US011807767B2

(12) United States Patent
Jung et al.

(10) Patent No.: US 11,807,767 B2
(45) Date of Patent: Nov. 7, 2023

(54) INK COMPOSITION FOR ORGANIC LIGHT EMITTING DEVICE

(71) Applicant: LG Chem, Ltd., Seoul (KR)

(72) Inventors: Ji Young Jung, Daejeon (KR); Mi Kyoung Kim, Daejeon (KR)

(73) Assignee: LG Chem, Ltd.

( * ) Notice: Subject to any disclaimer, the term of this patent is extended or adjusted under 35 U.S.C. 154(b) by 60 days.

(21) Appl. No.: 17/254,058

(22) PCT Filed: Sep. 27, 2019

(86) PCT No.: PCT/KR2019/012638
§ 371 (c)(1),
(2) Date: Dec. 18, 2020

(87) PCT Pub. No.: WO2020/067800
PCT Pub. Date: Apr. 2, 2020

(65) Prior Publication Data

US 2021/0277269 A1 Sep. 9, 2021

(30) Foreign Application Priority Data

Sep. 28, 2018 (KR) ........................ 10-2018-0116458

(51) Int. Cl.
*C09D 11/50* (2014.01)
*C09D 11/033* (2014.01)
(Continued)

(52) U.S. Cl.
CPC ............ *C09D 11/50* (2013.01); *C09D 11/033* (2013.01); *C09D 11/037* (2013.01);
(Continued)

(58) Field of Classification Search
CPC ...................................................... C09D 11/50
See application file for complete search history.

(56) References Cited

U.S. PATENT DOCUMENTS

2008/0290795 A1 11/2008 Sado et al.
2013/0092887 A1 4/2013 Seshadri et al.
(Continued)

FOREIGN PATENT DOCUMENTS

CN 101542769 A 9/2009
CN 105733562 A 7/2016
(Continued)

OTHER PUBLICATIONS

Extended European Search Report for Application No. 19866928.5 dated Jun. 28, 2021. 5 pgs.
(Continued)

*Primary Examiner* — William D Young
(74) *Attorney, Agent, or Firm* — Lerner David LLP

(57) ABSTRACT

The present invention relates to an ink composition for an organic light emitting device that can be applied to an inkjet process. The ink composition comprises a compound represented by the following Chemical Formula 1, a first solvent of aromatic esters having a boiling point of 260 to 400° C., and a second solvent of aliphatic ethers or aliphatic esters having a boiling point of 200 to 400° C., wherein the boiling point of the first solvent is higher than that of the second solvent. When this is applied to an inkjet process, it can form a flat film with a smooth surface when dried after forming the ink film.
(Continued)

[Chemical Formula 1]

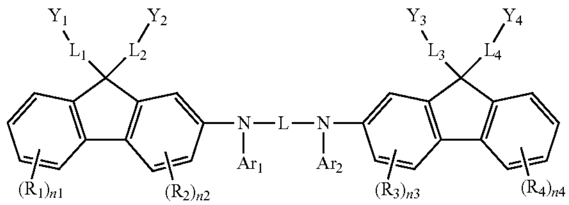

wherein L, $L_1$ to $L_4$, $Ar_1$, $Ar_2$, $R_1$ to $R_4$, $Y_1$ to $Y_4$, and $n_1$ to $n_4$ are described herein.

9 Claims, 2 Drawing Sheets

(51) Int. Cl.

| | |
|---|---|
| ***C09D 11/037*** | (2014.01) |
| ***C09D 11/322*** | (2014.01) |
| ***C09D 11/38*** | (2014.01) |
| ***C09D 11/52*** | (2014.01) |
| ***C09K 11/06*** | (2006.01) |
| ***H10K 85/60*** | (2023.01) |
| *H10K 71/00* | (2023.01) |
| *H10K 71/15* | (2023.01) |
| *H10K 71/13* | (2023.01) |
| *H10K 102/00* | (2023.01) |

(52) U.S. Cl.

CPC ............ *C09D 11/322* (2013.01); *C09D 11/38* (2013.01); *C09D 11/52* (2013.01); *C09K 11/06* (2013.01); *H10K 85/633* (2023.02); *C09K 2211/1007* (2013.01); *C09K 2211/1011* (2013.01); *C09K 2211/1014* (2013.01); *H10K 71/00* (2023.02); *H10K 71/135* (2023.02); *H10K 71/15* (2023.02); *H10K 85/626* (2023.02); *H10K 2102/361* (2023.02)

(56) References Cited

U.S. PATENT DOCUMENTS

| | | | |
|---|---|---|---|
| 2013/0252351 A1 | 9/2013 | Tregub et al. | |
| 2013/0256636 A1 | 10/2013 | Watanabe | |
| 2014/0087507 A1 | 3/2014 | Tregub et al. | |
| 2014/0138655 A1 | 5/2014 | Sonoyama et al. | |
| 2015/0079715 A1 | 3/2015 | Tregub et al. | |
| 2015/0270485 A1 | 9/2015 | Watanabe | |
| 2016/0060475 A1 | 3/2016 | Tregub et al. | |
| 2017/0081539 A1 | 3/2017 | Tregub et al. | |
| 2018/0062078 A1 | 3/2018 | Watanabe et al. | |
| 2018/0346749 A1 | 12/2018 | Tregub et al. | |
| 2018/0375029 A1* | 12/2018 | Béalle ................. | H01L 51/0058 |
| 2019/0127327 A1 | 5/2019 | Bae et al. | |
| 2019/0214568 A1 | 7/2019 | Kang et al. | |
| 2019/0237669 A1* | 8/2019 | Kang ....................... | C09D 4/00 |

FOREIGN PATENT DOCUMENTS

| | | | |
|---|---|---|---|
| JP | 2009059846 | A | 3/2009 |
| KR | 20000051826 | A | 8/2000 |
| KR | 20030058767 | A | 7/2003 |
| KR | 20100003632 | A | 1/2010 |
| KR | 20130106255 | A | 9/2013 |
| KR | 20130112003 | A | 10/2013 |
| KR | 20140066091 | A | 5/2014 |
| KR | 20140089364 | A | 7/2014 |
| KR | 20150093995 | A | 8/2015 |
| KR | 20150110366 | A | 10/2015 |
| KR | 20170110722 | A | 10/2017 |
| KR | 20180008154 | A | 1/2018 |
| KR | 20180092270 | A | 8/2018 |
| TW | 201738211 | A | 11/2017 |
| WO | 2013040468 | A1 | 3/2013 |
| WO | 2017102048 | A1 | 6/2017 |
| WO | 2018097654 | A2 | 5/2018 |
| WO | 2018159933 | A1 | 9/2018 |

OTHER PUBLICATIONS

Search Report dated Feb. 22, 2022 from the Office Action for Chinese Application No. 201980034243.8 dated Mar. 11, 2022, pp. 1-3.

Search report from International Application No. PCT/KR2019/012638, dated Jan. 16, 2020.

* cited by examiner

[FIG. 1]
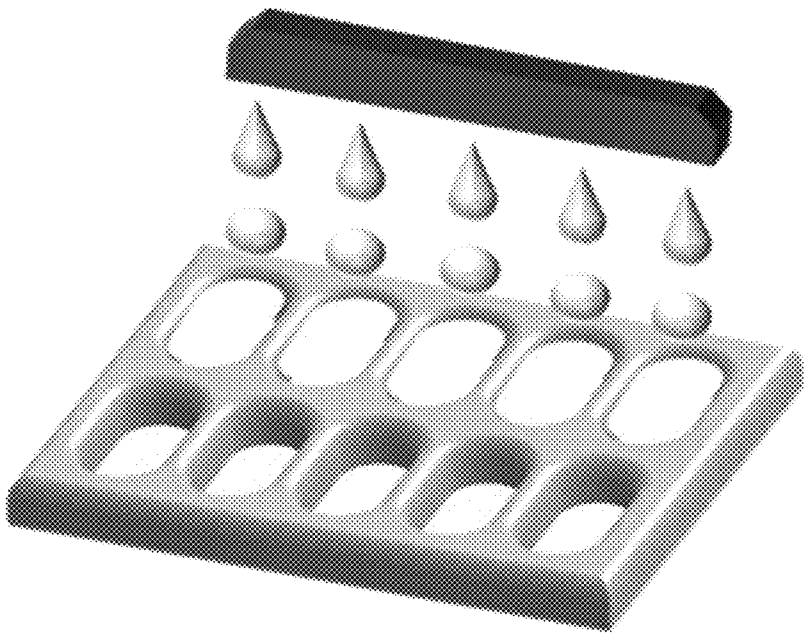
[FIG. 2]
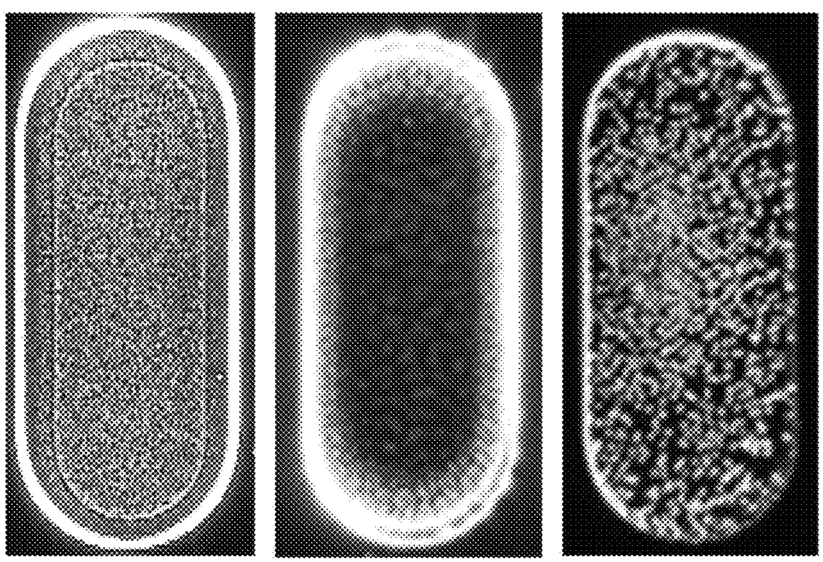

[FIG. 3]
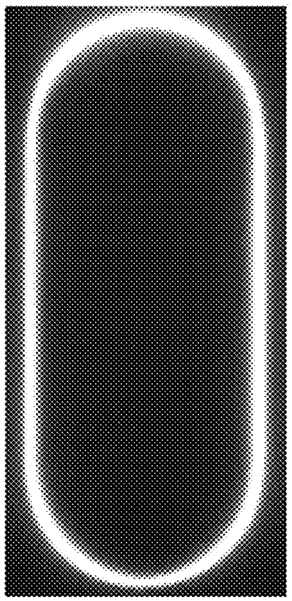
[FIG. 4]
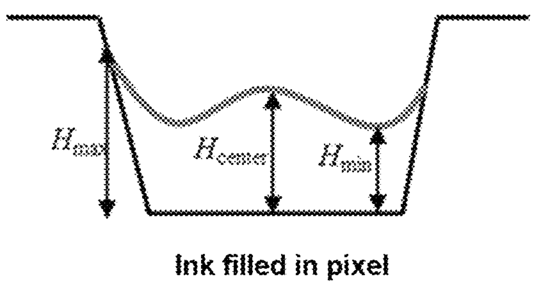
$$\text{Flatness} = \frac{H_{max} - H_{min}}{H_{center}}$$

INK COMPOSITION FOR ORGANIC LIGHT EMITTING DEVICE

CROSS-REFERENCE TO RELATED APPLICATIONS

This application is a national phase entry under 35 U.S.C. § 371 of International Application No. PCT/KR2019/012638 filed Sep. 27, 2019, which claims priority from Korean Patent Application No. 10-2018-0116458 filed Sep. 28, 2018, all of which are incorporated herein by reference.

TECHNICAL FIELD

The present invention relates to an ink composition for an organic light emitting device that can be applied to an inkjet process.

BACKGROUND ART

In general, an organic light emitting phenomenon refers to a phenomenon where electric energy is converted into light energy by using an organic material. The organic light emitting device using the organic light emitting phenomenon has characteristics such as a wide viewing angle, an excellent contrast, a fast response time, an excellent luminance, driving voltage and response speed, and thus many studies have proceeded.

The organic light emitting device generally has a structure which comprises an anode, a cathode, and an organic material layer interposed between the anode and the cathode. The organic material layer frequently has a multilayered structure that comprises different materials in order to enhance efficiency and stability of the organic light emitting device, and for example, the organic material layer may be formed of a hole injection layer, a hole transport layer, a light emitting layer, an electron transport layer, an electron injection layer and the like. In the structure of the organic light emitting device, if a voltage is applied between two electrodes, the holes are injected from an anode into the organic material layer and the electrons are injected from the cathode into the organic material layer, and when the injected holes and electrons meet each other, an exciton is formed, and light is emitted when the exciton falls to a ground state again.

Meanwhile, recently, in order to reduce process costs, an organic light emitting device using a solution process, particularly an inkjet process, has been developed instead of a conventional deposition process. In the initial stage of development, attempts have been made to develop organic light emitting devices by coating all organic light emitting device layers by a solution process, but current technology has limitations. Therefore, only HIL, HTL, and EML are processed in a layer device structure by a solution process, and a hybrid process utilizing traditional deposition processes is being studied as a subsequent process.

When forming a functional layer of the organic light emitting device using an inkjet process, ink must be stably discharged from the nozzle of the head for accuracy, and a uniform and flat film should be formed in the process of being coated and then dried. For example, when ink is coated onto a functional layer-forming region surrounded by a partition and then dried, it is difficult to secure film flatness if the ink film is unevenly solidified. In particular, there are many cases where the film thickness in the center portion may become thicker than the partition side (convex shape) or the film thickness on the partition side may become thicker than the center portion (concave shape).

Therefore, there is a need to develop an ink composition for an organic light emitting device that can resolve the above problems when applying the inkjet process.

PRIOR ART LITERATURE

Patent Literature (Patent Literature 1) Korean Unexamined Patent Publication No. 10-2000-0051826

DETAILED DESCRIPTION OF THE INVENTION

Technical Problem

It is an object of the present invention to provide an ink composition for an organic light emitting device that can be applied to an inkjet process.

Technical Solution

In order to achieve the above object, one aspect of the present invention provides an ink composition for an organic light emitting device including: 1) a compound represented by the following Chemical Formula 1, 2) a first solvent of aromatic esters having a boiling point of 260 to 400° C., and 3) a second solvent of aliphatic ethers or aliphatic esters having a boiling point of 200 to 400° C., wherein the boiling point of the first solvent is higher than that of the second solvent.

[Chemical Formula 1]

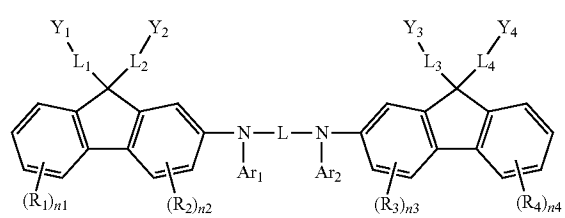

wherein, in Chemical Formula 1,

L and $L_1$ to $L_4$ are each independently a substituted or unsubstituted $C_{1-60}$ alkylene; or a substituted or unsubstituted $C_{6-60}$ arylene, $Ar_1$ and $Ar_2$ are each independently a substituted or unsubstituted $C_{6-60}$ aryl; or a substituted or unsubstituted $C_{2-60}$ heteroaryl containing one or more heteroatoms selected from the group consisting of N, O and S, and $R_1$ to $R_4$ are each independently hydrogen, deuterium, a substituted or unsubstituted $C_{1-60}$ alkyl, a substituted or unsubstituted $C_{1-60}$ alkoxy, a substituted or unsubstituted $C_{6-60}$ aryl, or a substituted or unsubstituted $C_{2-60}$ heteroaryl containing one or more heteroatoms selected from the group consisting of N, O and S, $Y_1$ to $Y_4$ are each independently hydrogen or —X-A, with the proviso that at least two of $Y_1$ to $Y_4$ are —X-A, X is a single bond, O, or S, A is a functional group that can be crosslinked by heat or light, n1 and n4 are each an integer of 0 to 4, and n2 and n3 are each an integer of 0 to 3.

Advantageous Effects

The ink composition for forming an organic light emitting device according to the present invention can form a flat film with a smooth surface when dried after forming an ink film by an inkjet process.

BRIEF DESCRIPTION OF THE DRAWINGS

FIG. 1 schematically shows a method for measuring film flatness according to the experimental example of the present invention.

FIG. 2 shows examples in which a film image is evaluated as N.G according to the experimental example of the present invention.

FIG. 3 shows examples in which a film image is evaluated as O.K according to the experimental example of the present invention.

FIG. 4 schematically shows a method for measuring film flatness according to the experimental example of the present invention.

DETAILED DESCRIPTION OF THE EMBODIMENTS

Hereinafter, embodiments of the present invention will be described in more detail to facilitate understanding of the invention.

Definition of Terms

As used herein, the notation

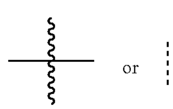

or means a bond linked to another substituent group.

As used herein, the term "substituted or unsubstituted" means being unsubstituted or substituted with one or more substituents selected from the group consisting of deuterium; a halogen group; a nitrile group; a nitro group; a hydroxy group; a carbonyl group; an ester group; an imide group; an amino group; a phosphine oxide group; an alkoxy group; an aryloxy group; an alkylthioxy group; an arylthioxy group; an alkylsulfoxy group; an arylsulfoxy group; a silyl group; a boron group; an alkyl group; a cycloalkyl group; an alkenyl group; an aryl group; an aralkyl group; an aralkenyl group; an alkylaryl group; an alkylamine group; an aralkylamine group; a heteroarylamine group; an arylamine group; an arylphosphine group; or a heterocyclic group containing at least one of N, O and S atoms, or being unsubstituted or substituted with a substituent to which two or more substituents are linked among the substituents exemplified above. For example, "the substituent to which two or more substituents are linked" may be a biphenyl group. That is, the biphenyl group may also be an aryl group and may be interpreted as a substituent to which two phenyl groups are linked.

In the present specification, the number of carbon atoms of a carbonyl group is not particularly limited, but is preferably 1 to 40. Specifically, the carbonyl group may be a compound having the following structural formulae but is not limited thereto.

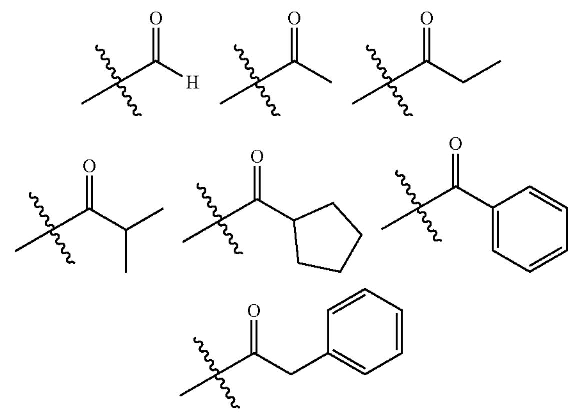

In the present specification, an ester group may have a structure in which oxygen of the ester group may be substituted by a straight-chain, branched-chain, or cyclic alkyl group having 1 to 25 carbon atoms, or an aryl group having 6 to 25 carbon atoms. Specifically, the ester group may be a compound having the following structural formulae, but is not limited thereto.

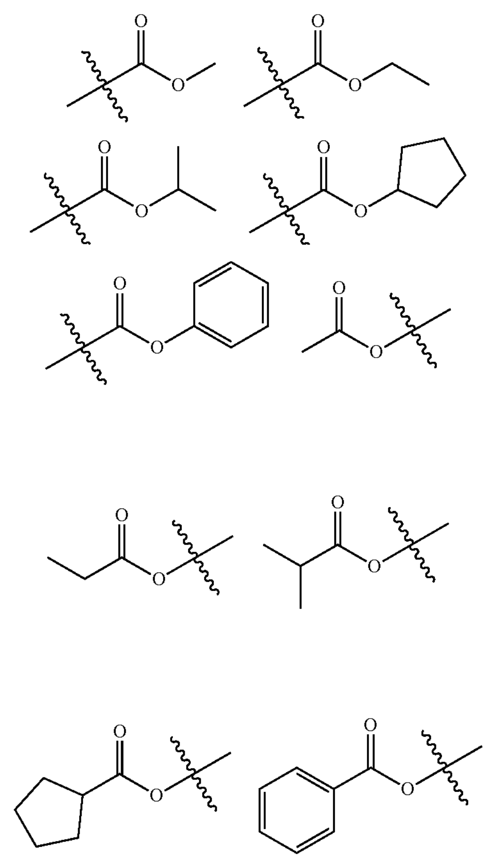

In the present specification, the number of carbon atoms of an imide group is not particularly limited, but is preferably 1 to 25. Specifically, the imide group may be a compound having the following structural formulae, but is not limited thereto.

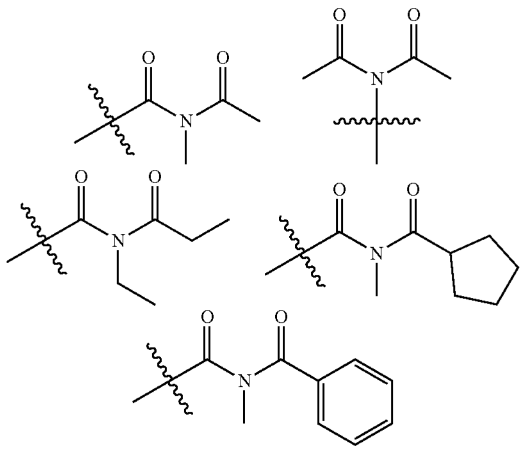

In the present specification, a silyl group specifically includes a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group and the like, but is not limited thereto.

In the present specification, a boron group specifically includes a trimethylboron group, a triethylboron group, a t-butyldimethylboron group, a triphenylboron group, and a phenylboron group, but is not limited thereto.

In the present specification, examples of a halogen group include fluorine, chlorine, bromine, or iodine.

In the present specification, the alkyl group may be a straight-chain or branched chain, and the number of carbon atoms thereof is not particularly limited, but is preferably 1 to 40. According to one embodiment, the number of carbon atoms of the alkyl group is 1 to 20. According to another embodiment, the number of carbon atoms of the alkyl group is 1 to 10. According to another embodiment, the number of carbon atoms of the alkyl group is 1 to 6. Specific examples of the alkyl group include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohectylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylpentyl, 4-methylhexyl, 5-methylhexyl, and the like, but are not limited thereto.

In the present specification, the alkenyl group may be a straight chain or branched chain, and the number of carbon atoms thereof is not particularly limited, but is preferably 2 to 40. According to one embodiment, the number of carbon atoms of the alkenyl group is 2 to 20. According to another embodiment, the number of carbon atoms of the alkenyl group is 2 to 10. According to still another embodiment, the number of carbon atoms of the alkenyl group is 2 to 6. Specific examples thereof include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, a stilbenyl group, a styrenyl group, and the like, but are not limited thereto.

In the present specification, a cycloalkyl group is not particularly limited, but the number of carbon atoms thereof is preferably 3 to 60. According to one embodiment, the number of carbon atoms of the cycloalkyl group is 3 to 30. According to another embodiment, the number of carbon atoms of the cycloalkyl group is 3 to 20. According to still another embodiment, the number of carbon atoms of the cycloalkyl group is 3 to 6. Specific examples thereof include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl, and the like, but are not limited thereto.

In the present specification, an aryl group is not particularly limited, but preferably has 6 to 60 carbon atoms, and may be a monocyclic aryl group or a polycyclic aryl group. According to one embodiment, the number of carbon atoms of the aryl group is 6 to 30. According to one embodiment, the number of carbon atoms of the aryl group is 6 to 20. The aryl group may be a phenyl group, a biphenyl group, a terphenyl group or the like as the monocyclic aryl group, but is not limited thereto. Examples of the polycyclic aryl group include a naphthyl group, an anthracenyl group, a phenanthryl group, a pyrenyl group, a perylenyl group, a chrysenyl group, a fluorenyl group or the like, but is not limited thereto.

In the present specification, a fluorenyl group may be substituted, and two substituent groups may be connected with each other to form a spiro structure. In the case where the fluorenyl group is substituted,

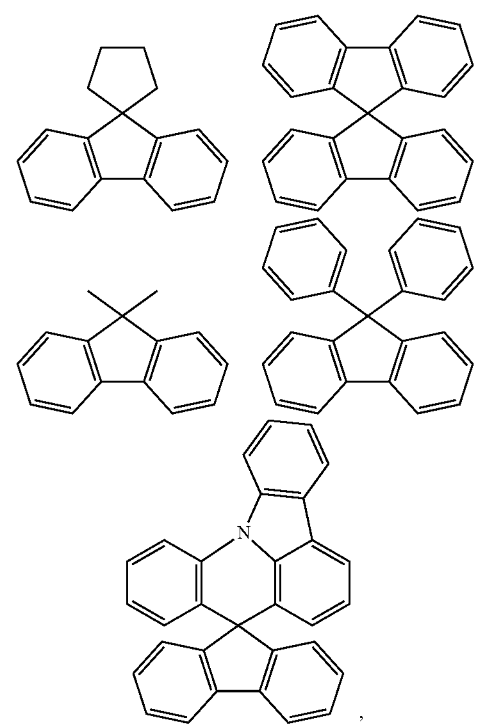

and the like can be formed. However, the structure is not limited thereto.

In the present specification, a heterocyclic group is a heterocyclic group including one or more of O, N, Si, and S as a heteroatom, and the number of carbon atoms thereof is not particularly limited, but is preferably 2 to 60. Examples of the heterocyclic group include a thiophene group, a furan group, a pyrrole group, an imidazole group, a thiazole group, an oxazol group, an oxadiazol group, a triazol group, a pyridyl group, a bipyridyl group, a pyrimidyl group, a triazine group, an acridyl group, a pyridazine group, a pyrazinyl group, a quinolinyl group, a quinazoline group, a quinoxalinyl group, a phthalazinyl group, a pyridopyrimidinyl group, a pyridopyrazinyl group, a pyrazinopyrazinyl group, an isoquinoline group, an indole group, a carbazole group, a benzoxazole group, a benzimidazole group, a benzothiazol group, a benzocarbazole group, a benzothiophene group, a dibenzothiophene group, a benzofuranyl group, a phenanthroline group, an isoxazolyl group, an thiadiazolyl group, a phenothiazinyl group, a dibenzofuranyl group, and the like, but are not limited thereto.

In the present specification, the aryl group in the aralkyl group, the aralkenyl group, the alkylaryl group, and the arylamine group is the same as the aforementioned examples of the aryl group. In the present specification, the alkyl group in the aralkyl group, the alkylaryl group and the alkylamine group is the same as the aforementioned examples of the alkyl group. In the present specification, the heteroaryl in the heteroarylamine can be applied to the aforementioned description of the heteroaryl. In the present specification, the alkenyl group in the aralkenyl group is the same as the aforementioned examples of the alkenyl group. In the present specification, the aforementioned description of the aryl group may be applied except that the arylene is a divalent group. In the present specification, the aforementioned description of the heteroaryl can be applied except that the heteroarylene is a divalent group. In the present specification, the aforementioned description of the aryl group or cycloalkyl group can be applied except that the hydrocarbon ring is not a monovalent group but formed by combining two substituent groups. In the present specification, the aforementioned description of the heteroaryl can be applied, except that the heterocycle is not a monovalent group but formed by combining two substituent groups.

Compound Represented by Chemical Formula 1

The compound represented by Chemical Formula 1 is a material that constitutes a functional layer in the organic light emitting device. Also, it has high solvent affinity with a solvent, has solvent orthogonality, and has resistance to a solvent used when forming other layers in addition to the organic material layer containing the aforementioned compound by a solution process, thereby preventing movement to another layer. In addition, the organic light emitting device including the same may have low driving voltage, high light emitting efficiency, and high lifetime.

Preferably, A is any one selected from the group consisting of the following:

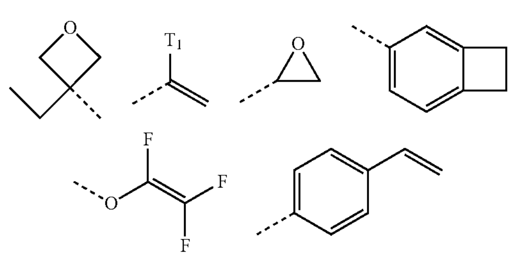

-continued

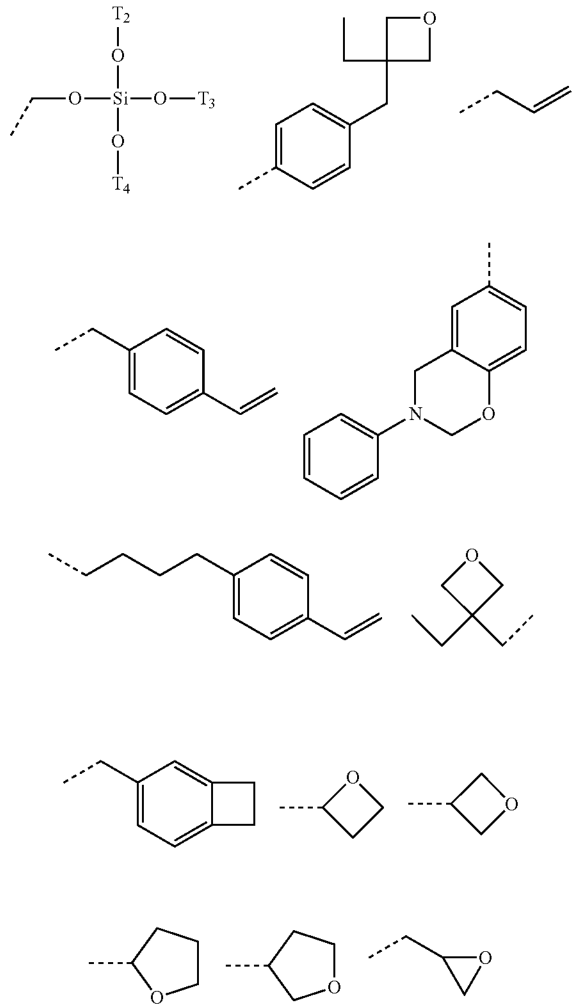

wherein, $T_1$ is hydrogen; or a substituted or unsubstituted $C_{1-6}$ alkyl, and $T_2$ to $T_4$ are each independently a substituted or unsubstituted $C_{1-6}$ alkyl.

Preferably, L is any one selected from the group consisting of the following:

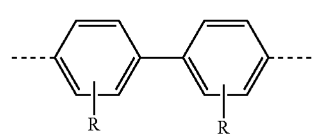

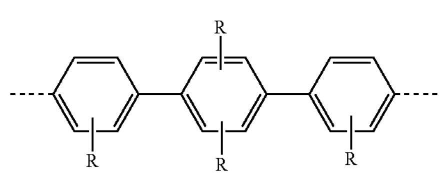

-continued

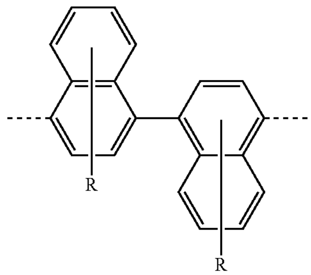

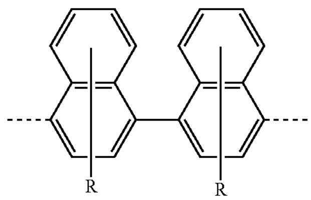

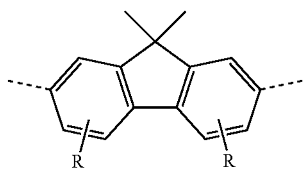

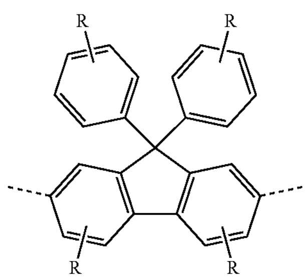

-continued

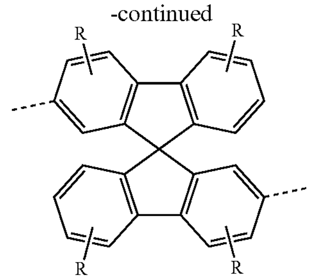

wherein, each R is independently hydrogen or $C_{1-10}$ alkyl.

Preferably, $L_1$ to $L_4$ are each independently $C_{1-10}$ alkylene, or the following Chemical Formula 1-A or 1-B:

[Chemical Formula 1-A]

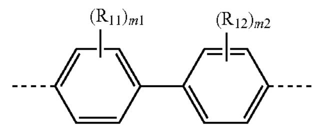

[Chemical Formula 1-B]

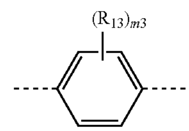

wherein, in Chemical Formulas 1-A and 1-B, $R_{11}$ to $R_{13}$ are each independently hydrogen, deuterium, a substituted or unsubstituted $C_{1-60}$ alkyl, a substituted or unsubstituted $C_{1-60}$ alkoxy, a substituted or unsubstituted $C_{6-60}$ aryl, or a substituted or unsubstituted $C_{2-60}$ heteroaryl containing any one or more heteroatoms selected from the group consisting of N, O and S, and m1 to m3 are each an integer of 0 to 4.

Preferably, $Ar_1$ and $Ar_2$ are the same as each other and are phenyl, biphenylyl, naphthyl, phenanthrenyl, dimethylfluorenyl, or diphenylfluorenyl.

Representative examples of the compound represented by Chemical Formula 1 are as follows:

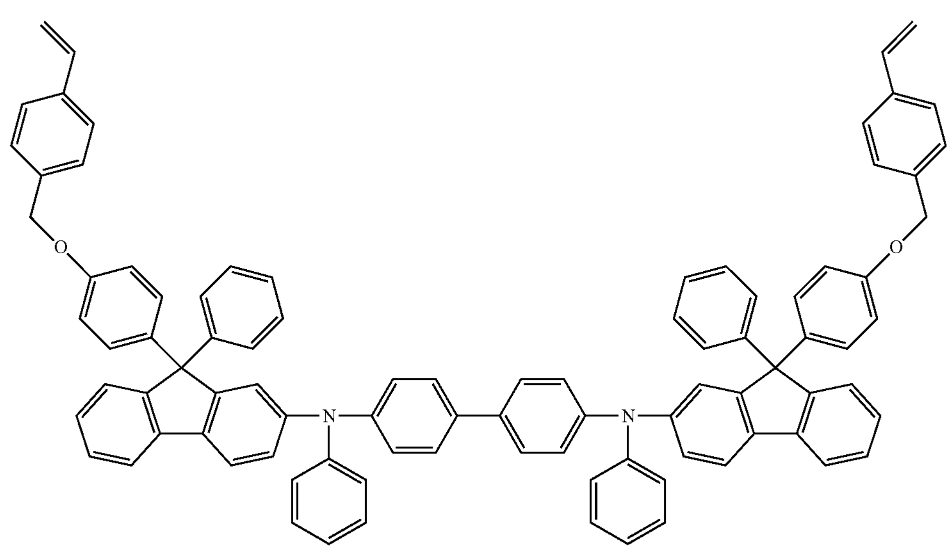

-continued
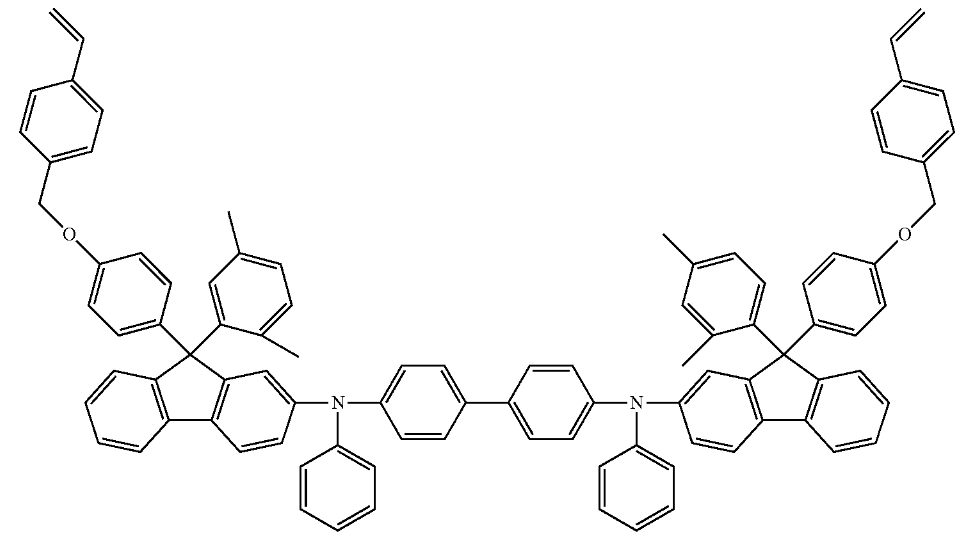
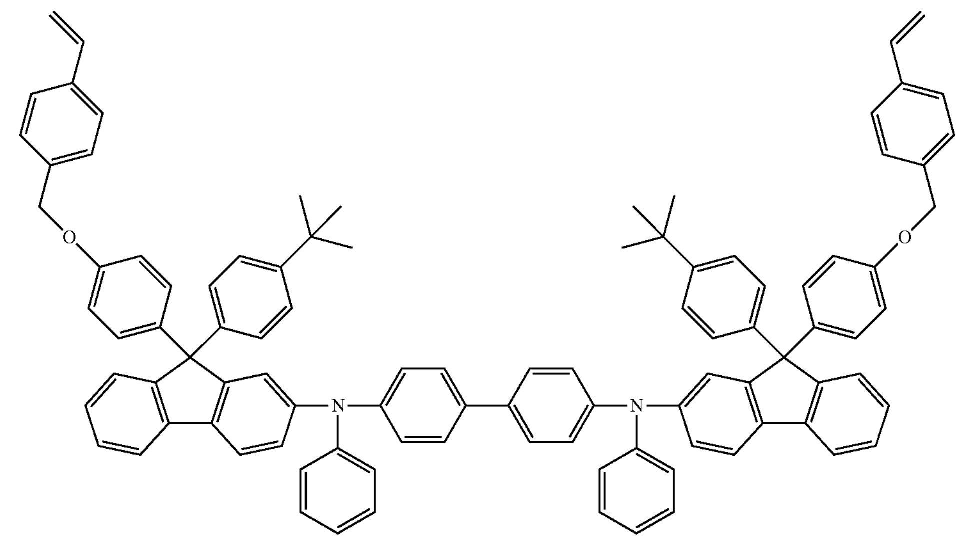
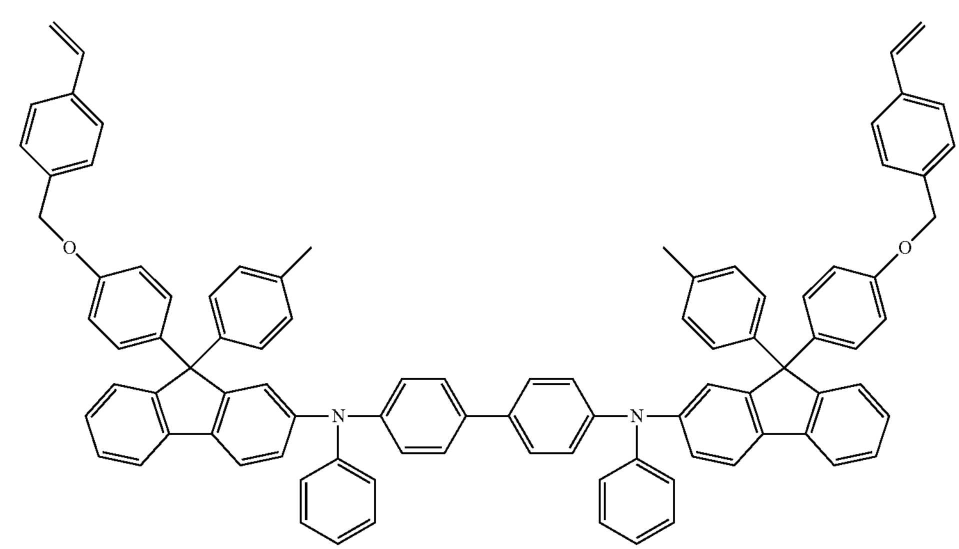

-continued
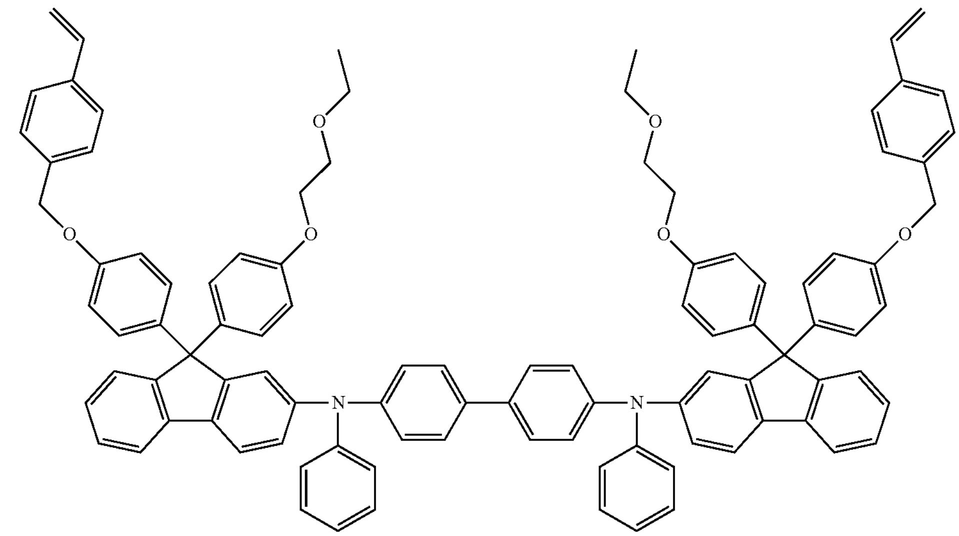
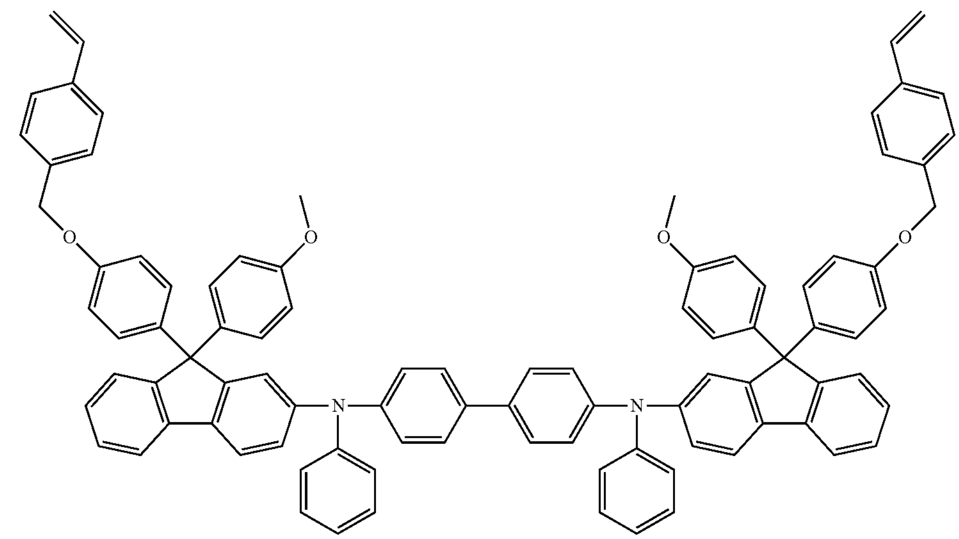
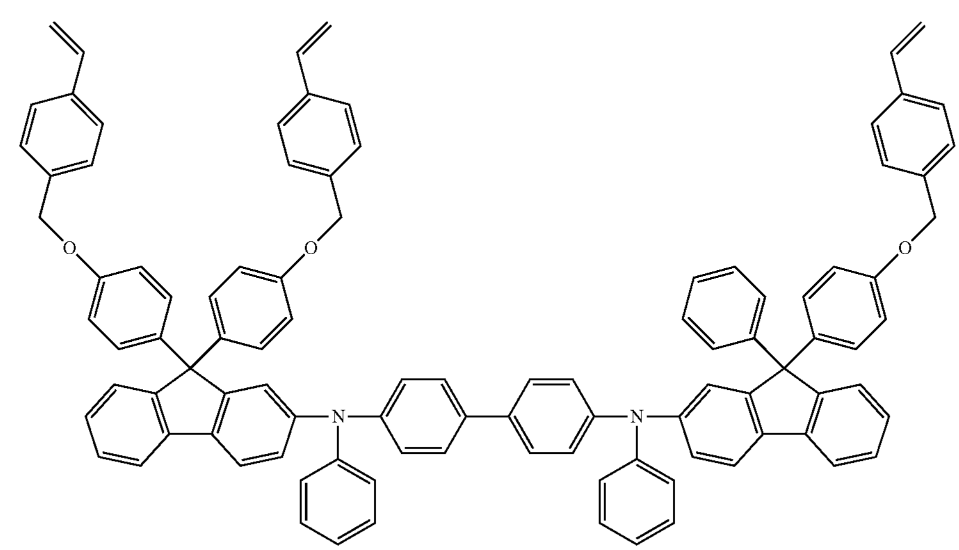

-continued
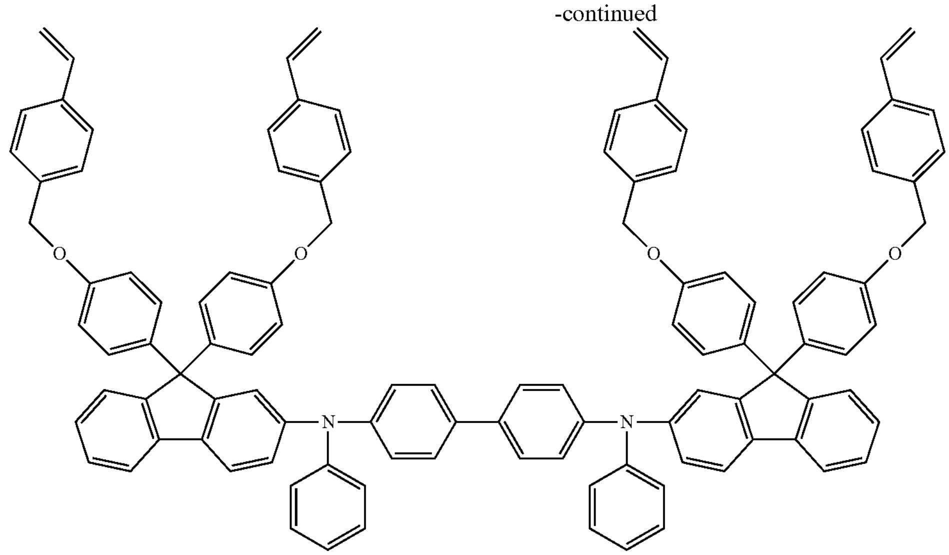
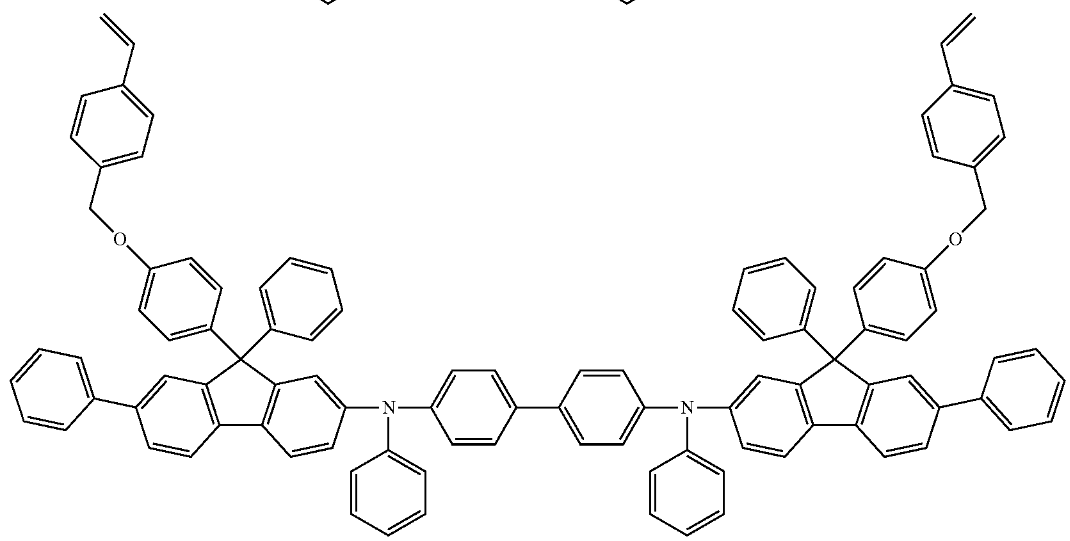
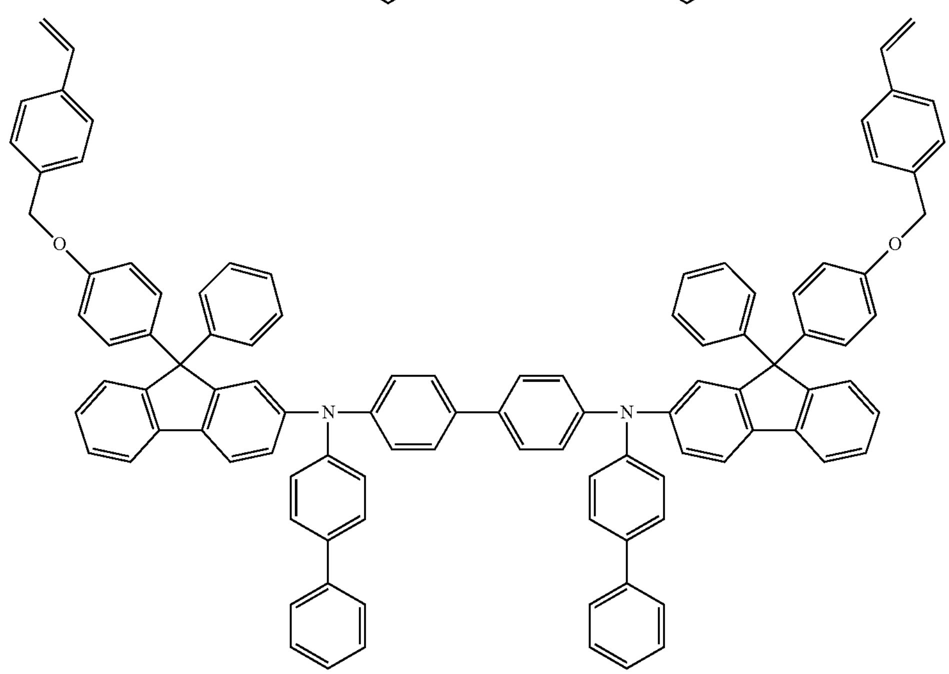

-continued
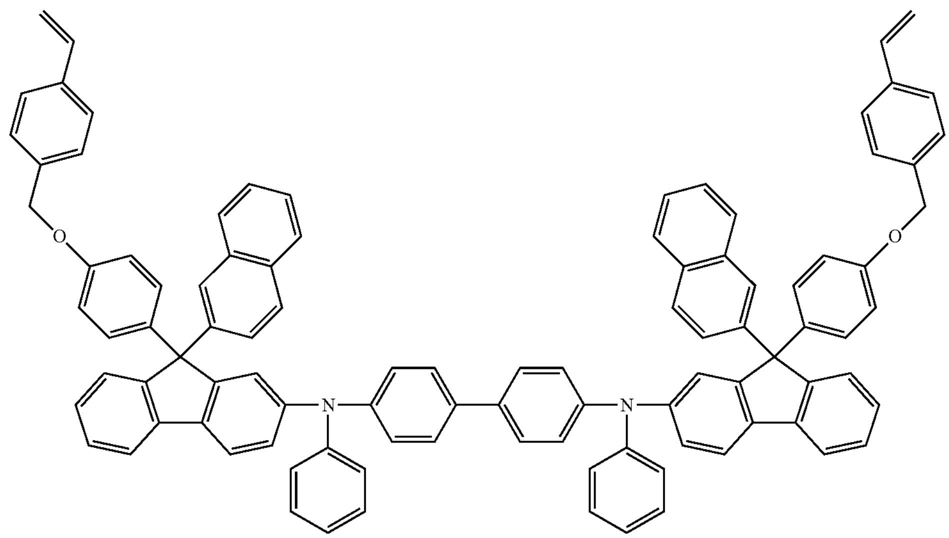
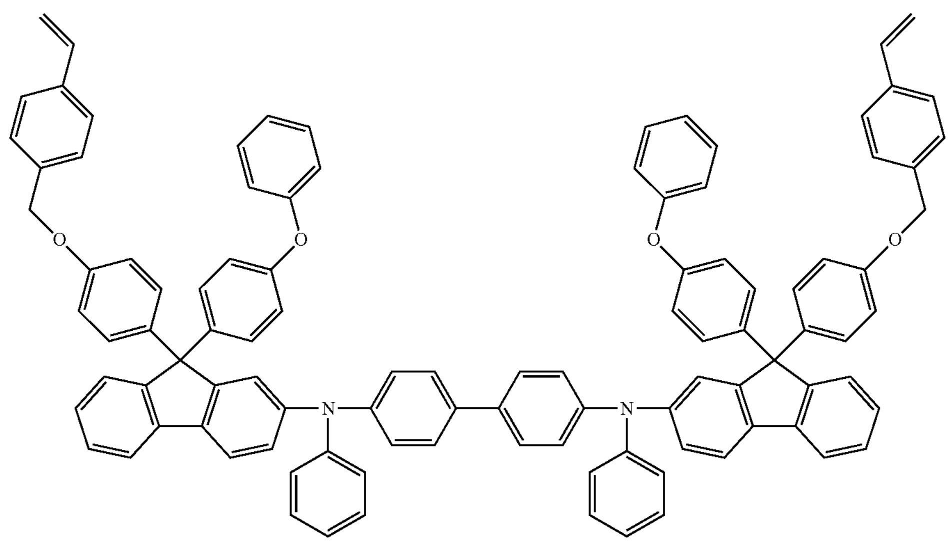
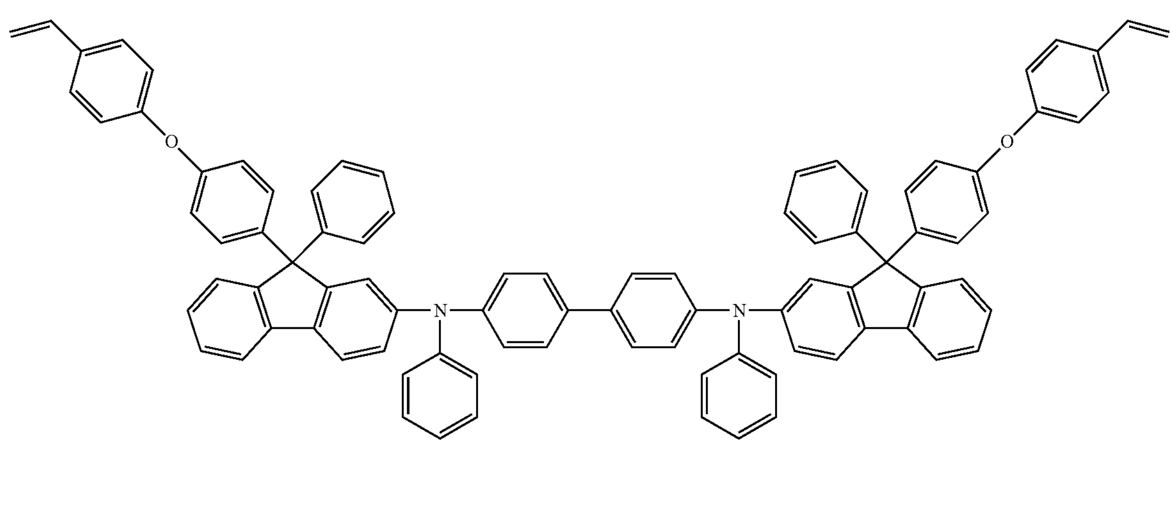

-continued
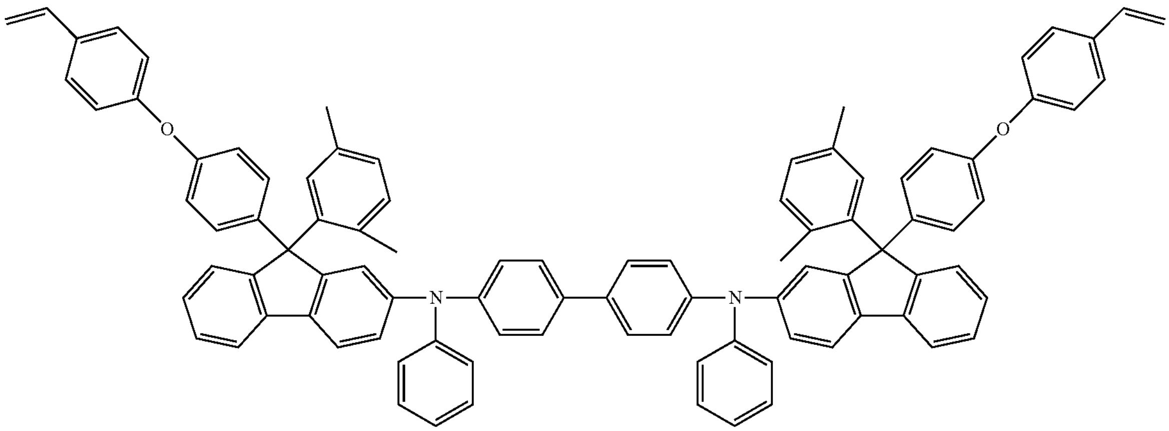
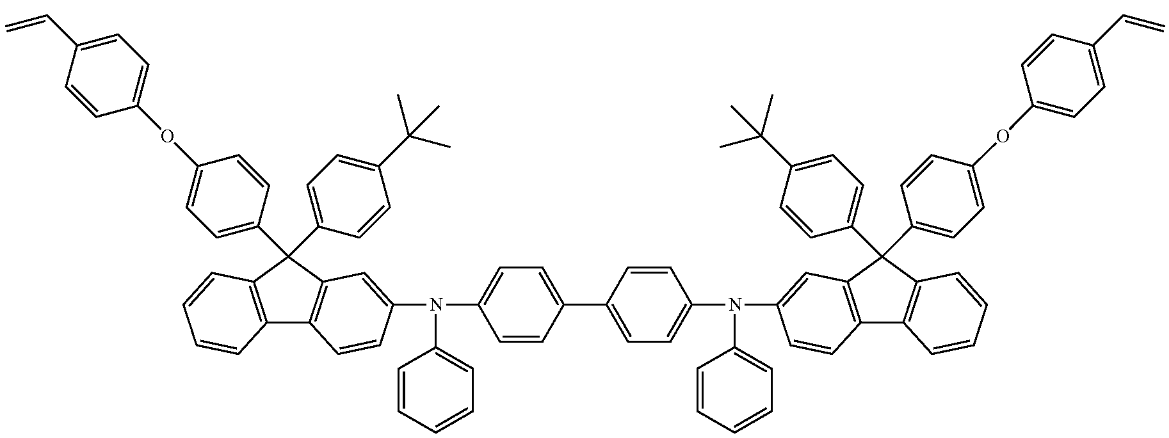
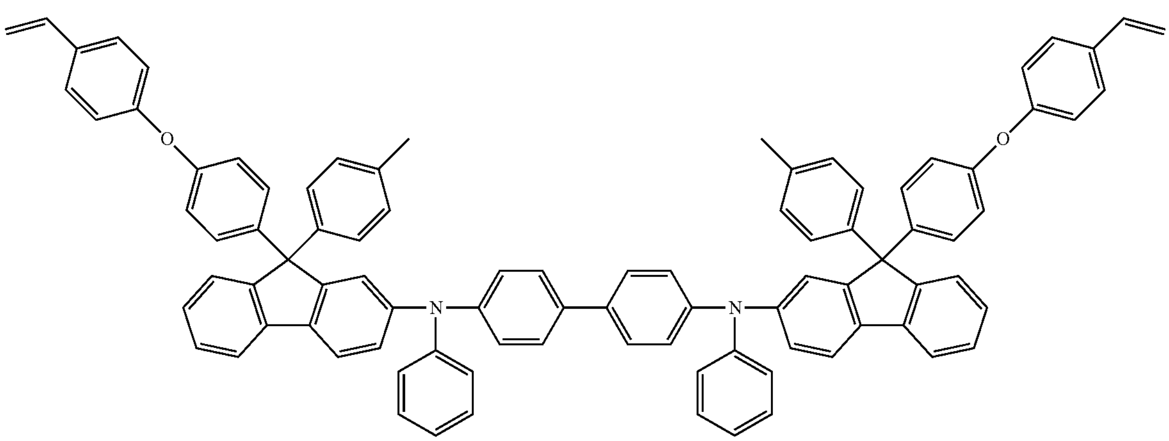

-continued
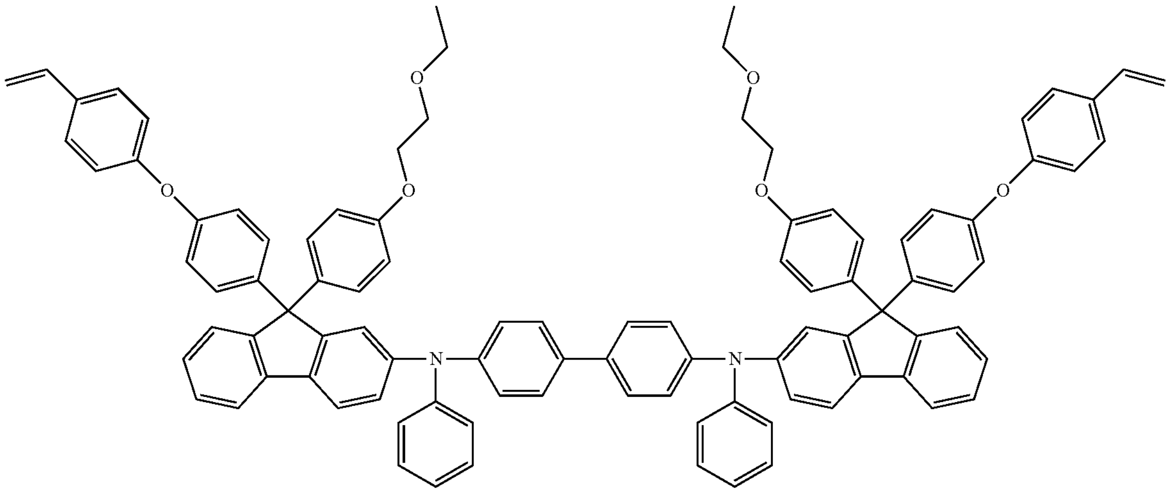
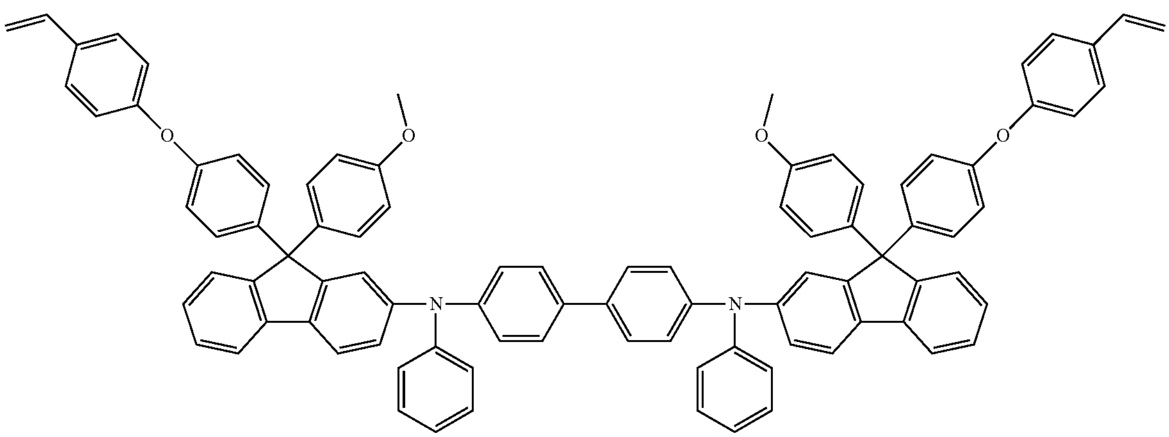
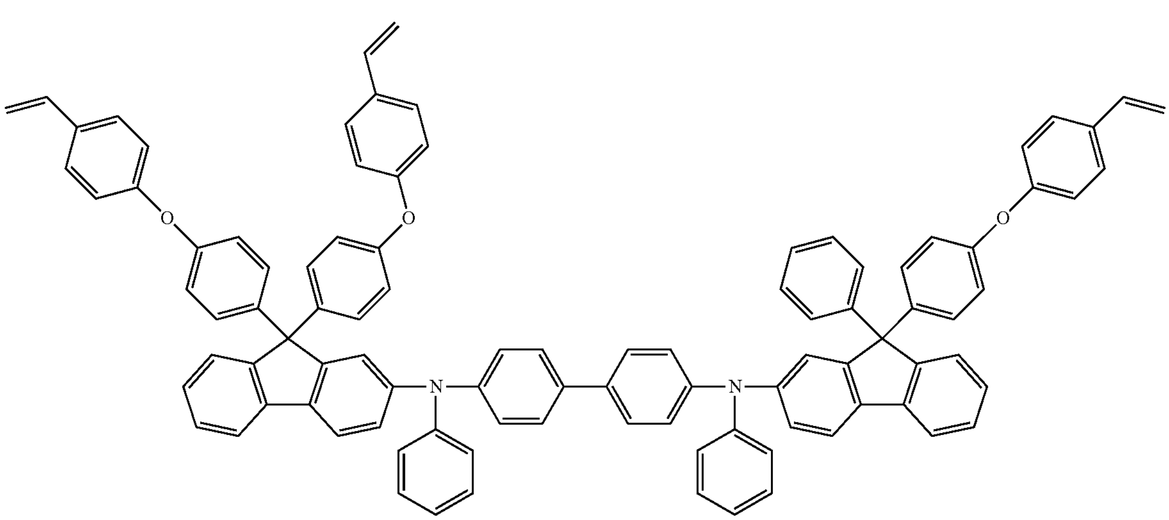

-continued
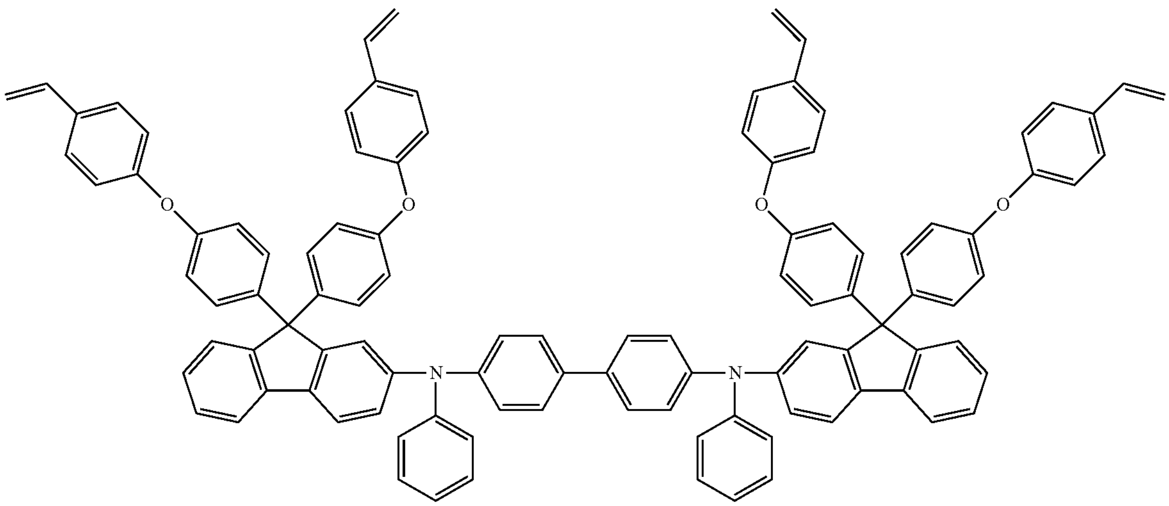
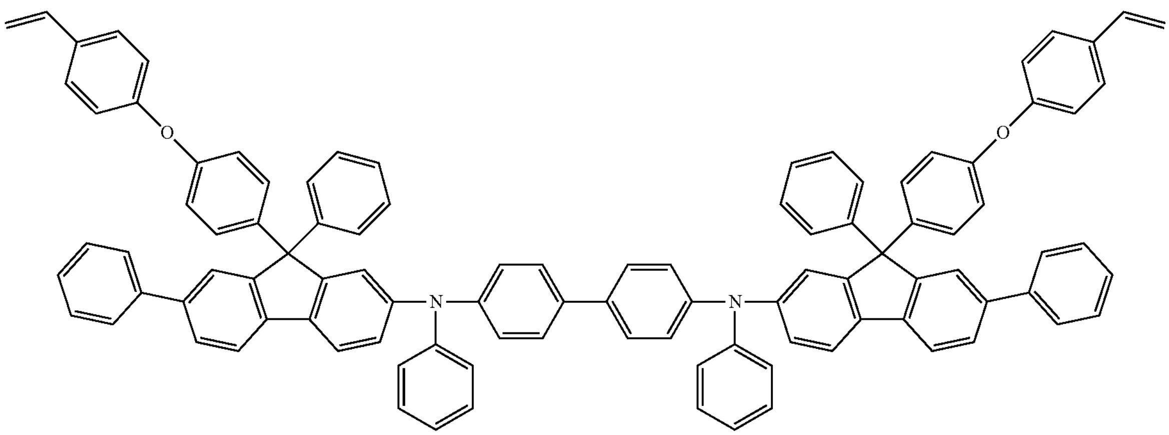
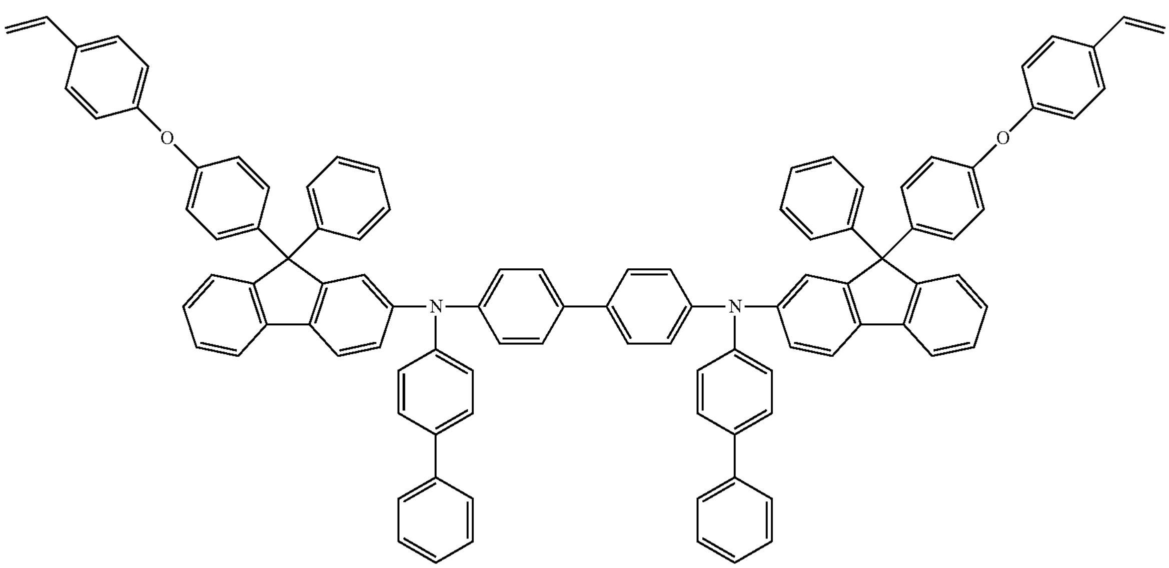

-continued
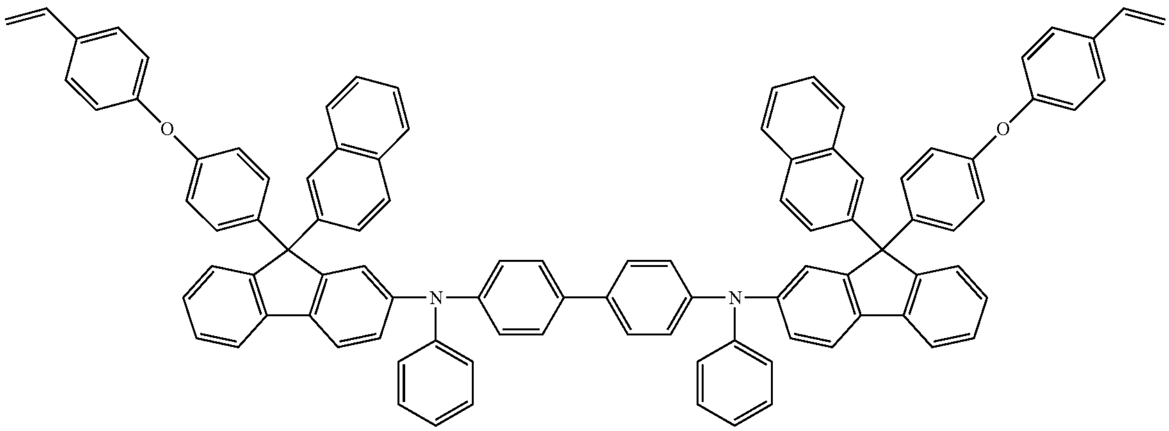
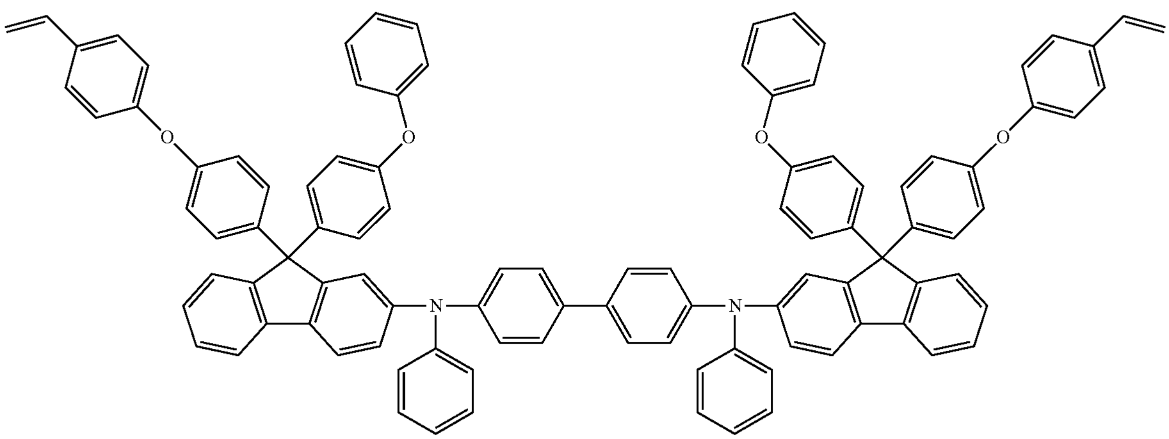
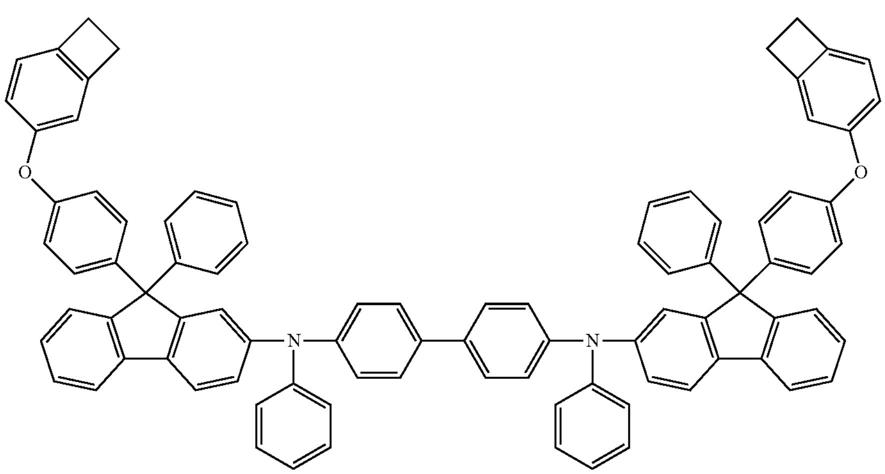

-continued
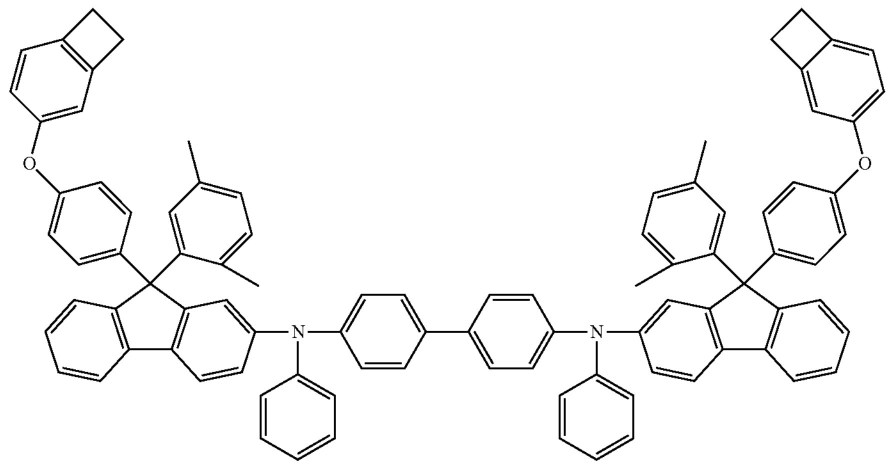
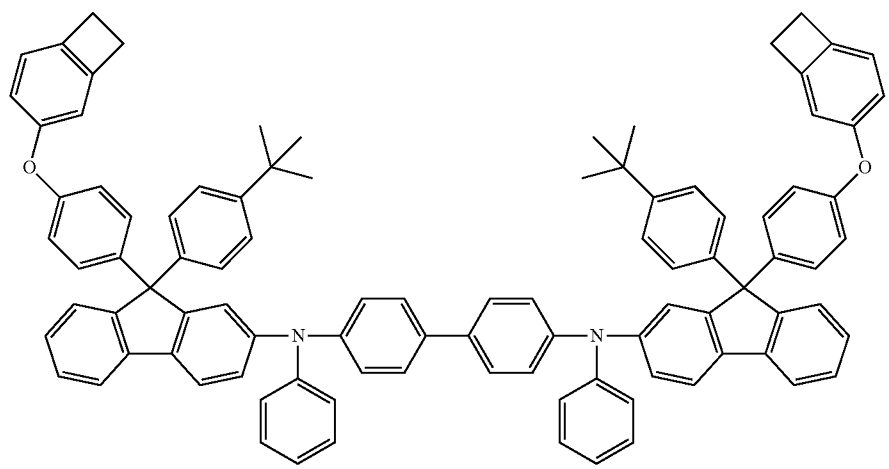
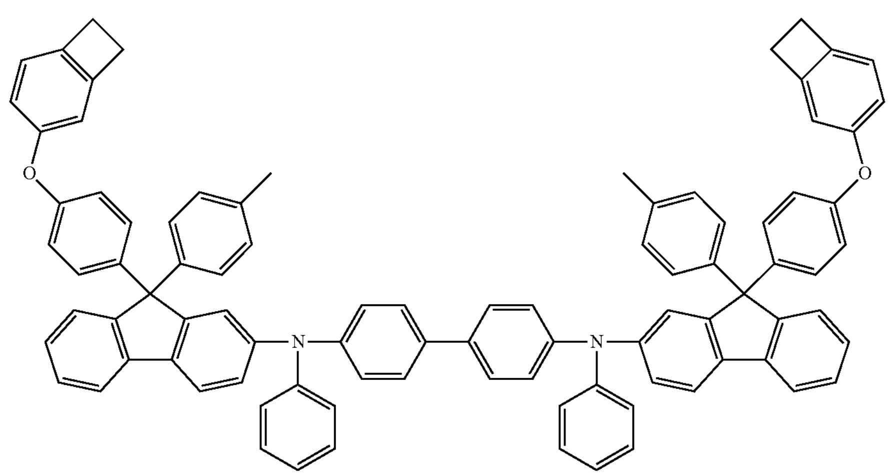

-continued
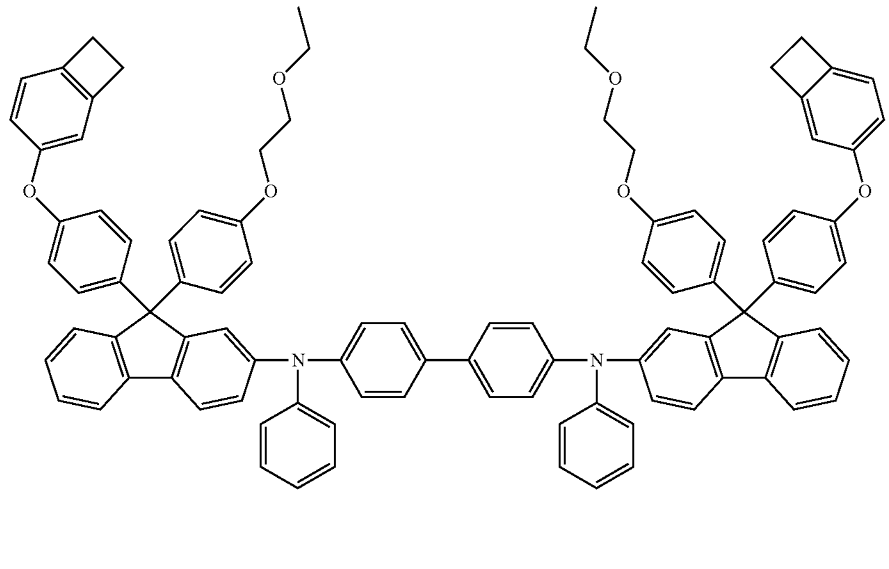
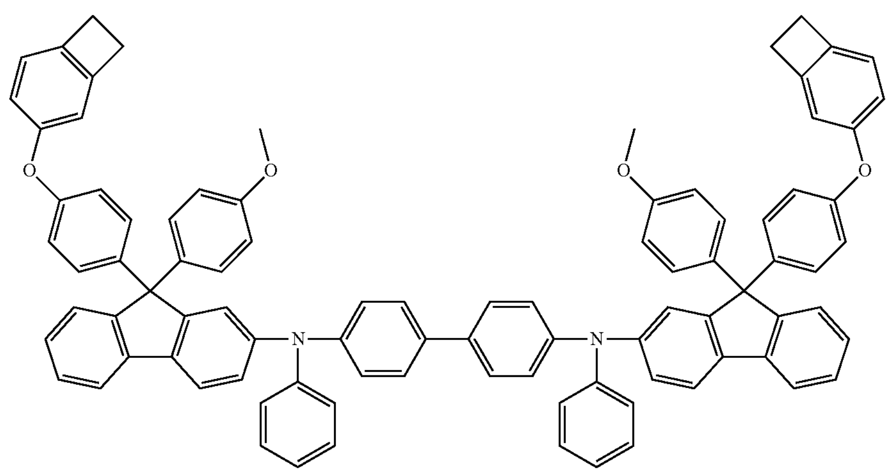
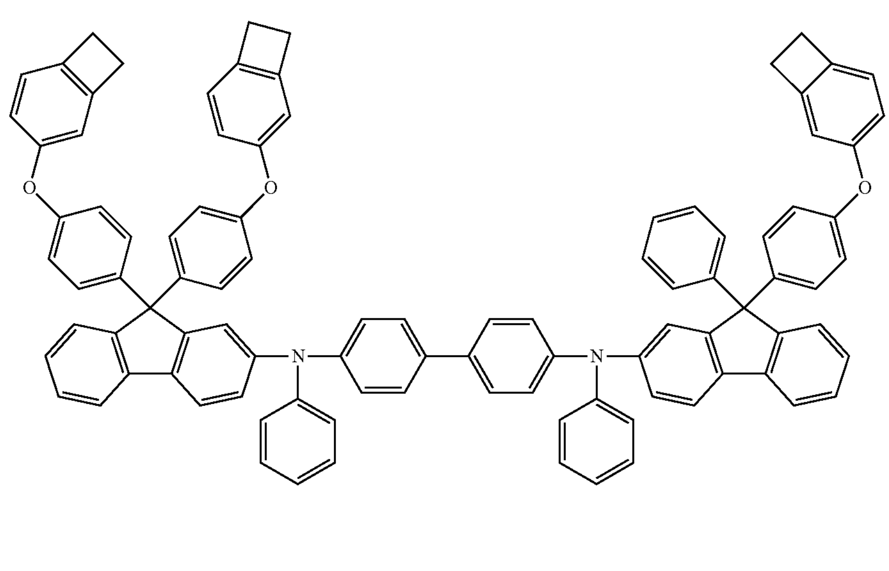

-continued
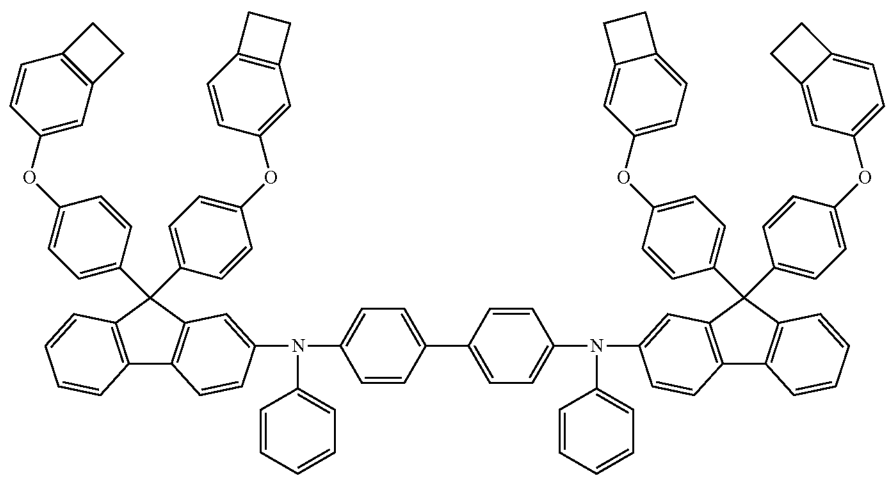
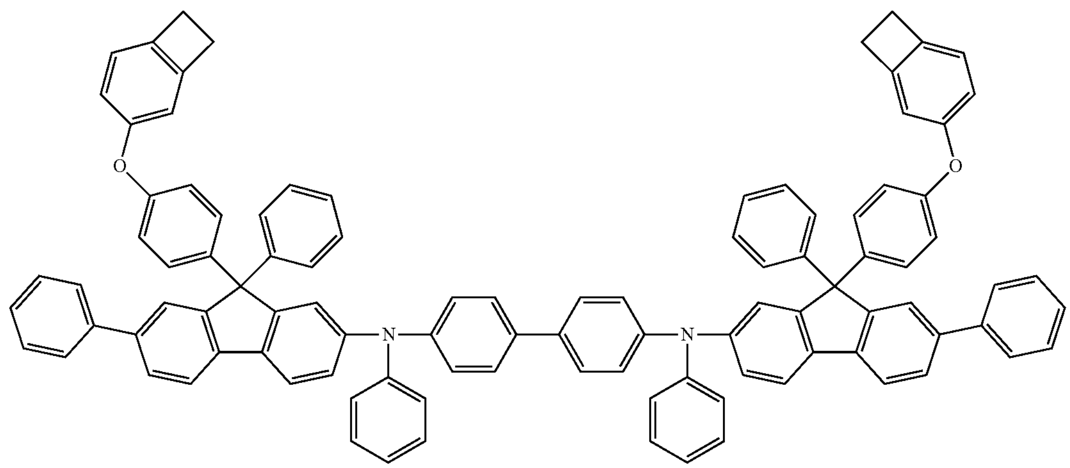
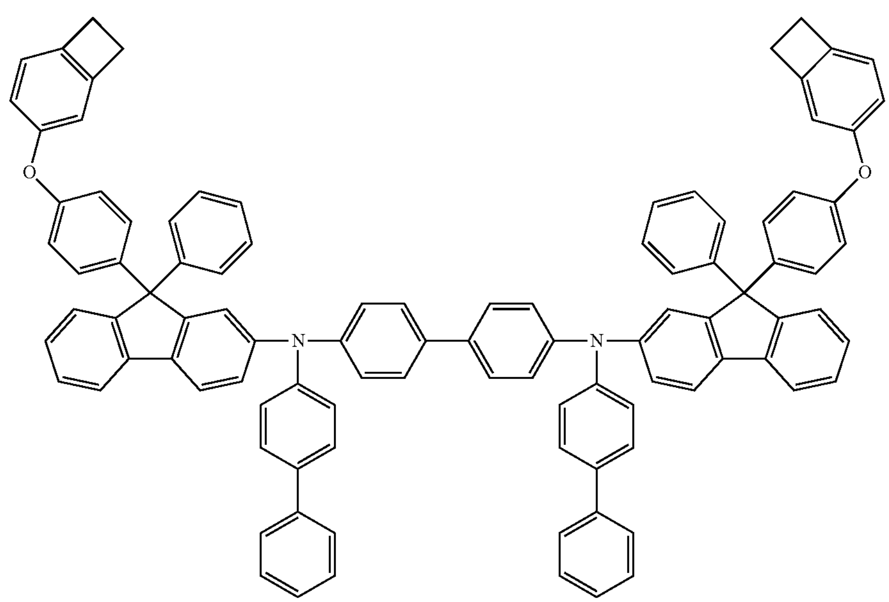

-continued
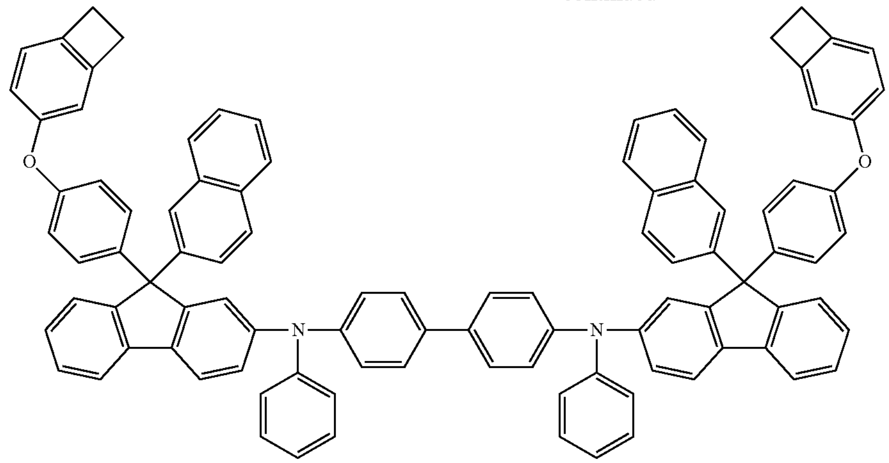
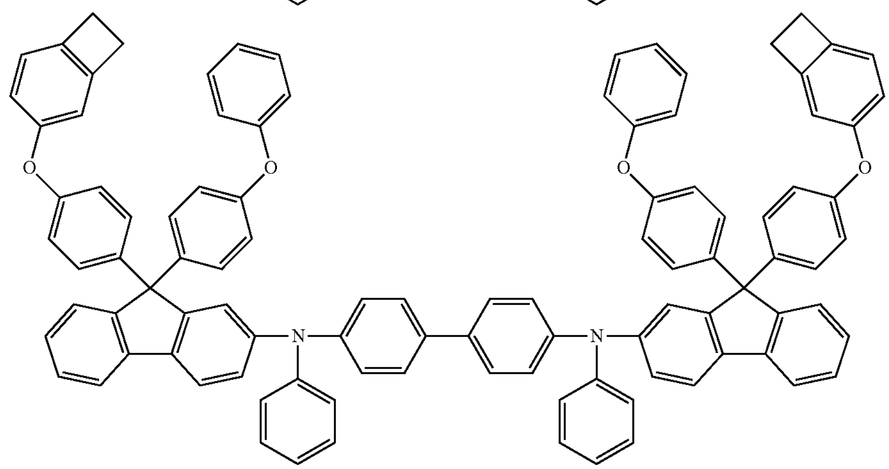
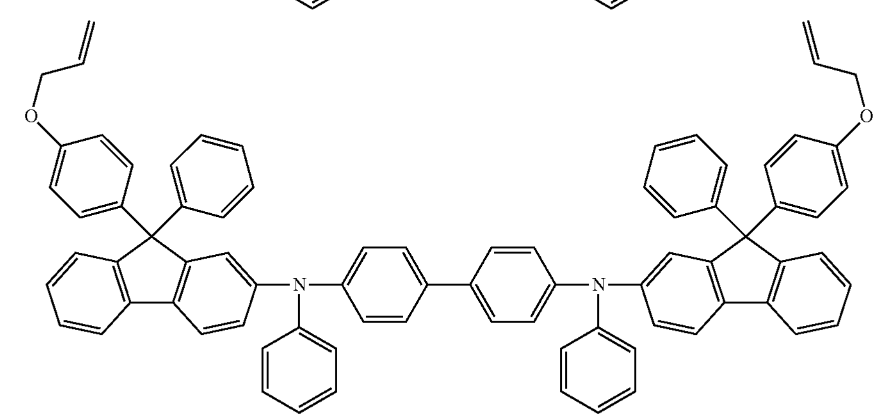
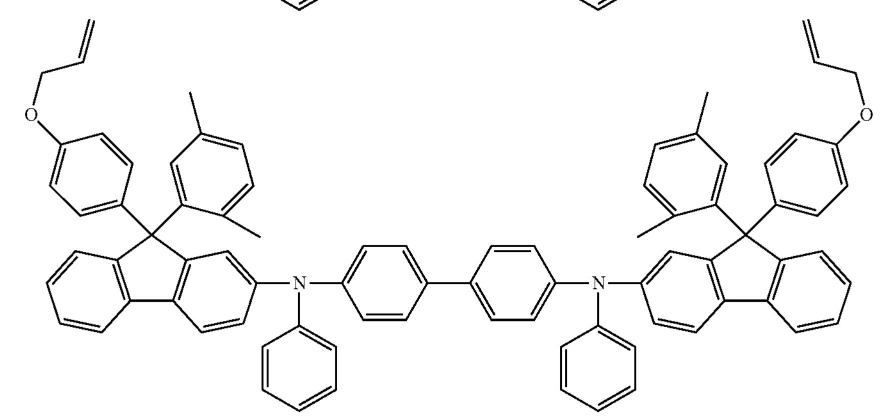

-continued
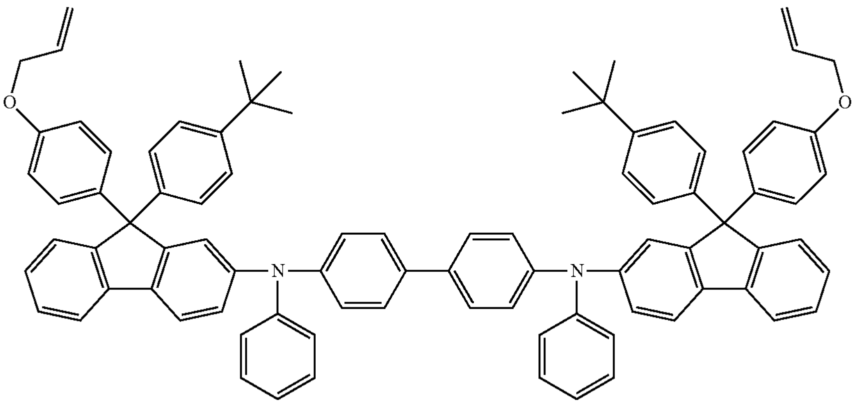
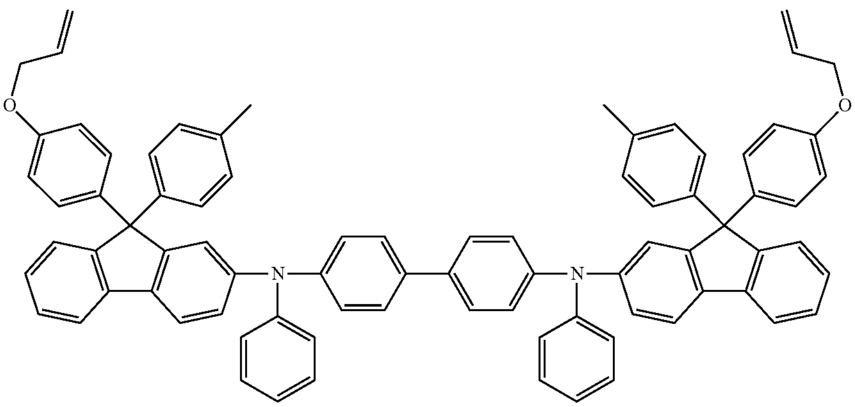
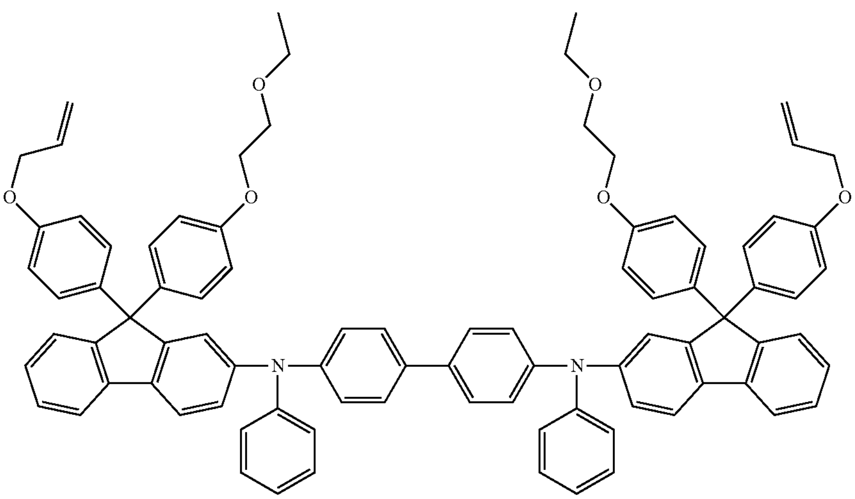
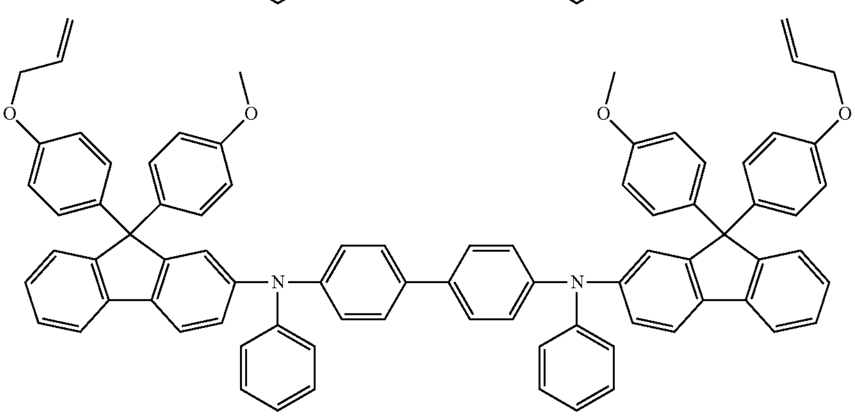

-continued
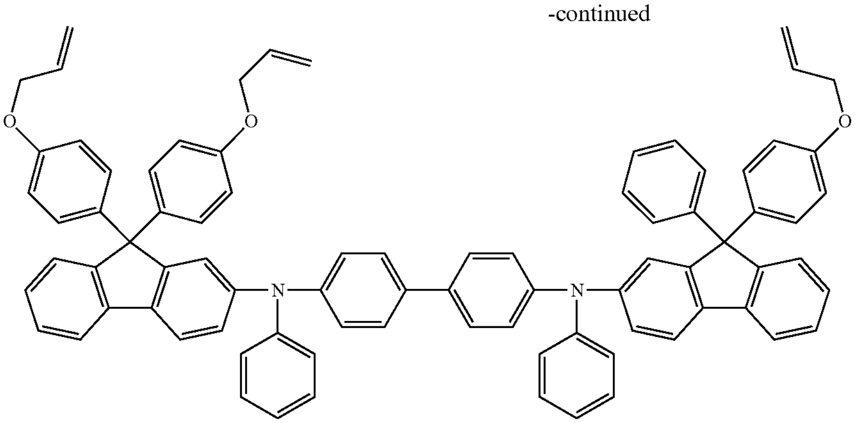
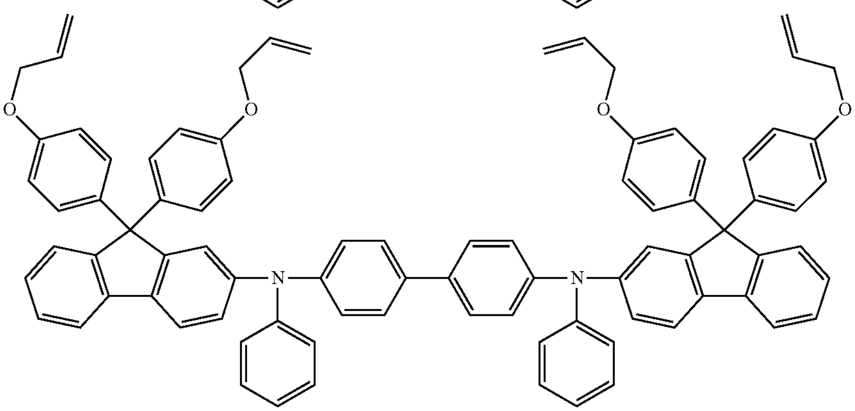
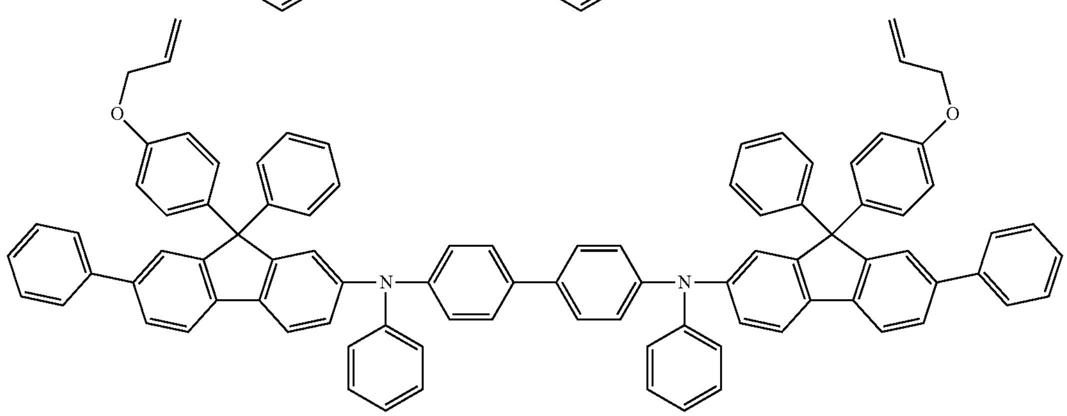
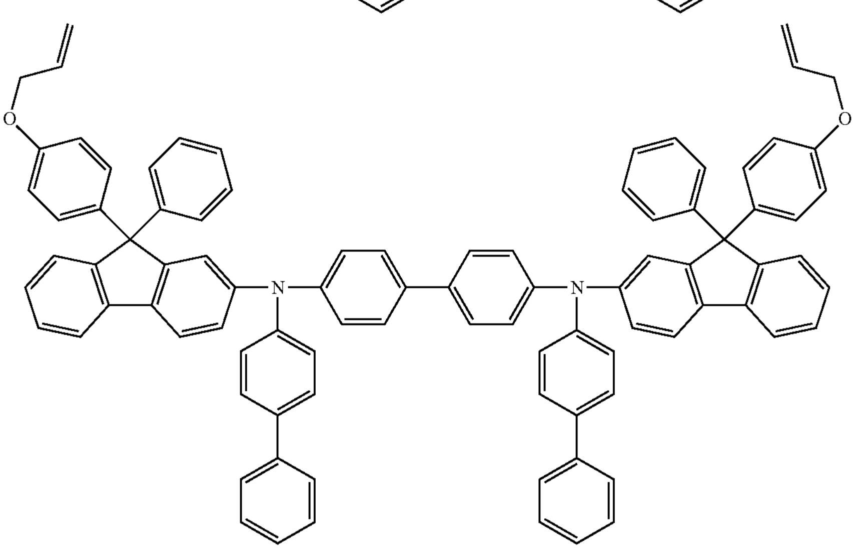

-continued
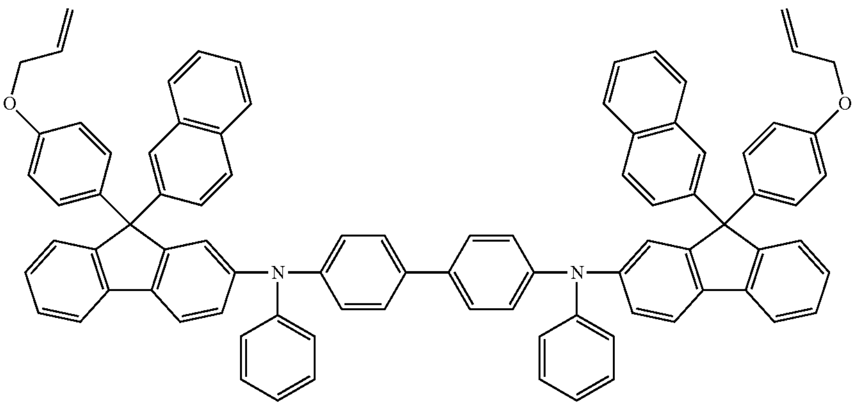
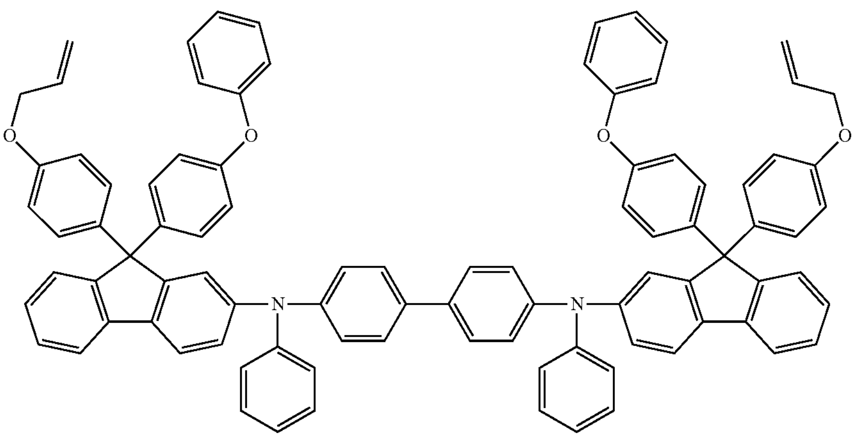
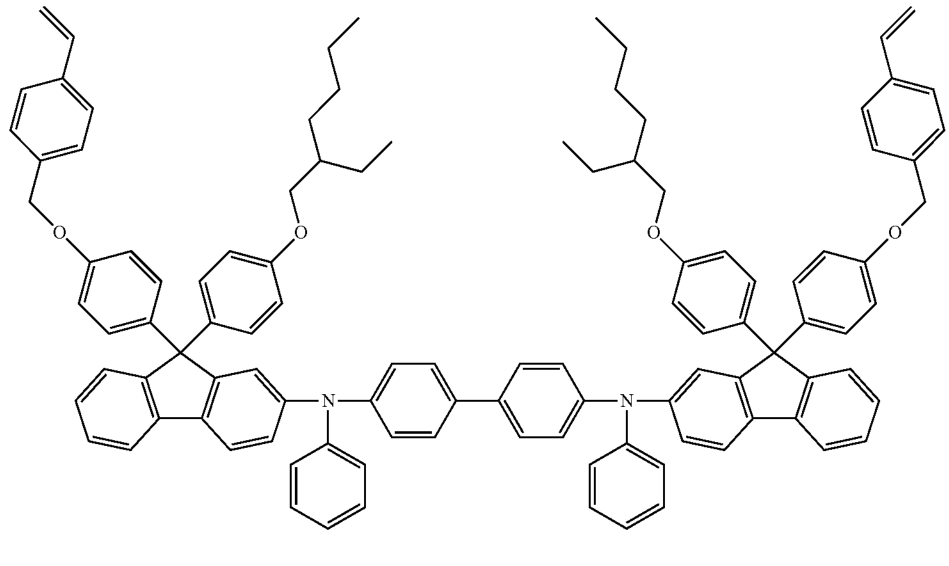

-continued
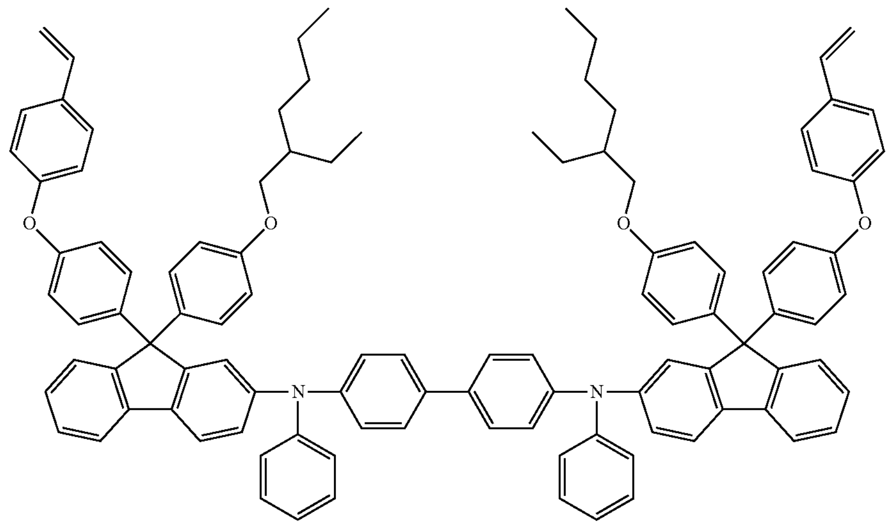
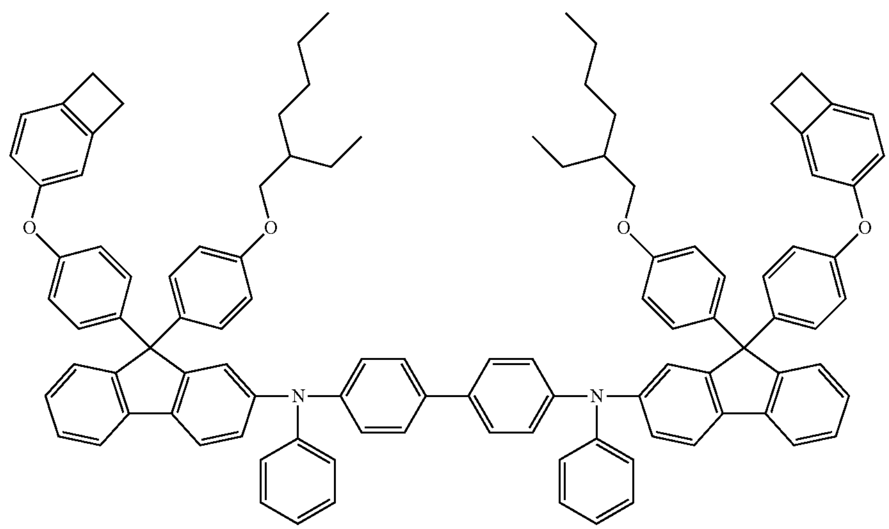
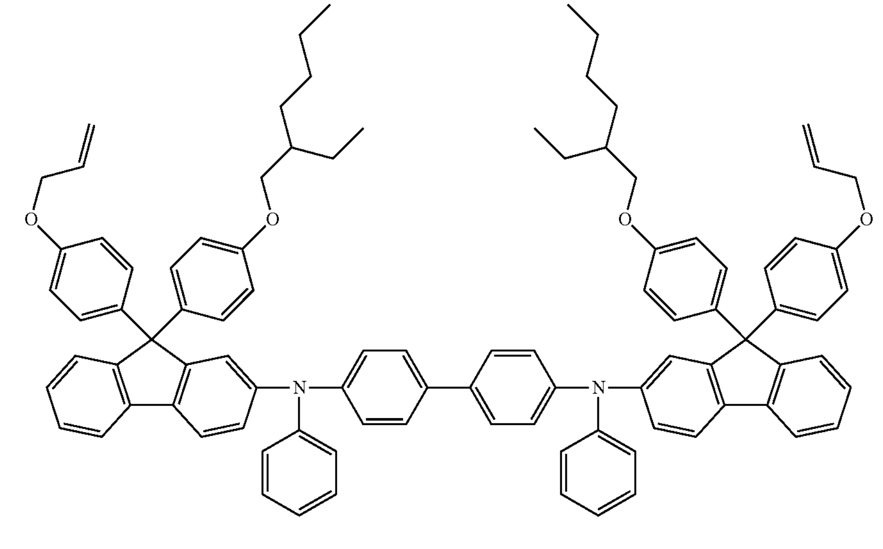

-continued
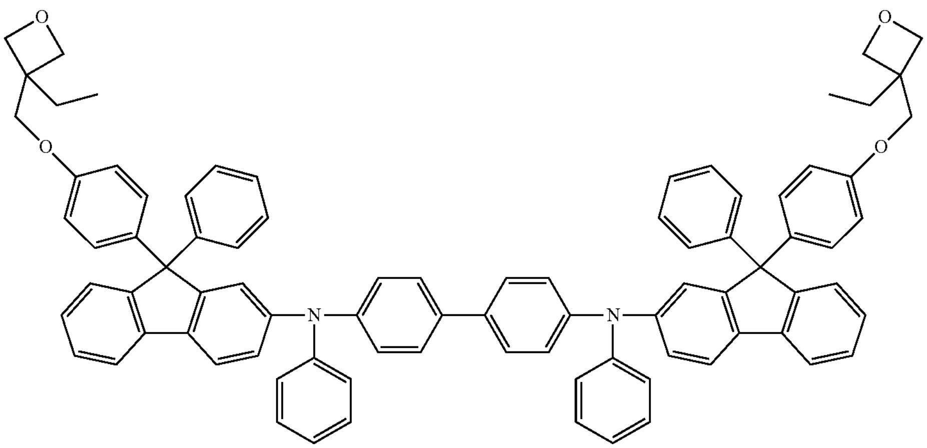
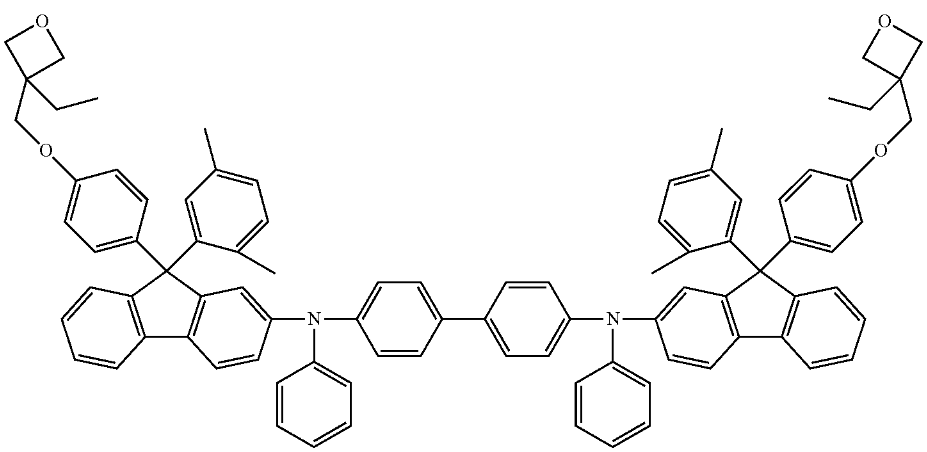
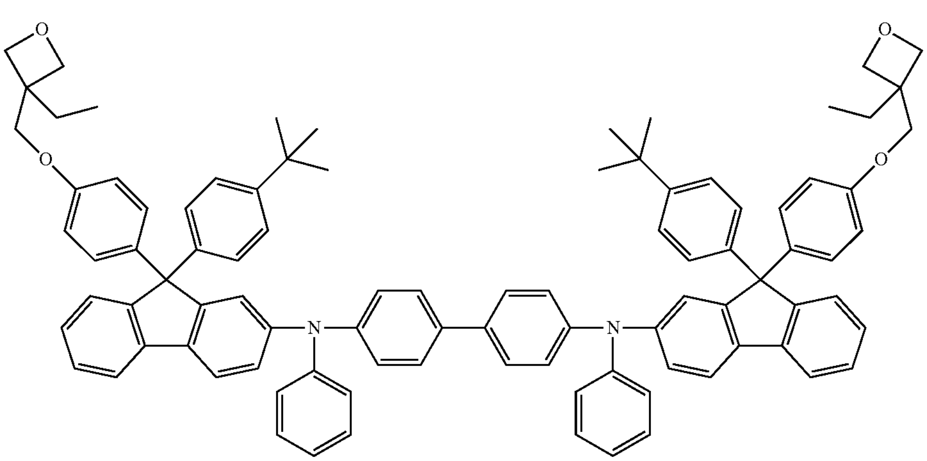

-continued
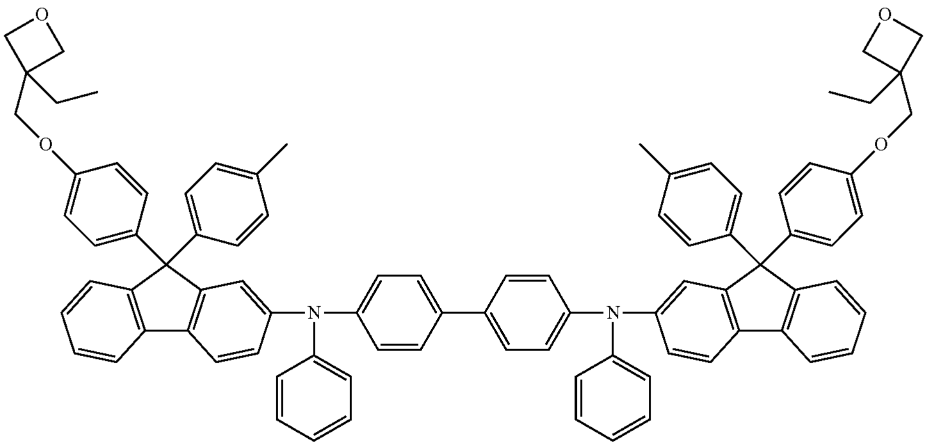
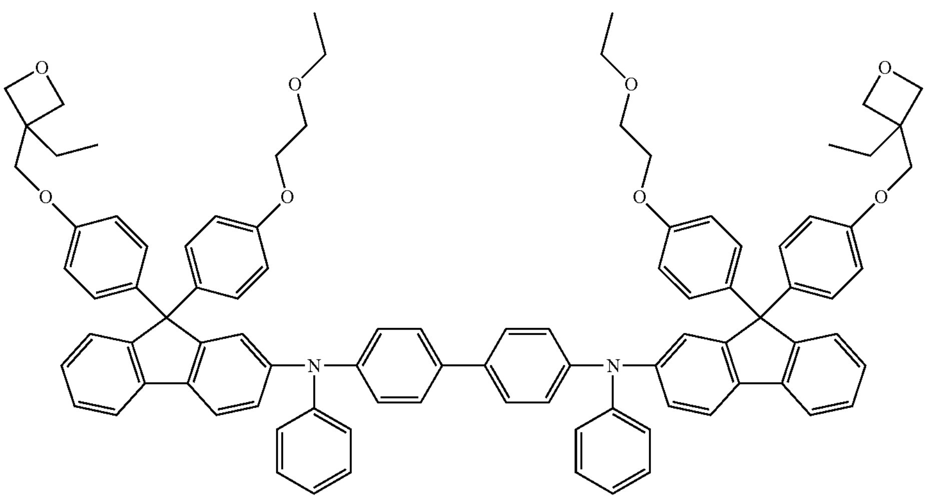
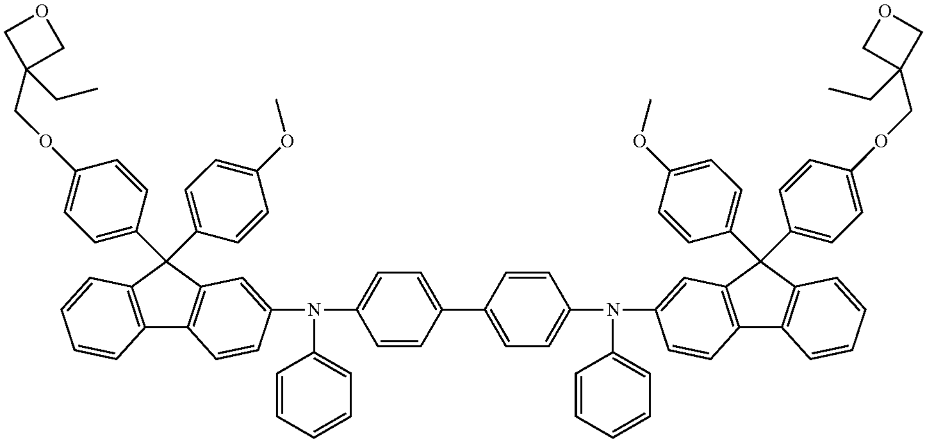

-continued
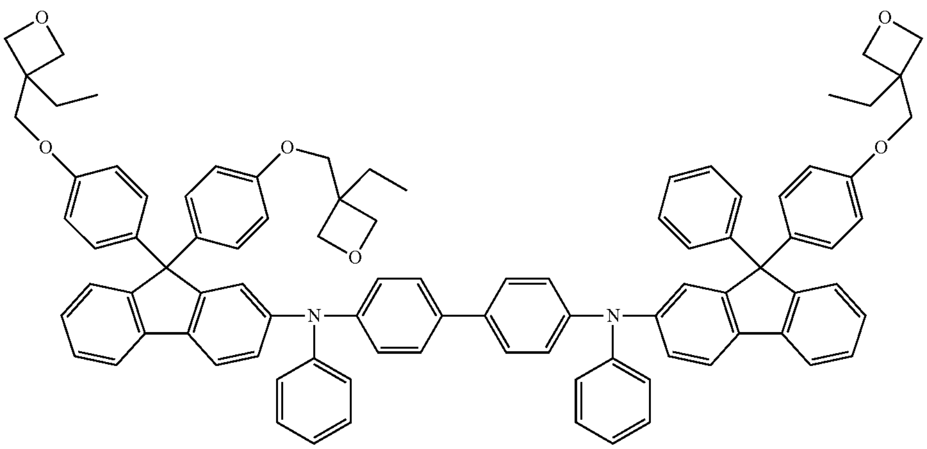
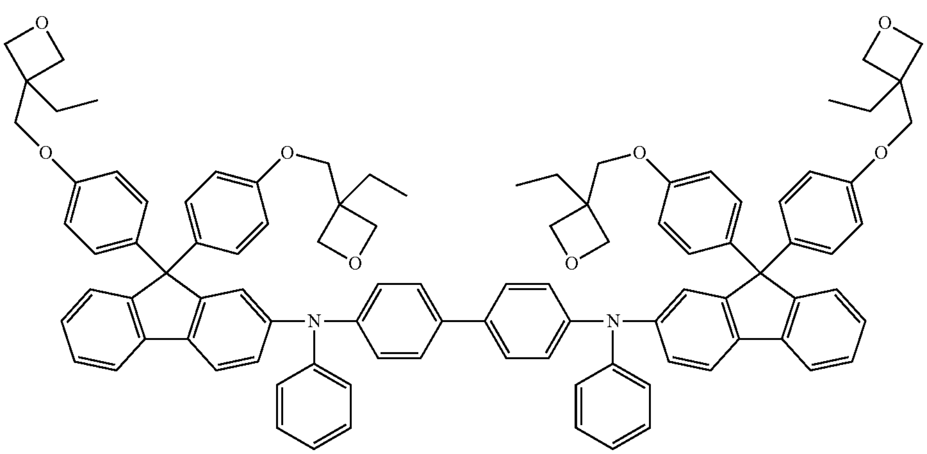
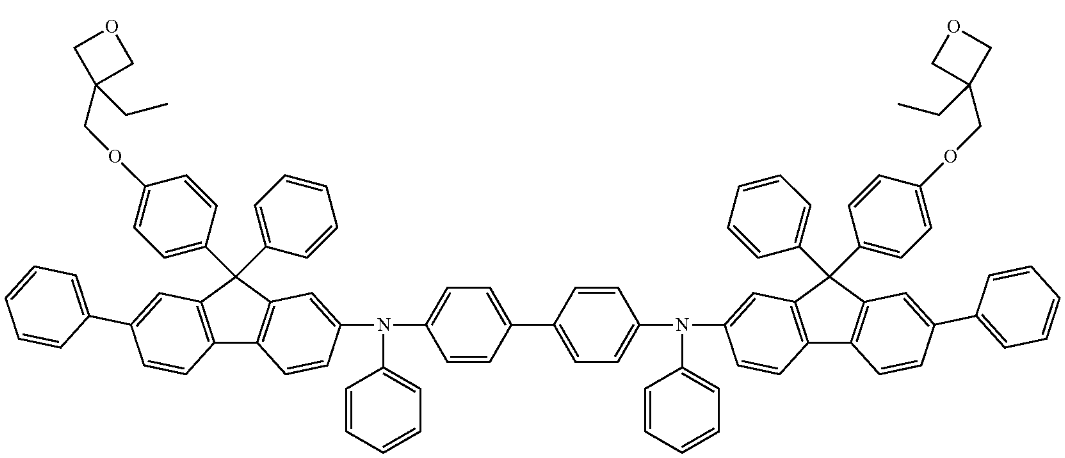

-continued
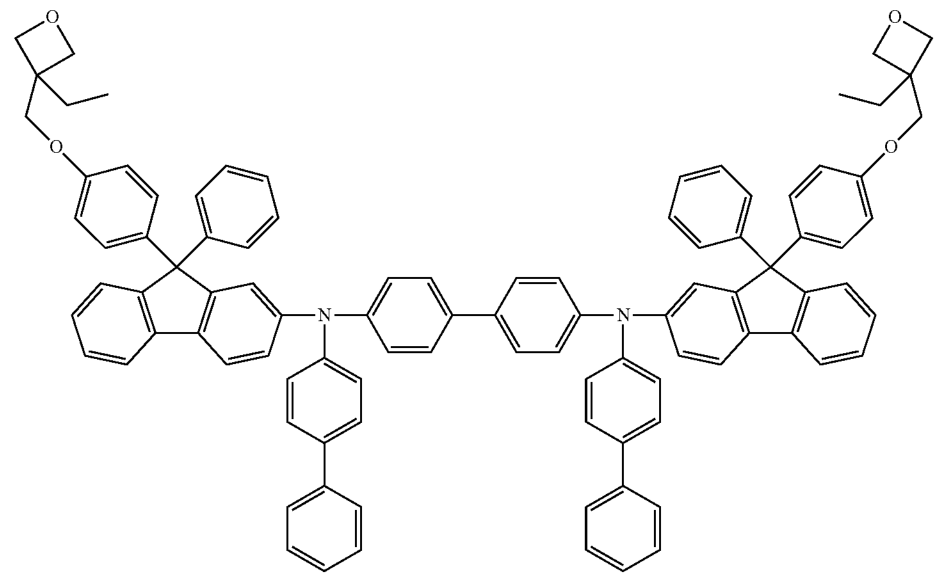
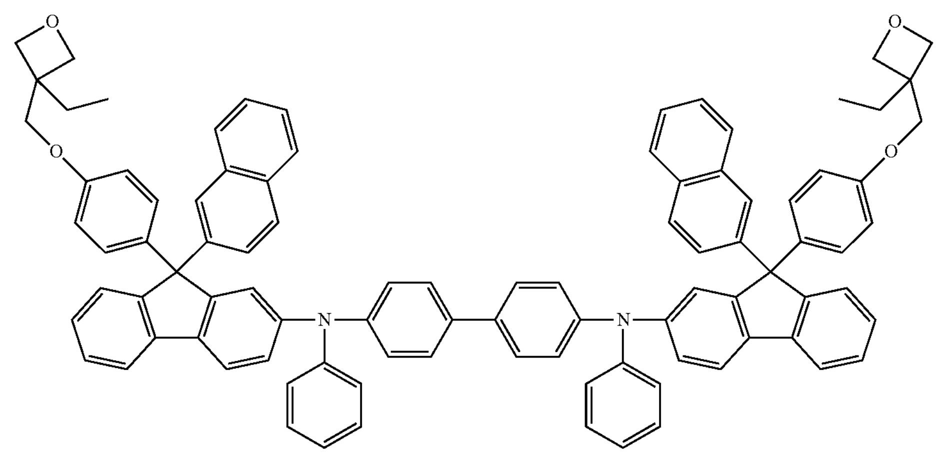
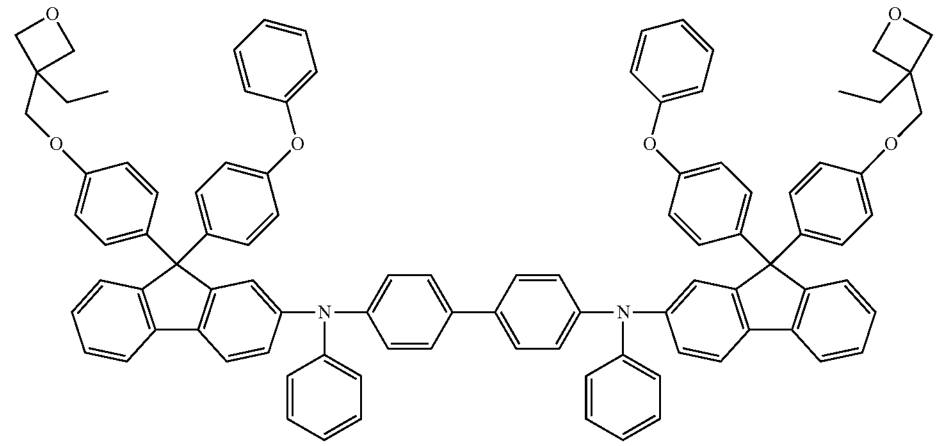

-continued
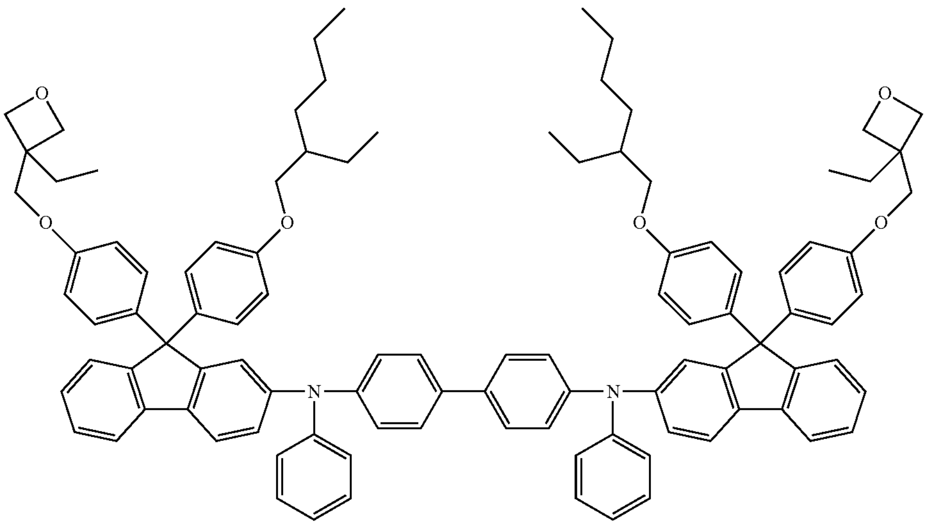
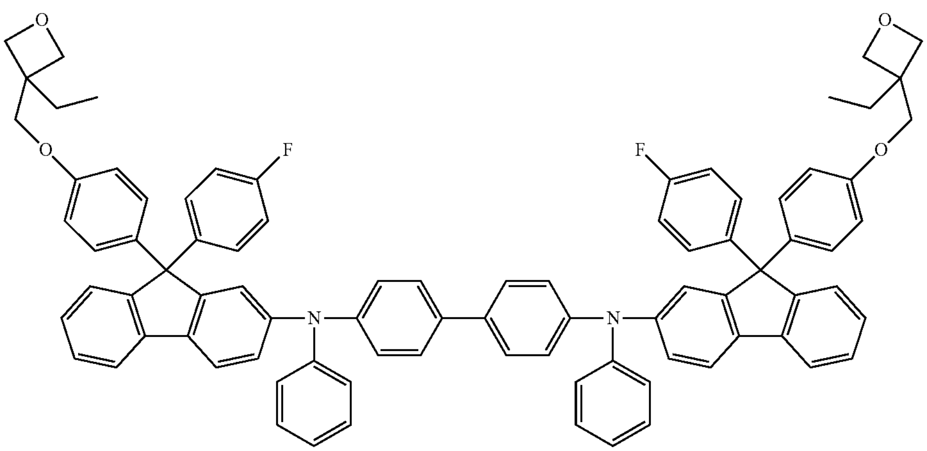
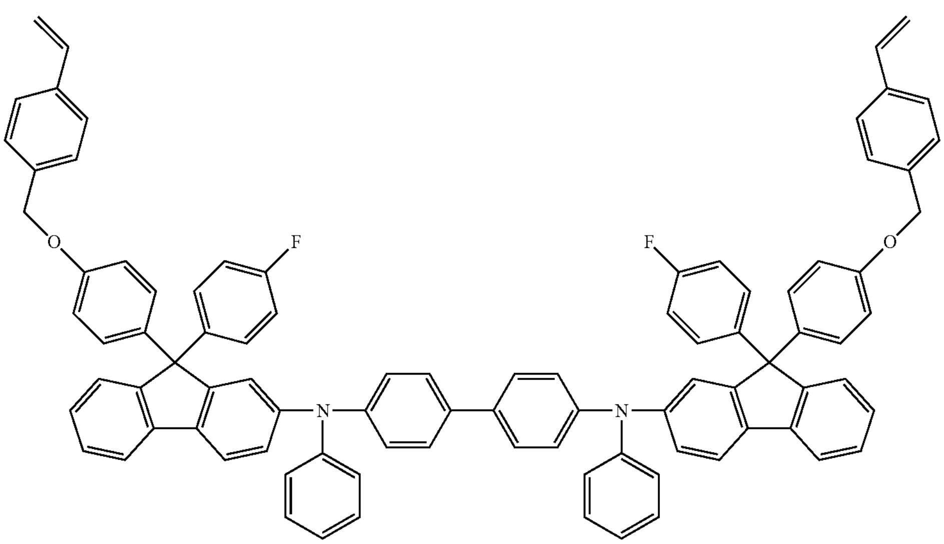

-continued
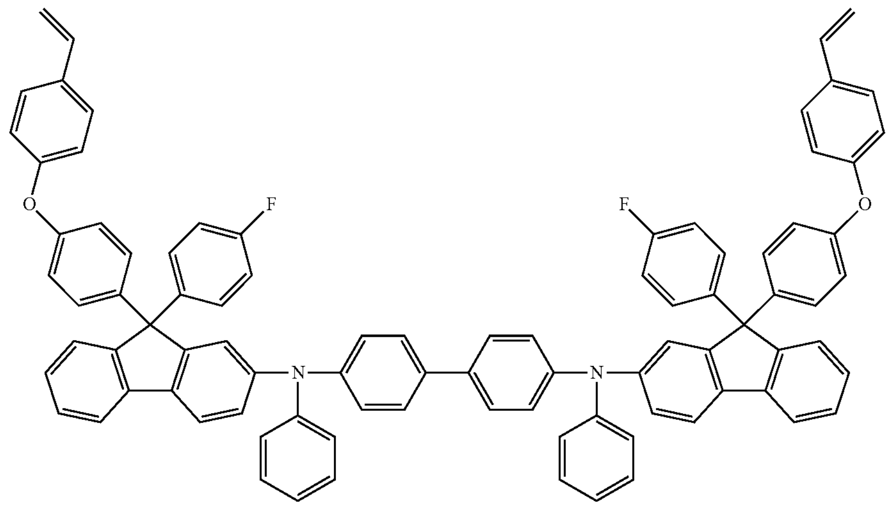
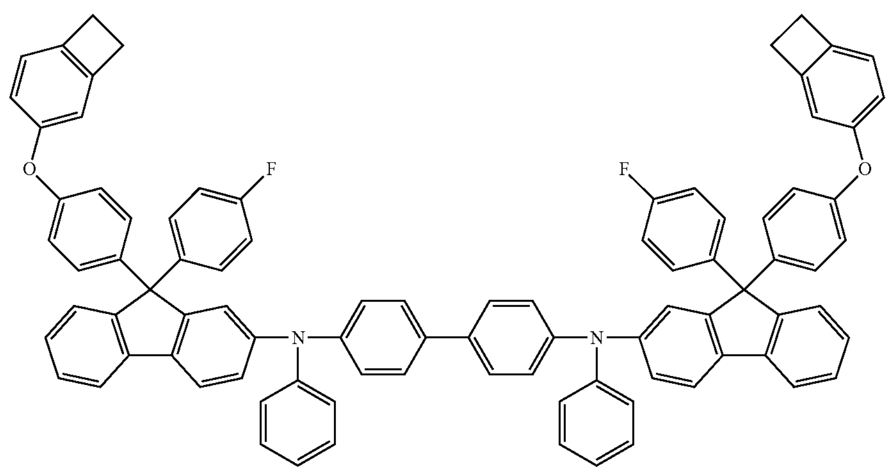
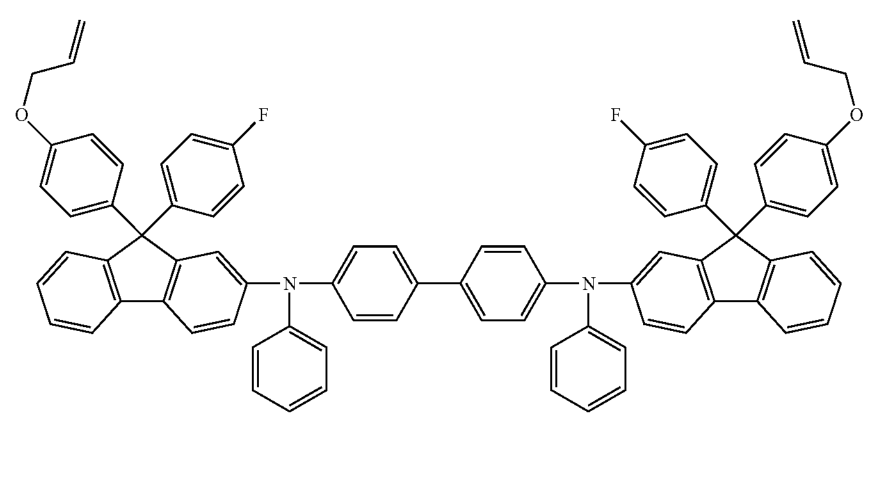

-continued
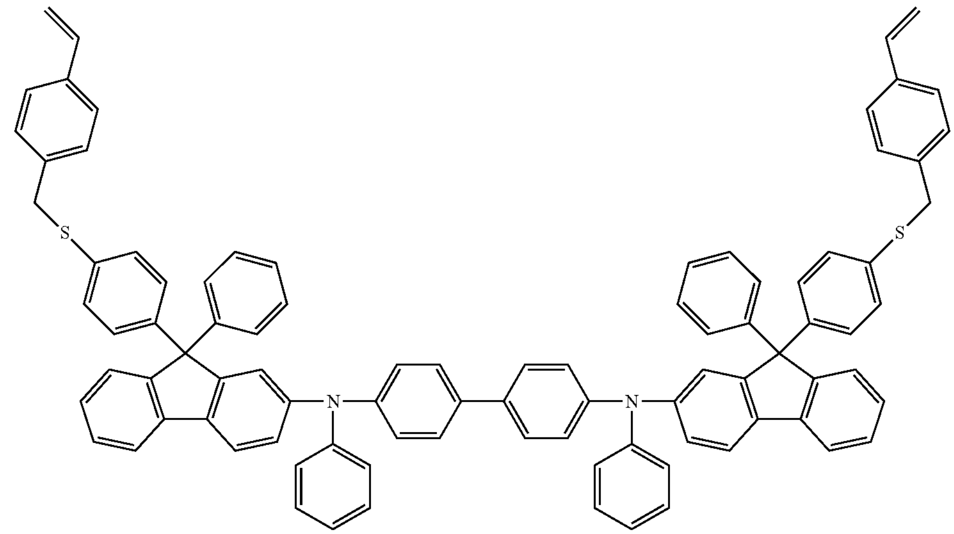
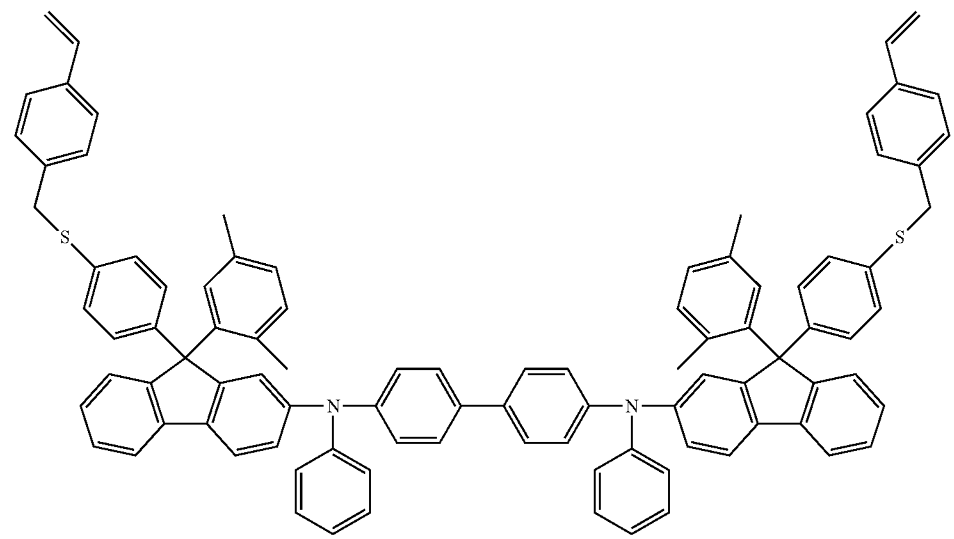
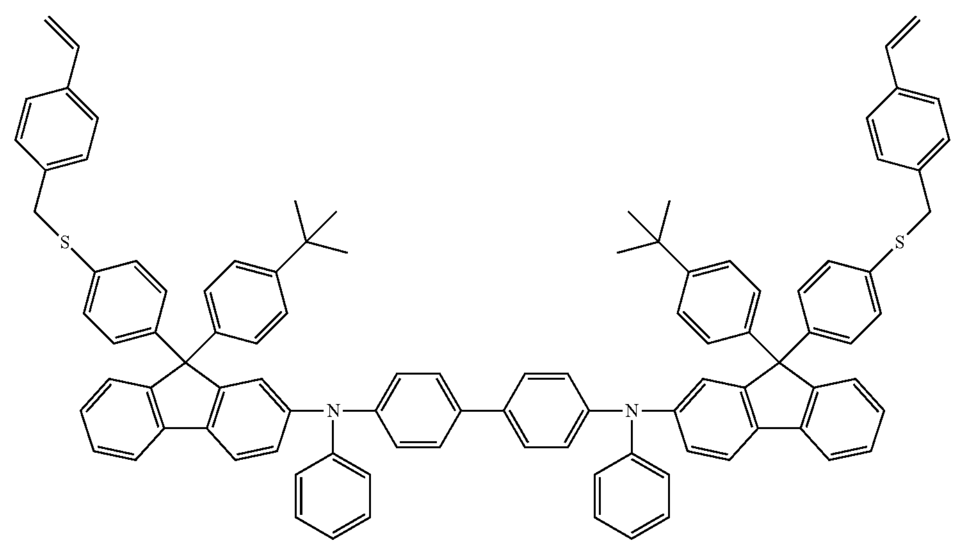

-continued
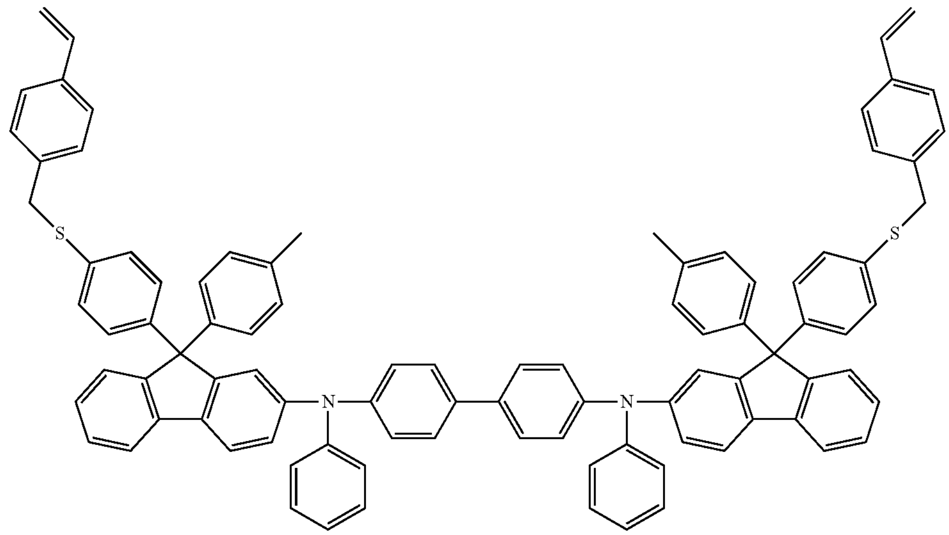
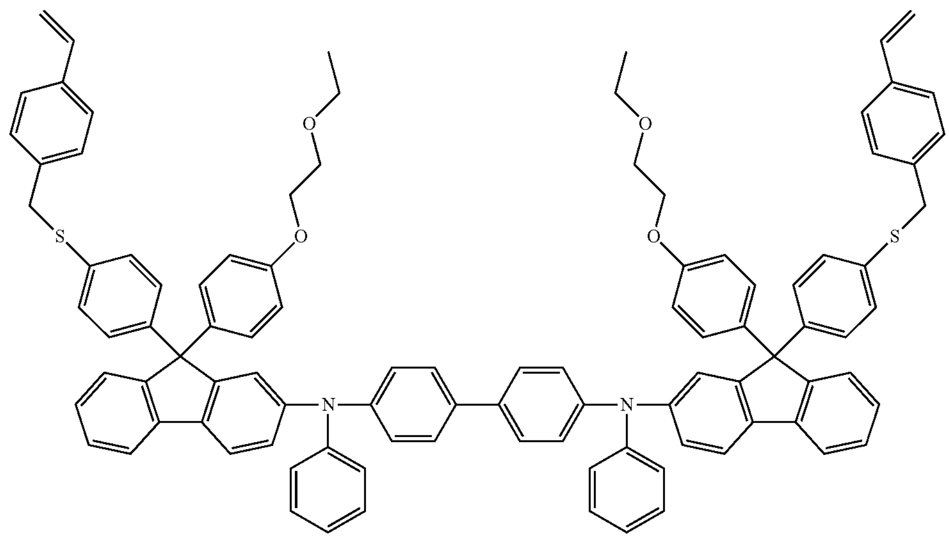
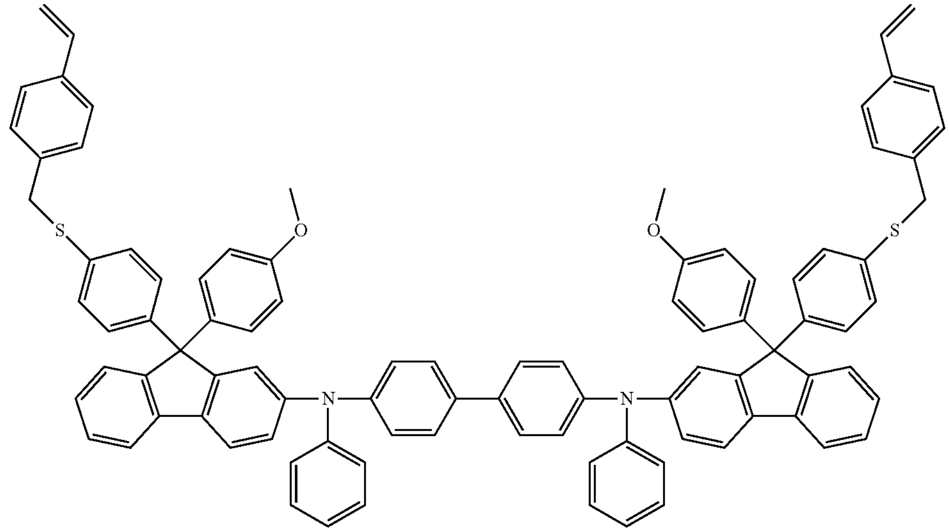

-continued
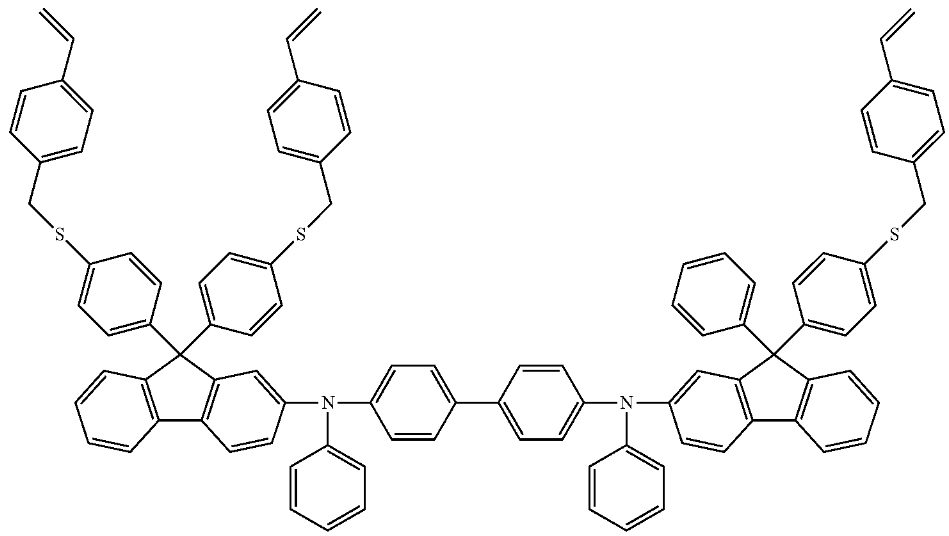
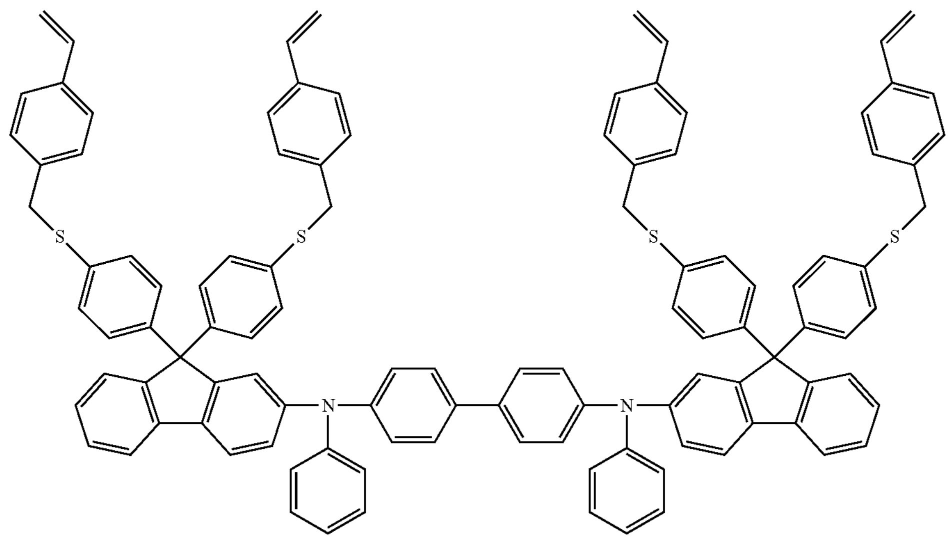
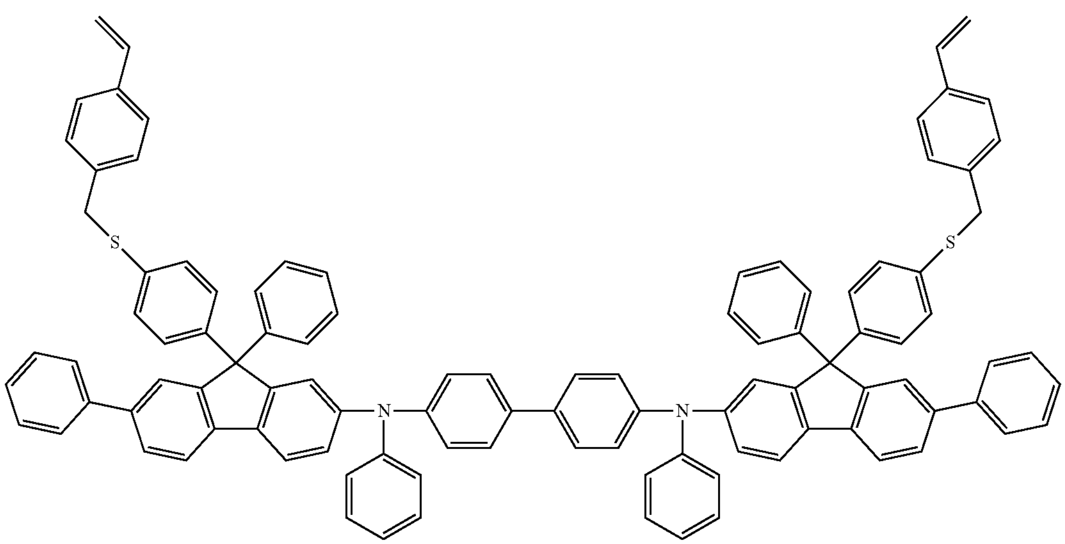

-continued
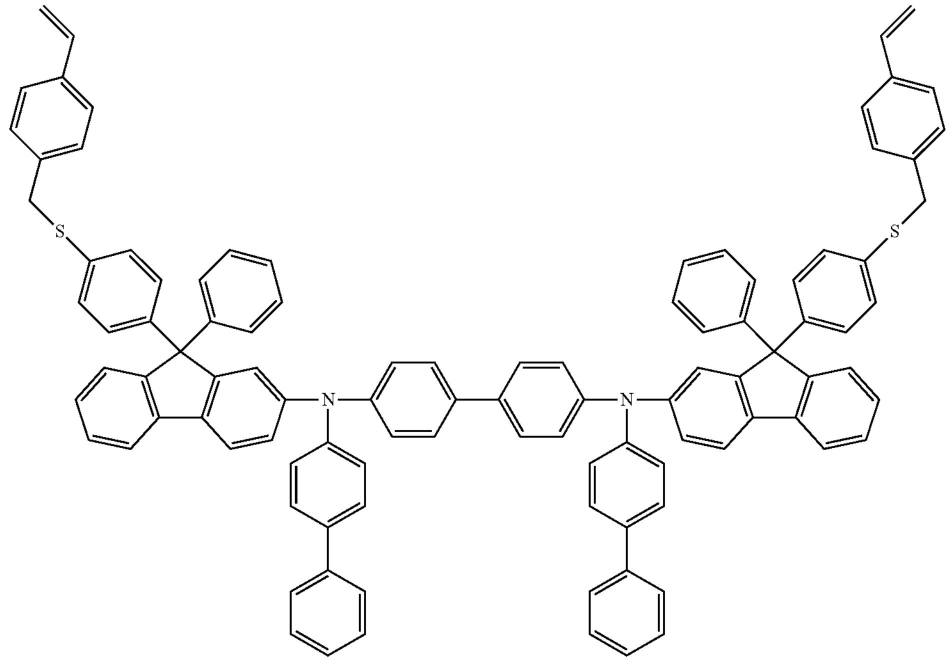
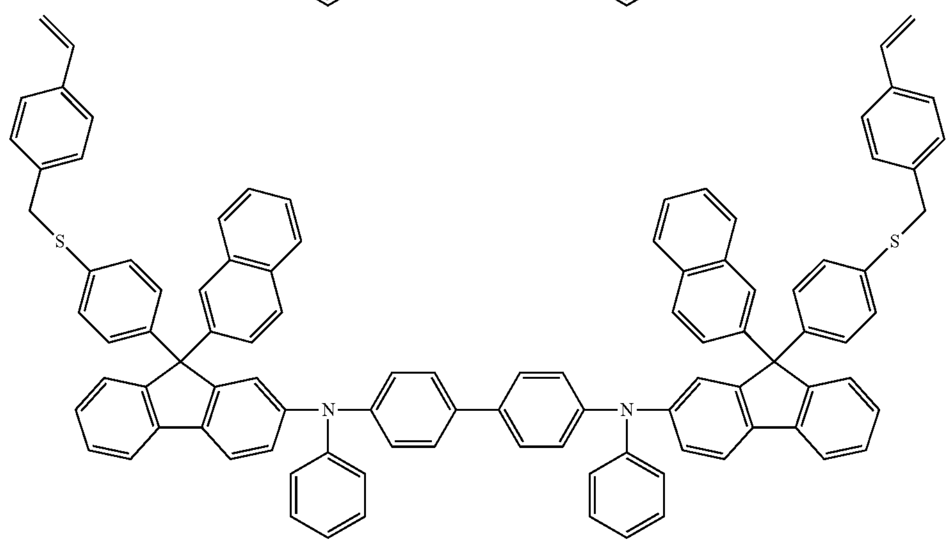
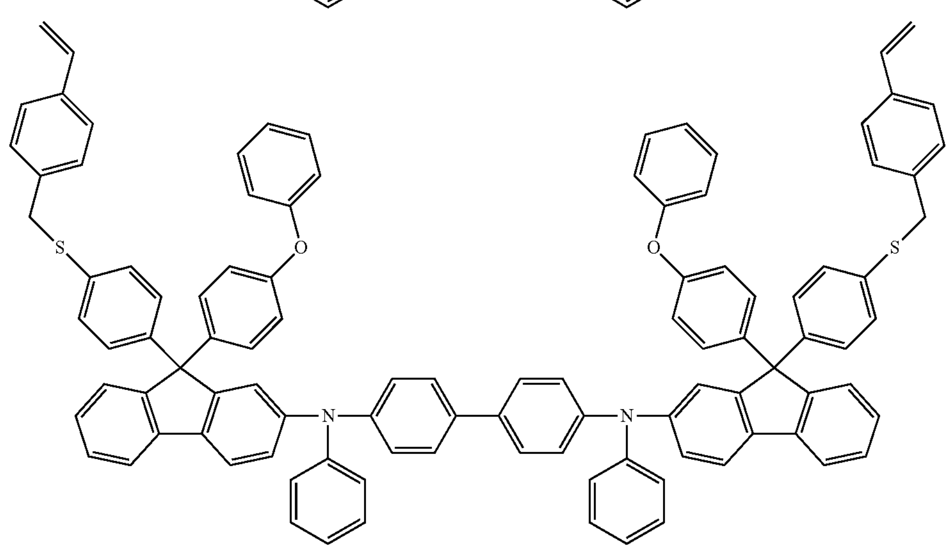

-continued
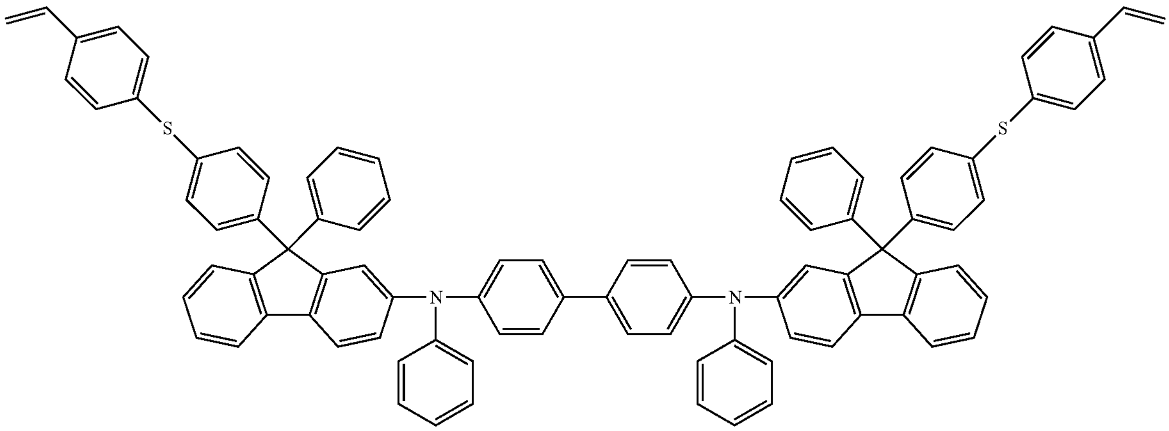
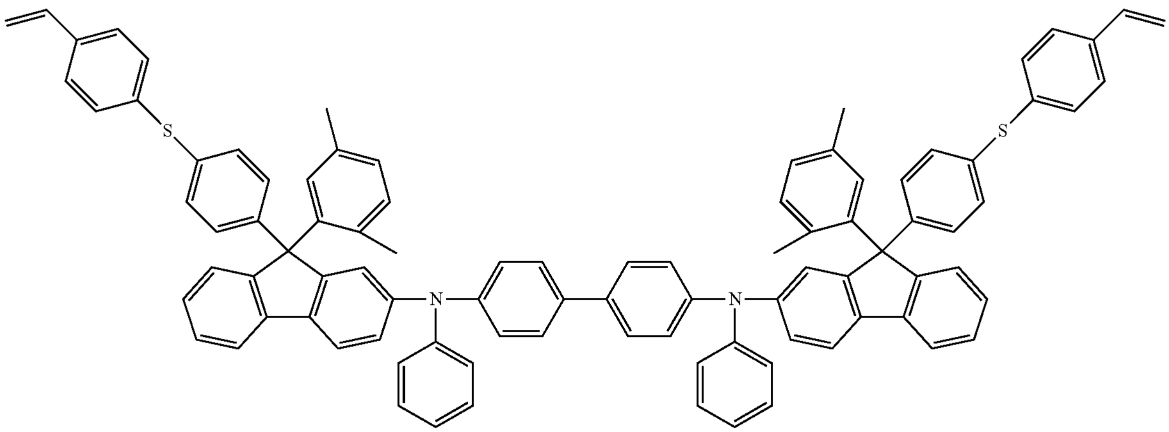
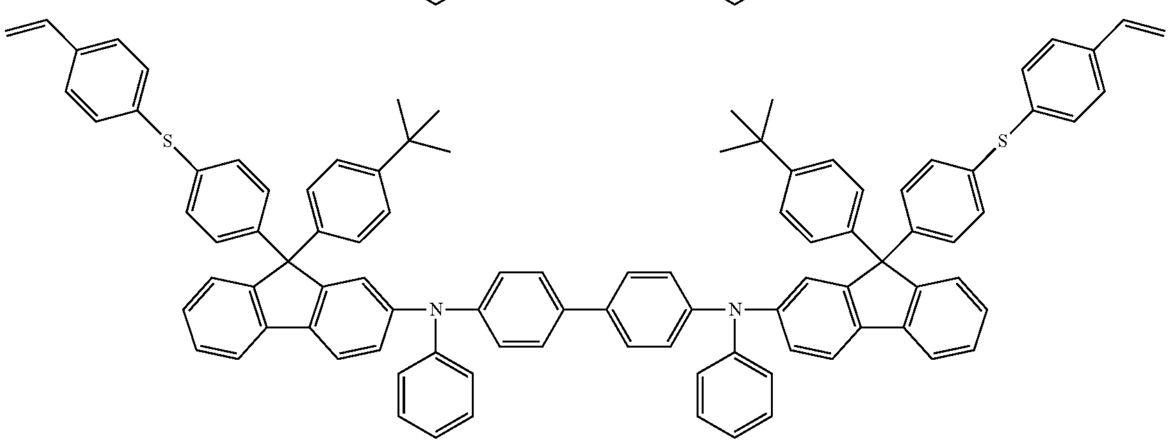
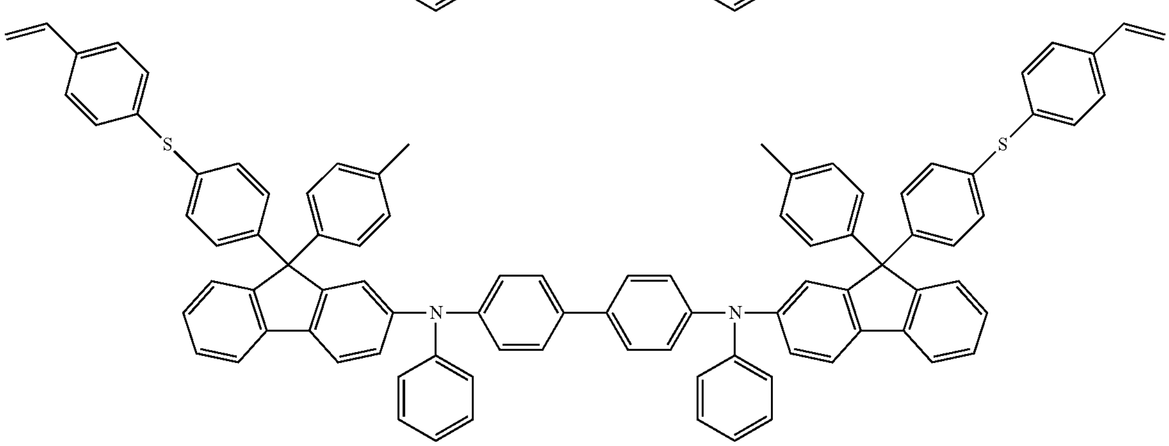

-continued
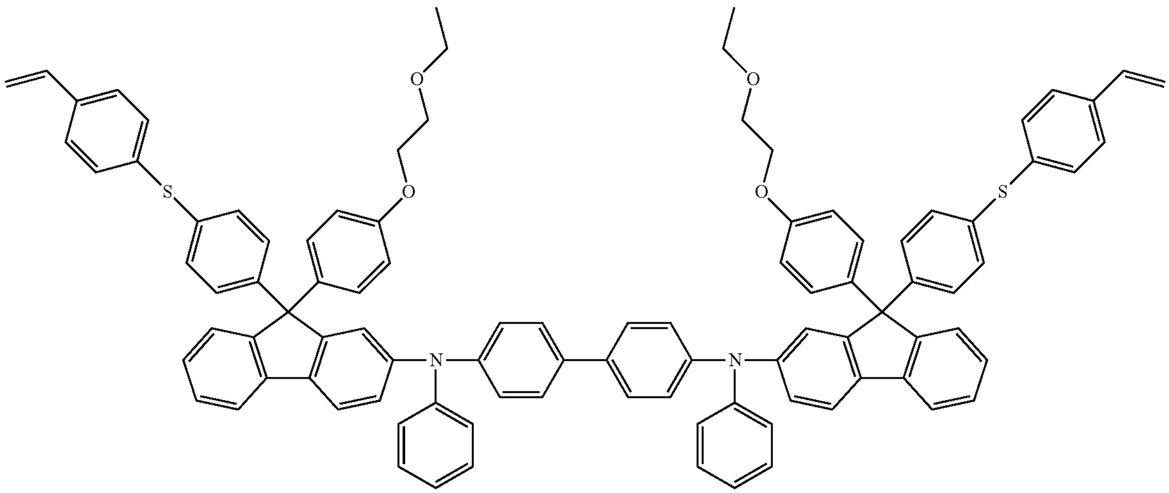
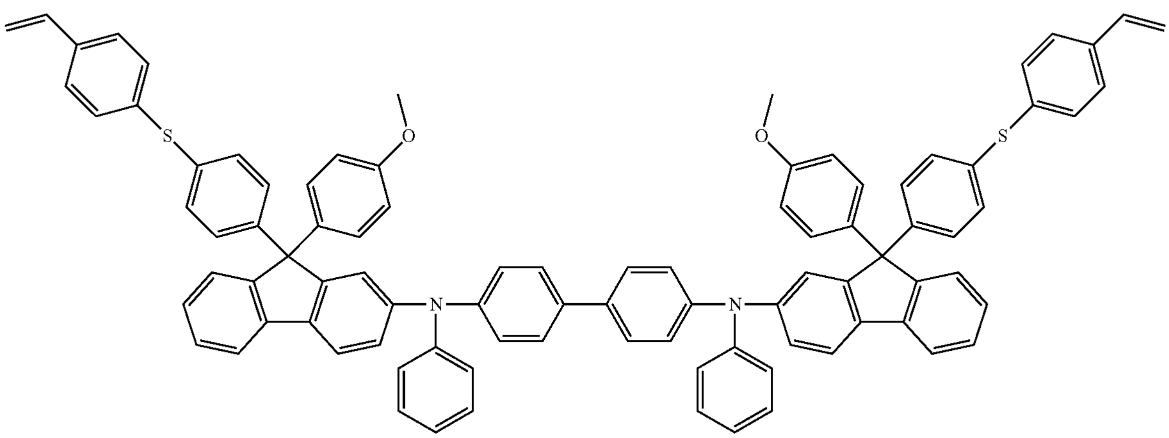
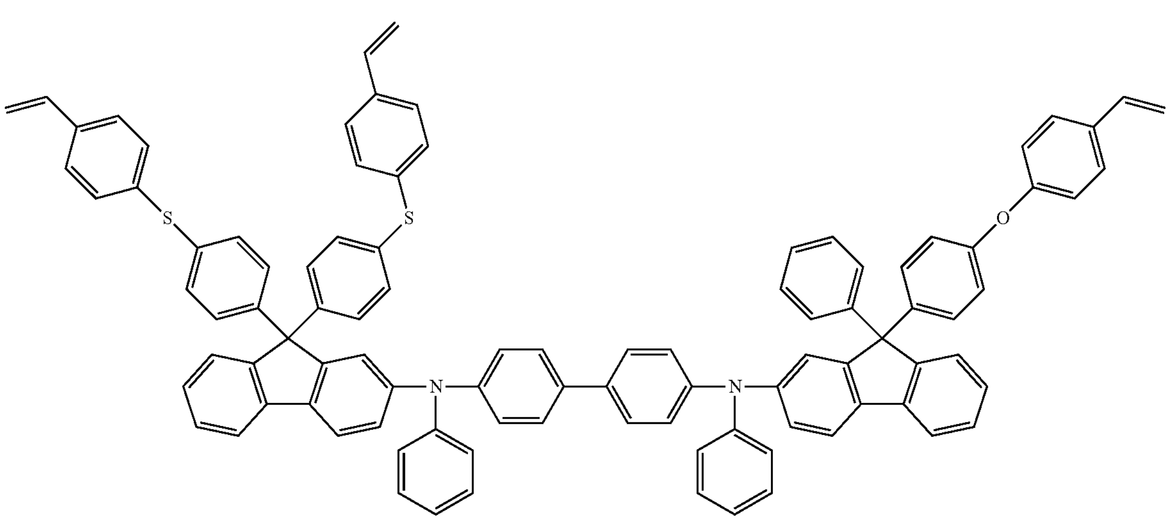

-continued
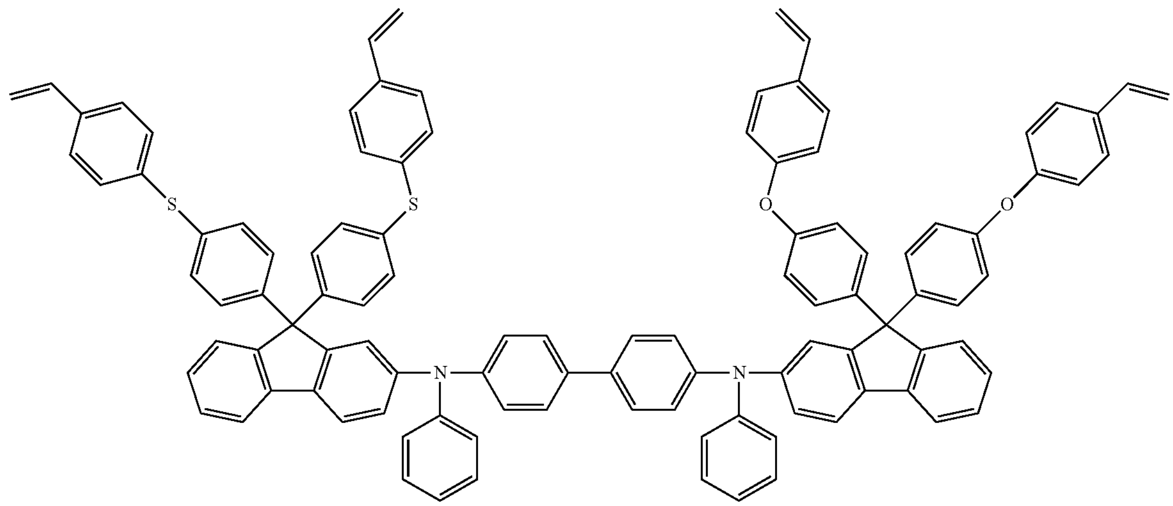
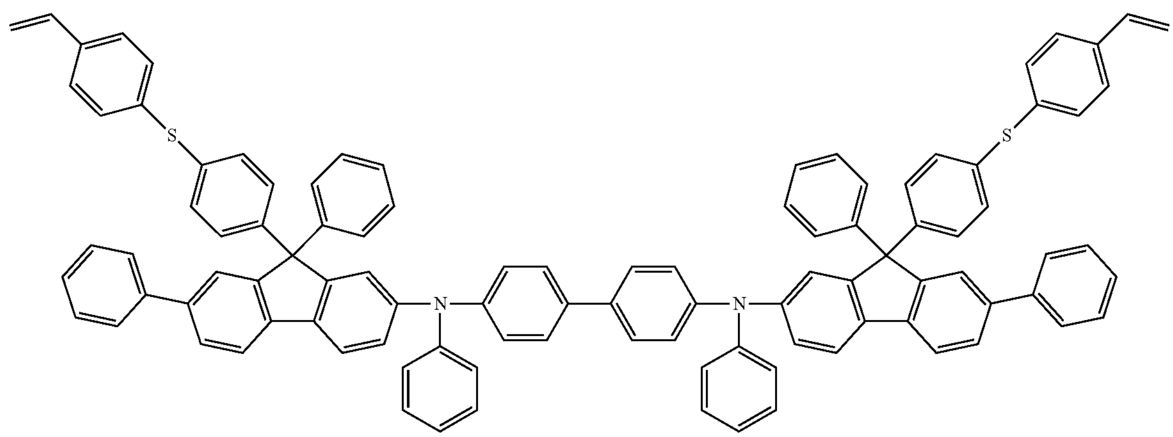
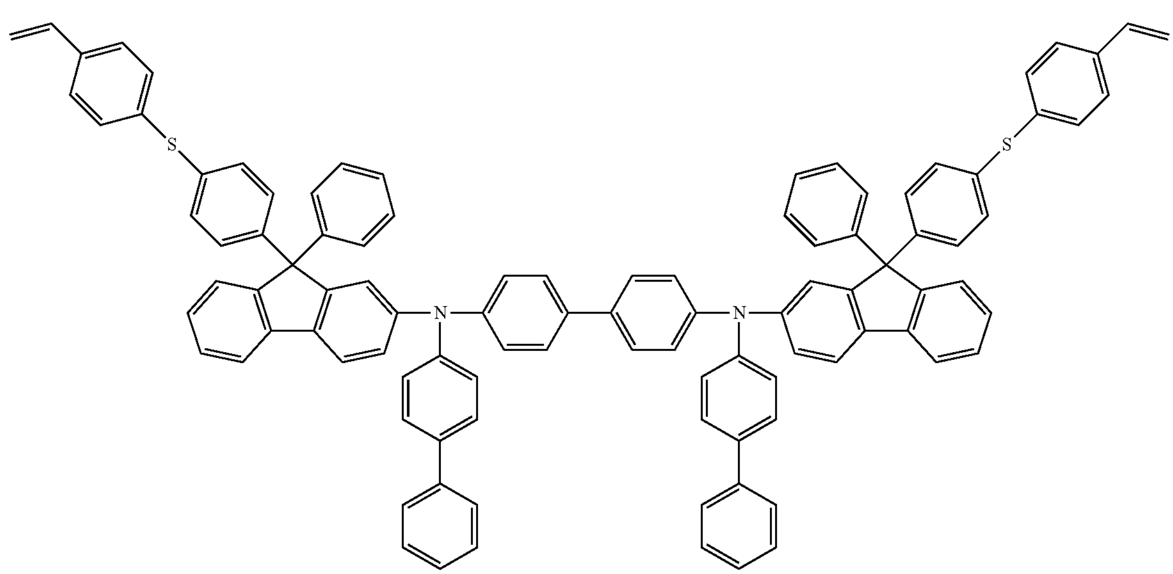

-continued
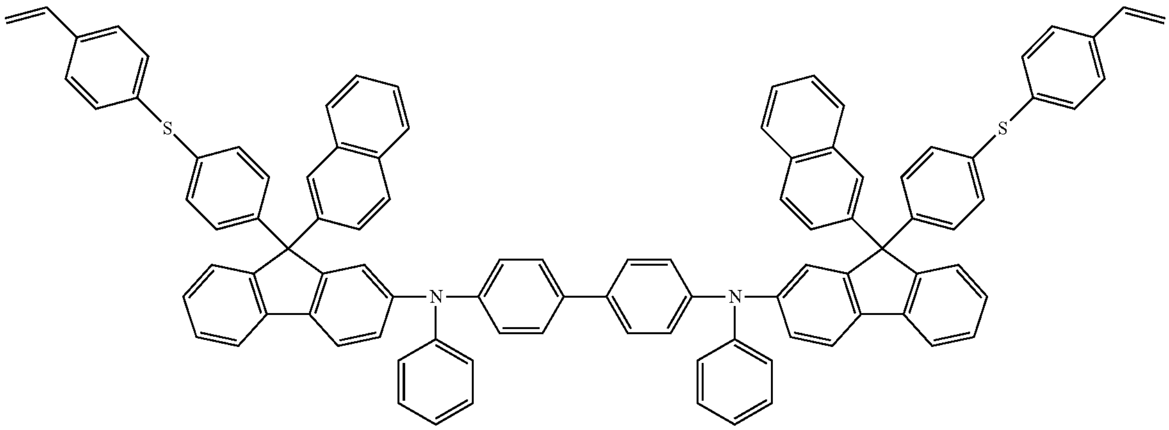
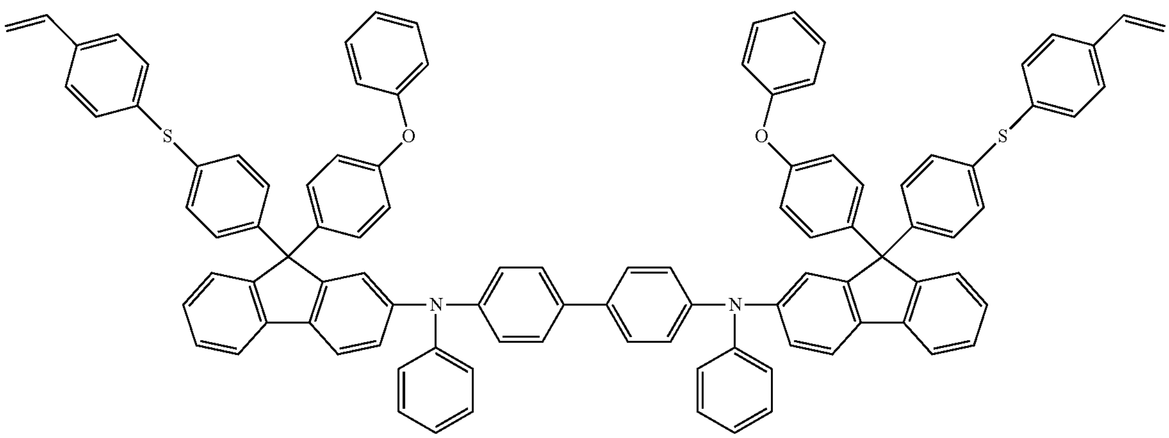
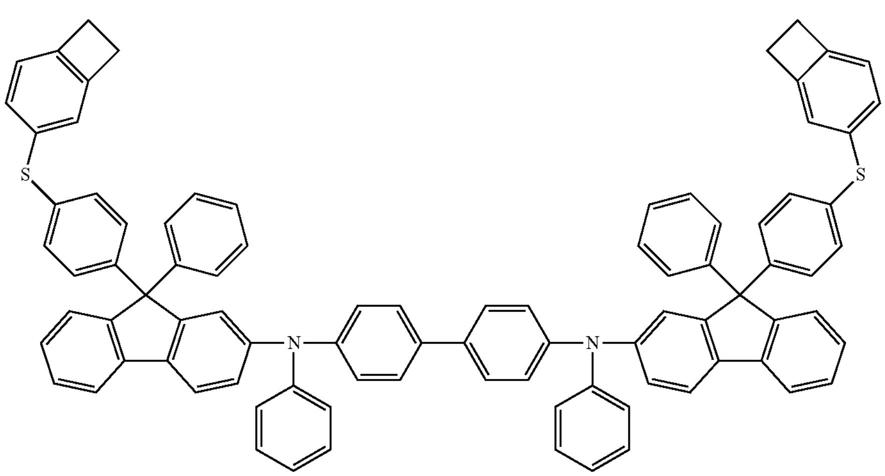

-continued
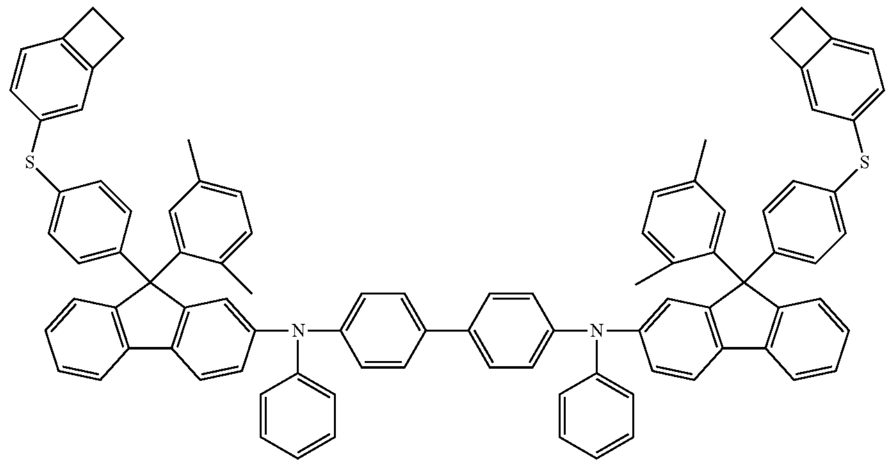
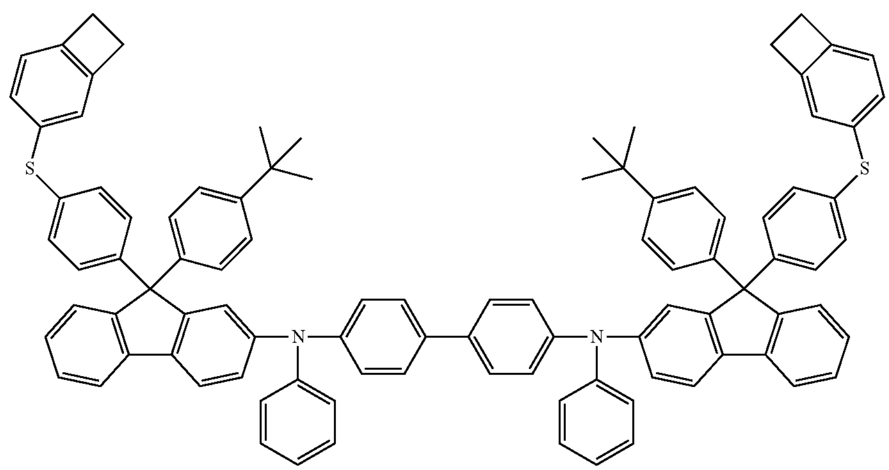
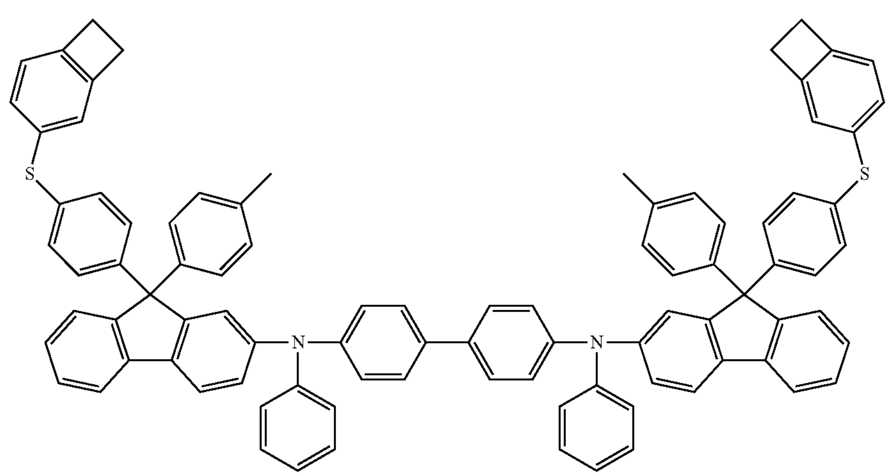

-continued
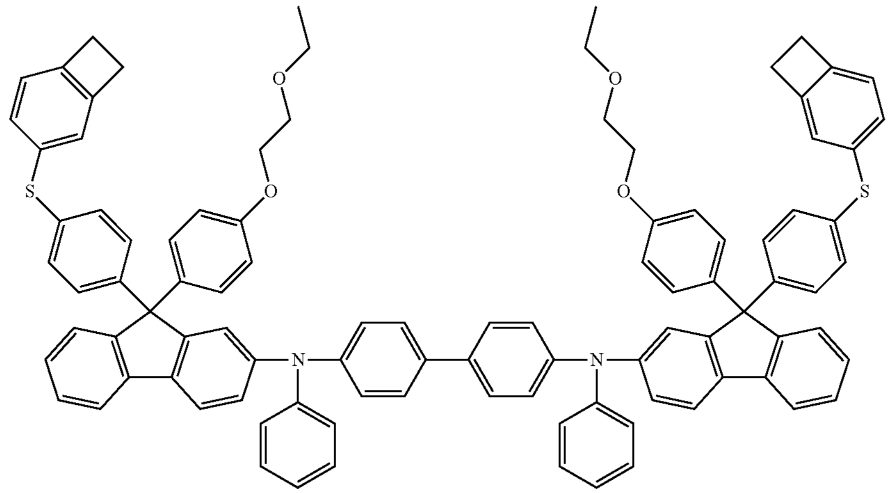
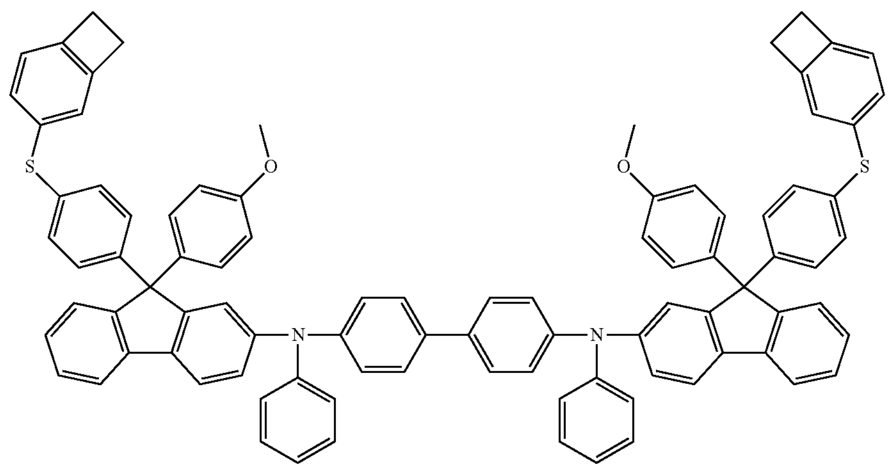
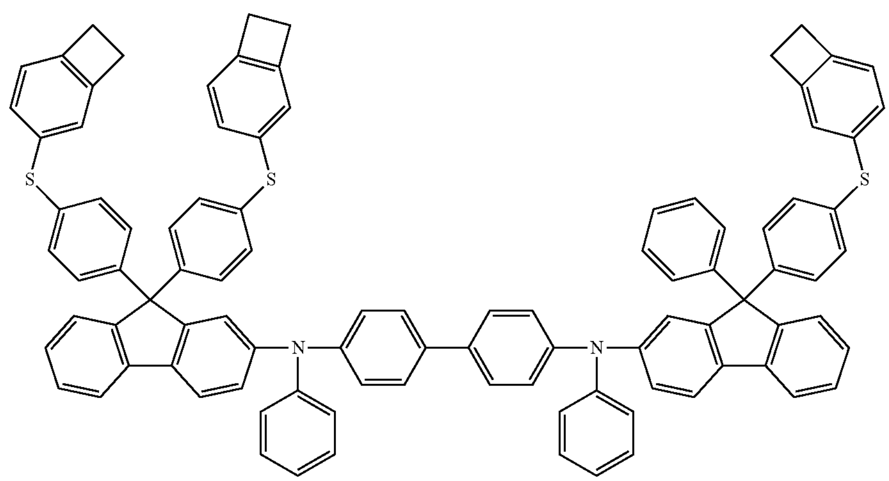

-continued
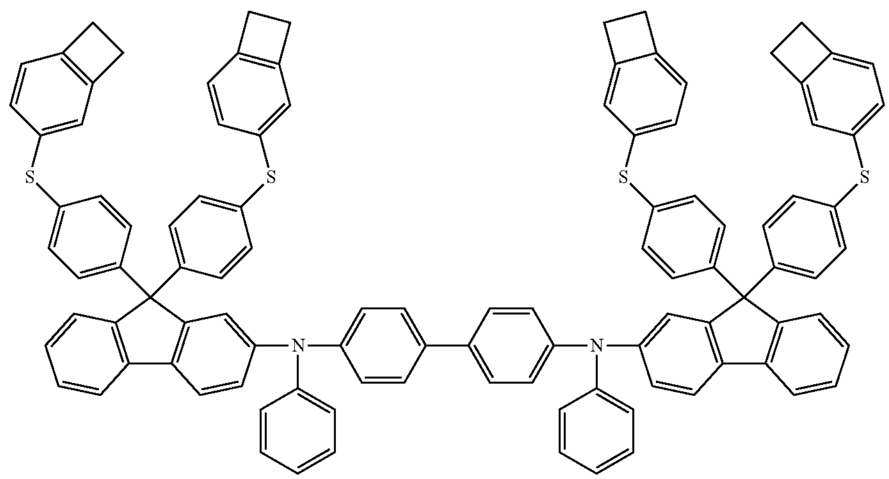
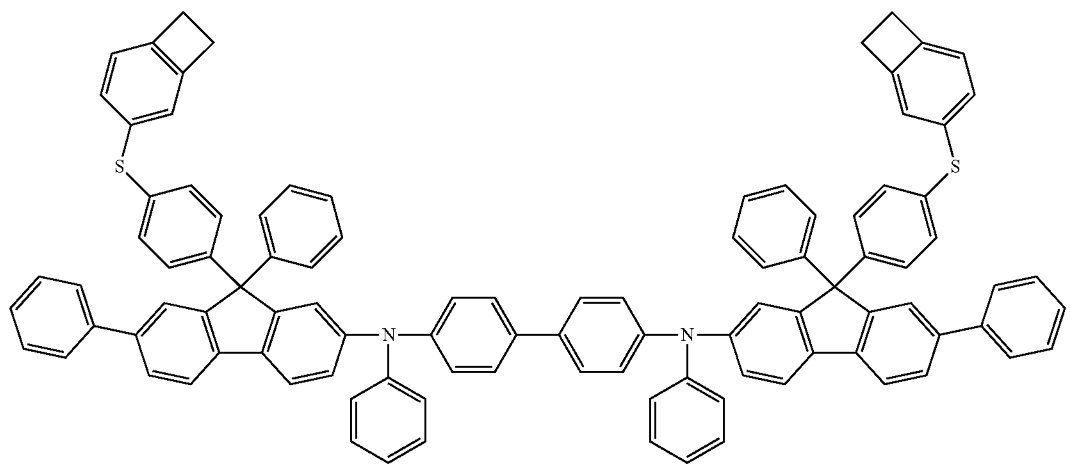
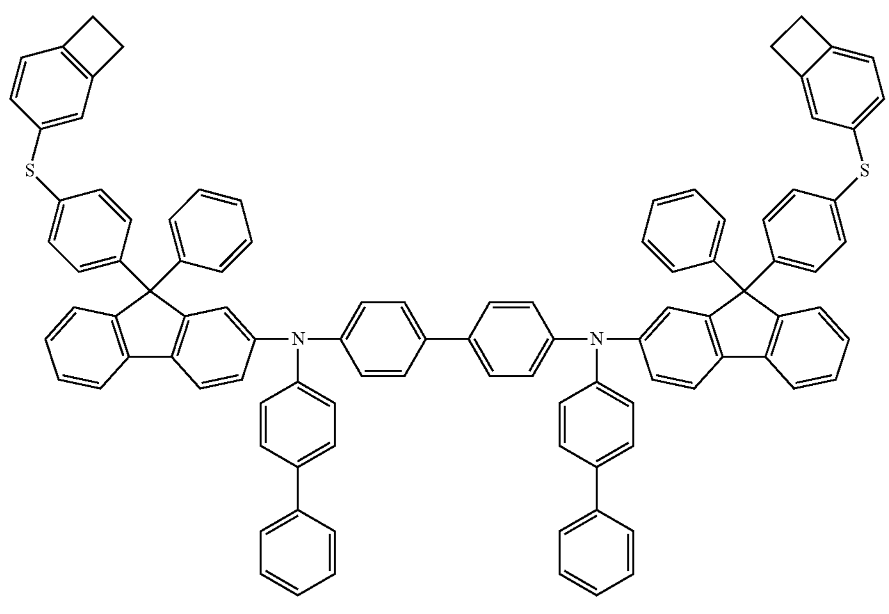

-continued
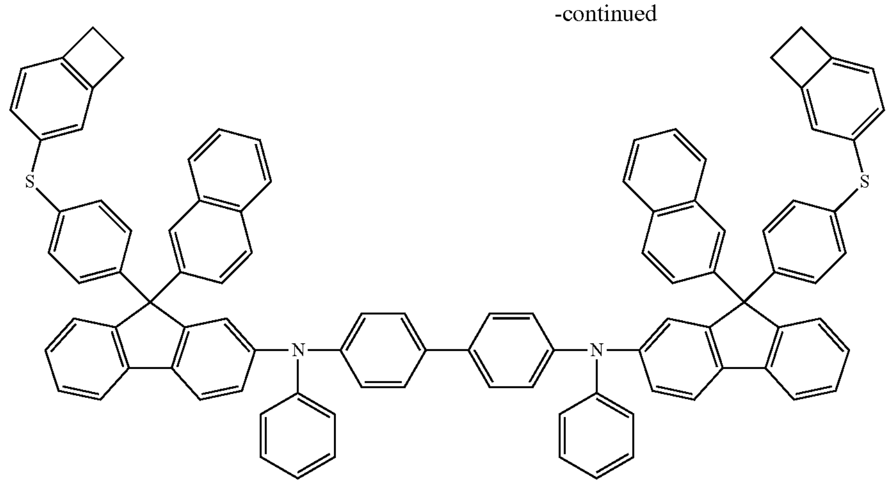
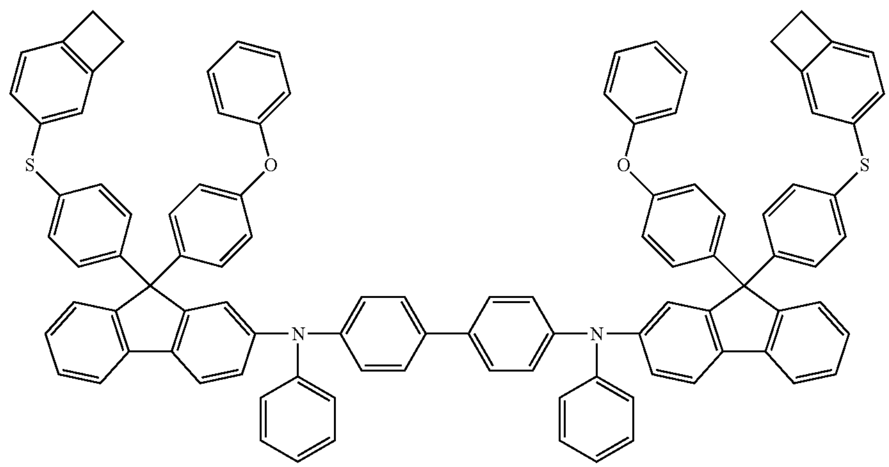
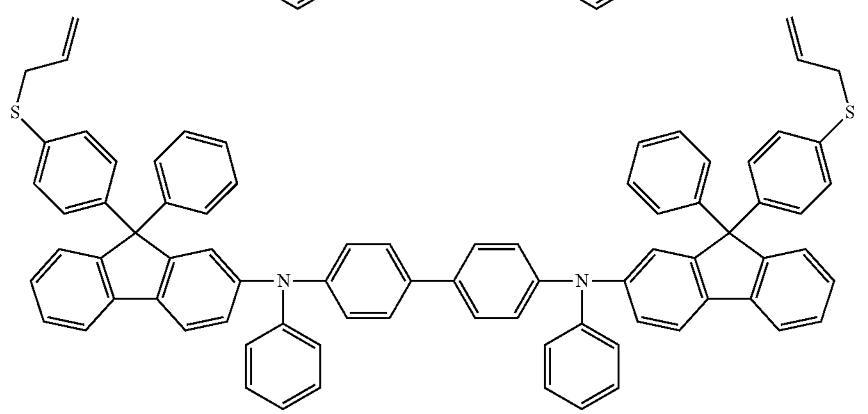
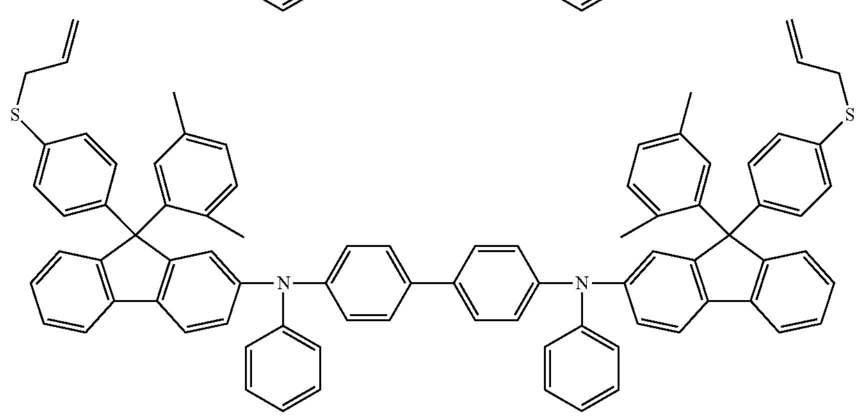

-continued
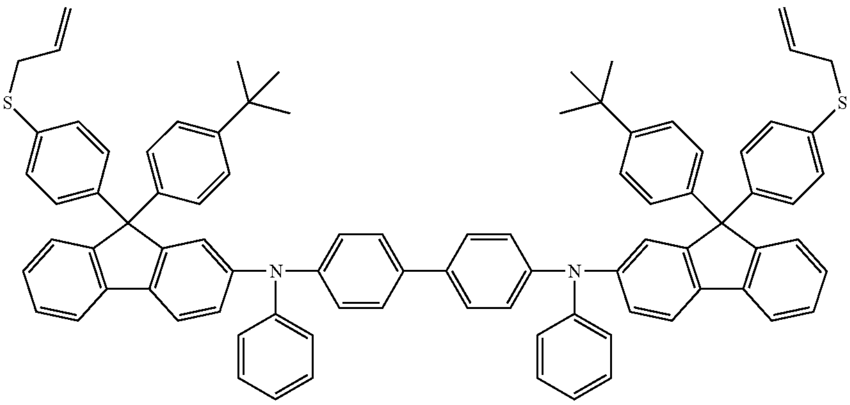
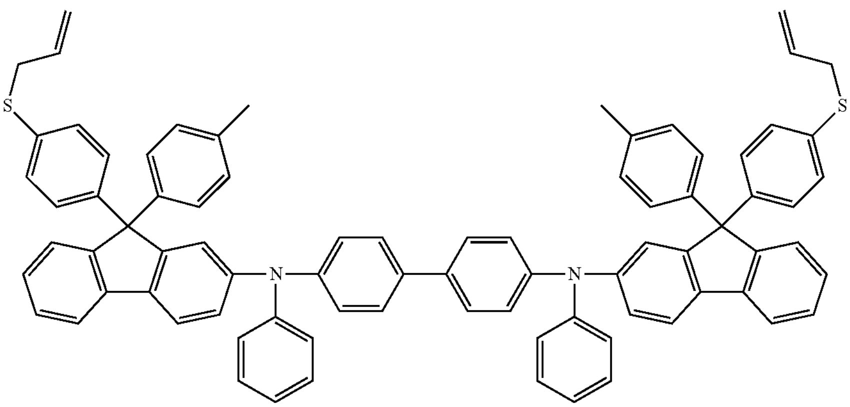
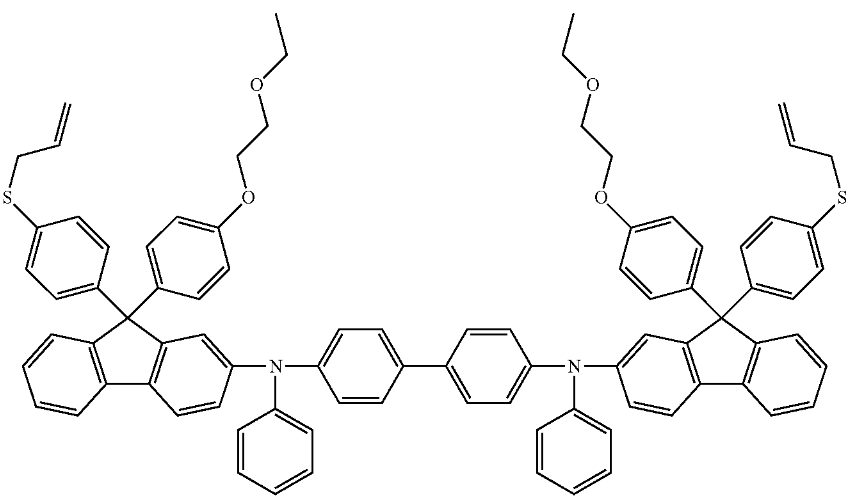
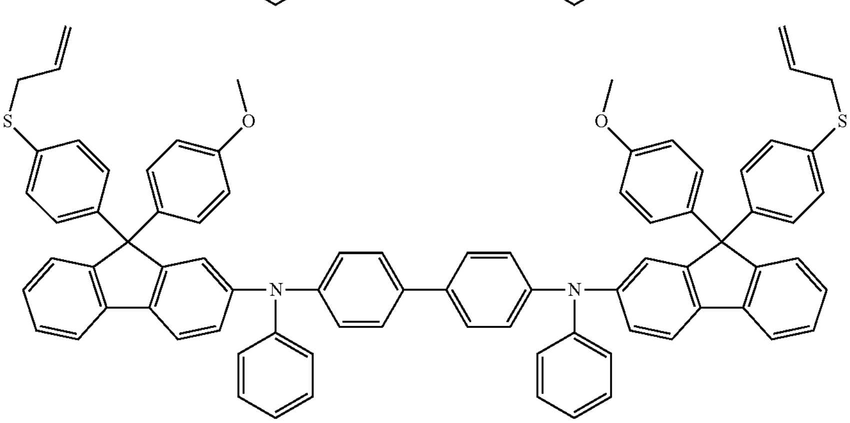

-continued
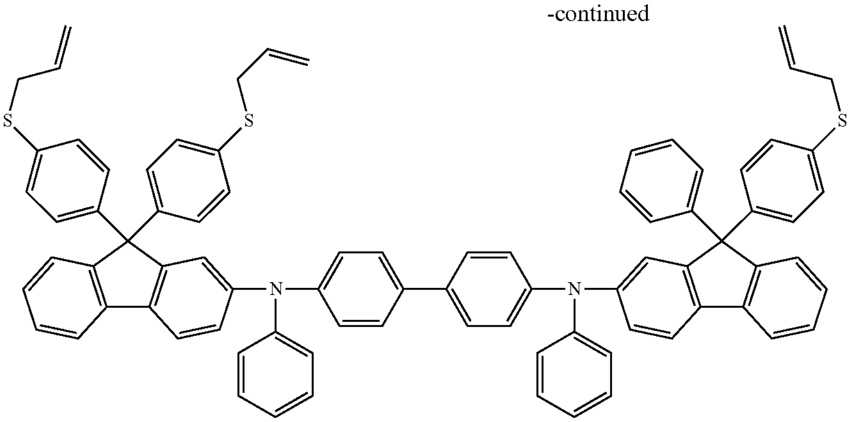
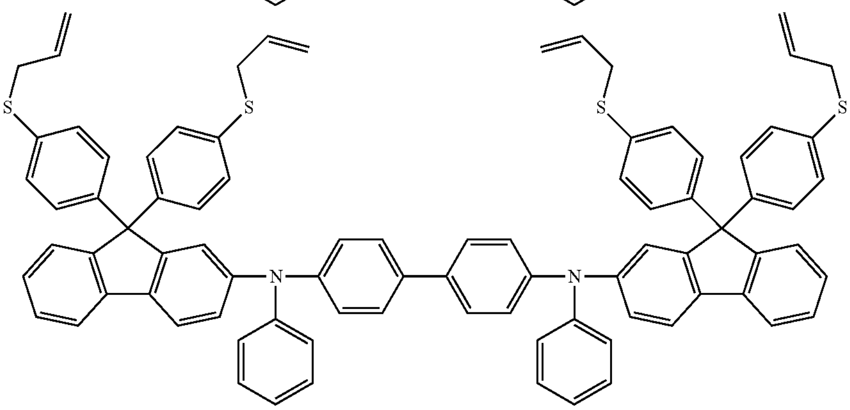
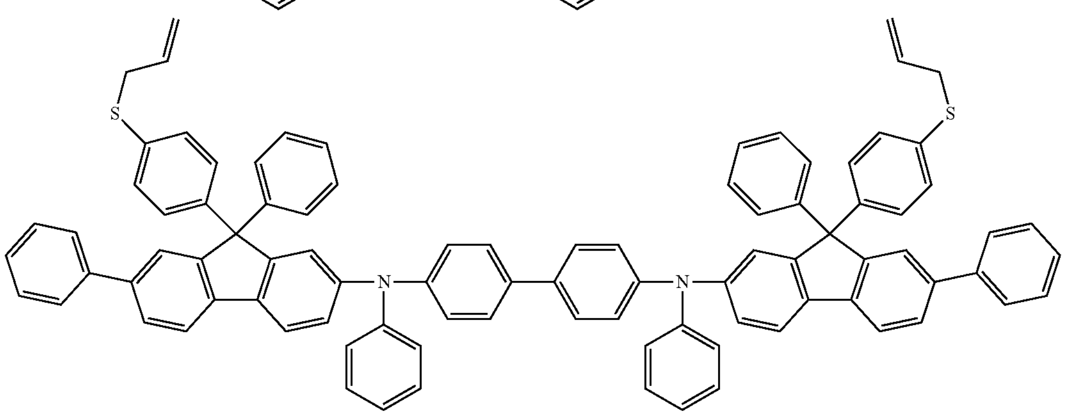
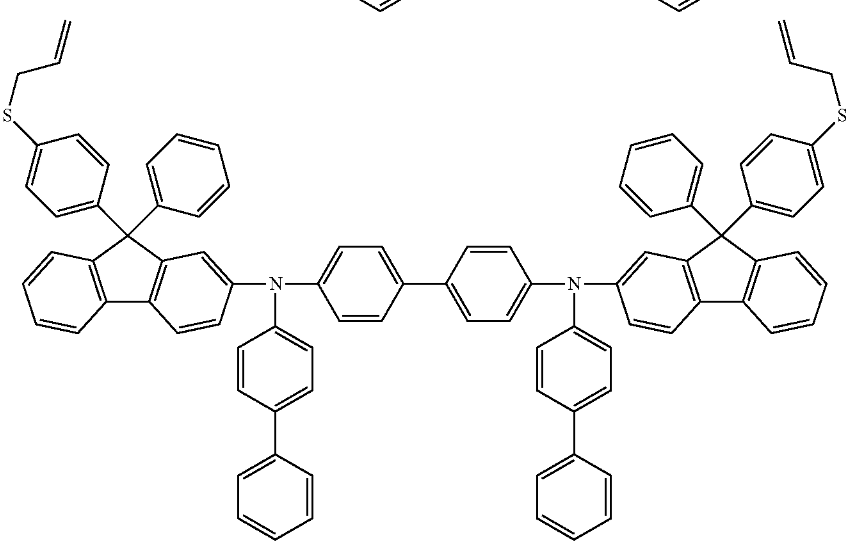

-continued
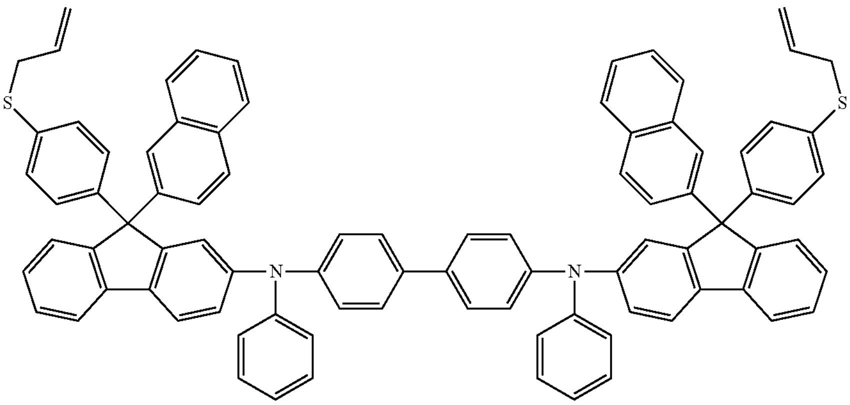
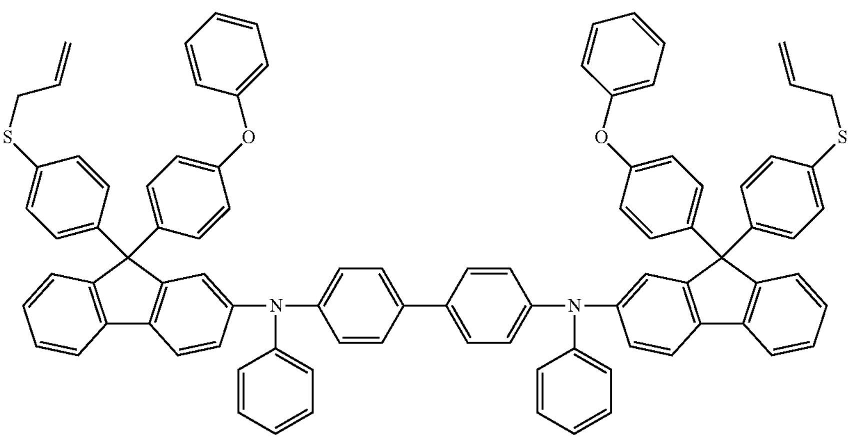
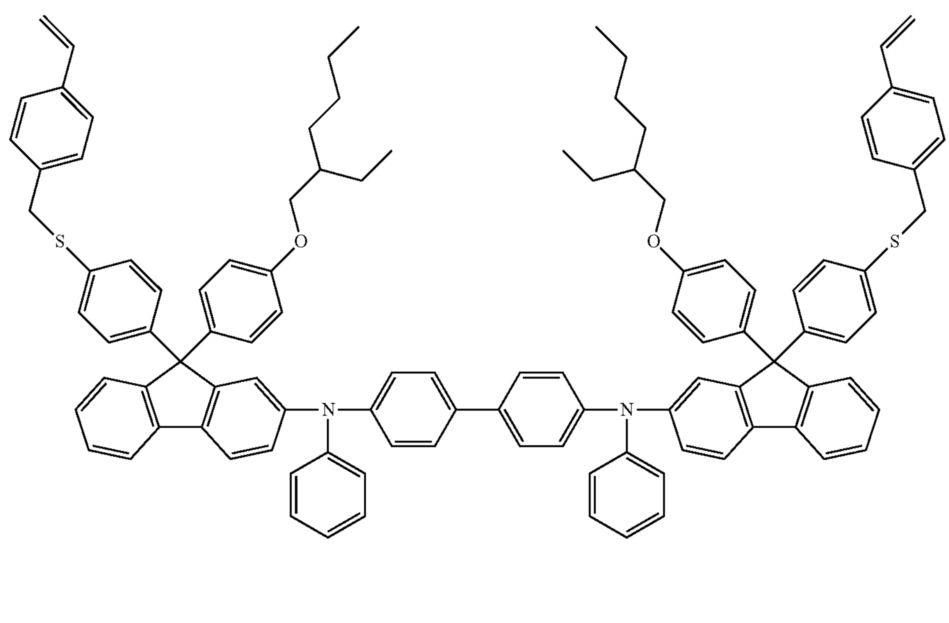

-continued
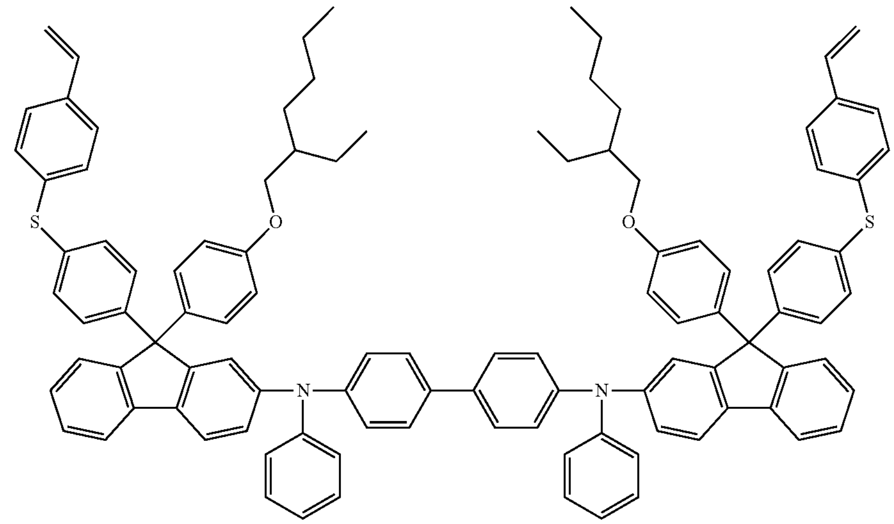
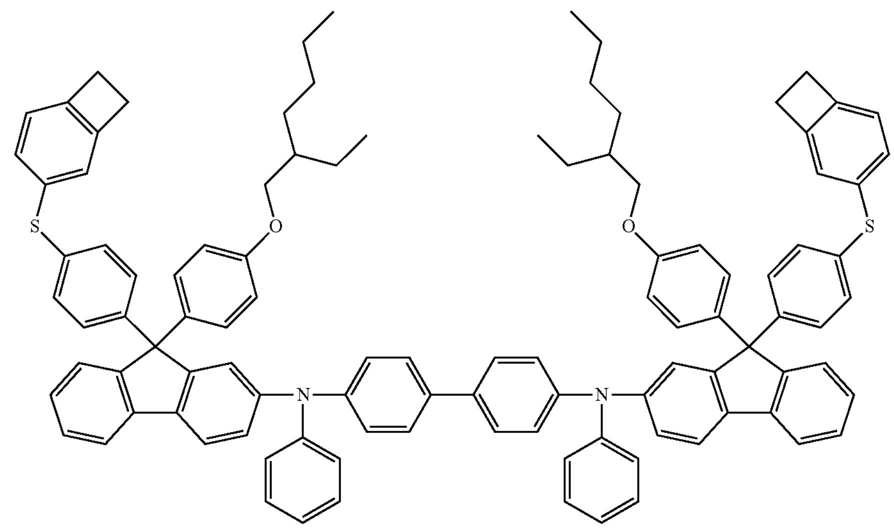
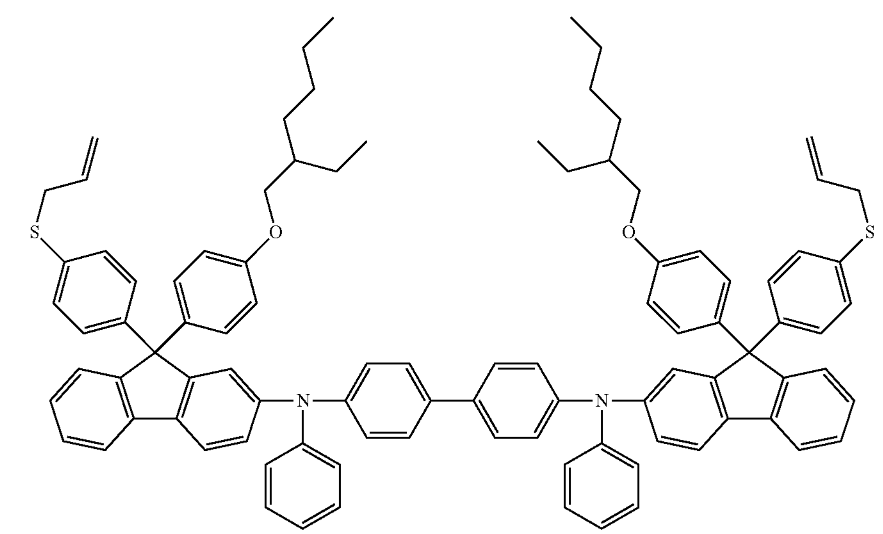

-continued
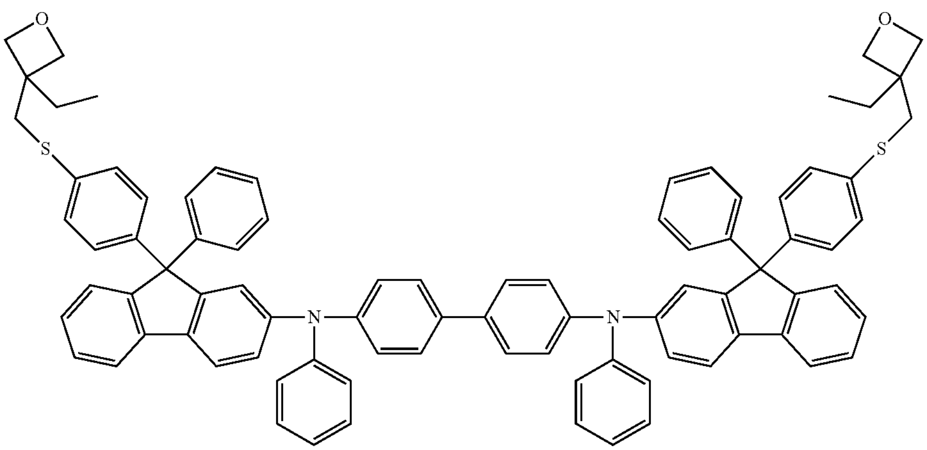
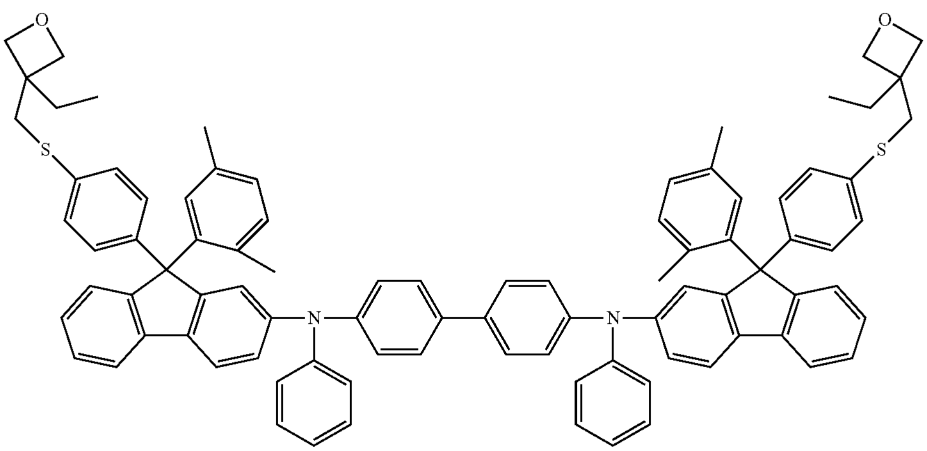
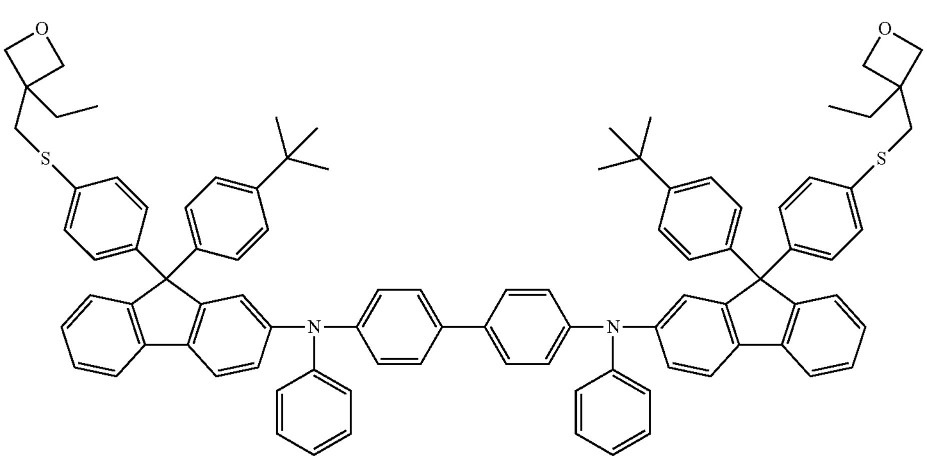

-continued
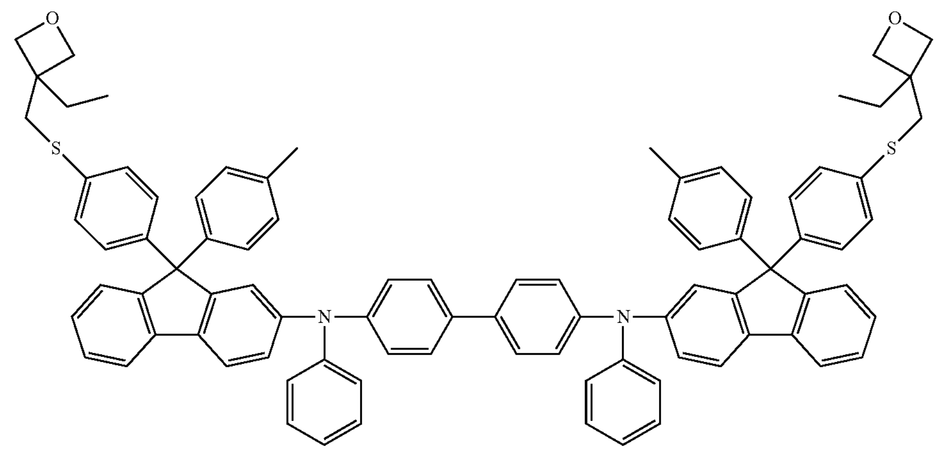
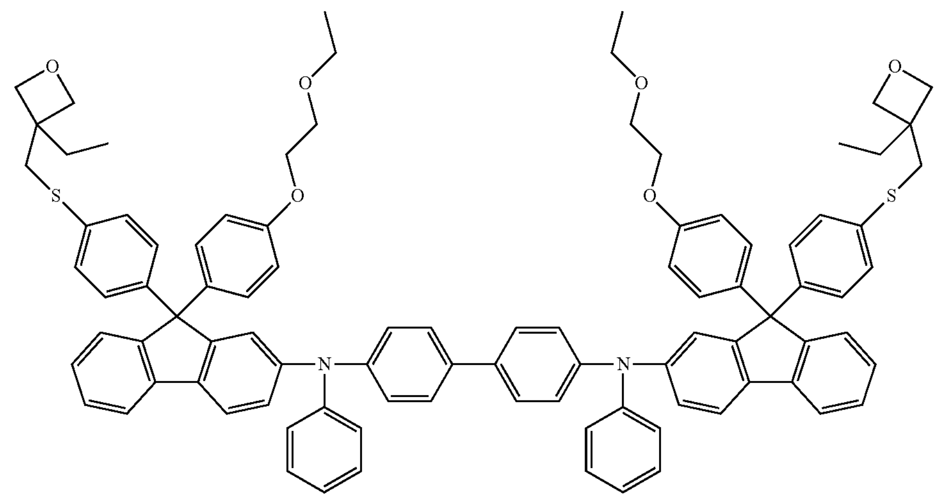
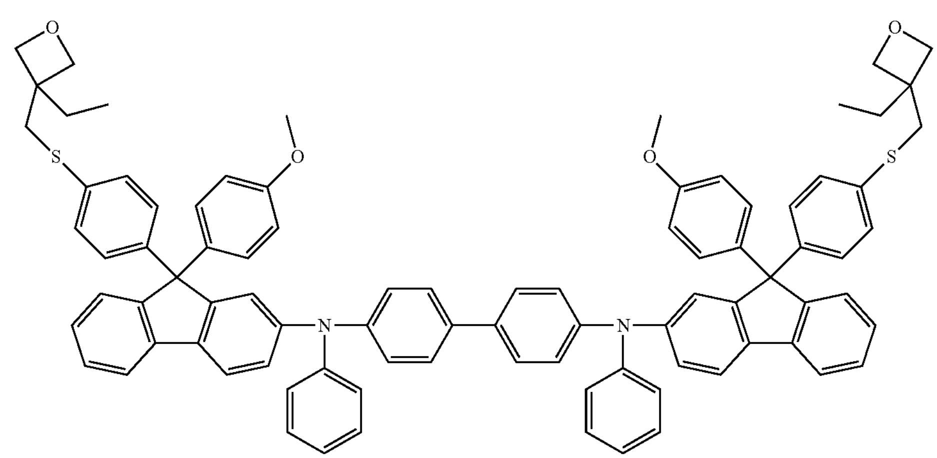

-continued
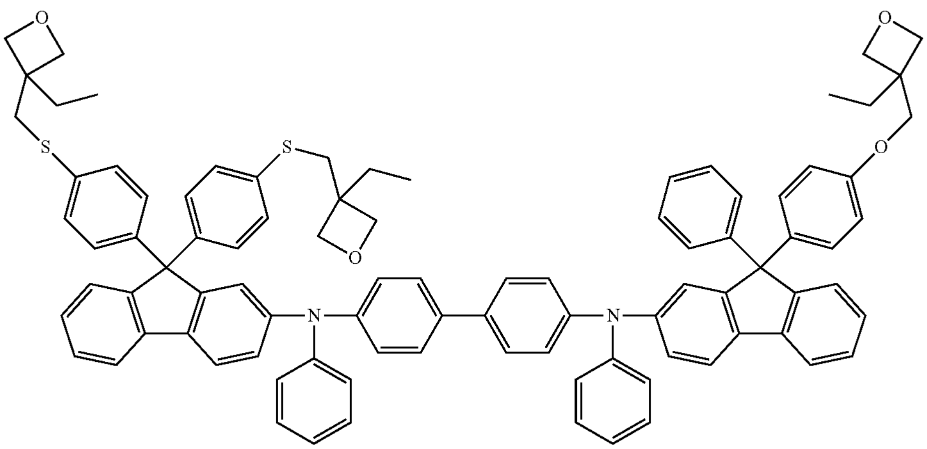
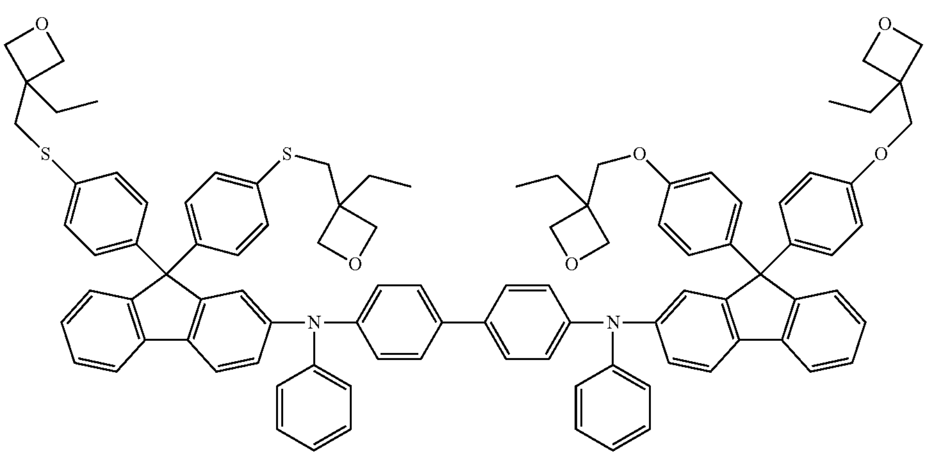
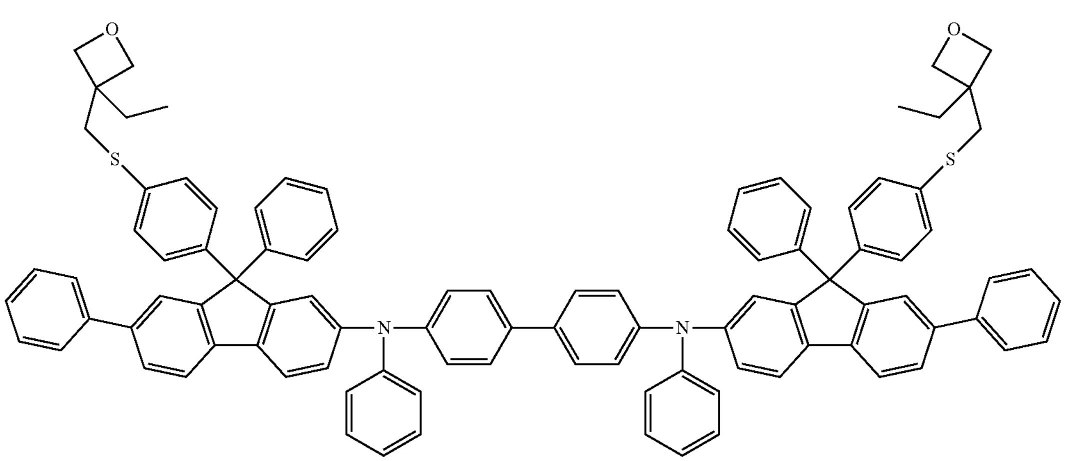

-continued
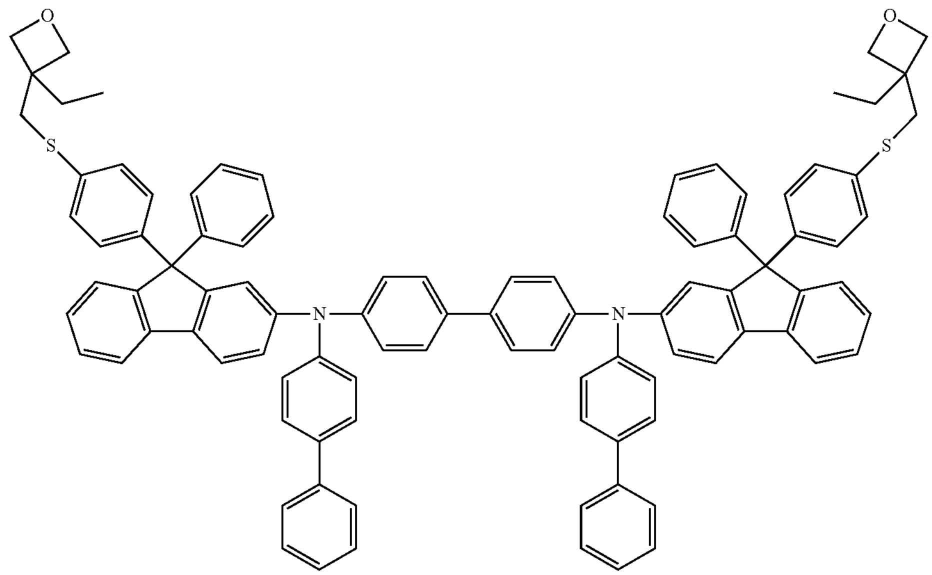
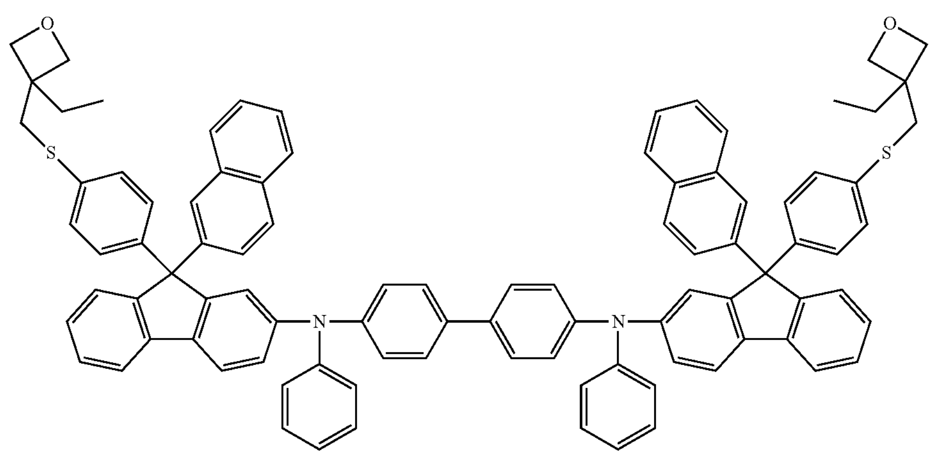
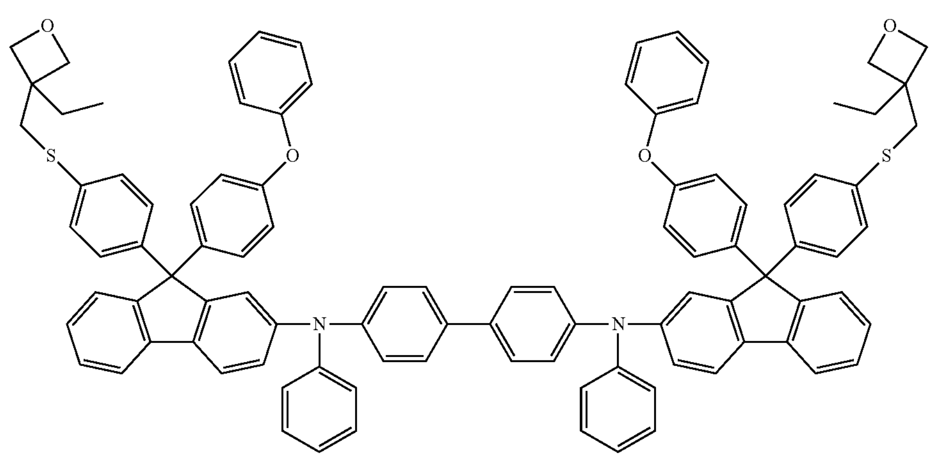

-continued
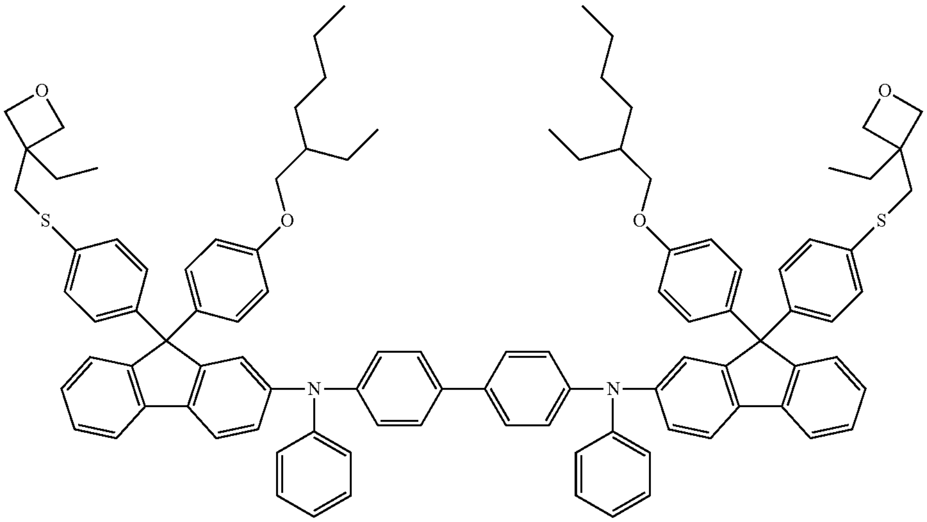
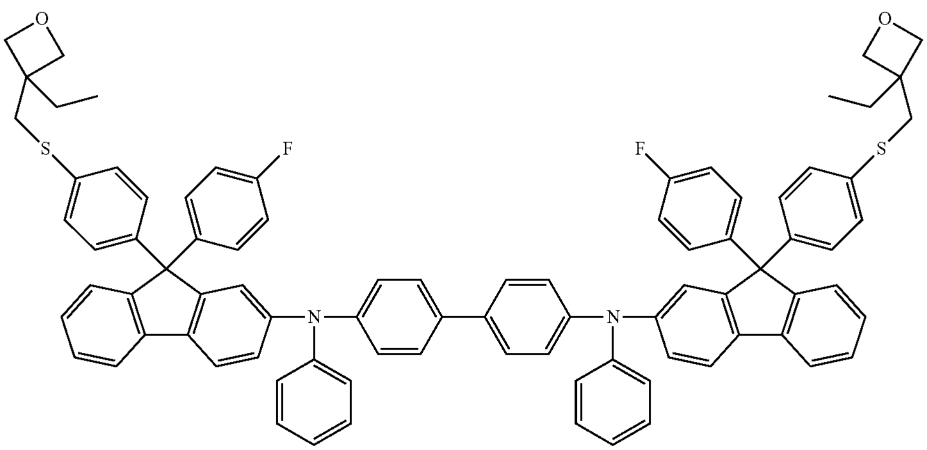
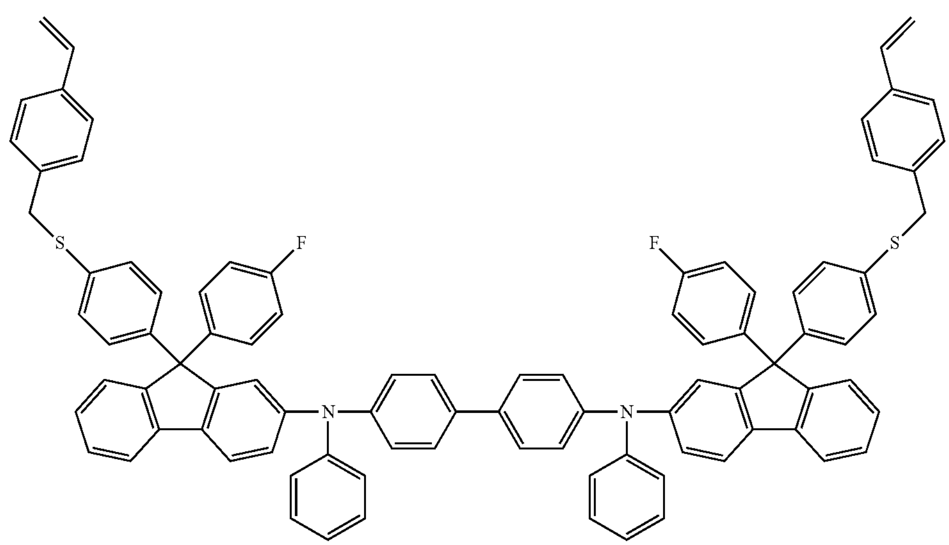

-continued
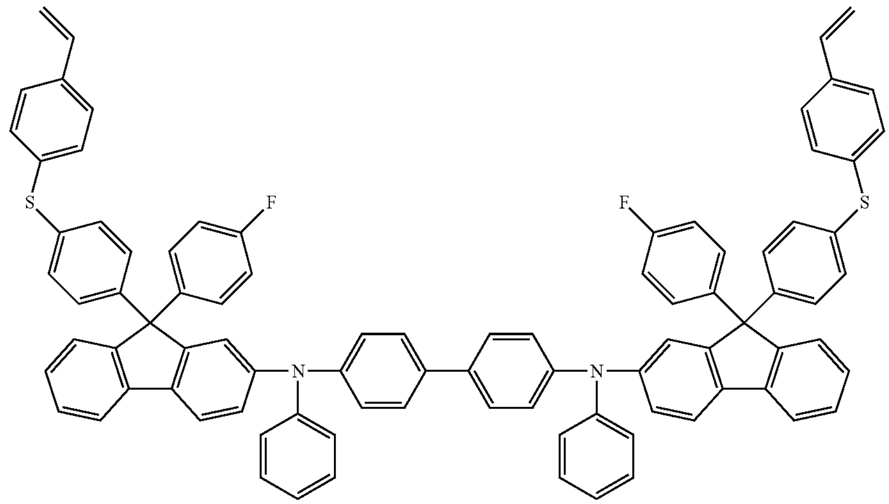
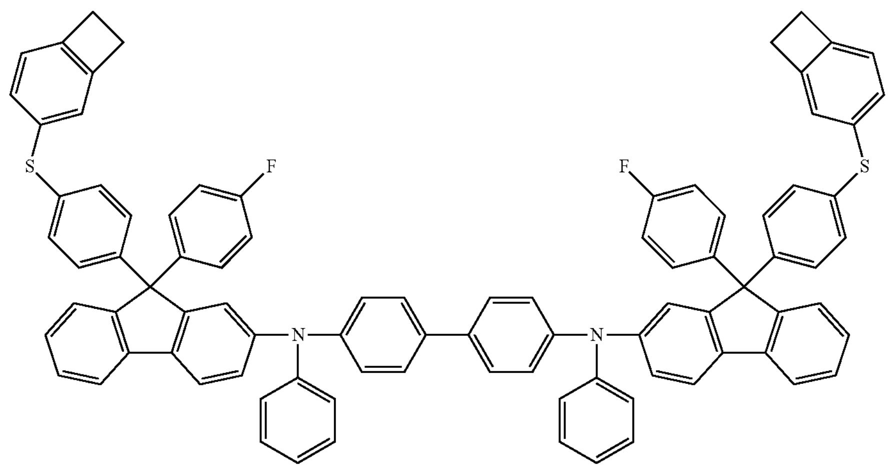
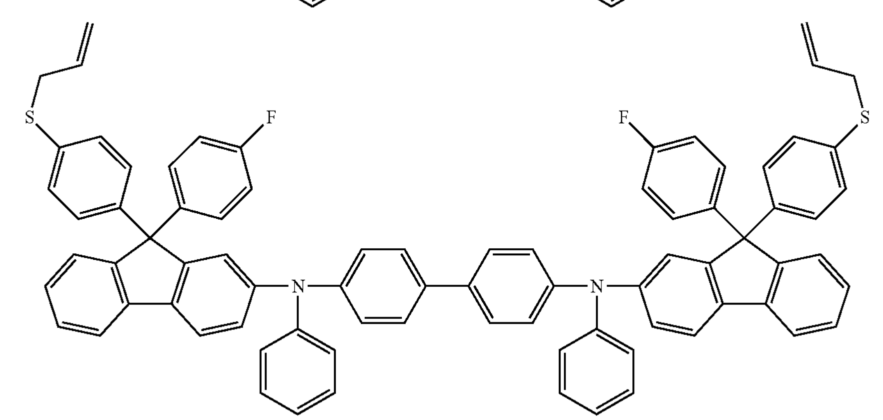
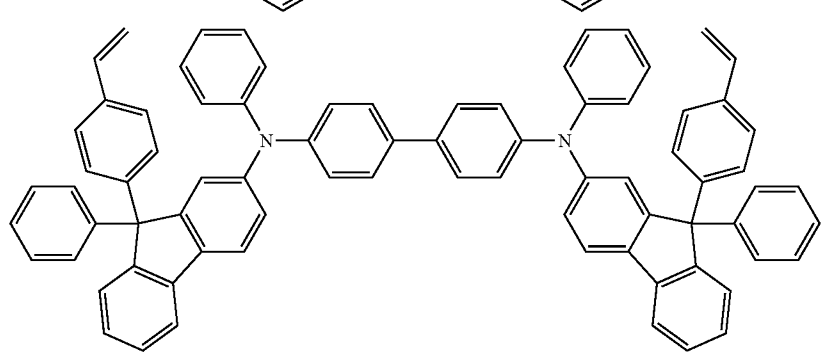

-continued
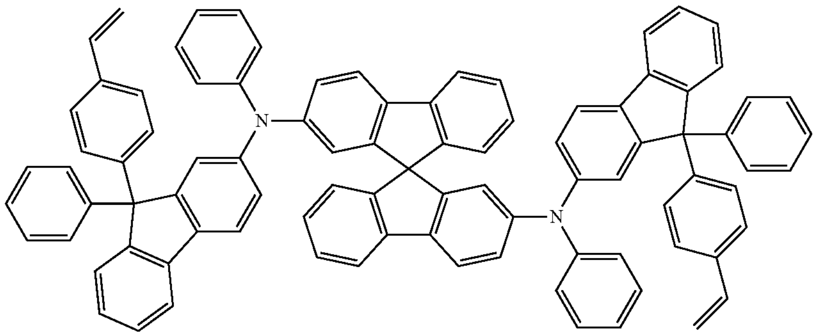
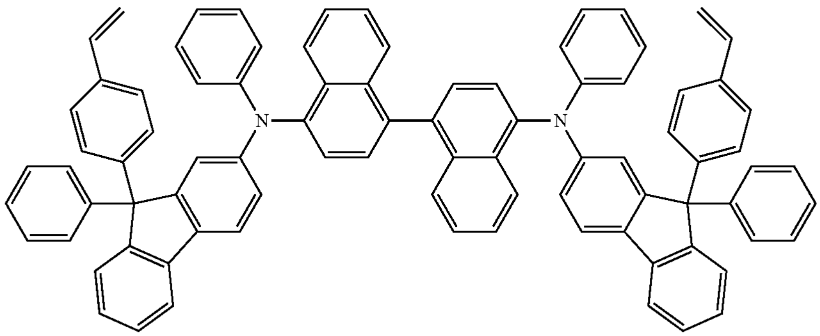
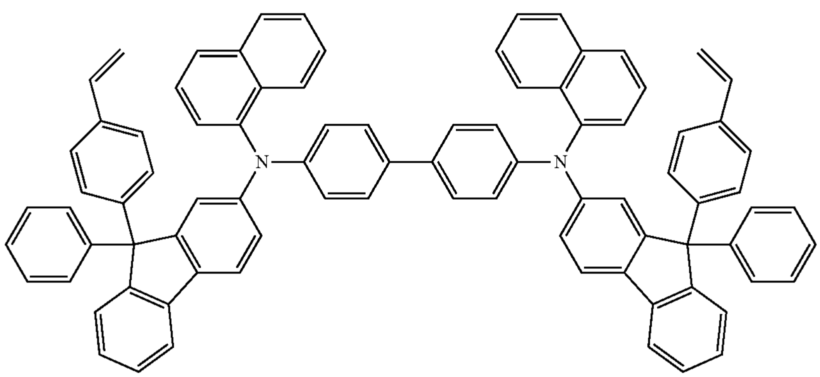
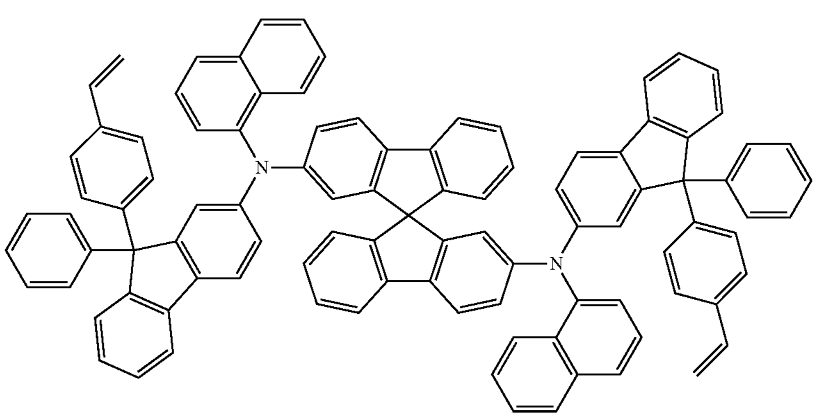

-continued
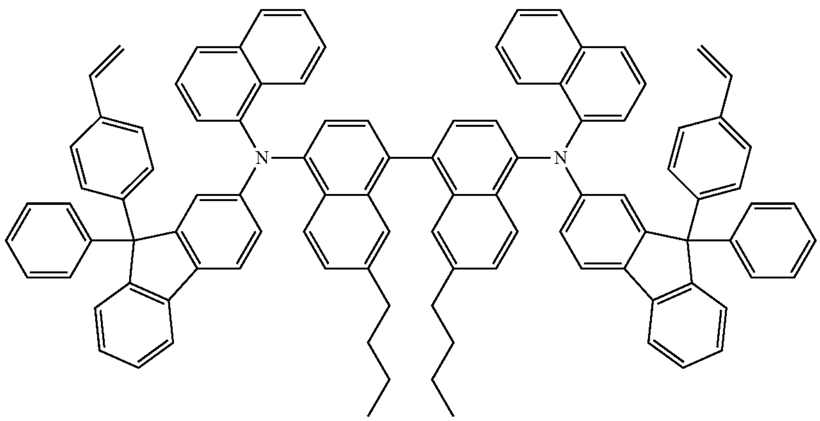
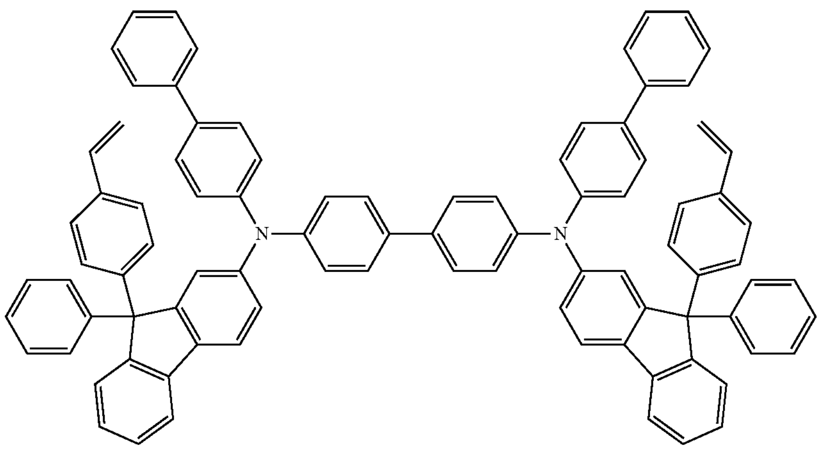
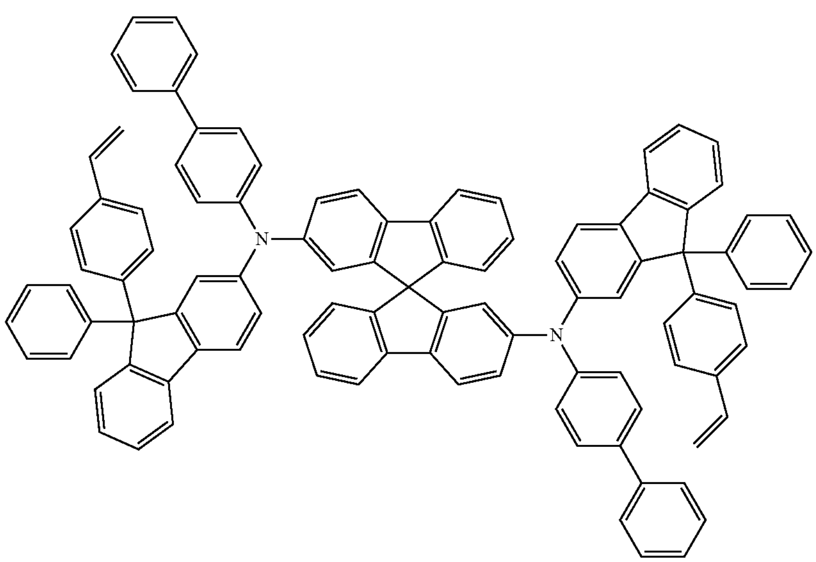

-continued
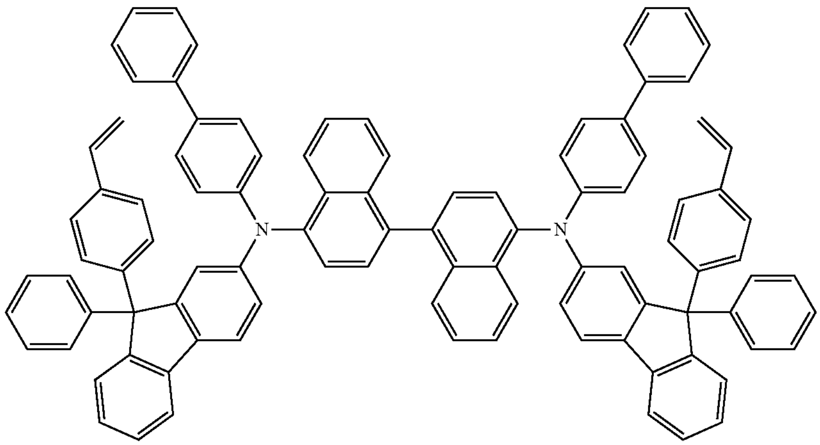
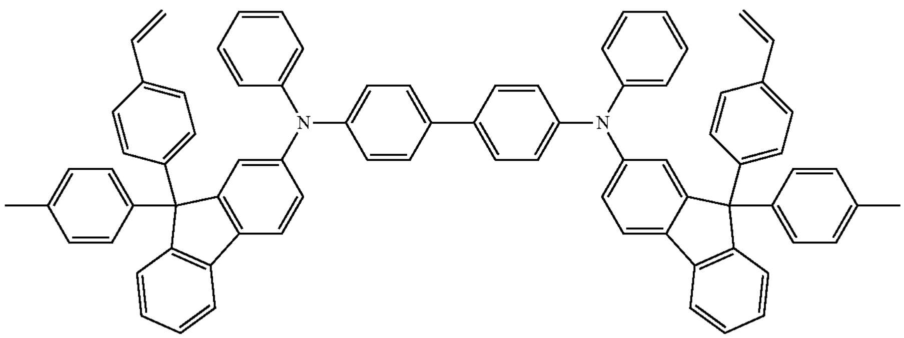
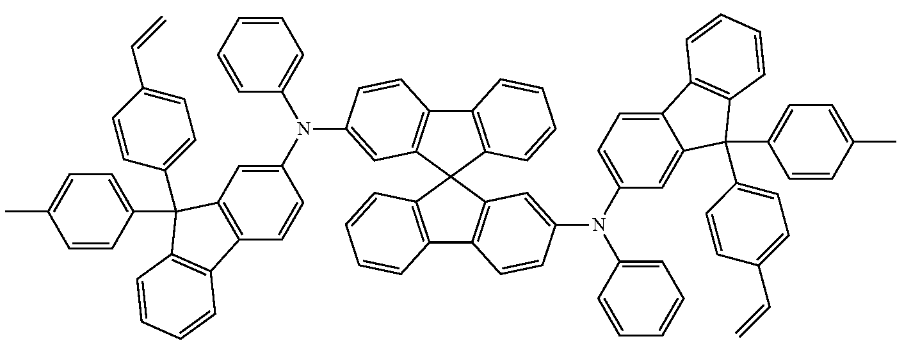
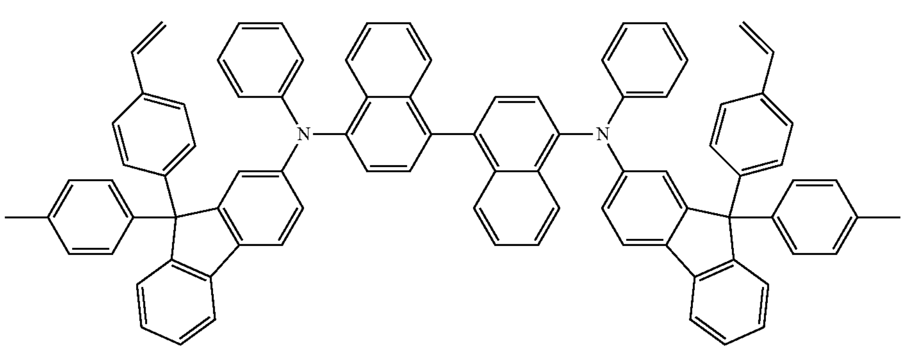

-continued
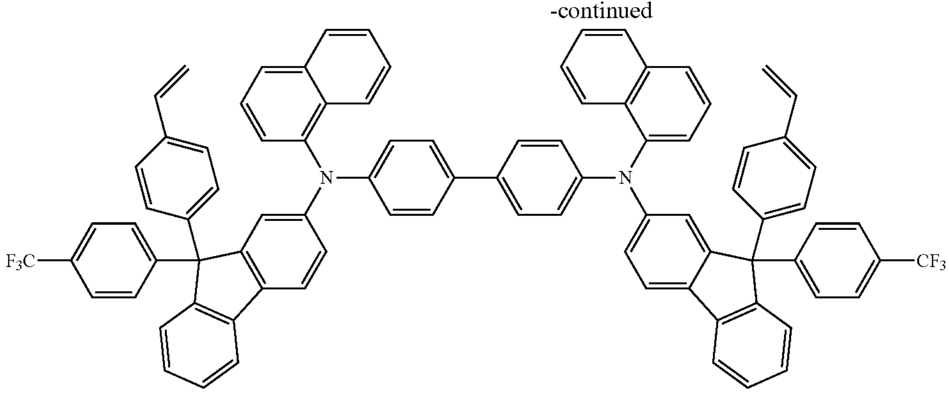
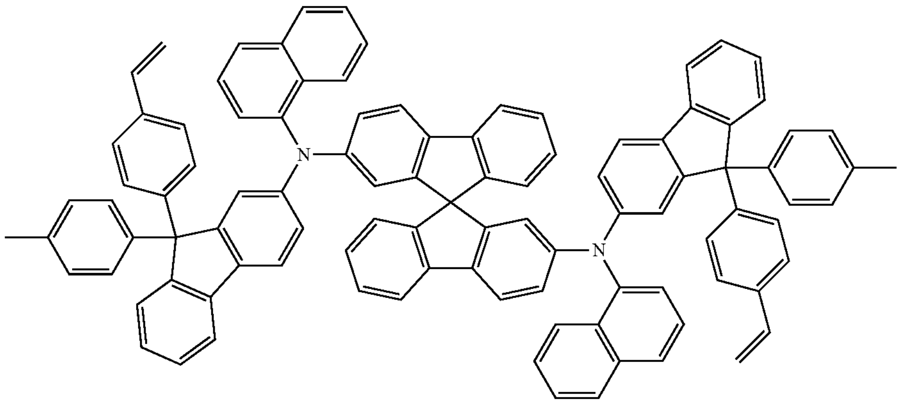
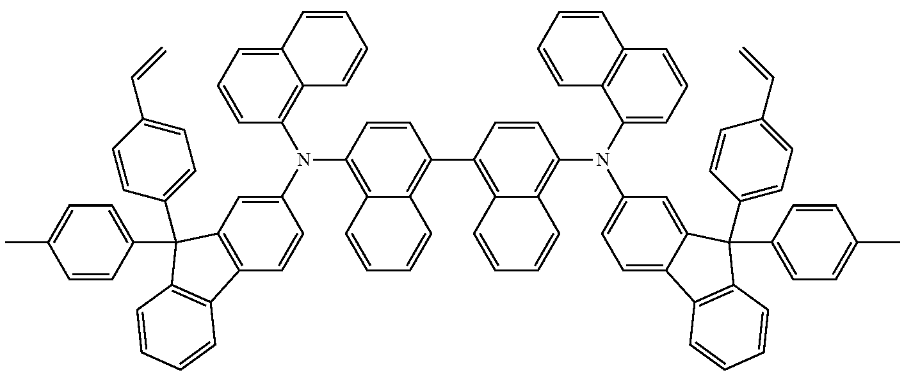
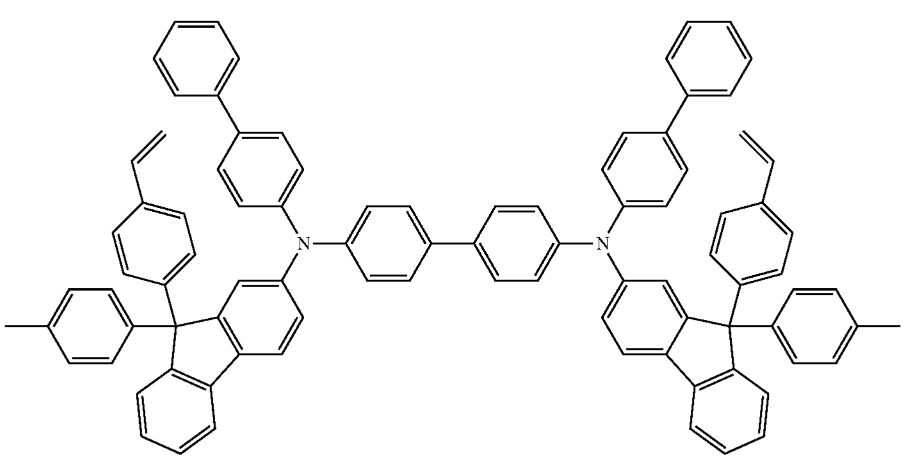

-continued
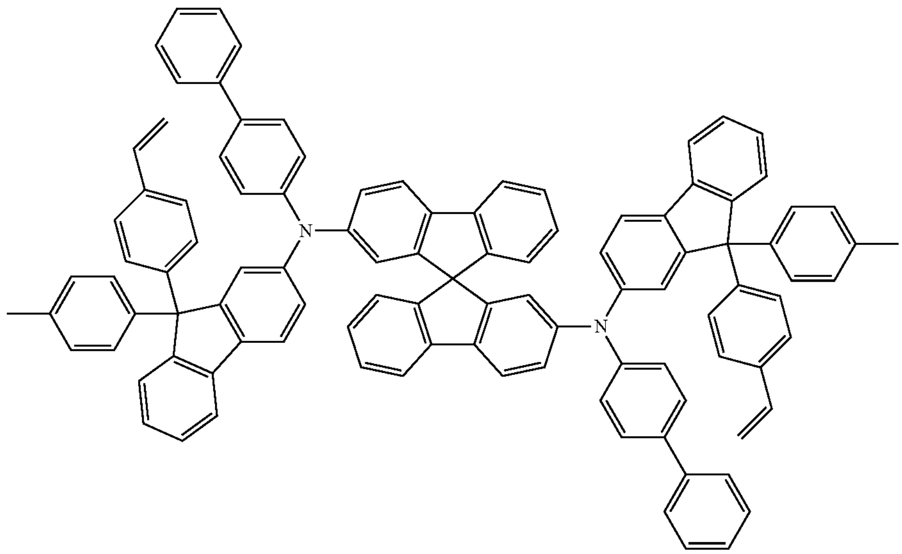
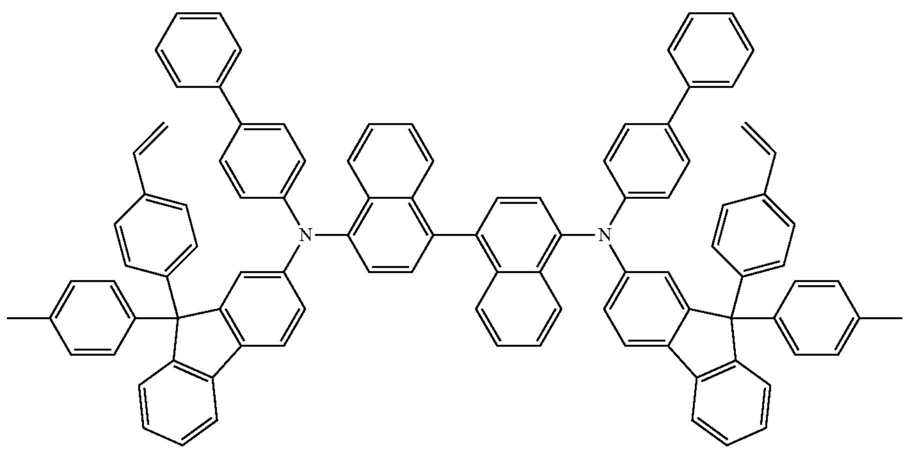
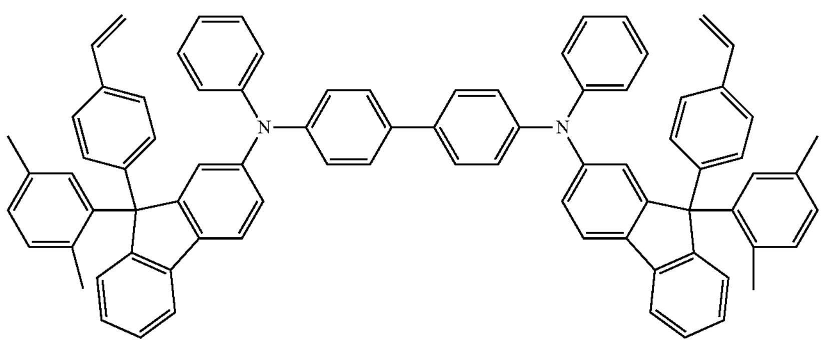
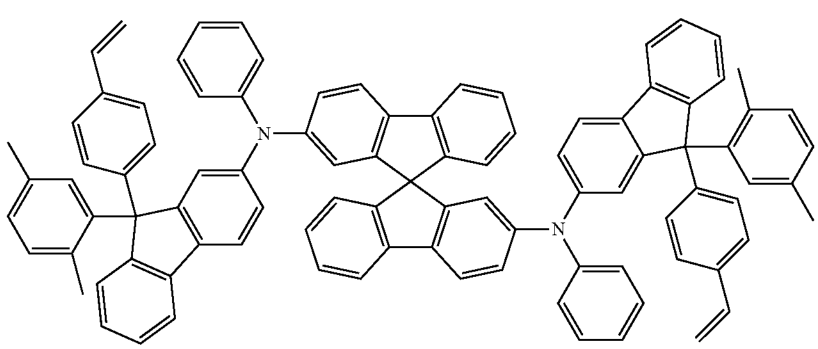

-continued
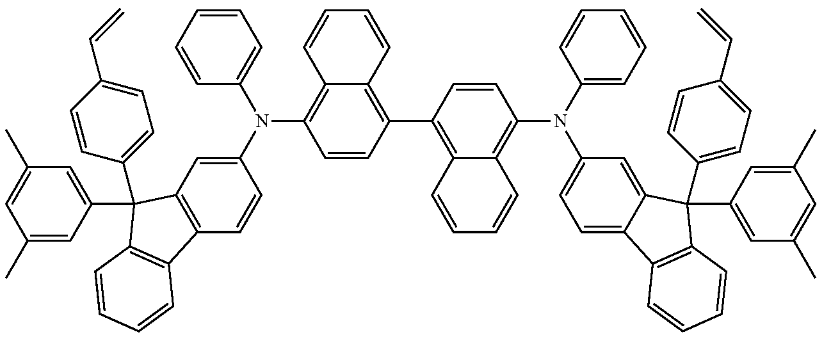
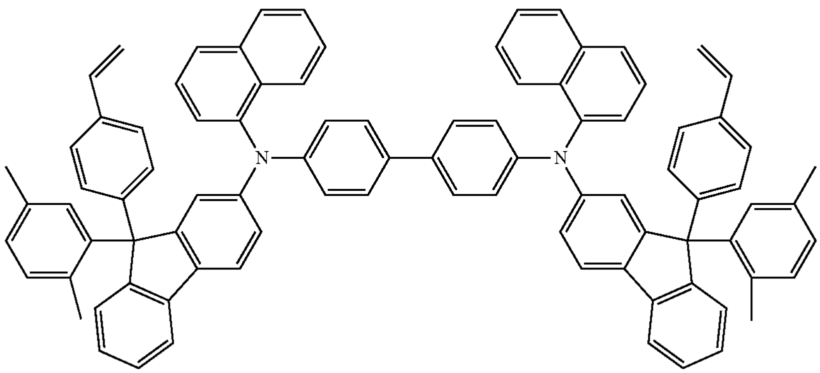
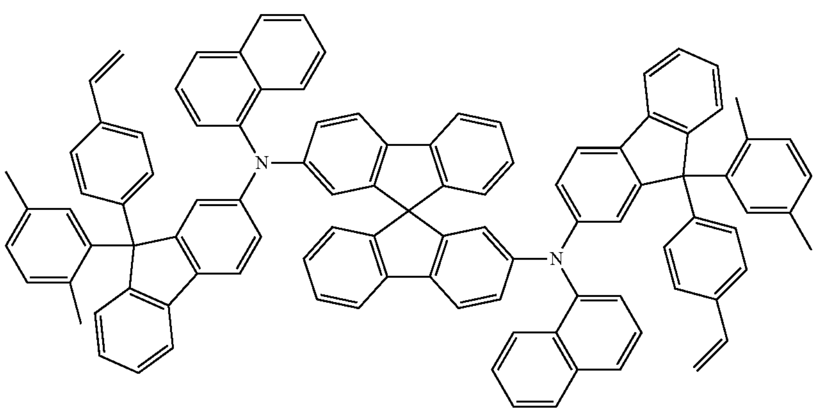
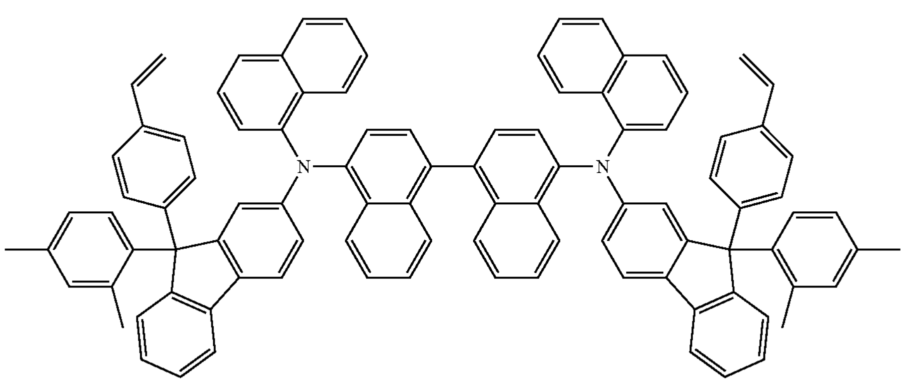

-continued
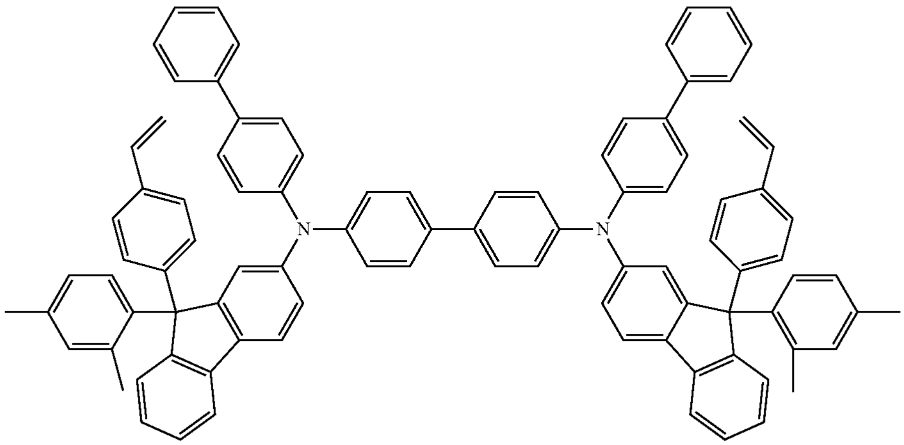
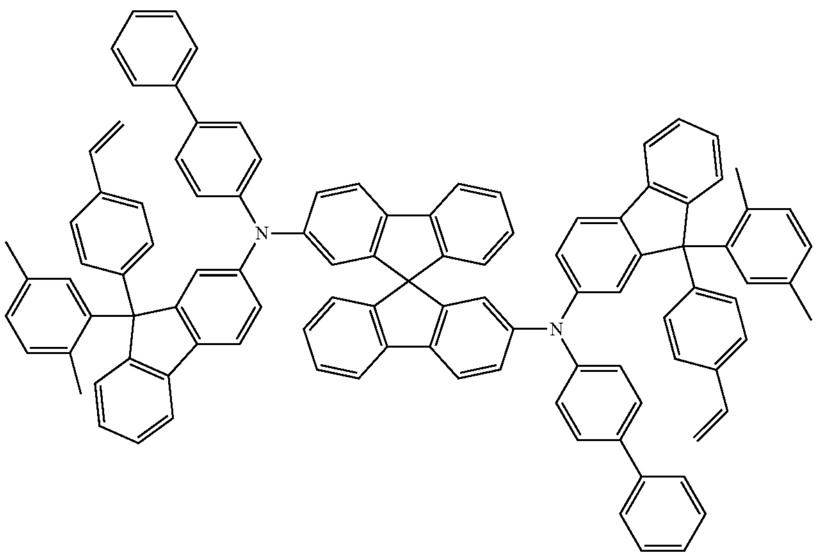
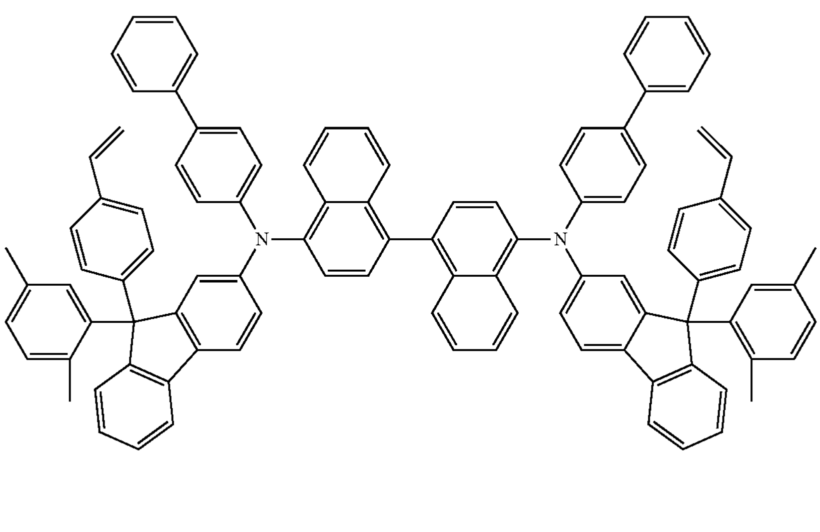

-continued
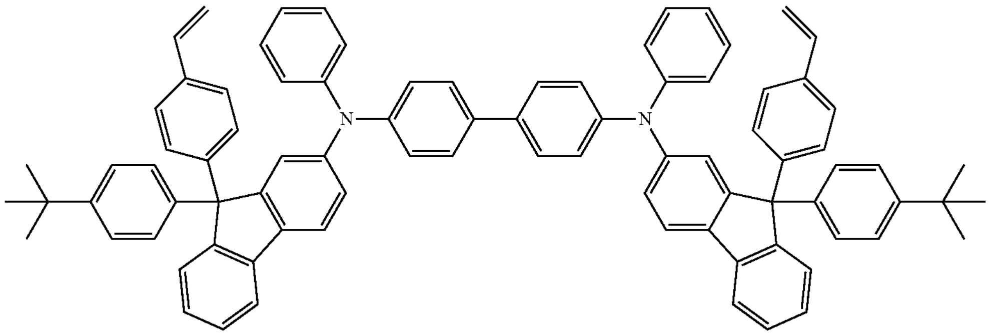
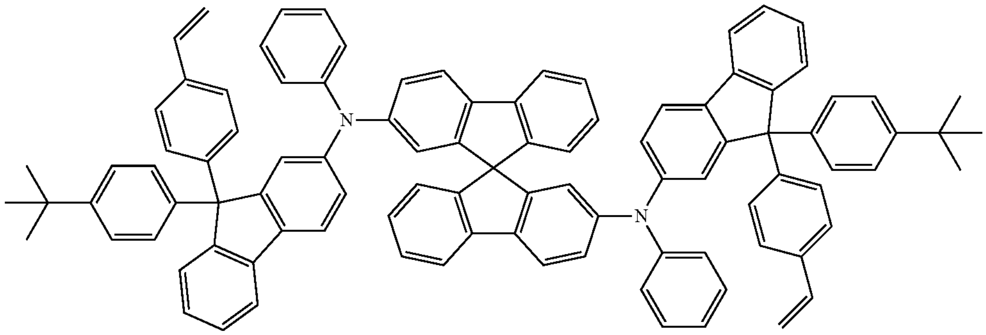
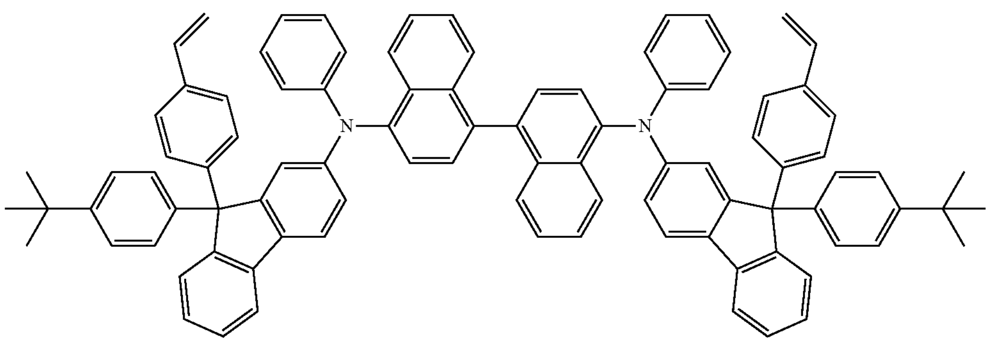
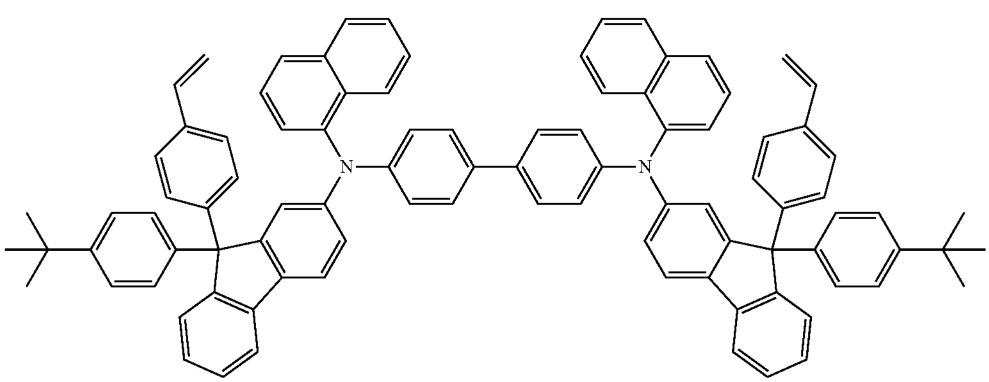

-continued
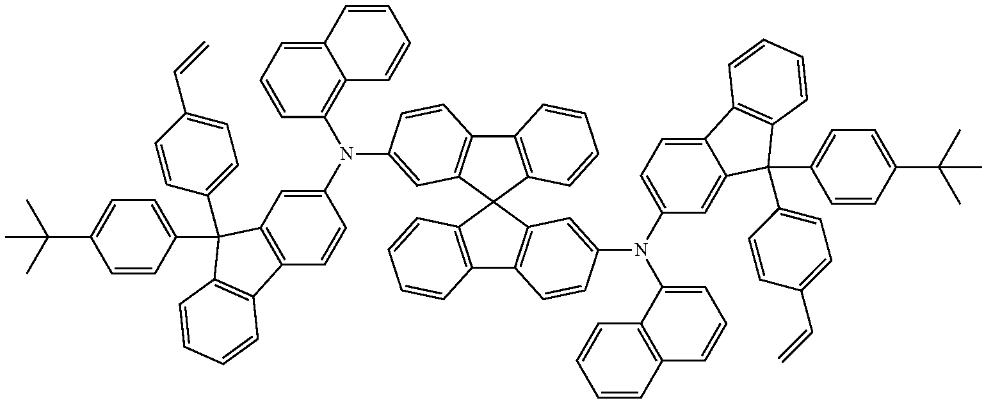
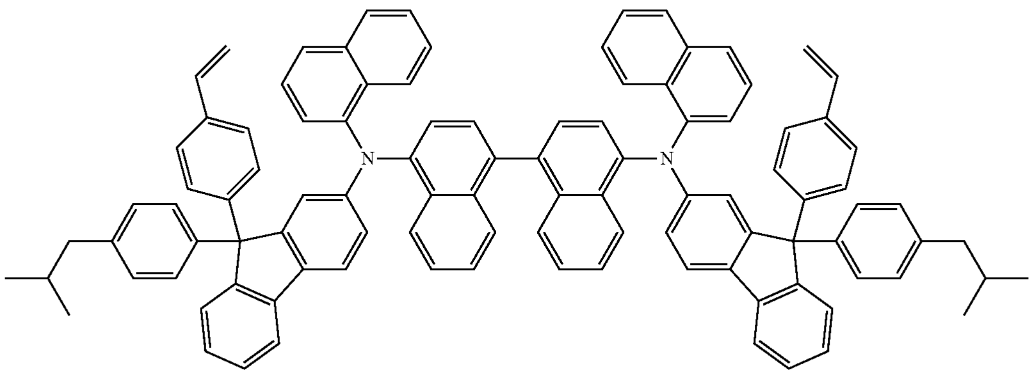
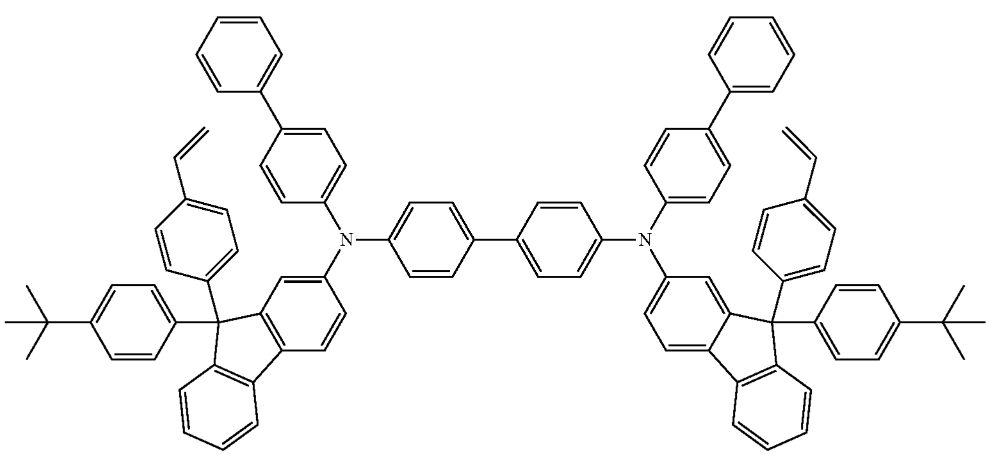

-continued
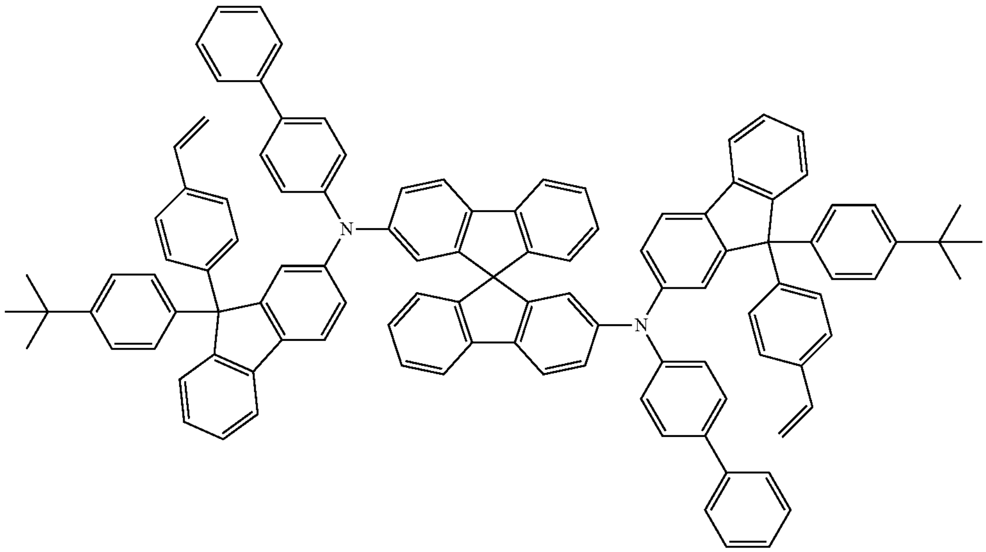
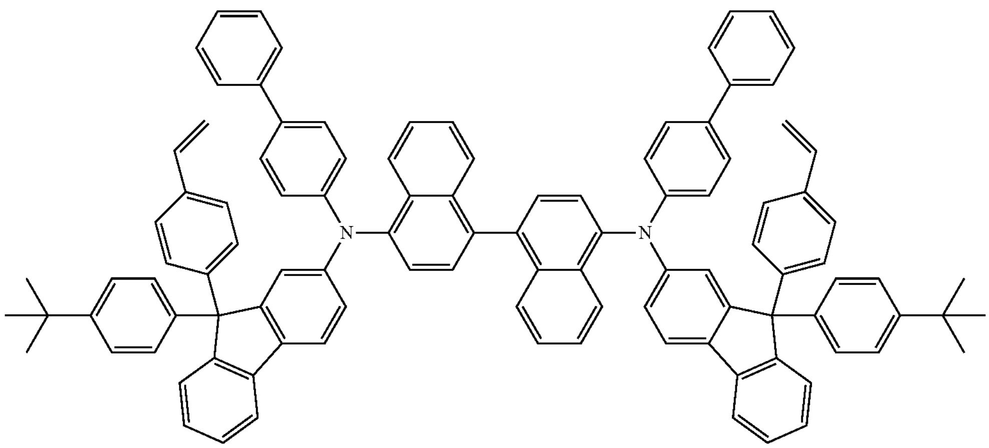
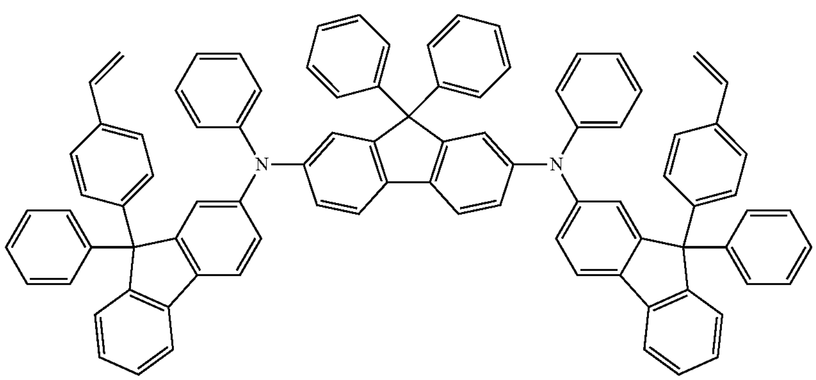
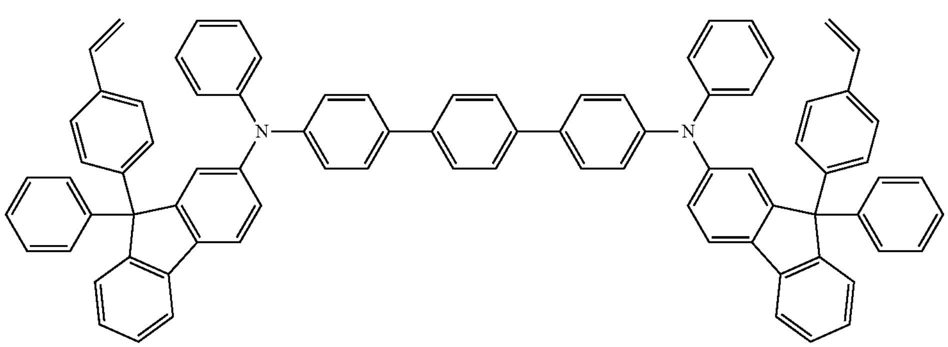

-continued
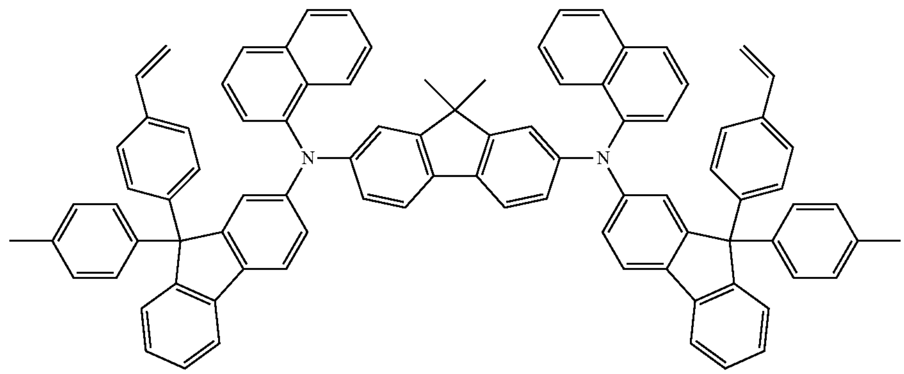
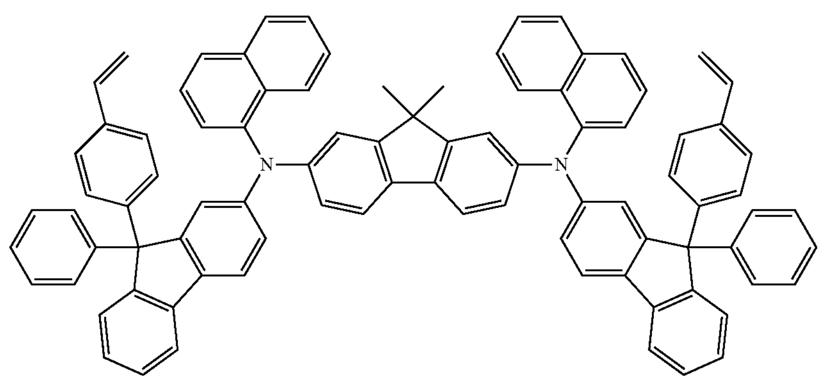
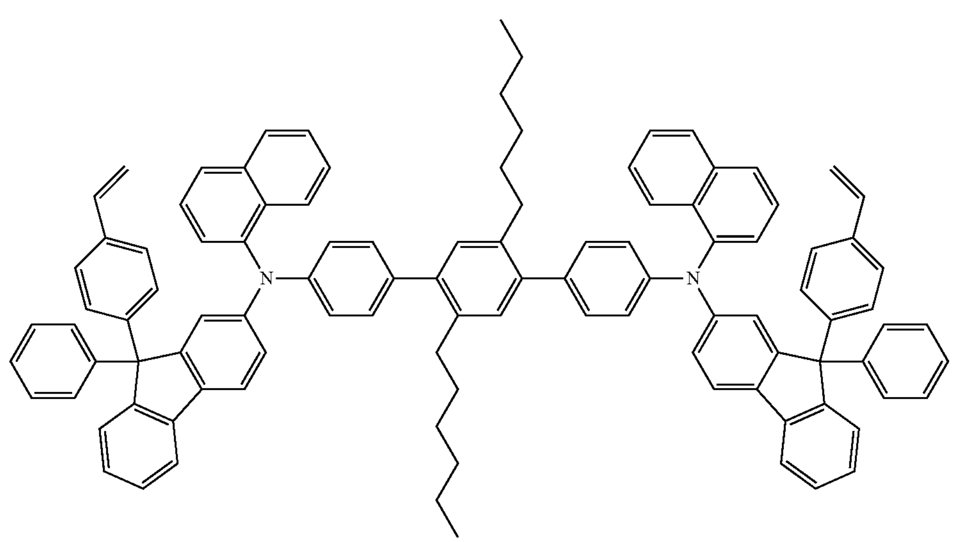

-continued
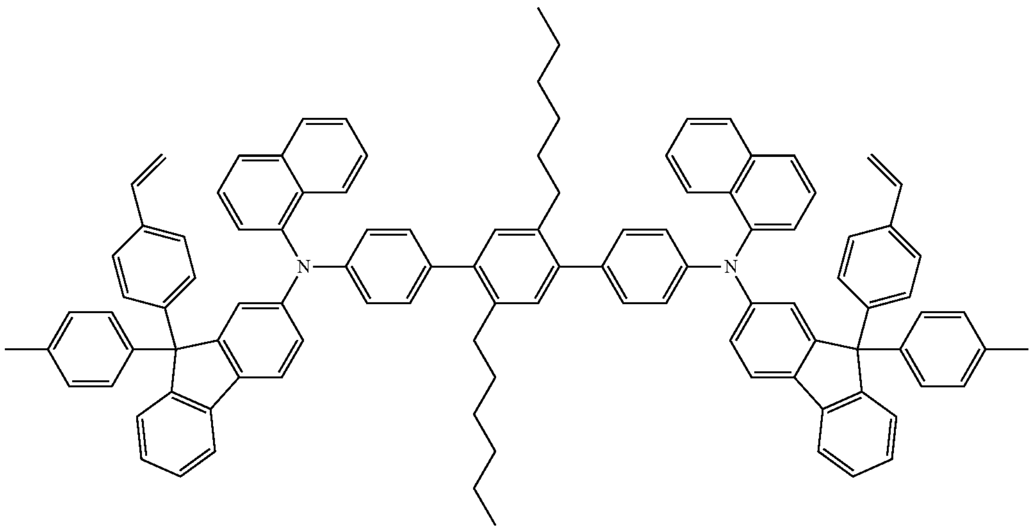
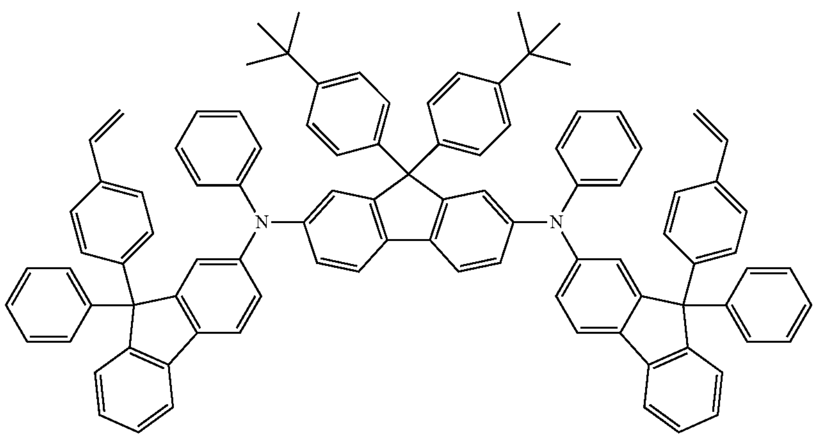
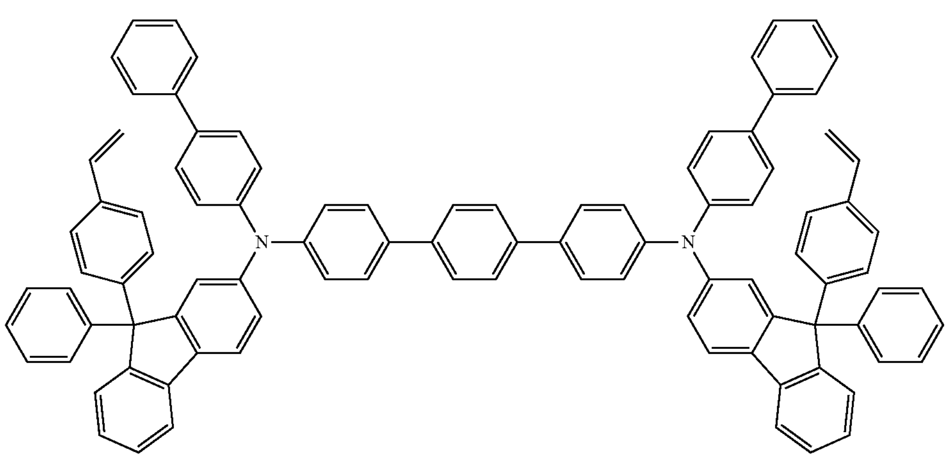

-continued
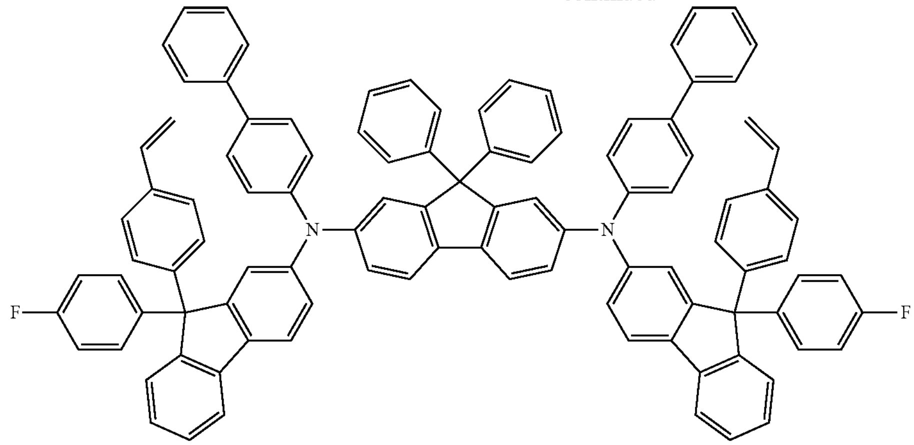
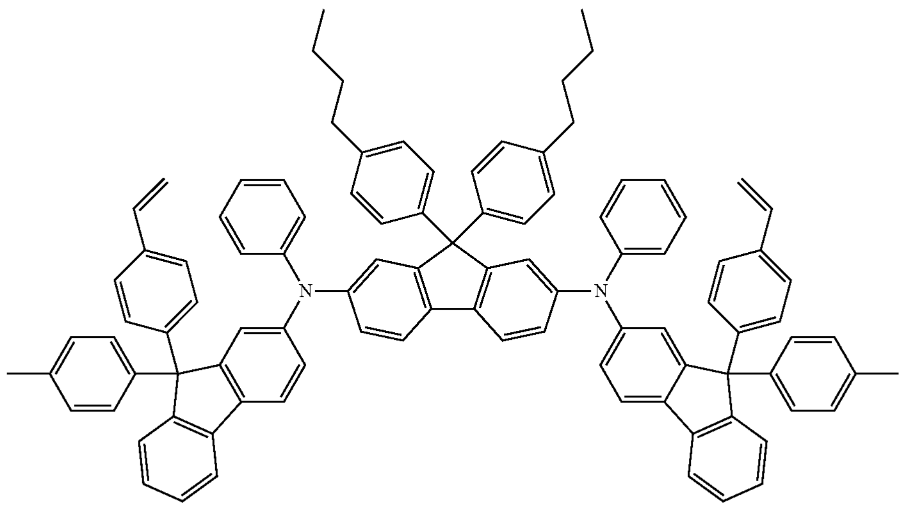
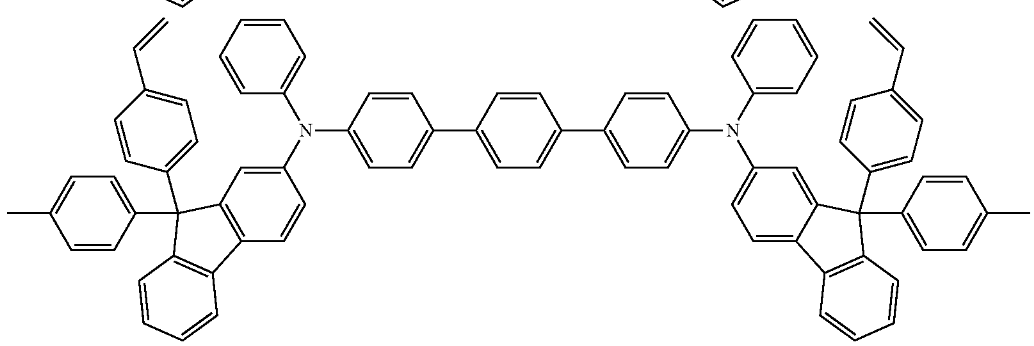
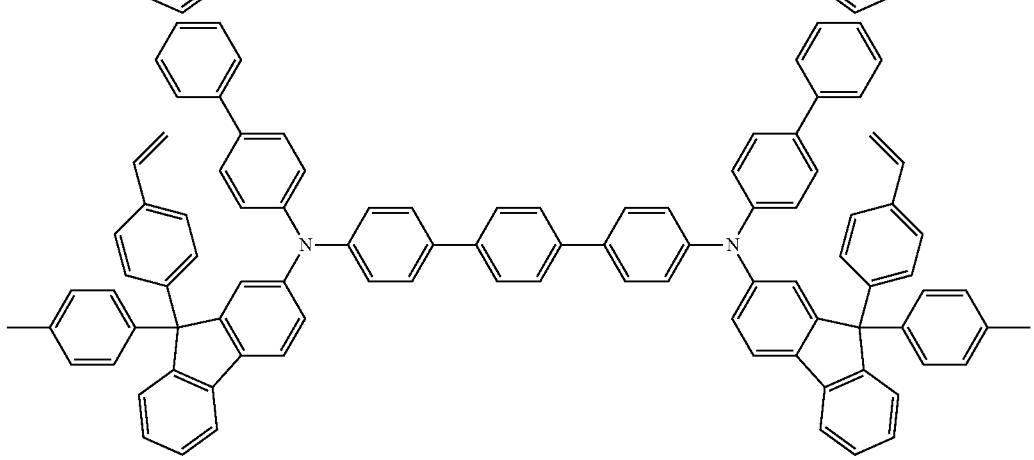

-continued
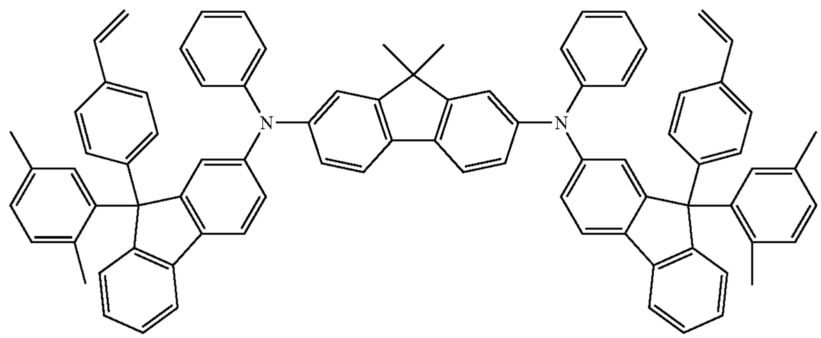
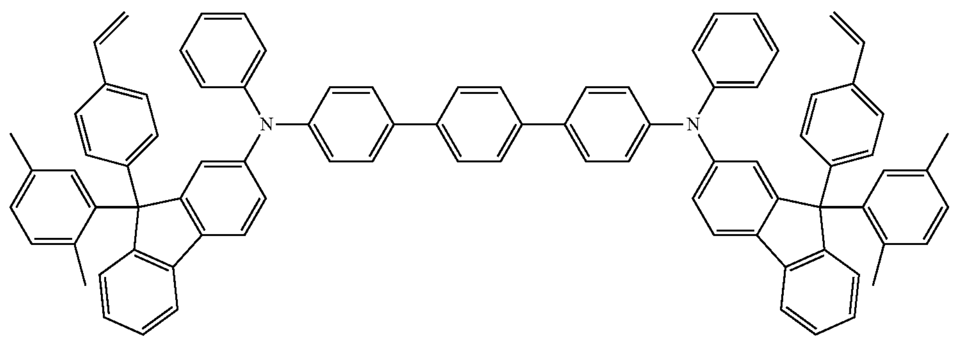
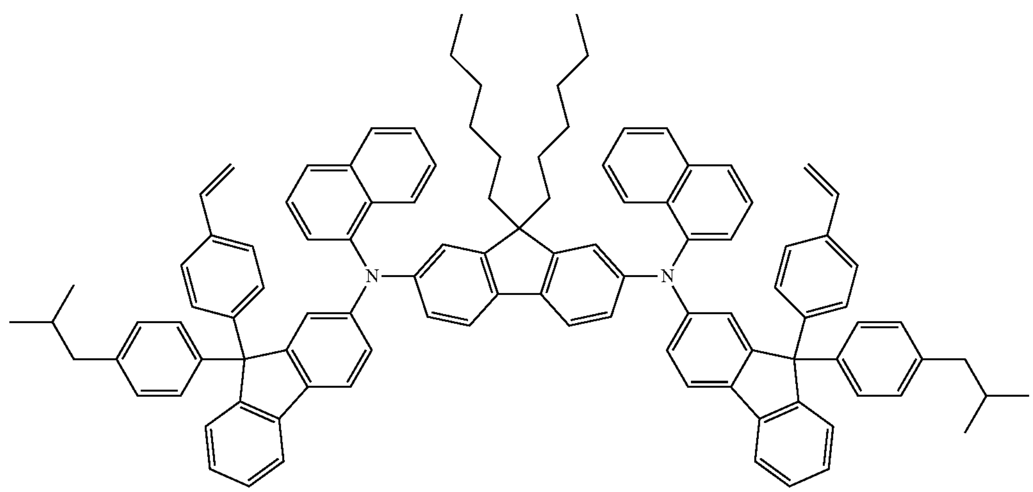
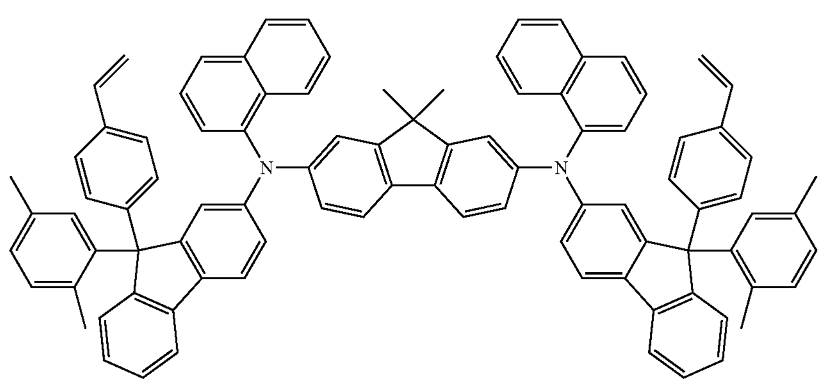

-continued
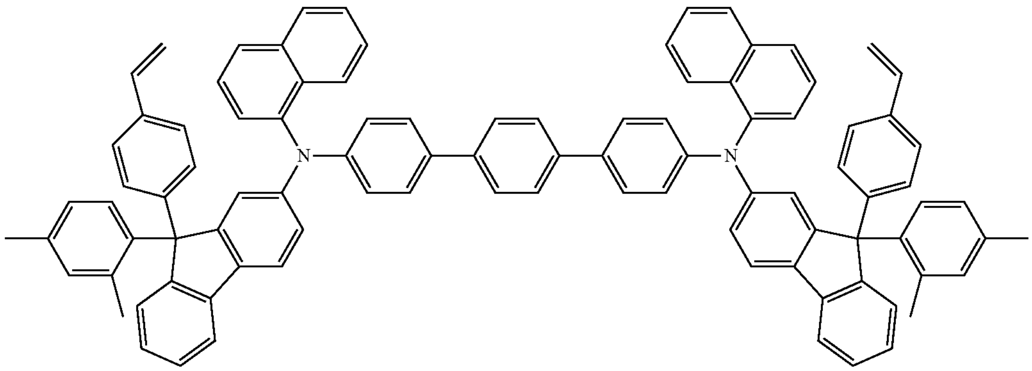
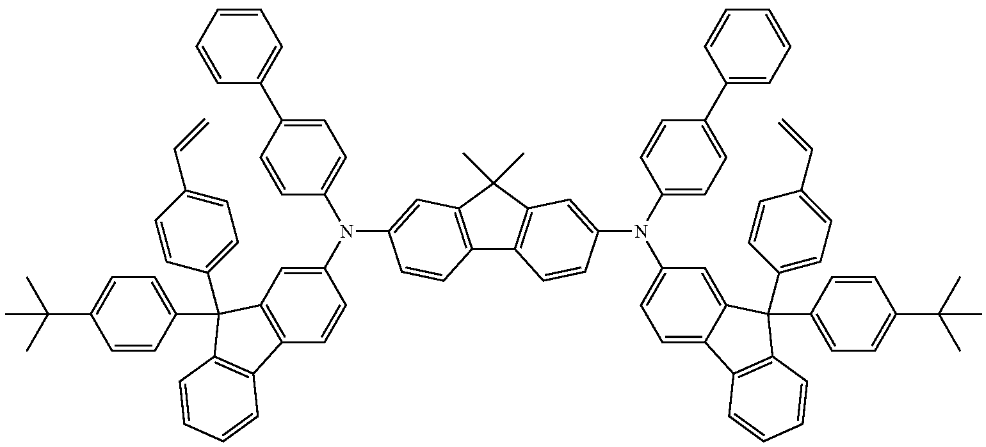
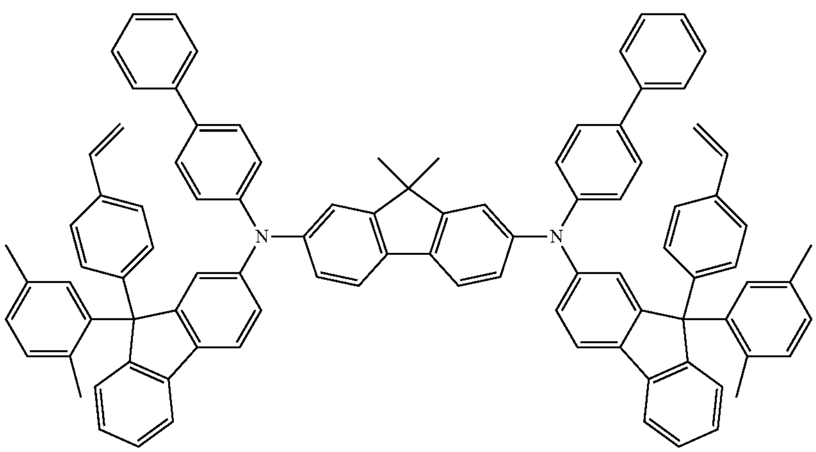
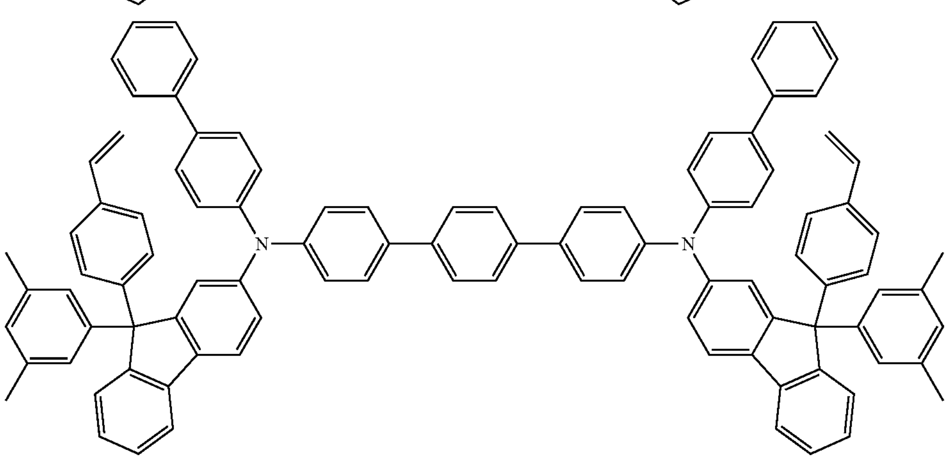

-continued
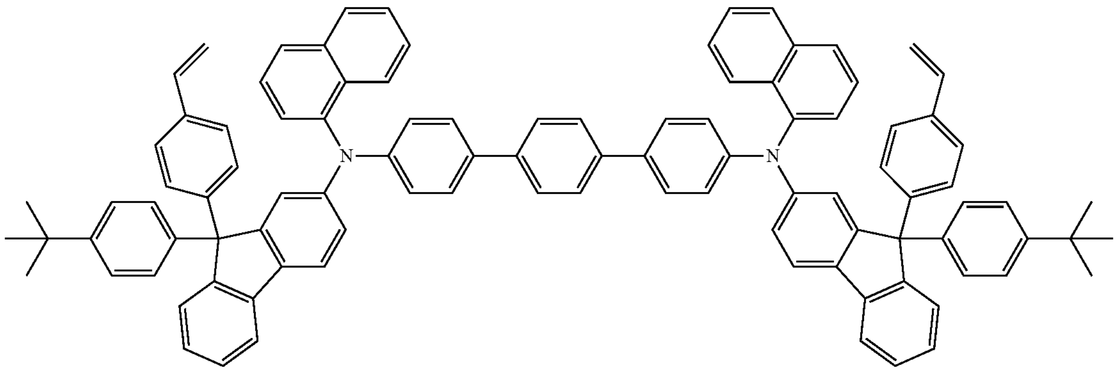
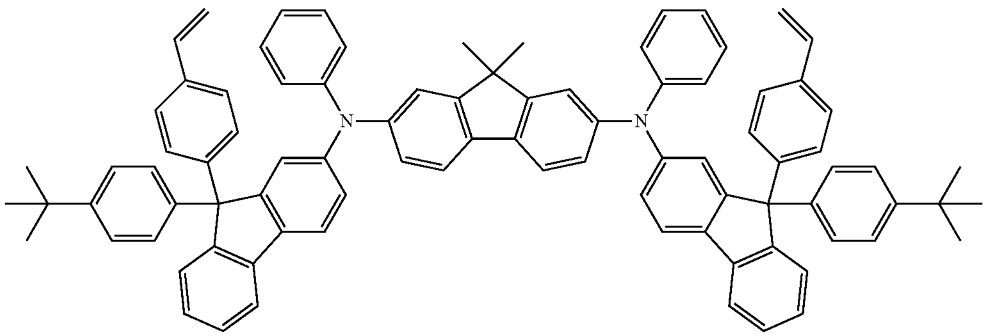
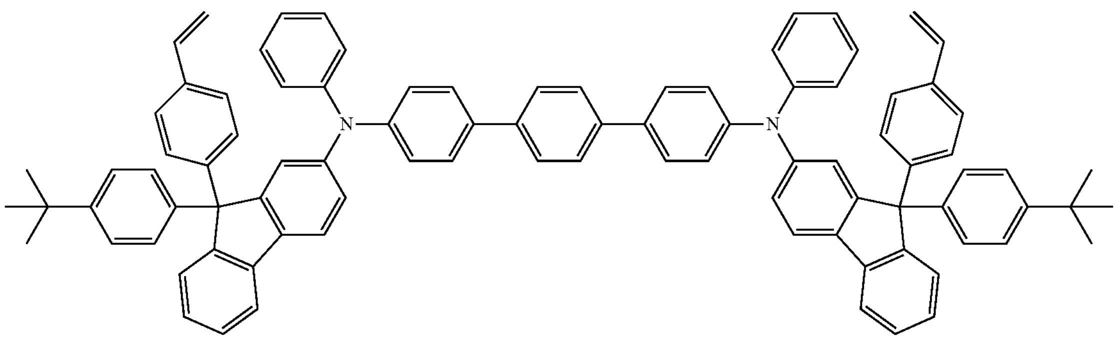
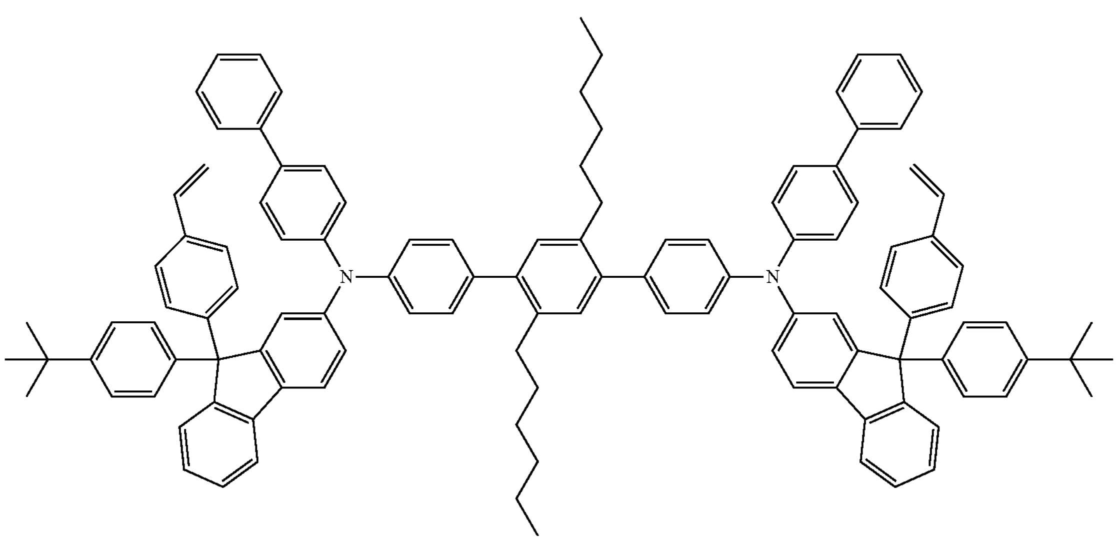

-continued
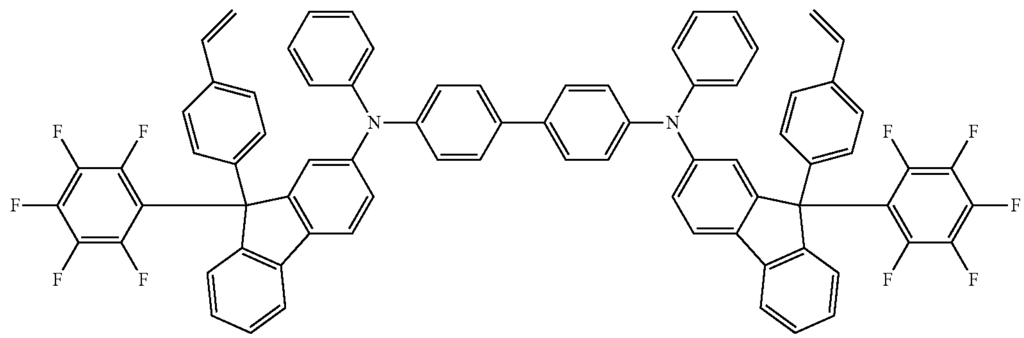
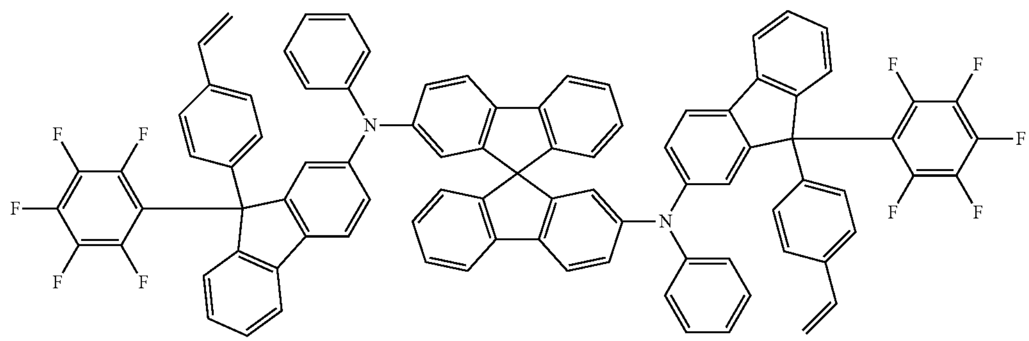
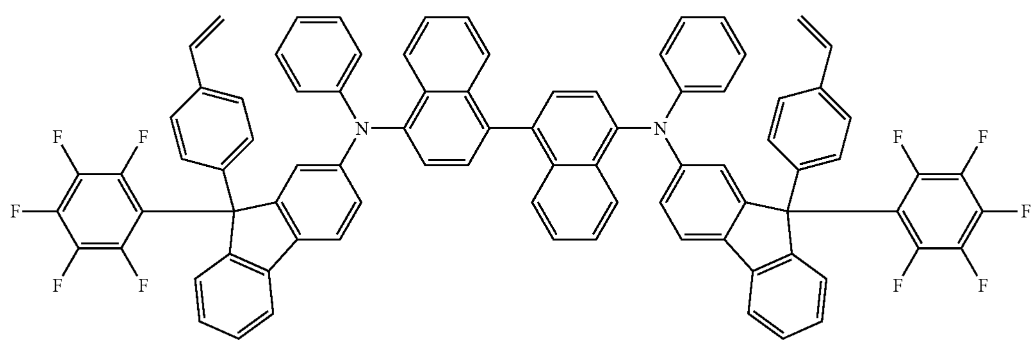
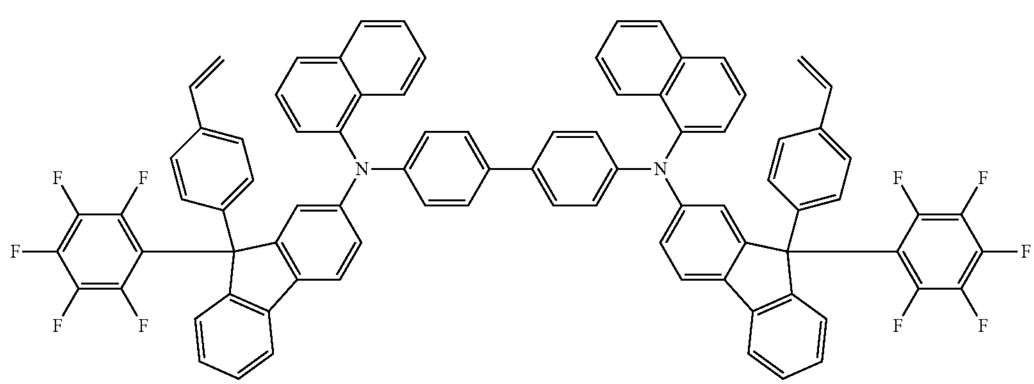

-continued
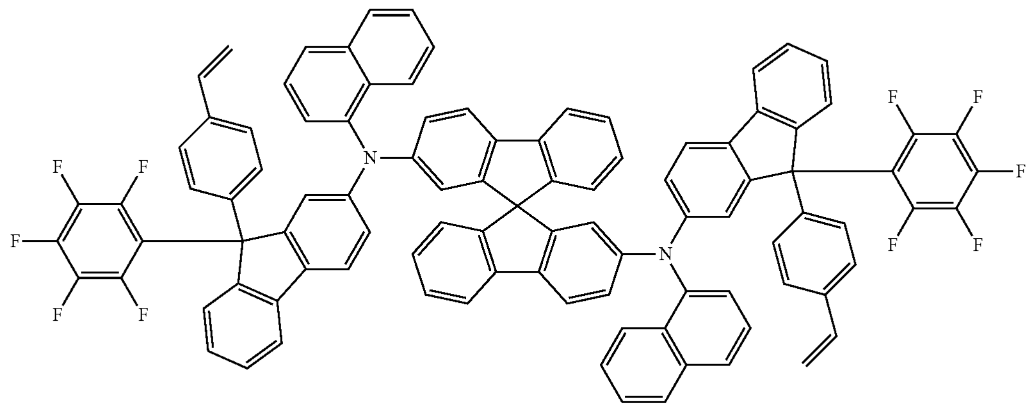
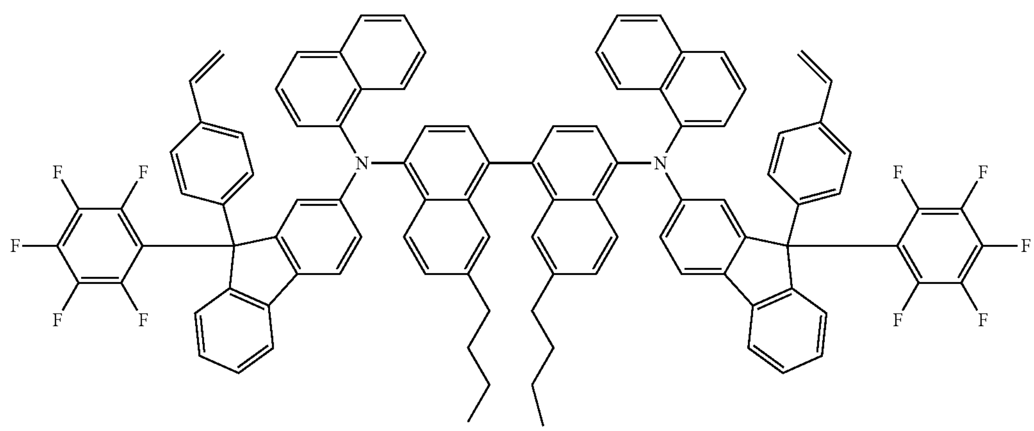
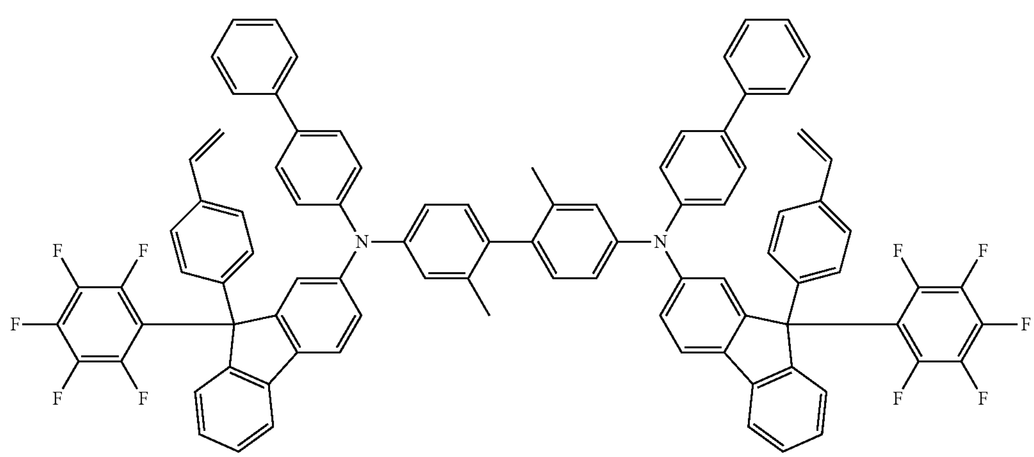

-continued
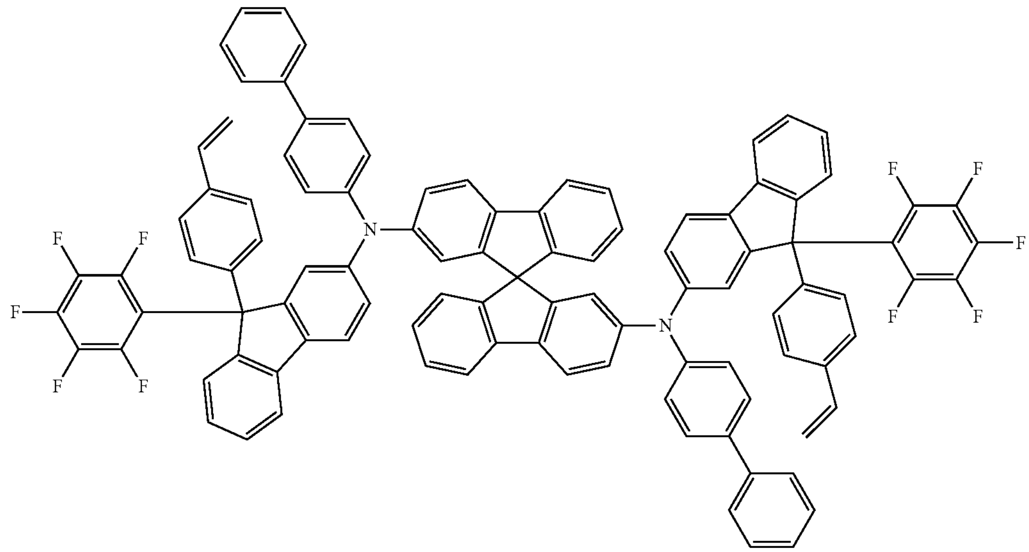
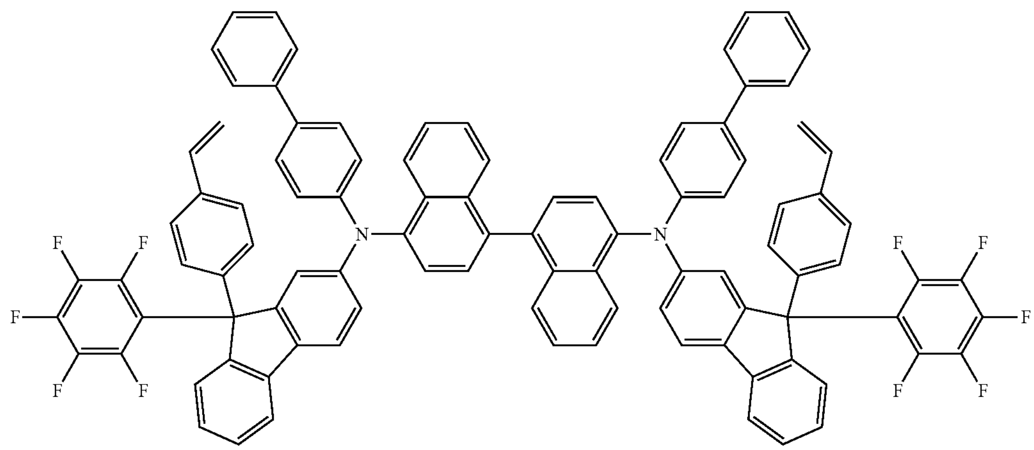
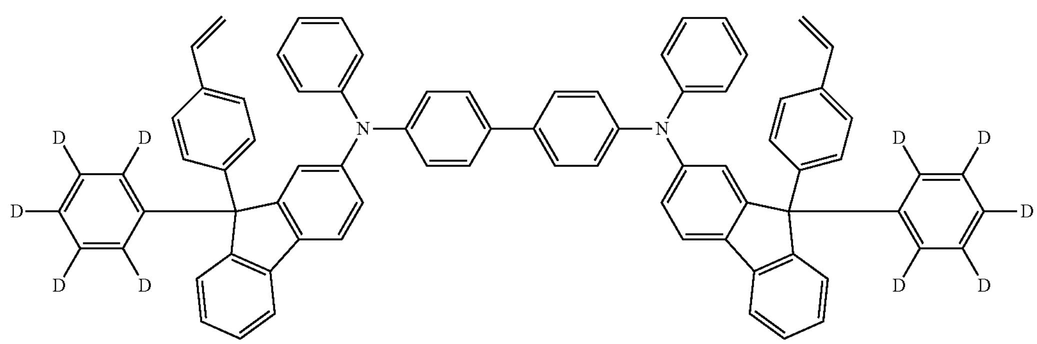
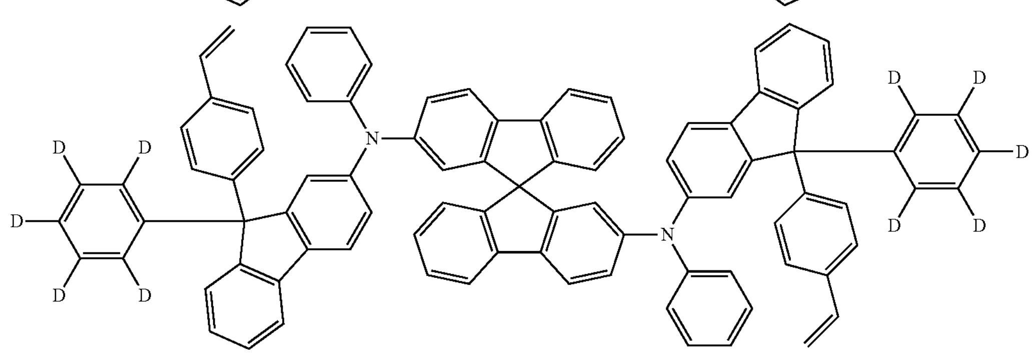

-continued
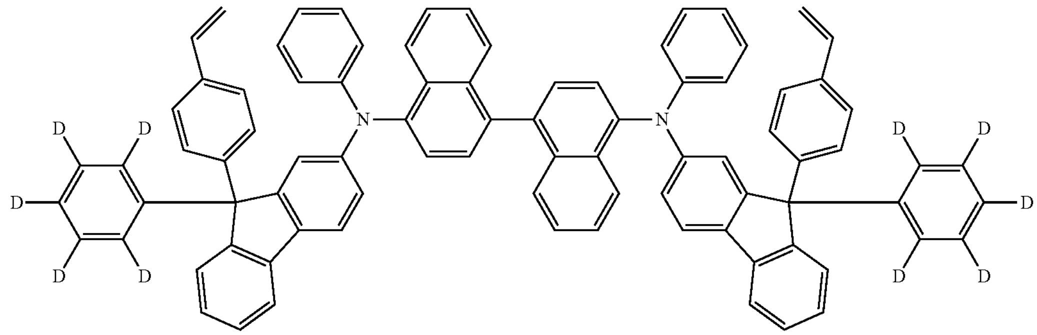
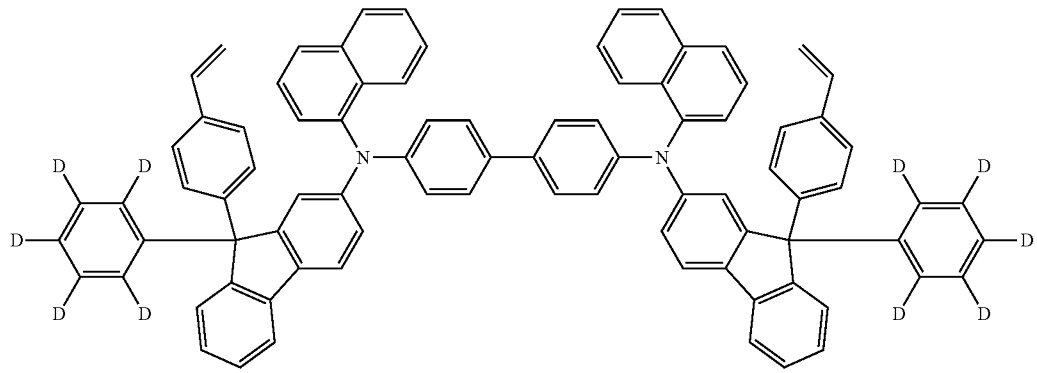
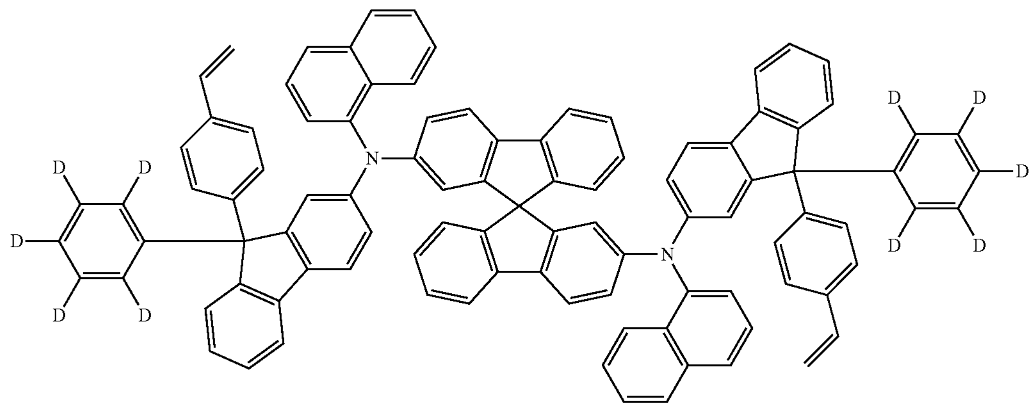
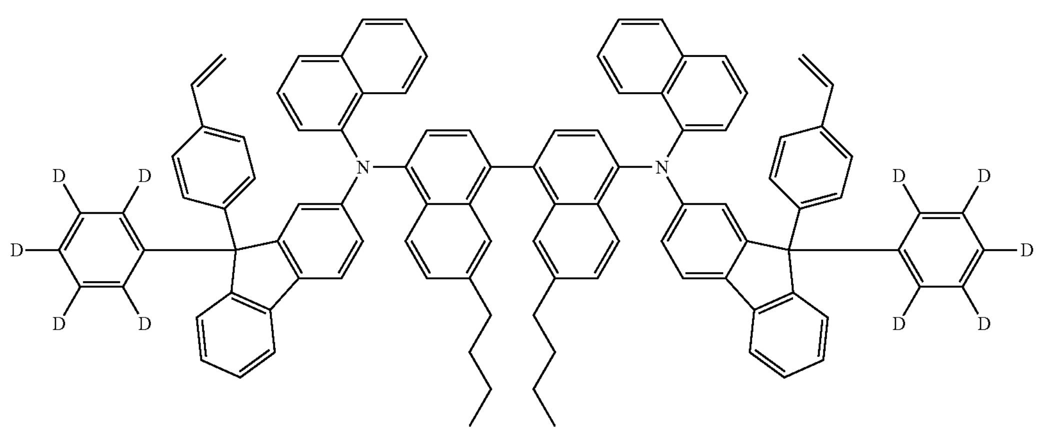

-continued
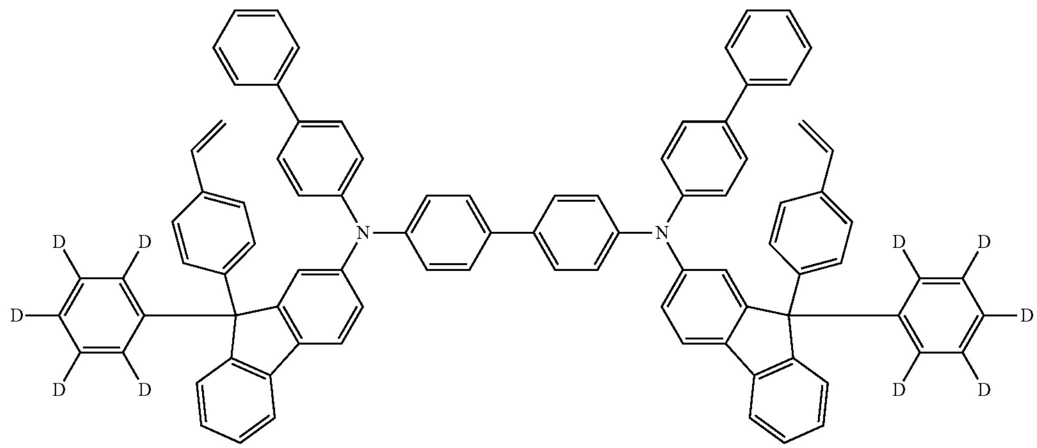
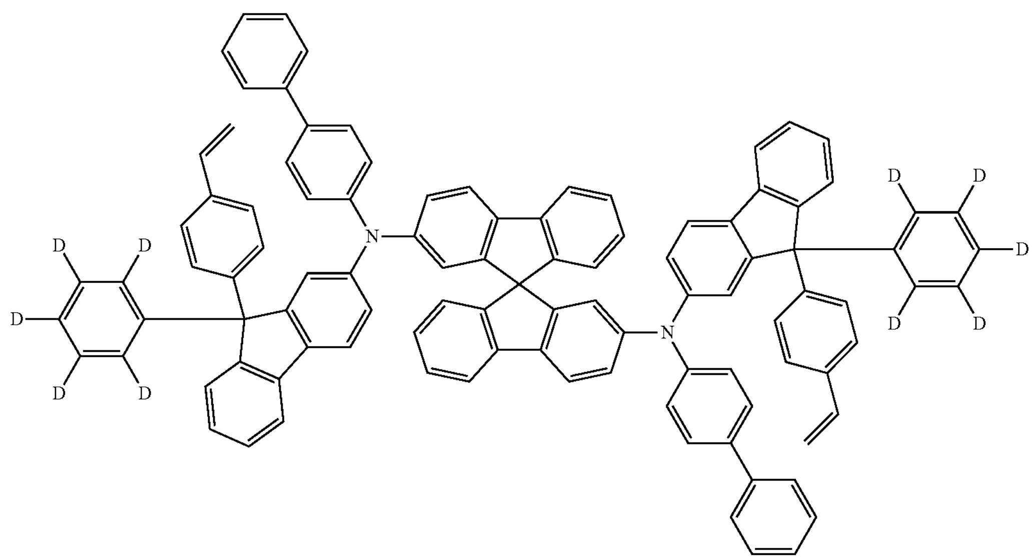
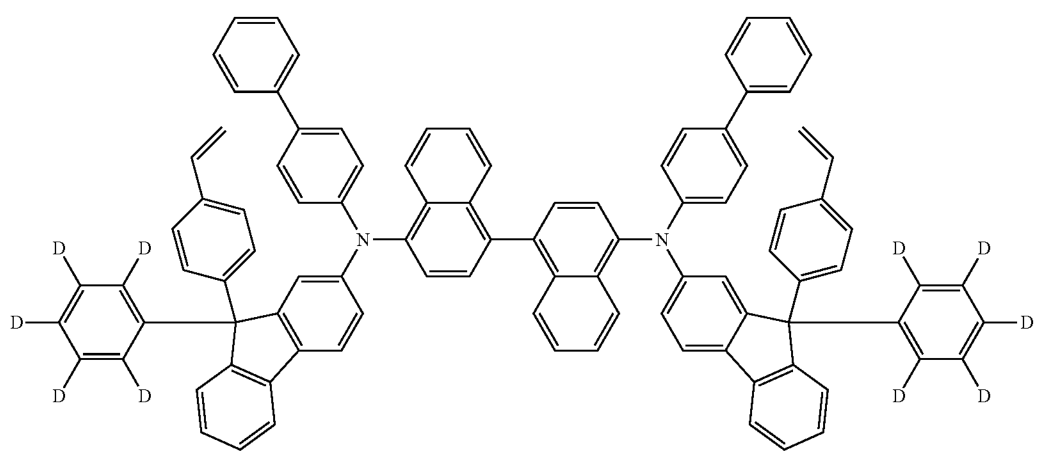

-continued
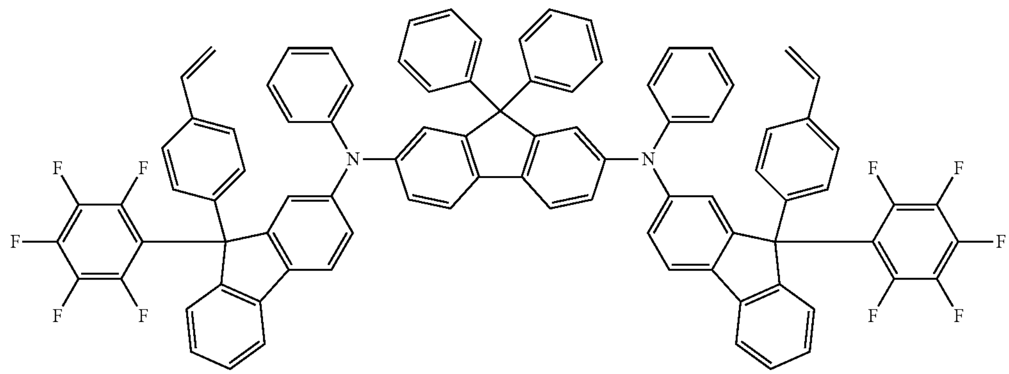
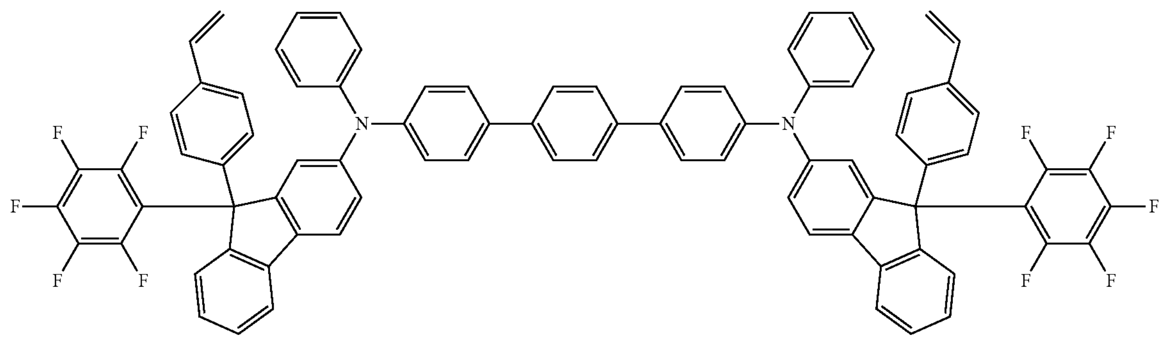
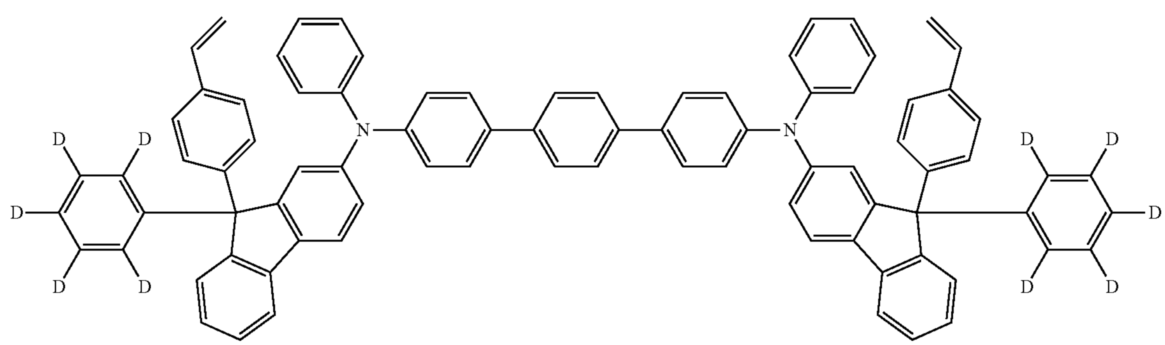
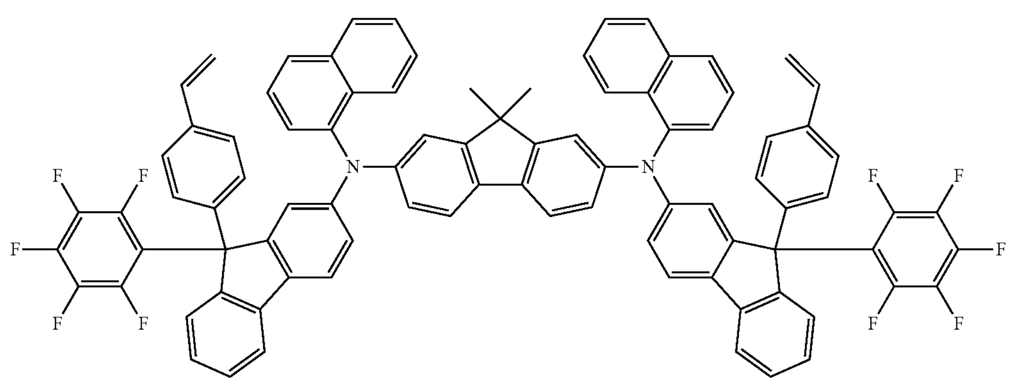

-continued
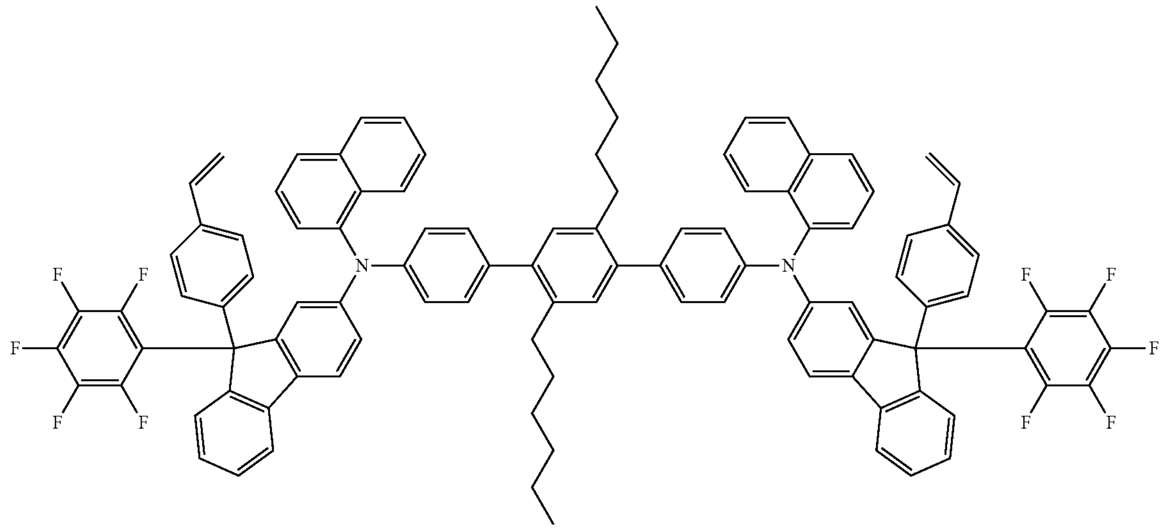
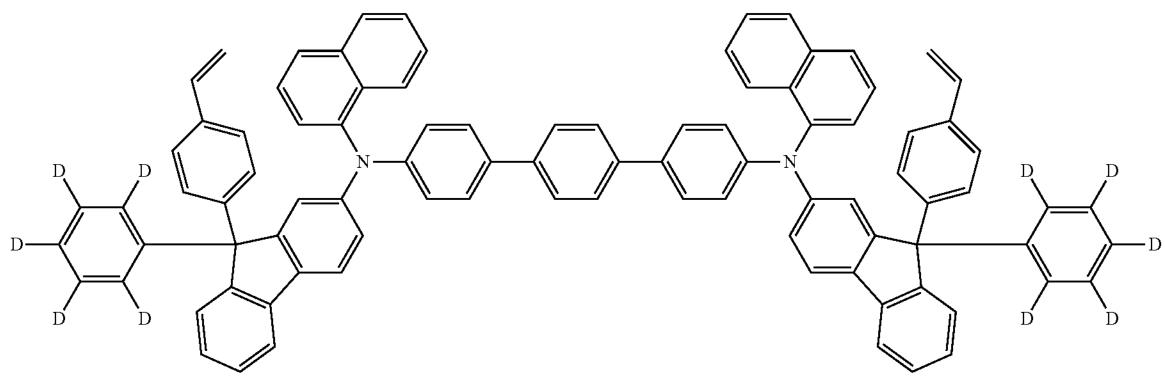
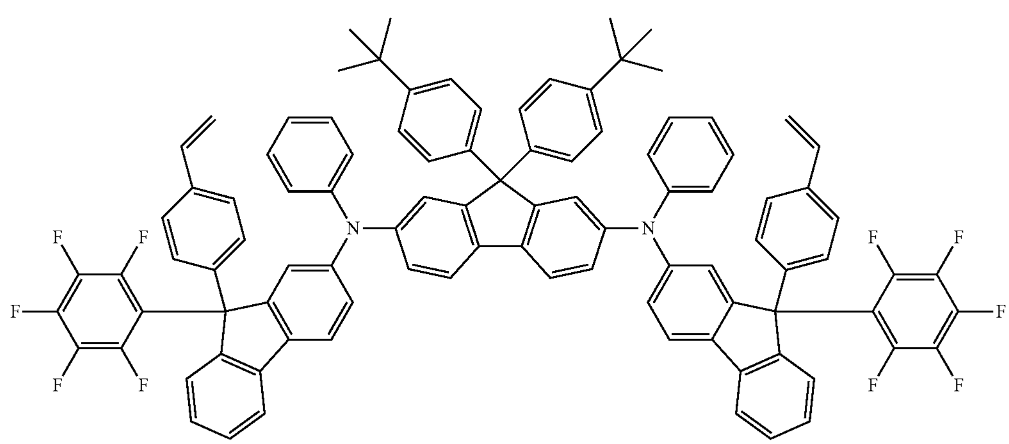

-continued
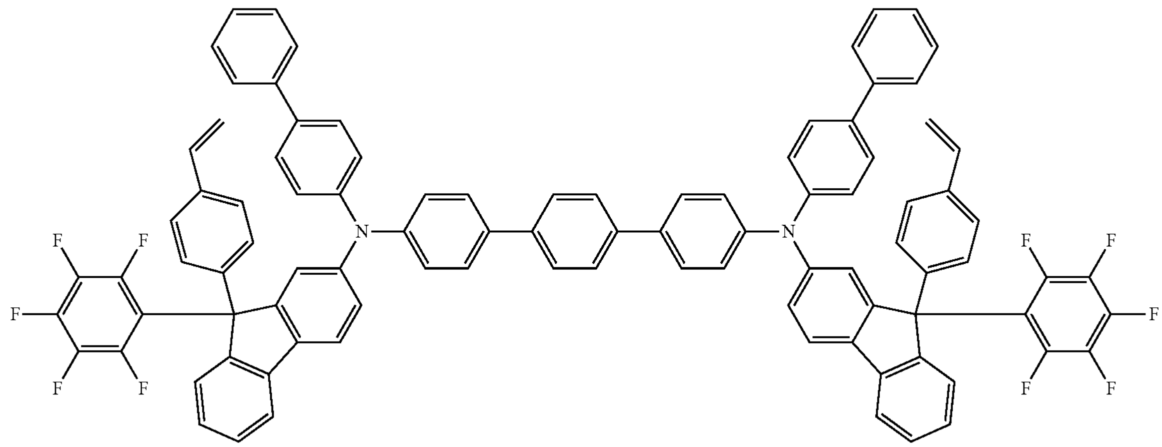
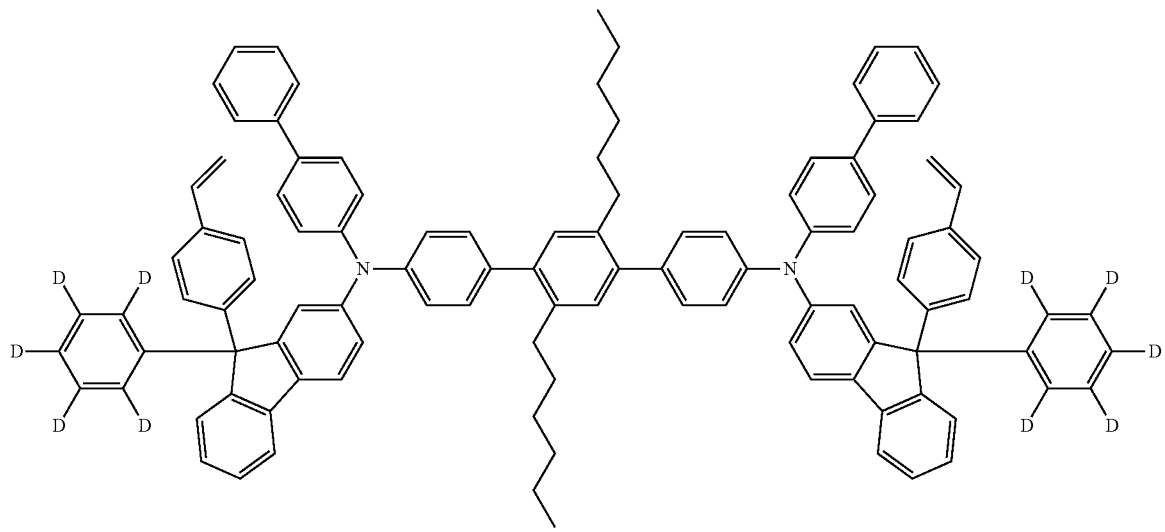
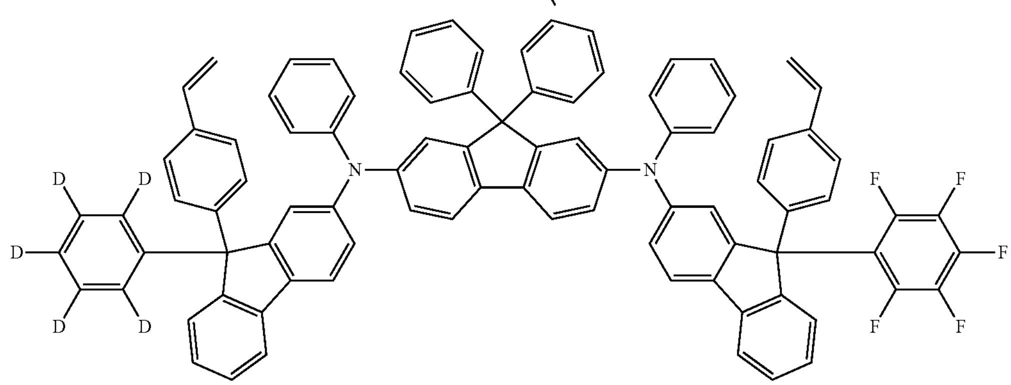
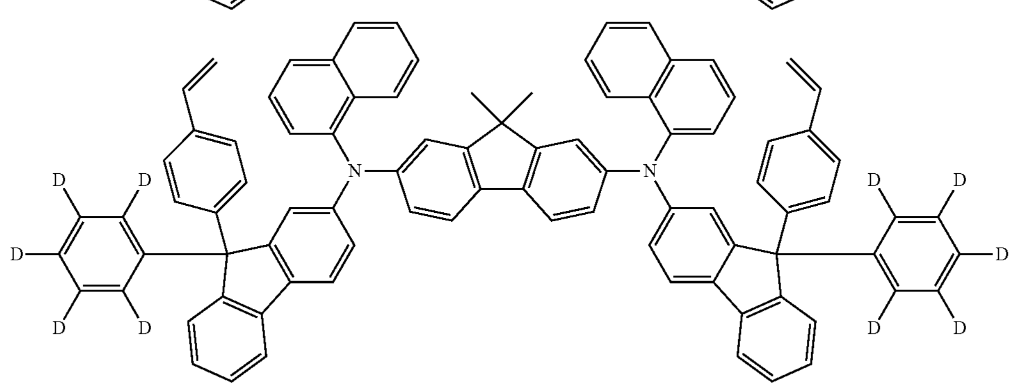

-continued
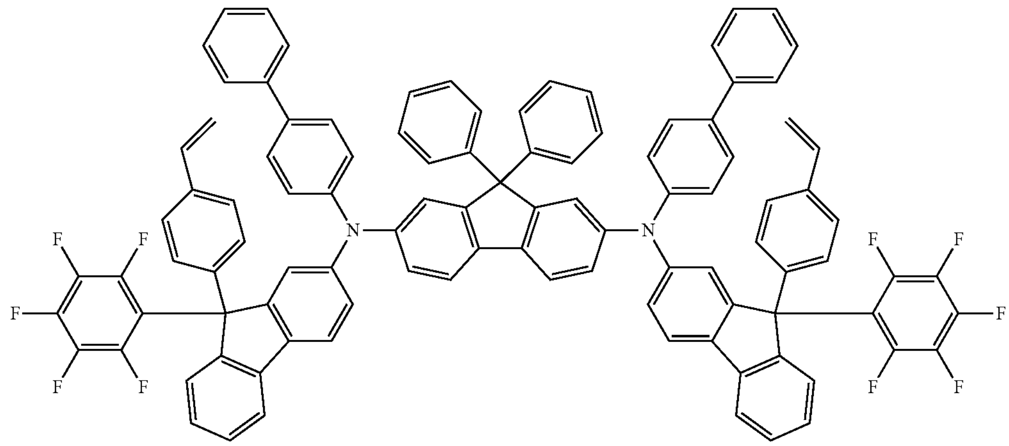
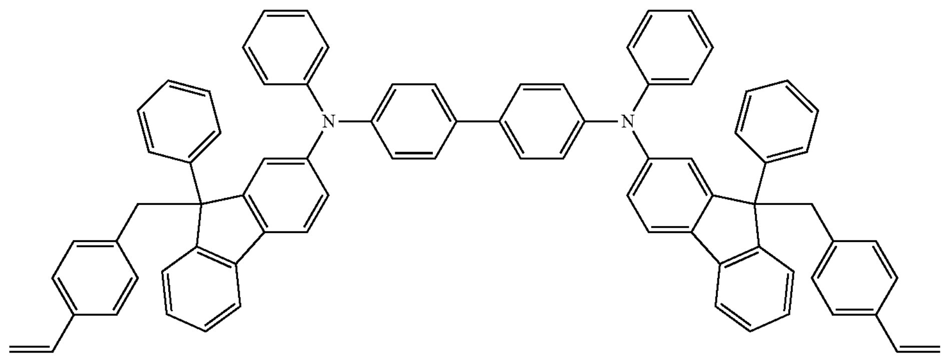
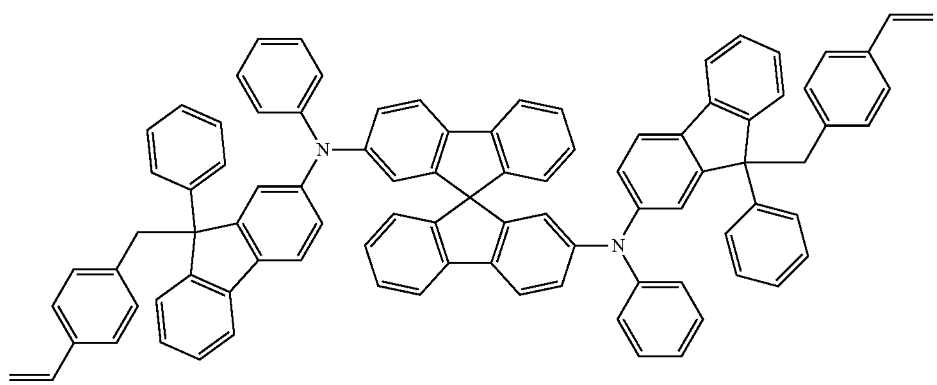
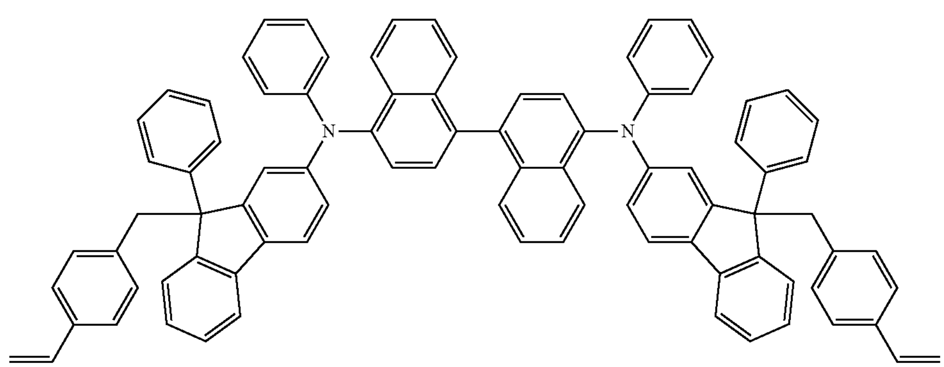

-continued
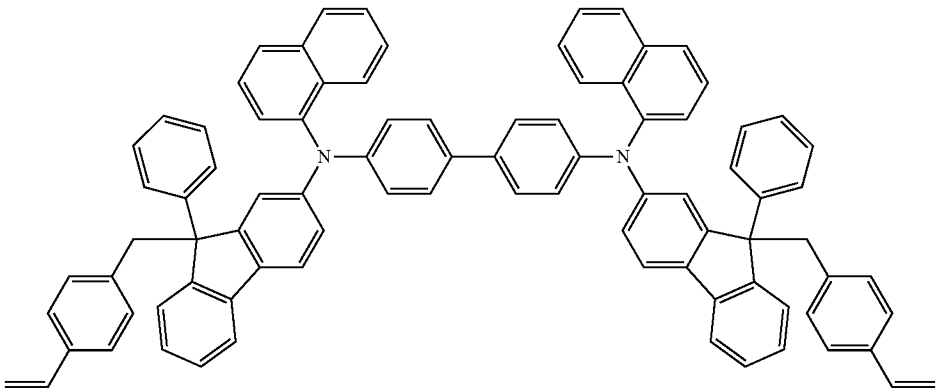
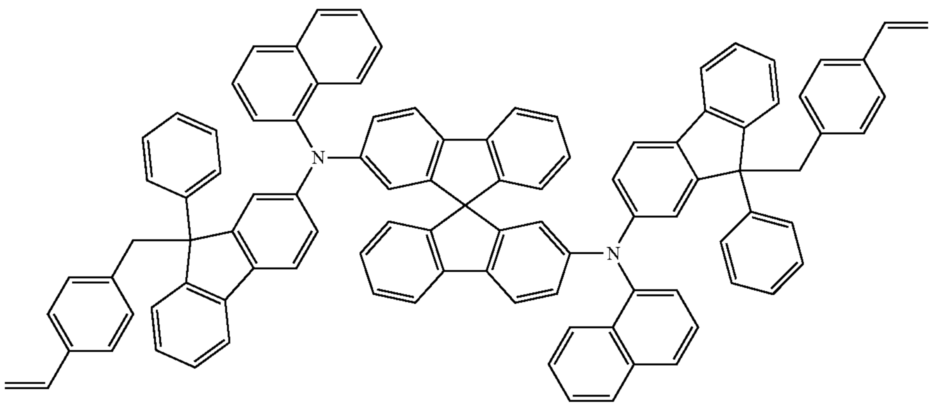
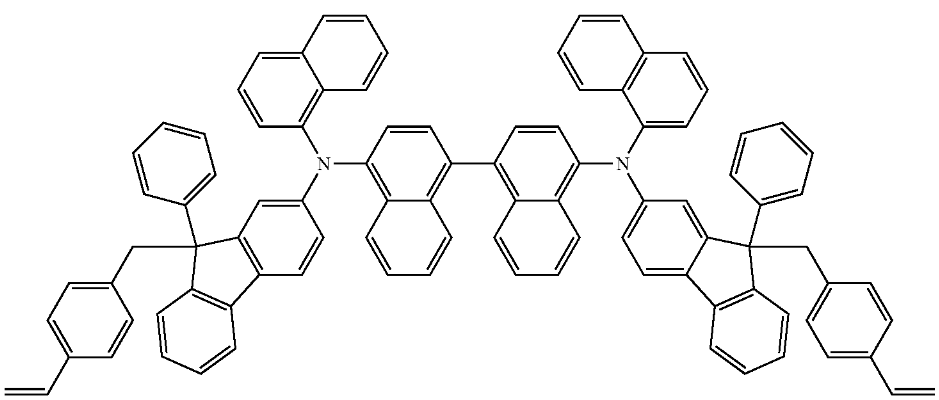
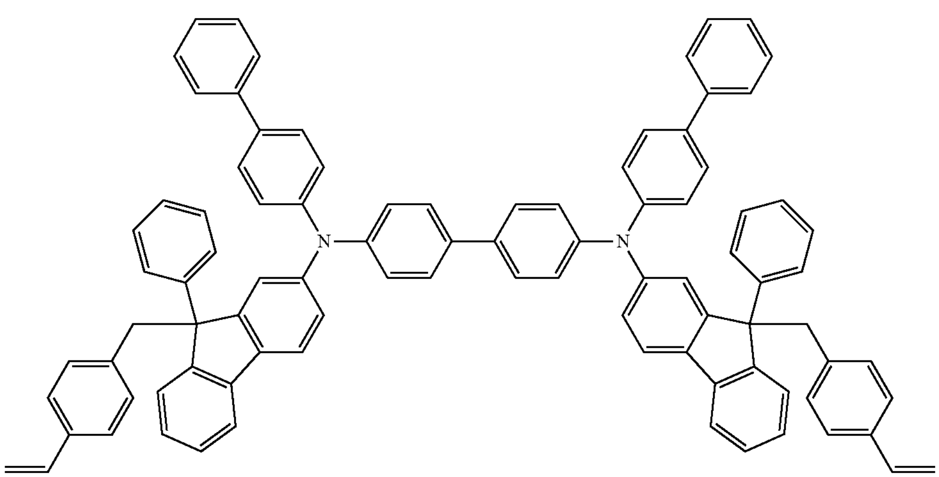

-continued
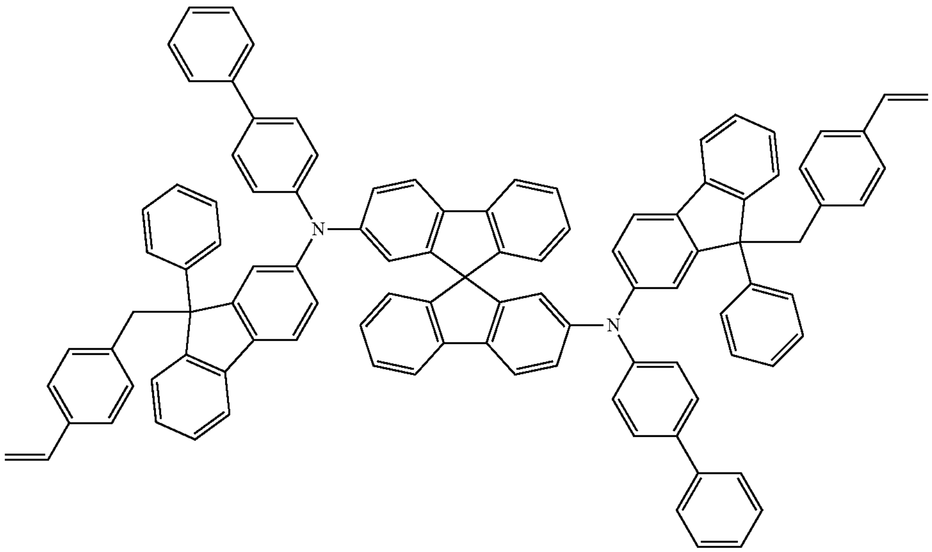
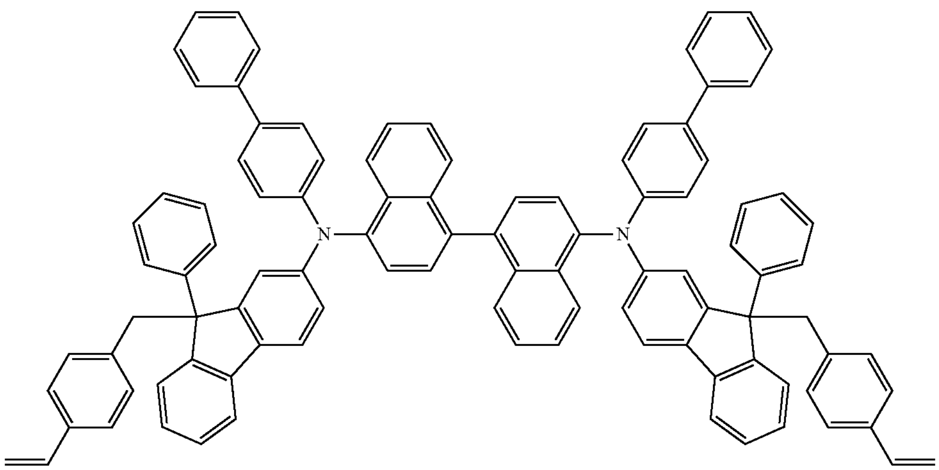
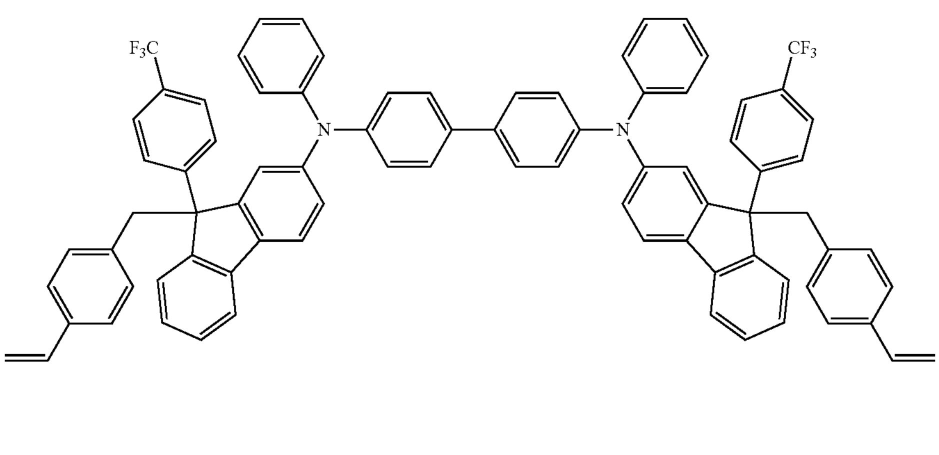

-continued
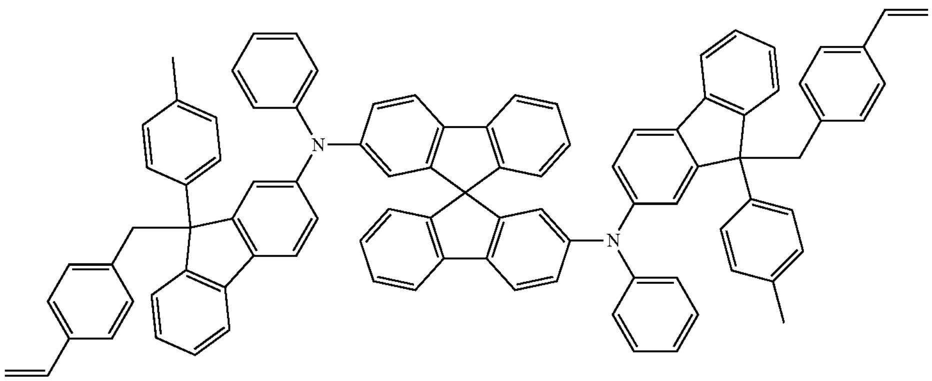
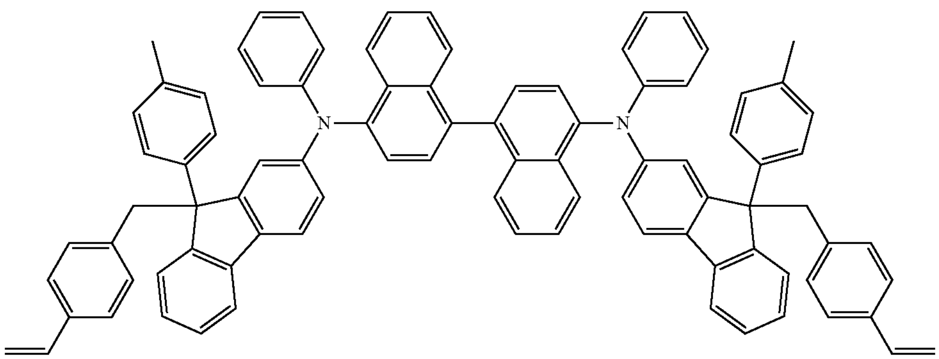
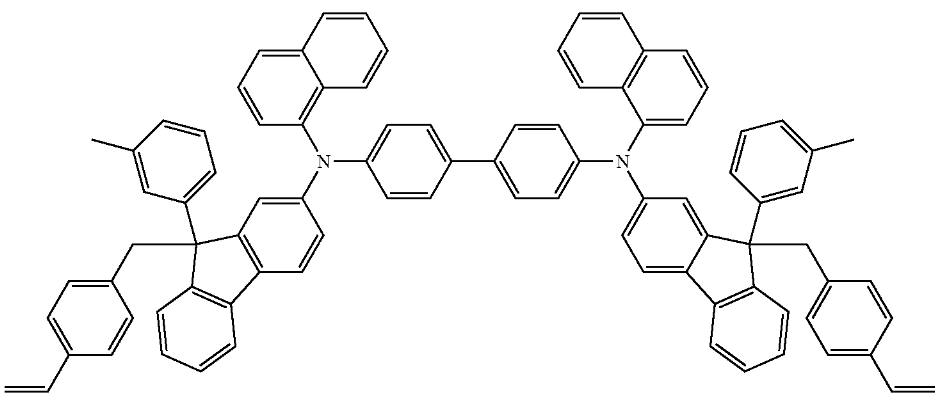
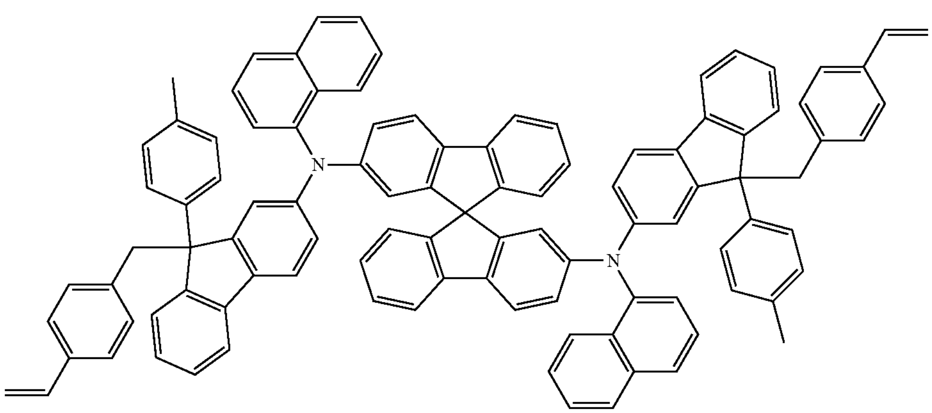

-continued
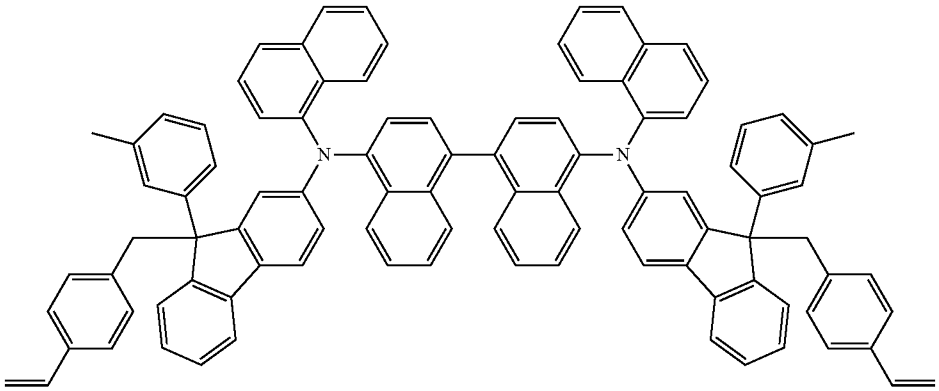
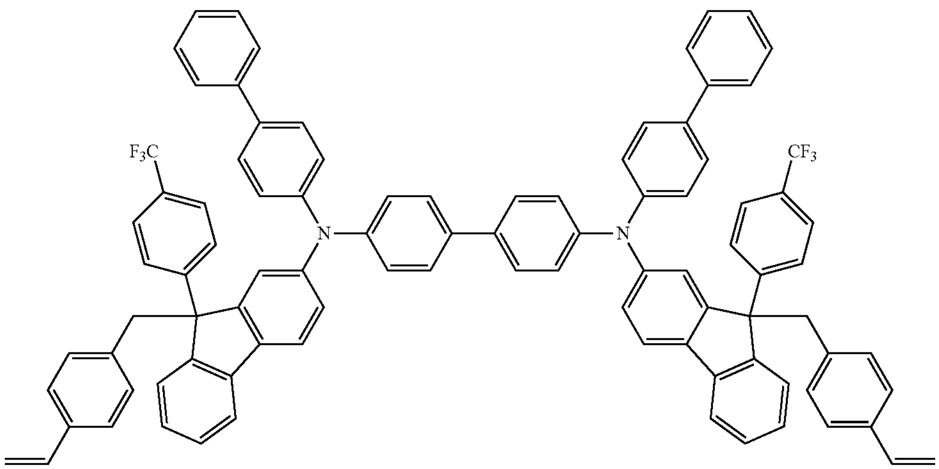
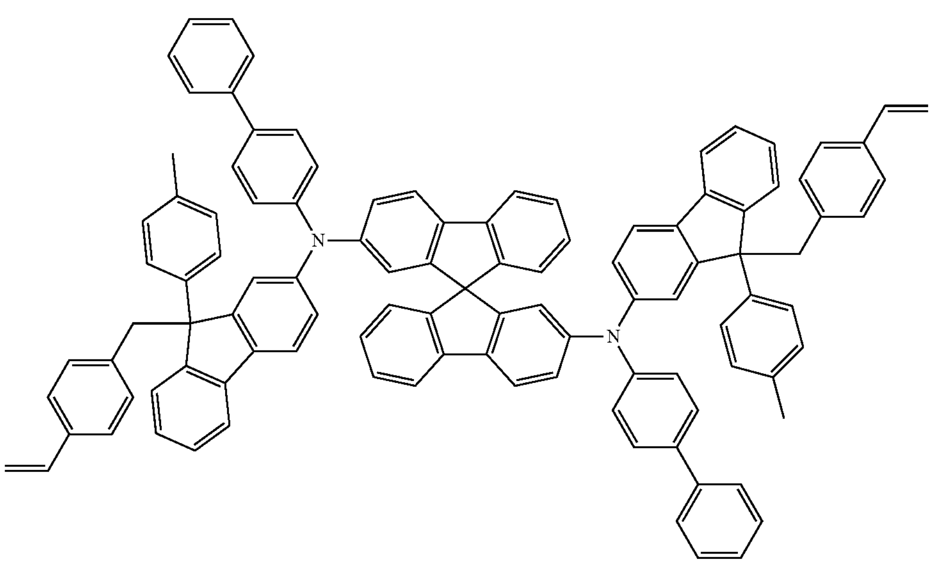

-continued
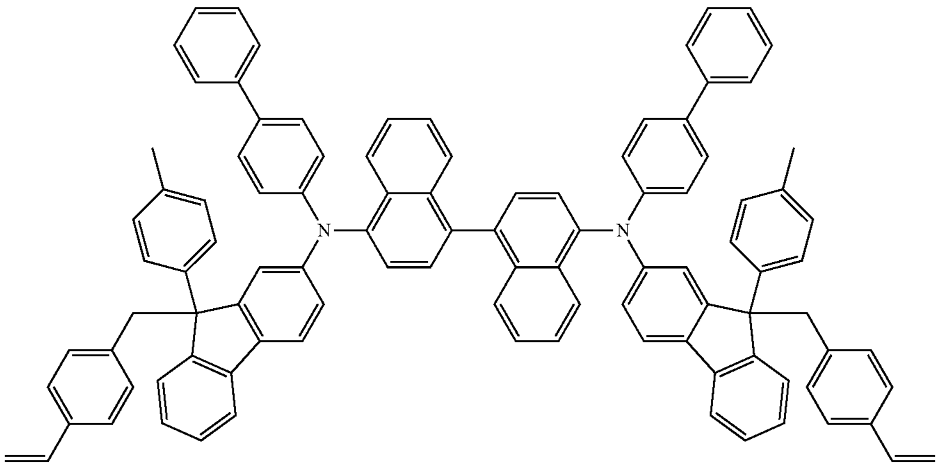
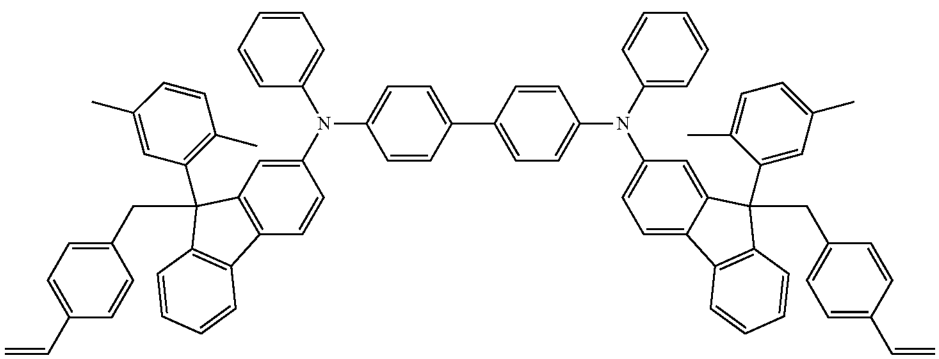
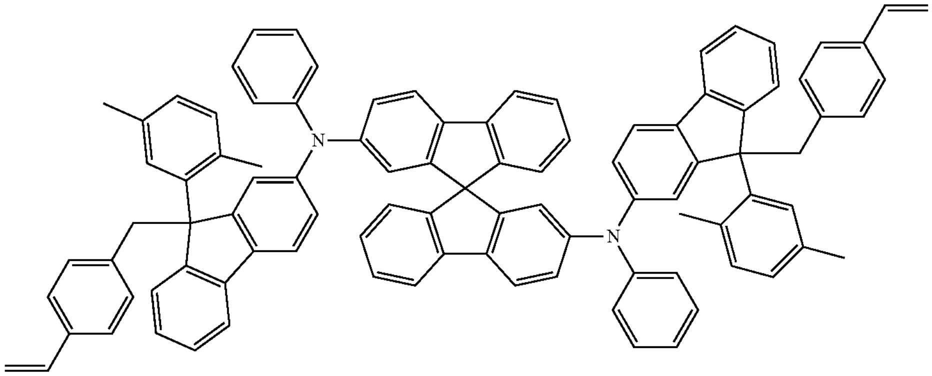
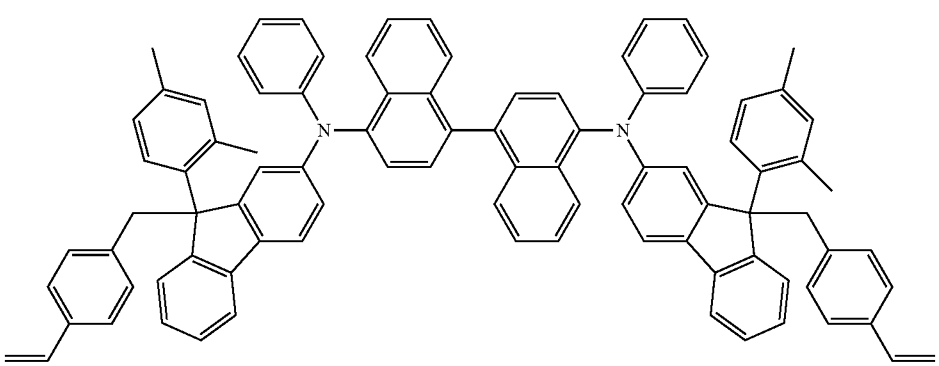

-continued
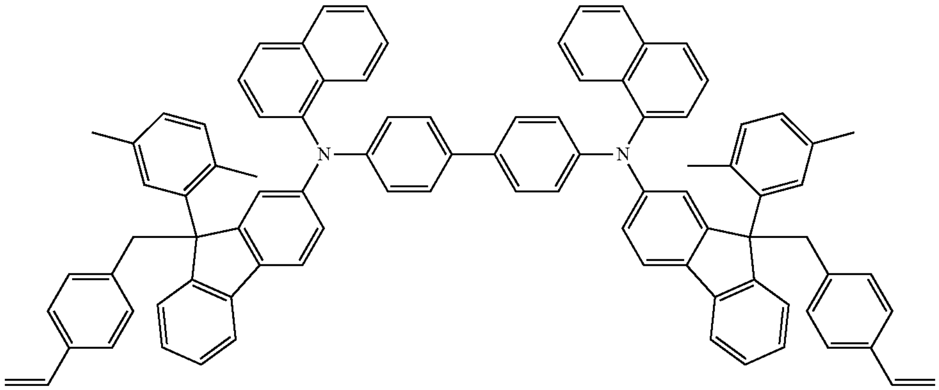
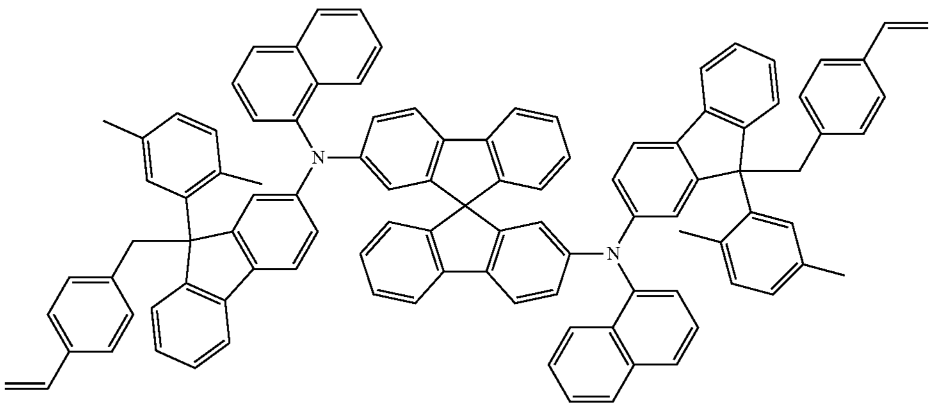
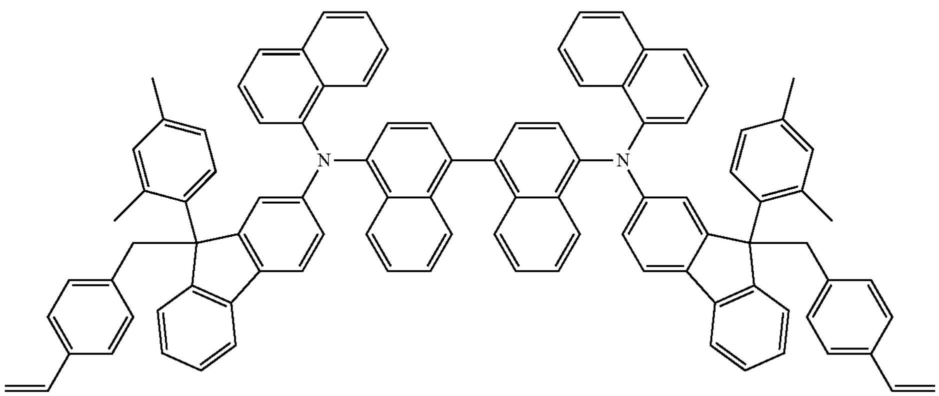
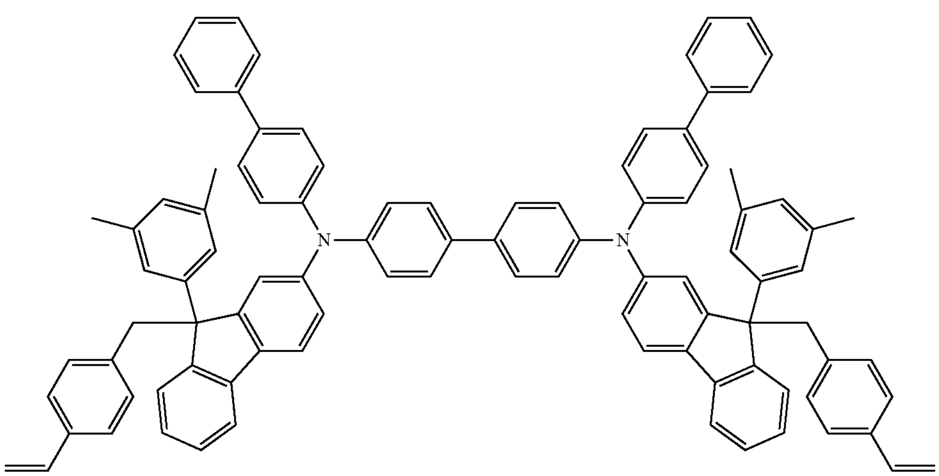

-continued
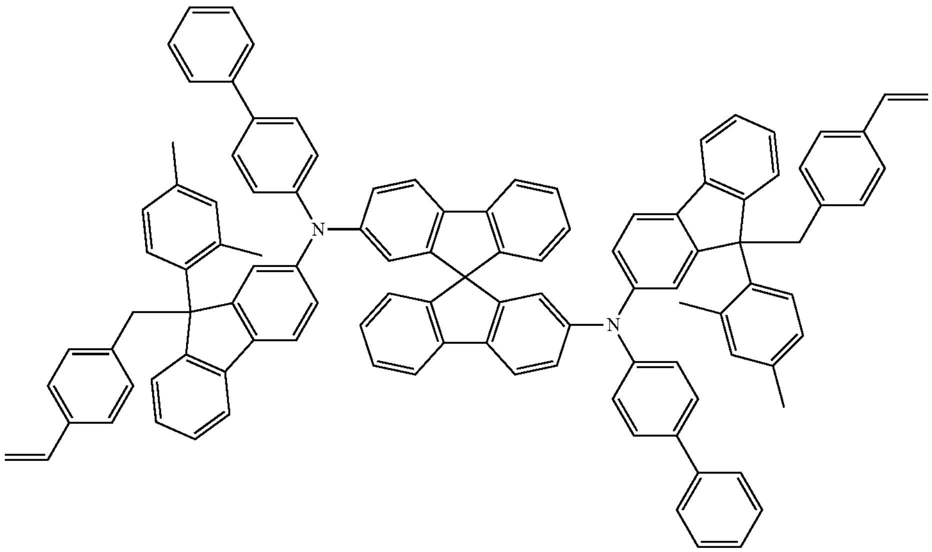
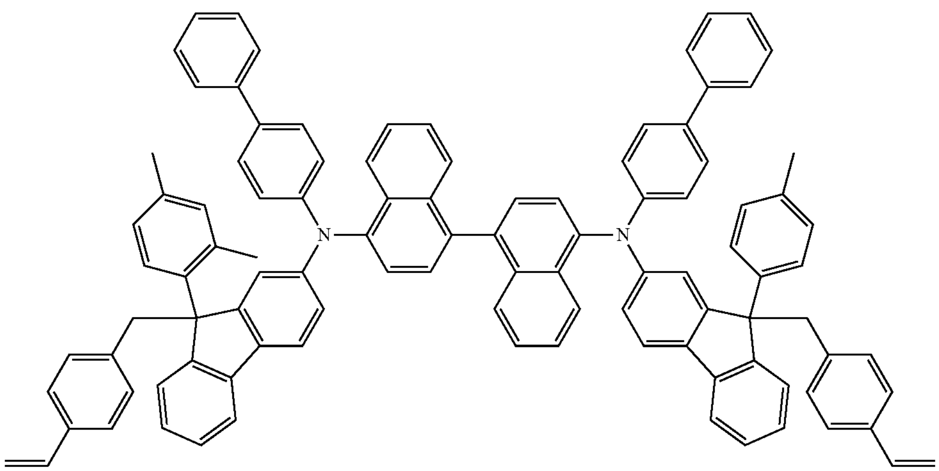
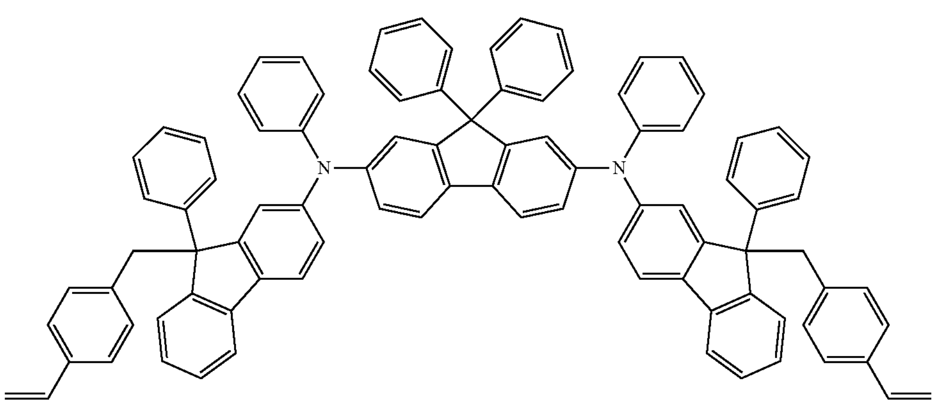

-continued
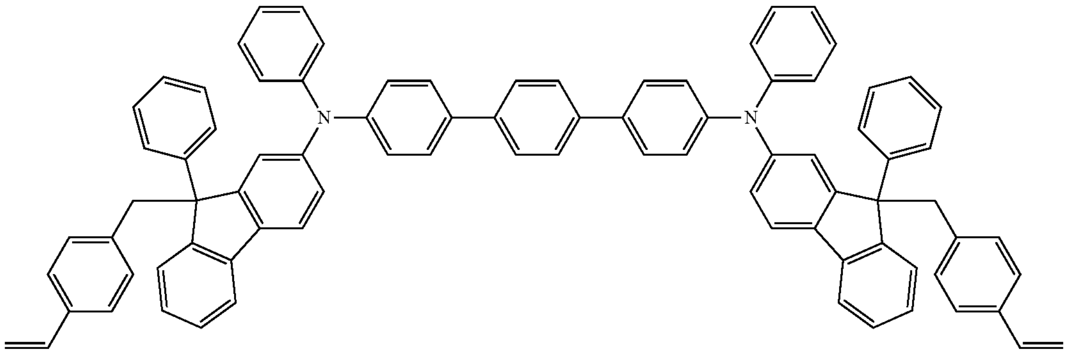
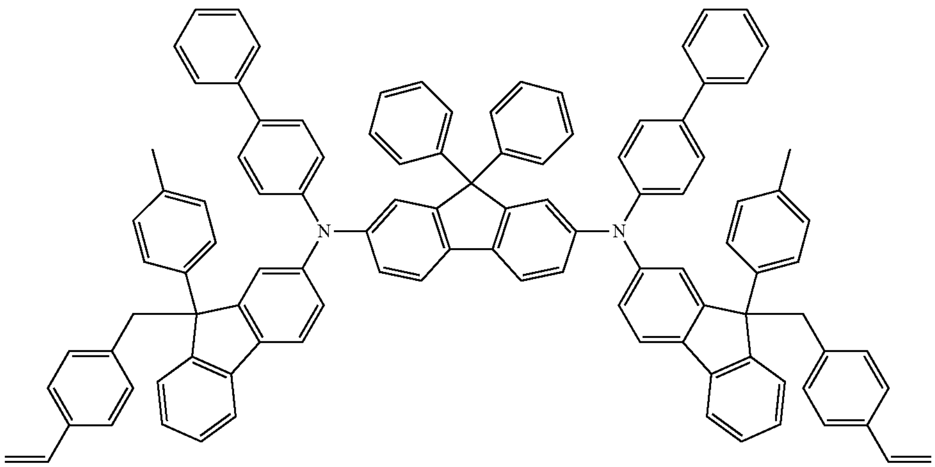
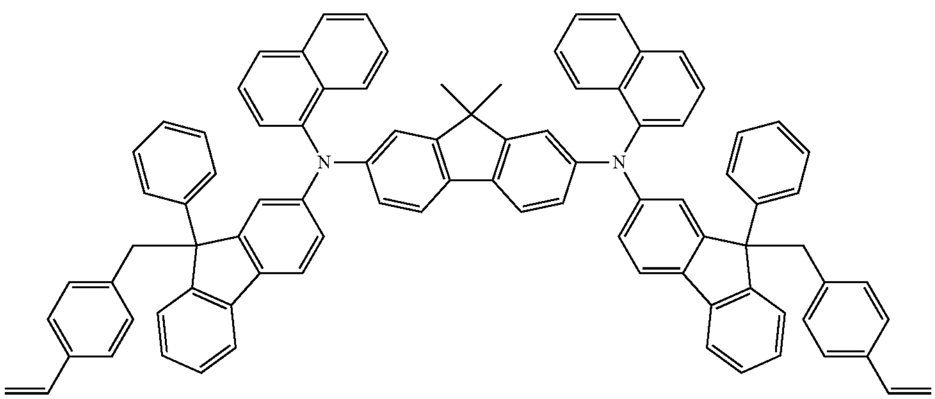
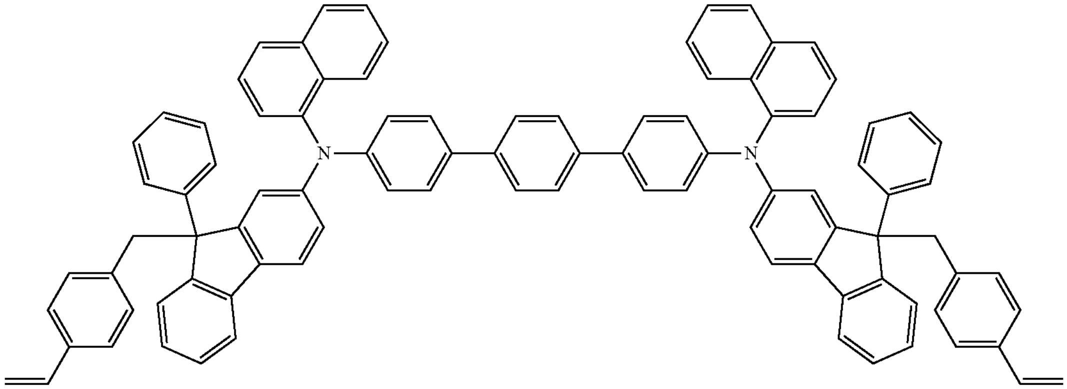

-continued
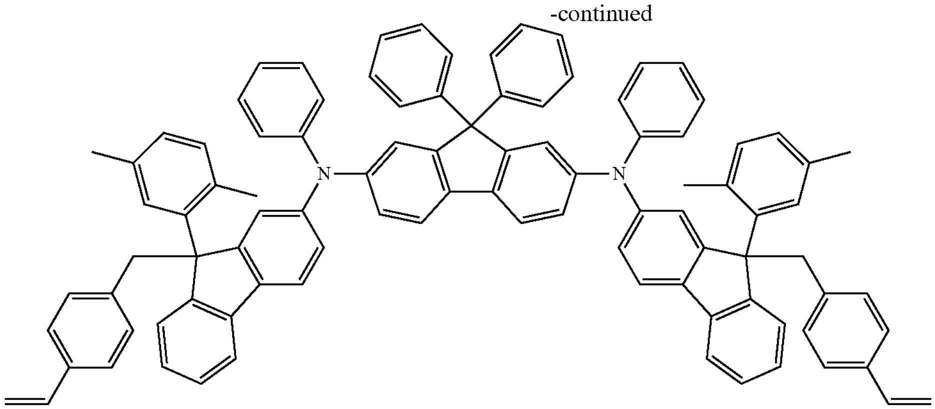
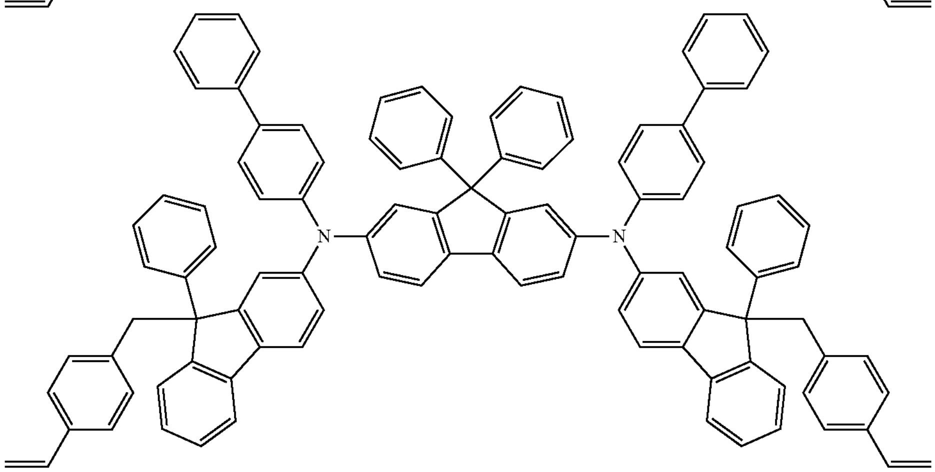
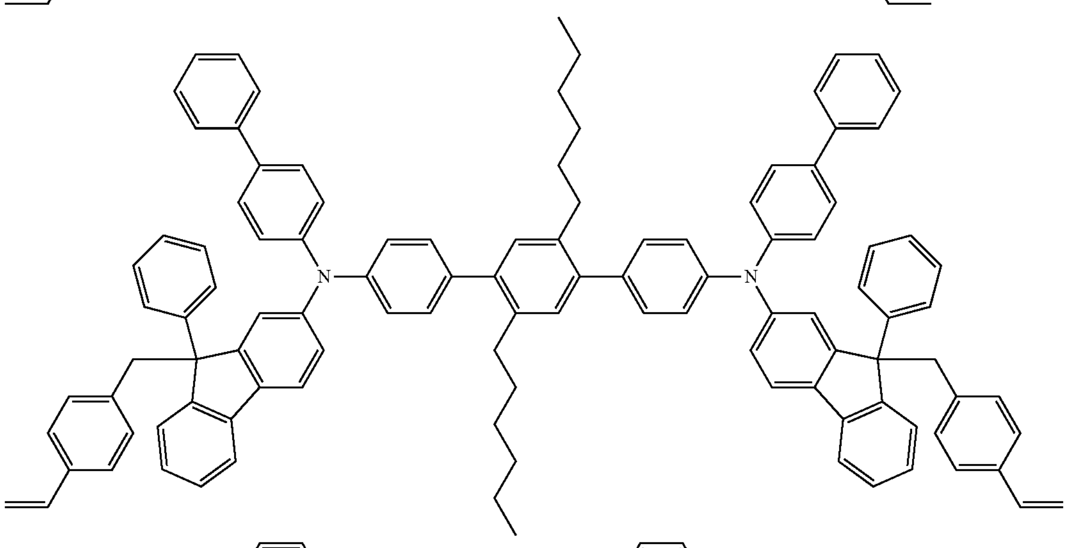
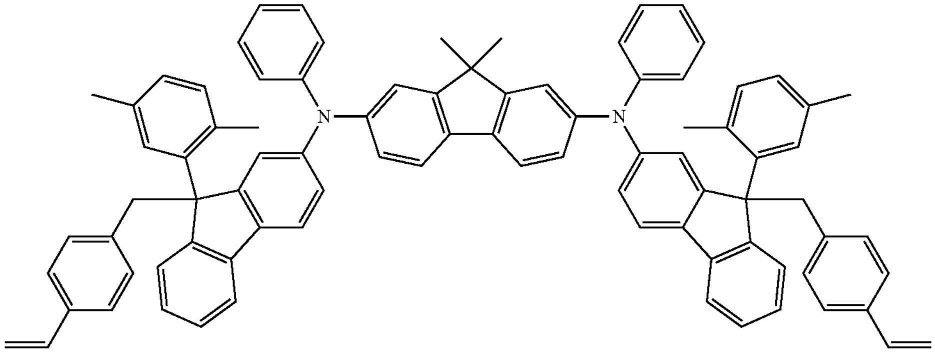

-continued
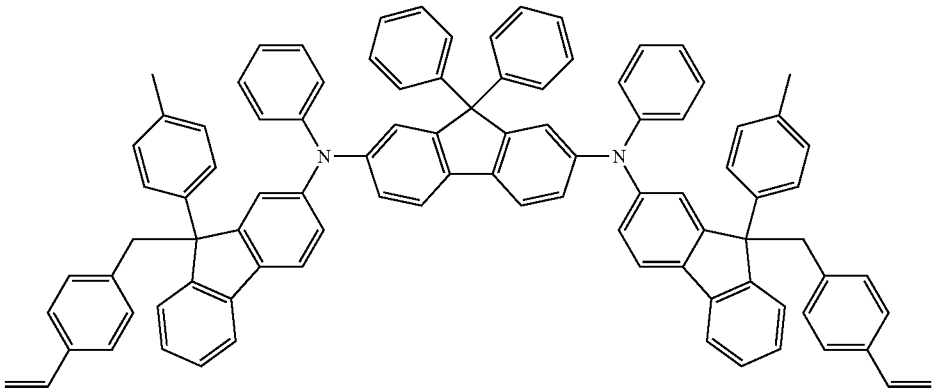
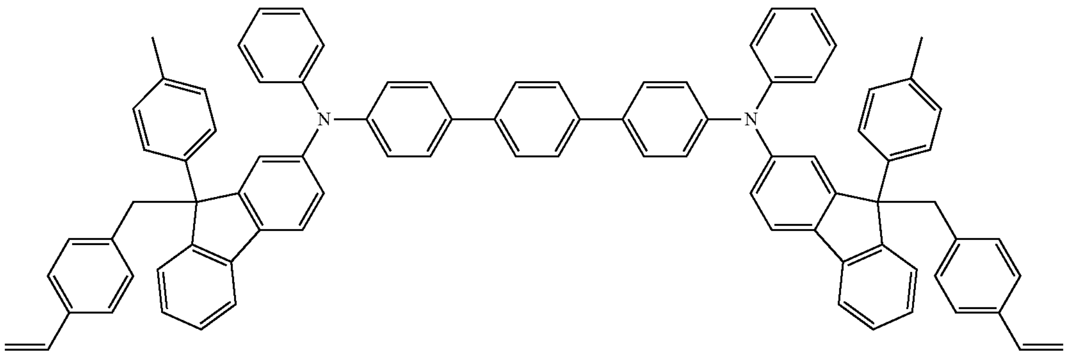
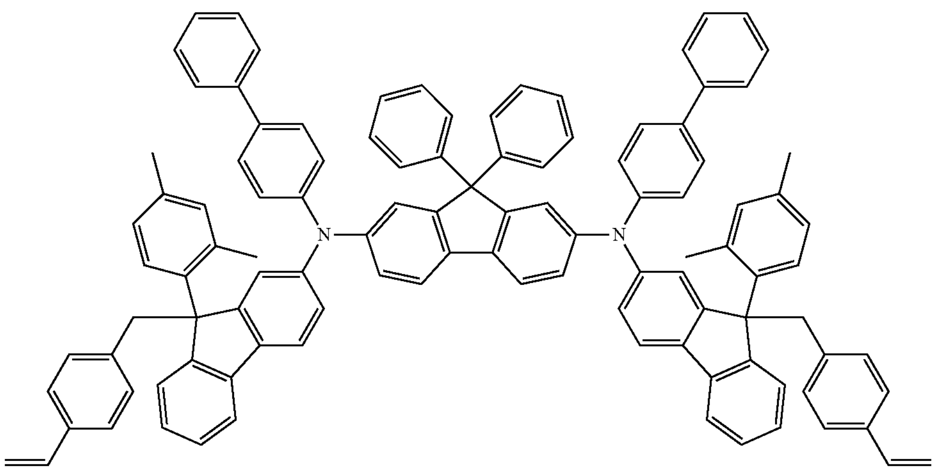
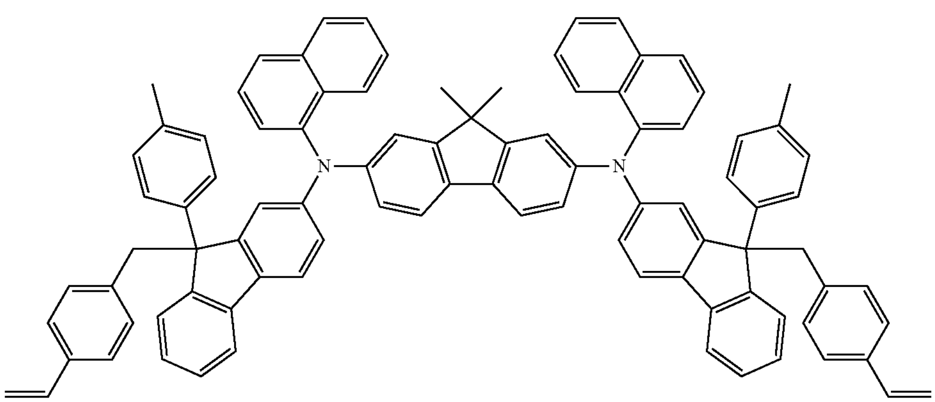

-continued
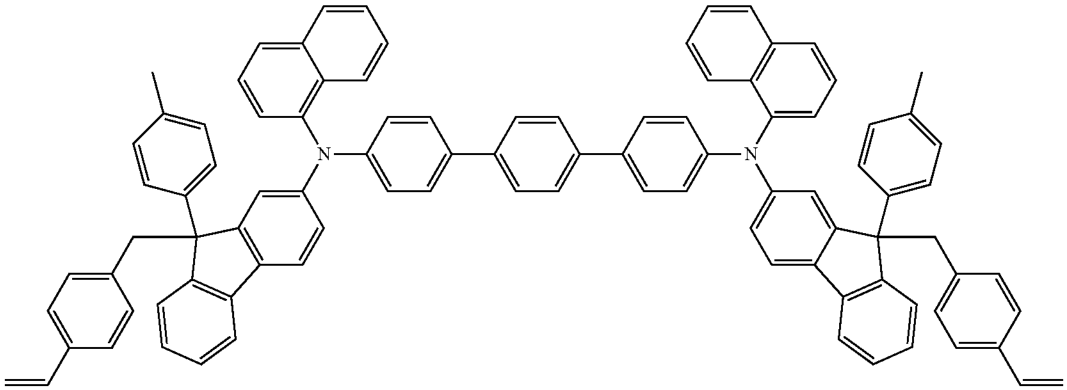
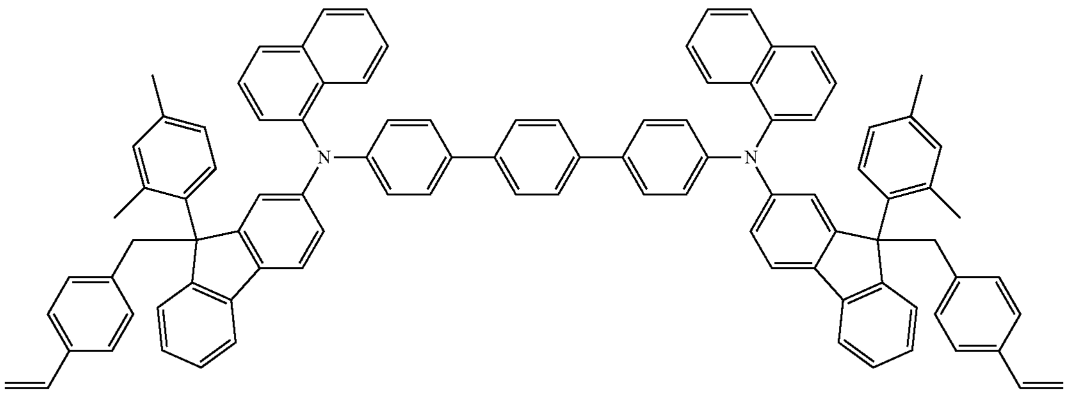
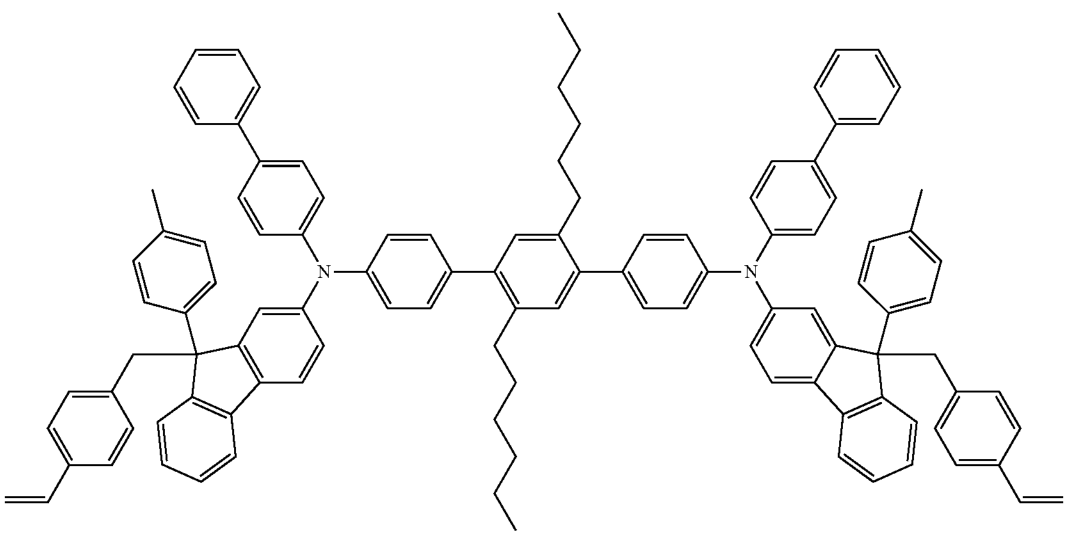
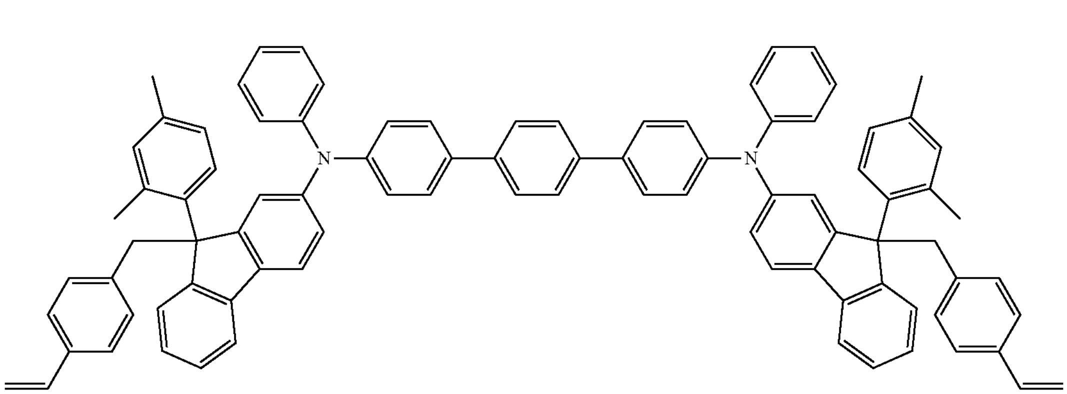

-continued
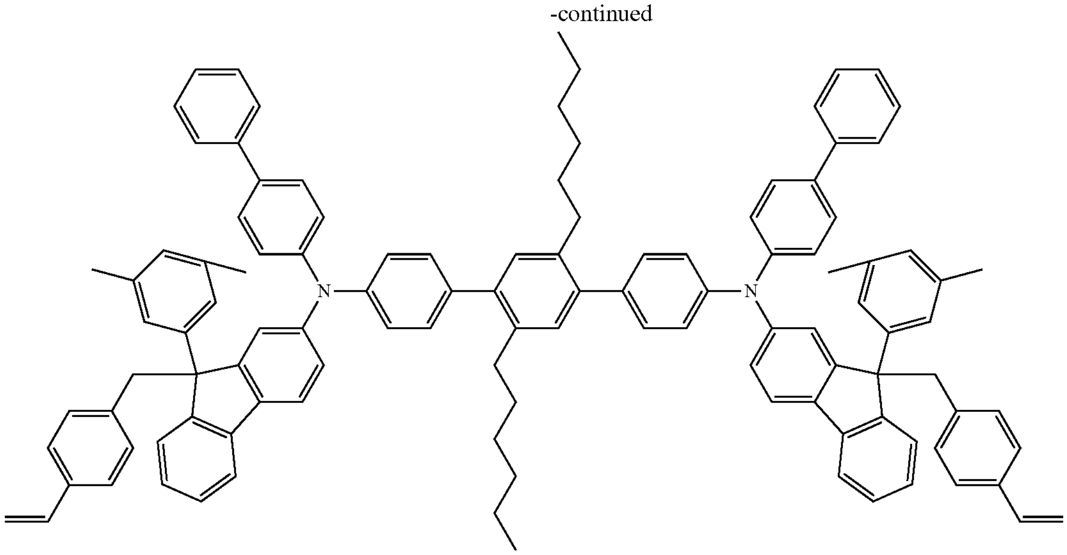
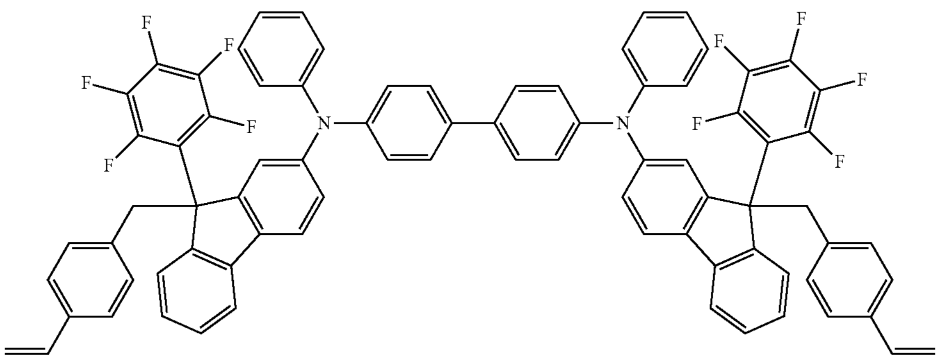
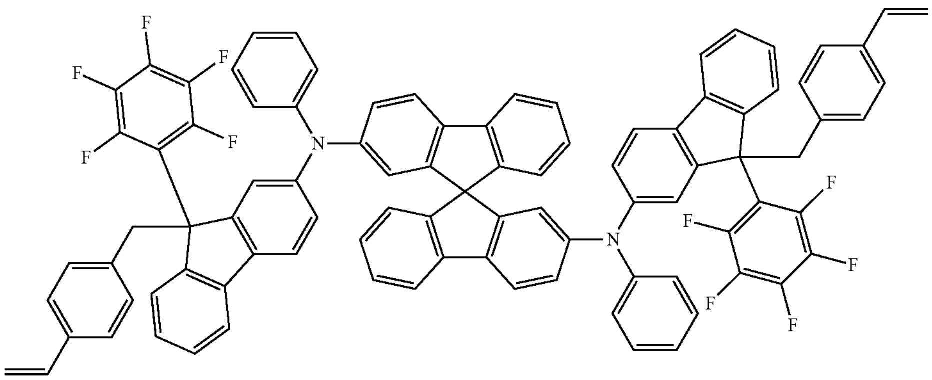
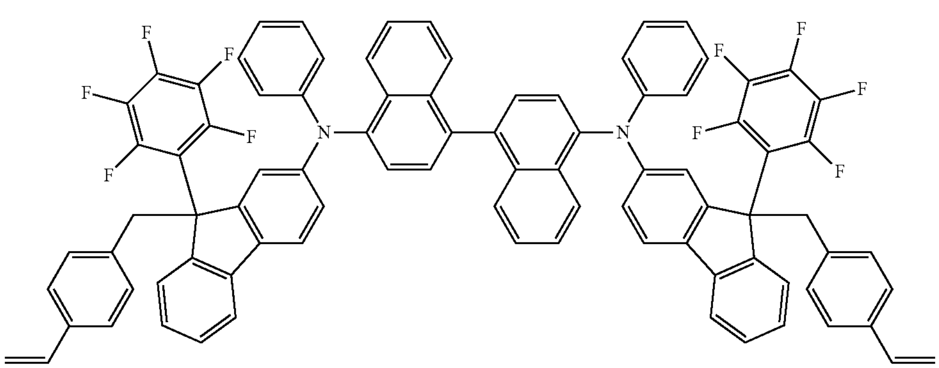

-continued
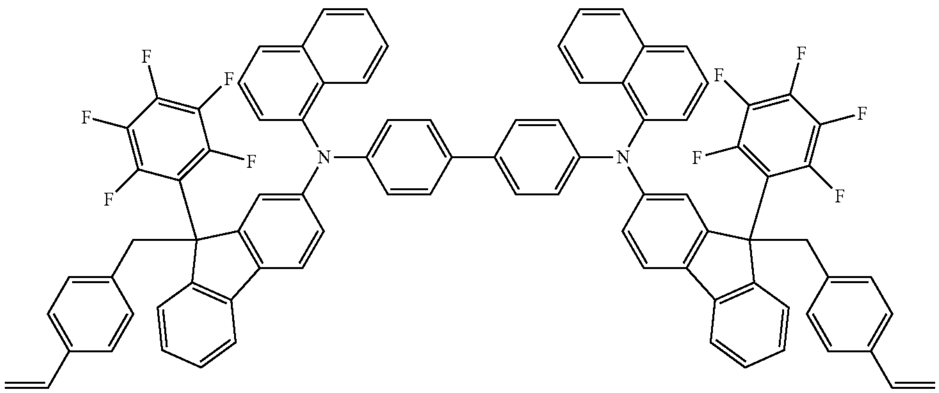
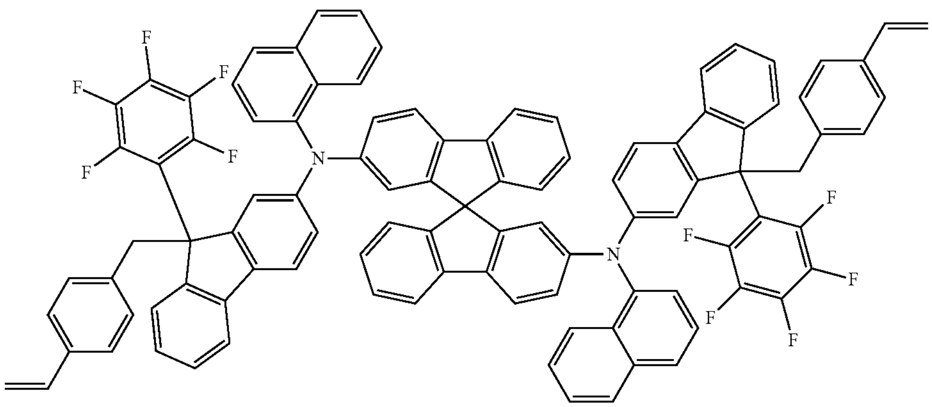
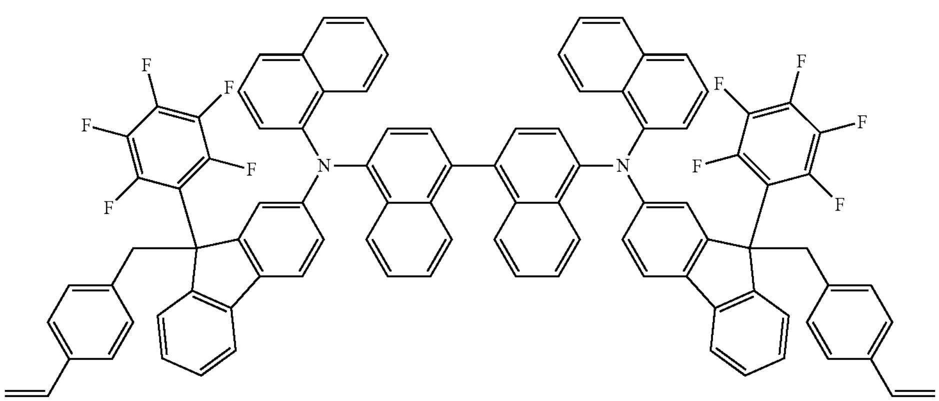
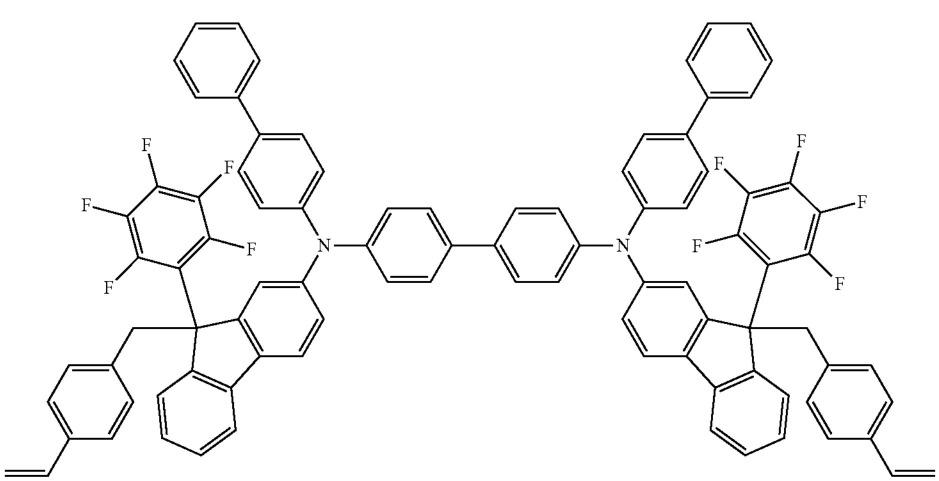

-continued
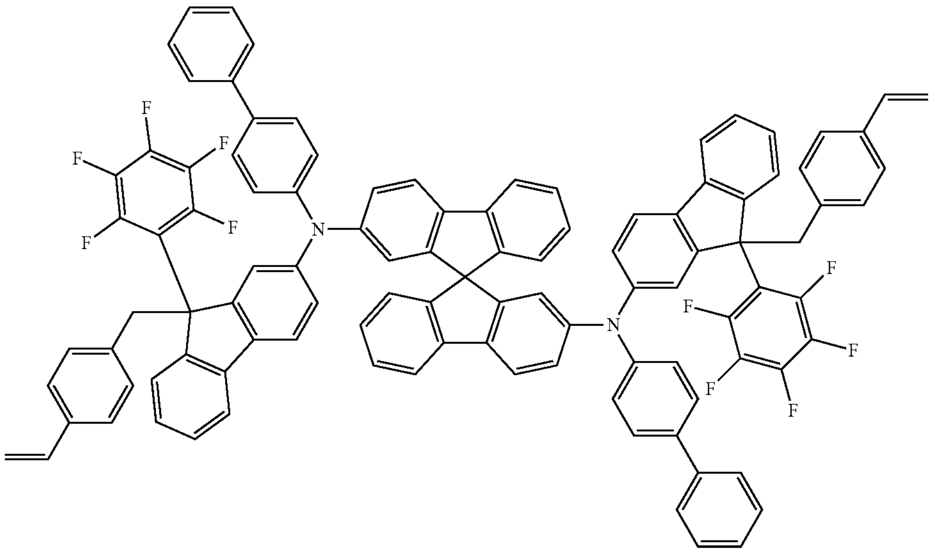
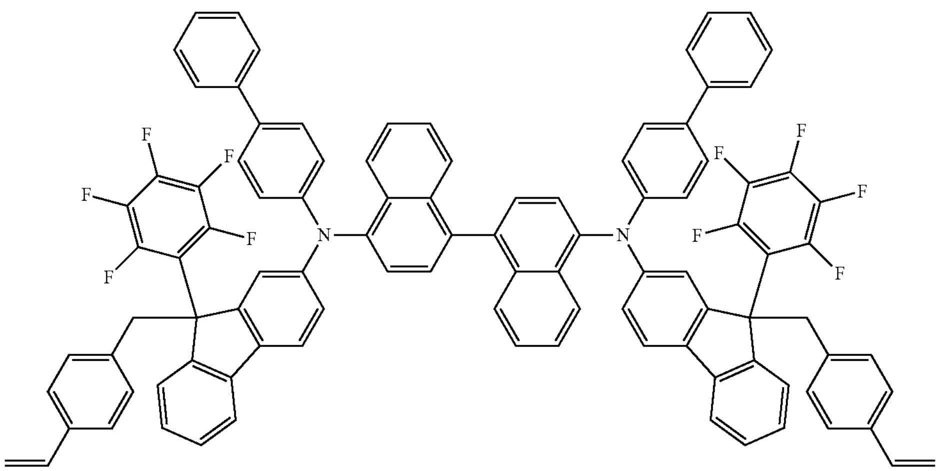
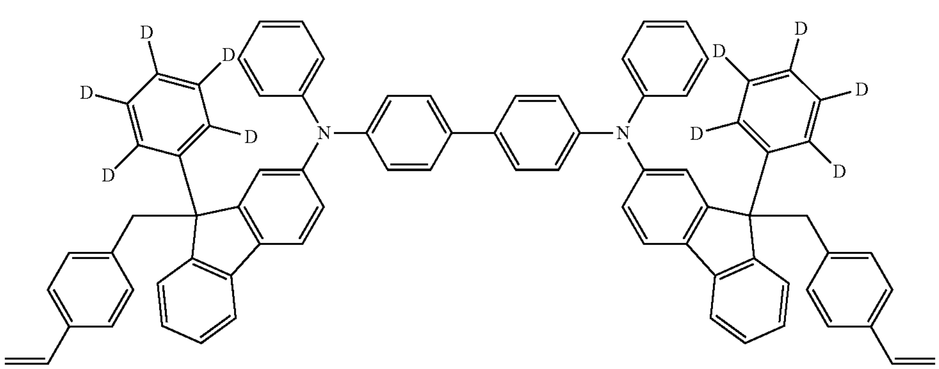

-continued
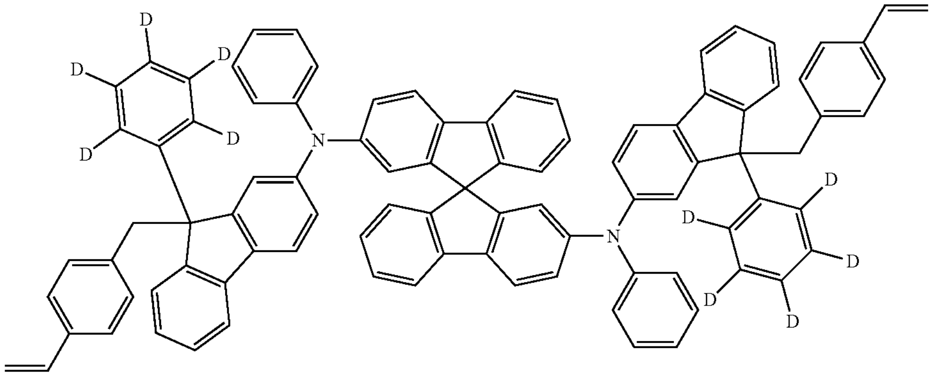
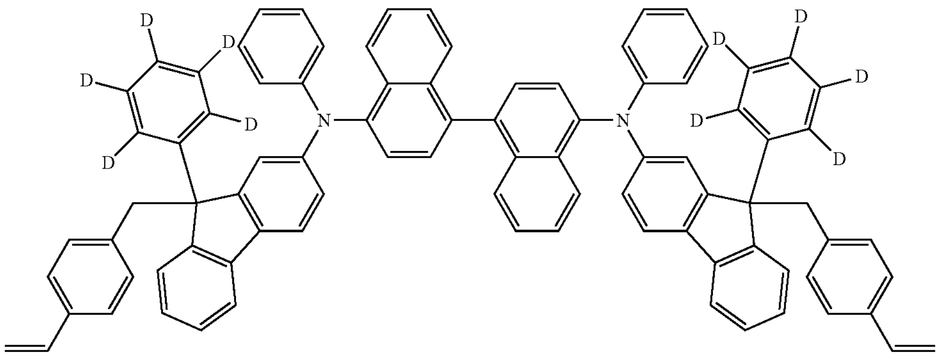
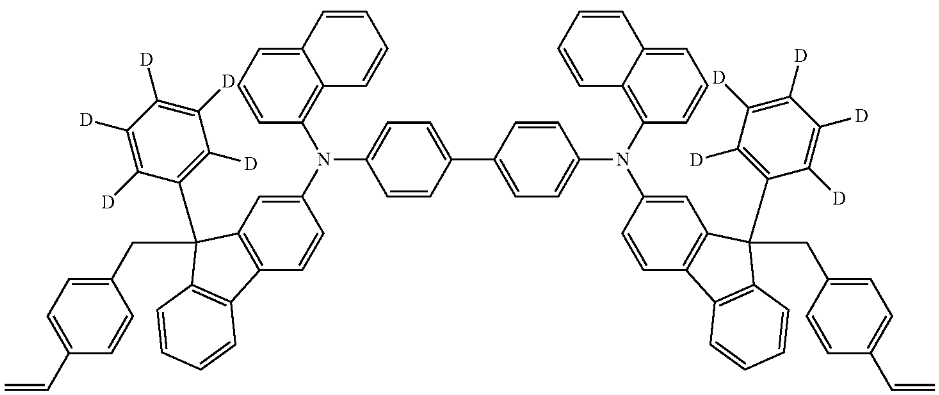
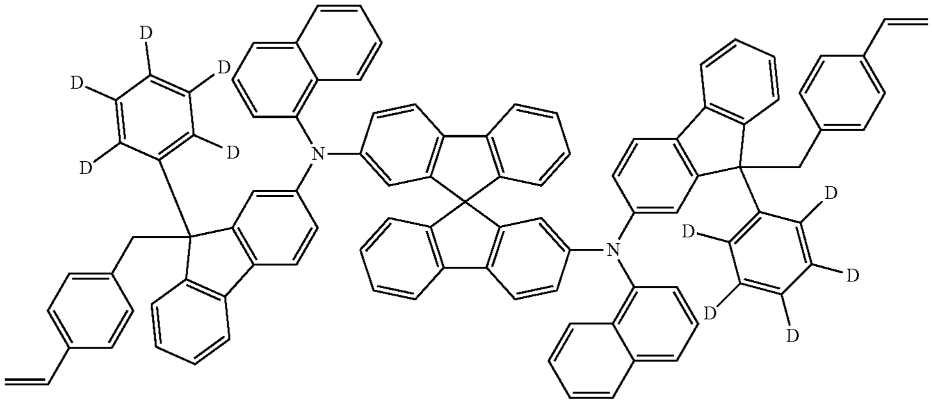

-continued
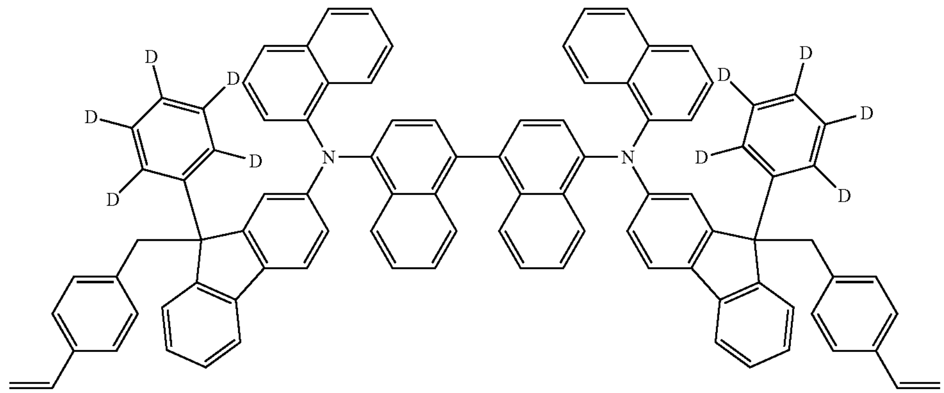
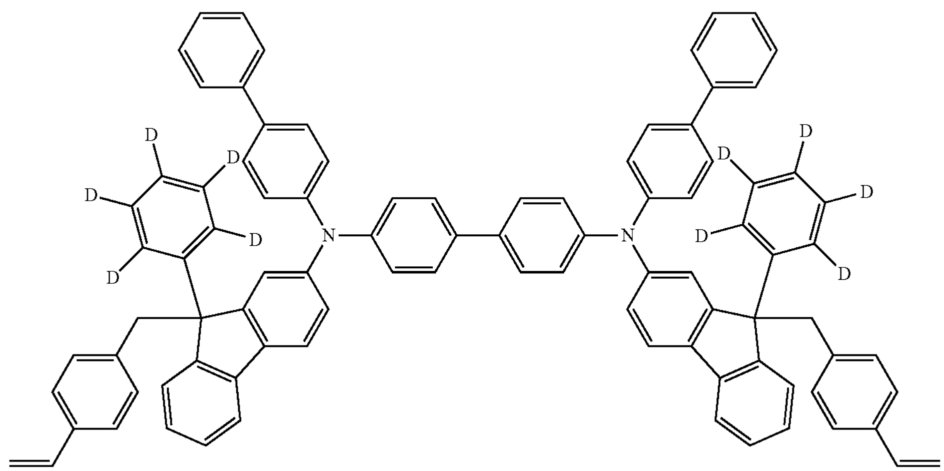
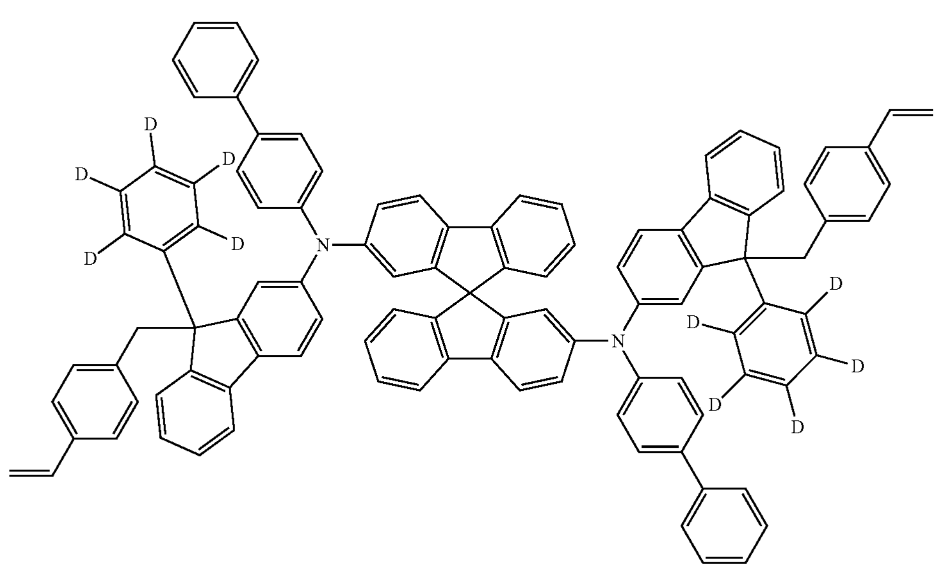

-continued
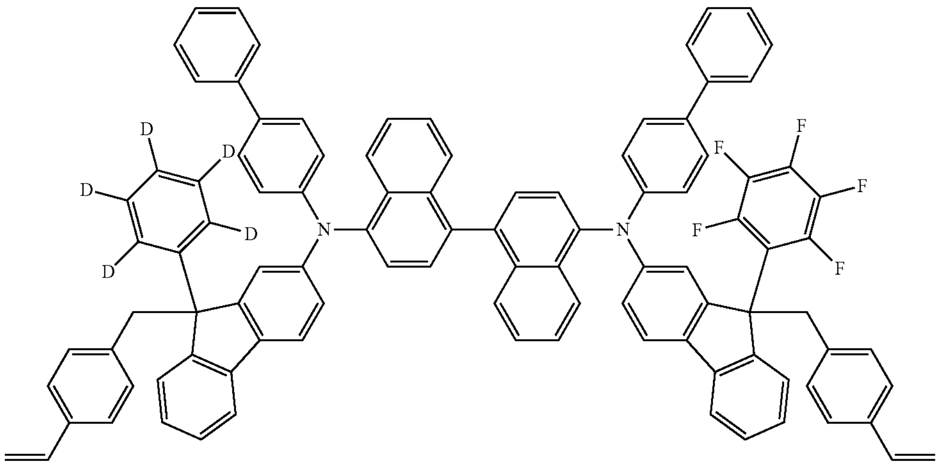
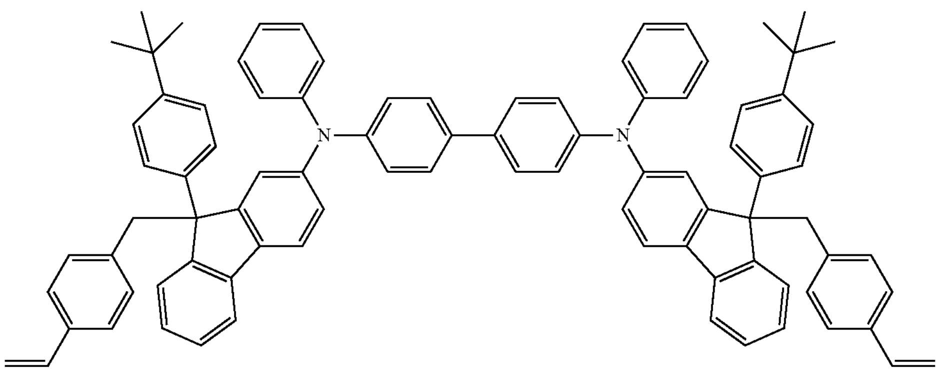
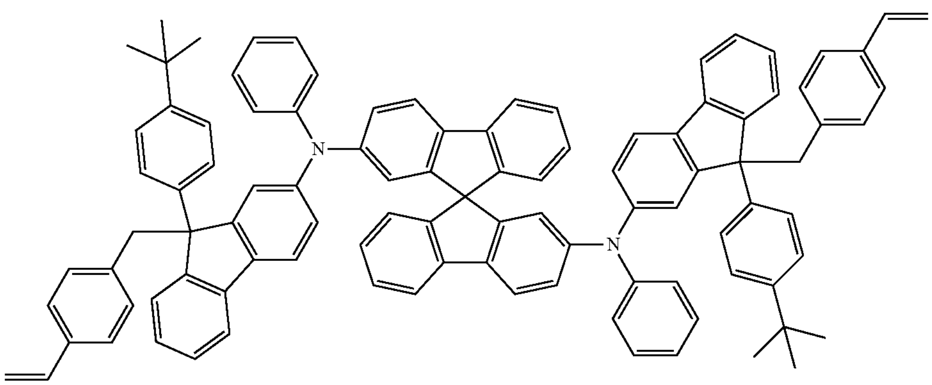
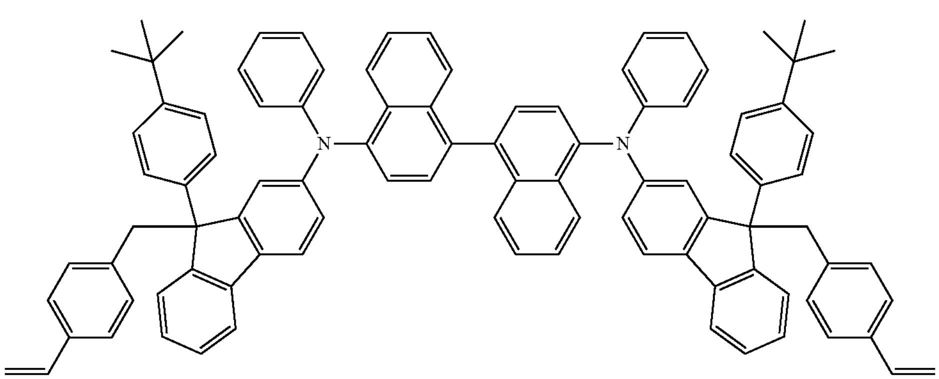

-continued
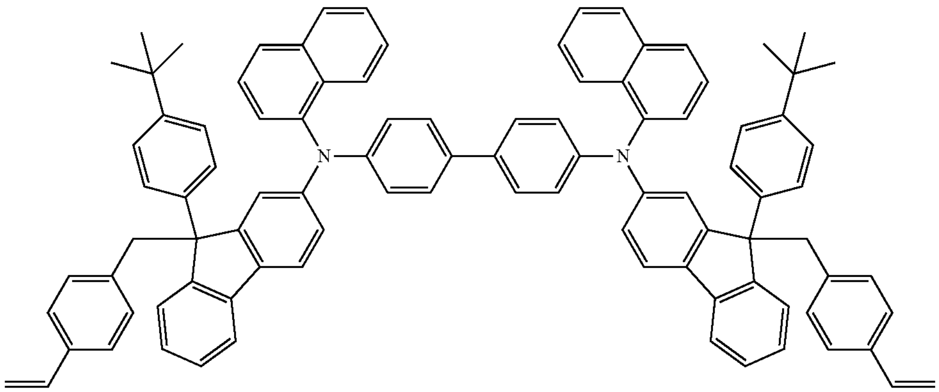
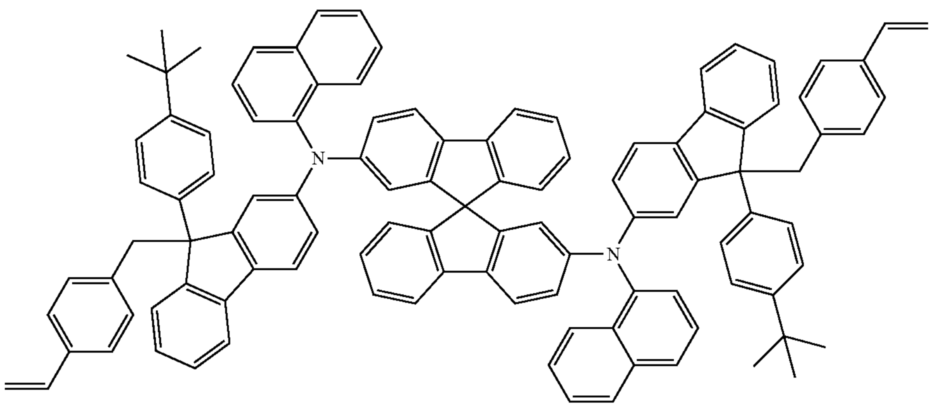
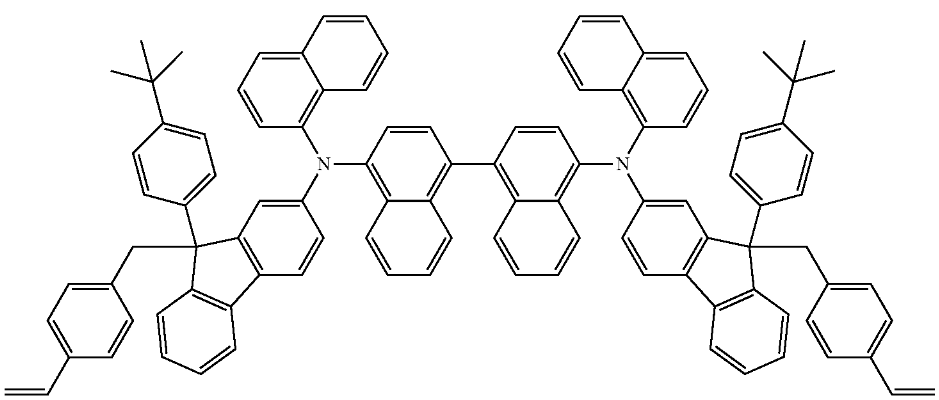
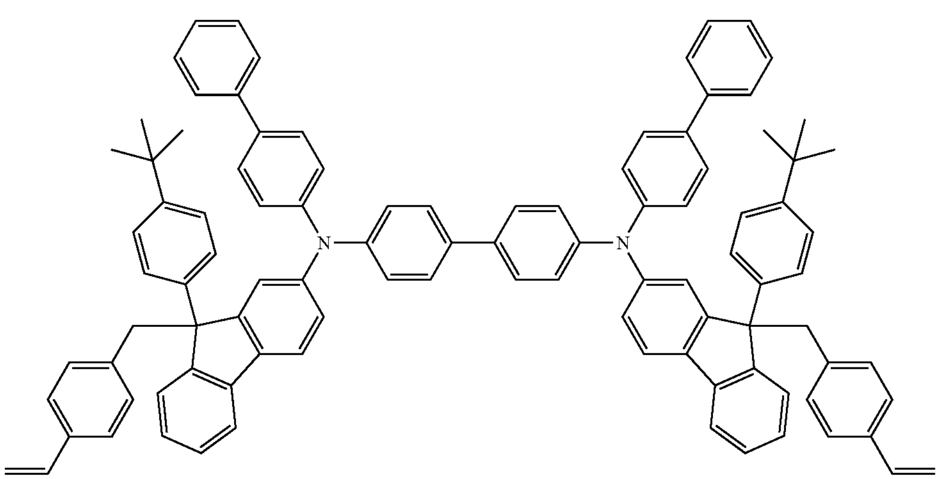

-continued
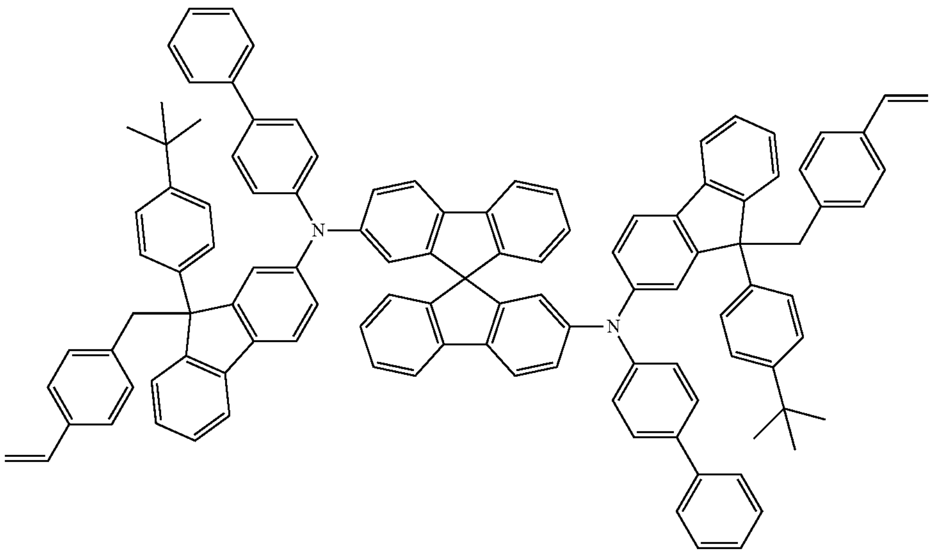
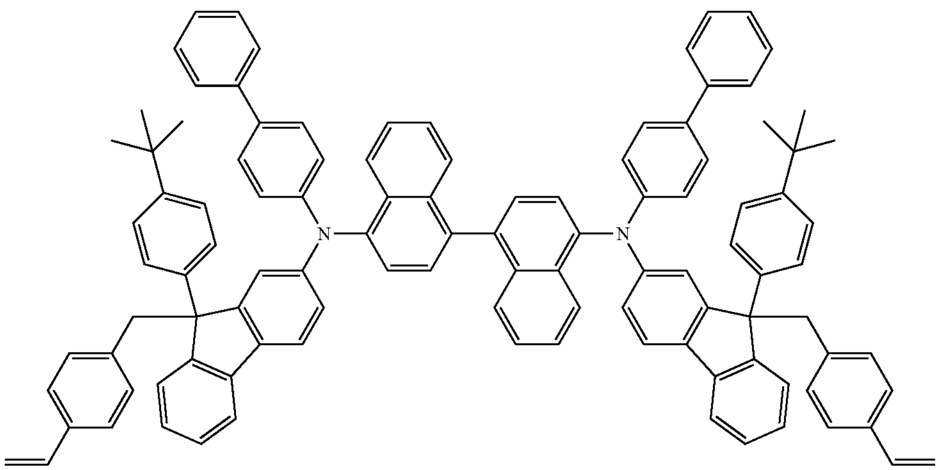
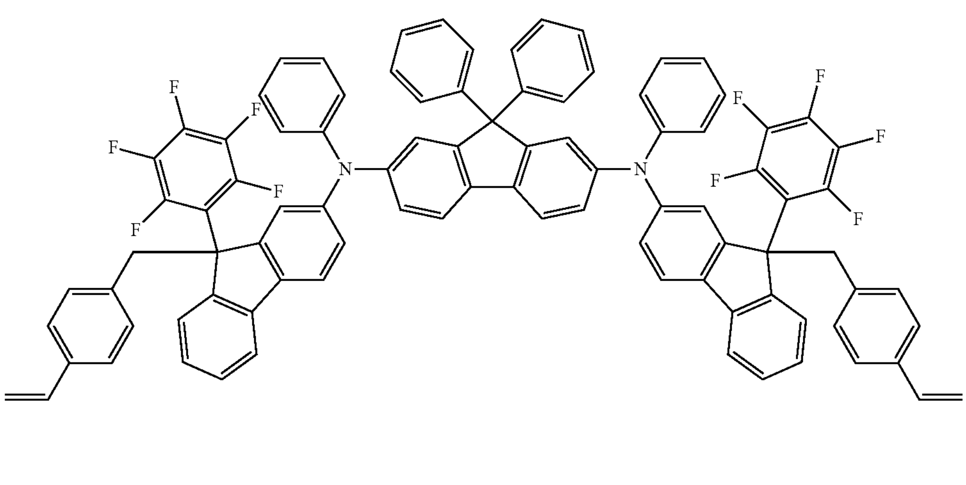

-continued
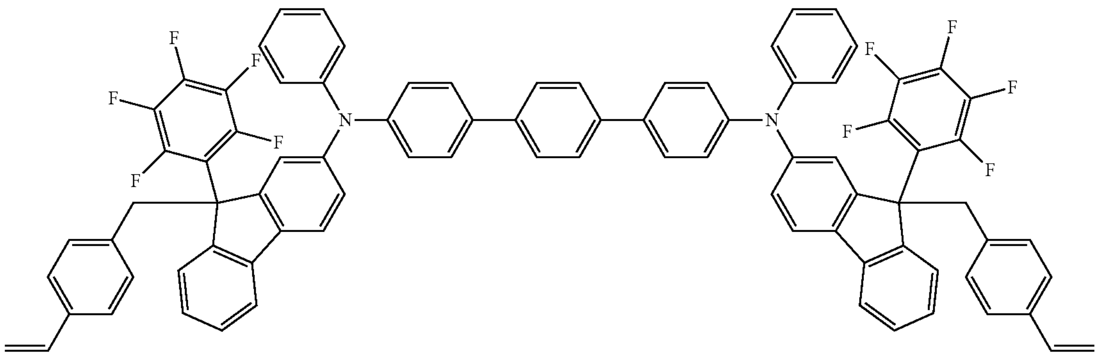
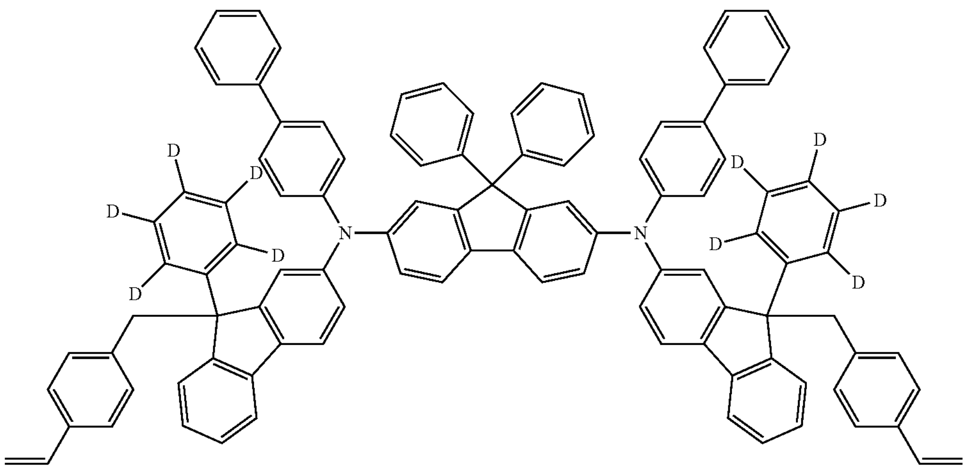
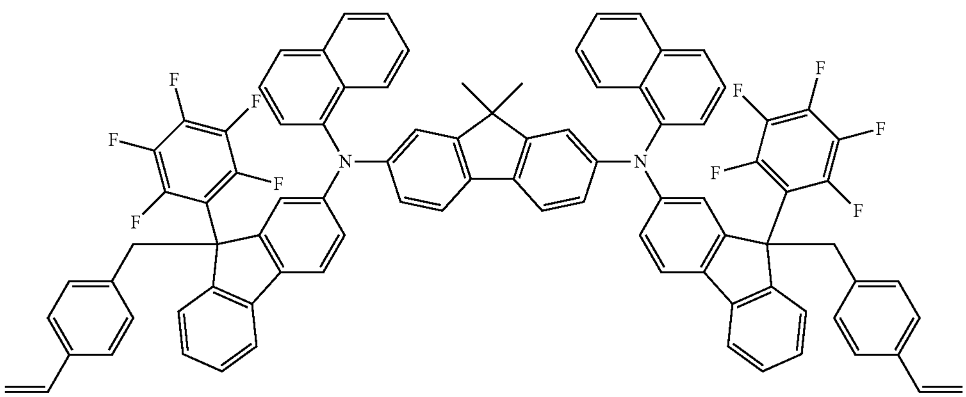
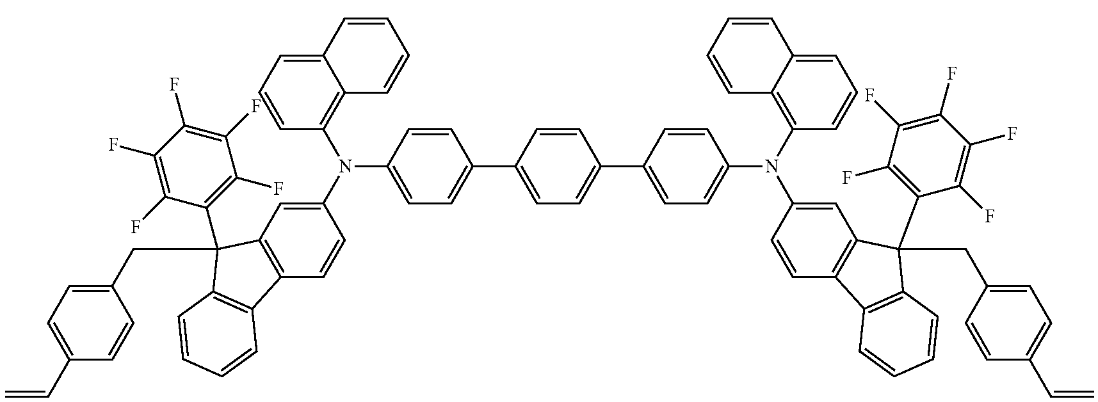

-continued
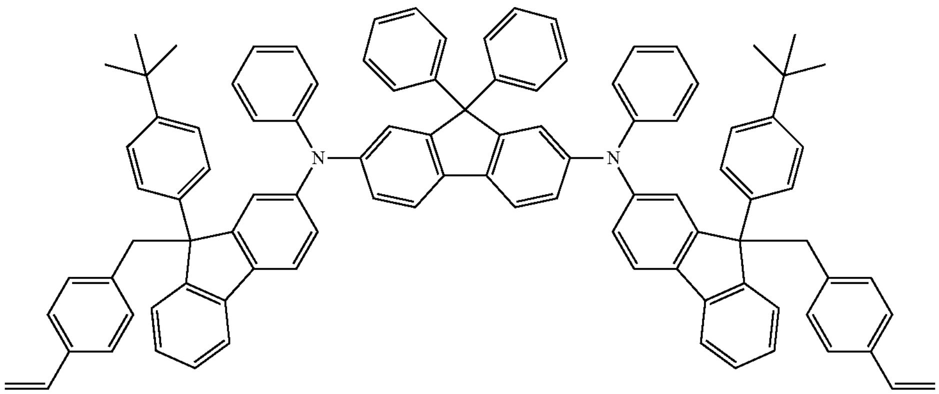
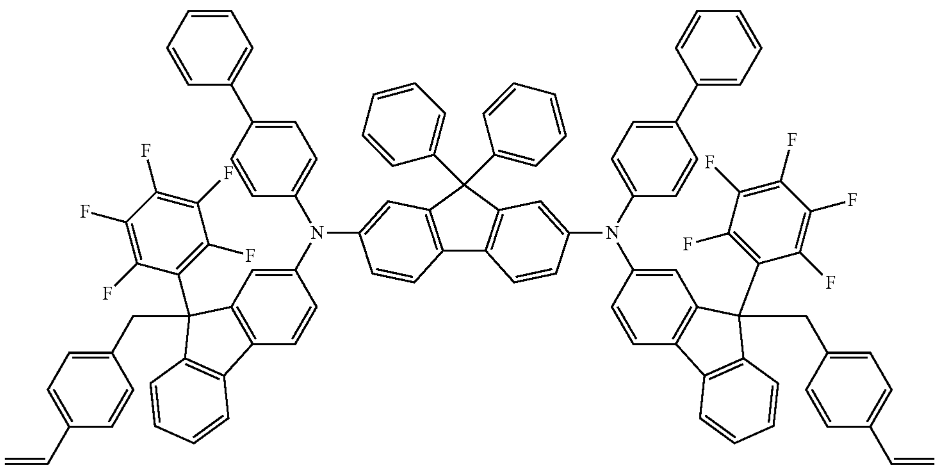
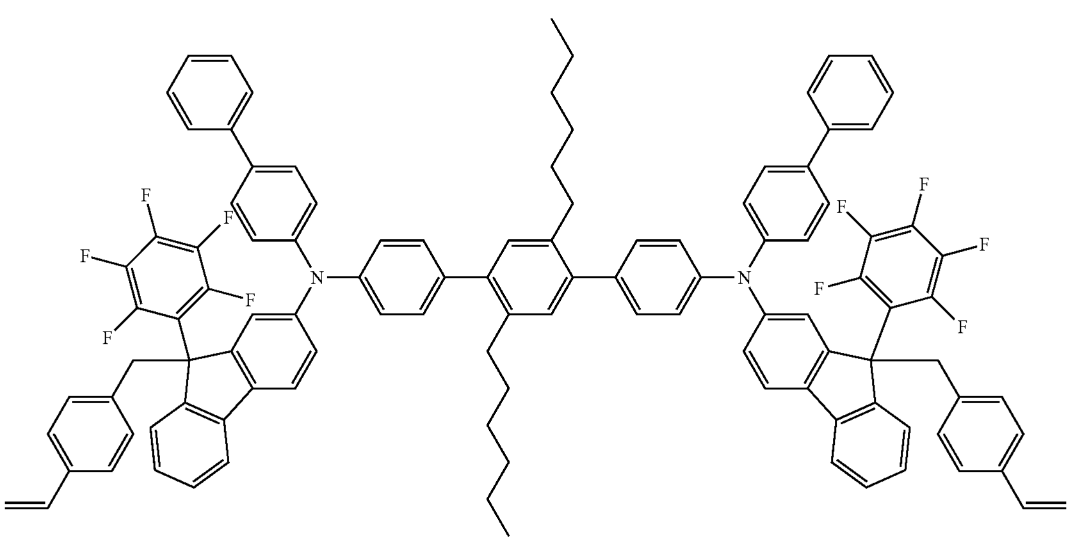

-continued
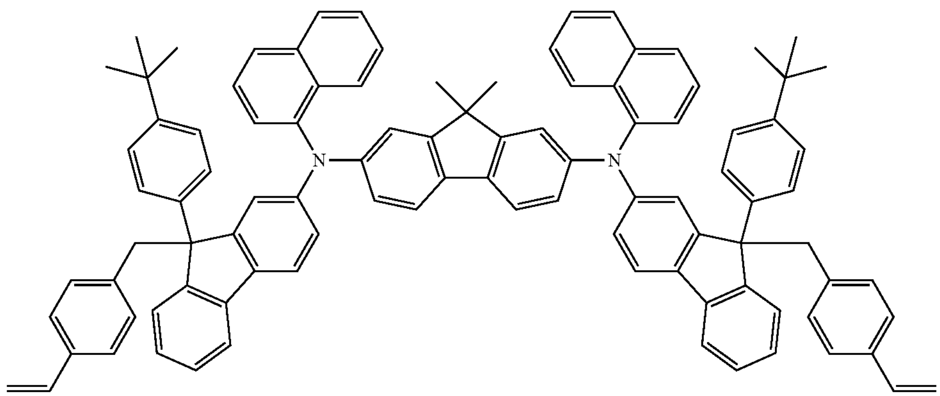
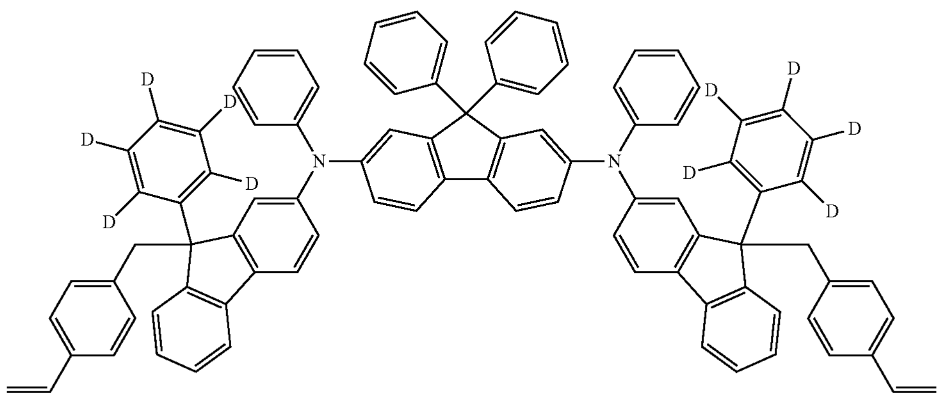
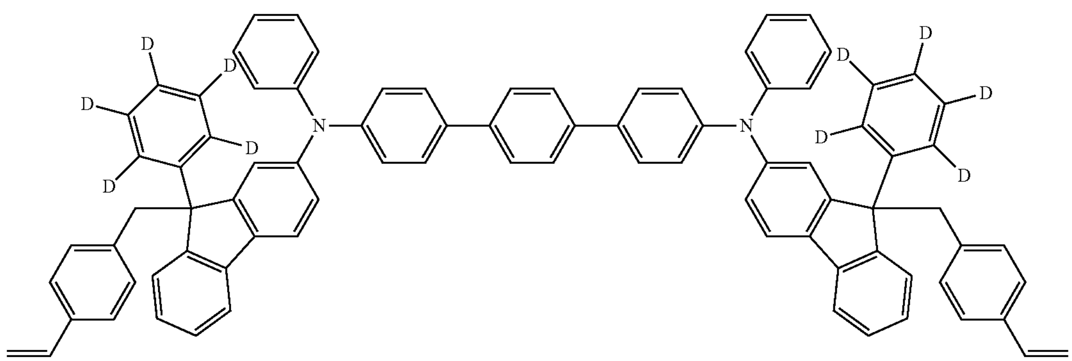
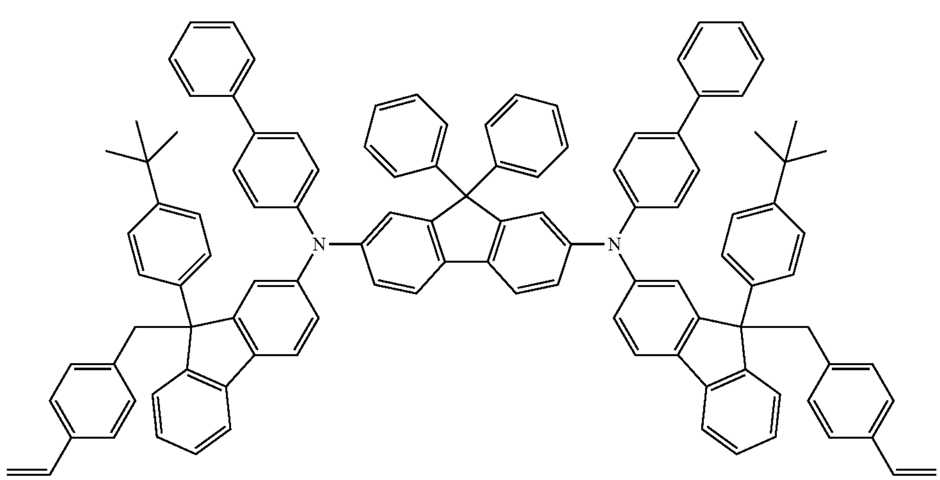

-continued
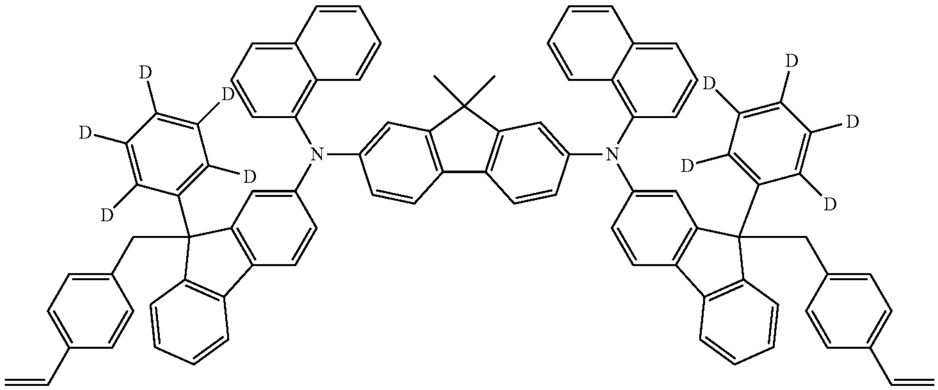
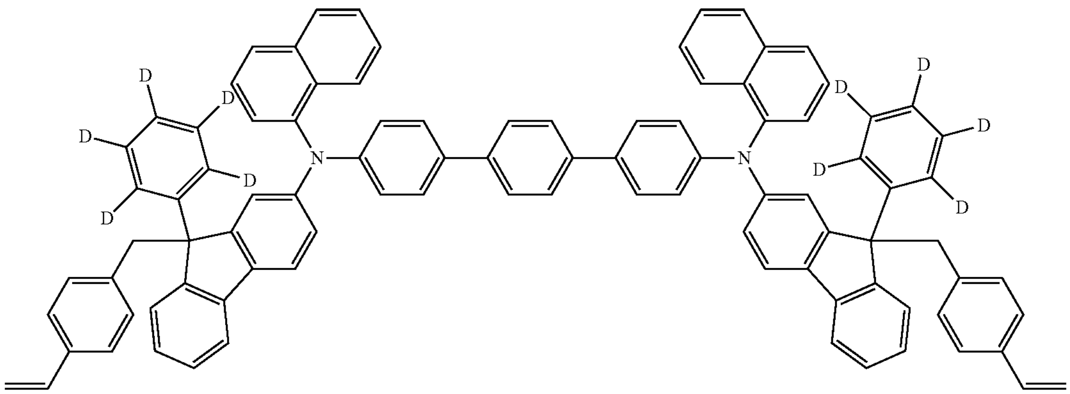
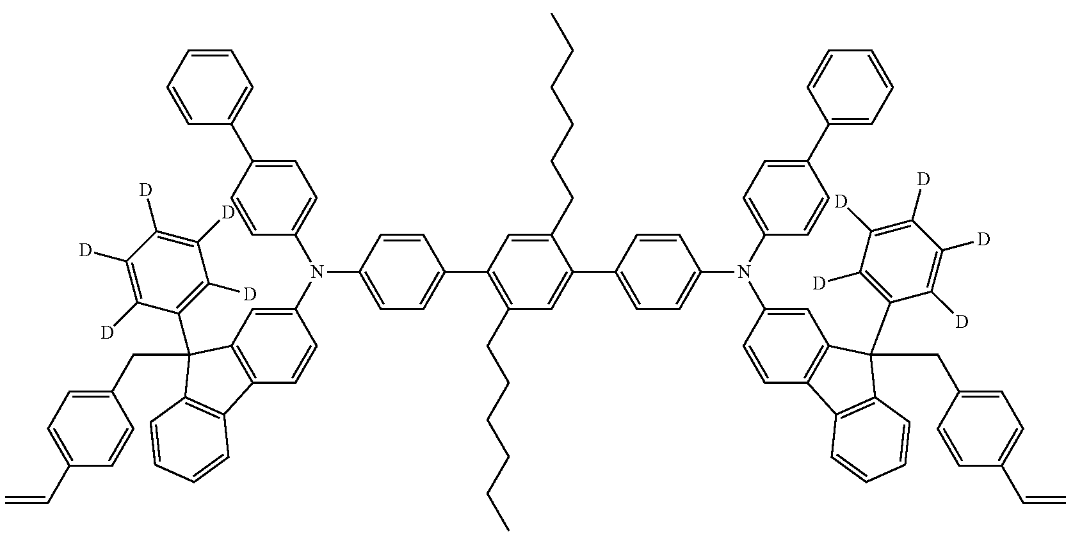
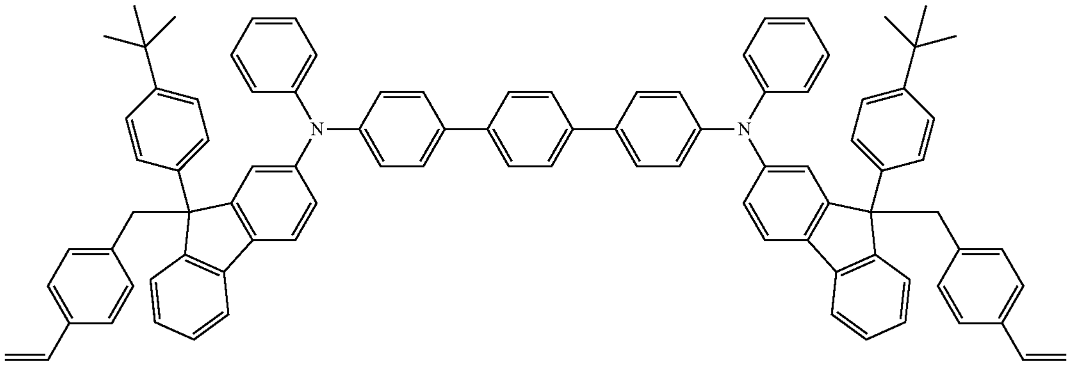

-continued
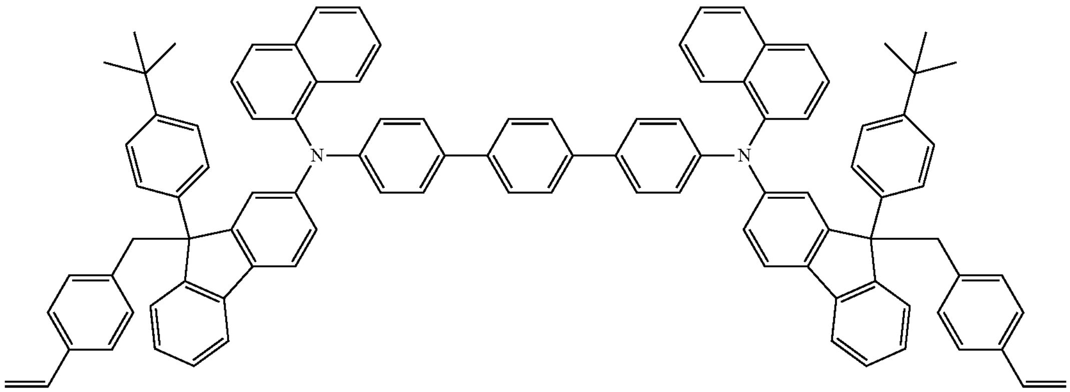
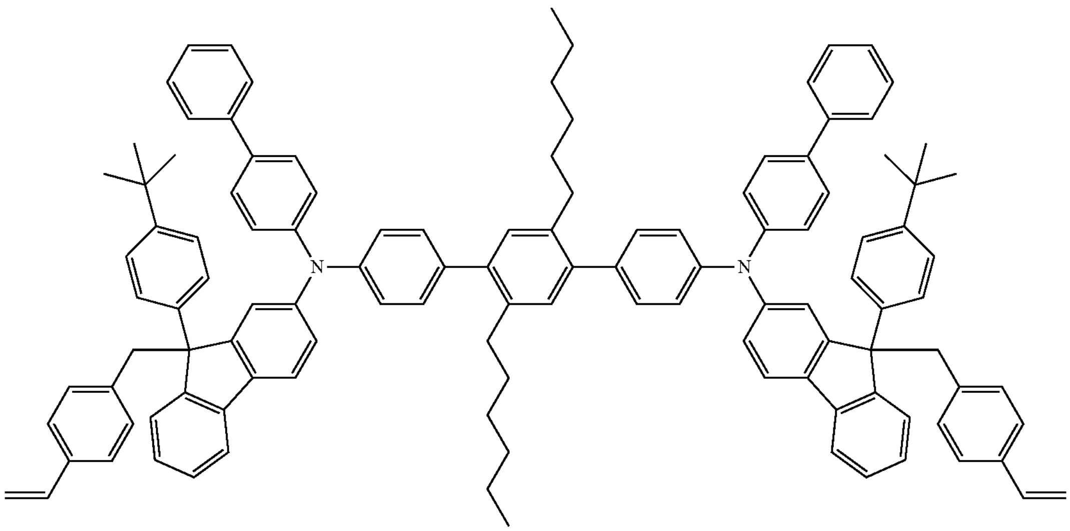
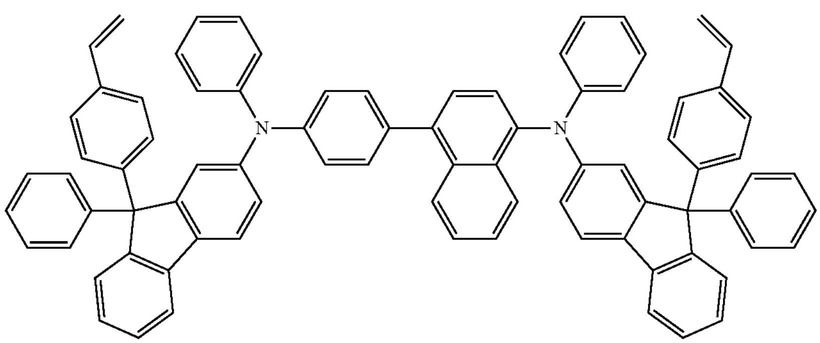
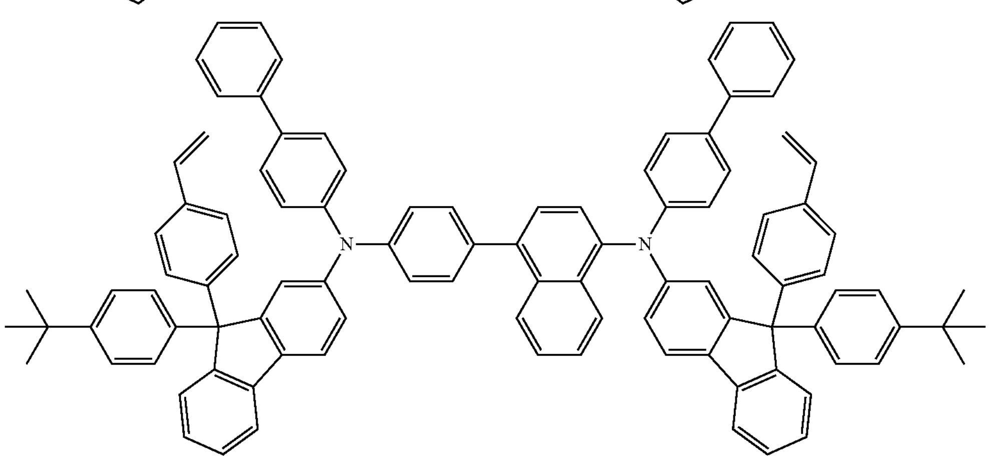

-continued
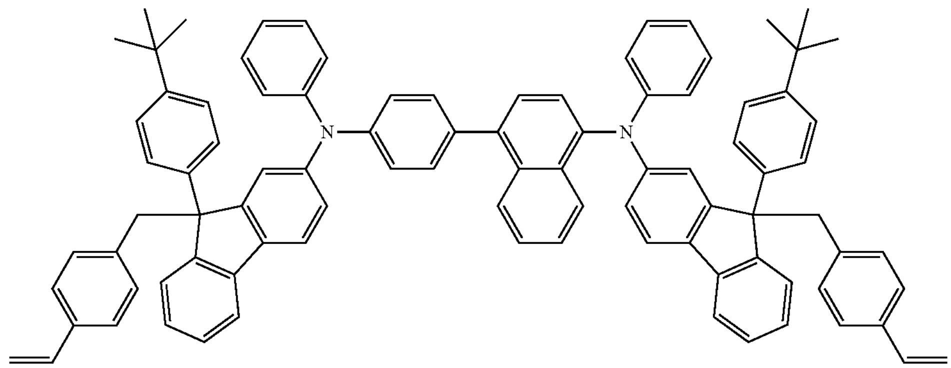
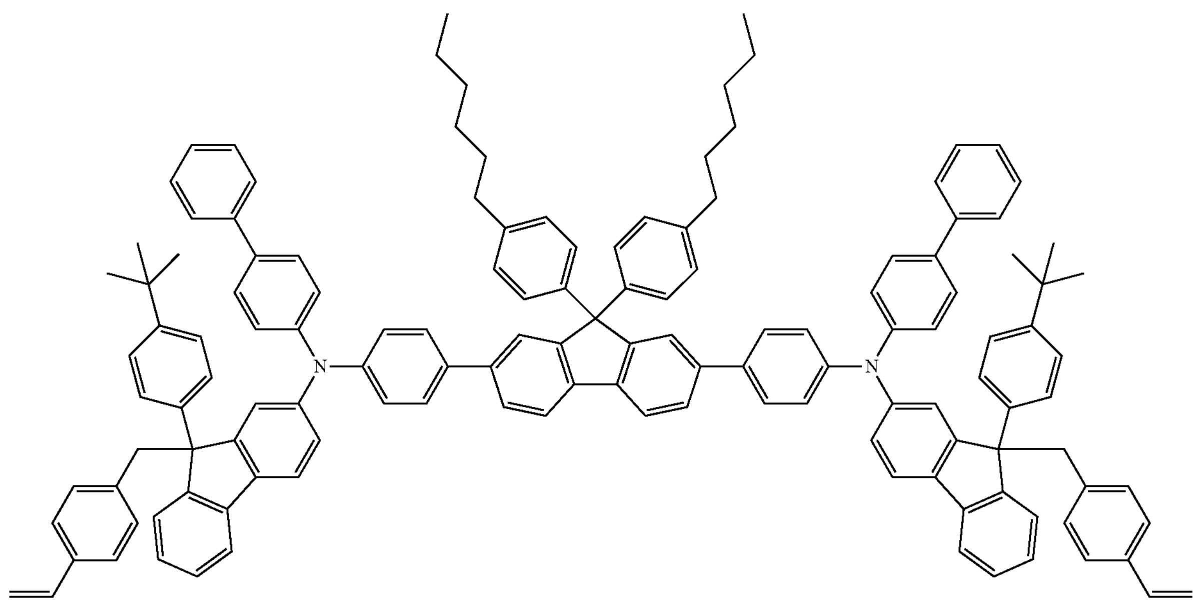
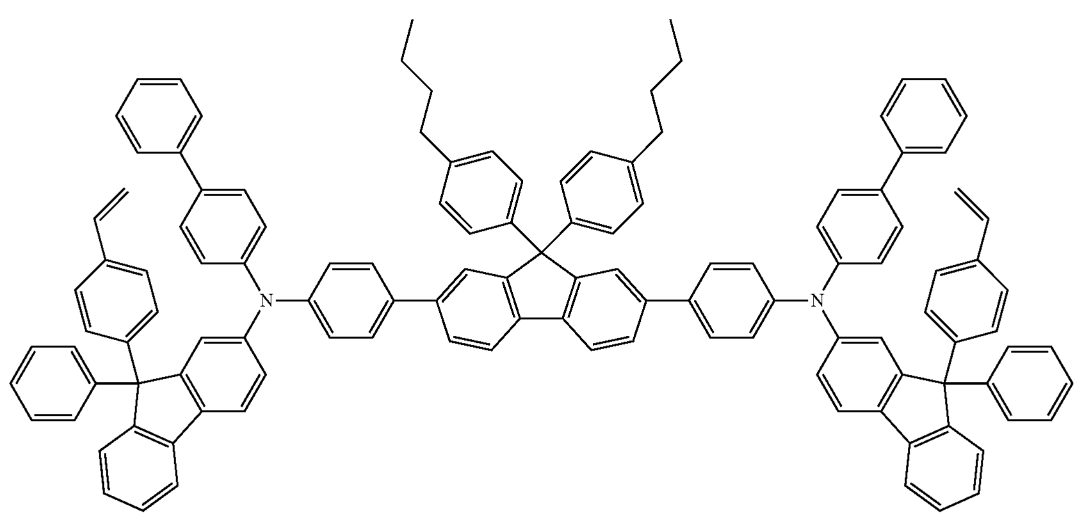

-continued
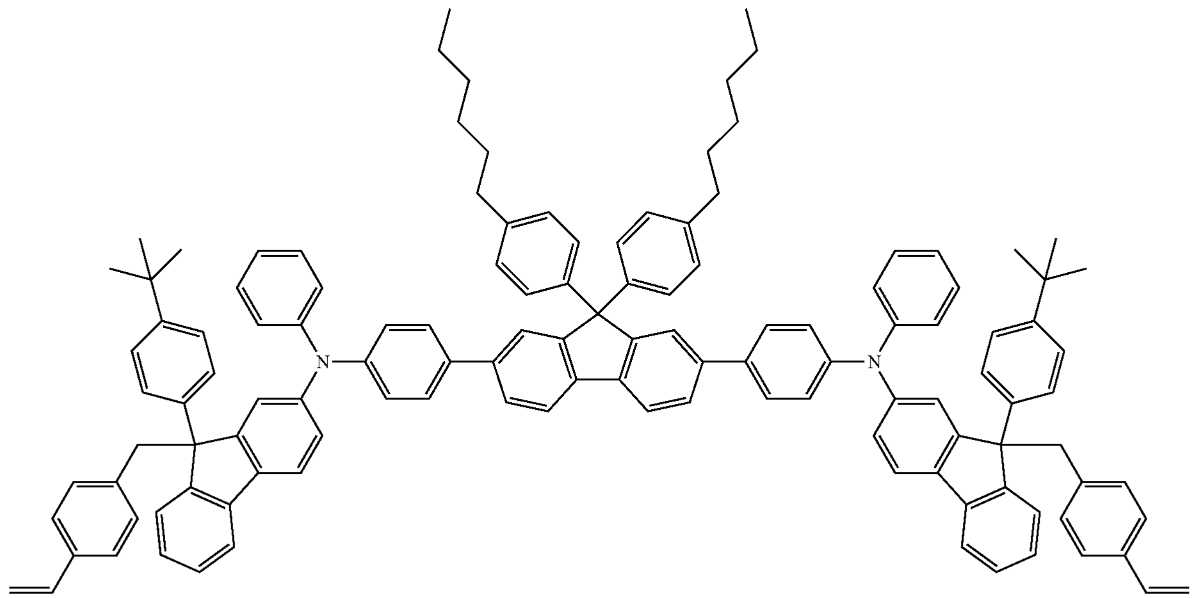
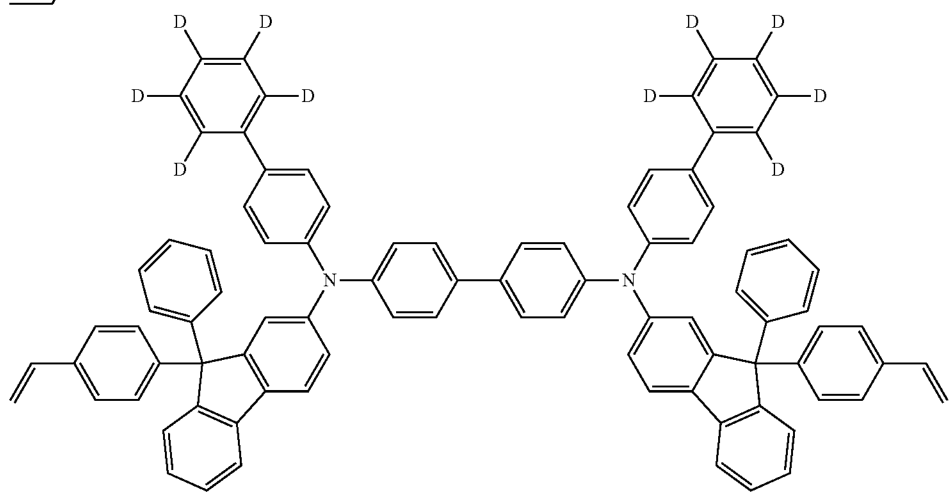
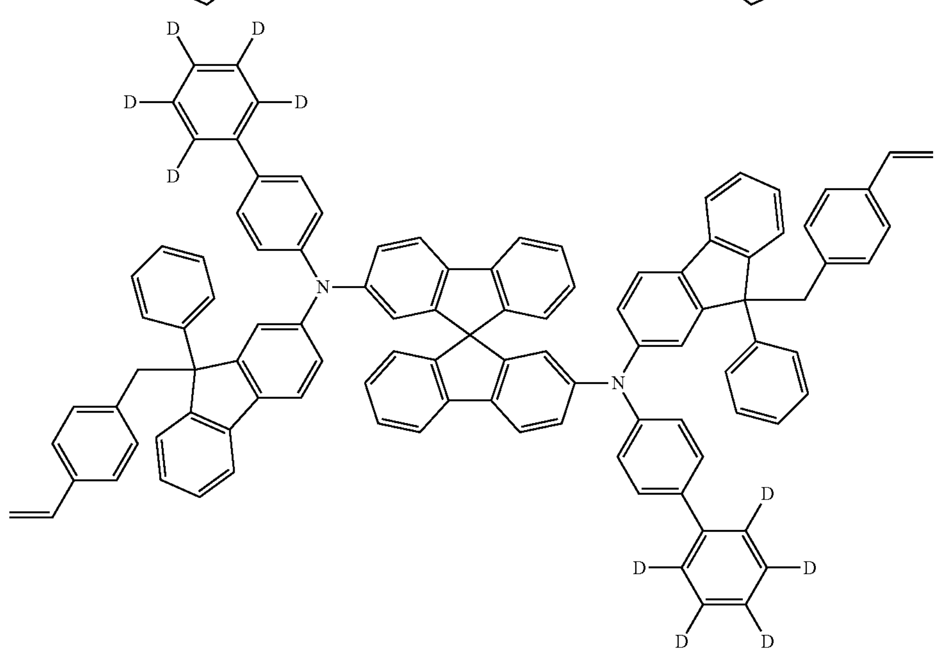

-continued
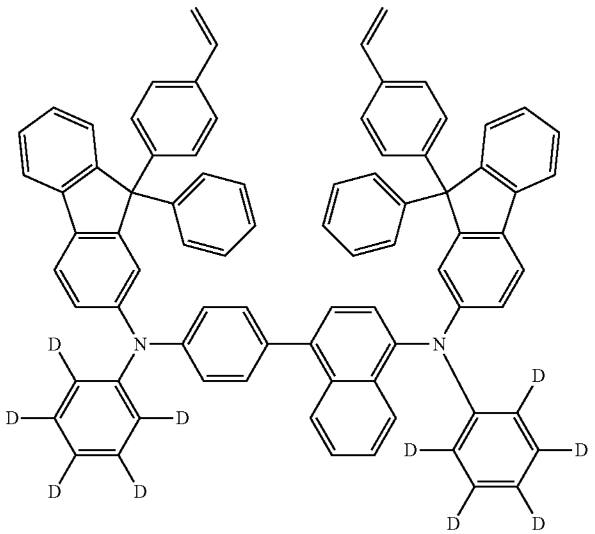
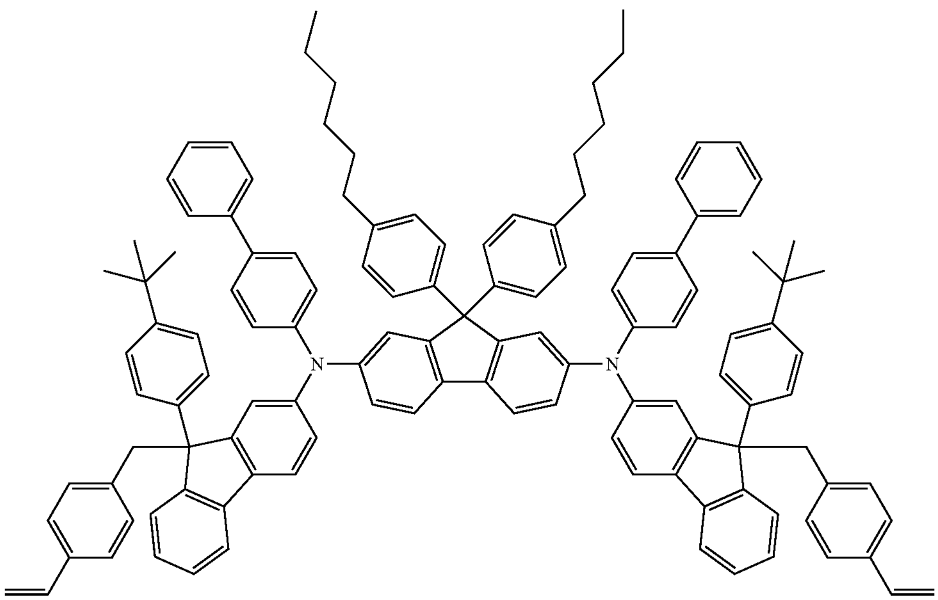
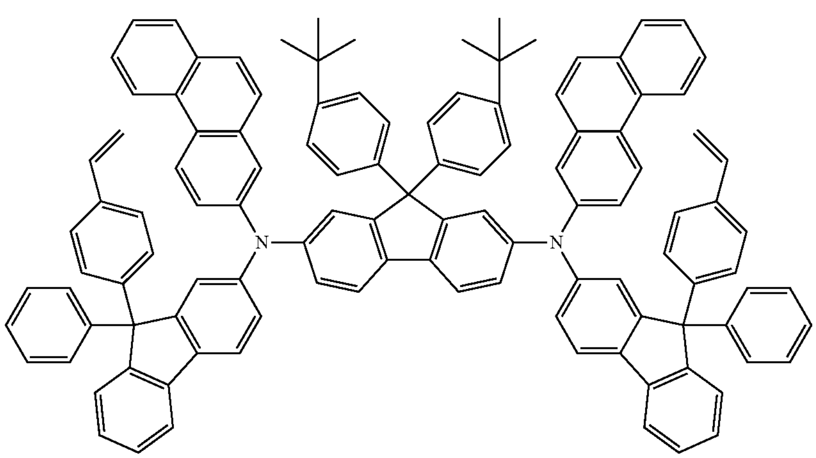

-continued
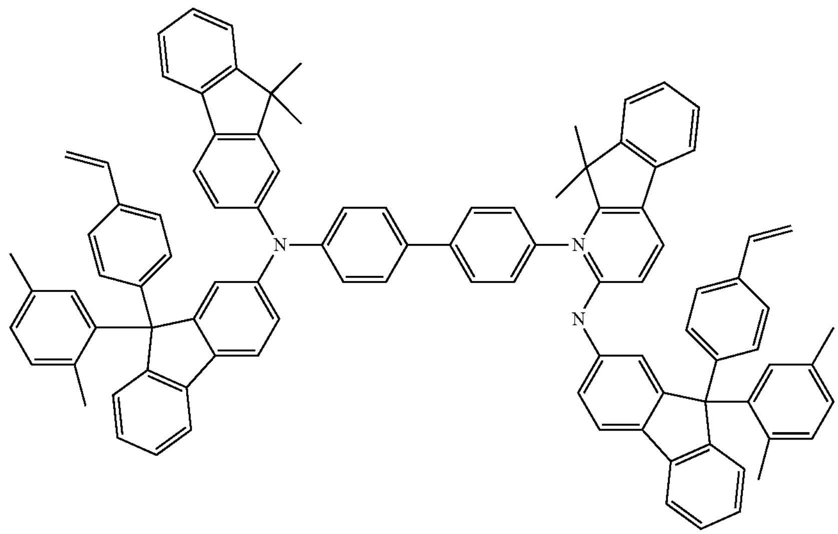
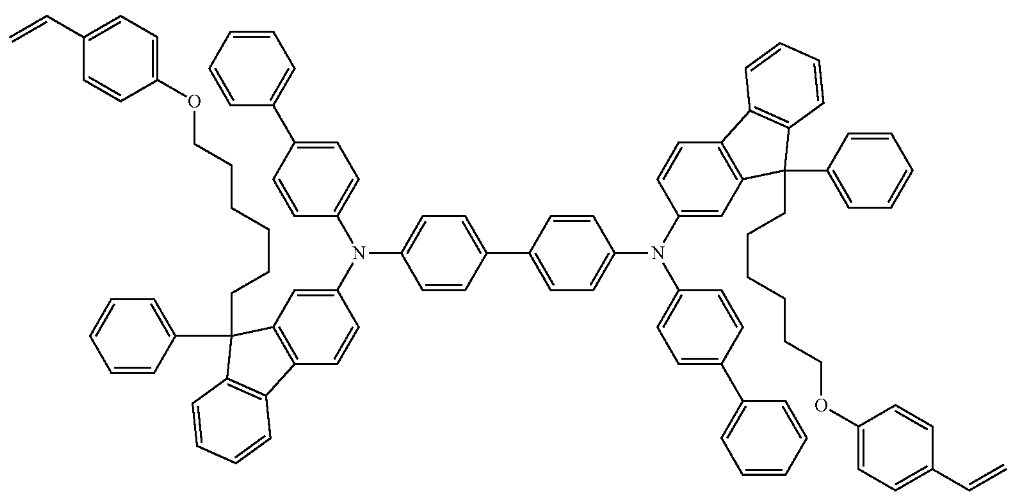
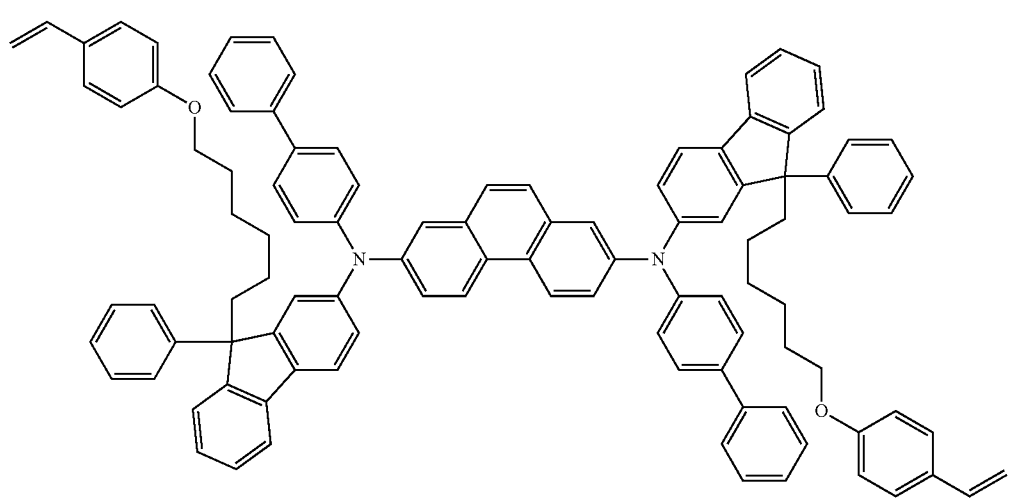

-continued
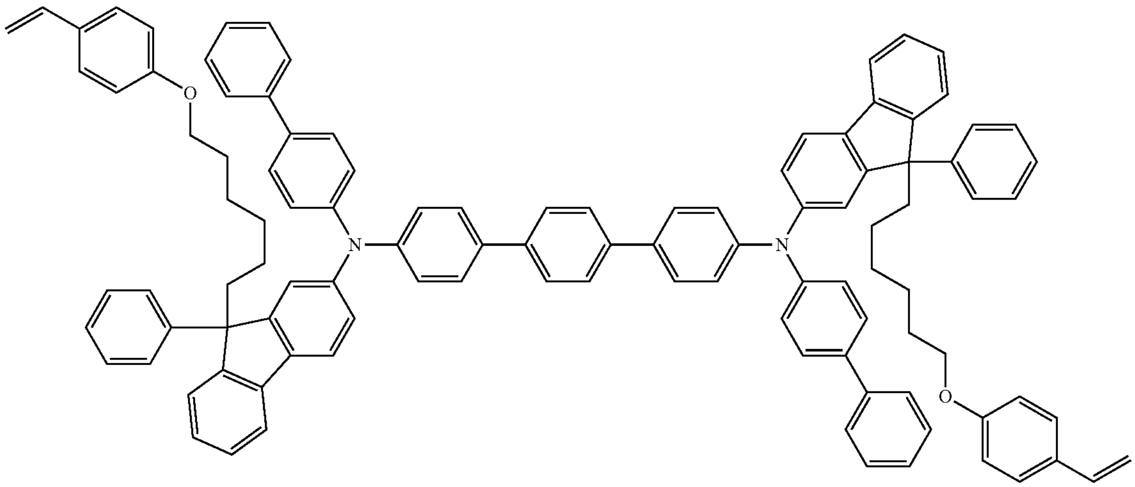
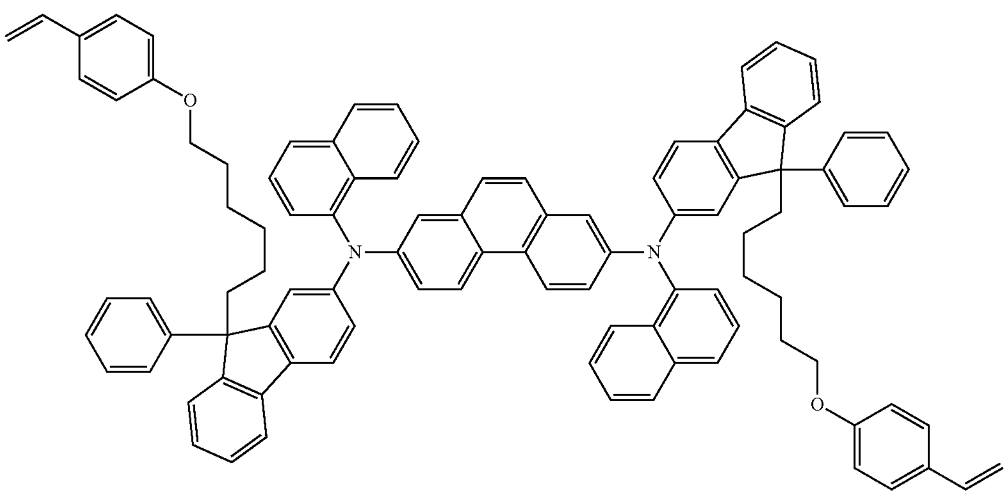
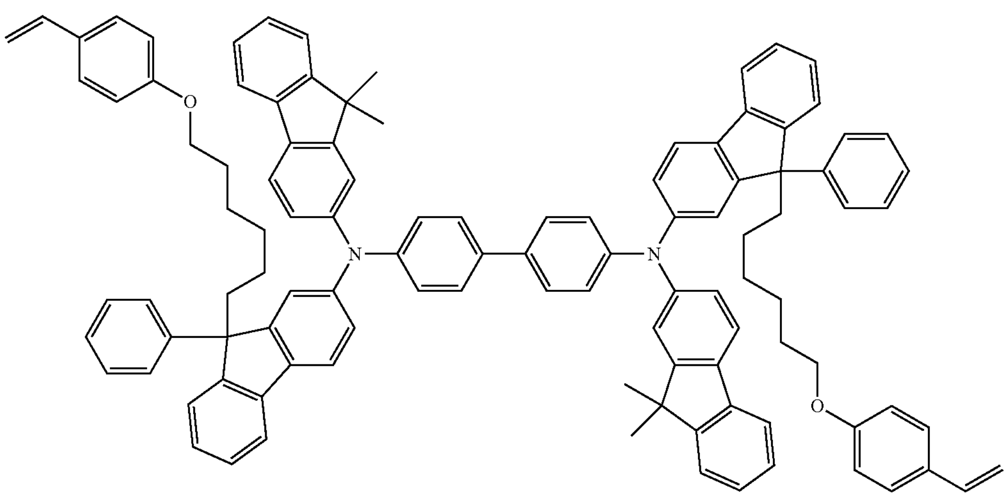

-continued
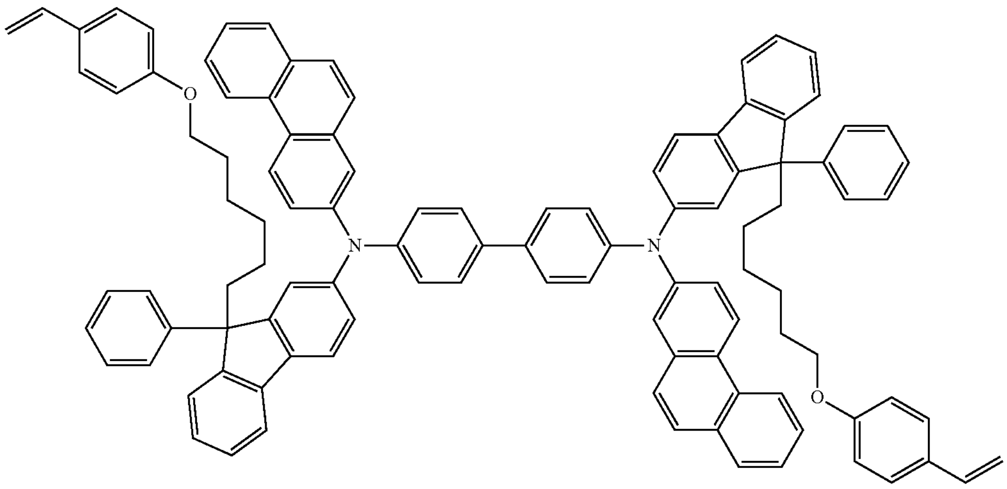
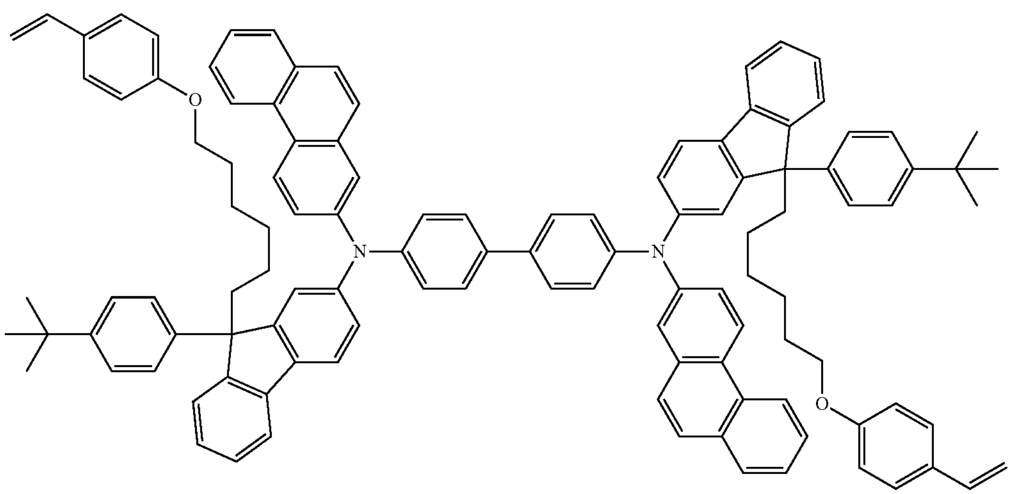
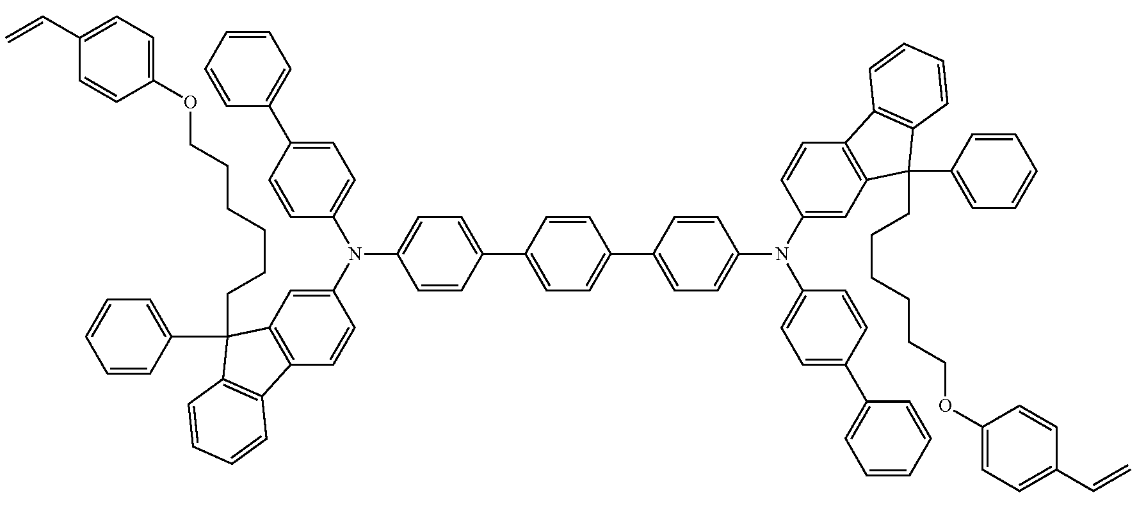

-continued
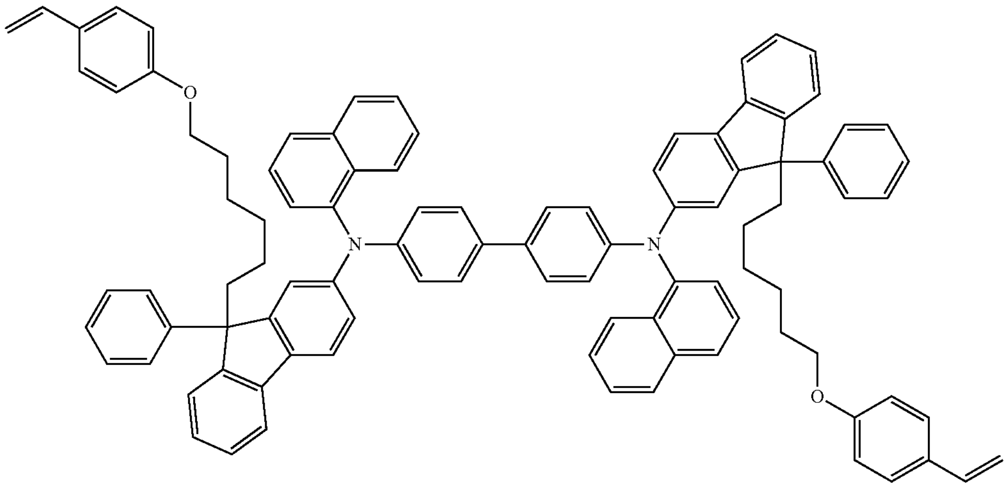
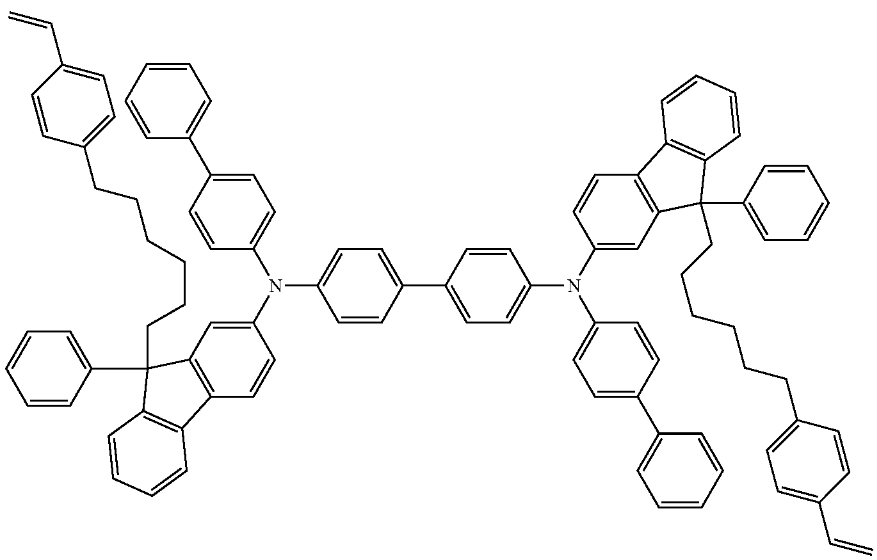
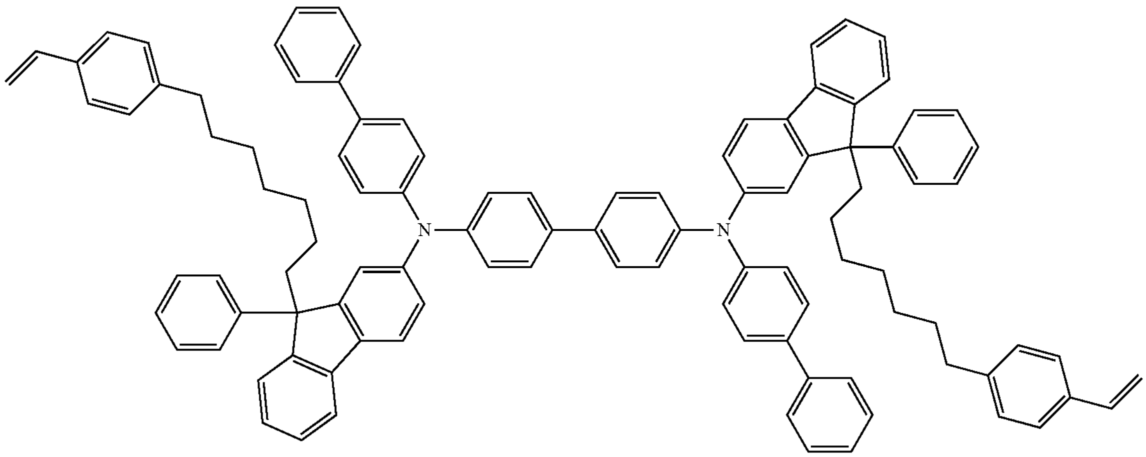

-continued
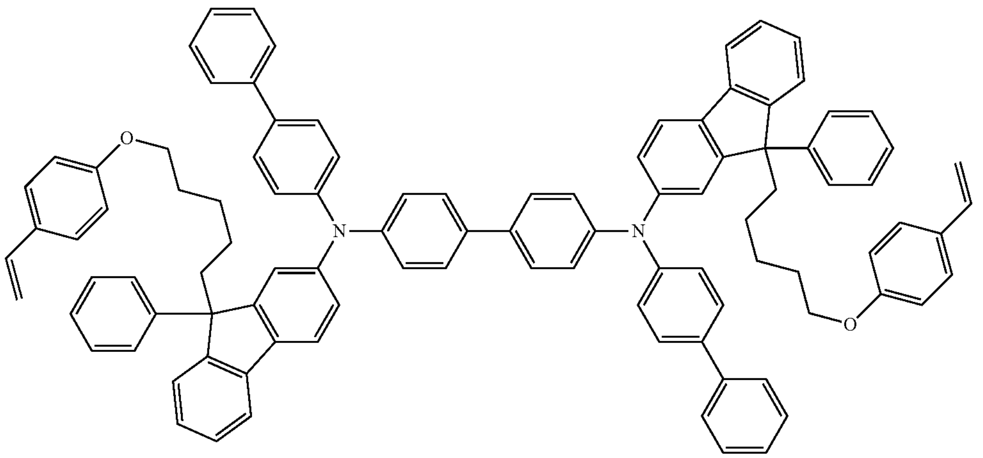
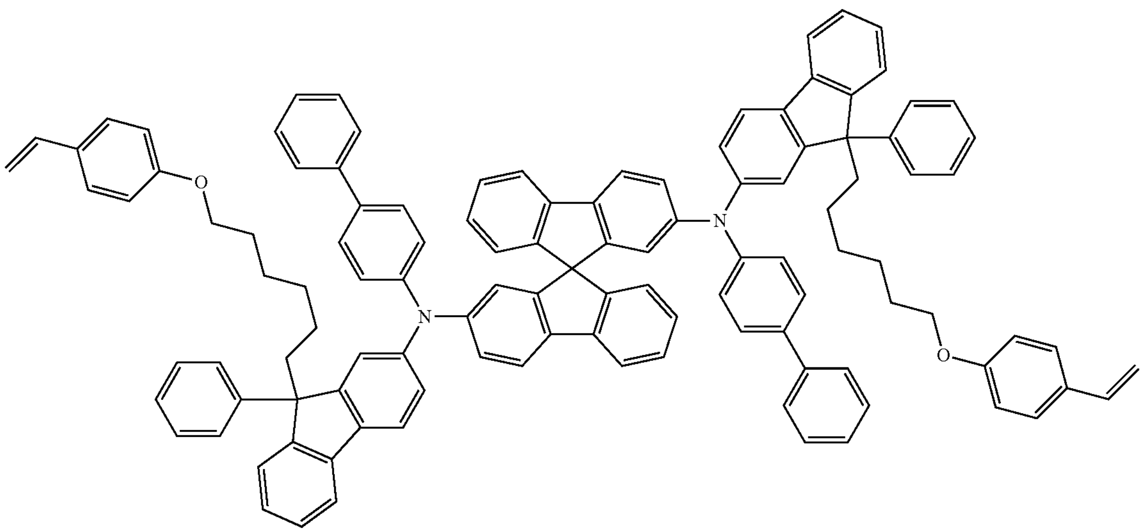
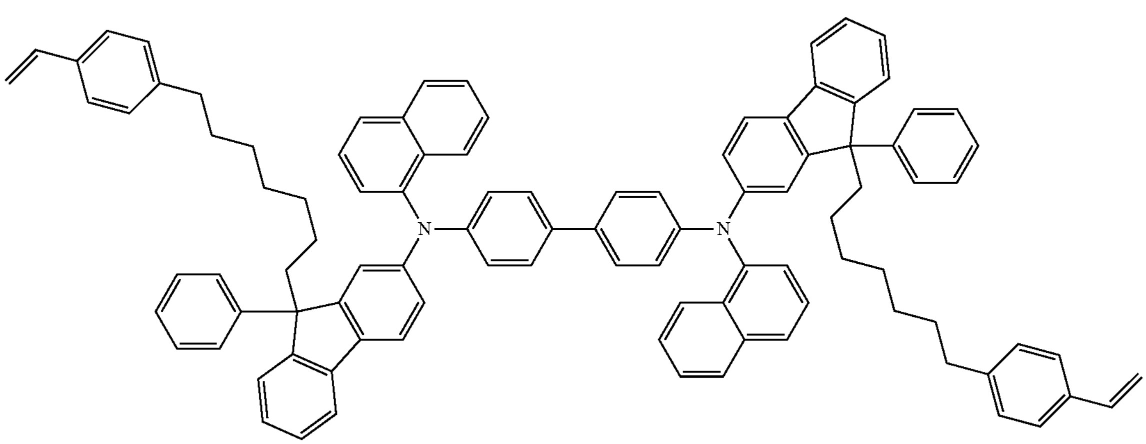

-continued
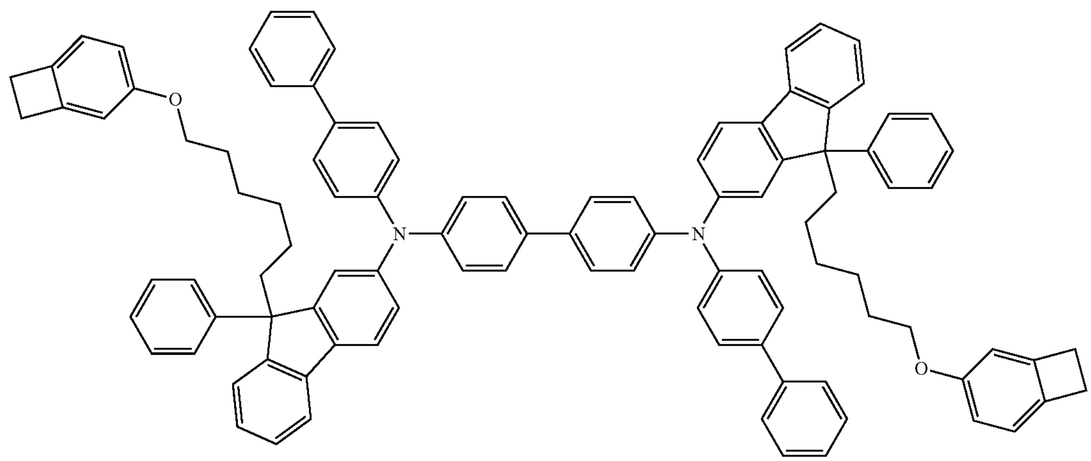
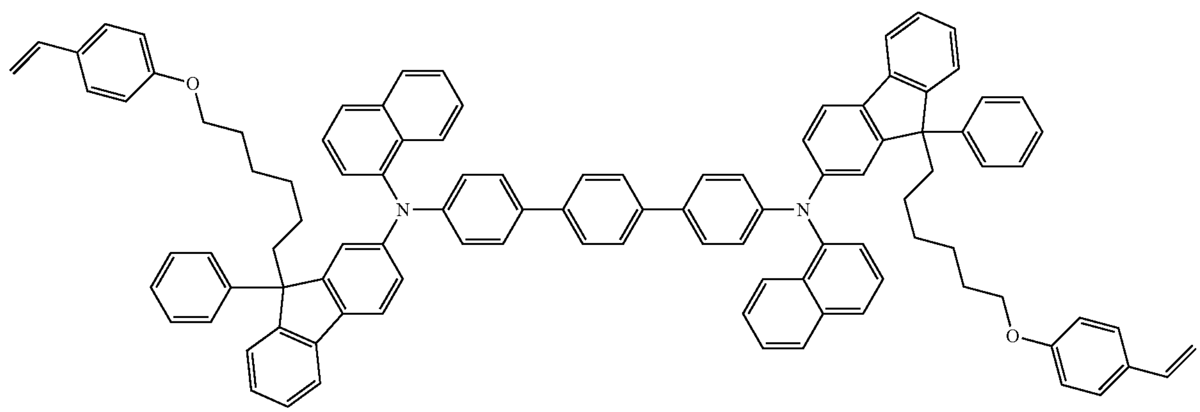
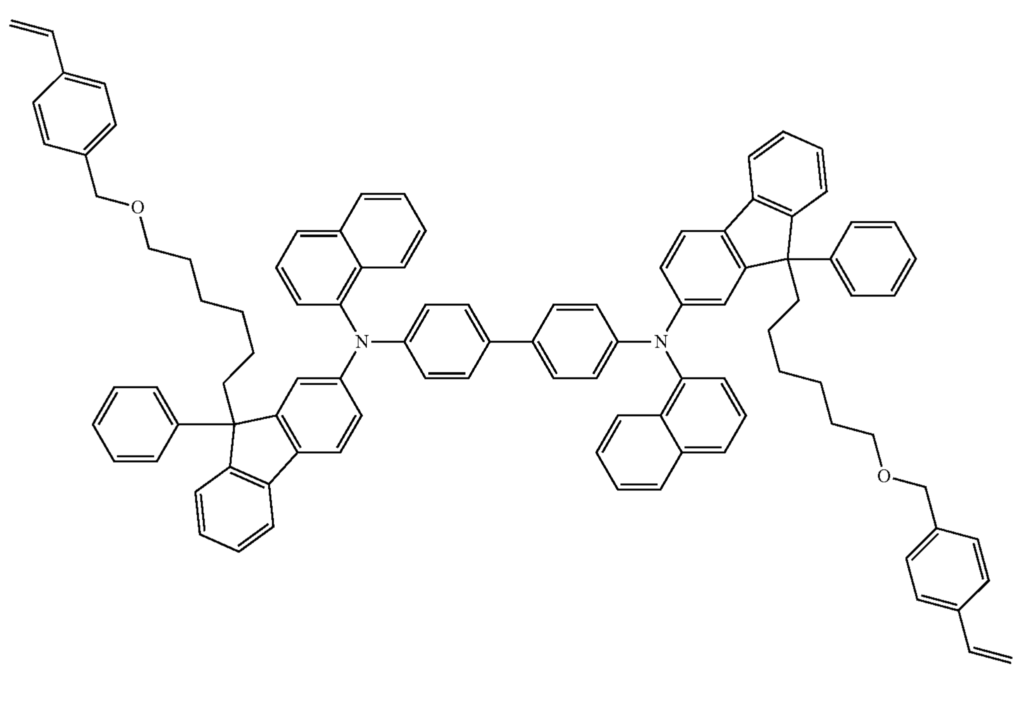

-continued
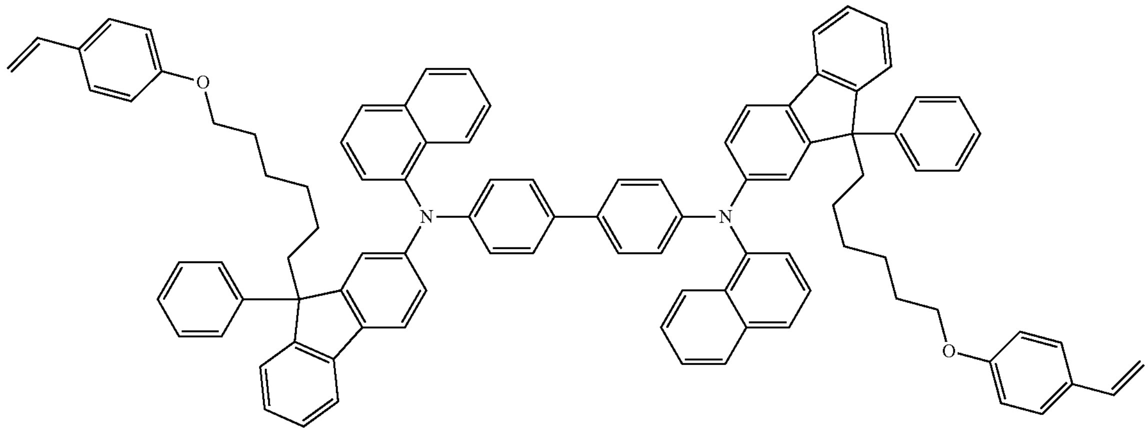
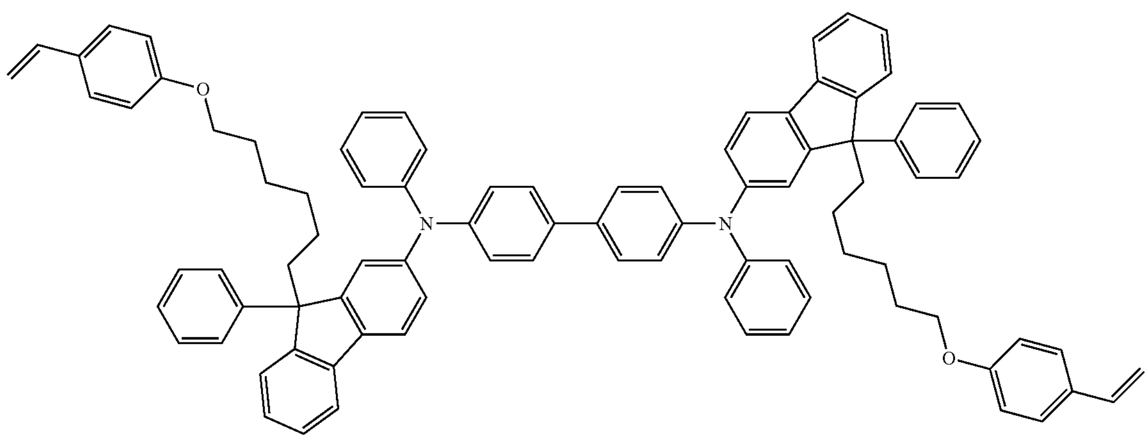
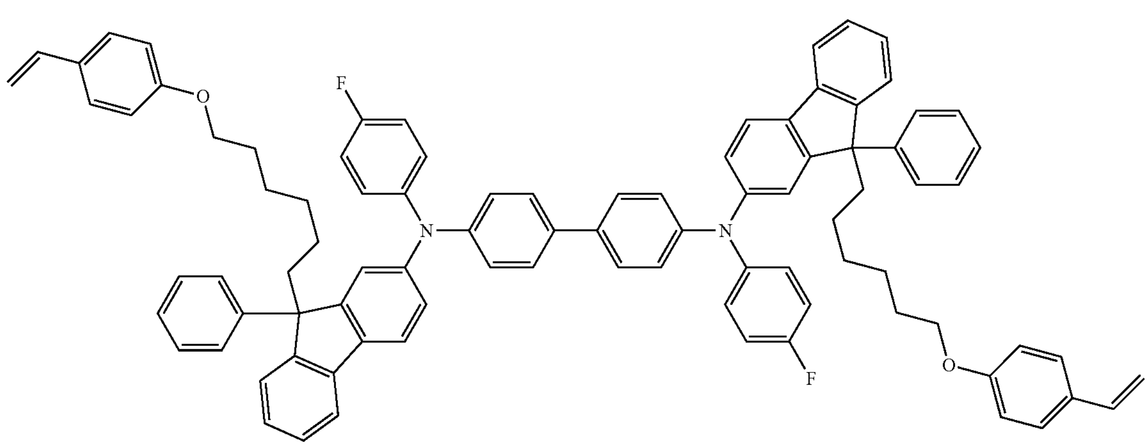

-continued
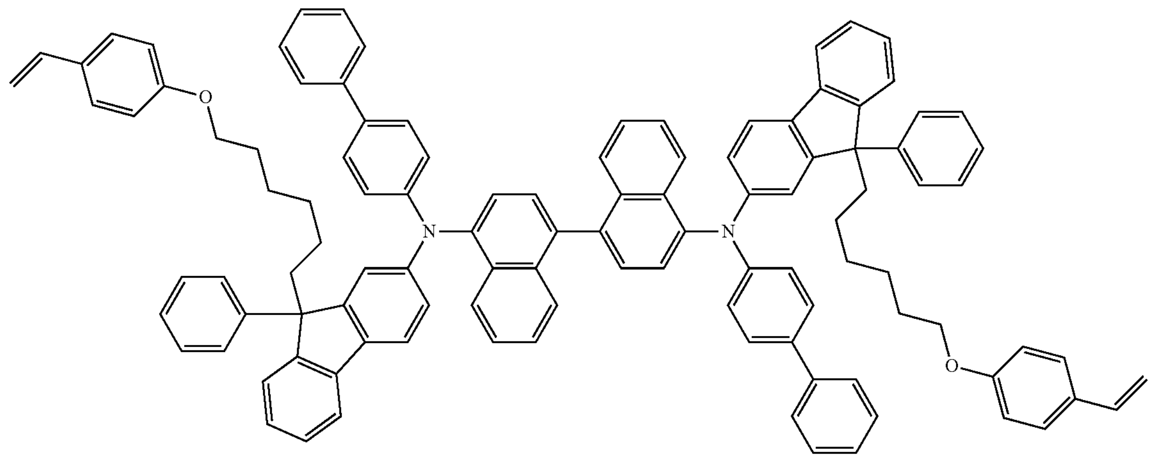
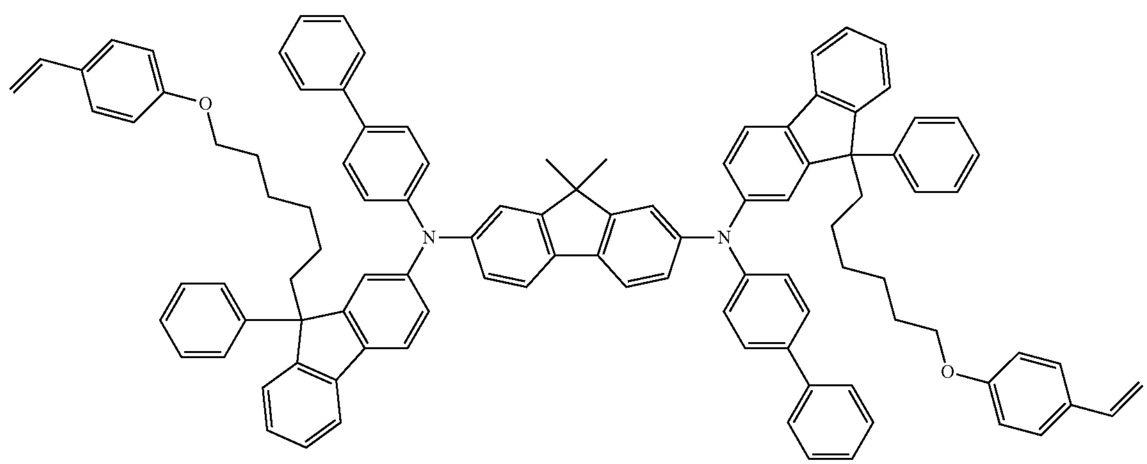
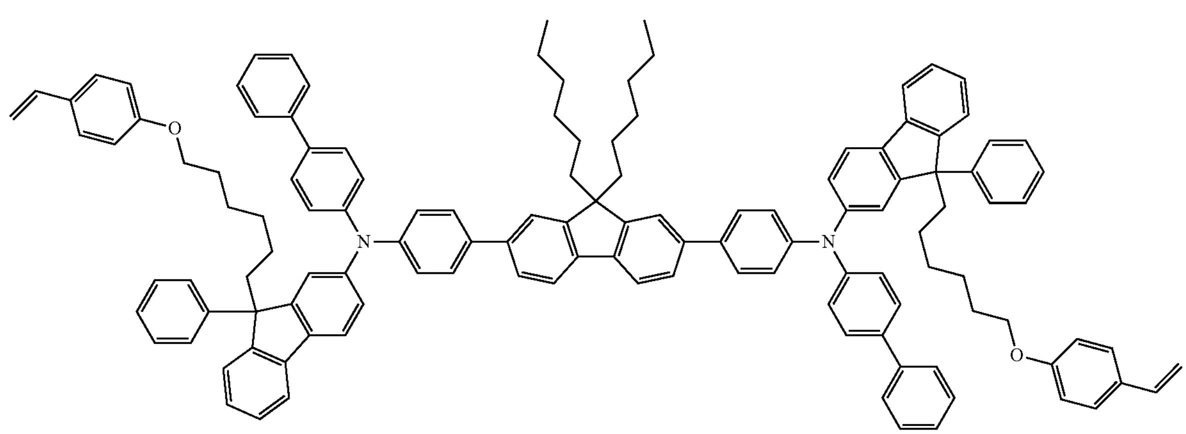

-continued
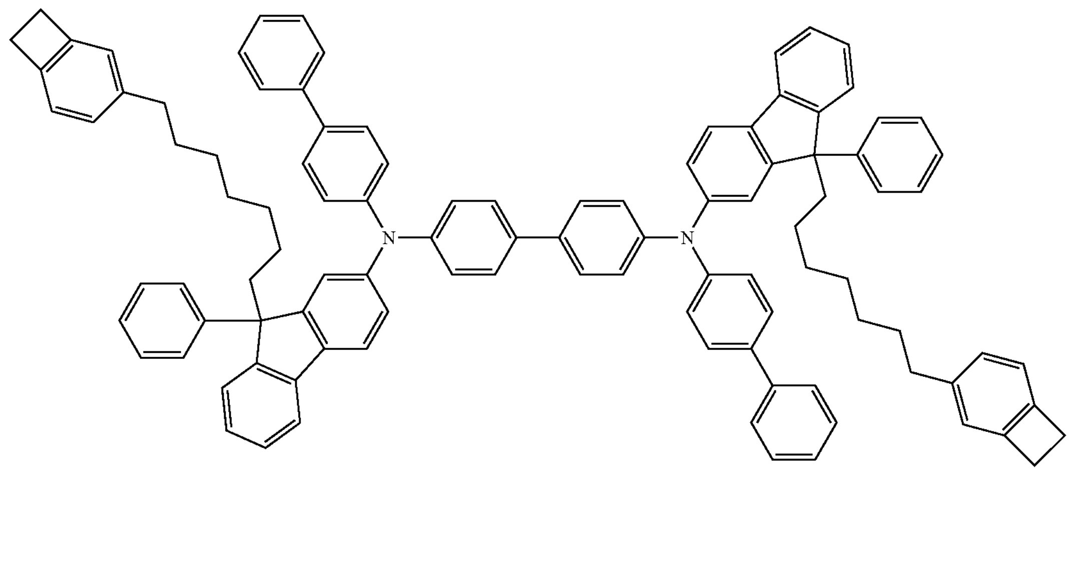
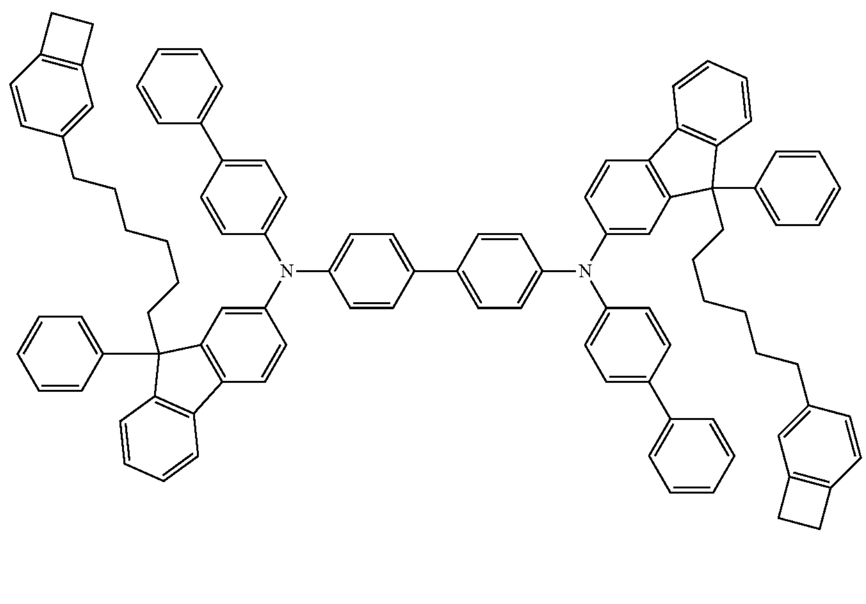
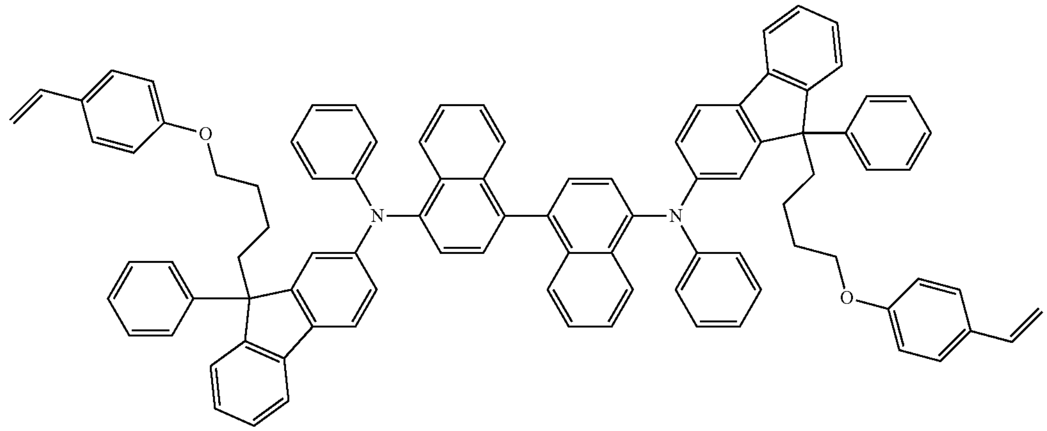

-continued
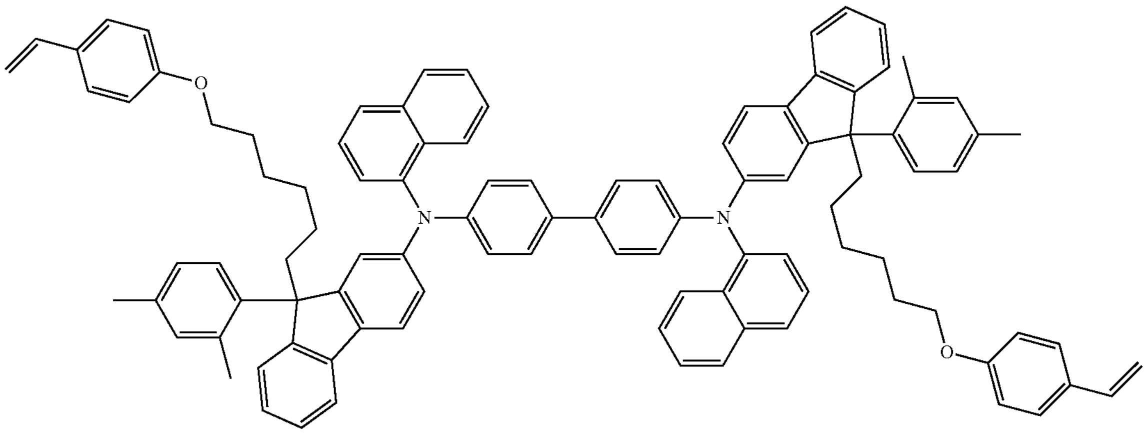
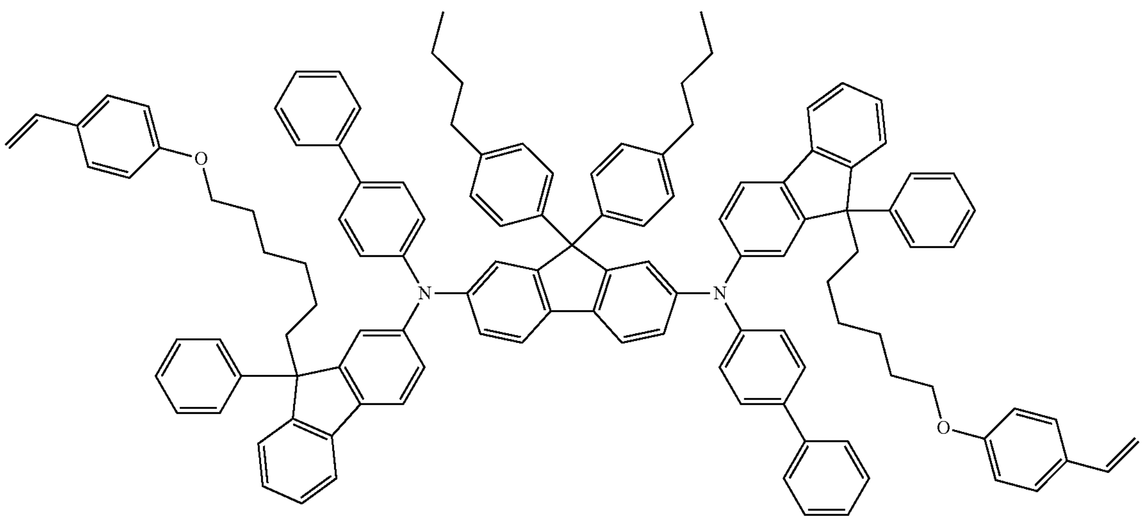
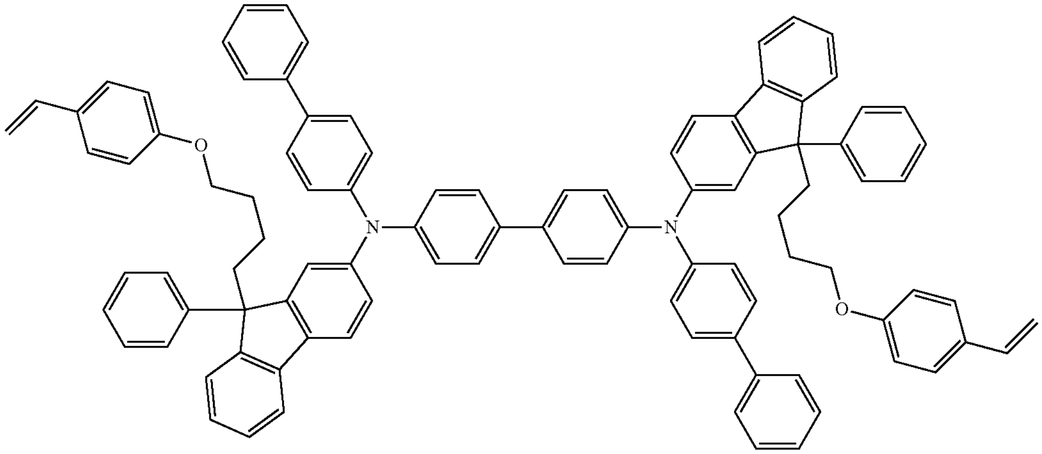

-continued
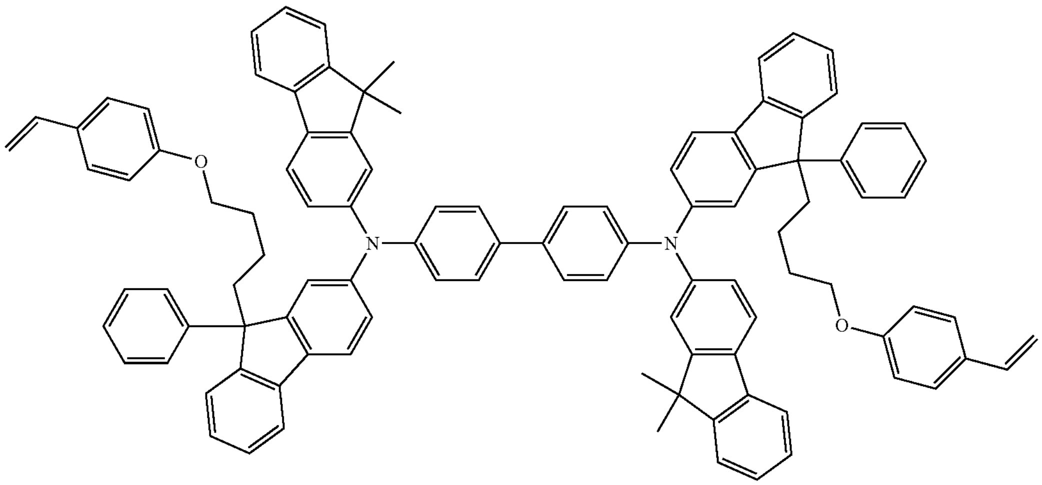
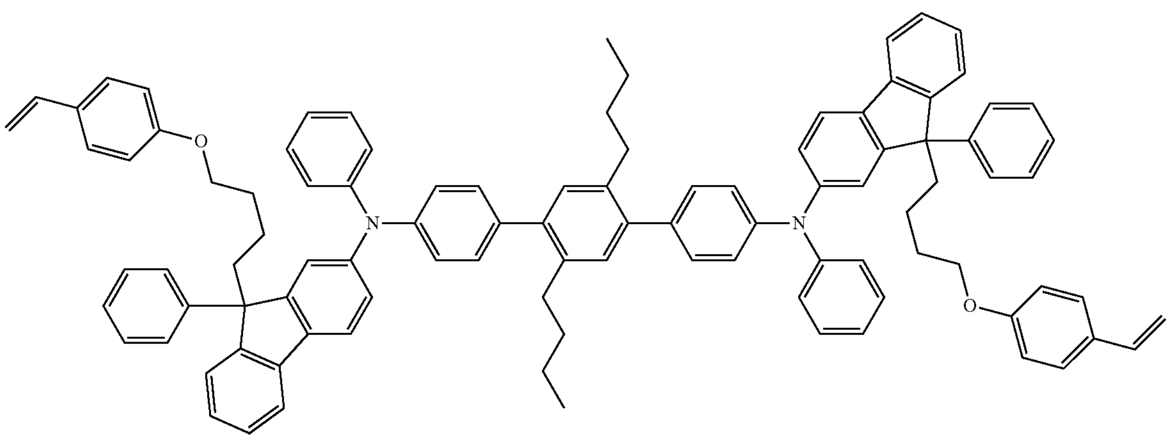
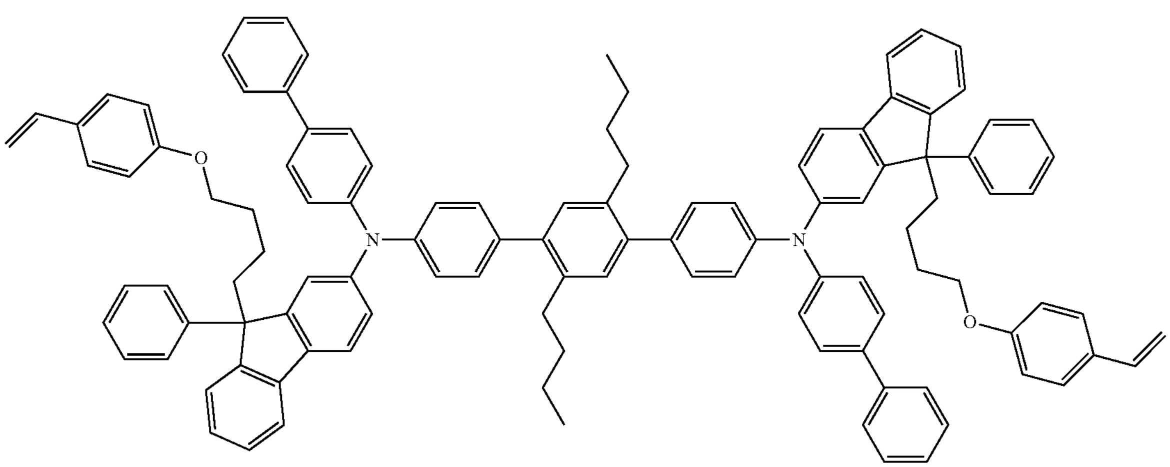

-continued
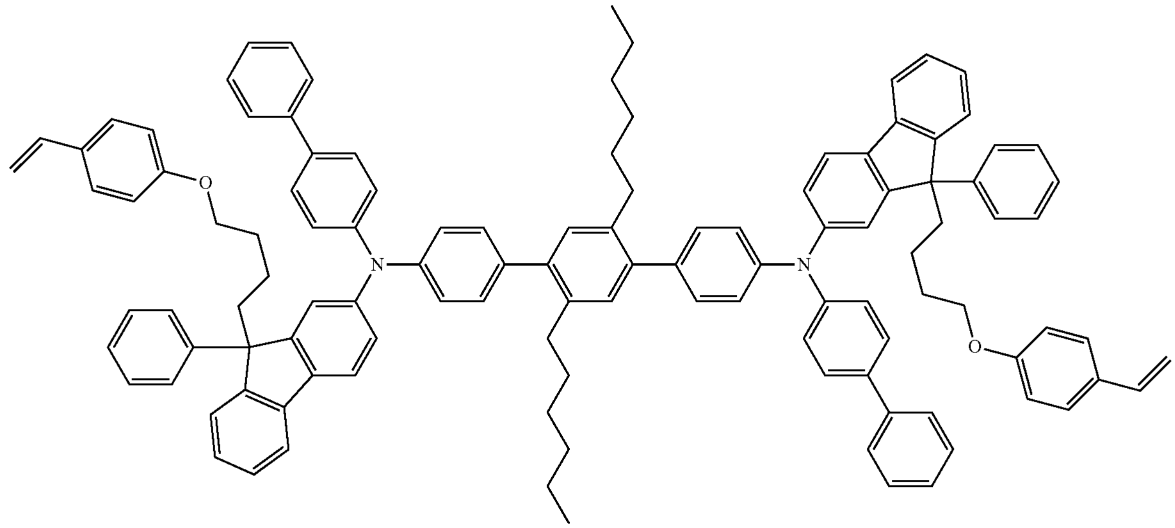
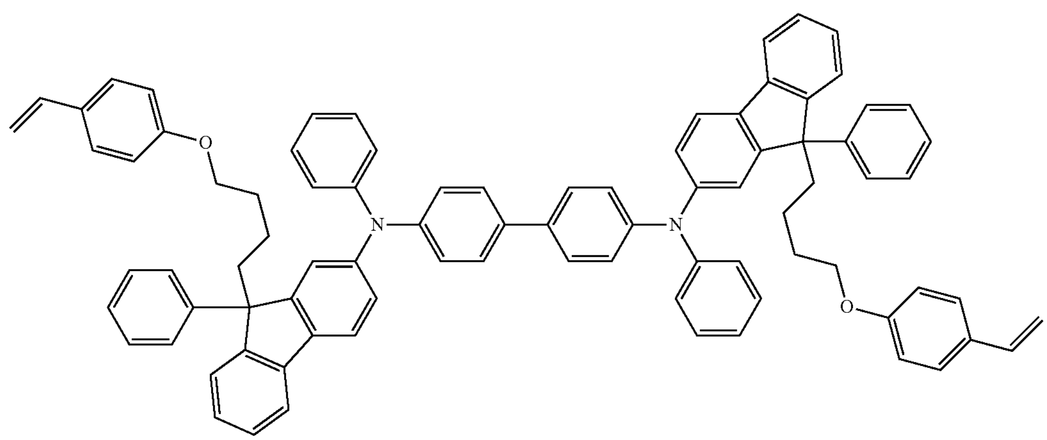
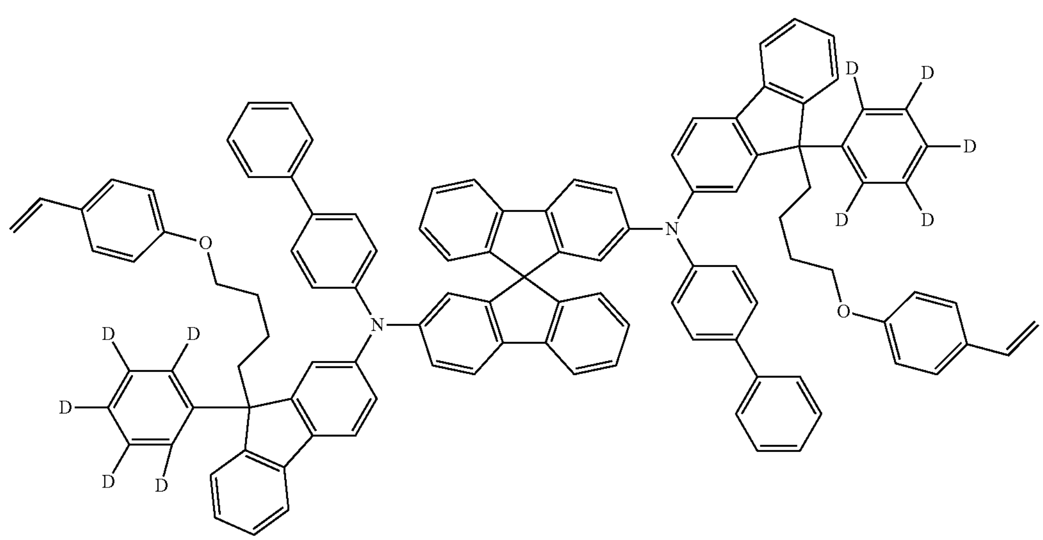

-continued
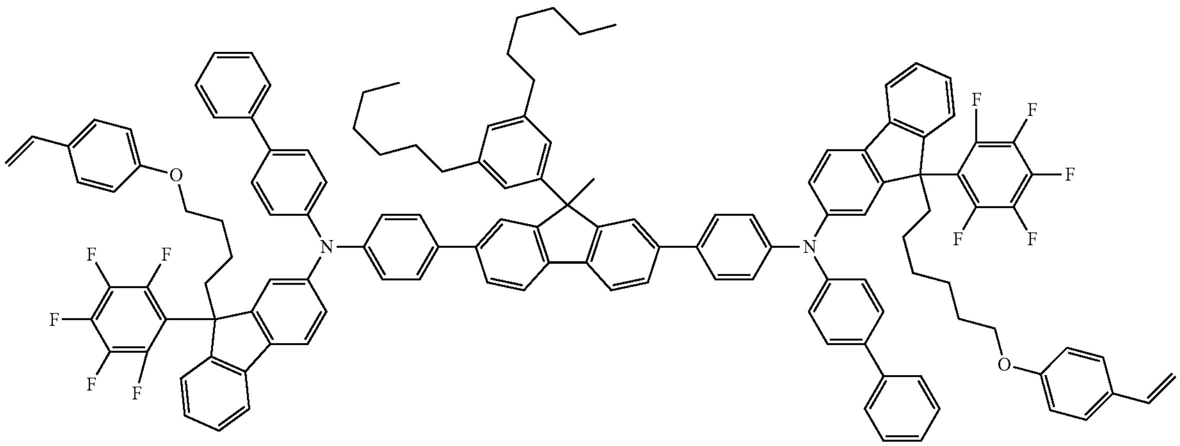
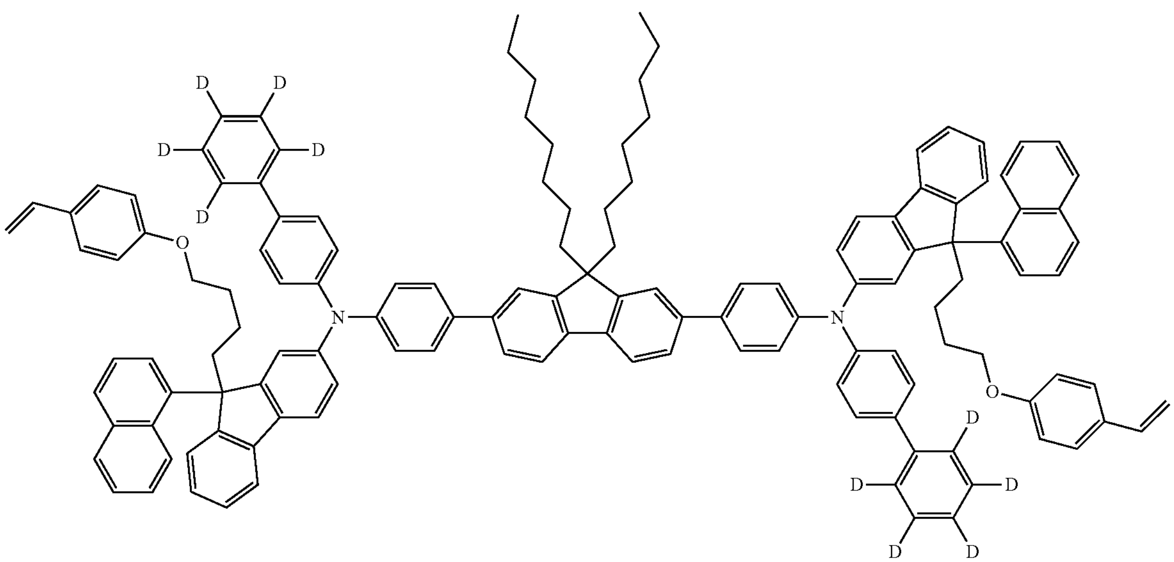
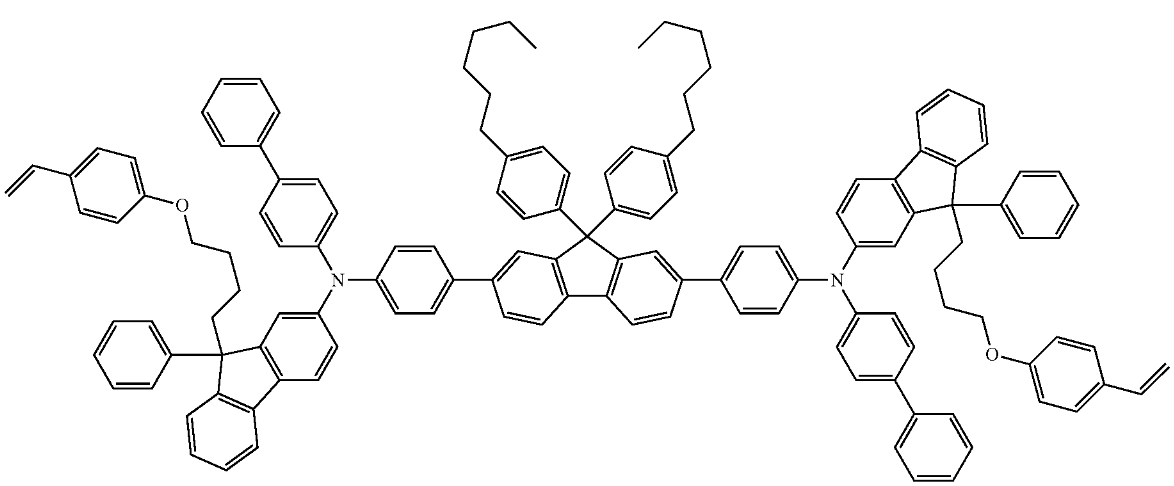

-continued
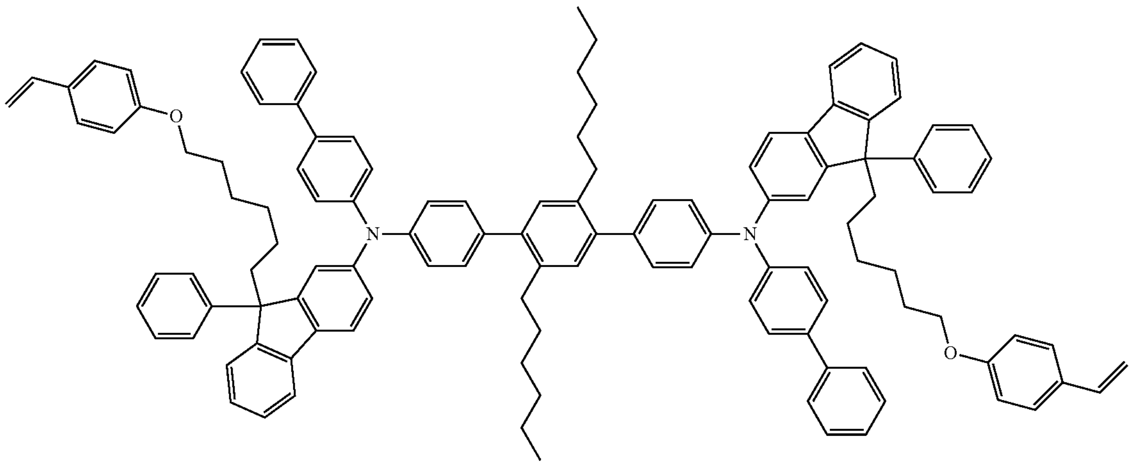
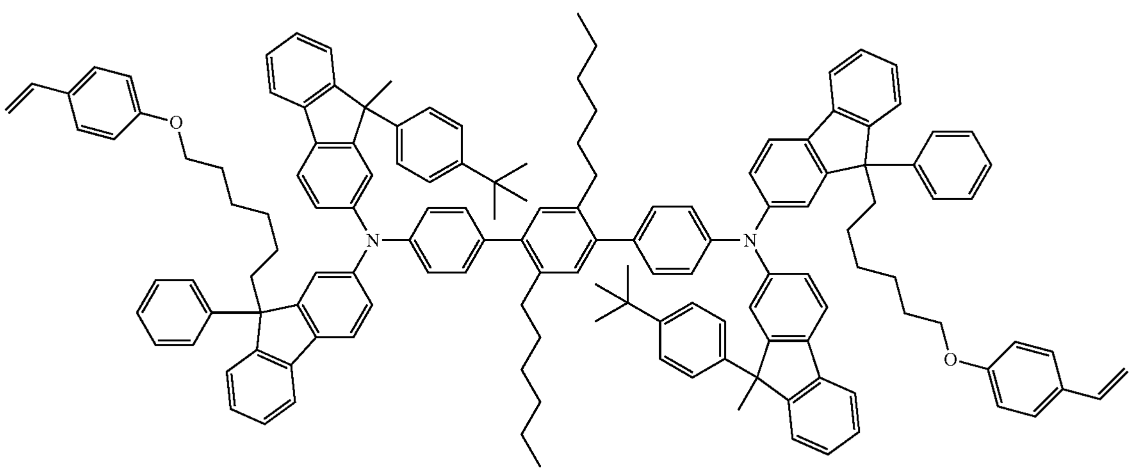
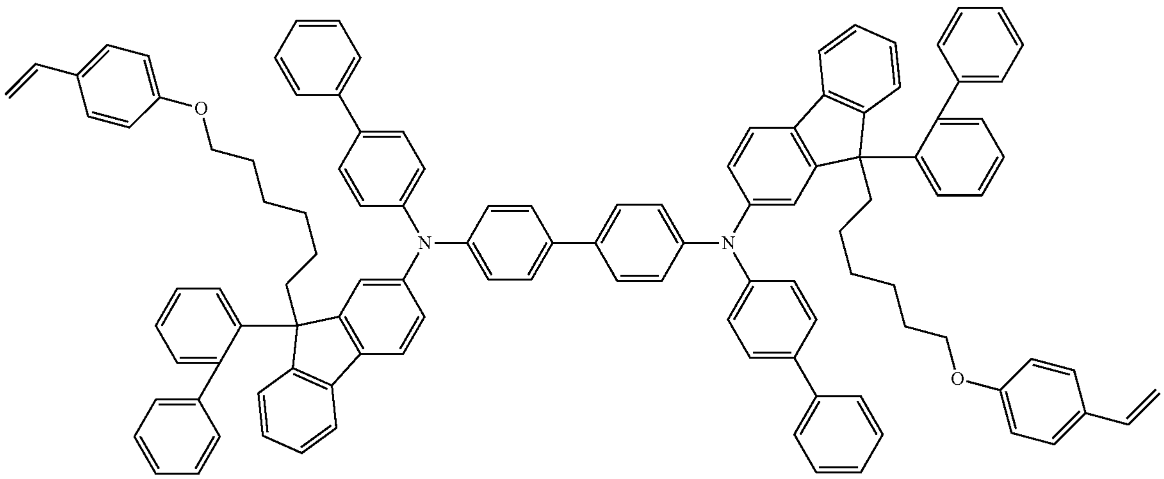

-continued
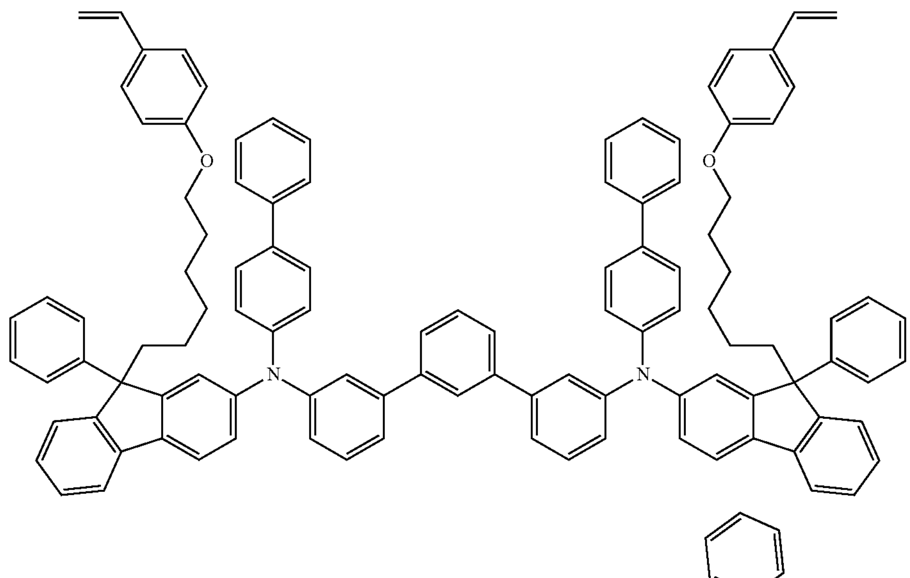
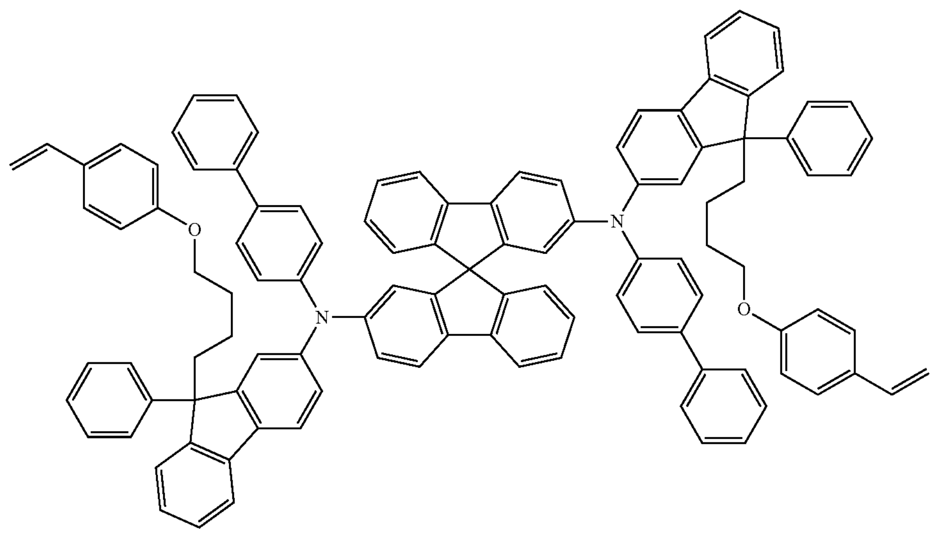
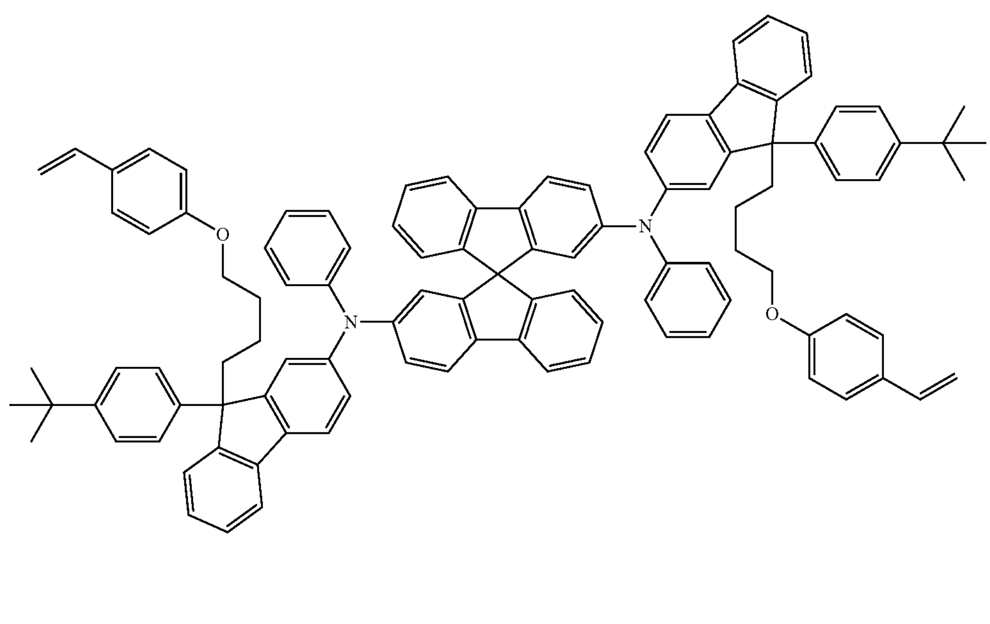

-continued
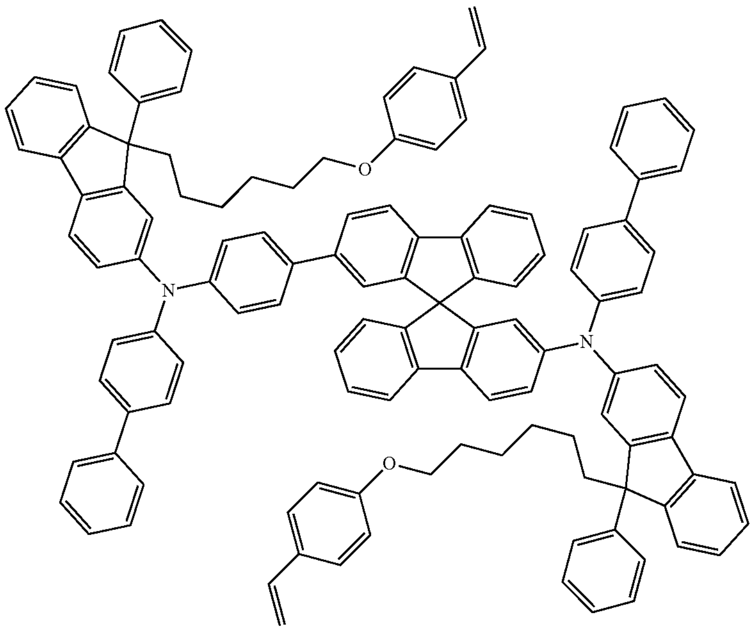
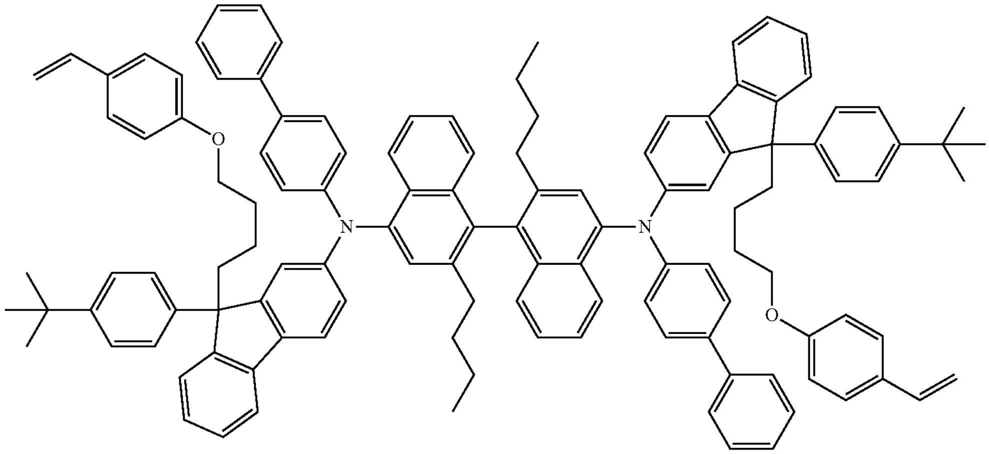
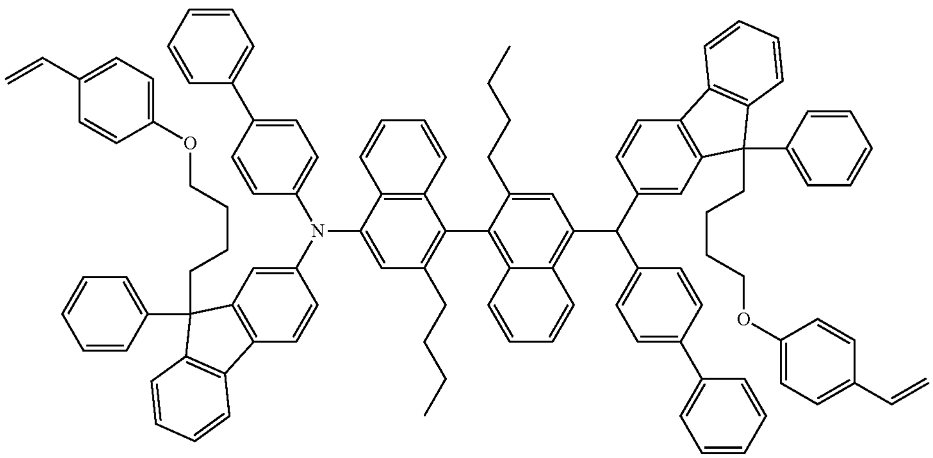

-continued

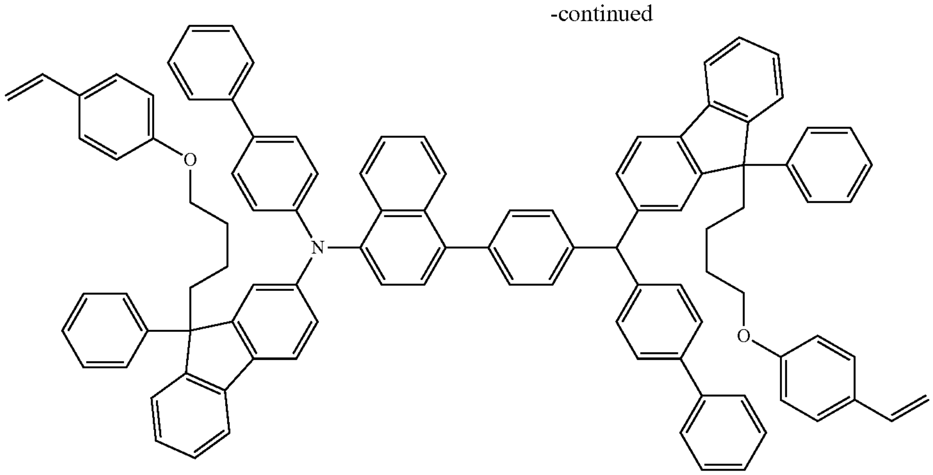

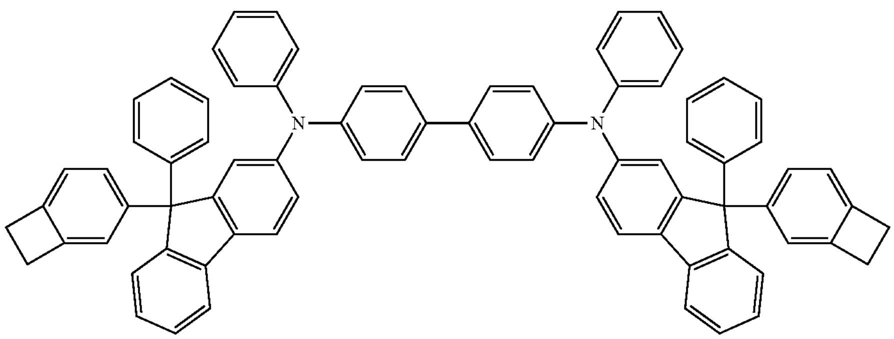

Meanwhile, the compound represented by Chemical Formula 1 may be prepared in accordance with a method as shown in the following Reaction Schemes 1 and 2.

[Reaction Scheme 1]

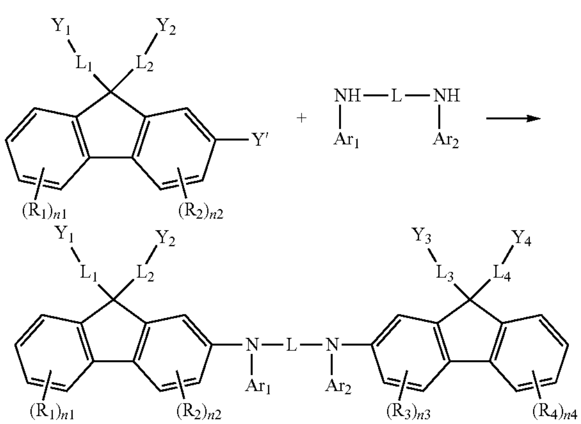

In Reaction Scheme 1, the remaining substituents excluding Y' are the same as defined above, and Y' is halogen, preferably bromo, or chloro. Reaction Scheme 1 is an amine substitution reaction, which is preferably carried out in the presence of a palladium catalyst and a base, and a reactive group for the amine substitution reaction can be modified as known in the art. The above preparation method will be more specifically described in the Preparation Examples described hereinafter.

Preferably, in the ink composition according to the present invention, the compound represented by Chemical Formula 1 is included in an amount of 0.1 to 10 wt %, more preferably 0.1 to 5 wt %, or 0.1 to 2 wt %.

Meanwhile, the ink composition according to the present invention further includes a p-doping material in addition to the compound represented by Chemical Formula 1. The p-doping material means a material allowing a host material to have a p-semiconductor property. The p-semiconductor property means a property receiving or transferring holes at a highest occupied molecular orbital (HOMO) energy level, that is, a property of a material having high hole conductivity.

Preferably, the p-doping material may be represented by one of the following Chemical Formulae A to F.

[Chemical Formulae A]

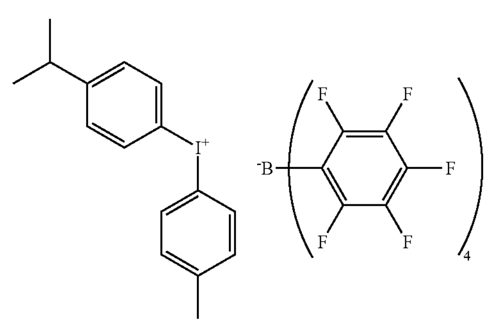

-continued

[Chemical Formulae B]

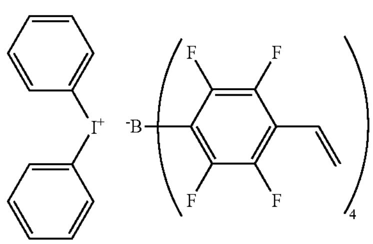

[Chemical Formulae C]

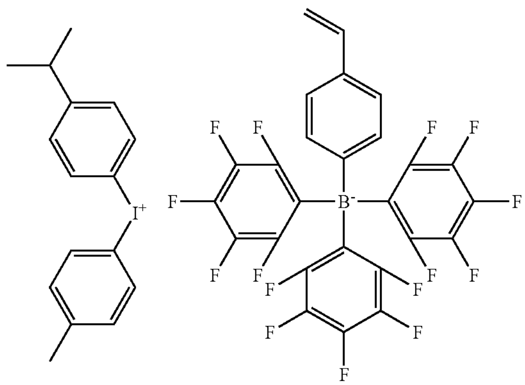

[Chemical Formulae D]

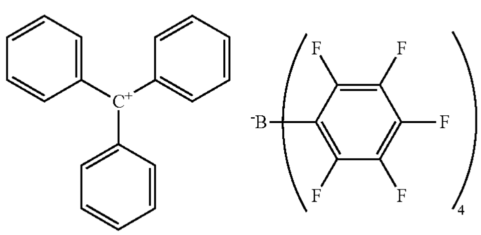

[Chemical Formulae E]

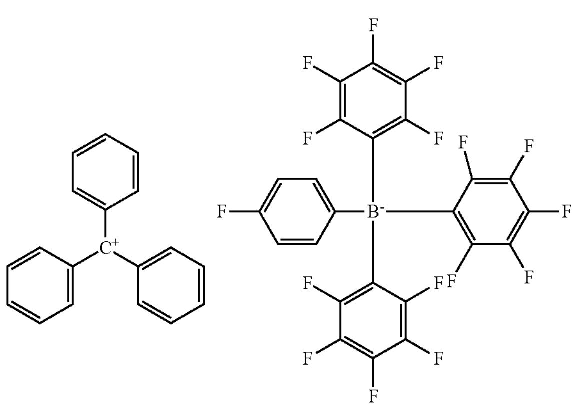

[Chemical Formulae F]

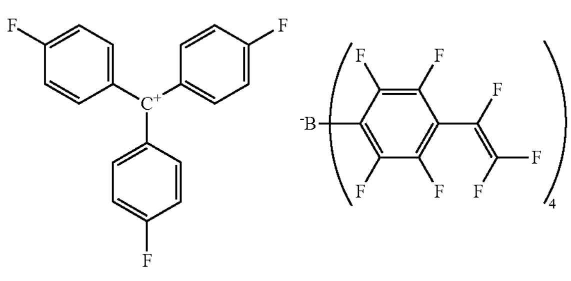

Preferably, the content of the p-doping material is 0 wt % to 50 wt % with respect to the compound represented by Chemical Formula 1.

First Solvent and Second Solvent

The compound represented by Chemical Formula 1 may form a functional layer by a solution process, but recently, the inkjet printing process is most frequently studied among the solution process. Since the inkjet printing process discharges fine drops, this has the advantage that not only the consumption of materials can be minimized but also precise patterns are possible.

In order to produce a flat functional layer by a solution process, it is basically necessary to ensure the processability of the ink, the film surface image and the film flatness at the same time. Since the ink composition is mostly composed of a solvent (minimum 90%, maximum 99.9%) and the ink properties are determined by the solvent, the selection of the solvent is most important.

The processability of the ink is a property that can be stably discharged without causing a ink drying phenomenon from the nozzle of the inkjet device. For this purpose, it is necessary to select a solvent having a high boiling point characteristic with a sufficiently low vapor pressure. The ink film image is a characteristic of forming a film image with a uniform surface without precipitation/phase separation when undergoing a drying process in the process of producing a functional layer. For this purpose, it is necessary to select a solvent having high solubility characteristics capable of sufficiently dissolving the material of the functional layer and drying characteristics suitable for vacuum drying. In addition, a characteristic required simultaneously with the film image is a film flatness. Since the functional layer is formed of a plurality of laminated structures, each functional layer should be flatly formed so that stable light emission characteristics can be exhibited in the completed organic light emitting device. Therefore, it is important to select a solvent that can simultaneously ensure ink processability, film image, and film flatness from the ink composition. Thus, in the present invention, the above-mentioned characteristics can be realized by using the ink composition containing the first solvent and the second solvent at the same time.

Although not limited by theory, the first solvent is an aromatic ester, and has a good interaction between the aromatic molecular structure and the compound represented by Chemical Formula 1, which is a functional layer-forming material, thus enhancing the dissolution effect. Moreover, since the first solvent has a higher boiling point than the second solvent, it remains to the end while the ink is dried, thereby obtaining a film image having a uniform surface without precipitation. The second solvent is aliphatic esters, aliphatic ethers, or aromatic ethers, and serves to form a flat functional layer. Meanwhile, the boiling point used herein means the boiling point measured at normal pressure (1 atm).

Preferably, the first solvent is a compound represented by the following Chemical Formula 2-1, or 2-2:

[Chemical Formula 2-1]

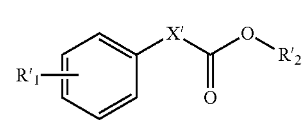

-continued

[Chemical Formula 2-2]

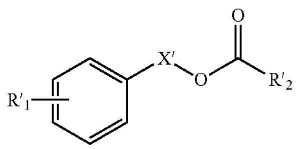

wherein, in Chemical Formulae 2-1 and 2-2,

X is a single bond, $C_{1-15}$ alkylene, or —O—($C_{1-15}$ alkylene),

R'$_1$ is hydrogen, $C_{1-15}$ alkyl, $C_{1-15}$ alkoxy, or —COO—($C_{1-15}$ alkyl), and R'$_2$ is $C_{1-15}$ alkyl.

Representative examples of the first solvent include ethyl 4-methoxybenzoate, ethyl 4-ethoxybenzoate, p-tolyl n-octanoate, 2-ethylhexyl benzoate, diethyl phthalate, dimethyl phthalate, 2-phenoxyethyl isobutyrate, 4-(2-acetoxyethoxy) toluene, 2-ethoxyethyl benzoate, or 2-phenoxyethyl acetate.

Preferably, the second solvent is a compound represented by the following Chemical Formula 3-1, 3-2, or 3-3:

[Chemical Formula 3-1]

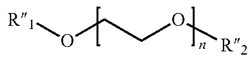

[Chemical Formula 3-2]

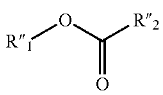

[Chemical Formula 3-3]

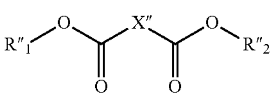

wherein, in Chemical Formulae 3-1, 3-2 and 3-3, n is an integer of 1 to 10,

R"$_1$ is hydrogen or $C_{1-15}$ alkyl,

R"$_2$ is hydrogen or $C_{1-15}$ alkyl, and

X" is $C_{1-10}$ alkylene.

Preferably, the second solvent is diethylene glycol butyl methyl ether, diethylene glycol dibutyl ether, tetraethylene glycol monomethyl ether, tetraethylene glycol dimethyl ether, triethylene glycol n-butyl ether, triethylene glycol butylmethyl ether, triethylene glycol monoisopropyl ether, diethylene glycol monohexyl ether, triethylene glycol monoethyl ether, triethylene glycol monomethyl ether, diethylene glycol monobutyl ether, dipropylene glycol n-butyl ether, triethylene glycol dimethyl ether, dipropylene glycol propyl ether, dipropylene glycol methyl ether, diethylene glycol monoethyl ether, tetraethylene glycol monomethyl ether, triethylene glycol, diethylene glycol, amyl n-octanoate, ethyl n-octanoate, isopropyl n-octanoate, propyl n-octanoate, butyl n-octanoate, methyl undecanoate, methyl laurate, methyl tridecanoate, dibutyl malonate, dibutyl oxalate, diethyl succinate, ethyl laurate, methyl myristate, diethyl adipate, diisopropyl adipate, dibutyl adipate, or dodecyl acetate.

Preferably, the weight ratio of the first solvent and the second solvent is 1:99 to 50:50. More preferably, the weight ratio is 10:90 to 40:60.

Ink Composition

The ink composition according to the present invention described above can be used for the production of a functional layer of an organic light emitting device. The ink composition may be used to produce a functional layer of the organic light emitting device by a solution process, and in particular, an inkjet process may be applied.

The inkjet process may use a method known in the art, except for using the ink composition according to the present invention described above. As an example, the method may include a step of discharging the ink composition to form an ink film; and a step of drying the ink film. In addition, since the compound represented by Chemical Formula 1 includes a functional group that can be cross-linked by heat or light, it may further include a step of subjecting to heat treatment or light treatment after the aforementioned step.

Meanwhile, the functional layer which may be formed of the ink composition may be a hole injection layer, a hole transport layer, and a light emitting layer of the organic light emitting device. In addition, since the structure and production method of the organic light emitting device used in the art can be applied except for the functional layer, a detailed description thereof will be omitted.

Hereinafter, preferred examples are provided to facilitate understanding the present invention. However, these examples are merely provided for a better understanding of the present invention, and the scope of the present invention are not limited thereto.

PREPARATION EXAMPLE

Preparation Example 1: Preparation of Compound 3

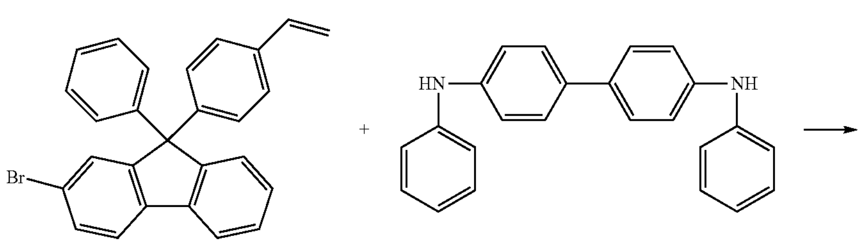

3-1

-continued

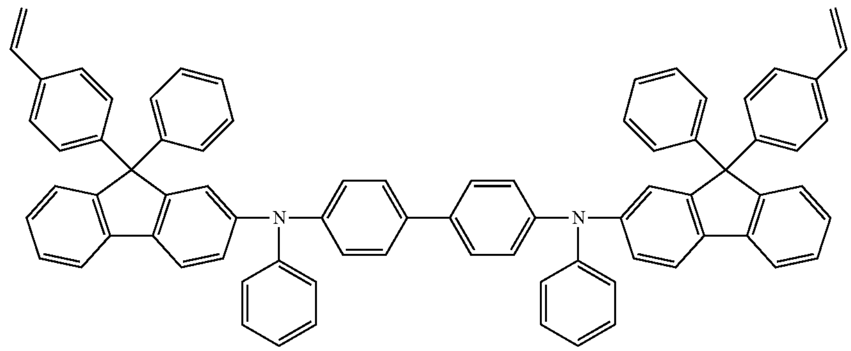

3

Toluene was placed in a flask containing Compound 3-1 (1.58 g, 3.74 mmol), N4,N4'-diphenyl-[1,1'-biphenyl]-4,4'-diamine (572 mg, 1.7 mmol), and sodium t-butoxide (980 mg, 10.2 mmol). The flask was immersed in an oil bath at 90° C., and then $Pd(PtBu_3)_2$ (43 mg, 0.085 mmol) was added thereto and reacted for 1 hour. Water was added to stop the reaction, the mixture was extracted with dichloromethane, and the organic layer was dried over $MgSO_4$. The organic solvent was removed using a vacuum rotary concentrator, and then the residue was purified by column chromatography to obtain Compound 3 (yield: 55%).

$MS[M+H]^+=1022$

Preparation Example 2: Preparation of Compound 1

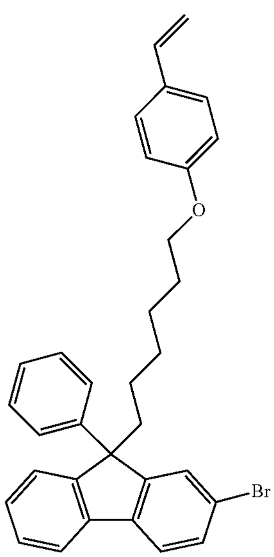

1-1

+

-continued

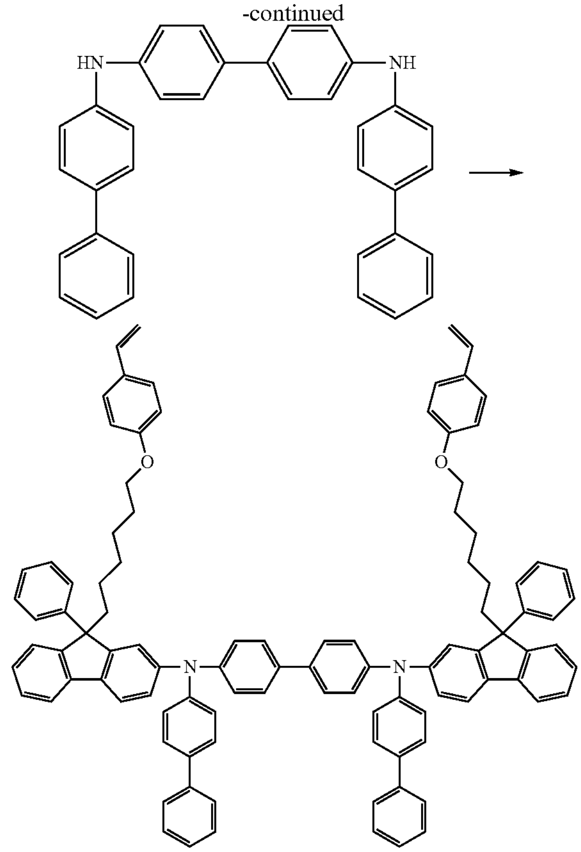

1

Compound 1 was prepared in the same manner as in Preparation Example 1, except that Compound 1-1 was used instead of compound 3-1 and N4,N4'-di(biphenyl-4-yl)biphenyl-4,4'-diamine was used instead of N4,N4'-diphenyl-[1,1'-biphenyl]-4,4'-diamine.

$MS[M+H]^+=1374$

Preparation Example 3: Preparation of Compound 2

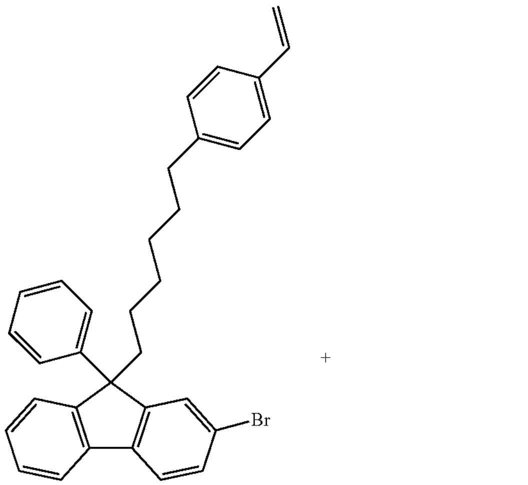

2-1

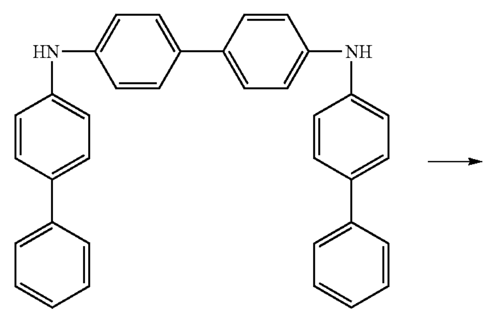

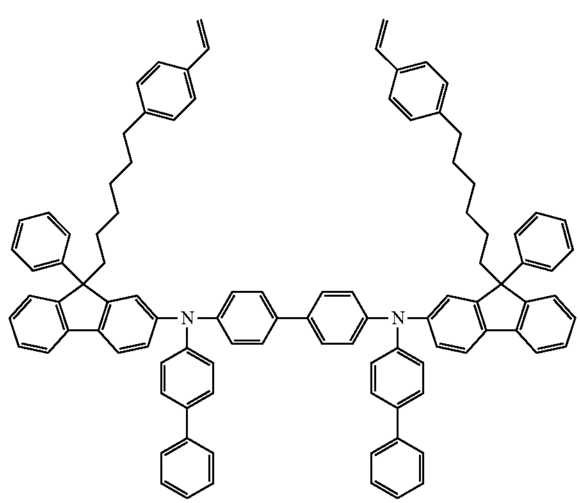

2

Compound 2 was prepared in the same manner as in Preparation Example 1, except that Compound 2-1 was used instead of compound 3-1 and N4,N4'-di(biphenyl-4-yl)biphenyl-4,4'-diamine was used instead of N4,N4'-diphenyl-[1,1'-biphenyl]-4,4'-diamine.

MS$[M+H]^+$=1342

Preparation Example 4: Preparation of Compound 4

1) Preparation of Intermediate 4-1

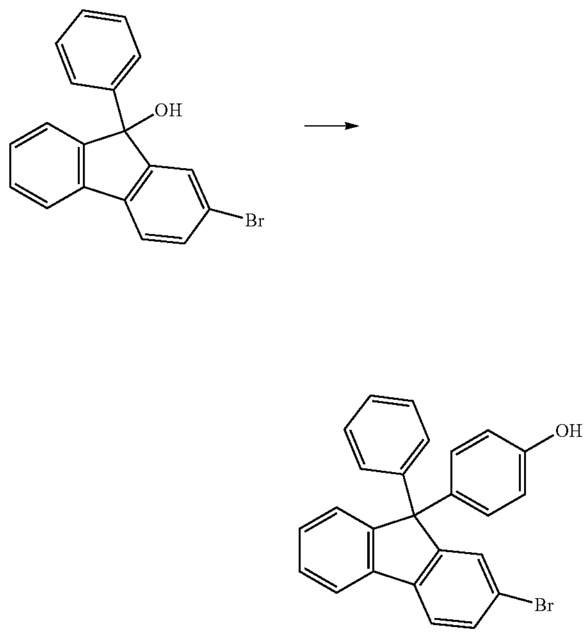

4-1

2-Bromo-9-phenyl-9H-fluorene-9-ol (50 g, 148.3 mmol, 1.0 eq) and phenol (41.8 g, 444.9 mmol, 3.0 eq) were placed in a 500 ml round flask, and dissolved in methanesulfonic acid (200 ml, 0.74 M). The reaction mixture was stirred overnight under reflux. Then, the reaction was stopped with a saturated aqueous $NaHCO_3$ solution, and the organic layer was extracted with ethyl acetate. The organic layer was dried over magnesium sulfate, the solvent was removed and then the product was purified by column chromatography to obtain Intermediate Compound 4-1.

2) Preparation of Intermediate 4-2

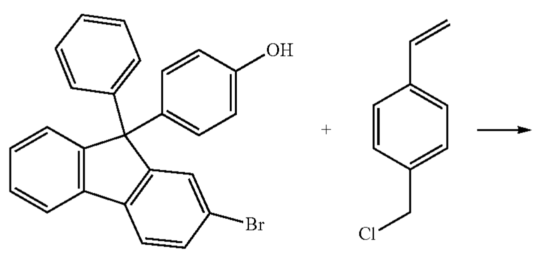

4-1

-continued

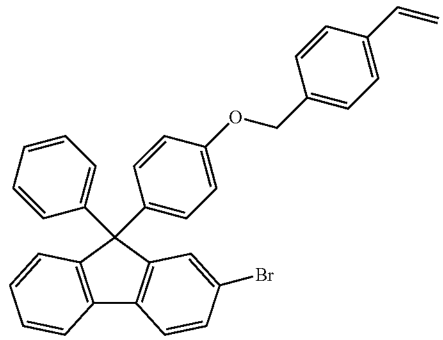

4-2

Intermediate 4-1 (30 g, 63.9 mmol, 1.0 eq) and cesium carbonate (41.6 g, 127.8 mmol, 2.0 eq) were dissolved in DMF (120 ml, 0.5 M) in a 500 ml round flask, and the mixture was heated to 50° C. and stirred. Then, 4-vinylbenzyl chloride (9.15 ml, 9.75 g, 1.0 eq) was added and stirred at 60° C. After cooling to room temperature, water was added and the reaction was stopped. The organic layer was extracted using ethyl acetate. The organic layer was separated and dried over magnesium sulfate. The solvent was removed and the product was purified by column chromatography to obtain Intermediate Compound 4-2.

3) Preparation of Compound 4

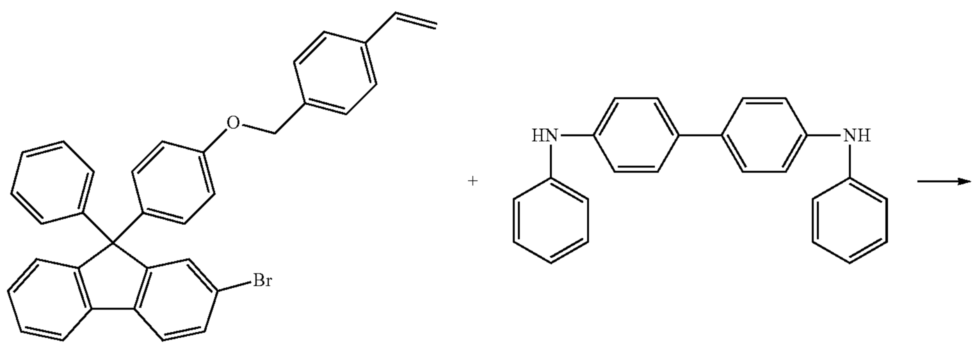

4-2

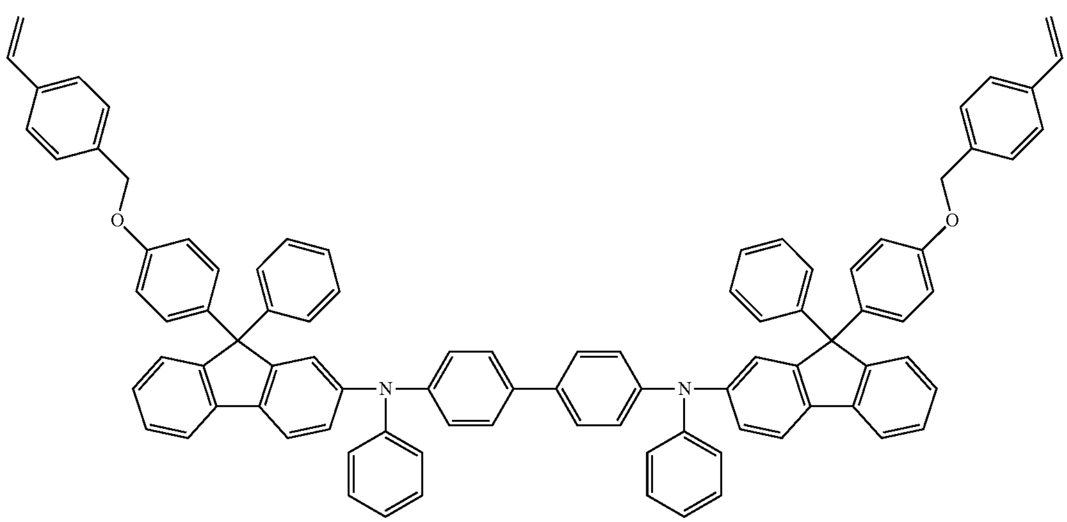

4

Intermediate 4-2 (12.0 g, 20.49 mmol, 2.05 eq), N4,N4-diphenyl-[1,1'-biphenyl]-4,4'-diamine (3.36 g, 10.0 mmol, 1.0 eq), NaOtBu (3.36 g, 34.99 mmol, 3.5 eq) and $Pd(PtBu_3)_2$ (255 mg, 0.5 mmol, 0.05 eq) were dissolved in toluene (100 ml) in a 250 ml round flask and then stirred and reacted under a nitrogen atmosphere. Then, when the reaction was completed, workup was performed with water and ethyl acetate, the organic layer was separated, dried and then filtered. The solvent was then removed with a rotary vacuum evaporator. The resulting crude material was purified by column chromatography and the solvent was removed to obtain Compound 4 (white solid).

$MS[M+H]^+$=1234

Preparation Example 5. Preparation of Compound 5

1) Preparation of Intermediate 5-1

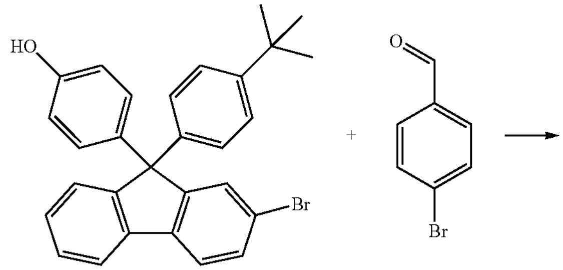

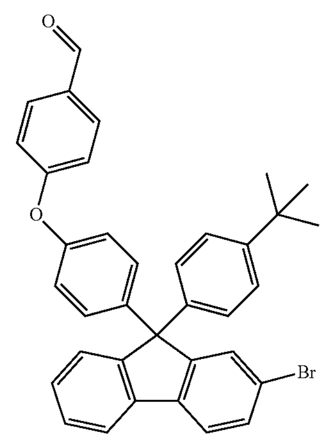

5-1

4-(2-Bromo-9-(4-(tert-butyl)phenyl)-9H-fluoren-9-yl) phenol (50 g, 106.50 mmol, 1.0 eq), 4-bromobenzaldehyde (23.6 g, 127.8 mmol, 1.2 eq) and potassium carbonate (44.2 g, 319.50 mmol, 3.0 eq) were placed in a 500 ml round flask and dissolved in dry pyridine (200 ml, 0.5 M). Then, copper(II) oxide (17.0 g, 213.0 mmol, 2 eq) was slowly added and the mixture was heated to 120° C., and allowed to react under reflux. When the reaction was completed, the reaction was stopped with saturated aqueous $NaHCO_3$ solution, and the organic layer was extracted with ethyl acetate. The organic layer was dried over magnesium sulfate, and then the solvent was removed. The resulting crude was dissolved in dichloromethane and precipitated in ethanol to obtain a solid intermediate compound 5-1.

2) Preparation of Intermediate 5-2

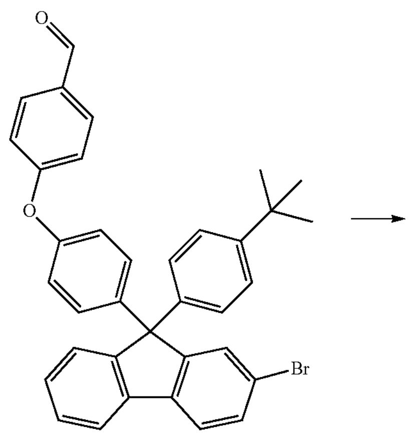

5-1

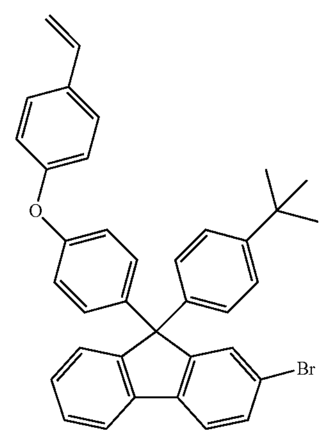

5-2

Anhydrous tetrahydrofuran (50 ml, 0.2 M) was placed in a round flask containing methyltriphenylphosphonium bromide (12.46 g, 34.87 mmol, 2.0 eq), and the round flask was immersed in an ice bath. Potassium tert-butoxide (3.9 g, 34.87 mmol, 2.0 eq) was added in one portion and stirred in an ice bath for 20 minutes. Intermediate Compound 5-1 (10.0 g, 17.44 mmol, 1.0 eq) was dissolved in tetrahydrofuran (30 ml) and then gradually added to the mixture using a dropping funnel. Then, tetrahydrofuran (10 ml) was added to wash the round flask and funnel. Water (50 ml) was added to terminate the reaction, and the organic layer was extracted with ethyl acetate. The organic layer was dried over magnesium sulfate, and then the solvent was removed and the product was purified by column chromatography to obtain Compound 5-2.

3) Preparation of Compound 5

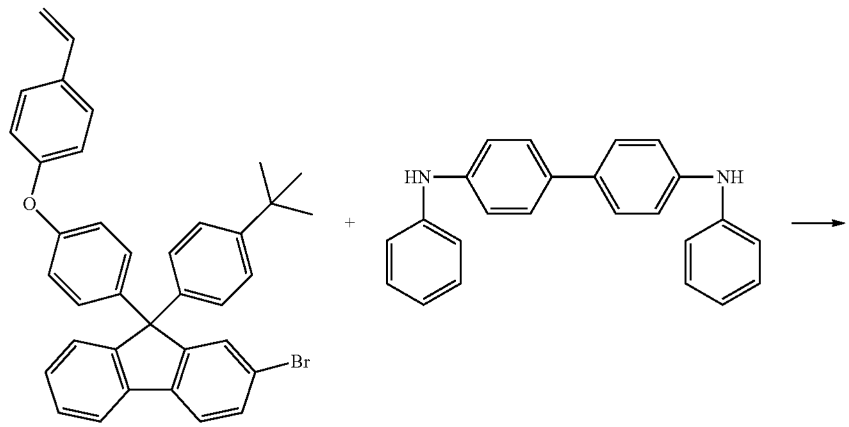

5-2

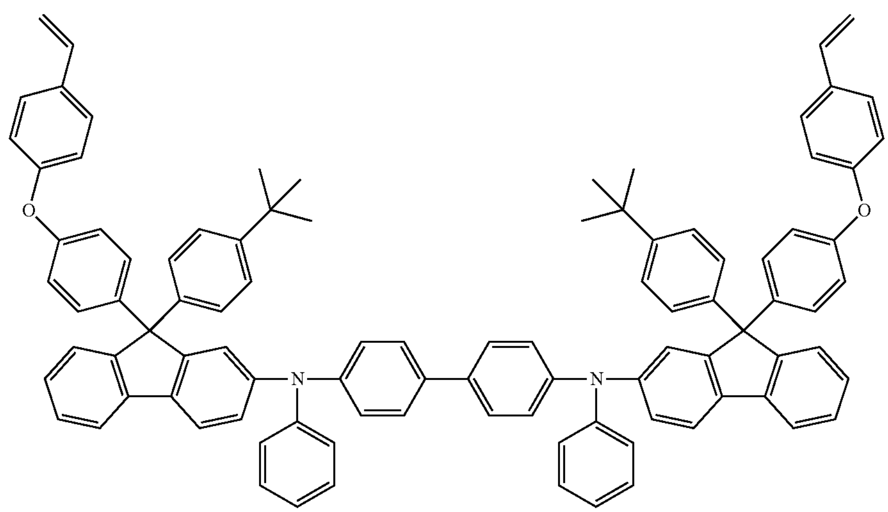

5

Intermediate Compound 5-2 (10.0 g, 17.50 mmol, 2.05 eq), N4,N4'-diphenyl-[1,1'-biphenyl]-4,4'-diamine (2.87 g, 8.53 mmol, 1.0 eq), NaOtBu (2.87 g, 29.86 mmol, 3.5 eq) and $Pd(PtBu_3)_2$ (218.0 mg, 0.43 mmol, 0.05 eq) were dissolved in toluene (90 ml) in a 250 ml round flask and then stirred and reacted under a nitrogen atmosphere. Then, when the reaction was completed, workup was performed with water and ethyl acetate, the organic layer was separated, dried and then filtered. The solvent was then removed with a rotary vacuum evaporator. The resulting crude material was purified by column chromatography and the solvent was removed to obtain Compound 5 (white solid).

$MS[M+H]^+=1318$

Preparation Example 3. Preparation of Compound 6

1) Preparation of Intermediate 6-1

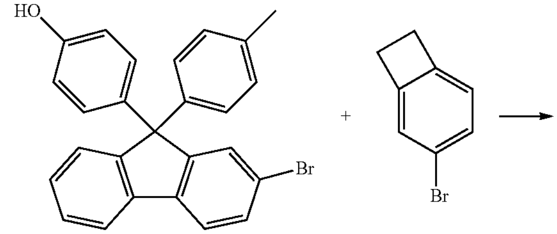

-continued

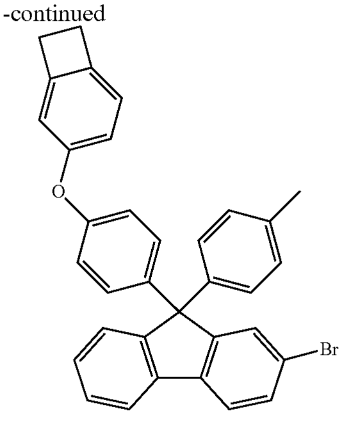

6-1

4-(2-Bromo-9-(p-tolyl)-9H-fluoren-9-yl)phenol (15 g, 35.1 mmol, 1.0 eq), potassium carbonate (14.6 g, 105.3 mmol, 3 eq), copper iodide (1) (334.3 mg, 1.76 mmol, 0.05 eq) and 4-bromo-1,2-dihydrocyclobutabenzene (6.4 g, 35.1 mmol, 1.0 eq) were placed in a 250 ml round flask and then dissolved in toluene (175 ml). After the reflux device was installed, the reaction mixture was heated to 120° C. and stirred to proceed the reaction. When the reaction was completed, the reaction was stopped with saturated aqueous $NaHCO_3$ solution and worked up with water and ethyl acetate. The organic layer was separated, dried over $MgSO_4$ and filtered. Then, the solvent was removed using a rotary vacuum evaporator, and the resulting crude material was purified by column chromatography to obtain Intermediate Compound 6-1.

2) Preparation of Compound 6

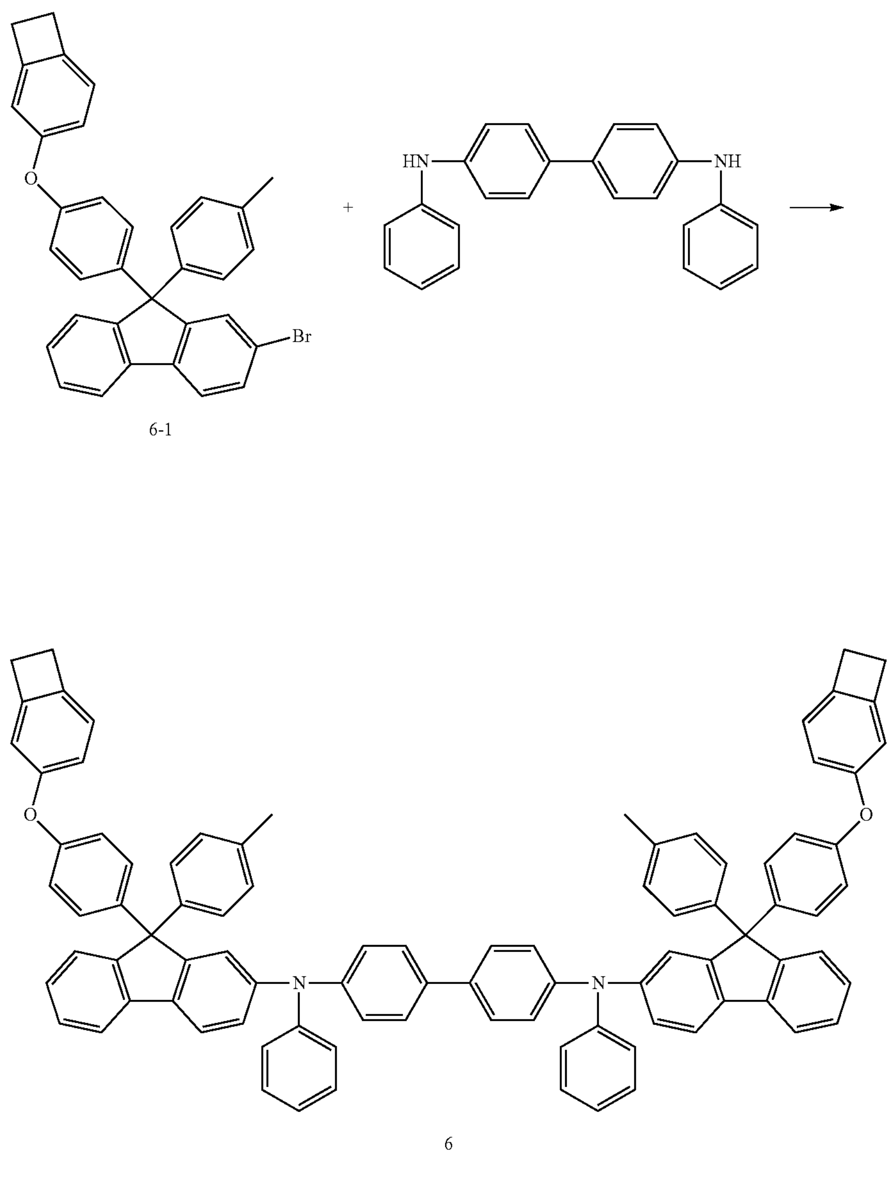

6

Intermediate Compound 6-1 (10.0 g, 18.89 mmol, 2.05 eq), N4,N4'-diphenyl-[1,1'-biphenyl]-4,4'-diamine (3.10 g, 9.21 mmol, 1.0 eq), NaOtBu (3.10 g, 32.24 mmol, 3.5 eq) and $Pd(PtBu_3)_2$ (235.1 mg, 0.46 mmol, 0.05 eq) were dissolved in toluene (120 ml) in a 250 ml round flask and then stirred and reacted under a nitrogen atmosphere. Then, when the reaction was completed, workup was performed with water and ethyl acetate, the organic layer was separated, dried and then filtered. The solvent was then removed with a rotary vacuum evaporator. The resulting crude material was purified by column chromatography and the solvent was removed to obtain Compound 6 (white solid).

$MS[M+H]^+=1234$

Example

Solvent Used

Hereinafter, the solvents used in Examples and Comparative Examples are shown in Table 1 below, and each boiling point is as described in Table 1 below. The following boiling point means the boiling point measured at normal pressure (1 atm).

TABLE 1

| | Boiling point (° C.) |
|---|---|
| First solvent | |
| Ethyl 4-methoxy benzoate | 263 |
| Ethyl 4-ethoxy benzoate | 275 |
| p-tolyl n-octanoate | 308 |
| 2-Ethylhexyl Benzoate | 313 |
| Dimethyl phthalate | 284 |
| Second solvent | |
| Tetraethyleneglycol dimethylether (TeEG DME) | 275 |
| Triethyleneglycol monobutylether, (TEG MBE) | 272 |
| Diethyleneglycol monohexylether (DEG MHE) | 260 |
| Diethyleneglycol dibutylether (DEG DBE) | 256 |
| Triethyleneglycol dimethylether (TEG DME) | 216 |
| Isoamyl n-octanoate | 250 |
| Dibutyl succinate | 274 |

Example 1-1

Dimethyl phthalate as a first solvent and tetraethylene glycol dimethyl ether as a second solvent were mixed in a weight ratio of 1:99, 10:90, 20:80, 30:70, 40:60 and 50:50 to prepare mixed solutions, respectively. 1.6 wt % of Compound 1 prepared above and 0.4 wt % of Compound A represented by Chemical Formula 2 were added to each of the mixed solutions to prepare ink compositions.

[Chemical Formula A]

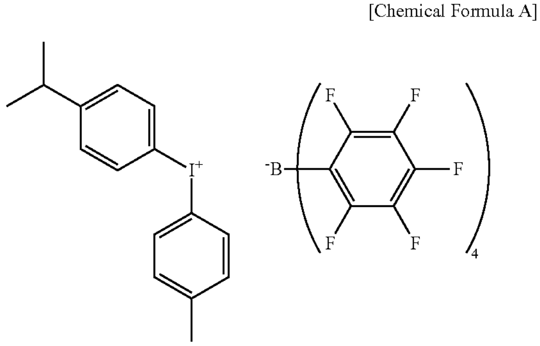

Examples 1-2 to 6-23

The ink compositions were prepared in the same manner as in Example 1-1, except that each added material was changed as shown in Tables 2 to 7 below. In the following Tables 2 to 7, the doping material is as follows.

[Chemical Formulae B]

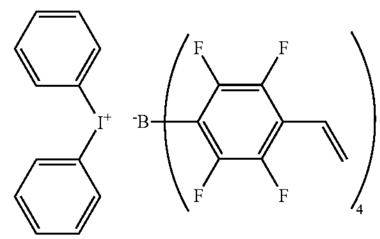

[Chemical Formulae C]

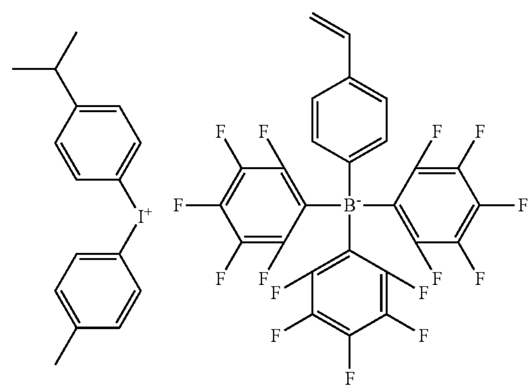

[Chemical Formulae D]

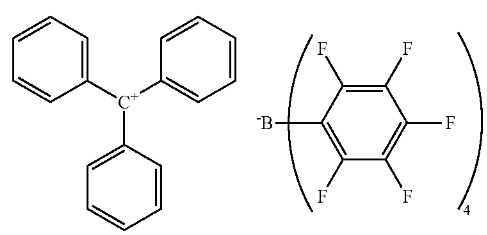

[Chemical Formulae E]

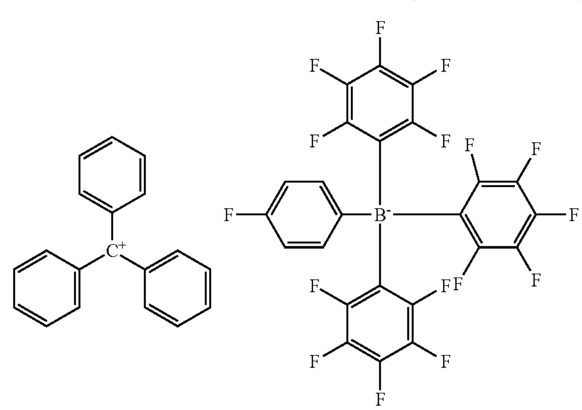

-continued

[Chemical Formulae F]

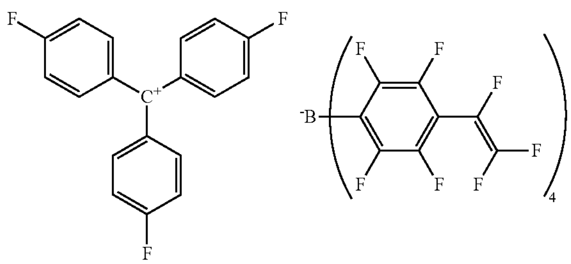

TABLE 2

| | Functional layer material | p-doping material | First solvent | Second solvent |
|---|---|---|---|---|
| Ex. 1-1 | Com. 1 | Com. A | Dimethyl phthalate | TeEG DME |
| Ex. 1-2 | Com. 1 | Com. A | Dimethyl phthalate | TEG MBE |
| Ex. 1-3 | Com. 1 | Com. B | Ethyl 4-methoxybenzoate | DEG MHE |
| Ex. 1-4 | Com. 1 | Com. B | Ethyl 4-methoxybenzoate | DEG DBE |
| Ex. 1-5 | Com. 1 | Com. B | Ethyl 4-methoxybenzoate | TEG DME |
| Ex. 1-6 | Com. 1 | Com. C | Ethyl 4-methoxybenzoate | Isoamyl n-octanoate |
| Ex. 1-7 | Com. 1 | Com. C | Dimethyl phthalate | Dibutyl succinate |
| Ex. 1-8 | Com. 1 | Com. A | Ethyl 4-ethoxybenzoate | TEG MBE |
| Ex. 1-9 | Com. 1 | Com. B | Ethyl 4-ethoxybenzoate | DEG MHE |
| Ex. 1-10 | Com. 1 | Com. B | Ethyl 4-ethoxybenzoate | DEG DBE |
| Ex. 1-11 | Com. 1 | Com. B | Ethyl 4-ethoxybenzoate | TEG DME |
| Ex. 1-12 | Com. 1 | Com. C | Ethyl 4-ethoxybenzoate | Isoamyl n-octanoate |
| Ex. 1-13 | Com. 1 | Com. C | Ethyl 4-ethoxybenzoate | Dibutyl succinate |
| Ex. 1-14 | Com. 1 | Com. A | 2-Ethylhexyl Benzoate | TEG MBE |
| Ex. 1-15 | Com. 1 | Com. B | 2-Ethylhexyl Benzoate | DEG MHE |
| Ex. 1-16 | Com. 1 | Com. B | 2-Ethylhexyl Benzoate | DEG DBE |
| Ex. 1-17 | Com. 1 | Com. C | 2-Ethylhexyl Benzoate | Isoamyl n-octanoate |
| Ex. 1-18 | Com. 1 | Com. C | 2-Ethylhexyl Benzoate | Dibutyl succinate |
| Ex. 1-19 | Com. 1 | Com. A | p-tolyl n-octanoate | TEG MBE |
| Ex. 1-20 | Com. 1 | Com. B | p-tolyl n-octanoate | DEG MHE |
| Ex. 1-21 | Com. 1 | Com. B | p-tolyl n-octanoate | DEG DBE |
| Ex. 1-22 | Com. 1 | Com. C | p-tolyl n-octanoate | Isoamyl n-octanoate |
| Ex. 1-23 | Com. 1 | Com. C | p-tolyl n-octanoate | Dibutyl succinate |

TABLE 3

| | Functional layer material | p-doping material | First solvent | Second solvent |
|---|---|---|---|---|
| Ex. 2-1 | Com. 2 | Com. D | Dimethyl phthalate | TeEG DME |
| Ex. 2-2 | Com. 2 | Com. D | Dimethyl phthalate | TEG MBE |
| Ex. 2-3 | Com. 2 | Com. E | Ethyl 4-methoxybenzoate | DEG MHE |
| Ex. 2-4 | Com. 2 | Com. E | Ethyl 4-methoxybenzoate | DEG DBE |
| Ex. 2-5 | Com. 2 | Com. E | Ethyl 4-methoxybenzoate | TEG DME |
| Ex. 2-6 | Com. 2 | Com. F | Ethyl 4-methoxybenzoate | Isoamyl n-octanoate |
| Ex. 2-7 | Com. 2 | Com. F | Dimethyl phthalate | Dibutyl succinate |
| Ex. 2-8 | Com. 2 | Com. D | Ethyl 4-ethoxybenzoate | TEG MBE |
| Ex. 2-9 | Com. 2 | Com. E | Ethyl 4-ethoxybenzoate | DEG MHE |
| Ex. 2-10 | Com. 2 | Com. E | Ethyl 4-ethoxybenzoate | DEG DBE |
| Ex. 2-11 | Com. 2 | Com. E | Ethyl 4-ethoxybenzoate | TEG DME |
| Ex. 2-12 | Com. 2 | Com. F | Ethyl 4-ethoxybenzoate | Isoamyl n-octanoate |
| Ex. 2-13 | Com. 2 | Com. F | Ethyl 4-ethoxybenzoate | Dibutyl succinate |

TABLE 3-continued

| | Functional layer material | p-doping material | First solvent | Second solvent |
|---|---|---|---|---|
| Ex. 2-14 | Com. 2 | Com. D | 2-Ethylhexyl Benzoate | TEG MBE |
| Ex. 2-15 | Com. 2 | Com. E | 2-Ethylhexyl Benzoate | DEG MHE |
| Ex. 2-16 | Com. 2 | Com. E | 2-Ethylhexyl Benzoate | DEG DBE |
| Ex. 2-17 | Com. 2 | Com. F | 2-Ethylhexyl Benzoate | Isoamyl n-octanoate |
| Ex. 2-18 | Com. 2 | Com. F | 2-Ethylhexyl Benzoate | Dibutyl succinate |
| Ex. 2-19 | Com. 2 | Com. D | p-tolyl n-octanoate | TEG MBE |
| Ex. 2-20 | Com. 2 | Com. E | p-tolyl n-octanoate | DEG MHE |
| Ex. 2-21 | Com. 2 | Com. E | p-tolyl n-octanoate | DEG DBE |
| Ex. 2-22 | Com. 2 | Com. F | p-tolyl n-octanoate | Isoamyl n-octanoate |
| Ex. 2-23 | Com. 2 | Com. F | p-tolyl n-octanoate | Dibutyl succinate |

TABLE 4

| | Functional layer material | p-doping material | First solvent | Second solvent |
|---|---|---|---|---|
| Ex. 3-1 | Com. 3 | Com. C | Dimethyl phthalate | TeEG DME |
| Ex. 3-2 | Com. 3 | Com. B | Dimethyl phthalate | TEG MBE |
| Ex. 3-3 | Com. 3 | Com. B | Ethyl 4-methoxybenzoate | DEG MHE |
| Ex. 3-4 | Com. 3 | Com. B | Ethyl 4-methoxybenzoate | DEG DBE |
| Ex. 3-5 | Com. 3 | Com. B | Ethyl 4-methoxybenzoate | TEG DME |
| Ex. 3-6 | Com. 3 | Com. B | Ethyl 4-methoxybenzoate | Isoamyl n-octanoate |
| Ex. 3-7 | Com. 3 | Com. B | Dimethyl phthalate | Dibutyl succinate |
| Ex. 3-8 | Com. 3 | Com. B | Ethyl 4-ethoxybenzoate | TEG MBE |
| Ex. 3-9 | Com. 3 | Com. B | Ethyl 4-ethoxybenzoate | DEG MHE |
| Ex. 3-10 | Com. 3 | Com. B | Ethyl 4-ethoxybenzoate | DEG DBE |
| Ex. 3-11 | Com. 3 | Com. B | Ethyl 4-ethoxybenzoate | TEG DME |
| Ex. 3-12 | Com. 3 | Com. B | Ethyl 4-ethoxybenzoate | Isoamyl n-octanoate |
| Ex. 3-13 | Com. 3 | Com. B | Ethyl 4-ethoxybenzoate | Dibutyl succinate |
| Ex. 3-14 | Com. 3 | Com. B | 2-Ethylhexyl Benzoate | TEG MBE |
| Ex. 3-15 | Com. 3 | Com. B | 2-Ethylhexyl Benzoate | DEG MHE |
| Ex. 3-16 | Com. 3 | Com. B | 2-Ethylhexyl Benzoate | DEG DBE |
| Ex. 3-17 | Com. 3 | Com. B | 2-Ethylhexyl Benzoate | Isoamyl n-octanoate |
| Ex. 3-18 | Com. 3 | Com. B | 2-Ethylhexyl Benzoate | Dibutyl succinate |
| Ex. 3-19 | Com. 3 | Com. B | p-tolyl n-octanoate | TEG MBE |
| Ex. 3-20 | Com. 3 | Com. B | p-tolyl n-octanoate | DEG MHE |
| Ex. 3-21 | Com. 3 | Com. B | p-tolyl n-octanoate | DEG DBE |
| Ex. 3-22 | Com. 3 | Com. B | p-tolyl n-octanoate | Isoamyl n-octanoate |
| Ex. 3-23 | Com. 3 | Com. B | p-tolyl n-octanoate | Dibutyl succinate |

TABLE 5

| | Functional layer material | p-doping material | First solvent | Second solvent |
|---|---|---|---|---|
| Ex. 4-1 | Com. 4 | Com. F | Dimethyl phthalate | TeEG DME |
| Ex. 4-2 | Com. 4 | Com. C | Dimethyl phthalate | TEG MBE |
| Ex. 4-3 | Com. 4 | Com. C | Ethyl 4-methoxybenzoate | DEG MHE |
| Ex. 4-4 | Com. 4 | Com. C | Ethyl 4-methoxybenzoate | DEG DBE |
| Ex. 4-5 | Com. 4 | Com. B | Ethyl 4-methoxybenzoate | TEG DME |
| Ex. 4-6 | Com. 4 | Com. B | Ethyl 4-methoxybenzoate | Isoamyl n-octanoate |
| Ex. 4-7 | Com. 4 | Com. B | Dimethyl phthalate | Dibutyl succinate |
| Ex. 4-8 | Com. 4 | Com. C | Ethyl 4-ethoxybenzoate | TEG MBE |
| Ex. 4-9 | Com. 4 | Com. C | Ethyl 4-ethoxybenzoate | DEG MHE |
| Ex. 4-10 | Com. 4 | Com. C | Ethyl 4-ethoxybenzoate | DEG DBE |

TABLE 5-continued

| | Functional layer material | p-doping material | First solvent | Second solvent |
|---|---|---|---|---|
| Ex. 4-11 | Com. 4 | Com. B | Ethyl 4-ethoxybenzoate | TEG DME |
| Ex. 4-12 | Com. 4 | Com. B | Ethyl 4-ethoxybenzoate | Isoamyl n-octanoate |
| Ex. 4-13 | Com. 4 | Com. B | Ethyl 4-ethoxybenzoate | Dibutyl succinate |
| Ex. 4-14 | Com. 4 | Com. F | 2-Ethylhexyl Benzoate | TEG MBE |
| Ex. 4-15 | Com. 4 | Com. C | 2-Ethylhexyl Benzoate | DEG MHE |
| Ex. 4-16 | Com. 4 | Com. C | 2-Ethylhexyl Benzoate | DEG DBE |
| Ex. 4-17 | Com. 4 | Com. B | 2-Ethylhexyl Benzoate | Isoamyl n-octanoate |
| Ex. 4-18 | Com. 4 | Com. B | 2-Ethylhexyl Benzoate | Dibutyl succinate |
| Ex. 4-19 | Com. 4 | Com. F | p-tolyl n-octanoate | TEG MBE |
| Ex. 4-20 | Com. 4 | Com. C | p-tolyl n-octanoate | DEG MHE |
| Ex. 4-21 | Com. 4 | Com. C | p-tolyl n-octanoate | DEG DBE |
| Ex. 4-22 | Com. 4 | Com. B | p-tolyl n-octanoate | Isoamyl n-octanoate |
| Ex. 4-23 | Com. 4 | Com. B | p-tolyl n-octanoate | Dibutyl succinate |

TABLE 6

| | Functional layer material | p-doping material | First solvent | Second solvent |
|---|---|---|---|---|
| Ex. 5-1 | Com. 5 | Com. C | Dimethyl phthalate | TeEG DME |
| Ex. 5-2 | Com. 5 | Com. B | Dimethyl phthalate | TEG MBE |
| Ex. 5-3 | Com. 5 | Com. B | Ethyl 4-methoxybenzoate | DEG MHE |
| Ex. 5-4 | Com. 5 | Com. B | Ethyl 4-methoxybenzoate | DEG DBE |
| Ex. 5-5 | Com. 5 | Com. B | Ethyl 4-methoxybenzoate | TEG DME |
| Ex. 5-6 | Com. 5 | Com. B | Ethyl 4-methoxybenzoate | Isoamyl n-octanoate |
| Ex. 5-7 | Com. 5 | Com. B | Dimethyl phthalate | Dibutyl succinate |
| Ex. 5-8 | Com. 5 | Com. B | Ethyl 4-ethoxybenzoate | TEG MBE |
| Ex. 5-9 | Com. 5 | Com. B | Ethyl 4-ethoxybenzoate | DEG MHE |
| Ex. 5-10 | Com. 5 | Com. B | Ethyl 4-ethoxybenzoate | DEG DBE |
| Ex. 5-11 | Com. 5 | Com. B | Ethyl 4-ethoxybenzoate | TEG DME |
| Ex. 5-12 | Com. 5 | Com. B | Ethyl 4-ethoxybenzoate | Isoamyl n-octanoate |
| Ex. 5-13 | Com. 5 | Com. B | Ethyl 4-ethoxybenzoate | Dibutyl succinate |
| Ex. 5-14 | Com. 5 | Com. B | 2-Ethylhexyl Benzoate | TEG MBE |
| Ex. 5-15 | Com. 5 | Com. B | 2-Ethylhexyl Benzoate | DEG MHE |
| Ex. 5-16 | Com. 5 | Com. B | 2-Ethylhexyl Benzoate | DEG DBE |
| Ex. 5-17 | Com. 5 | Com. B | 2-Ethylhexyl Benzoate | Isoamyl n-octanoate |
| Ex. 5-18 | Com. 5 | Com. B | 2-Ethylhexyl Benzoate | Dibutyl succinate |
| Ex. 5-19 | Com. 5 | Com. B | p-tolyl n-octanoate | TEG MBE |
| Ex. 5-20 | Com. 5 | Com. B | p-tolyl n-octanoate | DEG MHE |
| Ex. 5-21 | Com. 5 | Com. B | p-tolyl n-octanoate | DEG DBE |
| Ex. 5-22 | Com. 5 | Com. B | p-tolyl n-octanoate | Isoamyl n-octanoate |
| Ex. 5-23 | Com. 5 | Com. B | p-tolyl n-octanoate | Dibutyl succinate |

TABLE 7

| | Functional layer material | p-doping material | First solvent | Second solvent |
|---|---|---|---|---|
| Ex. 6-1 | Com. 6 | Com. F | Dimethyl phthalate | TeEG DME |
| Ex. 6-2 | Com. 6 | Com. C | Dimethyl phthalate | TEG MBE |
| Ex. 6-3 | Com. 6 | Com. C | Ethyl 4-methoxybenzoate | DEG MHE |
| Ex. 6-4 | Com. 6 | Com. C | Ethyl 4-methoxybenzoate | DEG DBE |
| Ex. 6-5 | Com. 6 | Com. B | Ethyl 4-methoxybenzoate | TEG DME |
| Ex. 6-6 | Com. 6 | Com. B | Ethyl 4-methoxybenzoate | Isoamyl n-octanoate |

TABLE 7-continued

| | Functional layer material | p-doping material | First solvent | Second solvent |
|---|---|---|---|---|
| Ex. 6-7 | Com. 6 | Com. B | Dimethyl phthalate | Dibutyl succinate |
| Ex. 6-8 | Com. 6 | Com. C | Ethyl 4-ethoxybenzoate | TEG MBE |
| Ex. 6-9 | Com. 6 | Com. C | Ethyl 4-ethoxybenzoate | DEG MHE |
| Ex. 6-10 | Com. 6 | Com. C | Ethyl 4-ethoxybenzoate | DEG DBE |
| Ex. 6-11 | Com. 6 | Com. B | Ethyl 4-ethoxybenzoate | TEG DME |
| Ex. 6-12 | Com. 6 | Com. B | Ethyl 4-ethoxybenzoate | Isoamyl n-octanoate |
| Ex. 6-13 | Com. 6 | Com. B | Ethyl 4-ethoxybenzoate | Dibutyl succinate |
| Ex. 6-14 | Com. 6 | Com. F | 2-Ethylhexyl Benzoate | TEG MBE |
| Ex. 6-15 | Com. 6 | Com. C | 2-Ethylhexyl Benzoate | DEG MHE |
| Ex. 6-16 | Com. 6 | Com. C | 2-Ethylhexyl Benzoate | DEG DBE |
| Ex. 6-17 | Com. 6 | Com. B | 2-Ethylhexyl Benzoate | Isoamyl n-octanoate |
| Ex. 6-18 | Com. 6 | Com. B | 2-Ethylhexyl Benzoate | Dibutyl succinate |
| Ex. 6-19 | Com. 6 | Com. F | p-tolyl n-octanoate | TEG MBE |
| Ex. 6-20 | Com. 6 | Com. C | p-tolyl n-octanoate | DEG MHE |
| Ex. 6-21 | Com. 6 | Com. C | p-tolyl n-octanoate | DEG DBE |
| Ex. 6-22 | Com. 6 | Com. B | p-tolyl n-octanoate | Isoamyl n-octanoate |
| Ex. 6-23 | Com. 6 | Com. B | p-tolyl n-octanoate | Dibutyl succinate |

Comparative Example 1 to 7

The ink compositions were prepared in the same manner as in Example 1-1, except that only the second solvent was used and each added

TABLE 8

| | Functional layer material | p-doping material | Solvent (single solvent) |
|---|---|---|---|
| Comparative Ex. 1 | Com. 1 | Com. A | TeEG DME |
| Comparative Ex. 2 | Com. 1 | Com. A | TEG MBE |
| Comparative Ex. 3 | Com. 1 | Com. B | DEG MHE |
| Comparative Ex. 4 | Com. 1 | Com. B | DEG DBE |
| Comparative Ex. 5 | Com. 1 | Com. B | TEG DME |
| Comparative Ex. 6 | Com. 1 | Com. C | Isoamyl n-octanoate |
| Comparative Ex. 7 | Com. 1 | Com. C | Dibutyl succinate |

Experimental Example

The properties of the ink compositions prepared in Examples and Comparative Examples were evaluated through the following experiments.

(1) Evaluation of Ink Stability

The ink compositions prepared in Examples and Comparative Examples were stored in a sealed cartridge at 25° C., atmospheric pressure, and general atmospheric conditions for one month. When the ink condition was visually confirmed, it was evaluated according to the following criteria.

O: very stable

X: precipitation of solids, phase separation (2) Evaluation of Discharge Stability The ink compositions prepared in Examples and Comparative Examples were injected into the head of Dimatix Materials Cartridge (Fujifilm), 10 pL of droplets were discharged, and the discharge images visually observed through an equipment camera were evaluated according to the following criteria.

Droplet is stably discharged for 20 minutes or more without shaking: O

Straightness of droplets is slightly inferior: Δ

Droplet does not discharge: X (3) Evaluation of Film Image

The ink compositions prepared in Examples and Comparative Examples were injected into the head of a Dimatix Materials Cartridge (Fujifilm), and ink droplets were discharged by nine drops on each pixel (see FIG. 1). The solvent was then removed by vacuum drying and heat treatment to form a final ink film. The film image (confirmed by optical microscope) and the profile (confirmed by optical profiler, using Zygo device) were observed for the prepared ink film and evaluated as follows.

X: When foreign matters like grains, sparkling dots, white dots, etc. are observed in the pixel (see FIG. 2)

O: When the above case is not observed (see FIG. 3)

(4) Evaluation of Film Flatness

As shown in FIG. 4, the ink compositions prepared in Examples and Comparative Examples were discharged to the pixel area, and the solvent was removed by vacuum drying and heat treatment. Then, the ink film profile was observed (confirmed by the optical profiler, using Zygo device). The ink was formed to a thickness of 20 nm to 150 nm. Next, the value of (Hmax−Hmin)/Hcenter was evaluated as follows.

Less than 0.3: O 0.3 or more and less than 0.5: Δ

0.5 or more: X

The results are shown in Tables 9 to 15 below.

TABLE 9

| 1st solvent: | Evaluation of ink stability/discharge stability | | | | | | Evaluation of film image/film flatness | | | | | |
|---|---|---|---|---|---|---|---|---|---|---|---|---|
| 2nd solvent | 1:99 | 10:90 | 20:80 | 30:70 | 40:60 | 50:50 | 1:90 | 10:90 | 20:80 | 30:70 | 40:60 | 50:50 |
| Ex. 1-1 | O/O | O/O | O/O | O/O | O/O | O/O | X/O | O/O | O/O | O/O | O/O | O/O |
| Ex. 1-2 | O/O | O/O | O/O | O/O | O/O | O/O | X/O | O/O | O/O | O/O | O/O | O/O |
| Ex. 1-3 | O/O | O/O | O/O | O/O | O/O | O/O | X/O | O/O | O/O | O/O | O/Δ | O/Δ |
| Ex. 1-4 | O/O | O/O | O/O | O/O | O/O | O/O | X/O | O/O | O/O | O/O | O/Δ | O/Δ |
| Ex. 1-5 | O/O | O/O | O/O | O/O | O/O | O/O | O/O | O/O | O/O | O/Δ | O/Δ | O/Δ |
| Ex. 1-6 | O/O | O/O | O/O | O/O | O/O | O/O | X/O | O/O | O/O | O/O | O/Δ | O/Δ |
| Ex. 1-7 | O/O | O/O | O/O | O/O | O/O | O/O | O/O | O/O | O/O | O/O | O/O | O/O |
| Ex. 1-8 | O/O | O/O | O/O | O/O | O/O | O/O | X/O | O/O | O/O | O/O | O/O | O/O |
| Ex. 1-9 | O/O | O/O | O/O | O/O | O/O | O/O | X/O | O/O | O/O | O/O | O/Δ | O/Δ |
| Ex. 1-10 | O/O | O/O | O/O | O/O | O/O | O/O | X/O | O/O | O/O | O/O | O/Δ | O/Δ |
| Ex. 1-11 | O/O | O/O | O/O | O/O | O/O | O/O | O/O | O/O | O/O | O/O | O/Δ | O/Δ |
| Ex. 1-12 | O/O | O/O | O/O | O/O | O/O | O/O | X/O | O/O | O/O | O/O | O/Δ | O/Δ |
| Ex. 1-13 | O/O | O/O | O/O | O/O | O/O | O/O | O/O | O/O | O/O | O/O | O/O | O/O |
| Ex. 1-14 | O/O | O/O | O/O | O/O | O/O | O/O | O/O | O/O | O/O | O/O | O/O | O/O |
| Ex. 1-15 | O/O | O/O | O/O | O/O | O/O | O/O | O/O | O/O | O/O | O/O | O/O | O/O |
| Ex. 1-16 | O/O | O/O | O/O | O/O | O/O | O/O | O/O | O/O | O/O | O/O | O/O | O/O |
| Ex. 1-17 | O/O | O/O | O/O | O/O | O/O | O/O | O/O | O/O | O/O | O/O | O/O | O/O |
| Ex. 1-18 | O/O | O/O | O/O | O/O | O/O | O/O | O/O | O/O | O/O | O/O | O/O | O/O |
| Ex. 1-19 | O/O | O/O | O/O | O/O | O/O | O/O | O/O | O/O | O/O | O/O | O/O | O/O |
| Ex. 1-20 | O/O | O/O | O/O | O/O | O/O | O/O | O/O | O/O | O/O | O/O | O/O | O/O |
| Ex. 1-21 | O/O | O/O | O/O | O/O | O/O | O/O | O/O | O/O | O/O | O/O | O/O | O/O |
| Ex. 1-22 | O/O | O/O | O/O | O/O | O/O | O/O | O/O | O/O | O/O | O/O | O/O | O/O |
| Ex. 1-23 | O/O | O/O | O/O | O/O | O/O | O/O | O/O | O/O | O/O | O/O | O/O | O/O |

TABLE 10

| 1st solvent: | Evaluation of ink stability/discharge stability | | | | | | Evaluation of film image/film flatness | | | | | |
|---|---|---|---|---|---|---|---|---|---|---|---|---|
| 2nd solvent | 1:99 | 10:90 | 20:80 | 30:70 | 40:60 | 50:50 | 1:90 | 10:90 | 20:80 | 30:70 | 40:60 | 50:50 |
| Ex. 2-1 | O/O | O/O | O/O | O/O | O/O | O/O | X/O | O/O | O/O | O/O | O/O | O/Δ |
| Ex. 2-2 | O/O | O/O | O/O | O/O | O/O | O/O | X/O | O/O | O/O | O/O | O/O | O/Δ |
| Ex. 2-3 | O/O | O/O | O/O | O/O | O/O | O/O | X/O | O/O | O/O | O/O | O/Δ | O/Δ |
| Ex. 2-4 | O/O | O/O | O/O | O/O | O/O | O/O | X/O | O/O | O/O | O/O | O/Δ | O/Δ |
| Ex. 2-5 | O/O | O/O | O/O | O/O | O/O | O/O | O/O | O/O | O/O | O/Δ | O/Δ | O/Δ |
| Ex. 2-6 | O/O | O/O | O/O | O/O | O/O | O/O | X/O | O/O | O/O | O/O | O/Δ | O/Δ |
| Ex. 2-7 | O/O | O/O | O/O | O/O | O/O | O/O | O/O | O/O | O/O | O/O | O/O | O/O |
| Ex. 2-8 | O/O | O/O | O/O | O/O | O/O | O/O | X/O | O/O | O/O | O/O | O/O | O/Δ |
| Ex. 2-9 | O/O | O/O | O/O | O/O | O/O | O/O | X/O | O/O | O/O | O/O | O/Δ | O/Δ |
| Ex. 2-10 | O/O | O/O | O/O | O/O | O/O | O/O | X/O | O/O | O/O | O/O | O/Δ | O/Δ |
| Ex. 2-11 | O/O | O/O | O/O | O/O | O/O | O/O | O/O | O/O | O/O | O/O | O/Δ | O/Δ |
| Ex. 2-12 | O/O | O/O | O/O | O/O | O/O | O/O | X/O | O/O | O/O | O/O | O/Δ | O/Δ |
| Ex. 2-13 | O/O | O/O | O/O | O/O | O/O | O/O | O/O | O/O | O/O | O/O | O/O | O/O |
| Ex. 2-14 | O/O | O/O | O/O | O/O | O/O | O/O | O/O | O/O | O/O | O/O | O/O | O/O |
| Ex. 2-15 | O/O | O/O | O/O | O/O | O/O | O/O | O/O | O/O | O/O | O/O | O/O | O/O |
| Ex. 2-16 | O/O | O/O | O/O | O/O | O/O | O/O | O/O | O/O | O/O | O/O | O/O | O/O |
| Ex. 2-17 | O/O | O/O | O/O | O/O | O/O | O/O | O/O | O/O | O/O | O/O | O/O | O/O |
| Ex. 2-18 | O/O | O/O | O/O | O/O | O/O | O/O | O/O | O/O | O/O | O/O | O/O | O/O |
| Ex. 2-19 | O/O | O/O | O/O | O/O | O/O | O/O | O/O | O/O | O/O | O/O | O/O | O/O |
| Ex. 2-20 | O/O | O/O | O/O | O/O | O/O | O/O | O/O | O/O | O/O | O/O | O/O | O/O |

TABLE 10-continued

| 1st solvent: | Evaluation of ink stability/discharge stability | | | | | | Evaluation of film image/film flatness | | | | | |
|---|---|---|---|---|---|---|---|---|---|---|---|---|
| 2nd solvent | 1:99 | 10:90 | 20:80 | 30:70 | 40:60 | 50:50 | 1:90 | 10:90 | 20:80 | 30:70 | 40:60 | 50:50 |
| Ex. 2-21 | O/O | O/O | O/O | O/O | O/O | O/O | O/O | O/O | O/O | O/O | O/O | O/O |
| Ex. 2-22 | O/O | O/O | O/O | O/O | O/O | O/O | O/O | O/O | O/O | O/O | O/O | O/O |
| Ex. 2-23 | O/O | O/O | O/O | O/O | O/O | O/O | O/O | O/O | O/O | O/O | O/O | O/O |

TABLE 11

| 1st solvent: | Evaluation of ink stability/discharge stability | | | | | | Evaluation of film image/film flatness | | | | | |
|---|---|---|---|---|---|---|---|---|---|---|---|---|
| 2nd solvent | 1:99 | 10:90 | 20:80 | 30:70 | 40:60 | 50:50 | 1:90 | 10:90 | 20:80 | 30:70 | 40:60 | 50:50 |
| Ex. 3-1 | O/O | O/O | O/O | O/O | O/O | O/O | X/O | O/O | O/O | O/O | O/O | O/O |
| Ex. 3-2 | O/O | O/O | O/O | O/O | O/O | O/O | X/O | O/O | O/O | O/O | O/O | O/O |
| Ex. 3-3 | O/O | O/O | O/O | O/O | O/O | O/O | X/O | O/O | O/O | O/O | O/Δ | O/Δ |
| Ex. 3-4 | O/O | O/O | O/O | O/O | O/O | O/O | X/O | O/O | O/O | O/O | O/Δ | O/Δ |
| Ex. 3-5 | O/O | O/O | O/O | O/O | O/O | O/O | O/O | O/O | O/O | O/Δ | O/Δ | O/Δ |
| Ex. 3-6 | O/O | O/O | O/O | O/O | O/O | O/O | X/O | O/O | O/O | O/O | O/Δ | O/Δ |
| Ex. 3-7 | O/O | O/O | O/O | O/O | O/O | O/O | O/O | O/O | O/O | O/O | O/O | O/O |
| Ex. 3-8 | O/O | O/O | O/O | O/O | O/O | O/O | X/O | O/O | O/O | O/O | O/O | O/O |
| Ex. 3-9 | O/O | O/O | O/O | O/O | O/O | O/O | X/O | O/O | O/O | O/O | O/Δ | O/Δ |
| Ex. 3-10 | O/O | O/O | O/O | O/O | O/O | O/O | X/O | O/O | O/O | O/O | O/Δ | O/Δ |
| Ex. 3-11 | O/O | O/O | O/O | O/O | O/O | O/O | O/O | O/O | O/O | O/O | O/Δ | O/Δ |
| Ex. 3-12 | O/O | O/O | O/O | O/O | O/O | O/O | X/O | O/O | O/O | O/O | O/Δ | O/Δ |
| Ex. 3-13 | O/O | O/O | O/O | O/O | O/O | O/O | O/O | O/O | O/O | O/O | O/O | O/O |
| Ex. 3-14 | O/O | O/O | O/O | O/O | O/O | O/O | O/O | O/O | O/O | O/O | O/O | O/O |
| Ex. 3-15 | O/O | O/O | O/O | O/O | O/O | O/O | O/O | O/O | O/O | O/O | O/O | O/O |
| Ex. 3-16 | O/O | O/O | O/O | O/O | O/O | O/O | O/O | O/O | O/O | O/O | O/O | O/O |
| Ex. 3-17 | O/O | O/O | O/O | O/O | O/O | O/O | O/O | O/O | O/O | O/O | O/O | O/O |
| Ex. 3-18 | O/O | O/O | O/O | O/O | O/O | O/O | O/O | O/O | O/O | O/O | O/O | O/O |
| Ex. 3-19 | O/O | O/O | O/O | O/O | O/O | O/O | O/O | O/O | O/O | O/O | O/O | O/O |
| Ex. 3-20 | O/O | O/O | O/O | O/O | O/O | O/O | O/O | O/O | O/O | O/O | O/O | O/O |
| Ex. 3-21 | O/O | O/O | O/O | O/O | O/O | O/O | O/O | O/O | O/O | O/O | O/O | O/O |
| Ex. 3-22 | O/O | O/O | O/O | O/O | O/O | O/O | O/O | O/O | O/O | O/O | O/O | O/O |
| Ex. 3-23 | O/O | O/O | O/O | O/O | O/O | O/O | O/O | O/O | O/O | O/O | O/O | O/O |

TABLE 12

| 1st solvent: | Evaluation of ink stability/discharge stability | | | | | | Evaluation of film image/film flatness | | | | | |
|---|---|---|---|---|---|---|---|---|---|---|---|---|
| 2nd solvent | 1:99 | 10:90 | 20:80 | 30:70 | 40:60 | 50:50 | 1:90 | 10:90 | 20:80 | 30:70 | 40:60 | 50:50 |
| Ex. 4-1 | O/O | O/O | O/O | O/O | O/O | O/O | X/O | O/O | O/O | O/O | O/O | O/O |
| Ex. 4-2 | O/O | O/O | O/O | O/O | O/O | O/O | X/O | O/O | O/O | O/O | O/O | O/O |
| Ex. 4-3 | O/O | O/O | O/O | O/O | O/O | O/O | X/O | O/O | O/O | O/O | O/Δ | O/Δ |
| Ex. 4-4 | O/O | O/O | O/O | O/O | O/O | O/O | X/O | O/O | O/O | O/O | O/Δ | O/Δ |
| Ex. 4-5 | O/O | O/O | O/O | O/O | O/O | O/O | O/O | O/O | O/O | O/Δ | O/Δ | O/Δ |
| Ex. 4-6 | O/O | O/O | O/O | O/O | O/O | O/O | X/O | O/O | O/O | O/O | O/Δ | O/Δ |
| Ex. 4-7 | O/O | O/O | O/O | O/O | O/O | O/O | O/O | O/O | O/O | O/O | O/O | O/O |
| Ex. 4-8 | O/O | O/O | O/O | O/O | O/O | O/O | X/O | O/O | O/O | O/O | O/O | O/O |
| Ex. 4-9 | O/O | O/O | O/O | O/O | O/O | O/O | X/O | O/O | O/O | O/O | O/Δ | O/Δ |
| Ex. 4-10 | O/O | O/O | O/O | O/O | O/O | O/O | X/O | O/O | O/O | O/O | O/Δ | O/Δ |
| Ex. 4-11 | O/O | O/O | O/O | O/O | O/O | O/O | O/O | O/O | O/O | O/O | O/Δ | O/Δ |
| Ex. 4-12 | O/O | O/O | O/O | O/O | O/O | O/O | X/O | O/O | O/O | O/O | O/Δ | O/Δ |
| Ex. 4-13 | O/O | O/O | O/O | O/O | O/O | O/O | O/O | O/O | O/O | O/O | O/O | O/O |
| Ex. 4-14 | O/O | O/O | O/O | O/O | O/O | O/O | O/O | O/O | O/O | O/O | O/O | O/O |
| Ex. 4-15 | O/O | O/O | O/O | O/O | O/O | O/O | O/O | O/O | O/O | O/O | O/O | O/O |
| Ex. 4-16 | O/O | O/O | O/O | O/O | O/O | O/O | O/O | O/O | O/O | O/O | O/O | O/O |
| Ex. 4-17 | O/O | O/O | O/O | O/O | O/O | O/O | O/O | O/O | O/O | O/O | O/O | O/O |
| Ex. 4-18 | O/O | O/O | O/O | O/O | O/O | O/O | O/O | O/O | O/O | O/O | O/O | O/O |
| Ex. 4-19 | O/O | O/O | O/O | O/O | O/O | O/O | O/O | O/O | O/O | O/O | O/O | O/O |
| Ex. 4-20 | O/O | O/O | O/O | O/O | O/O | O/O | O/O | O/O | O/O | O/O | O/O | O/O |
| Ex. 4-21 | O/O | O/O | O/O | O/O | O/O | O/O | O/O | O/O | O/O | O/O | O/O | O/O |
| Ex. 4-22 | O/O | O/O | O/O | O/O | O/O | O/O | O/O | O/O | O/O | O/O | O/O | O/O |
| Ex. 4-23 | O/O | O/O | O/O | O/O | O/O | O/O | O/O | O/O | O/O | O/O | O/O | O/O |

TABLE 13

| 1st solvent: 2nd solvent | Evaluation of ink stability/discharge stability | | | | | | Evaluation of film image/film flatness | | | | | |
|---|---|---|---|---|---|---|---|---|---|---|---|---|
| | 1:99 | 10:90 | 20:80 | 30:70 | 40:60 | 50:50 | 1:90 | 10:90 | 20:80 | 30:70 | 40:60 | 50:50 |
| Ex. 5-1 | O/O | O/O | O/O | O/O | O/O | O/O | X/O | O/O | O/O | O/O | O/O | O/O |
| Ex. 5-2 | O/O | O/O | O/O | O/O | O/O | O/O | X/O | O/O | O/O | O/O | O/O | O/O |
| Ex. 5-3 | O/O | O/O | O/O | O/O | O/O | O/O | X/O | O/O | O/O | O/O | O/Δ | O/Δ |
| Ex. 5-4 | O/O | O/O | O/O | O/O | O/O | O/O | X/O | O/O | O/O | O/O | O/Δ | O/Δ |
| Ex. 5-5 | O/O | O/O | O/O | O/O | O/O | O/O | O/O | O/O | O/O | O/Δ | O/Δ | O/Δ |
| Ex. 5-6 | O/O | O/O | O/O | O/O | O/O | O/O | X/O | O/O | O/O | O/O | O/Δ | O/Δ |
| Ex. 5-7 | O/O | O/O | O/O | O/O | O/O | O/O | O/O | O/O | O/O | O/O | O/O | O/O |
| Ex. 5-8 | O/O | O/O | O/O | O/O | O/O | O/O | X/O | O/O | O/O | O/O | O/O | O/O |
| Ex. 5-9 | O/O | O/O | O/O | O/O | O/O | O/O | X/O | O/O | O/O | O/O | O/Δ | O/Δ |
| Ex. 5-10 | O/O | O/O | O/O | O/O | O/O | O/O | X/O | O/O | O/O | O/O | O/Δ | O/Δ |
| Ex. 5-11 | O/O | O/O | O/O | O/O | O/O | O/O | O/O | O/O | O/O | O/O | O/Δ | O/Δ |
| Ex. 5-12 | O/O | O/O | O/O | O/O | O/O | O/O | X/O | O/O | O/O | O/O | O/Δ | O/Δ |
| Ex. 5-13 | O/O | O/O | O/O | O/O | O/O | O/O | O/O | O/O | O/O | O/O | O/O | O/O |
| Ex. 5-14 | O/O | O/O | O/O | O/O | O/O | O/O | O/O | O/O | O/O | O/O | O/O | O/O |
| Ex. 5-15 | O/O | O/O | O/O | O/O | O/O | O/O | O/O | O/O | O/O | O/O | O/O | O/O |
| Ex. 5-16 | O/O | O/O | O/O | O/O | O/O | O/O | O/O | O/O | O/O | O/O | O/O | O/O |
| Ex. 5-17 | O/O | O/O | O/O | O/O | O/O | O/O | O/O | O/O | O/O | O/O | O/O | O/O |
| Ex. 5-18 | O/O | O/O | O/O | O/O | O/O | O/O | O/O | O/O | O/O | O/O | O/O | O/O |
| Ex. 5-19 | O/O | O/O | O/O | O/O | O/O | O/O | O/O | O/O | O/O | O/O | O/O | O/O |
| Ex. 5-20 | O/O | O/O | O/O | O/O | O/O | O/O | O/O | O/O | O/O | O/O | O/O | O/O |
| Ex. 5-21 | O/O | O/O | O/O | O/O | O/O | O/O | O/O | O/O | O/O | O/O | O/O | O/O |
| Ex. 5-22 | O/O | O/O | O/O | O/O | O/O | O/O | O/O | O/O | O/O | O/O | O/O | O/O |
| Ex. 5-23 | O/O | O/O | O/O | O/O | O/O | O/O | O/O | O/O | O/O | O/O | O/O | O/O |

TABLE 14

| 1st solvent: 2nd solvent | Evaluation of ink stability/discharge stability | | | | | | Evaluation of film image/film flatness | | | | | |
|---|---|---|---|---|---|---|---|---|---|---|---|---|
| | 1:99 | 10:90 | 20:80 | 30:70 | 40:60 | 50:50 | 1:90 | 10:90 | 20:80 | 30:70 | 40:60 | 50:50 |
| Ex. 6-1 | O/O | O/O | O/O | O/O | O/O | O/O | X/O | O/O | O/O | O/O | O/O | O/Δ |
| Ex. 6-2 | O/O | O/O | O/O | O/O | O/O | O/O | O/X | O/O | O/O | O/O | O/O | O/Δ |
| Ex. 6-3 | O/O | O/O | O/O | O/O | O/O | O/O | X/O | O/O | O/O | O/O | O/Δ | O/Δ |
| Ex. 6-4 | O/O | O/O | O/O | O/O | O/O | O/O | X/O | O/O | O/O | O/O | O/Δ | O/Δ |
| Ex. 6-5 | O/O | O/O | O/O | O/O | O/O | O/O | O/O | O/O | O/O | O/Δ | O/Δ | O/Δ |
| Ex. 6-6 | O/O | O/O | O/O | O/O | O/O | O/O | X/O | O/O | O/O | O/O | O/Δ | O/Δ |
| Ex. 6-7 | O/O | O/O | O/O | O/O | O/O | O/O | O/O | O/O | O/O | O/O | O/O | O/O |
| Ex. 6-8 | O/O | O/O | O/O | O/O | O/O | O/O | X/O | O/O | O/O | O/O | O/O | O/Δ |
| Ex. 6-9 | O/O | O/O | O/O | O/O | O/O | O/O | X/O | O/O | O/O | O/O | O/Δ | O/Δ |
| Ex. 6-10 | O/O | O/O | O/O | O/O | O/O | O/O | X/O | O/O | O/O | O/O | O/Δ | O/Δ |
| Ex. 6-11 | O/O | O/O | O/O | O/O | O/O | O/O | O/O | O/O | O/O | O/O | O/Δ | O/Δ |
| Ex. 6-12 | O/O | O/O | O/O | O/O | O/O | O/O | X/O | O/O | O/O | O/O | O/Δ | O/Δ |
| Ex. 6-13 | O/O | O/O | O/O | O/O | O/O | O/O | O/O | O/O | O/O | O/O | O/O | O/O |
| Ex. 6-14 | O/O | O/O | O/O | O/O | O/O | O/O | O/O | O/O | O/O | O/O | O/O | O/O |
| Ex. 6-15 | O/O | O/O | O/O | O/O | O/O | O/O | O/O | O/O | O/O | O/O | O/O | O/O |
| Ex. 6-16 | O/O | O/O | O/O | O/O | O/O | O/O | O/O | O/O | O/O | O/O | O/O | O/Δ |
| Ex. 6-17 | O/O | O/O | O/O | O/O | O/O | O/O | O/O | O/O | O/O | O/O | O/O | O/Δ |
| Ex. 6-18 | O/O | O/O | O/O | O/O | O/O | O/O | O/O | O/O | O/O | O/O | O/O | O/O |
| Ex. 6-19 | O/O | O/O | O/O | O/O | O/O | O/O | O/O | O/O | O/O | O/O | O/O | O/O |
| Ex. 6-20 | O/O | O/O | O/O | O/O | O/O | O/O | O/O | O/O | O/O | O/O | O/O | O/O |
| Ex. 6-21 | O/O | O/O | O/O | O/O | O/O | O/O | O/O | O/O | O/O | O/O | O/O | O/O |
| Ex. 6-22 | O/O | O/O | O/O | O/O | O/O | O/O | O/O | O/O | O/O | O/O | O/O | O/Δ |
| Ex. 6-23 | O/O | O/O | O/O | O/O | O/O | O/O | O/O | O/O | O/O | O/O | O/O | O/Δ |

TABLE 15

| | Evaluation of ink stability | Evaluation of discharge stability | Evaluation of film image | Evaluation of film flatness |
|---|---|---|---|---|
| Comparative Ex. 1 | O | O | X | O |
| Comparative Ex. 2 | O | O | X | O |
| Comparative Ex. 3 | O | O | X | O |
| Comparative Ex. 4 | O | O | X | O |
| Comparative Ex. 5 | O | O | X | O |
| Comparative Ex. 6 | O | O | X | O |
| Comparative Ex. 7 | O | O | X | O |

The invention claimed is:

1. An ink composition for an organic light emitting device, comprising:

1) a compound represented by Chemical Formula 1, 2) a first solvent selected from the group consisting of ethyl 4-methoxybenzoate, ethyl 4-ethoxybenzoate, p-tolyl n-octanoate, and 2-ethylhexyl benzoate, and 3) A second solvent of a compound represented by Chemical Formula 3-3, wherein the boiling point of the first solvent is higher than that of the second solvent, and the weight ratio of the first solvent and the second solvent is 10:90 to 50:50:

[Chemical Formula 1]

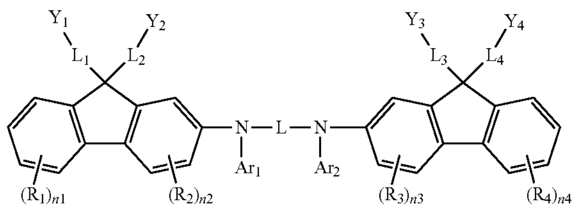

wherein, in Chemical Formula 1,

L and $L_1$ to $L_4$ are each independently a substituted or unsubstituted $C_{1-60}$ alkylene; or a substituted or unsubstituted $C_{6-60}$ arylene, $Ar_1$ and $Ar_2$ are each independently a substituted or unsubstituted $C_{6-60}$ aryl; or a substituted or unsubstituted $C_2$-60 heteroaryl containing one or more heteroatoms selected from the group consisting of N, O and S, and $R_1$ to $R_4$ are each independently hydrogen, deuterium, a substituted or unsubstituted $C_{1-60}$ alkyl, a substituted or unsubstituted $C_{1-60}$ alkoxy, a substituted or unsubstituted $C_{6-60}$ aryl, or a substituted or unsubstituted $C_{2-60}$ heteroaryl containing one or more heteroatoms selected from the group consisting of N, O and S, $Y_1$ to $Y_4$ are each independently hydrogen, or —X-A, with the proviso that at least two of $Y_1$ to $Y_4$ are —X-A, X is a single bond, O, or S, A is a functional group that can be crosslinked by heat or light, n1 and n4 are each independently an integer of 0 to 4, and n2 and n3 are each independently an integer of 0 to 3,

[Chemical Formula 3-3]

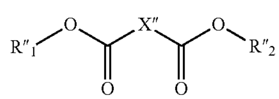

wherein, in Chemical Formula 3-3, $R''_1$ is hydrogen or $C_{1-15}$ alkyl, $R''_2$ is hydrogen or $C_{1-15}$ alkyl, and X" is $C_{1-10}$ alkylene.

2. The ink composition of claim 1, wherein

A is any one selected from the group consisting of the following:

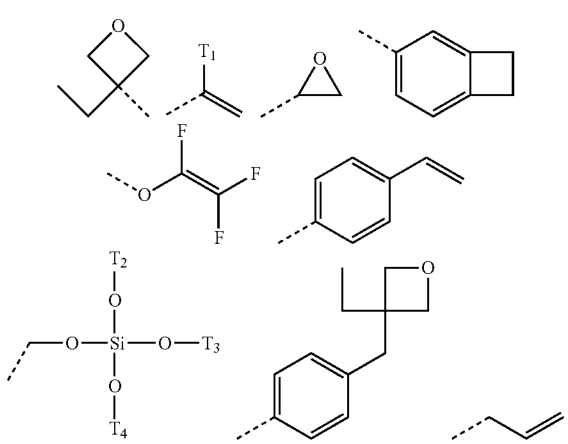

-continued

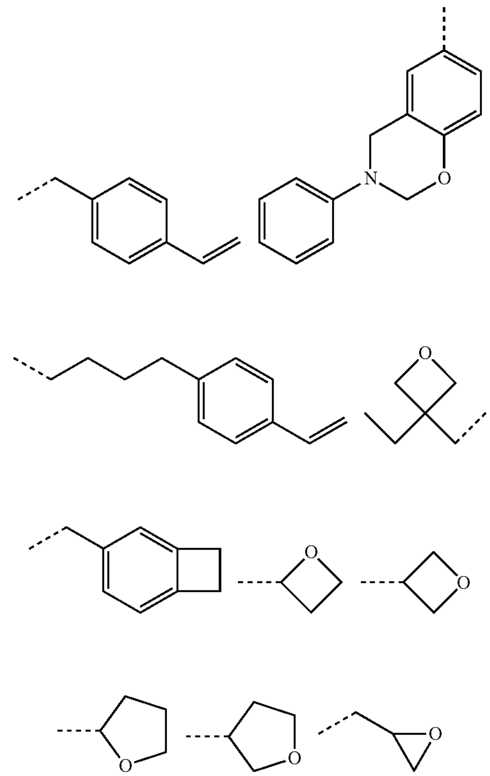

wherein, $T_1$ is hydrogen; or a substituted or unsubstituted $C_{1-6}$ alkyl, and $T_2$ to $T_4$ are each independently a substituted or unsubstituted $C_{1-6}$ alkyl.

3. The ink composition of claim 1, wherein

L is any one selected from the group consisting of the following:

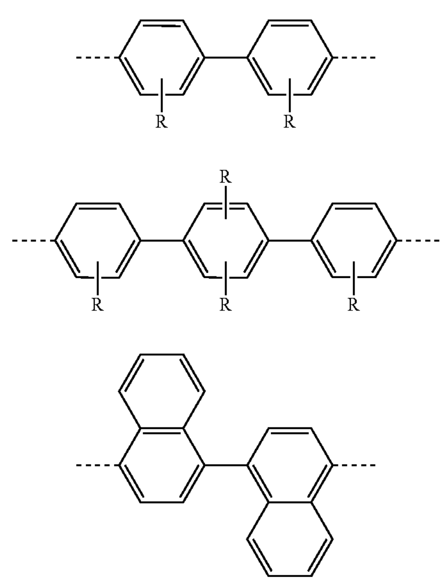

-continued

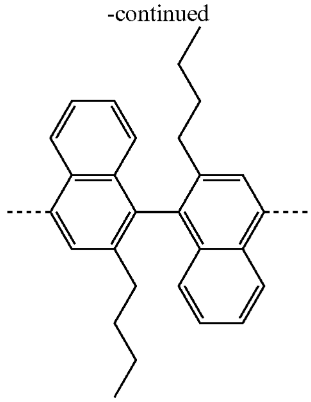

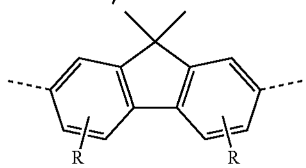

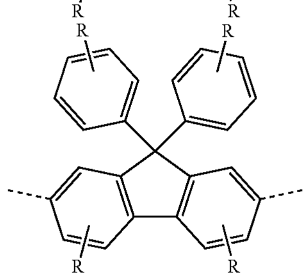

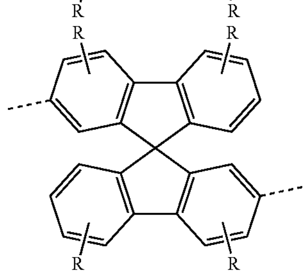

wherein, each R is independently hydrogen, or $C_{1-10}$ alkyl.

4. The ink composition of claim 1, wherein $L_1$ to $L_4$ are each independently $C_{1-10}$ alkylene, or the following Chemical Formula 1-A or 1-B:

[Chemical Formula 1-A]

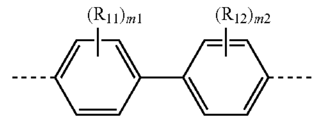

[Chemical Formula 1-B]

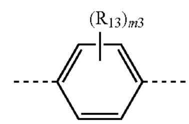

wherein, in Chemical Formulas 1-A and 1-B, $R_{11}$ to $R_{13}$ are each independently hydrogen, deuterium, a substituted or unsubstituted $C_{1-60}$ alkyl, a substituted or unsubstituted $C_{1-60}$ alkoxy, a substituted or unsubstituted $C_{6-60}$ aryl, or a substituted or unsubstituted $C_{2-60}$ heteroaryl containing any one or more heteroatoms selected from the group consisting of —N, O and S, and m1 to m3 are each an integer of 0 to 4.

5. The ink composition of claim 1, wherein $Ar_1$ and $Ar_2$ are the same as each other, and are phenyl, biphenylyl, naphthyl, phenanthrenyl, dimethylfluorenyl, or diphenylfluorenyl.

6. The ink composition of claim 1, wherein the compound represented by Chemical Formula 1 is any one selected from the group consisting of the following:

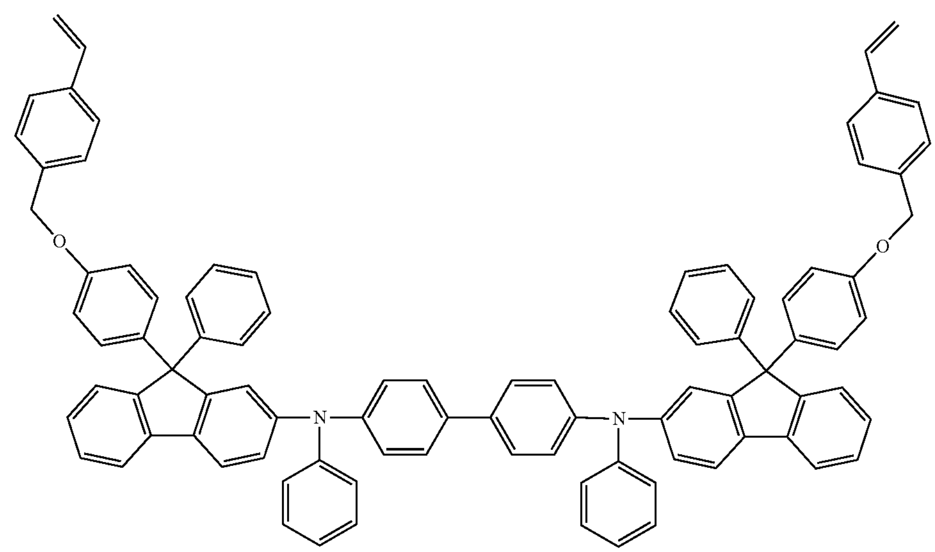

-continued
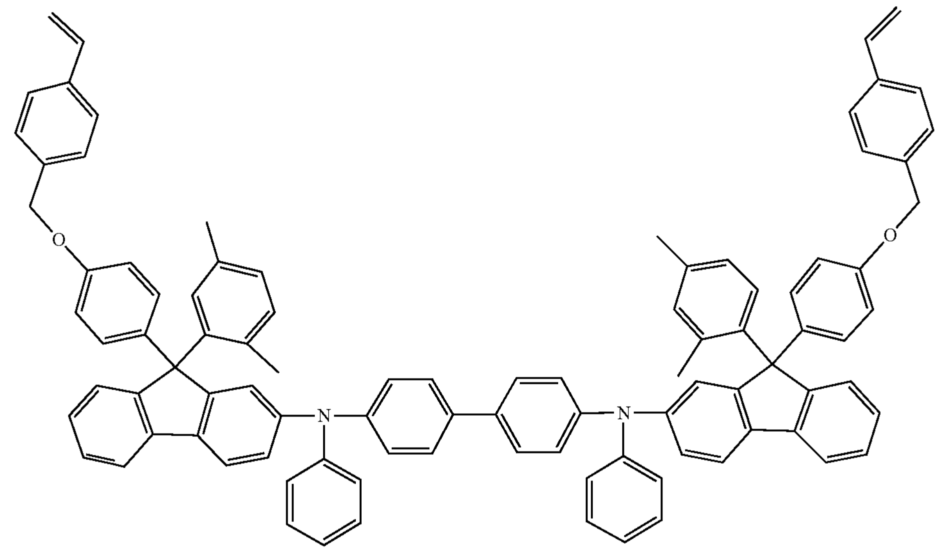
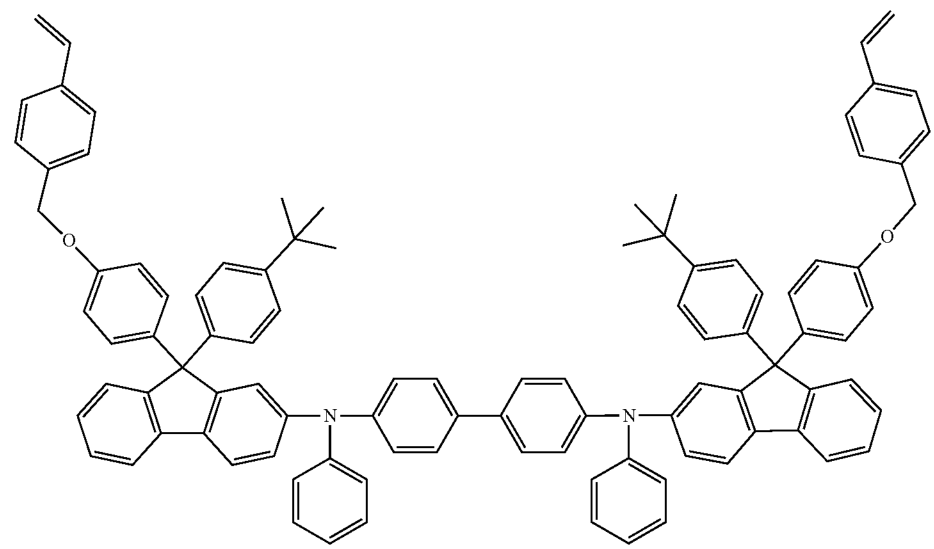
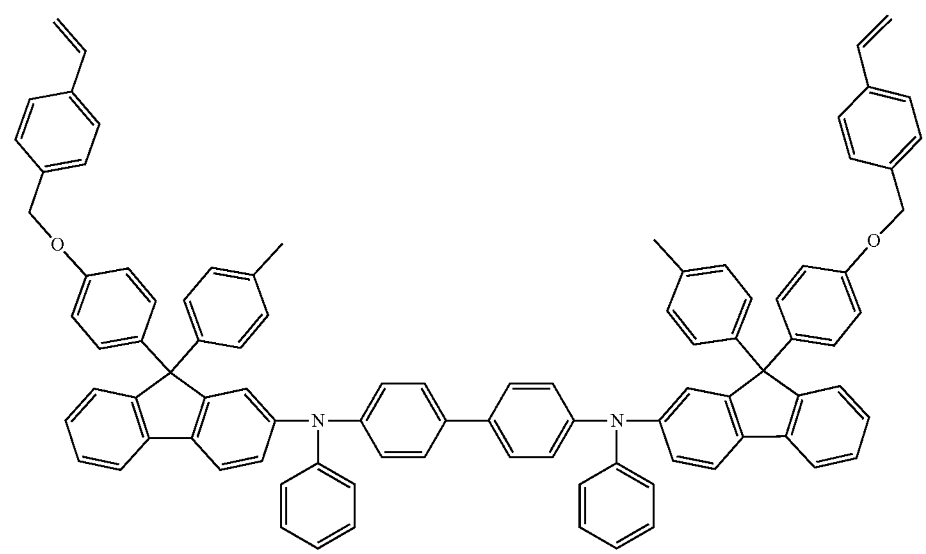

-continued
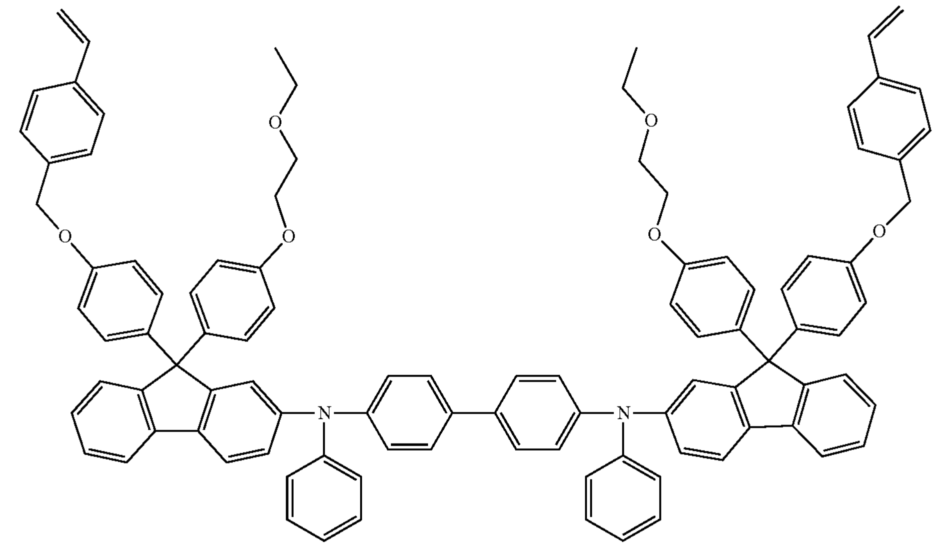
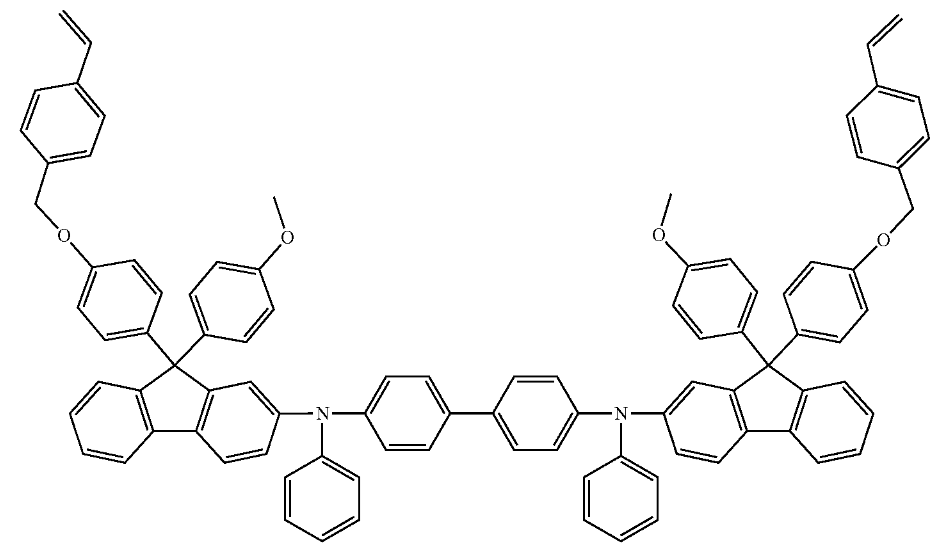
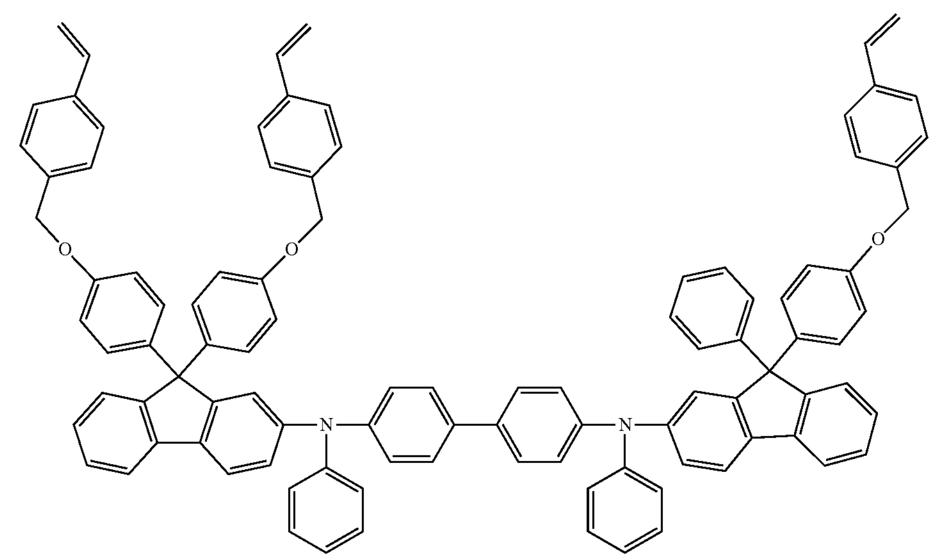

-continued
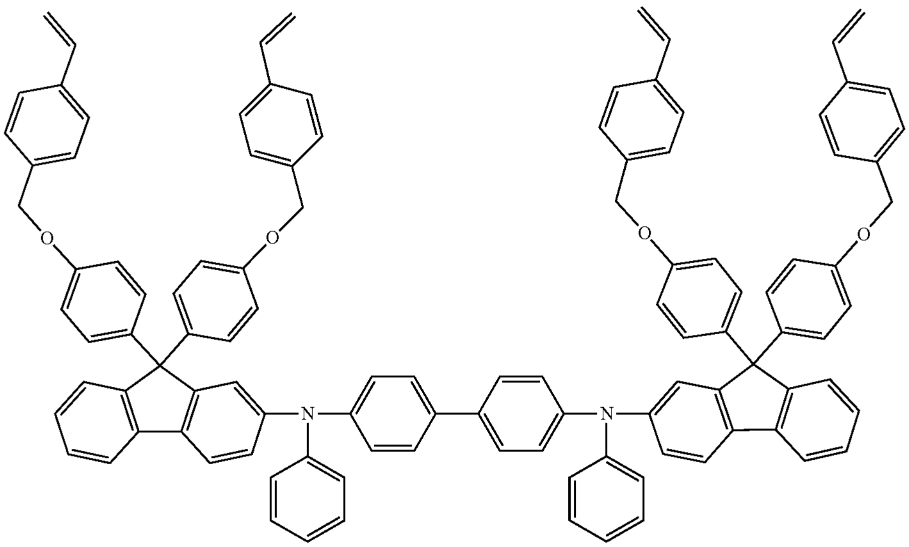
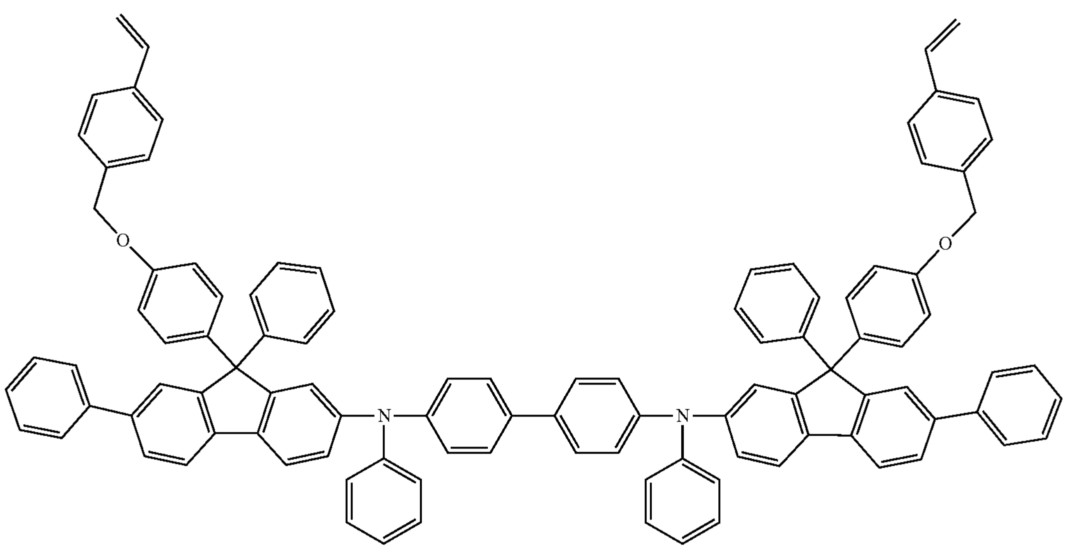

-continued
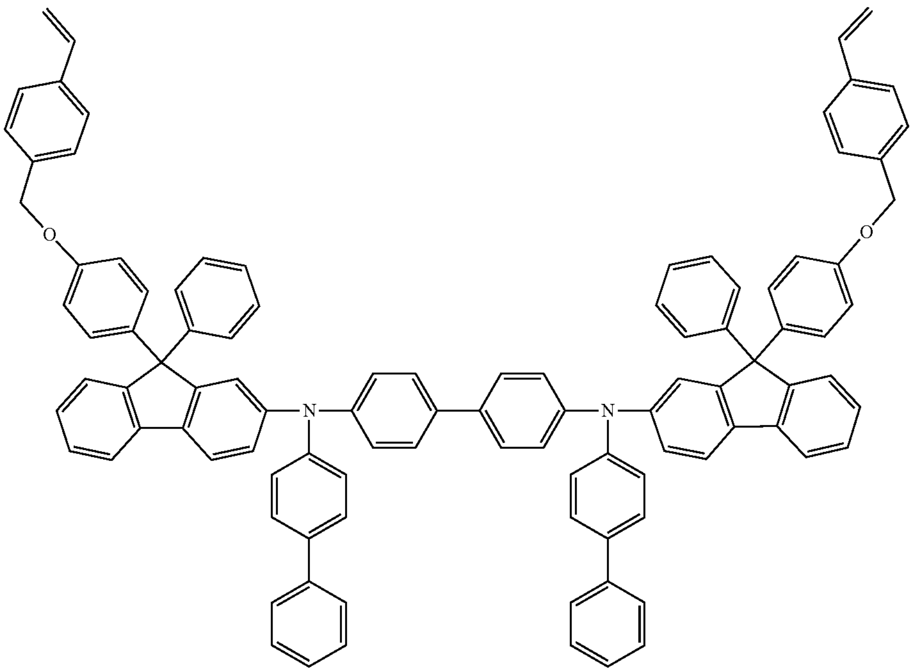
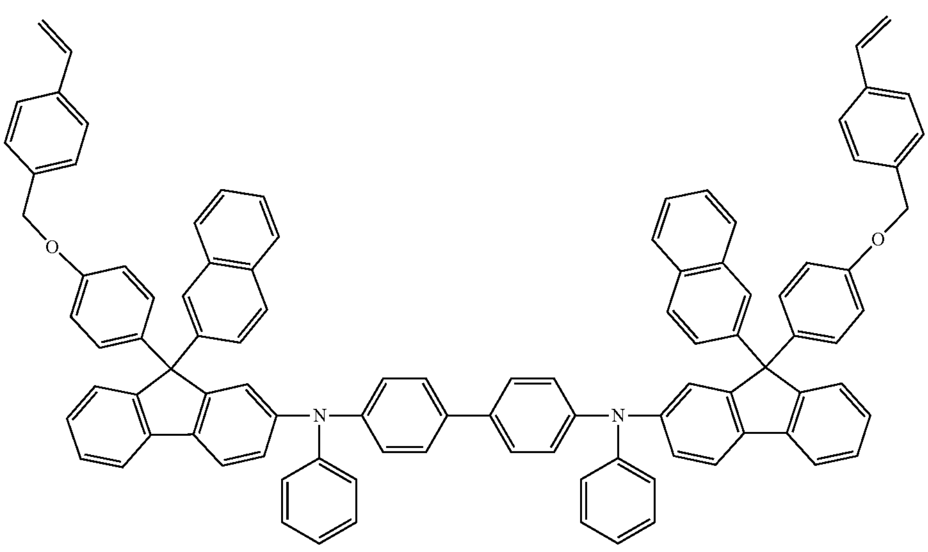

-continued
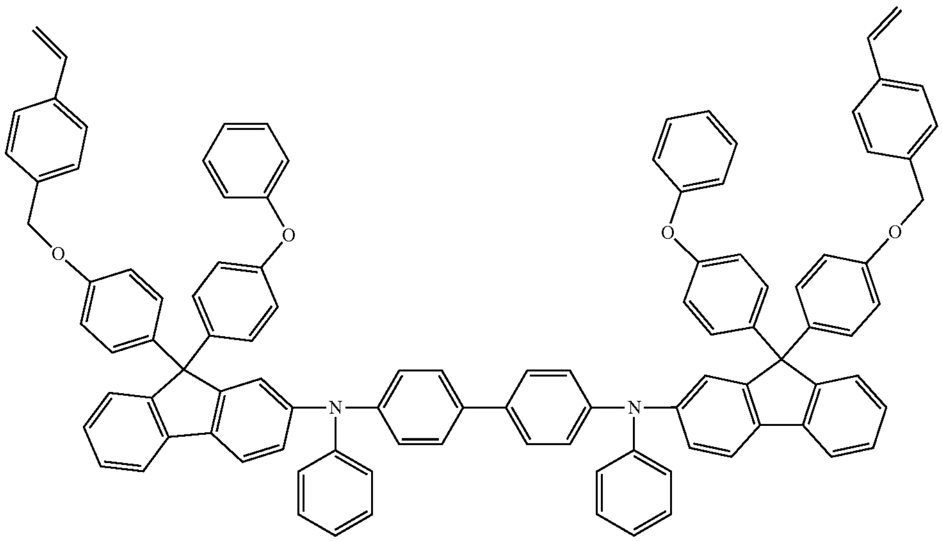
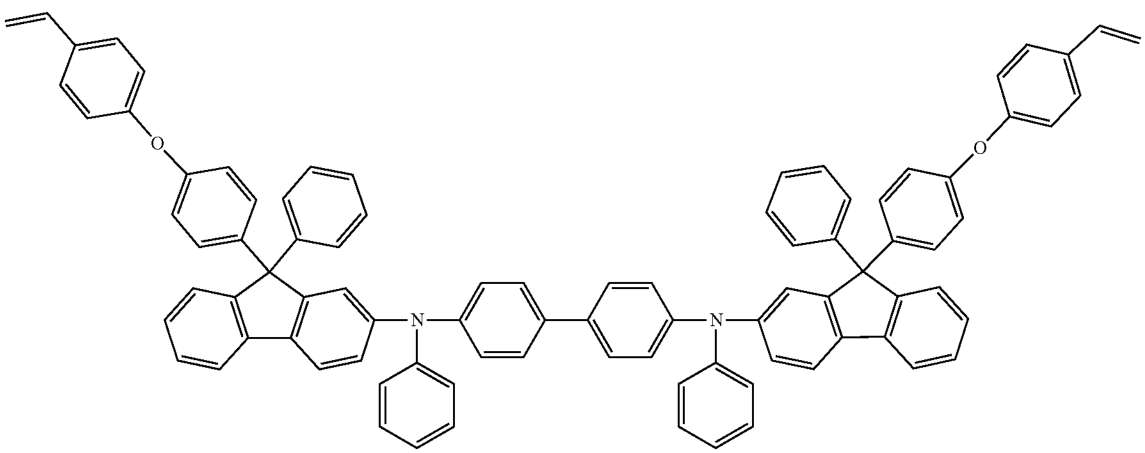
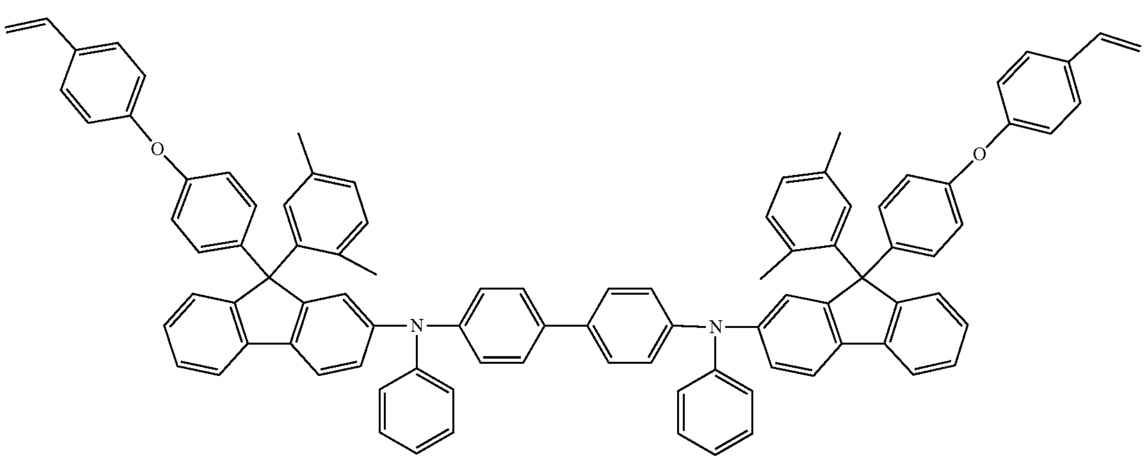

-continued
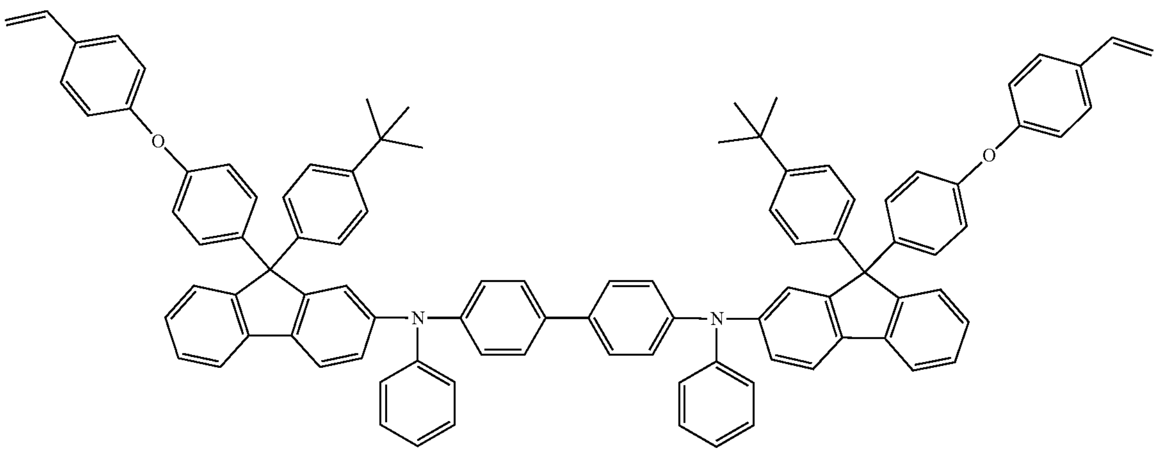
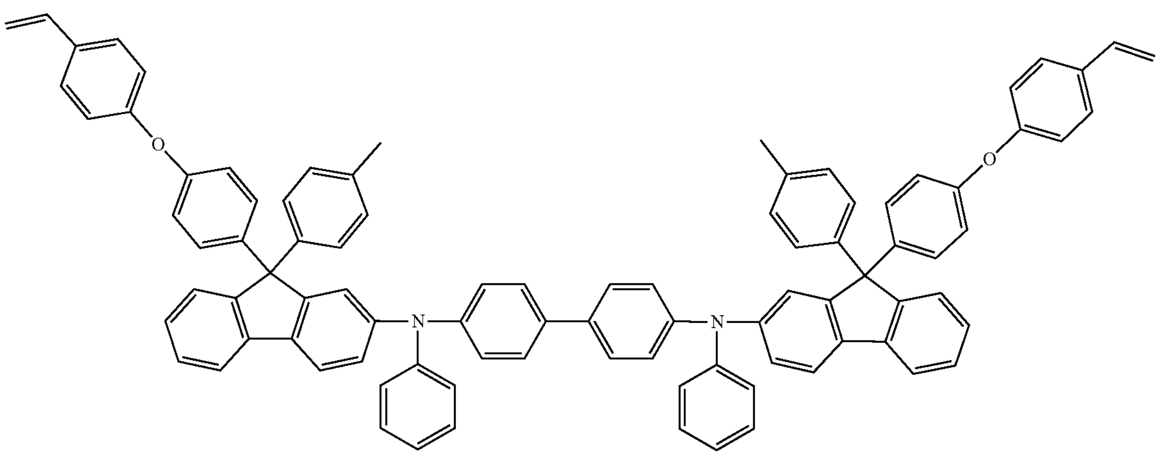
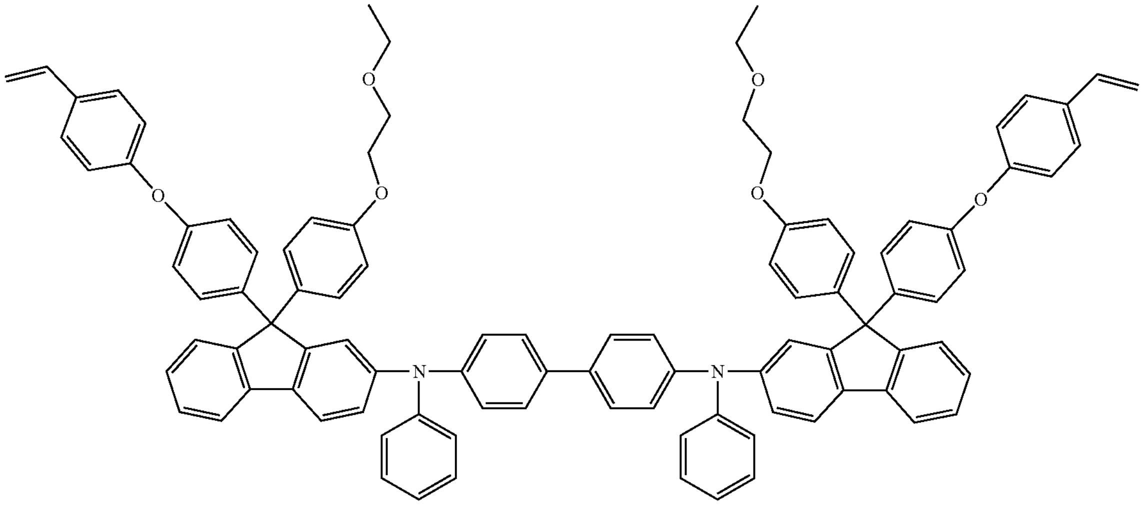

-continued
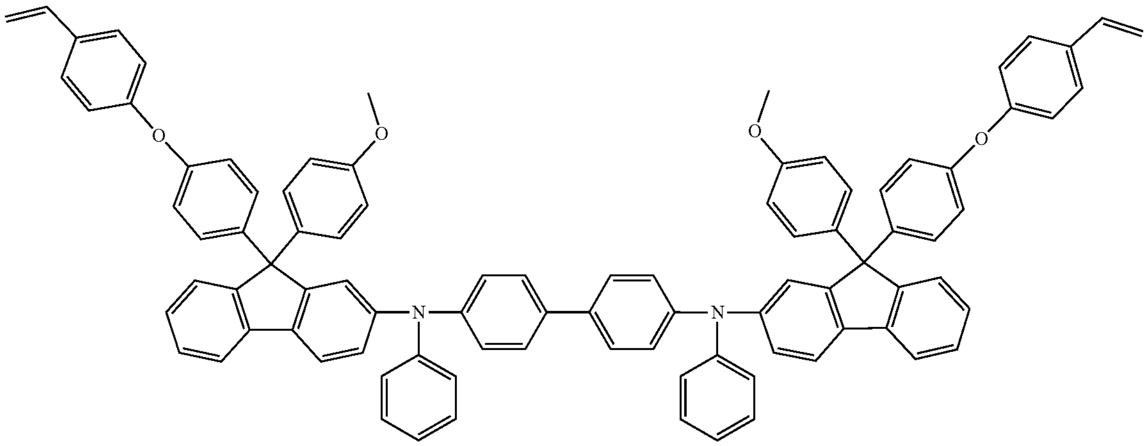
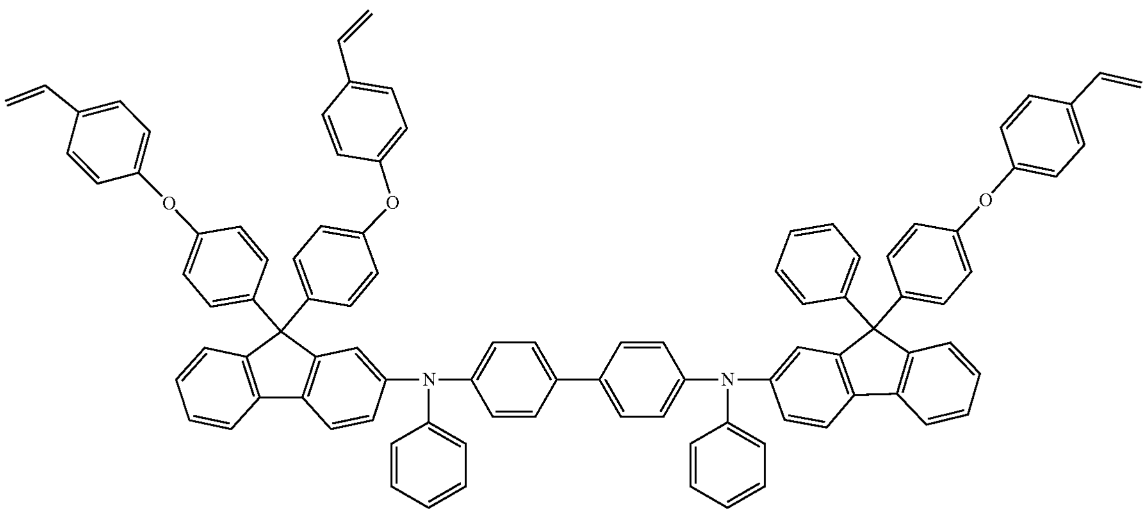
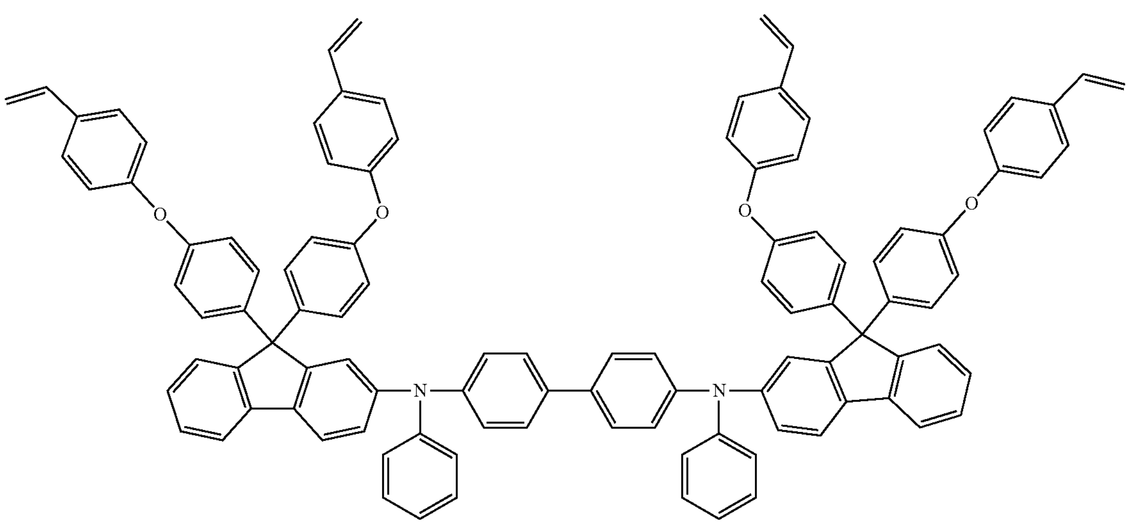

-continued
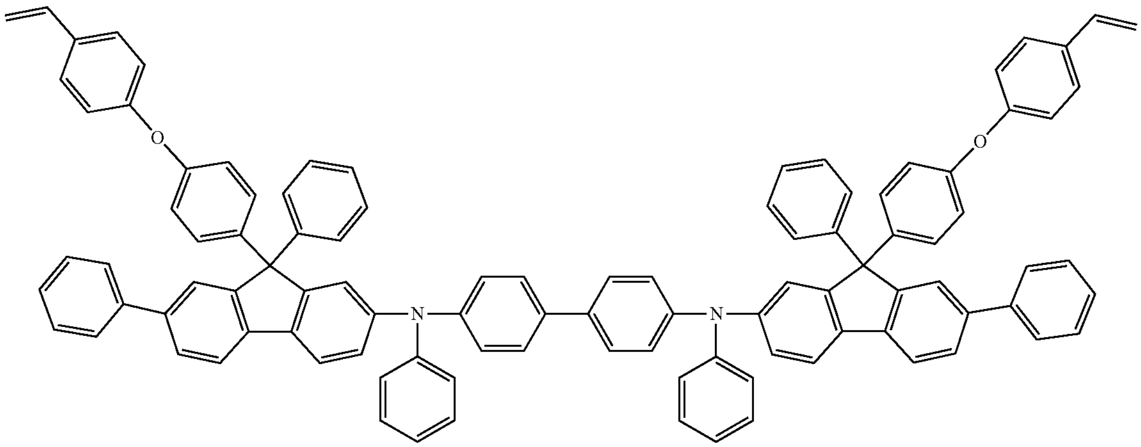
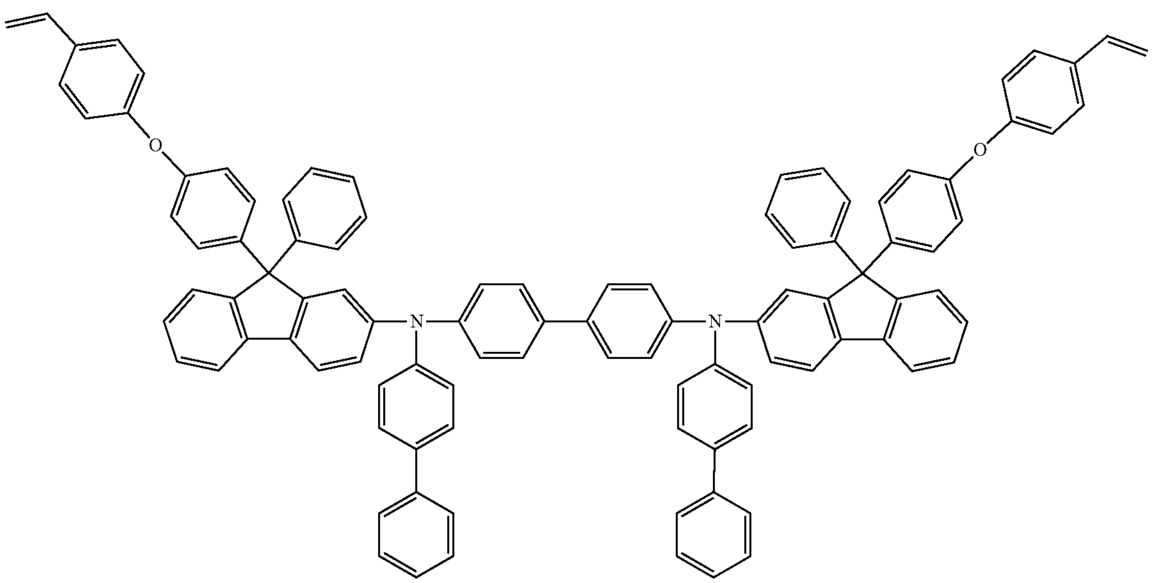
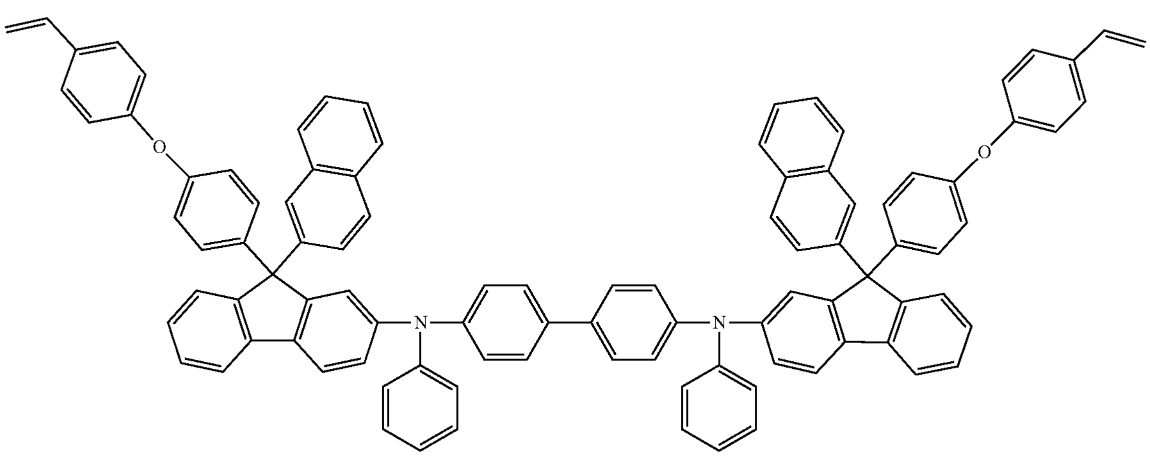

-continued
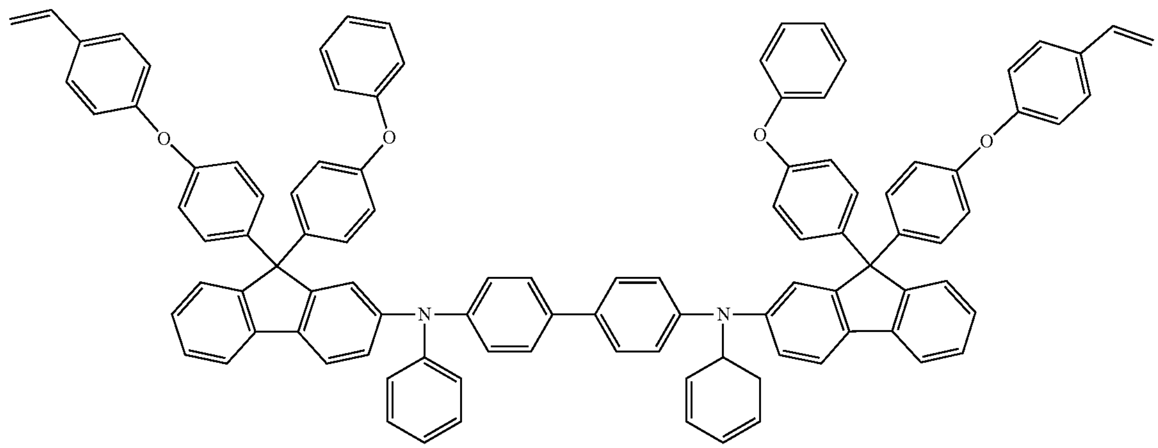 [SMILES: C=Cc1ccc(Oc2ccc(C3(c4ccc(Oc5ccccc5)cc4)c4ccccc4-c4ccc(N(c5ccccc5)c5ccc(-c6ccc(N(c7ccc8c(c7)C(c7ccc(Oc9ccccc9)cc7)(c7ccc(Oc9ccc(C=C)cc9)cc7)c7ccccc7-8)C7C=CC=CC7)cc6)cc5)cc43)cc2)cc1]
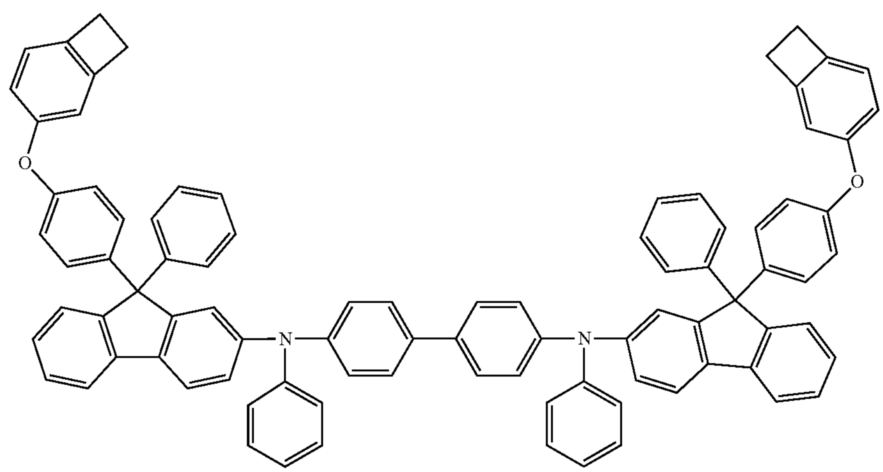
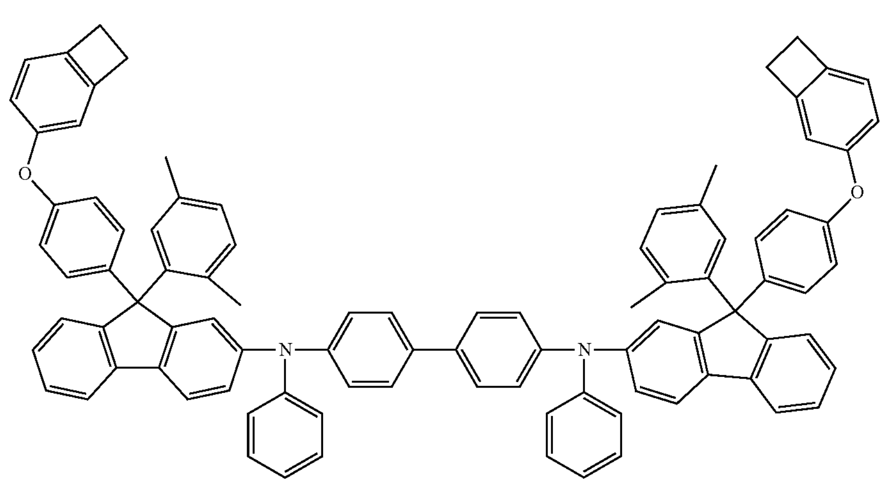

-continued
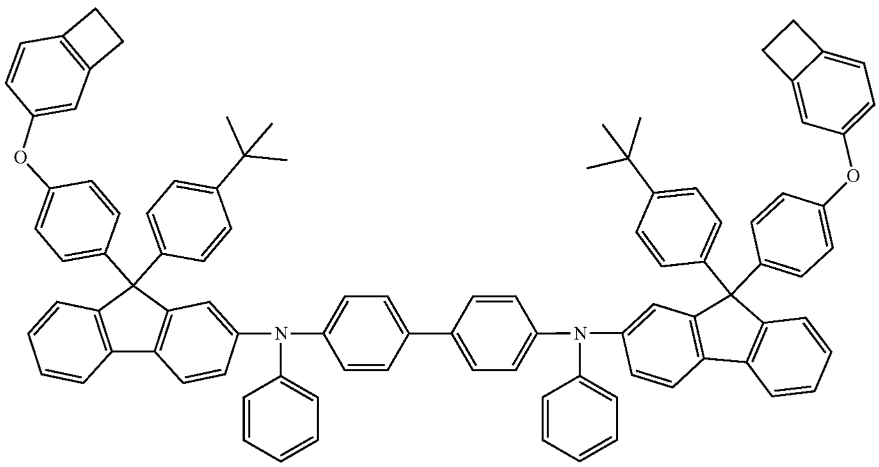
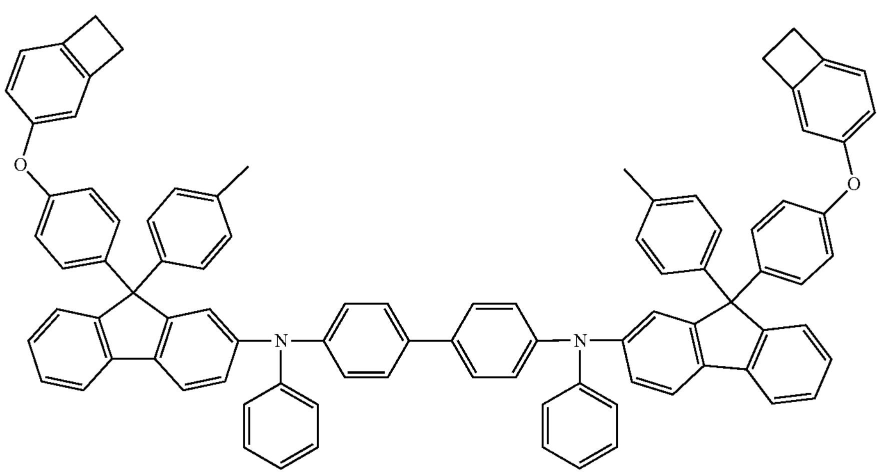
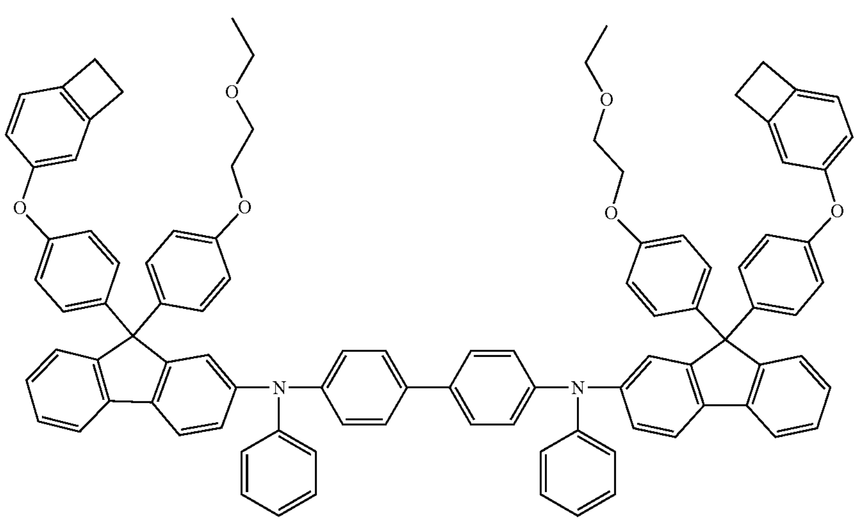

-continued
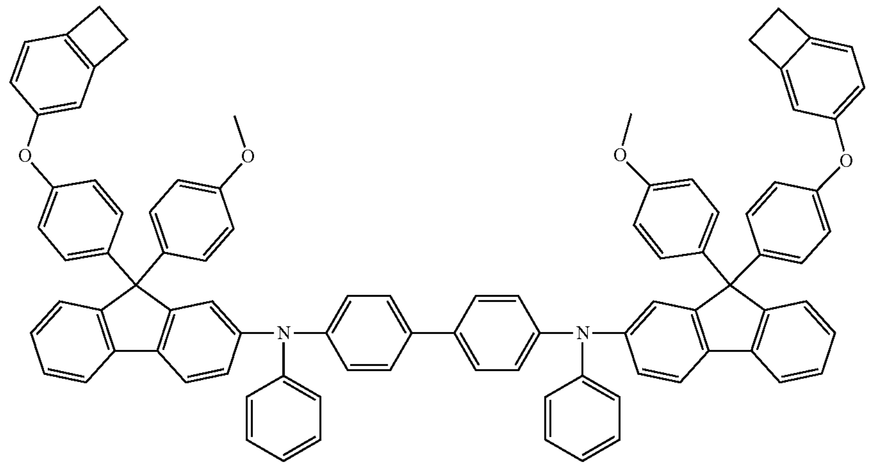
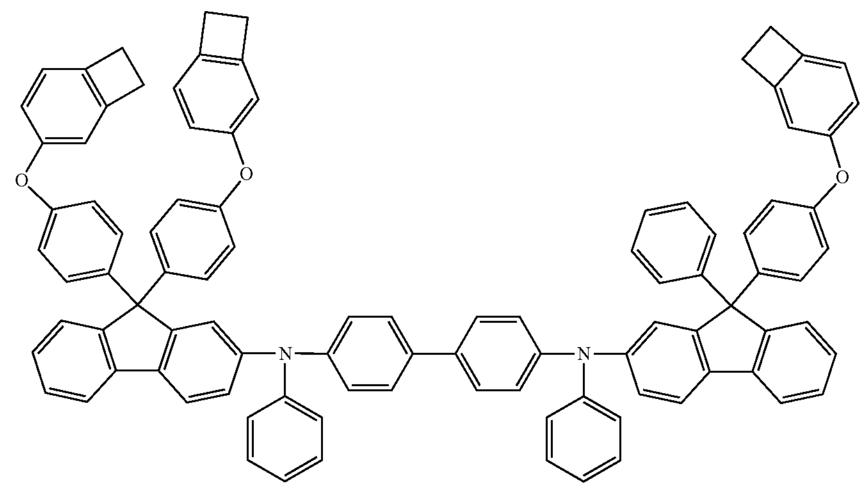
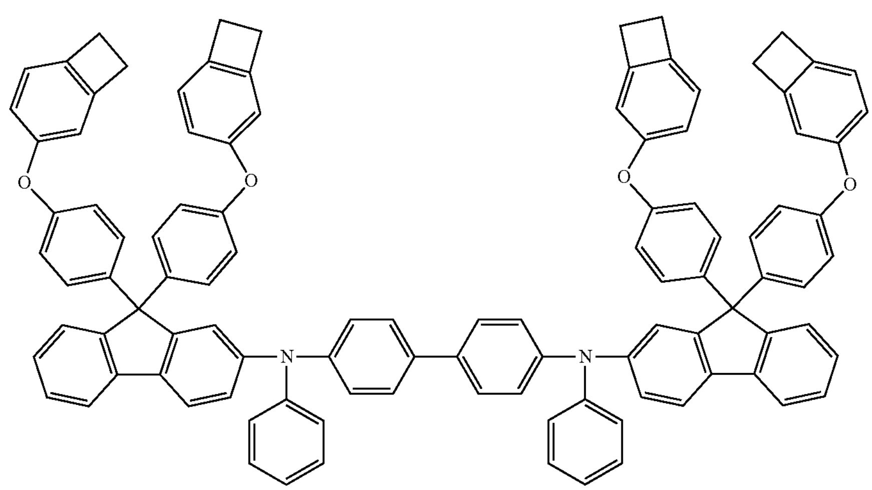 [SMILES: c1ccc(N(c2ccc(-c3ccc(N(c4ccccc4)c4ccc5c(c4)C(c4ccc(Oc6ccc7c(c6)CC7)cc4)(c4ccc(Oc6ccc7c(c6)CC7)cc4)c4ccccc4-5)cc3)cc2)c2ccc3c(c2)C(c2ccc(Oc4ccc5c(c4)CC5)cc2)(c2ccc(Oc4ccc5c(c4)CC5)cc2)c2ccccc2-3)cc1]

-continued
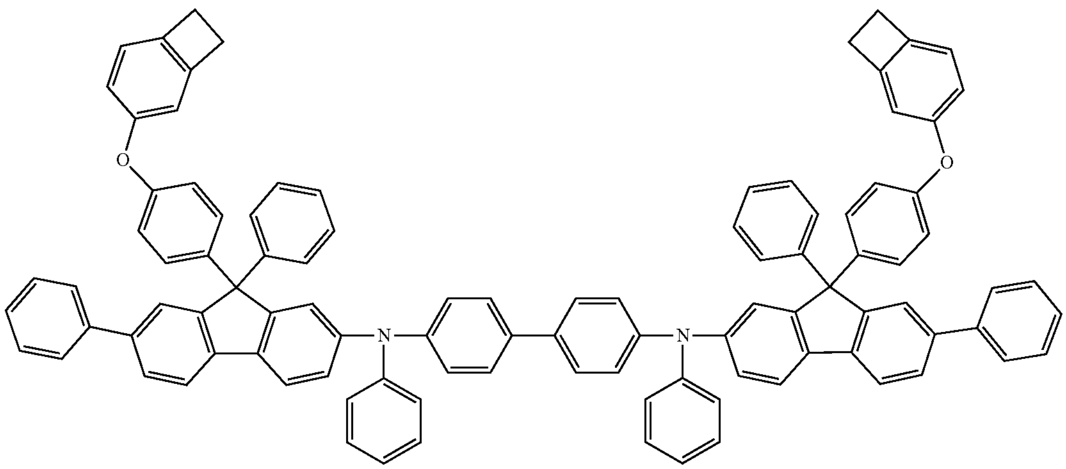
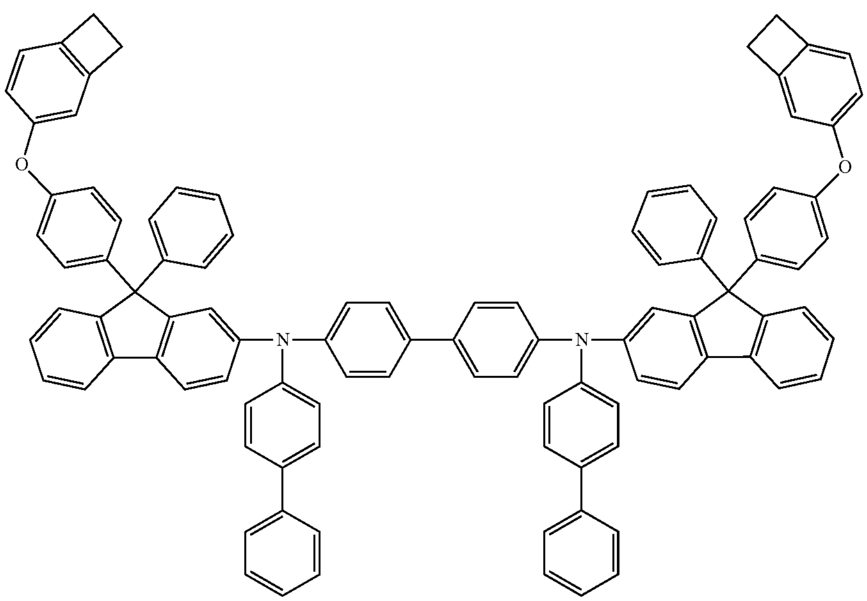
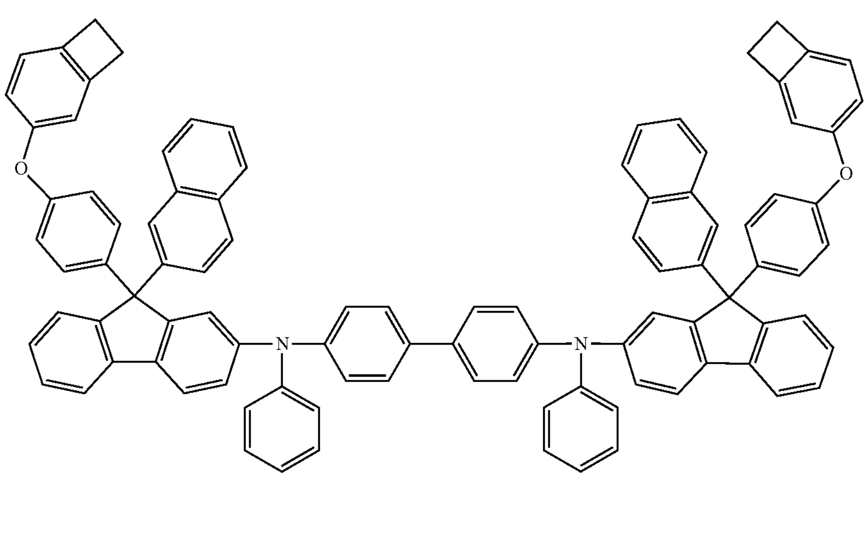

-continued
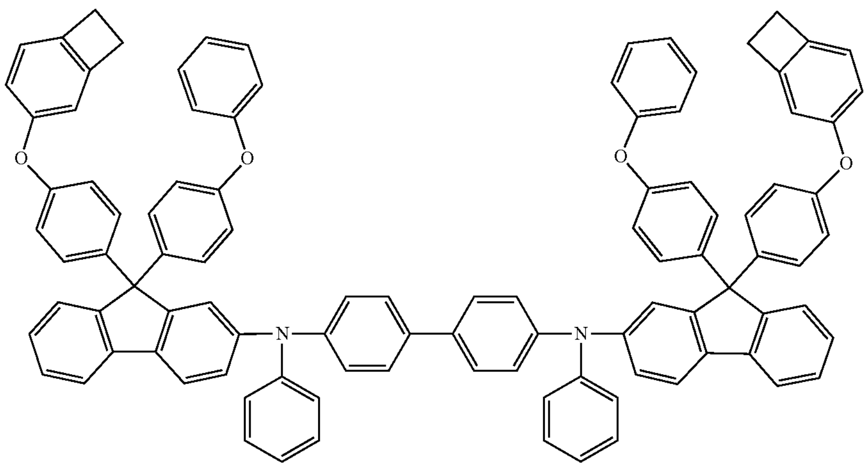
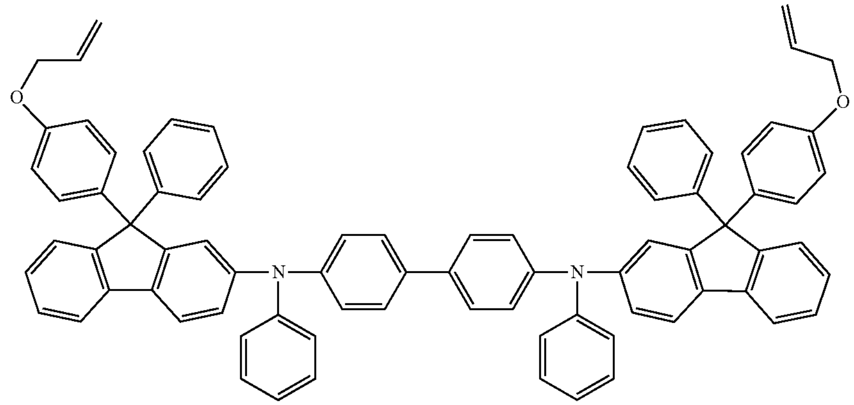
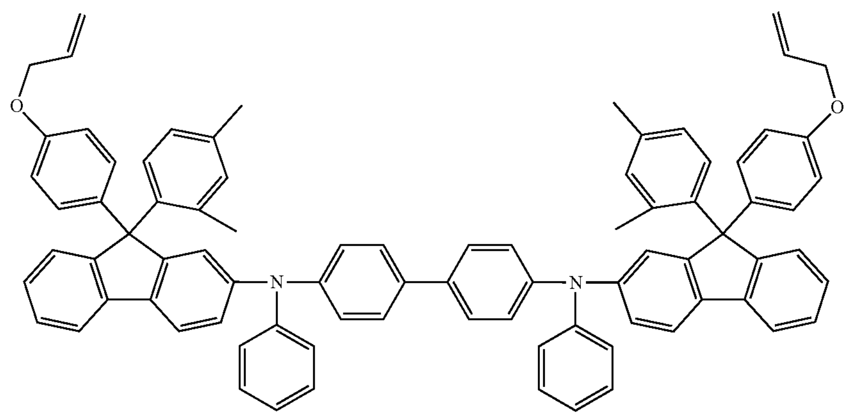
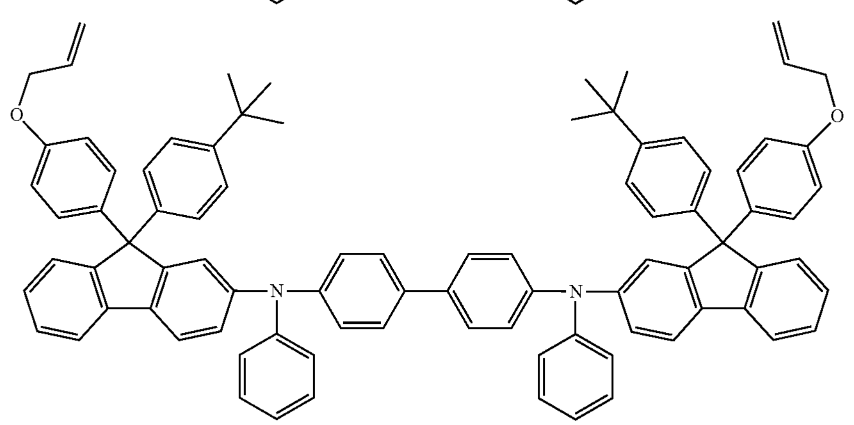

-continued
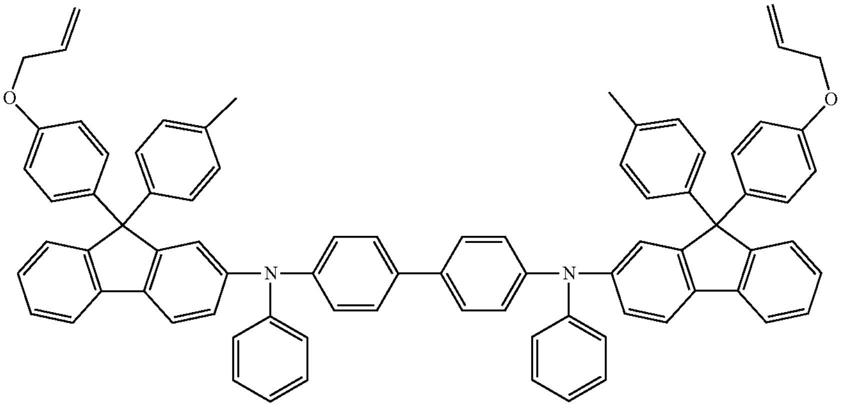 [SMILES: C=CCOc1ccc(C2(c3ccc(C)cc3)c3ccccc3-c3ccc(N(c4ccccc4)c4ccc(-c5ccc(N(c6ccccc6)c6ccc7c(c6)C(c6ccc(C)cc6)(c6ccc(OCC=C)cc6)c6ccccc6-7)cc5)cc4)cc32)cc1]
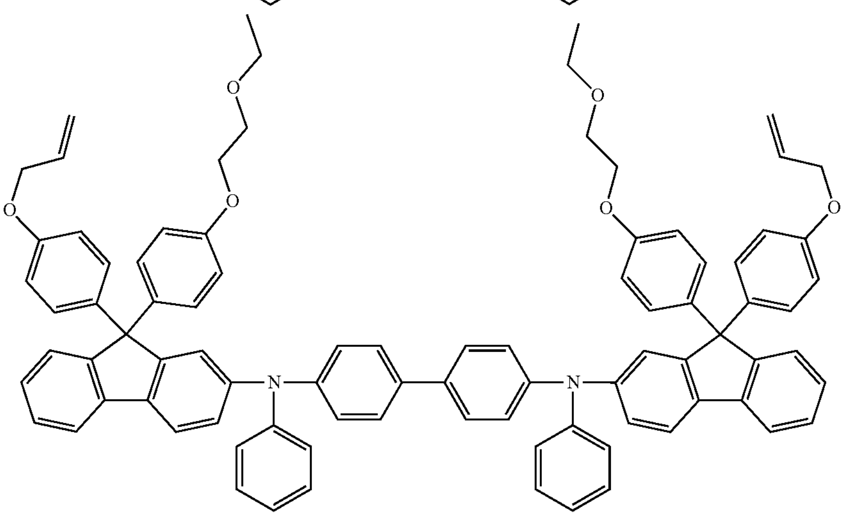
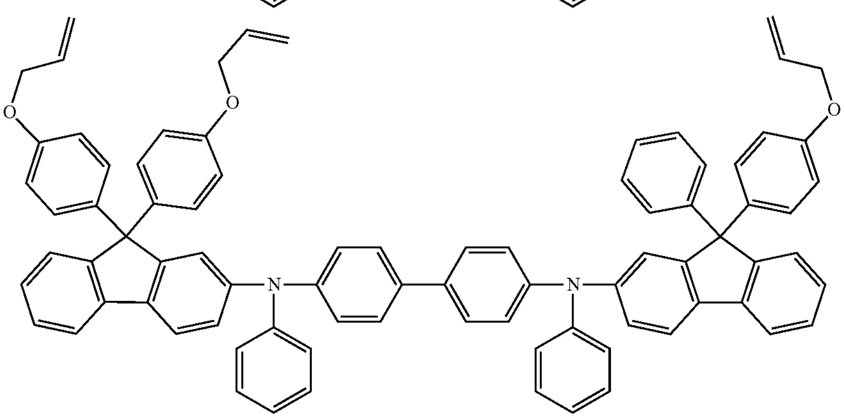
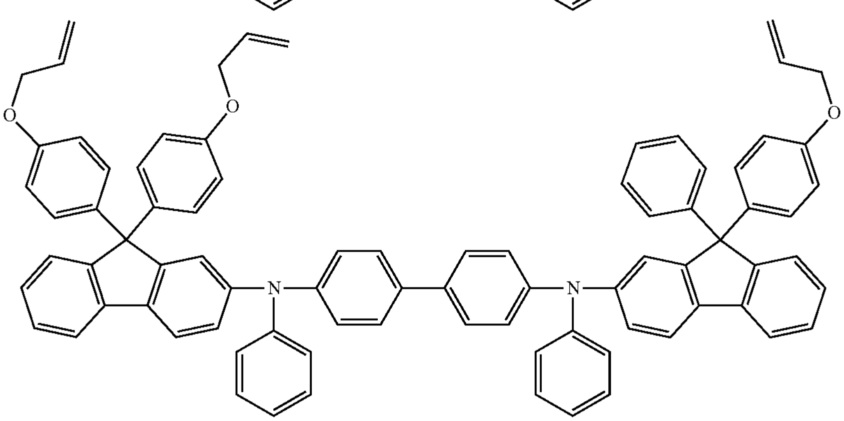

-continued
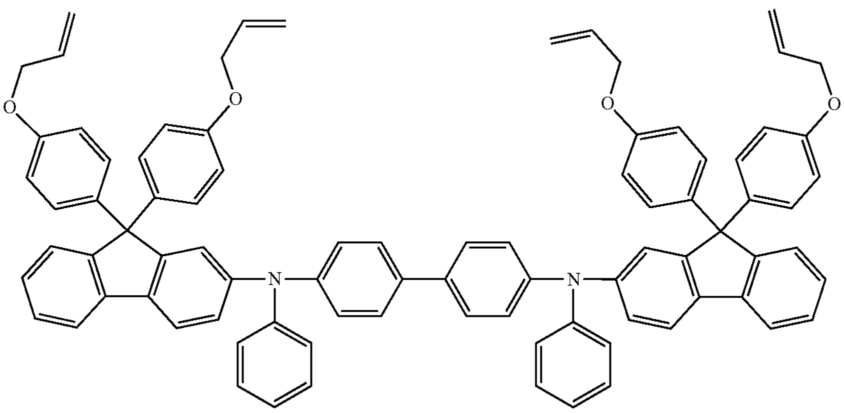
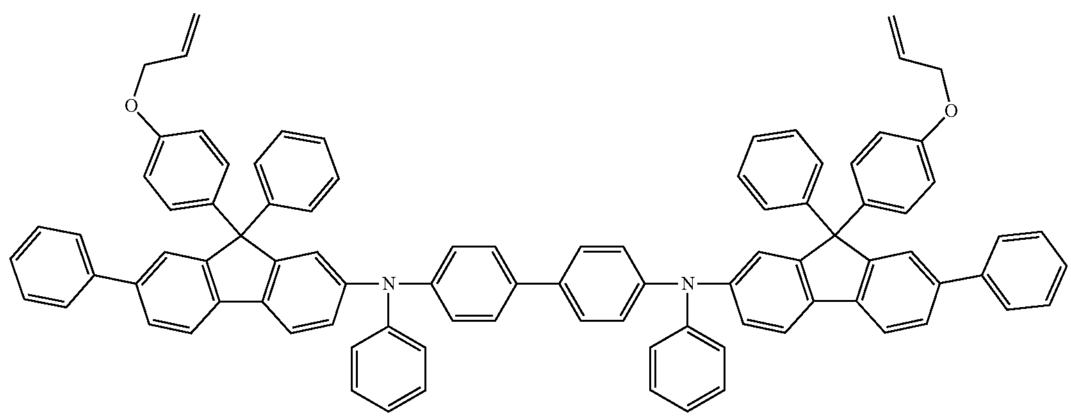
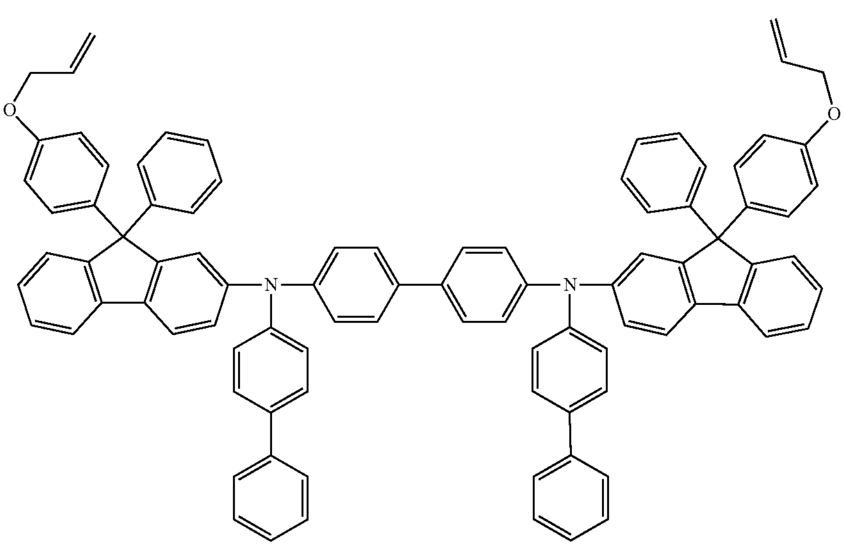

-continued
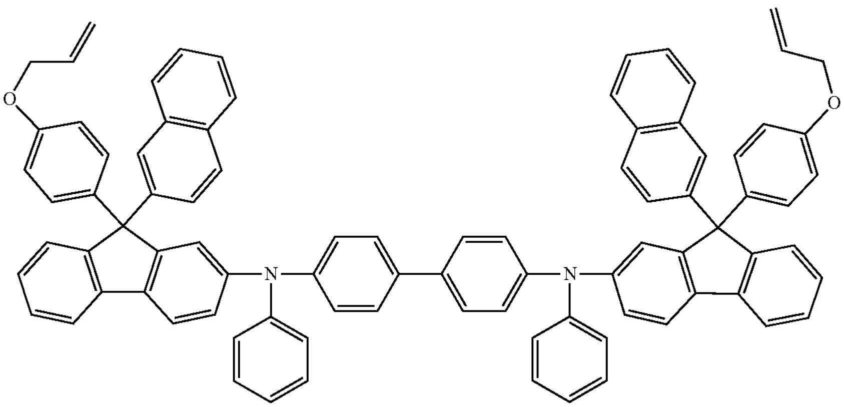
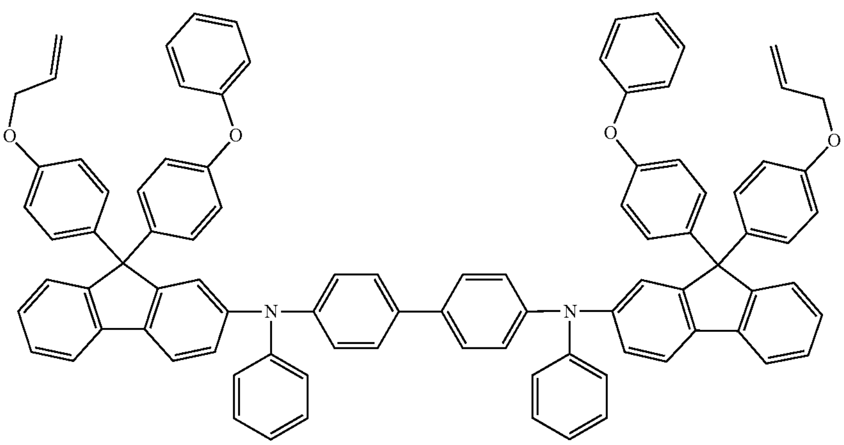 [SMILES: C=CCOc1ccc(C2(c3ccc(Oc4ccccc4)cc3)c3ccccc3-c3ccc(N(c4ccccc4)c4ccc(-c5ccc(N(c6ccccc6)c6ccc7c(c6)C(c6ccc(OCC=C)cc6)(c6ccc(Oc8ccccc8)cc6)c6ccccc6-7)cc5)cc4)cc32)cc1]
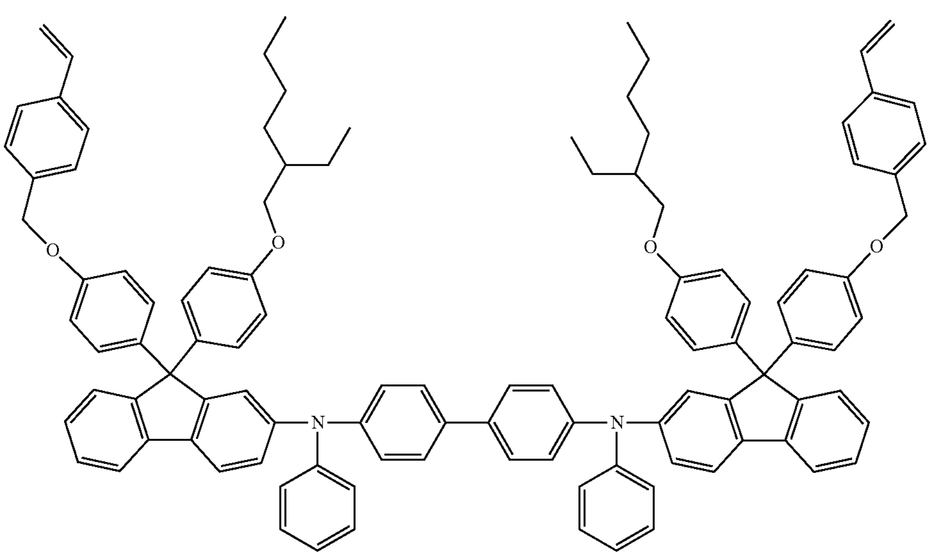

-continued
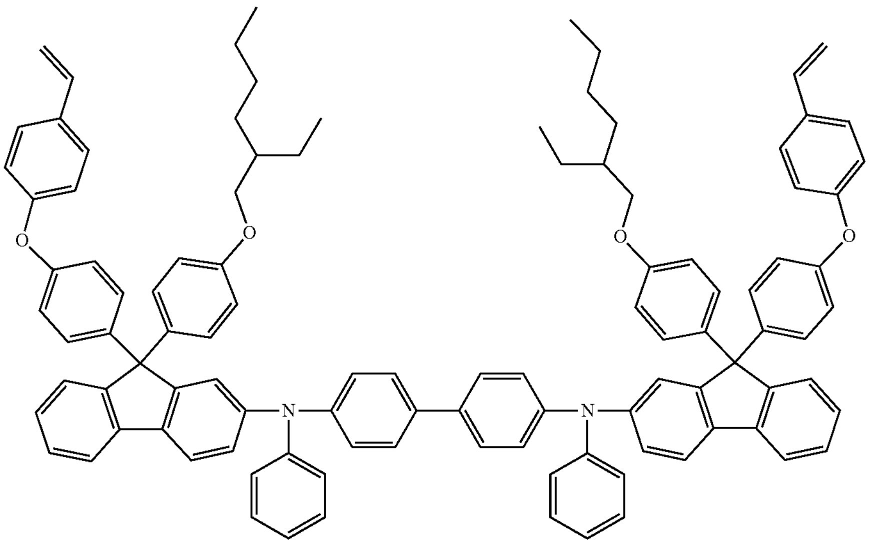
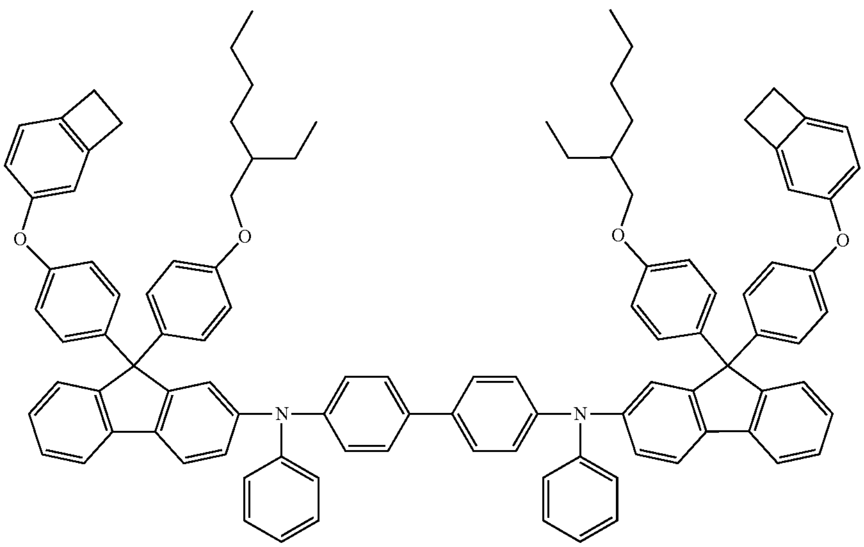
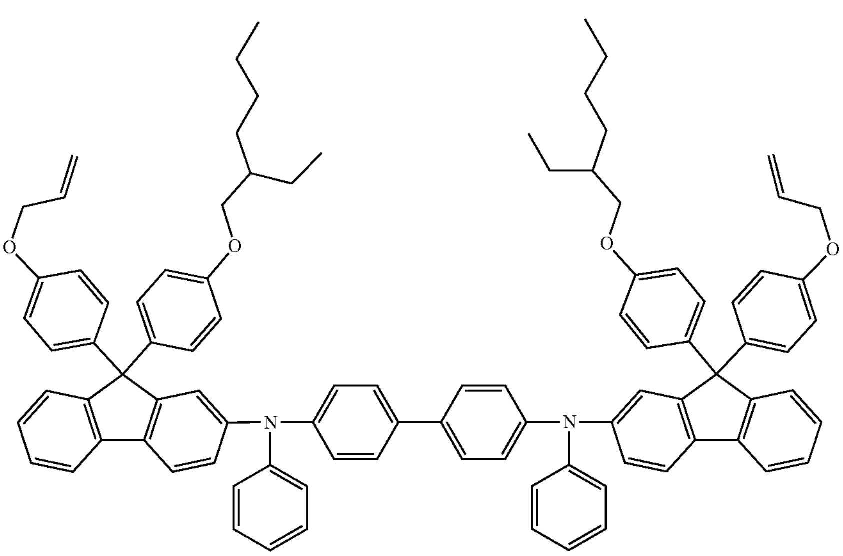

-continued
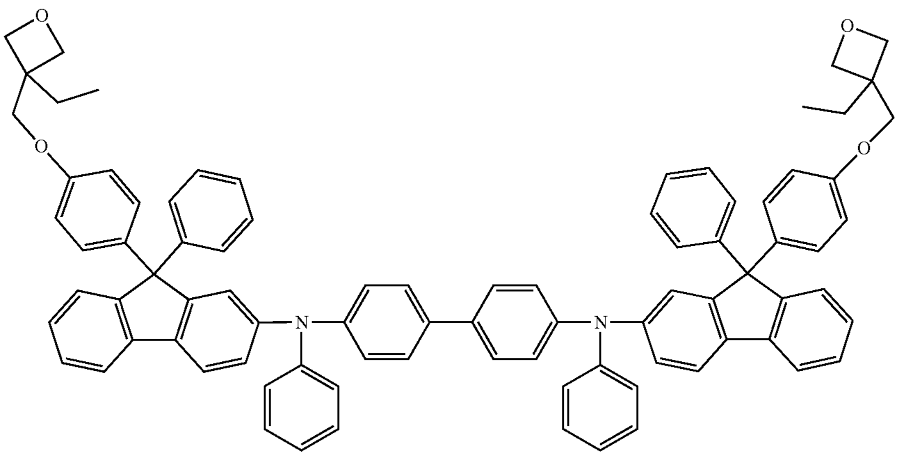
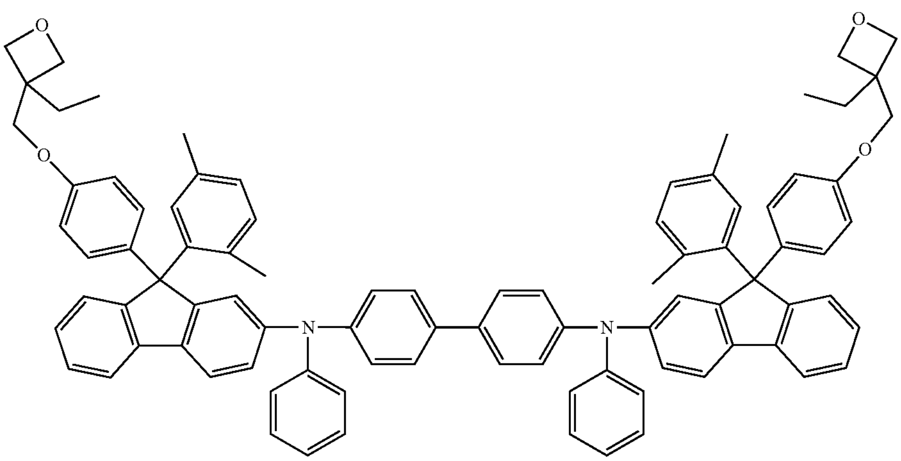
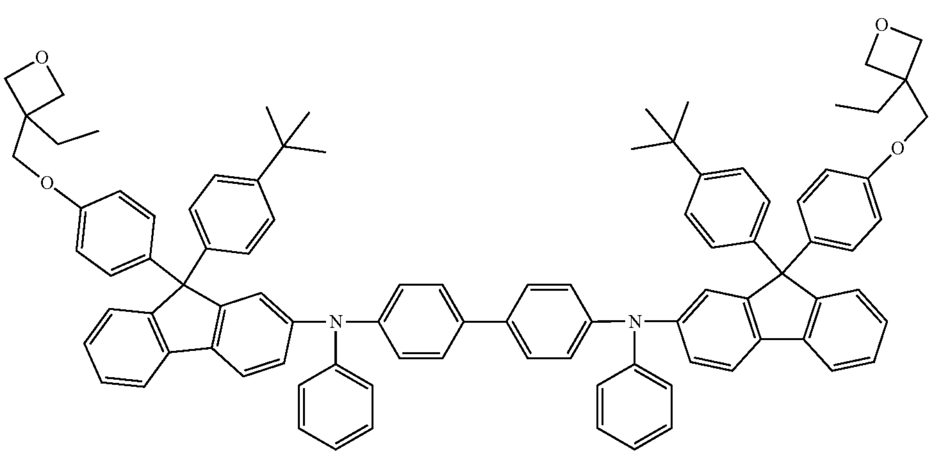

-continued
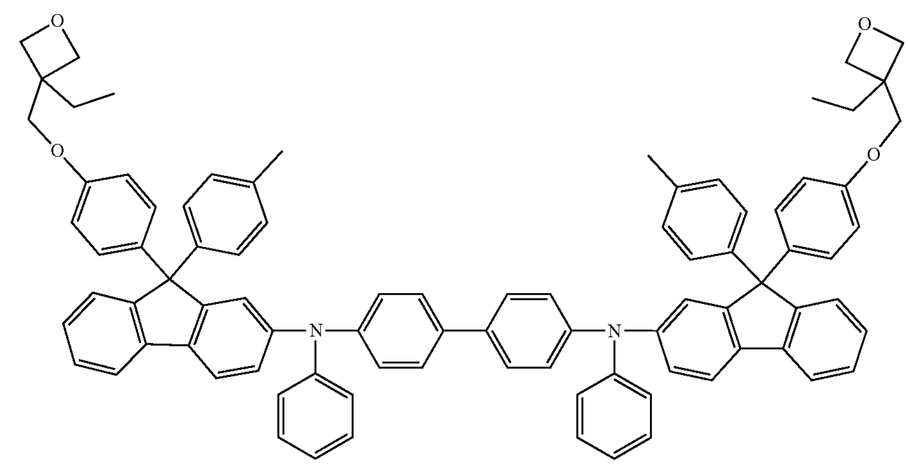 [SMILES: CCC1(COc2ccc(C3(c4ccc(C)cc4)c4ccccc4-c4ccc(N(c5ccccc5)c5ccc(-c6ccc(N(c7ccccc7)c7ccc8c(c7)C(c7ccc(C)cc7)(c7ccc(OCC9(CC)COC9)cc7)c7ccccc7-8)cc6)cc5)cc43)cc2)COC1]
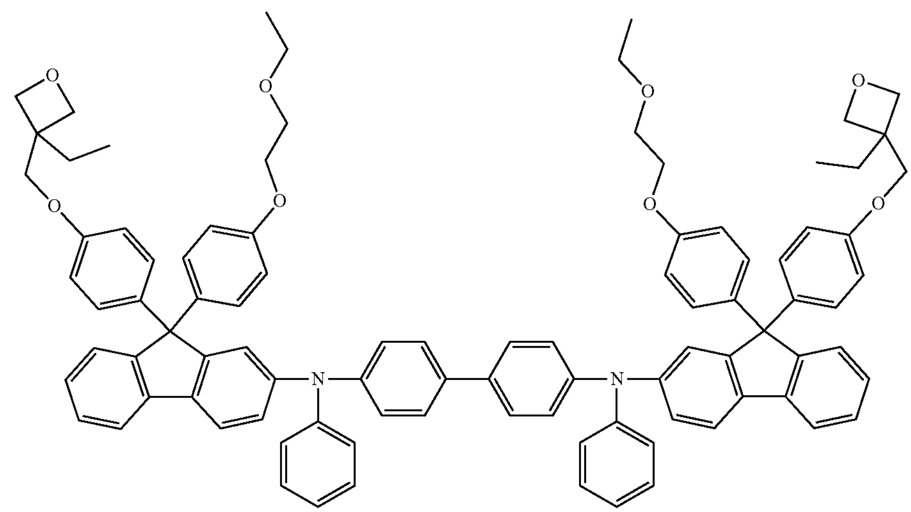
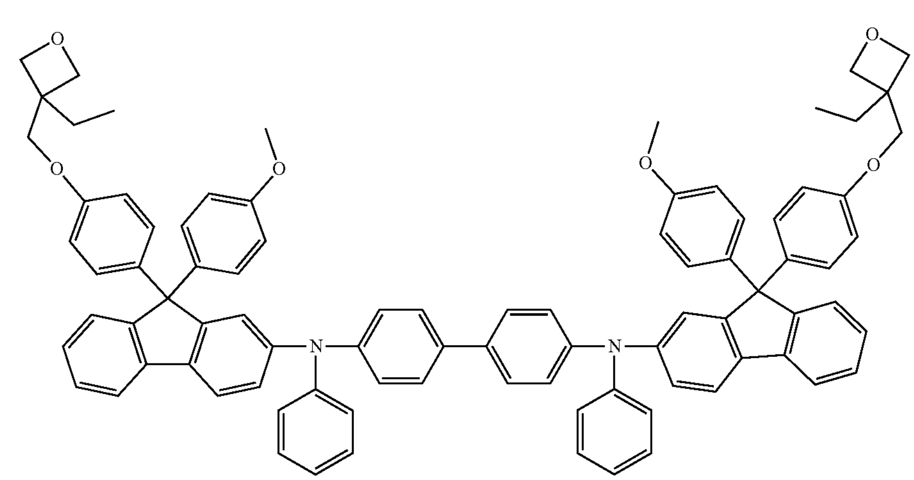

-continued
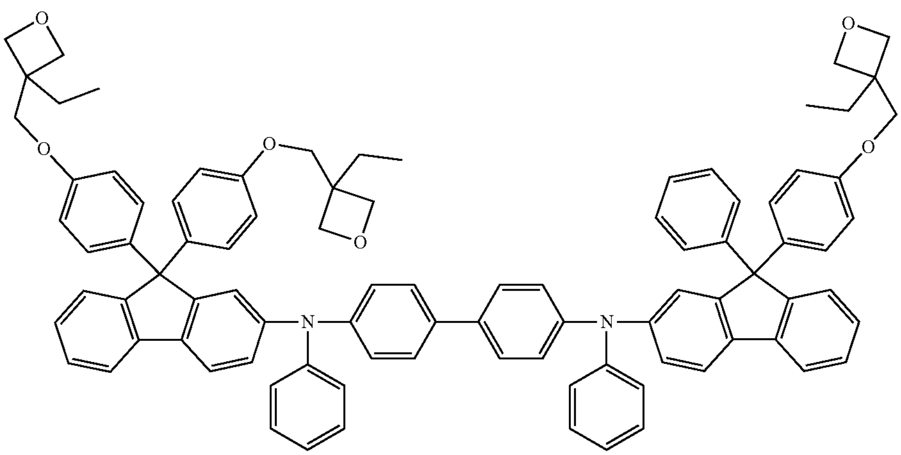
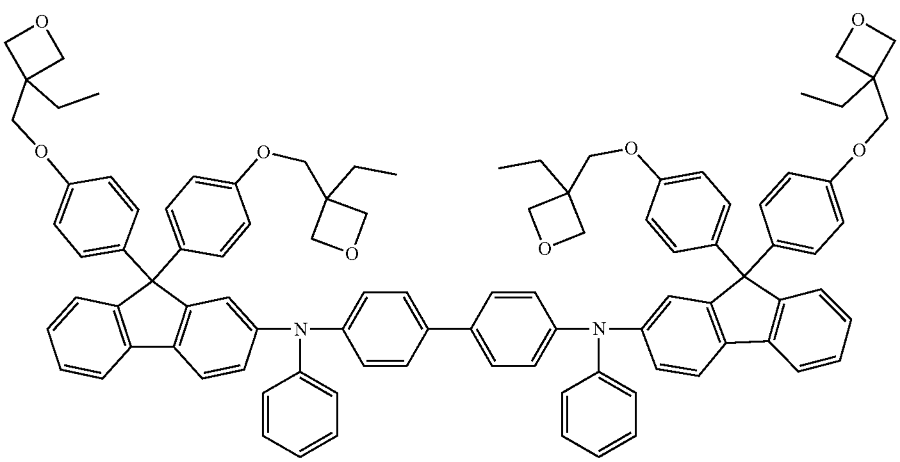
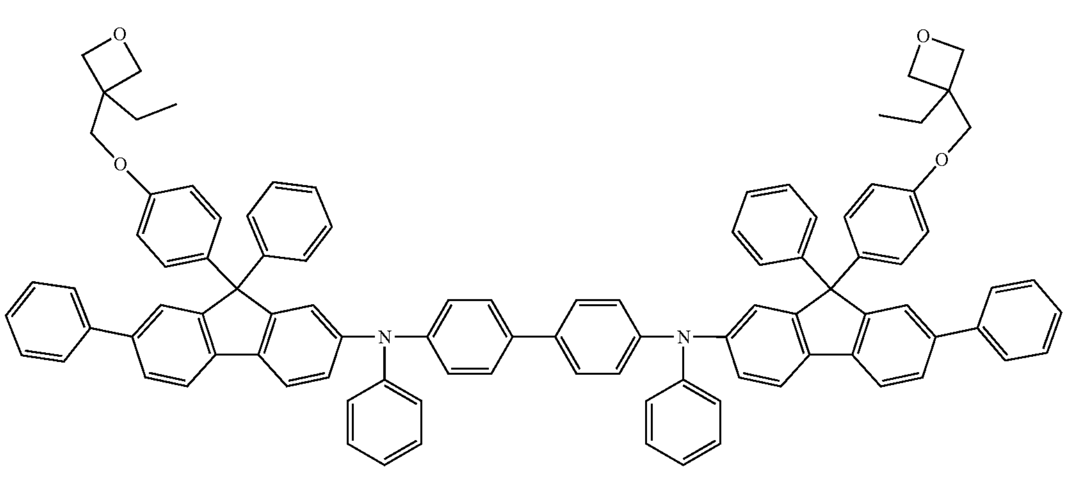

-continued
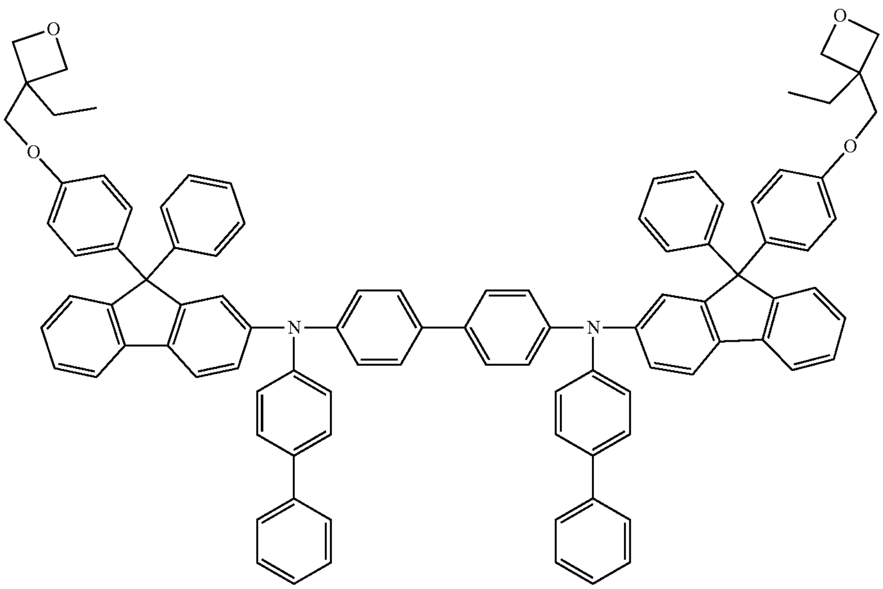
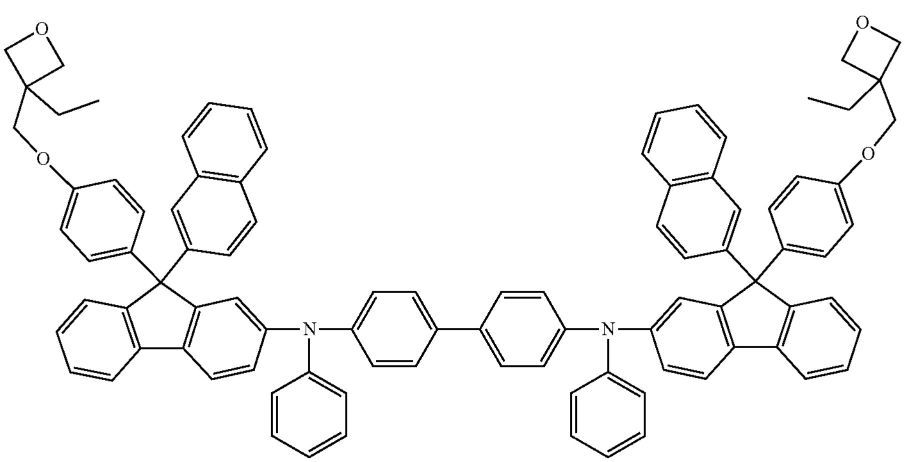
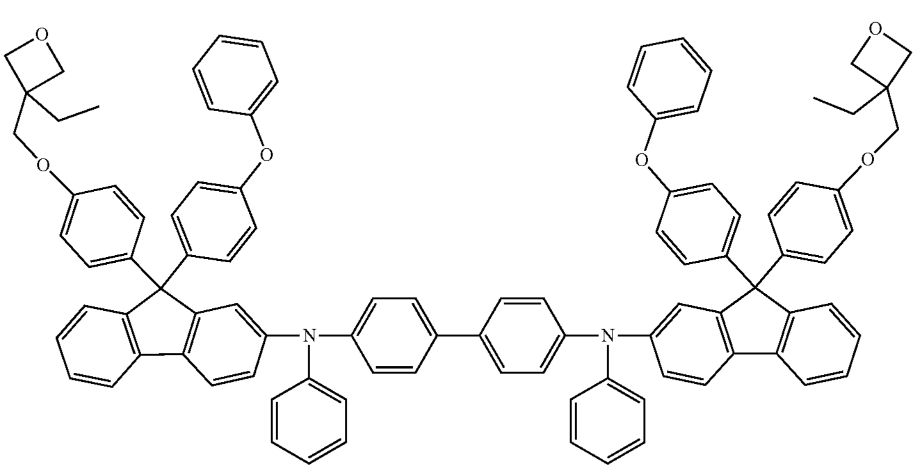 [SMILES: CCC1(COc2ccc(C3(c4ccc(Oc5ccccc5)cc4)c4ccccc4-c4ccc(N(c5ccccc5)c5ccc(-c6ccc(N(c7ccccc7)c7ccc8c(c7)C(c7ccc(OCC9(CC)COC9)cc7)(c7ccc(Oc9ccccc9)cc7)c7ccccc7-8)cc6)cc5)cc43)cc2)COC1]

-continued
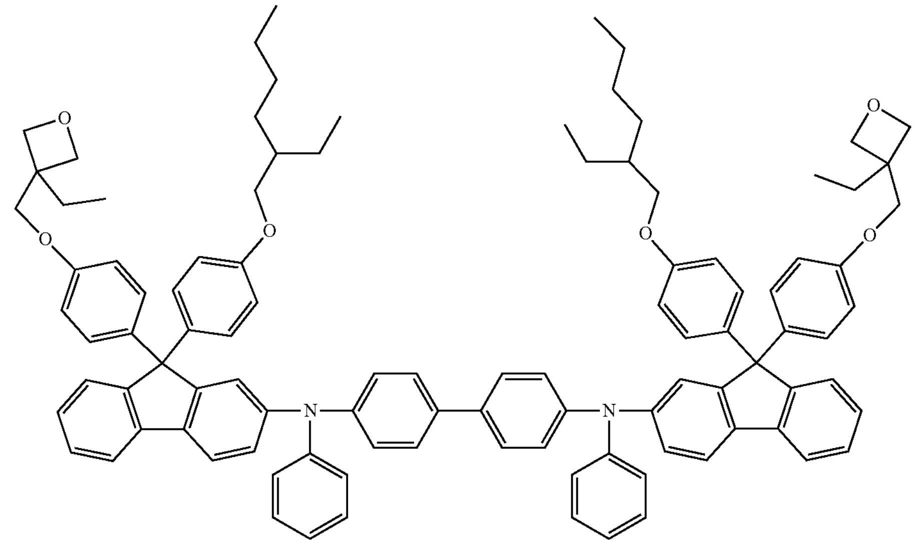
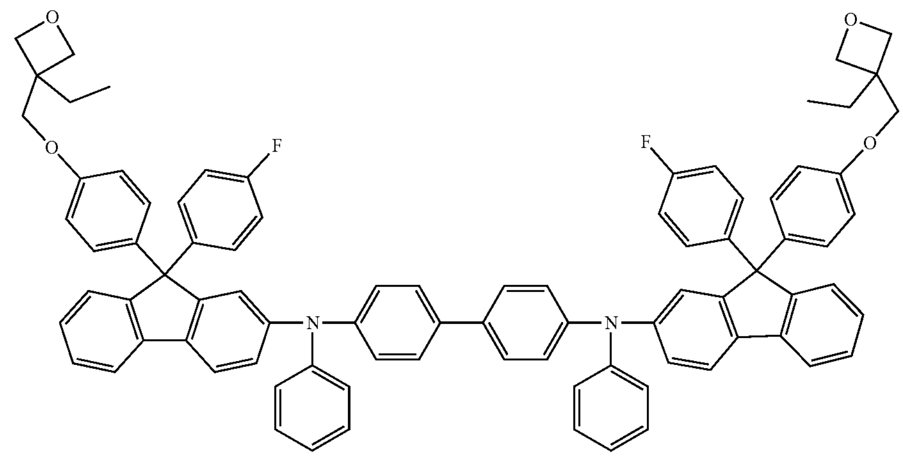
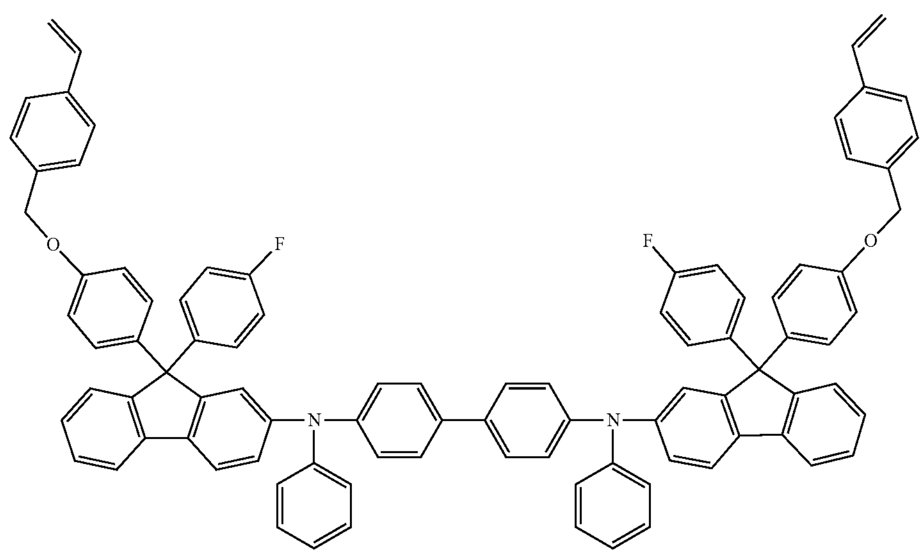

-continued
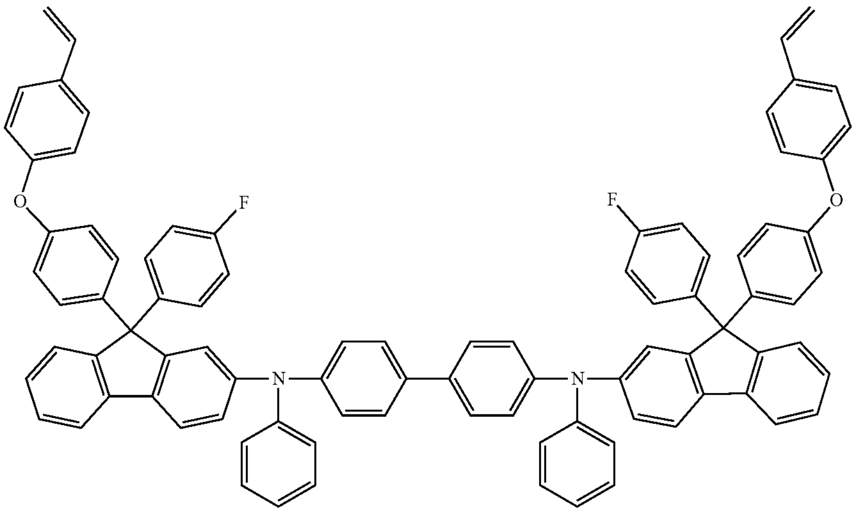
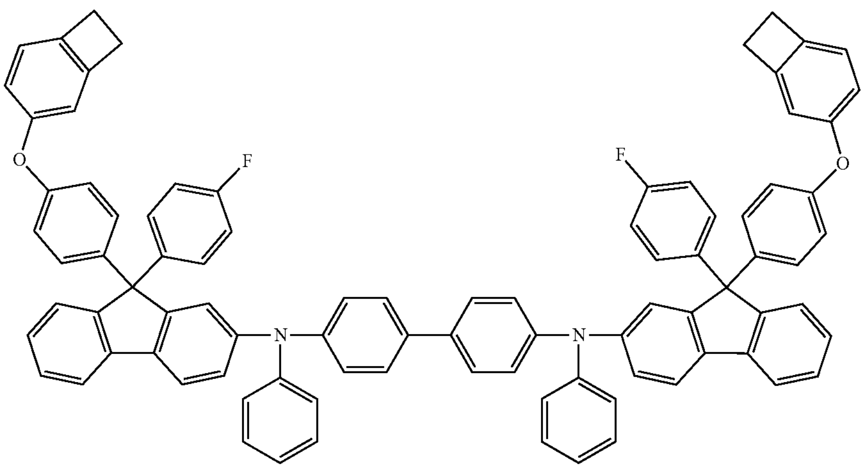
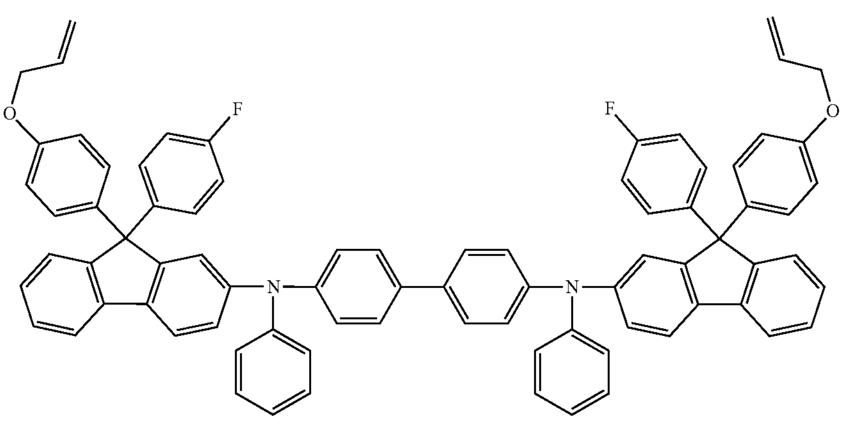

-continued
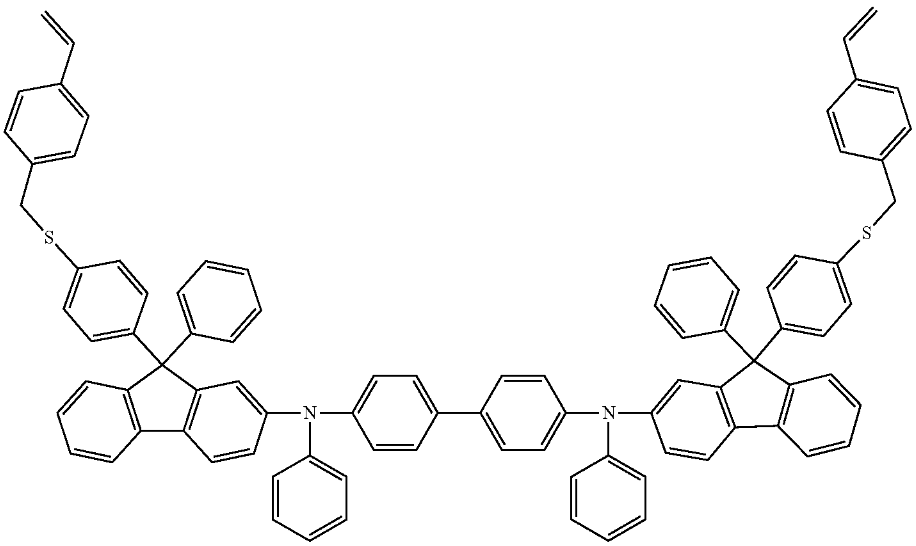
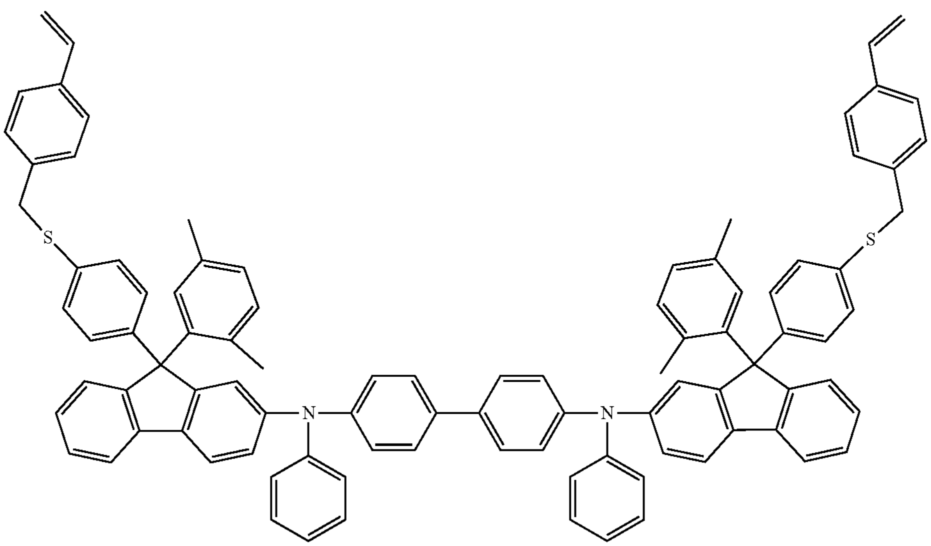 [SMILES: C=Cc1ccc(CSc2ccc(C3(c4cc(C)ccc4C)c4ccccc4-c4ccc(N(c5ccccc5)c5ccc(-c6ccc(N(c7ccccc7)c7ccc8c(c7)C(c7ccc(SCc9ccc(C=C)cc9)cc7)(c7cc(C)ccc7C)c7ccccc7-8)cc6)cc5)cc43)cc2)cc1]
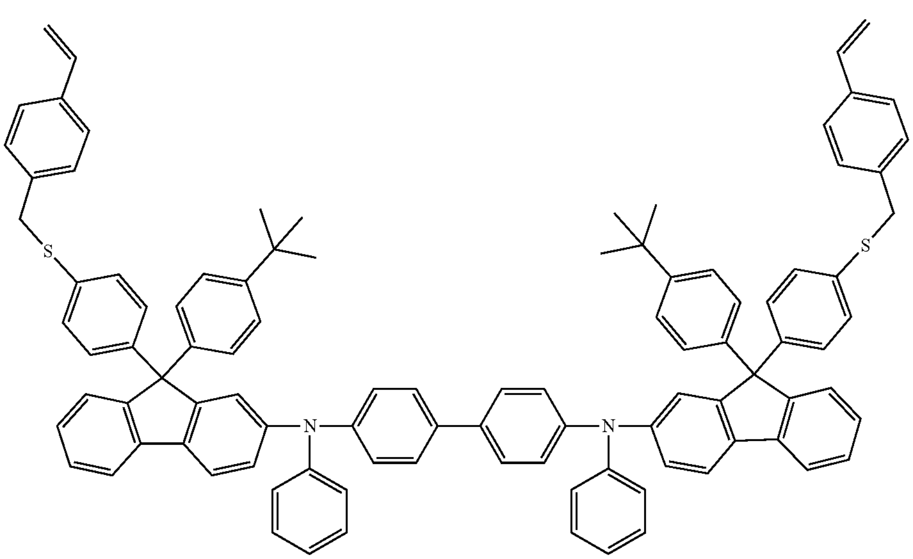

-continued
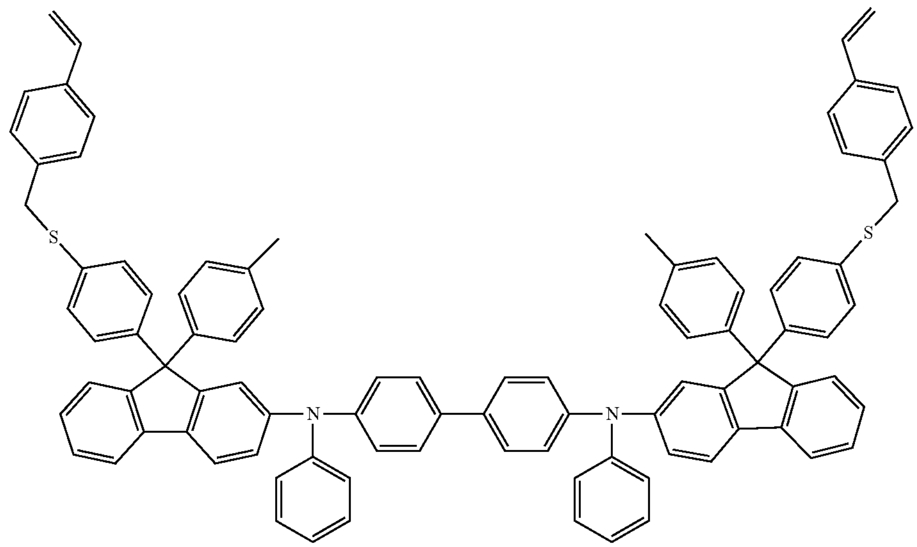
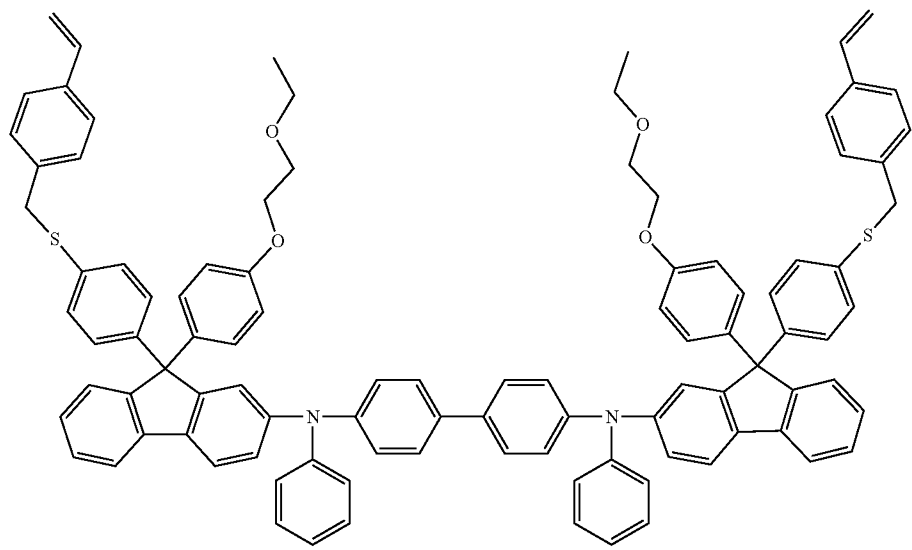
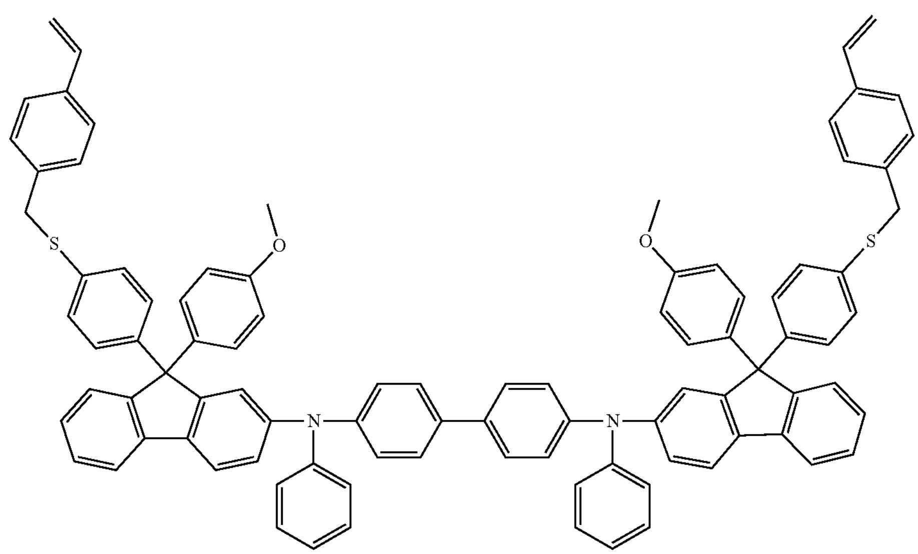

-continued
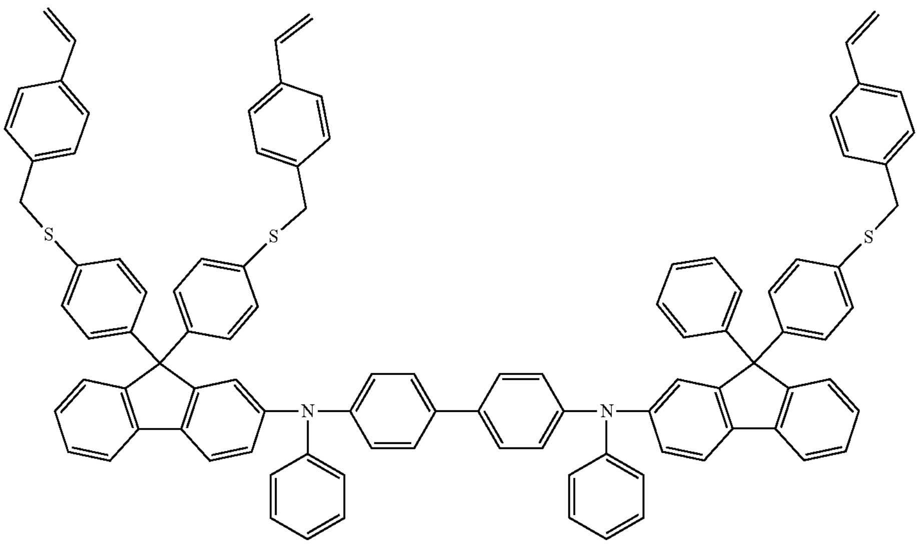
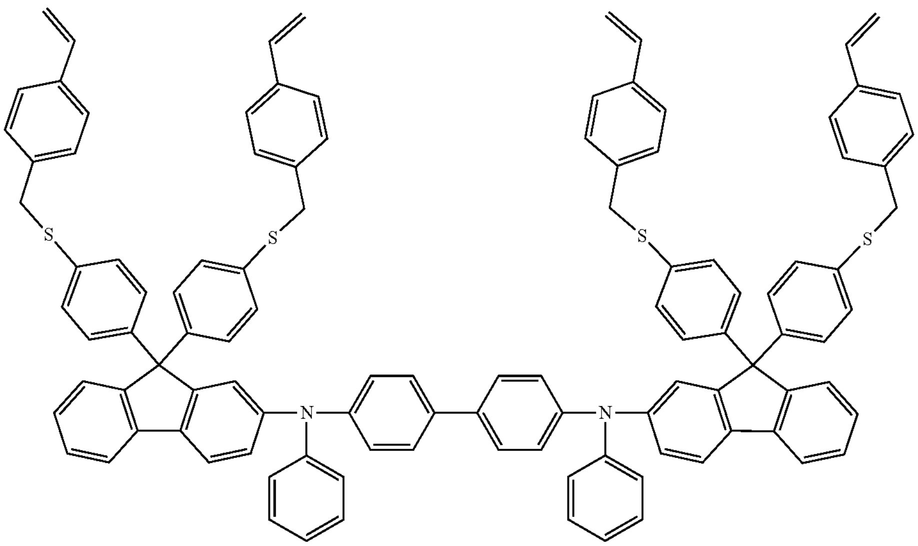
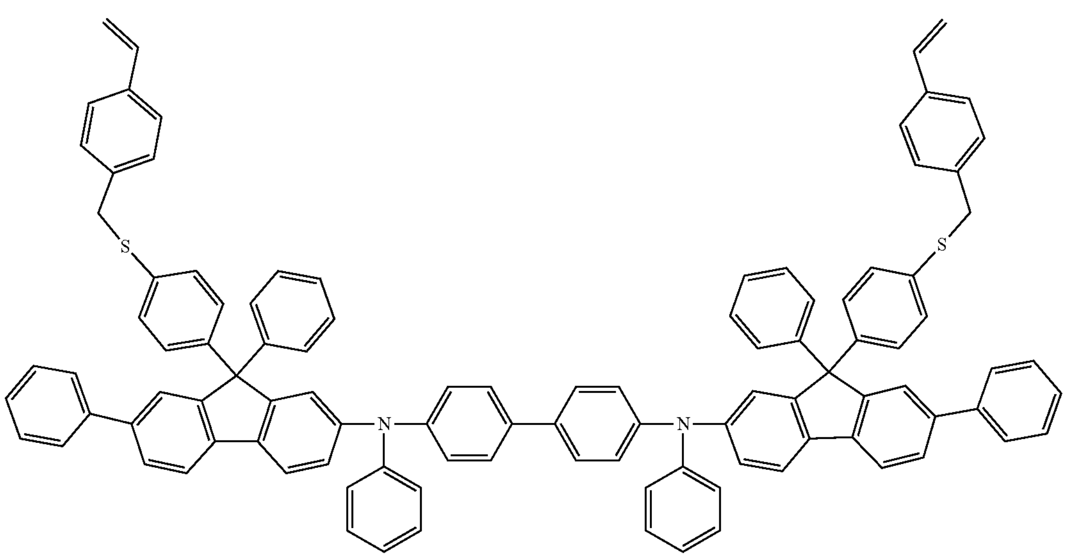

-continued
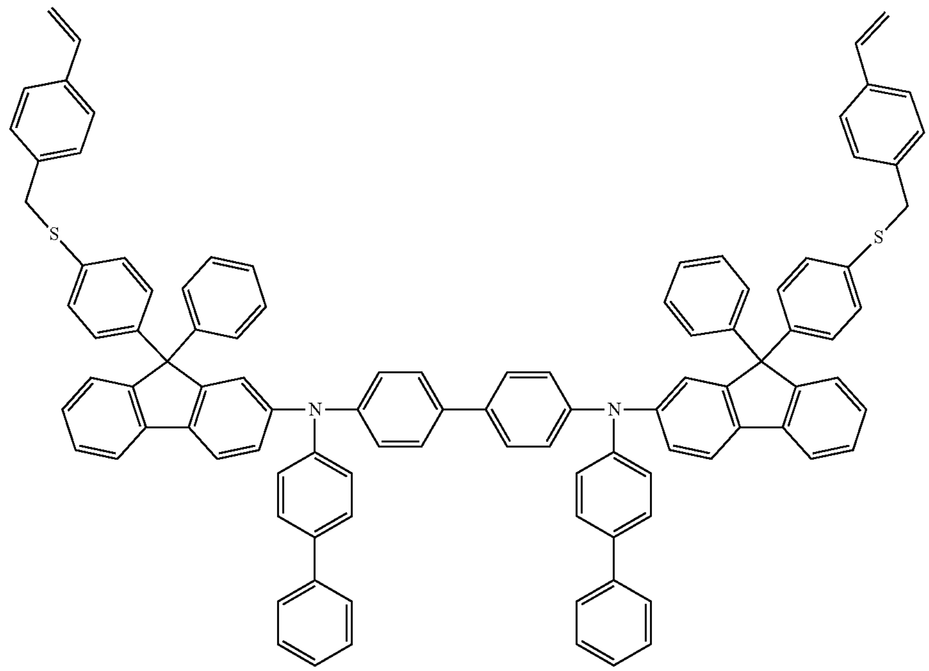
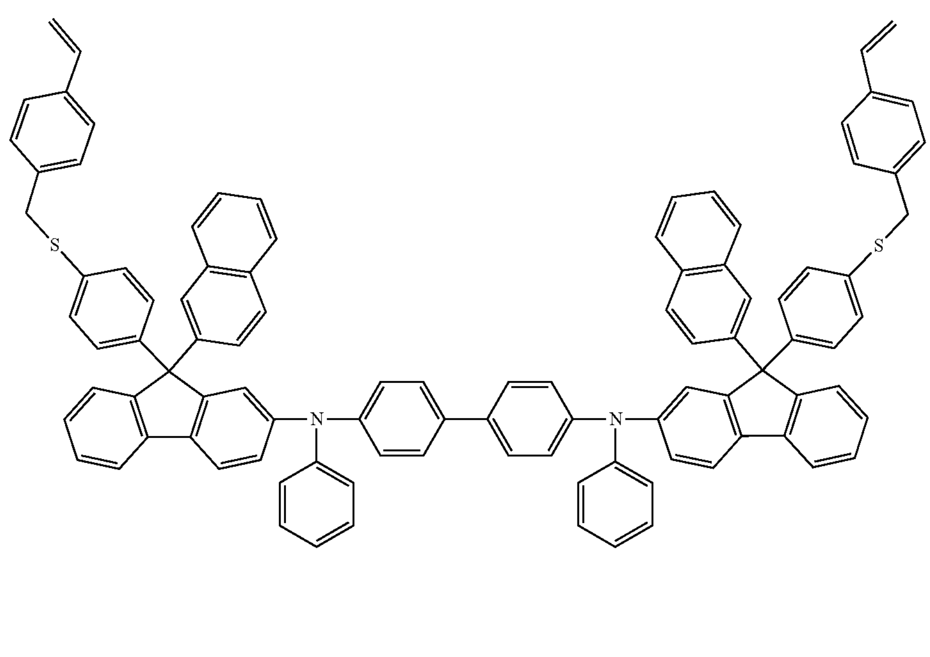

-continued
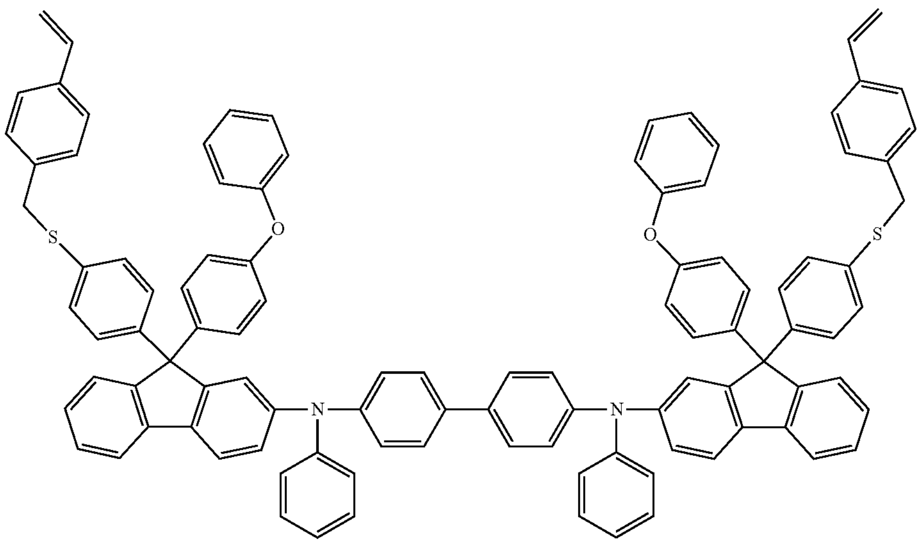
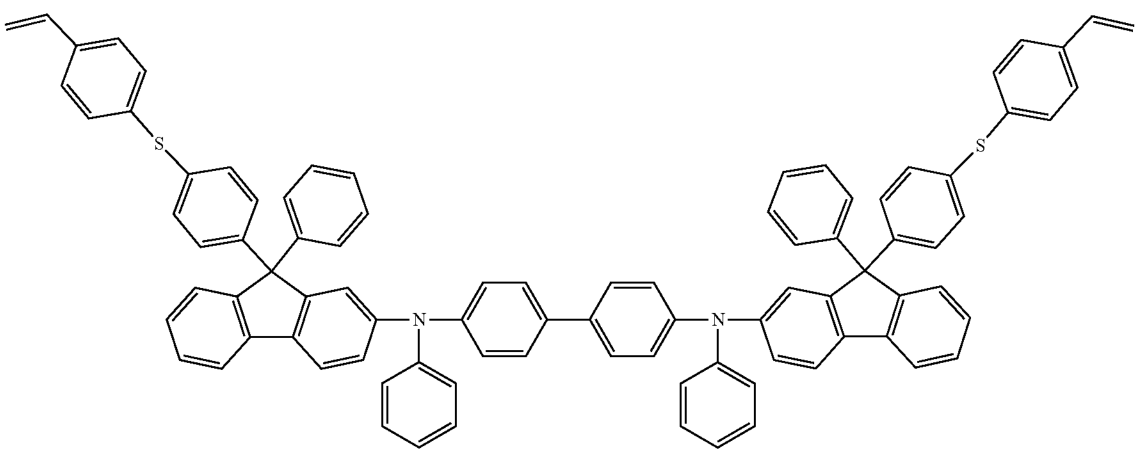
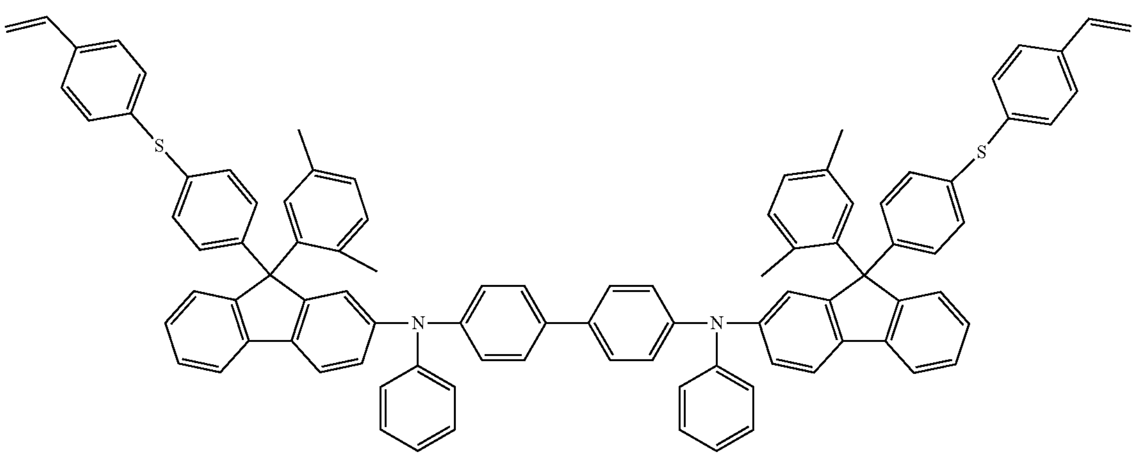

-continued
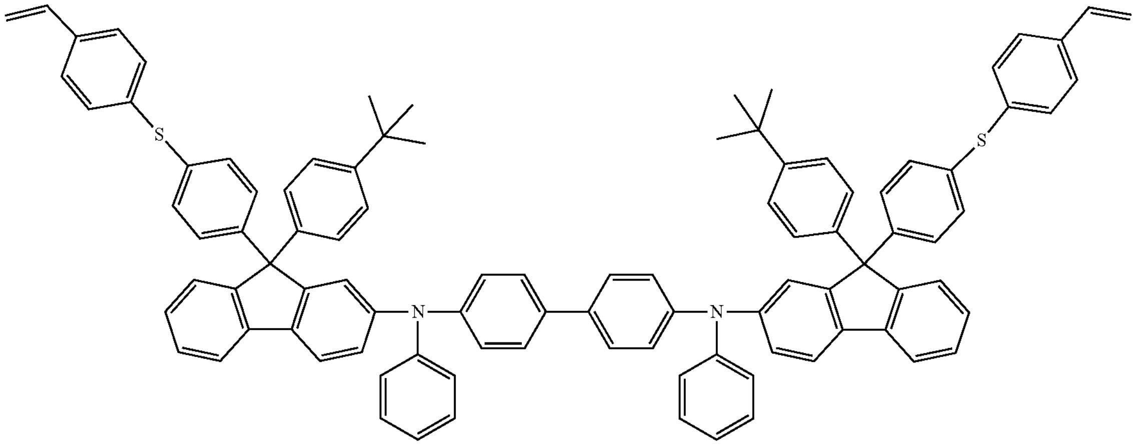
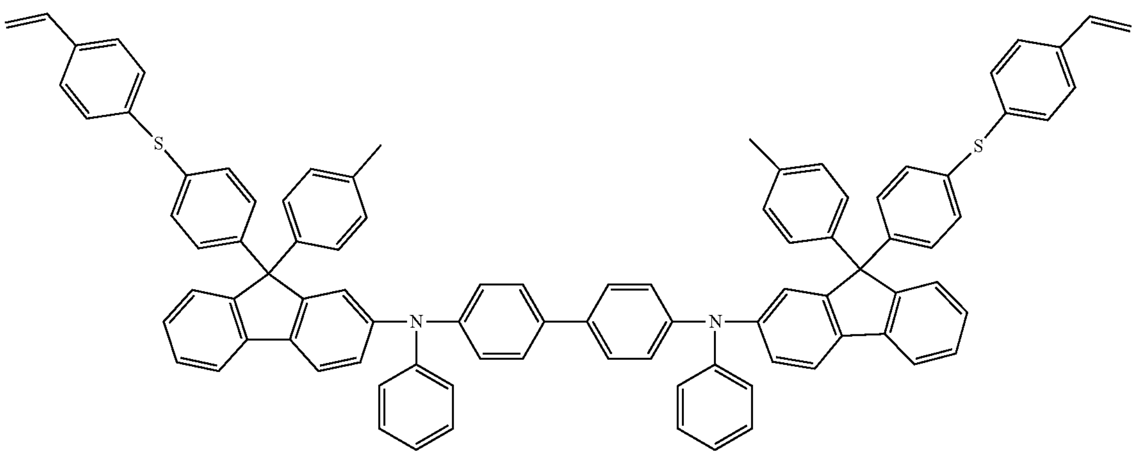
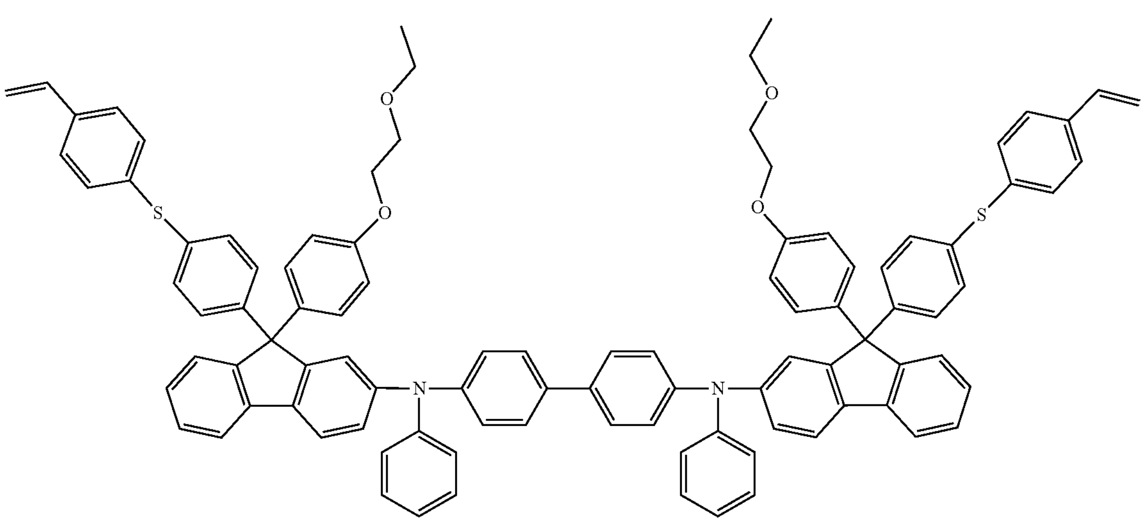

-continued
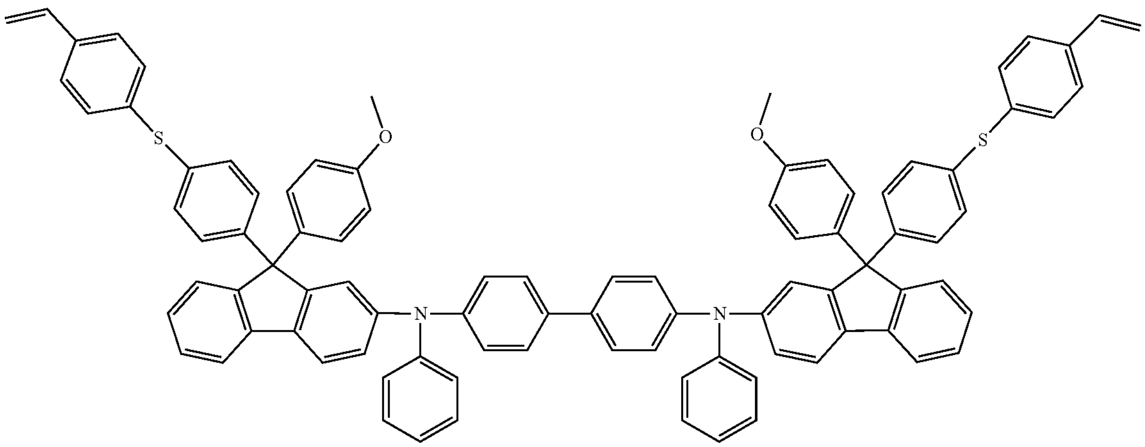 [SMILES: C=Cc1ccc(Sc2ccc(C3(c4ccc(OC)cc4)c4ccccc4-c4ccc(N(c5ccccc5)c5ccc(-c6ccc(N(c7ccccc7)c7ccc8c(c7)C(c7ccc(OC)cc7)(c7ccc(Sc9ccc(C=C)cc9)cc7)c7ccccc7-8)cc6)cc5)cc43)cc2)cc1]
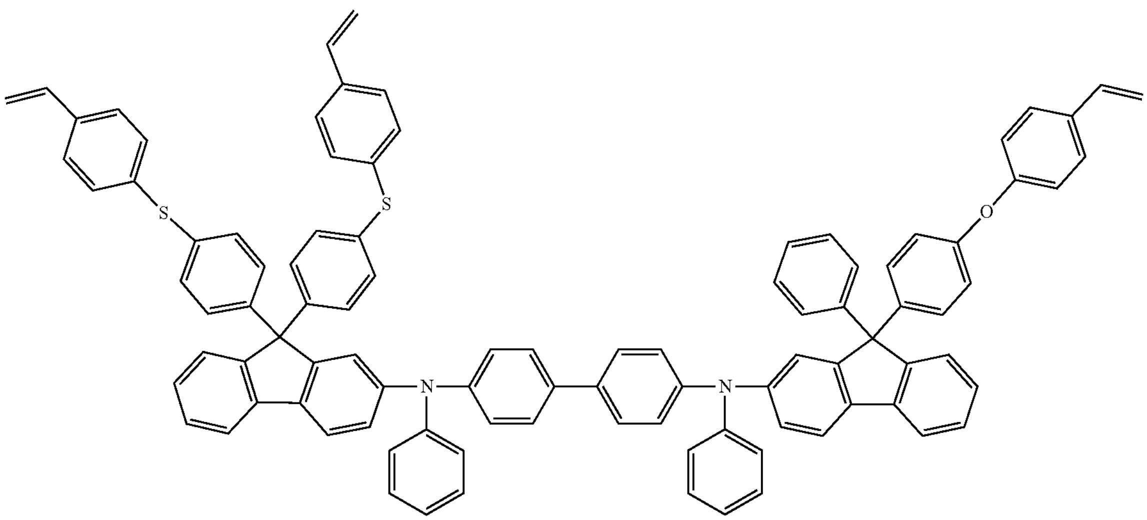
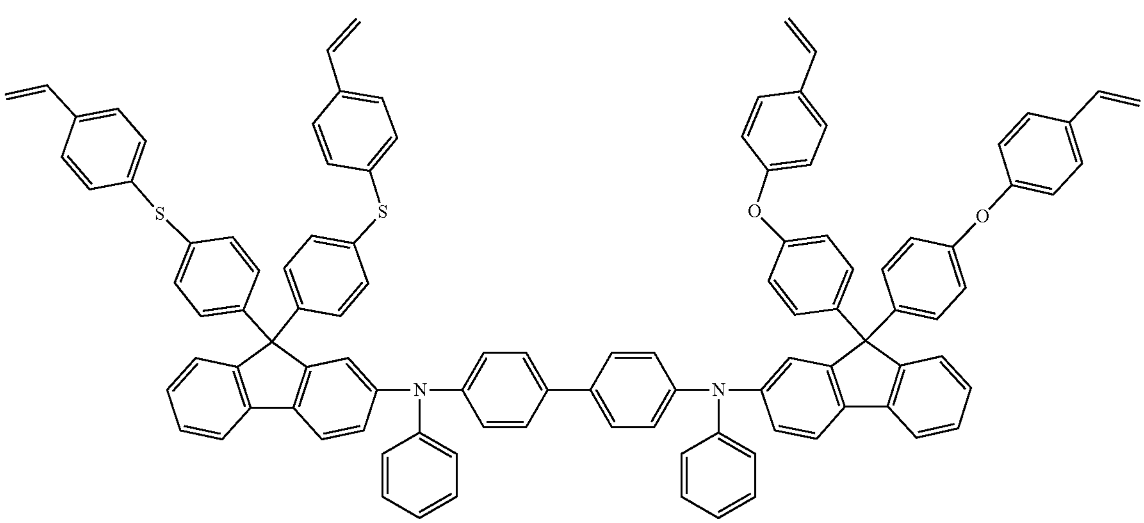

-continued
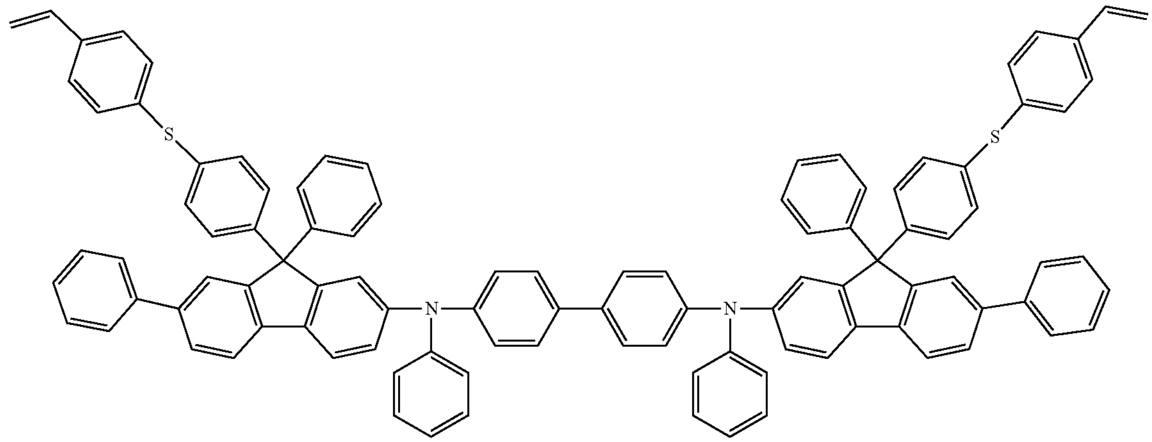
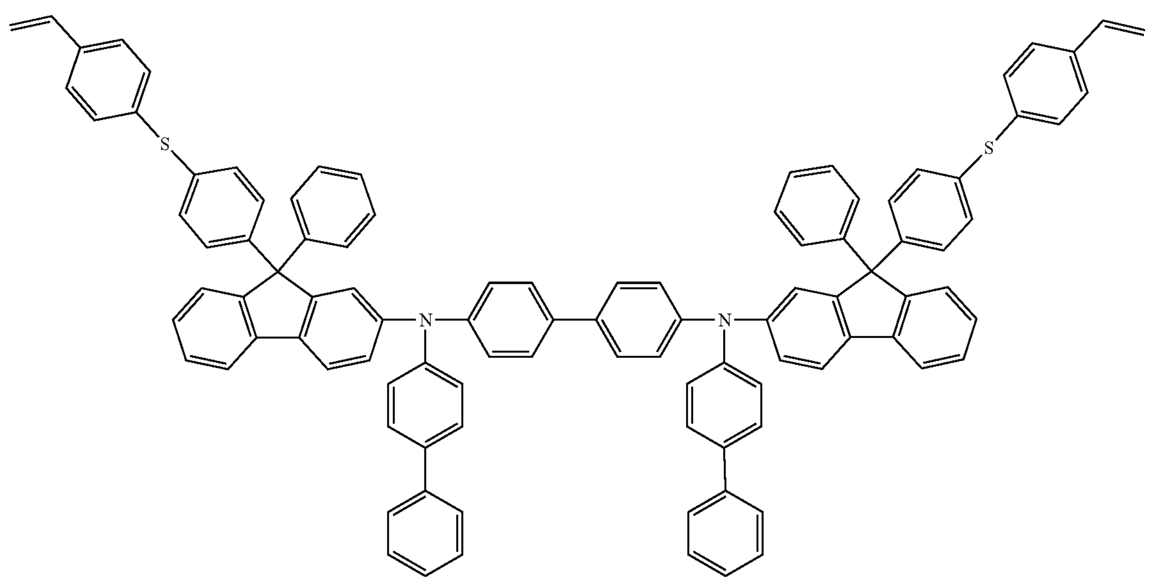
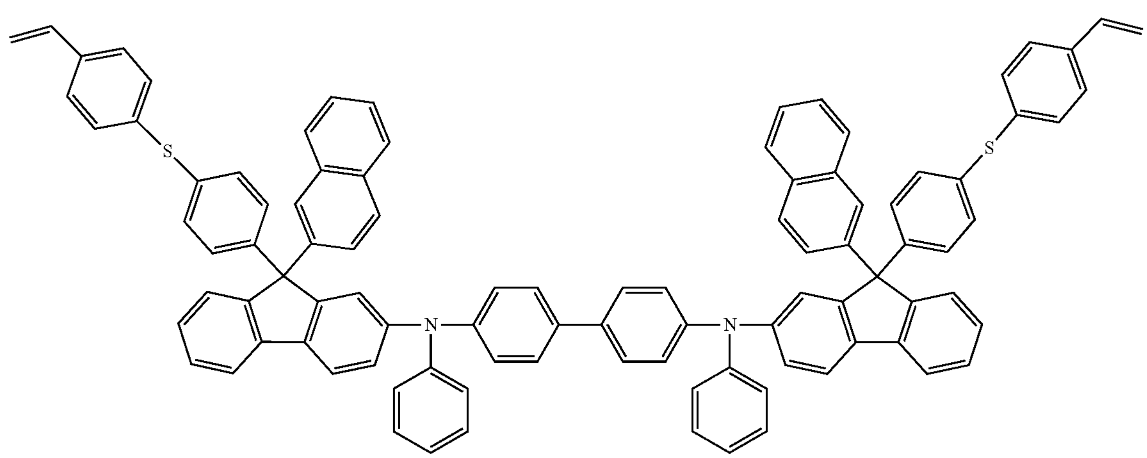

-continued
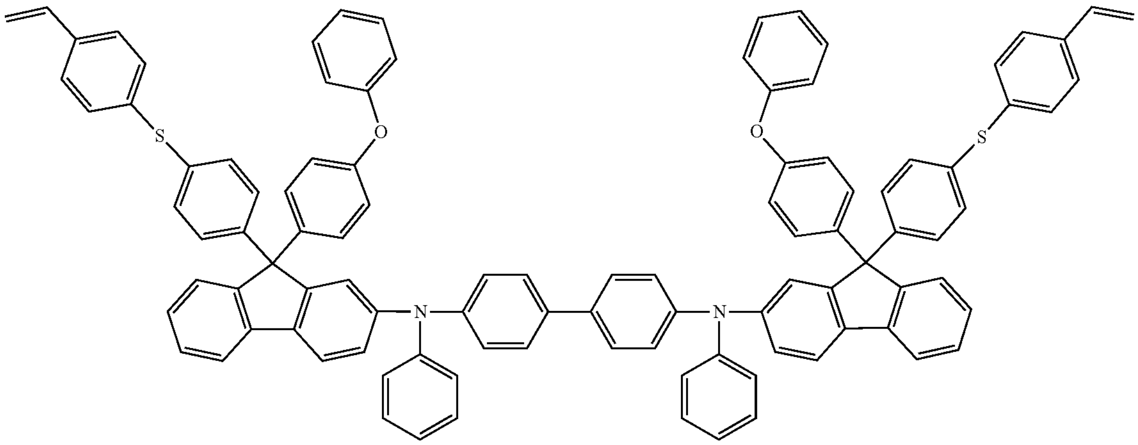
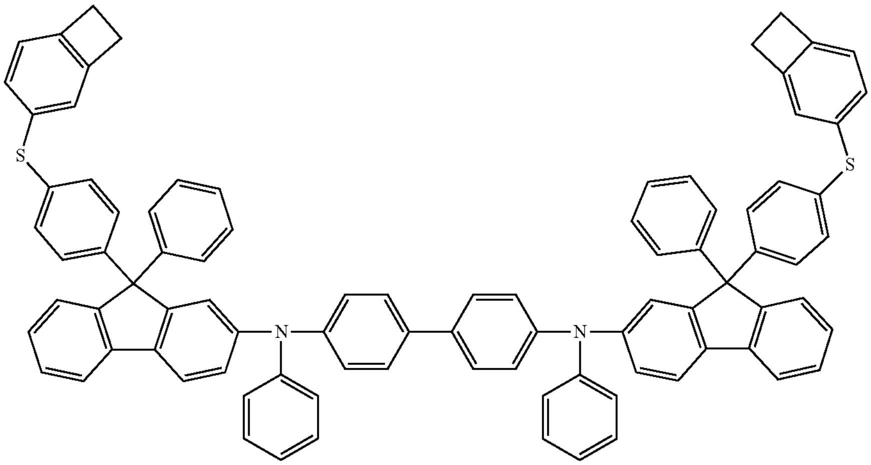
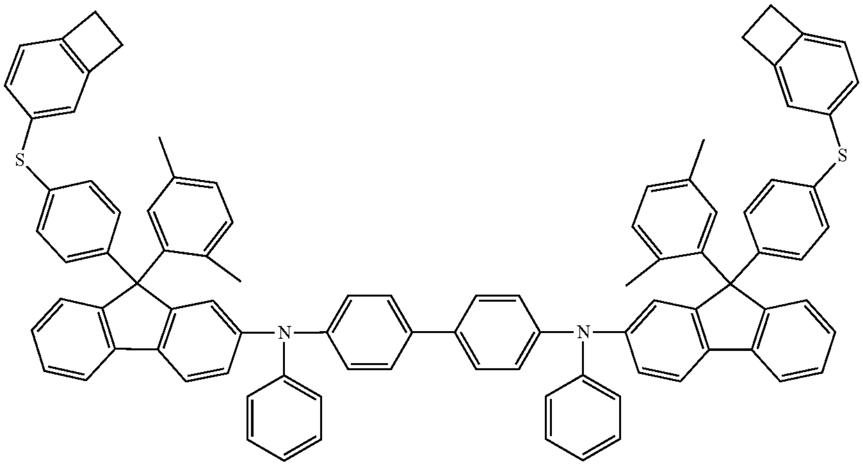 [SMILES: Cc1ccc(C)c(C2(c3ccc(Sc4ccc5c(c4)CC5)cc3)c3ccccc3-c3ccc(N(c4ccccc4)c4ccc(-c5ccc(N(c6ccccc6)c6ccc7c(c6)C(c6ccc(Sc8ccc9c(c8)CC9)cc6)(c6cc(C)ccc6C)c6ccccc6-7)cc5)cc4)cc32)c1]

-continued
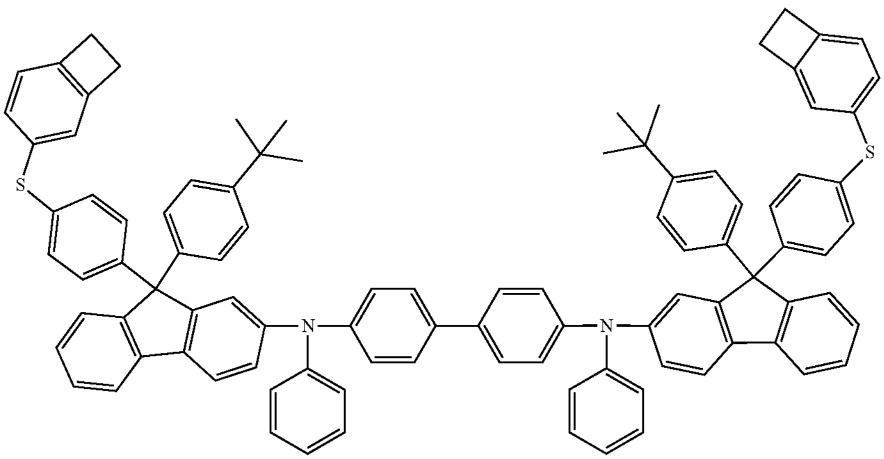
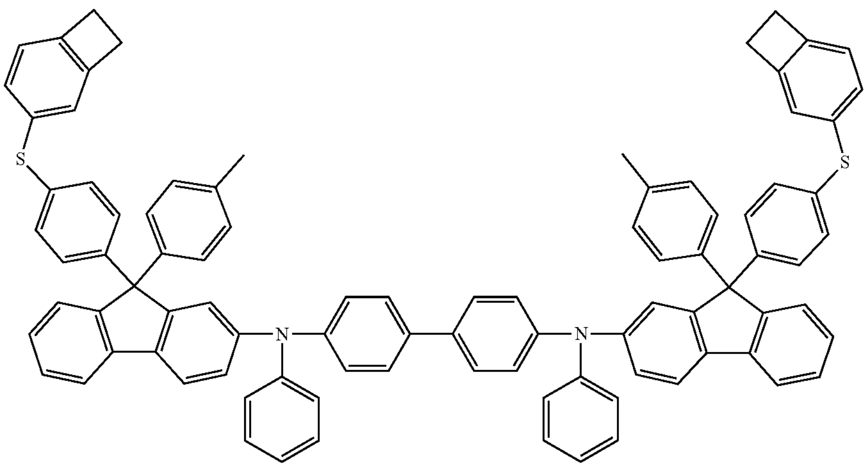
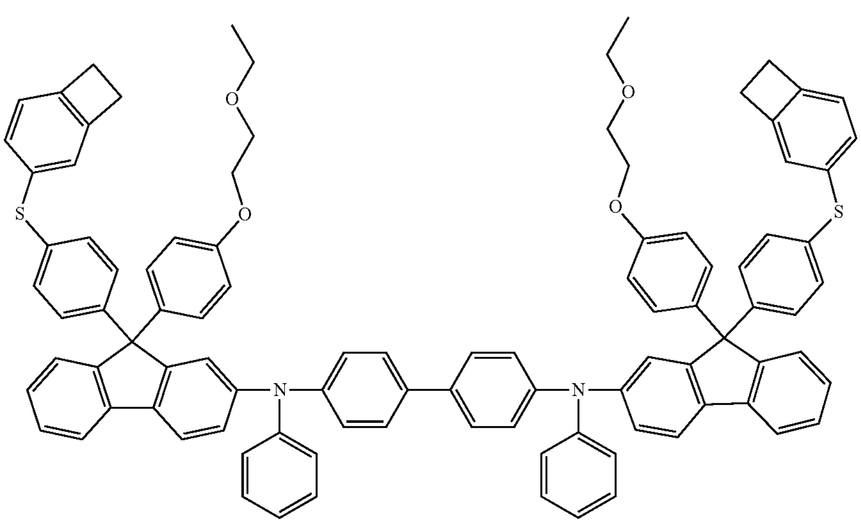

-continued
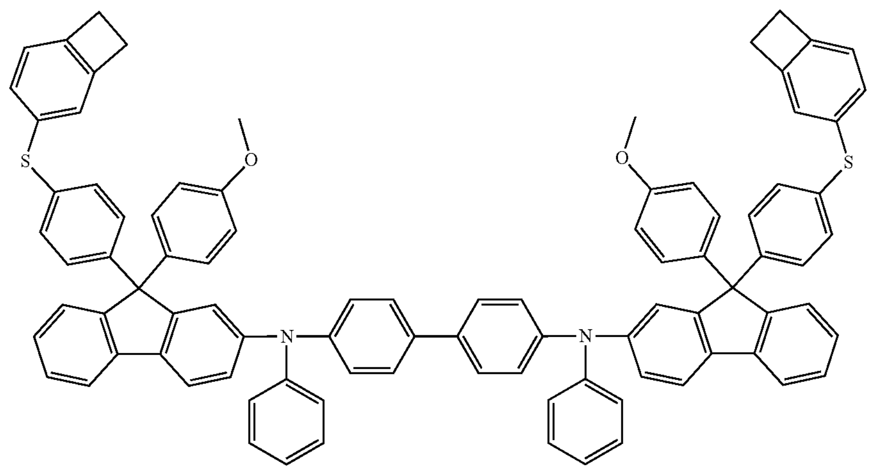
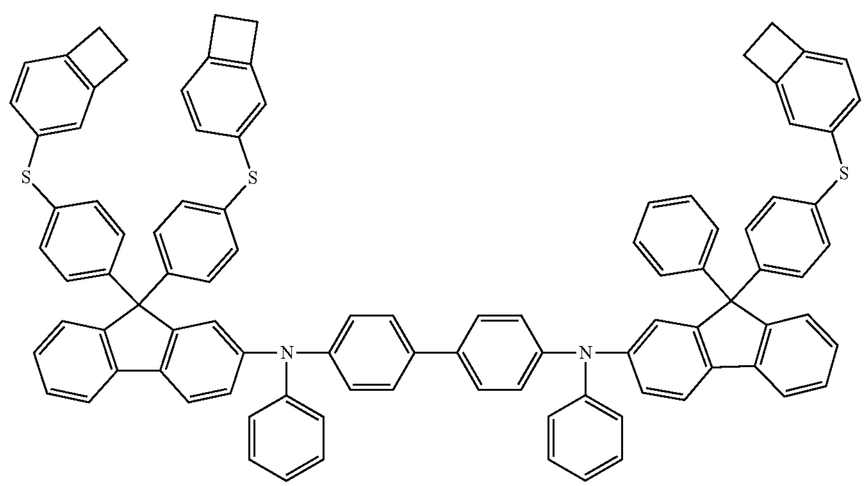
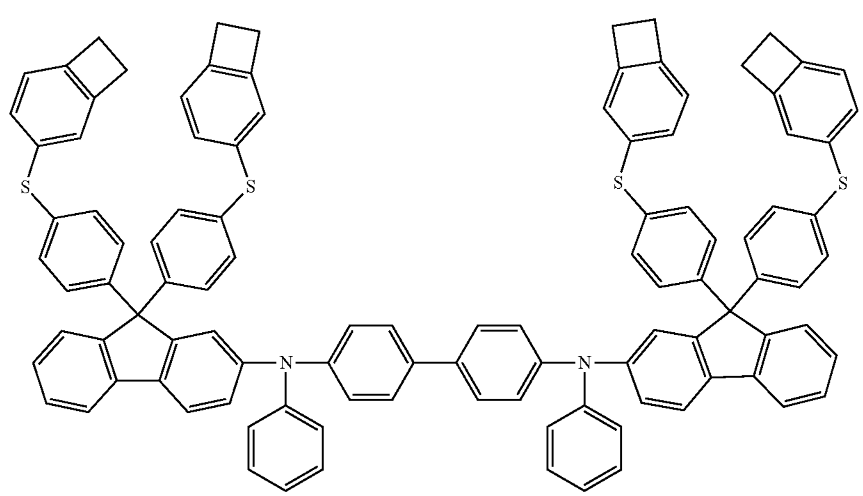

-continued
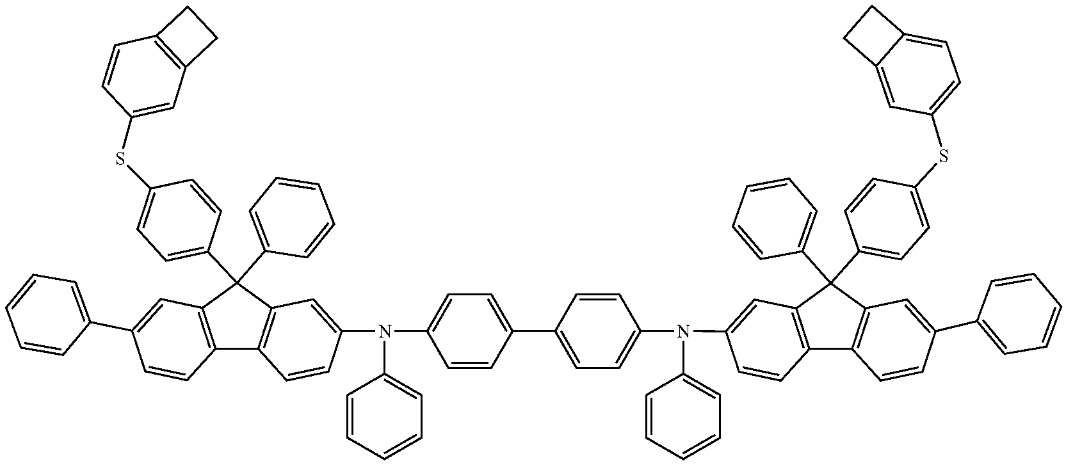
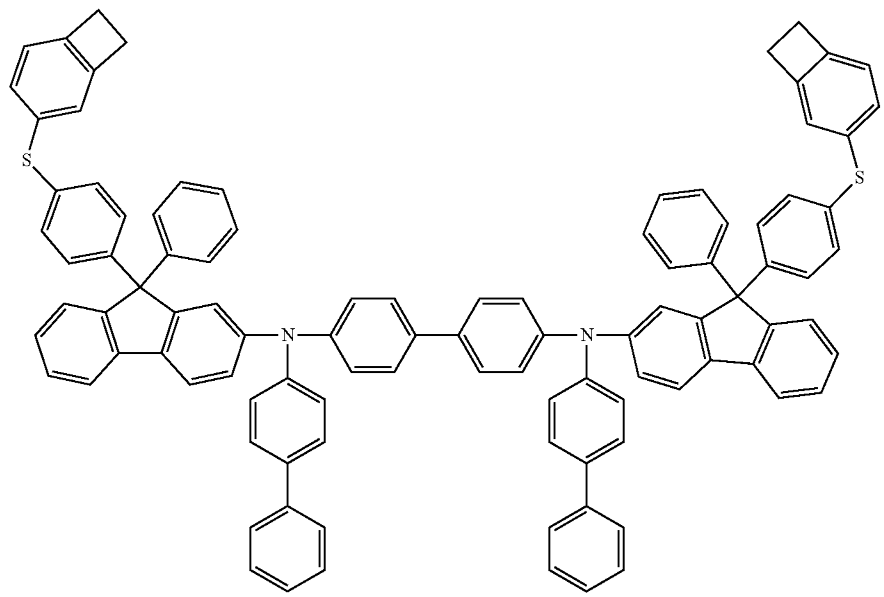 [SMILES: c1ccc(-c2ccc(N(c3ccc(-c4ccc(N(c5ccc(-c6ccccc6)cc5)c5ccc6c(c5)C(c5ccccc5)(c5ccc(Sc7ccc8c(c7)CC8)cc5)c5ccccc5-6)cc4)cc3)c3ccc4c(c3)C(c3ccccc3)(c3ccc(Sc5ccc6c(c5)CC6)cc3)c3ccccc3-4)cc2)cc1]
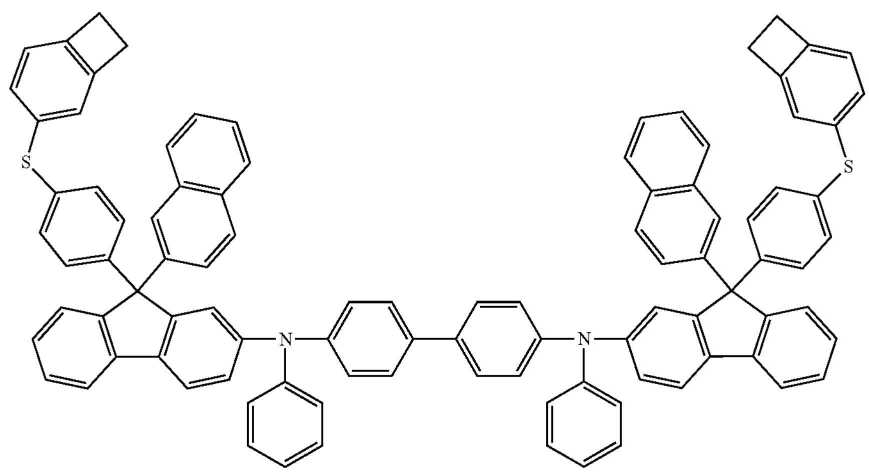

-continued
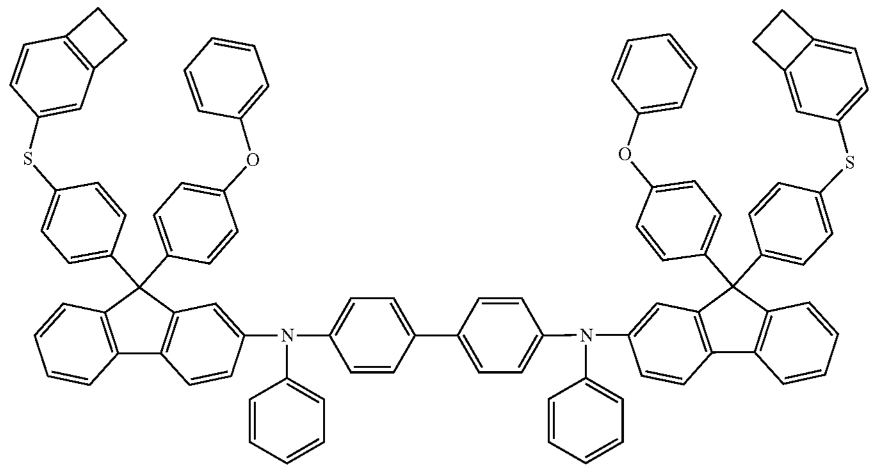
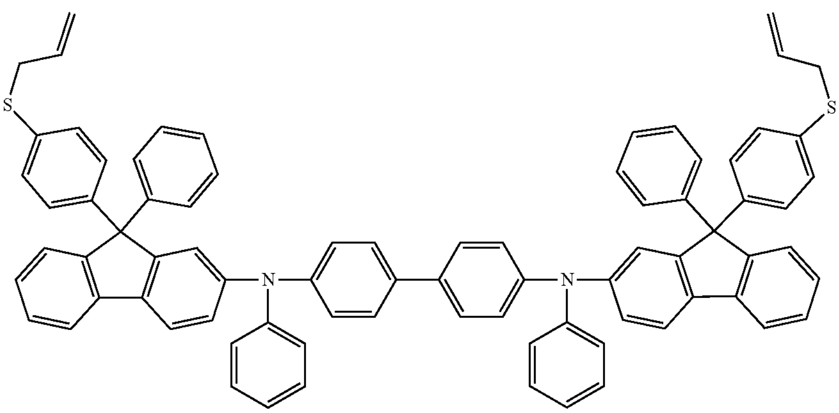
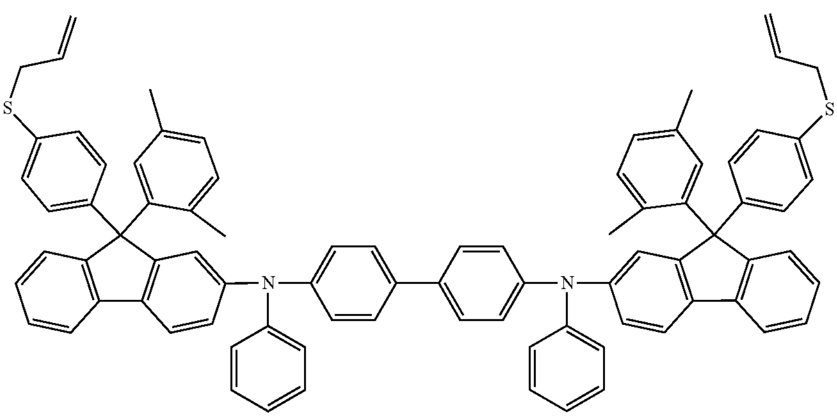
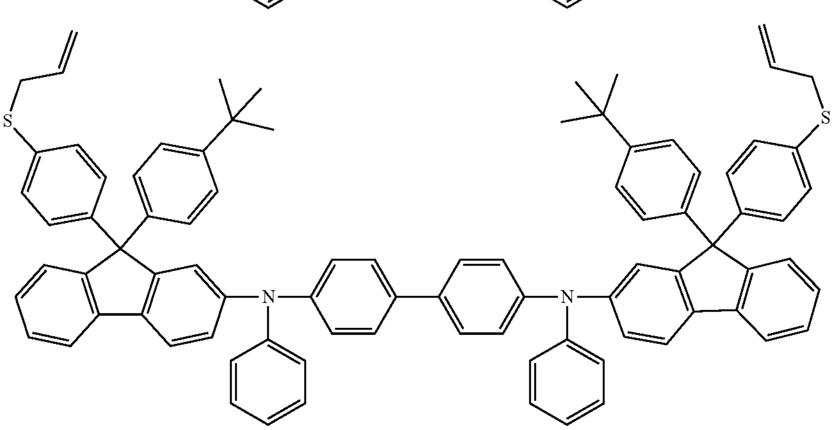

-continued
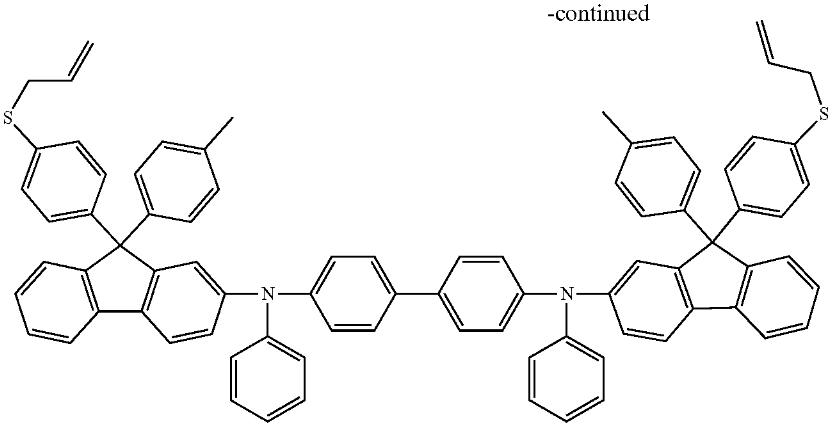
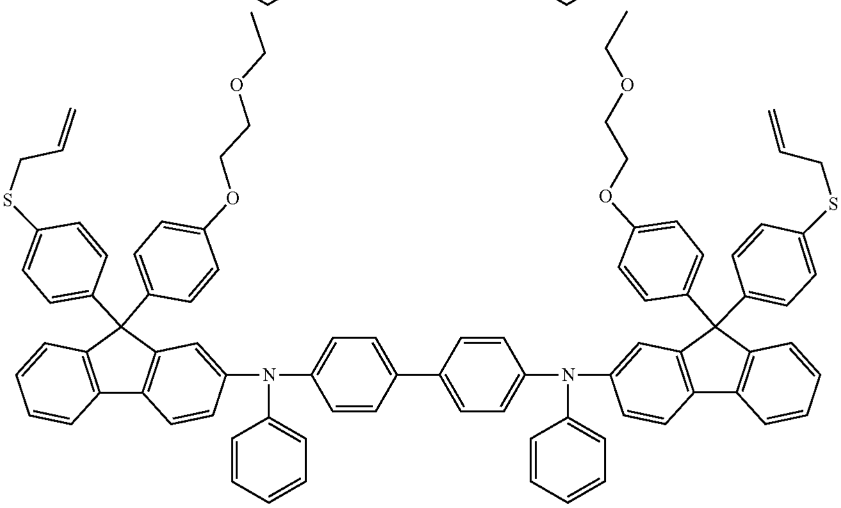
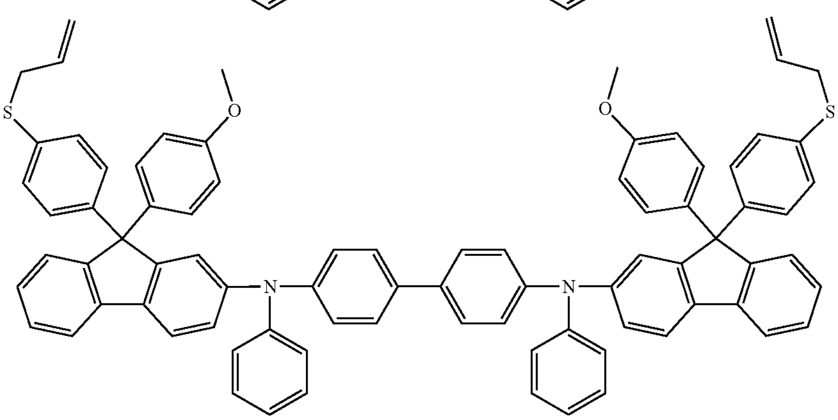
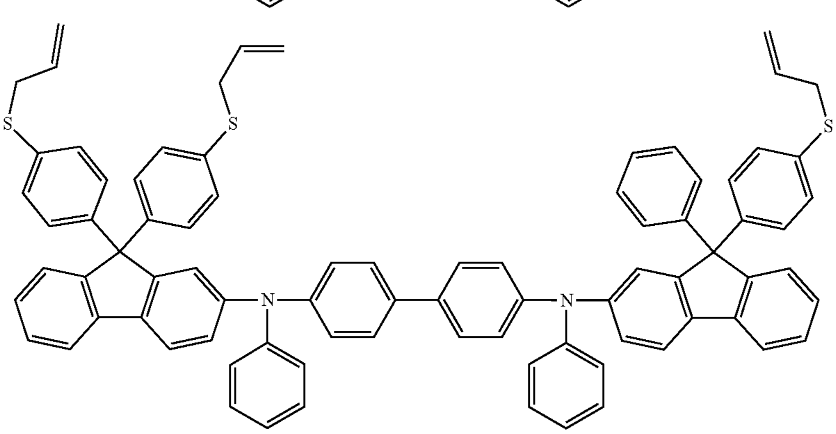

-continued
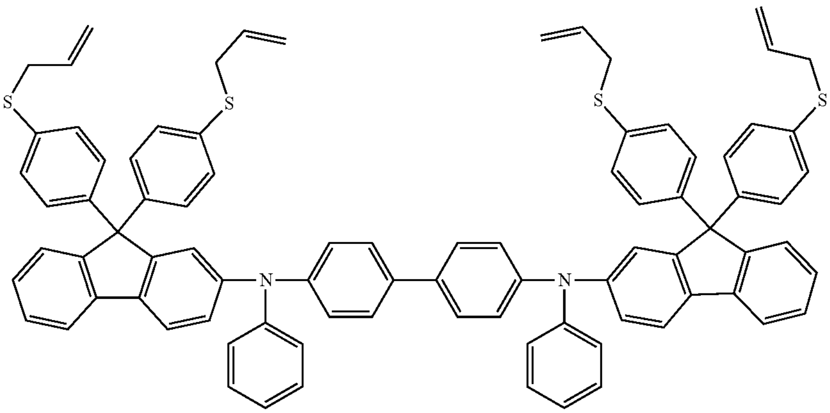
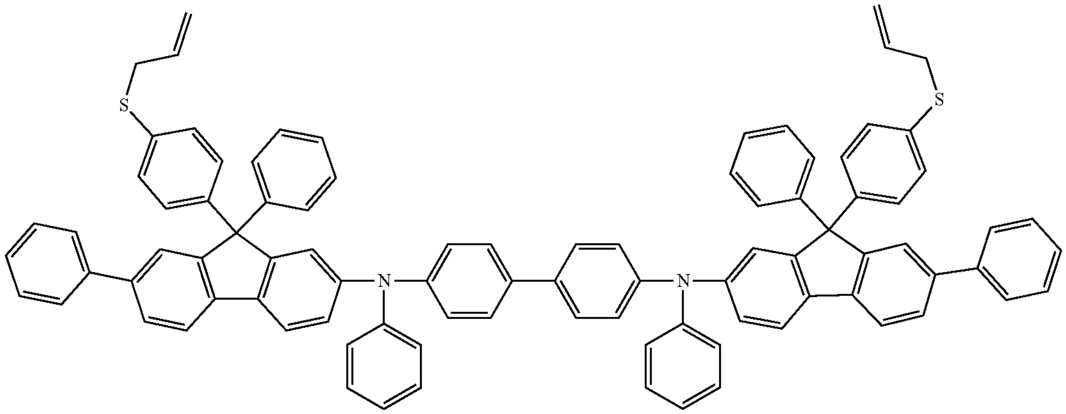
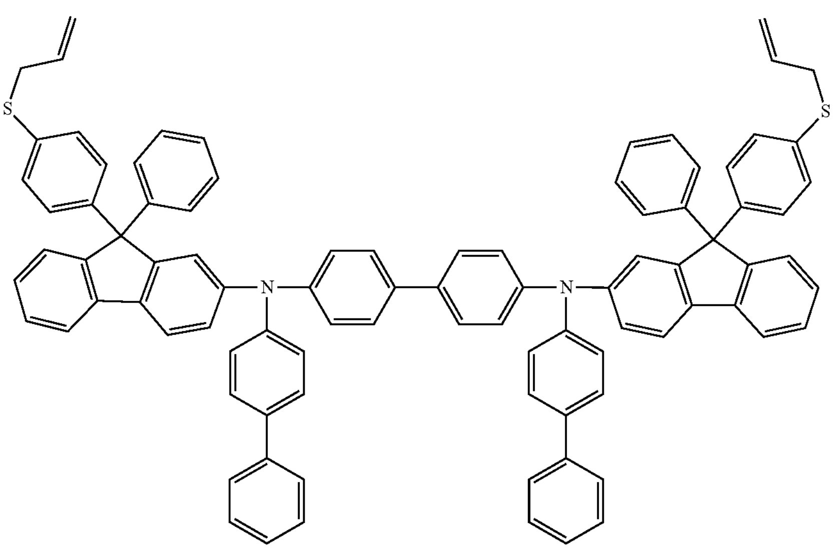

-continued
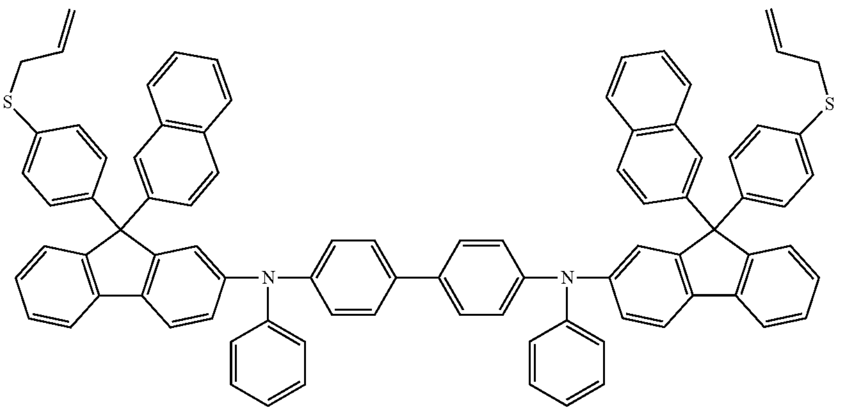
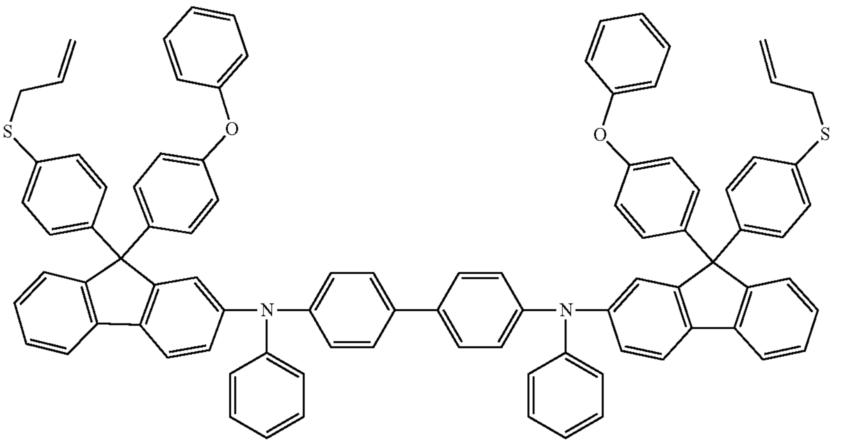
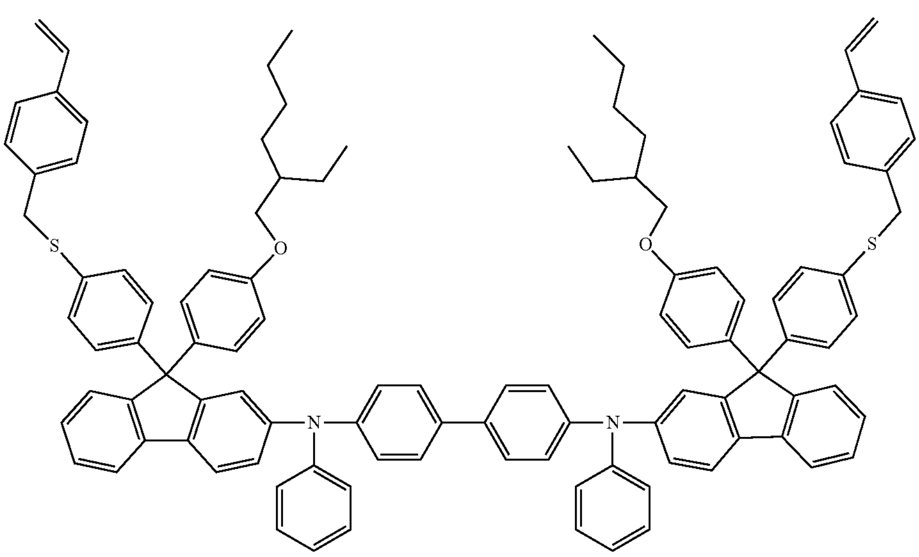

-continued
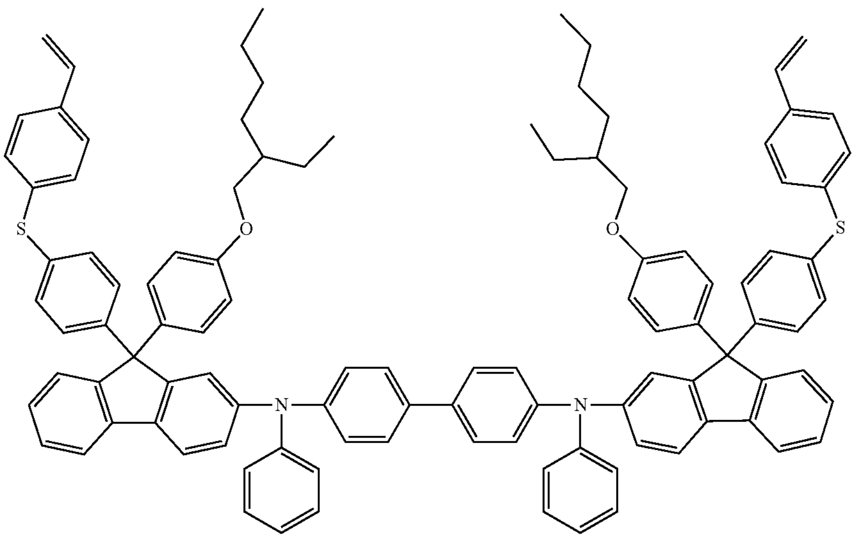 [SMILES: C=Cc1ccc(Sc2ccc(C3(c4ccc(OCC(CC)CCCC)cc4)c4ccccc4-c4ccc(N(c5ccccc5)c5ccc(-c6ccc(N(c7ccccc7)c7ccc8c(c7)C(c7ccc(OCC(CC)CCCC)cc7)(c7ccc(Sc9ccc(C=C)cc9)cc7)c7ccccc7-8)cc6)cc5)cc43)cc2)cc1]
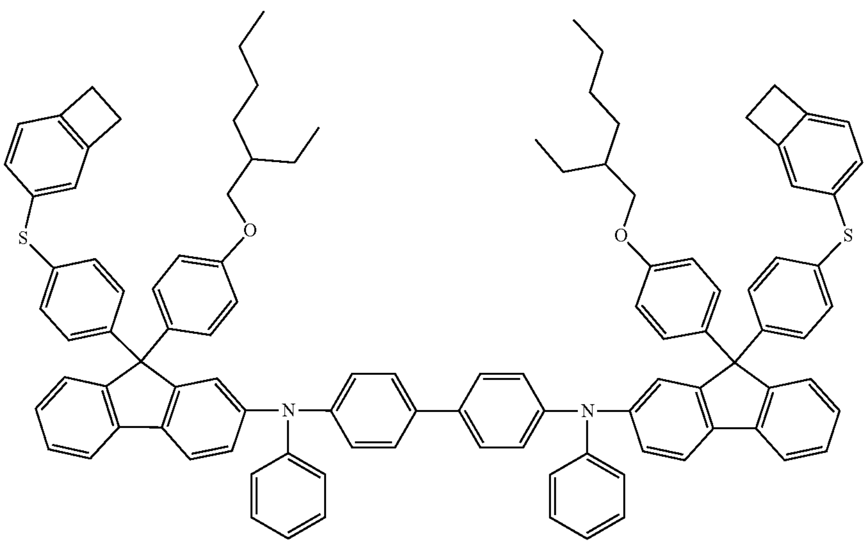
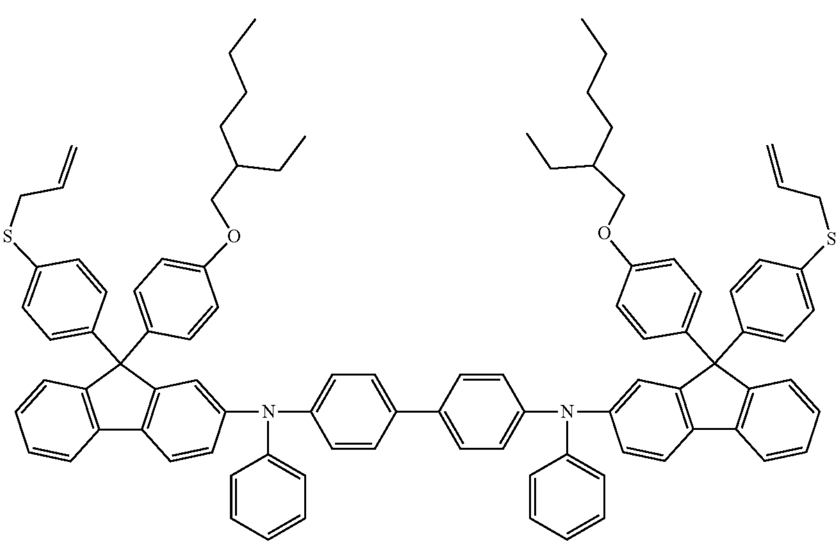

-continued
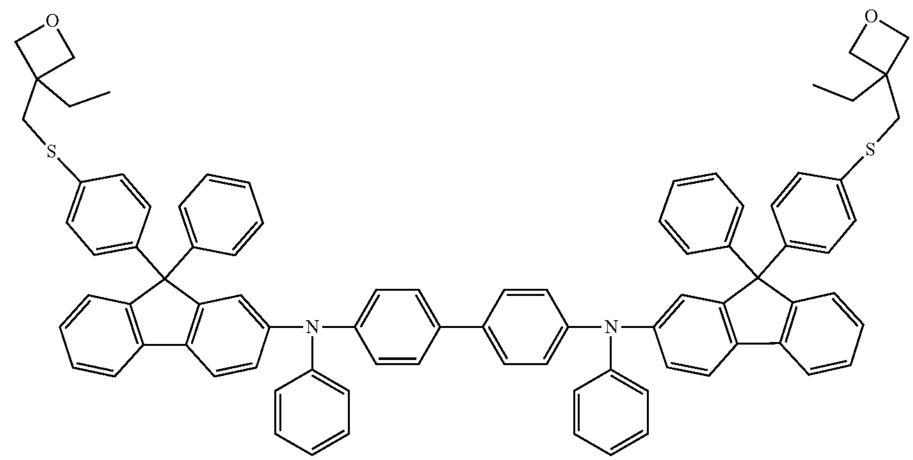
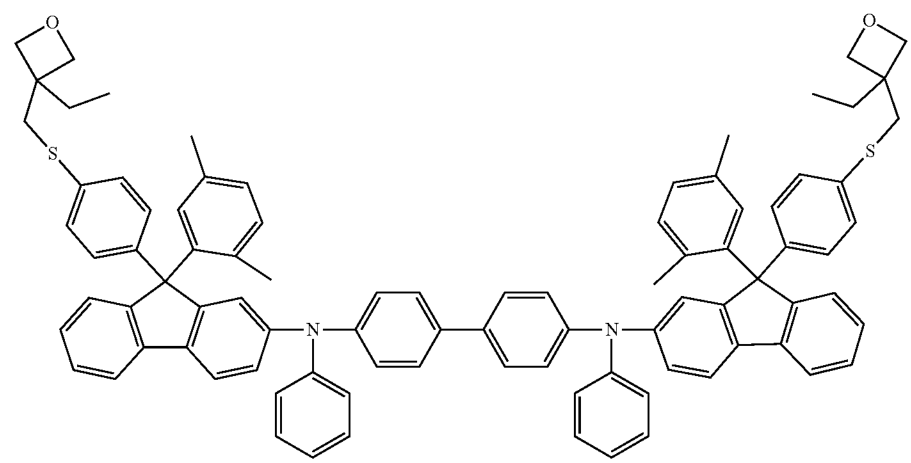
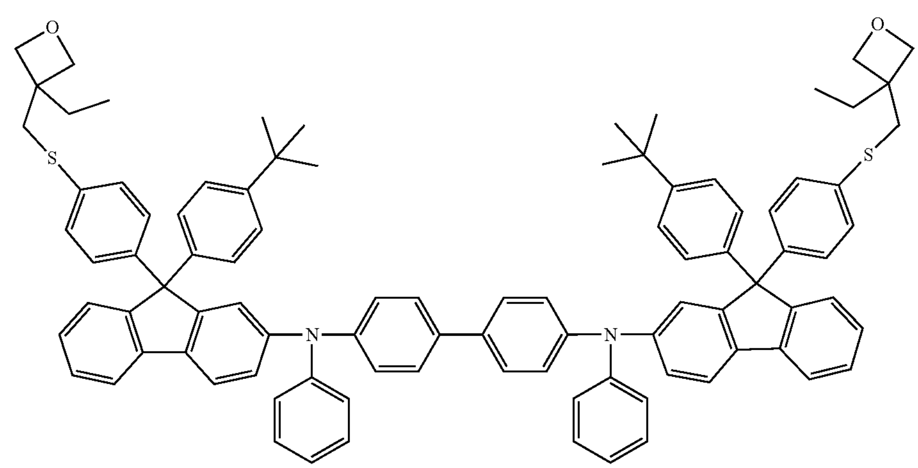

-continued
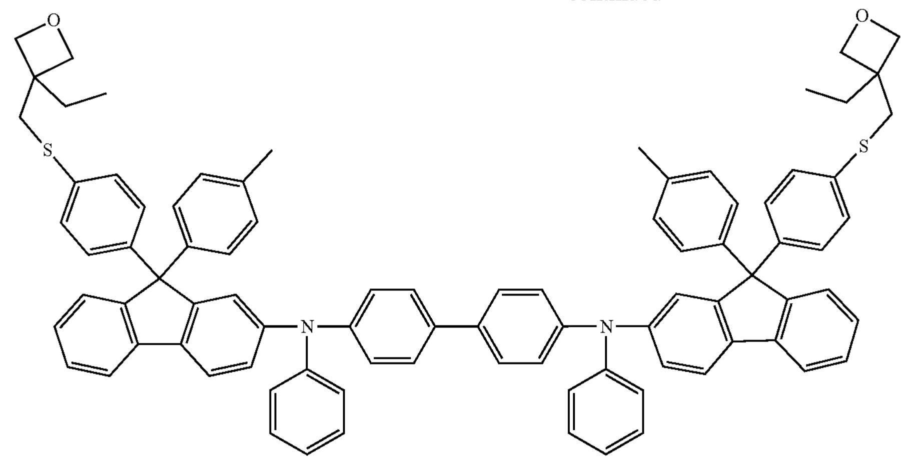
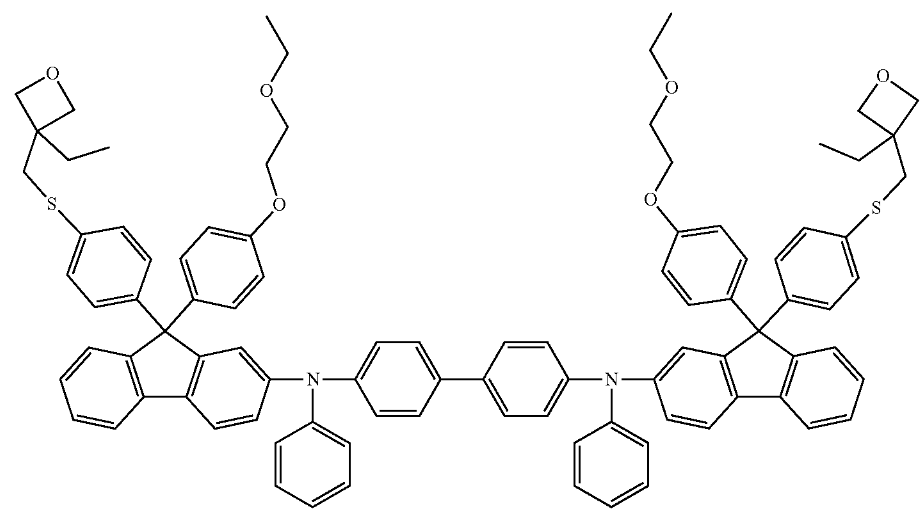
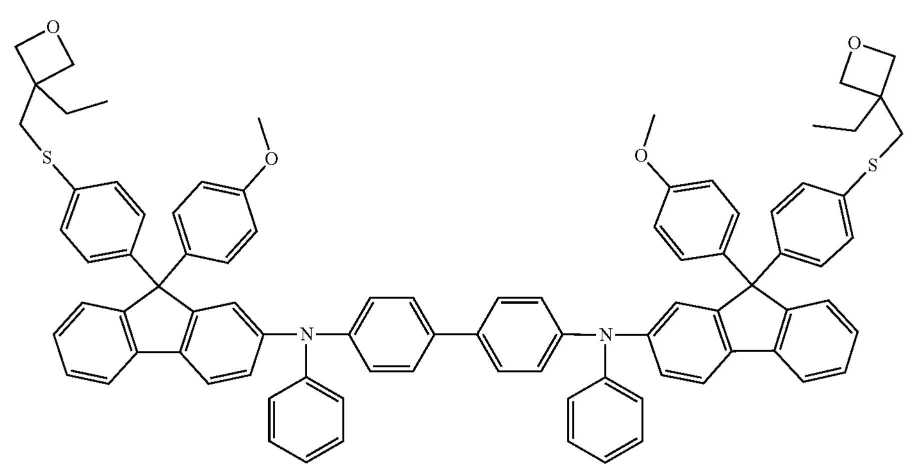 [SMILES: CCC1(CSc2ccc(C3(c4ccc(OC)cc4)c4ccccc4-c4ccc(N(c5ccccc5)c5ccc(-c6ccc(N(c7ccccc7)c7ccc8c(c7)C(c7ccc(OC)cc7)(c7ccc(SCC9(CC)COC9)cc7)c7ccccc7-8)cc6)cc5)cc43)cc2)COC1]

-continued
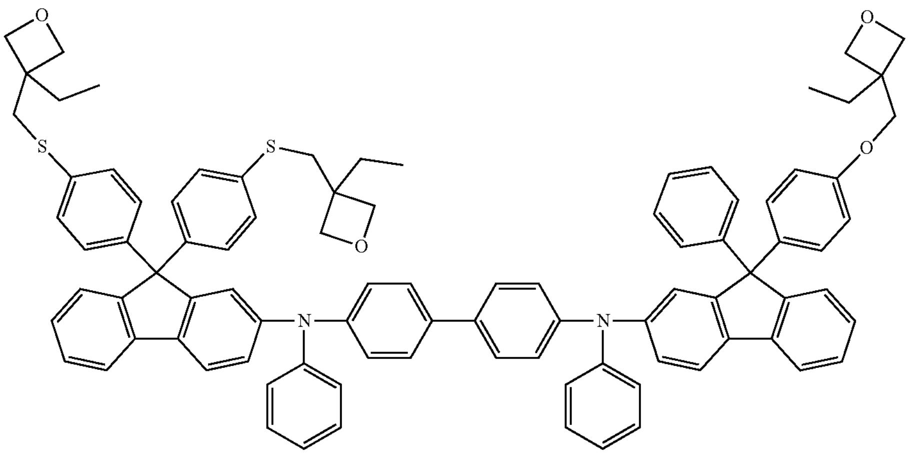
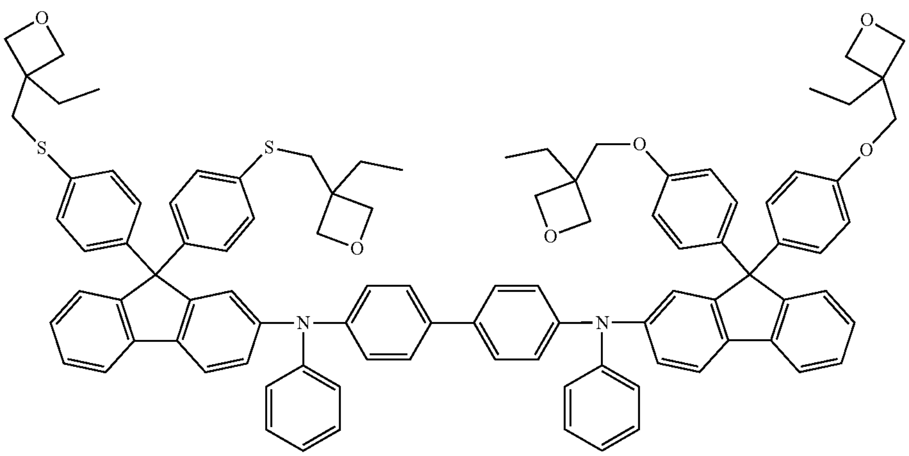
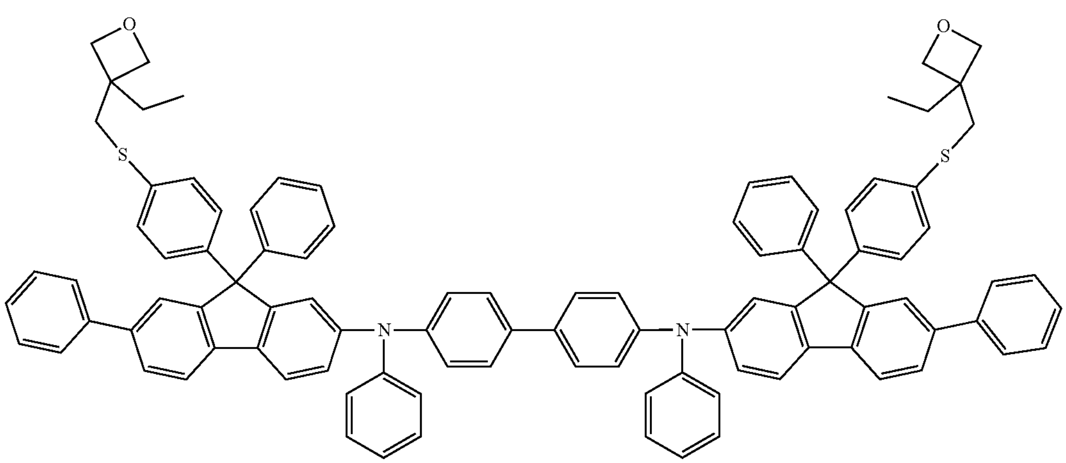

-continued
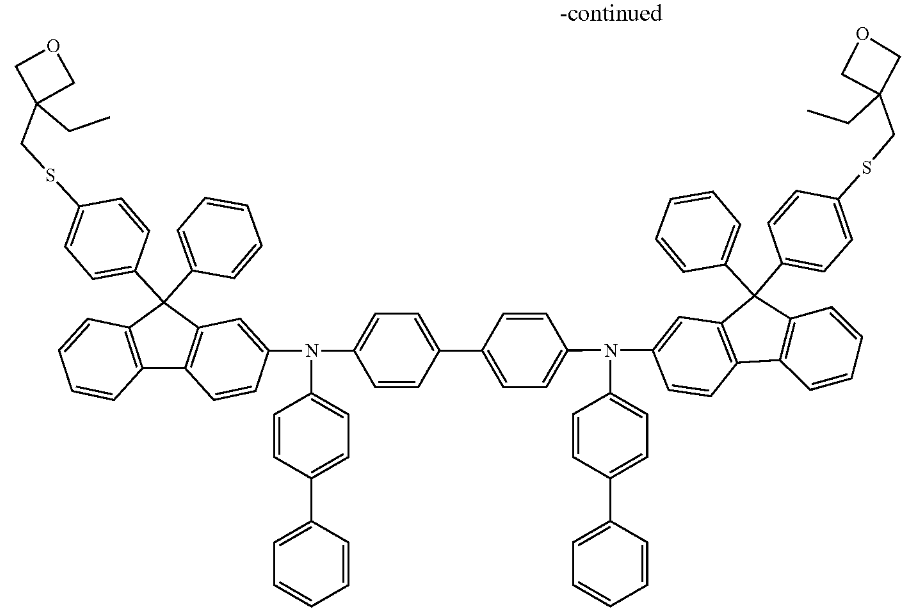
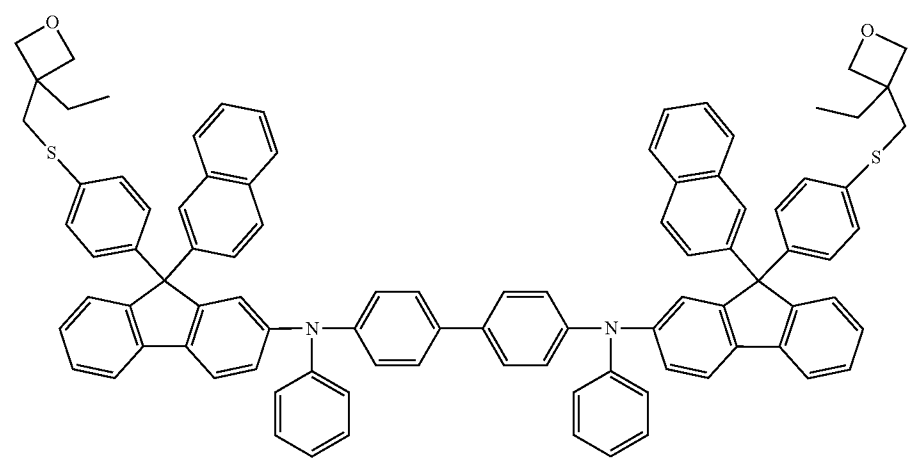
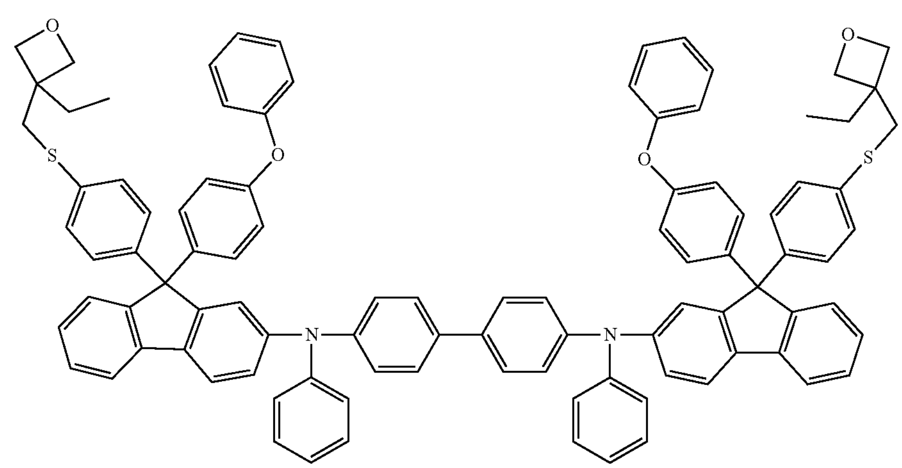

-continued
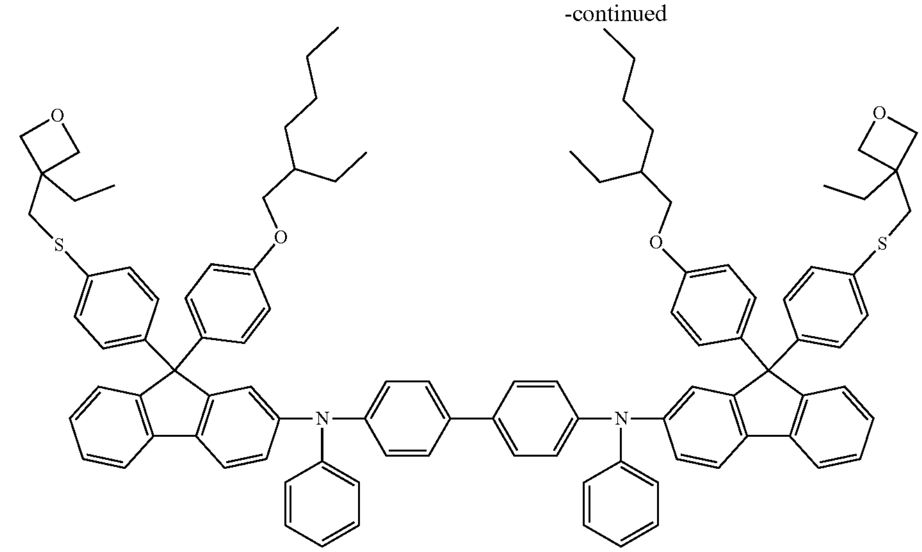
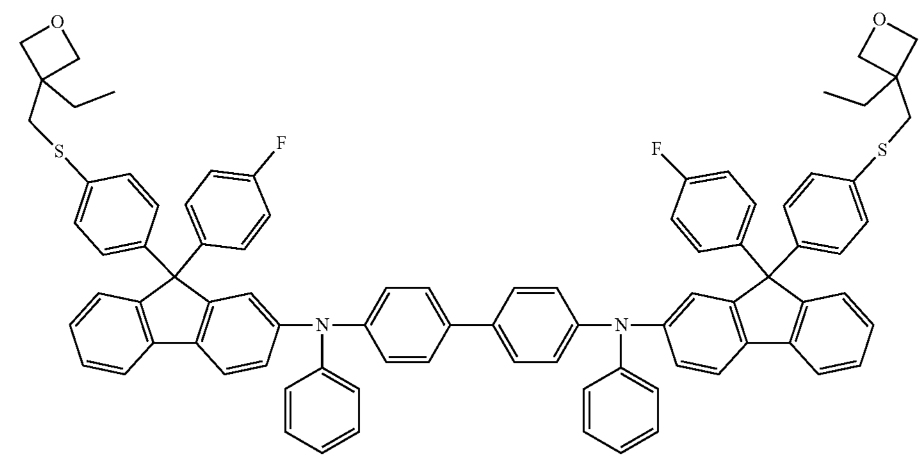 [SMILES: CCC1(CSc2ccc(C3(c4ccc(F)cc4)c4ccccc4-c4ccc(N(c5ccccc5)c5ccc(-c6ccc(N(c7ccccc7)c7ccc8c(c7)C(c7ccc(F)cc7)(c7ccc(SCC9(CC)COC9)cc7)c7ccccc7-8)cc6)cc5)cc43)cc2)COC1]
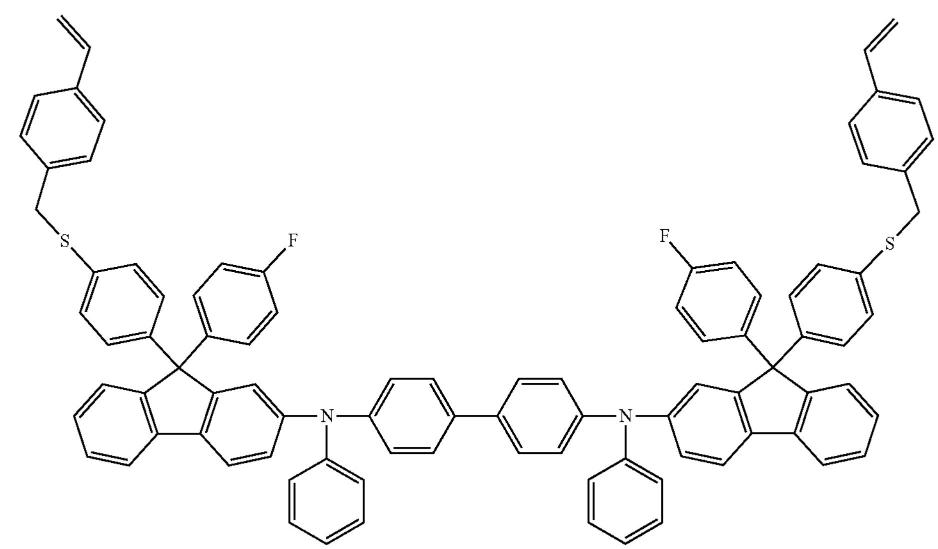

-continued
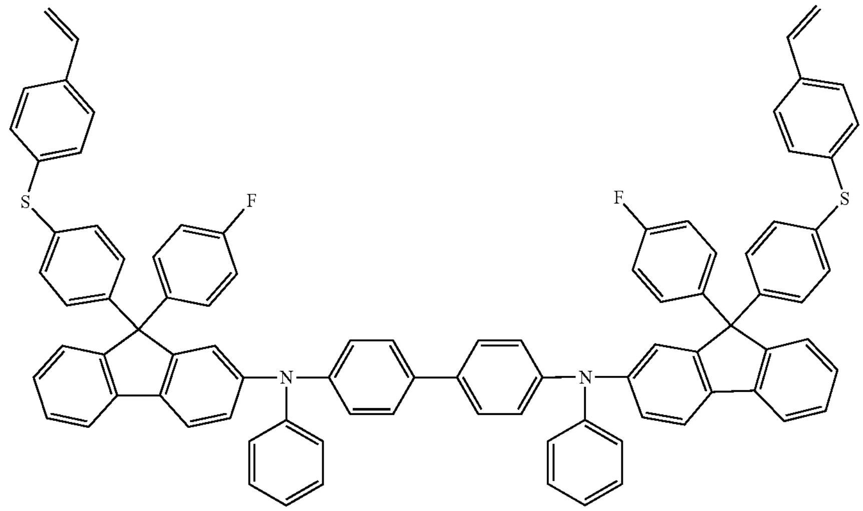
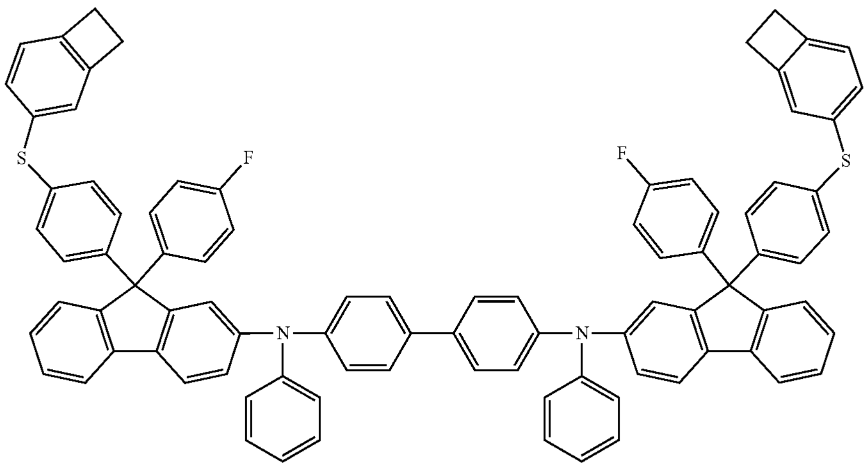
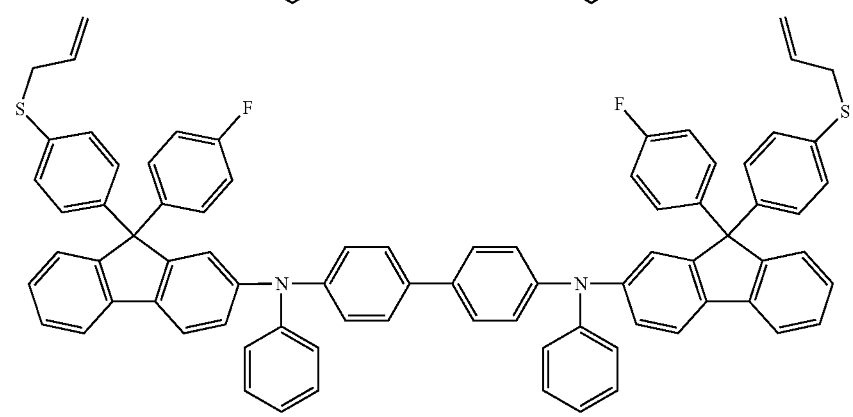
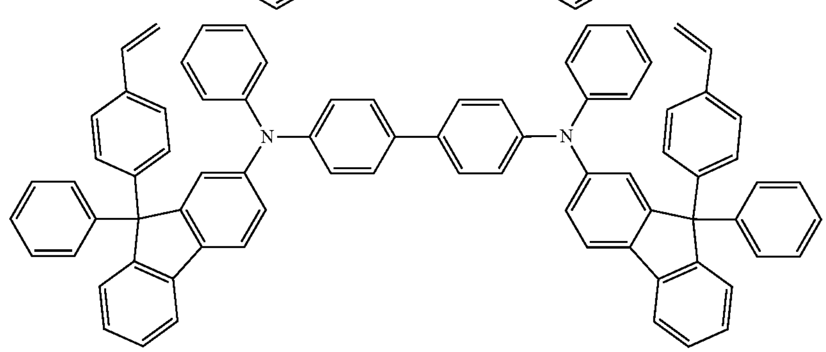

-continued
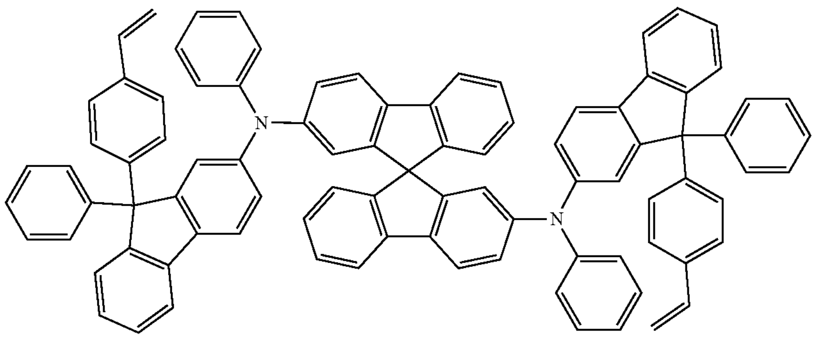
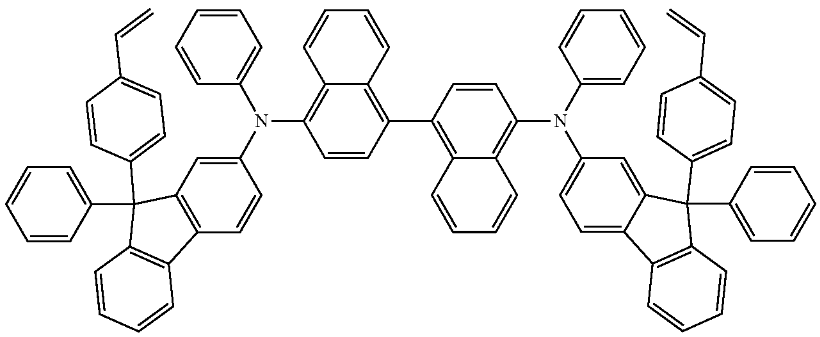
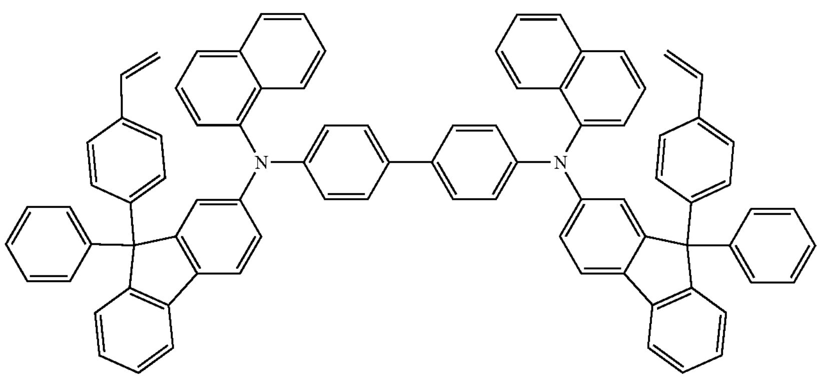
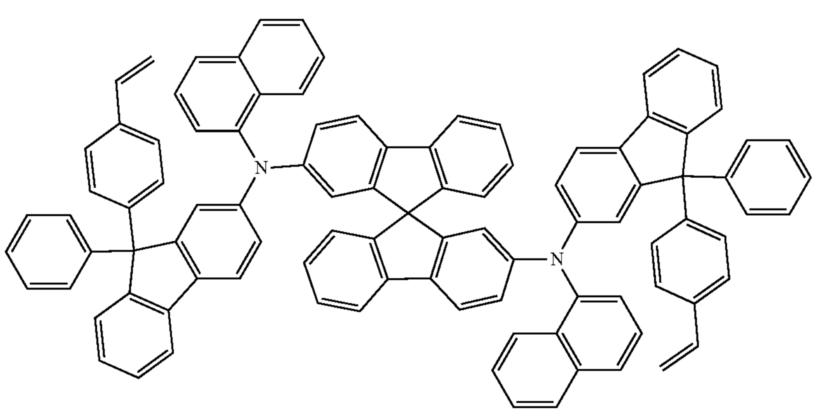

-continued
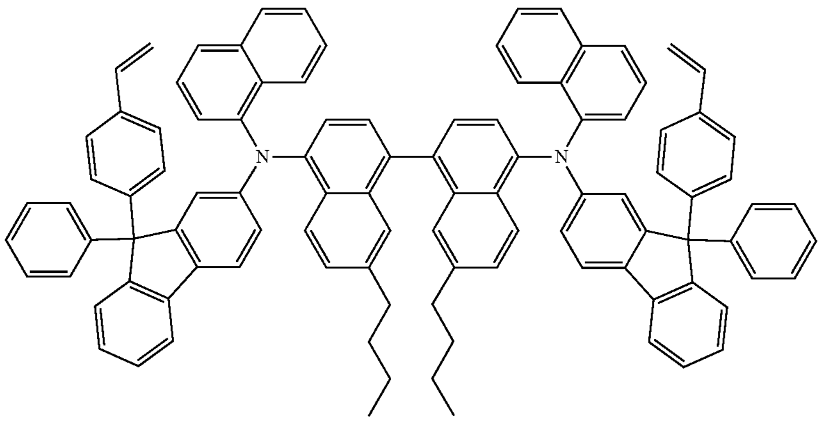
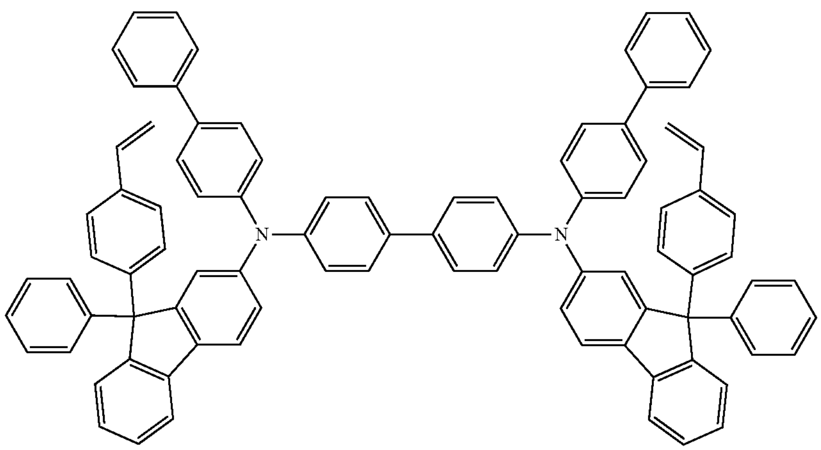
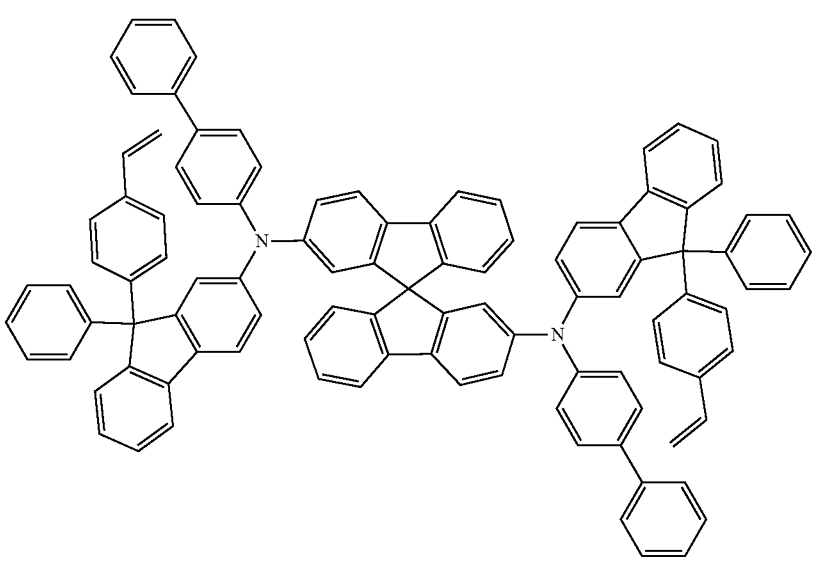

-continued
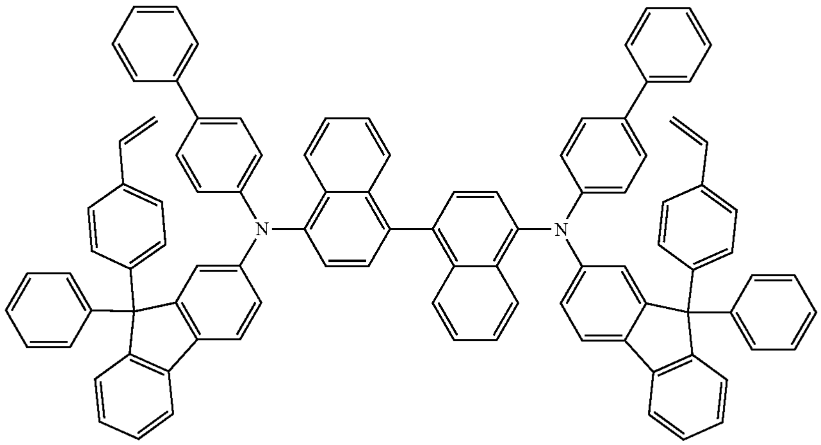
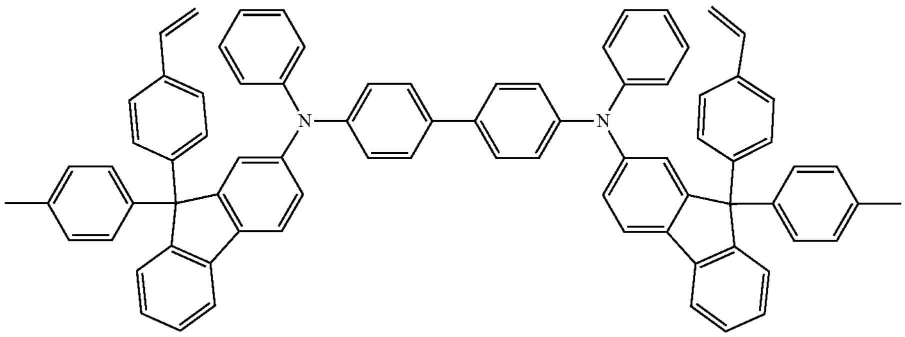
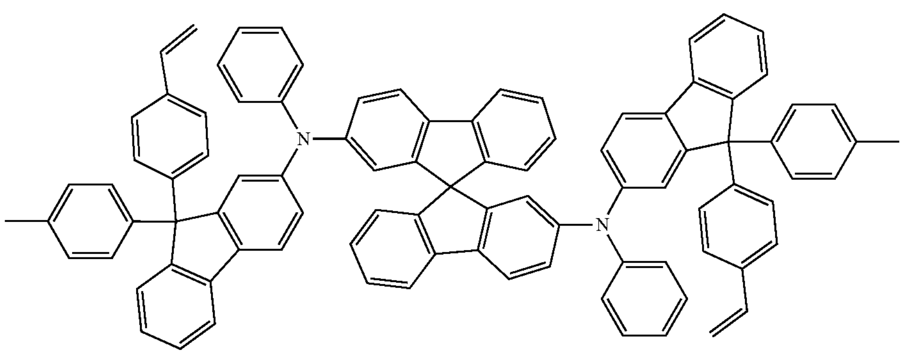
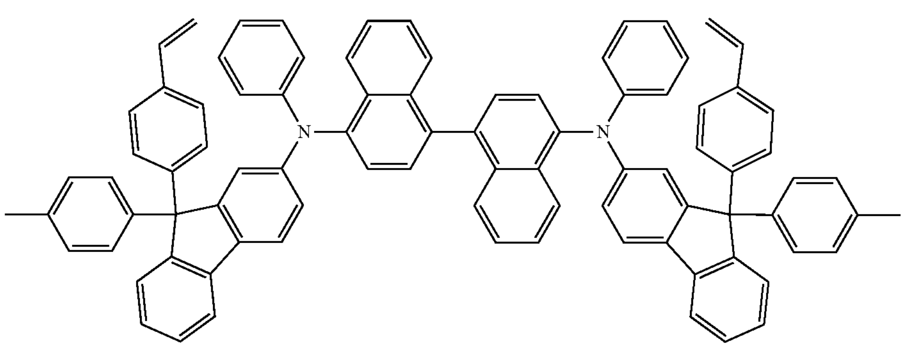

-continued
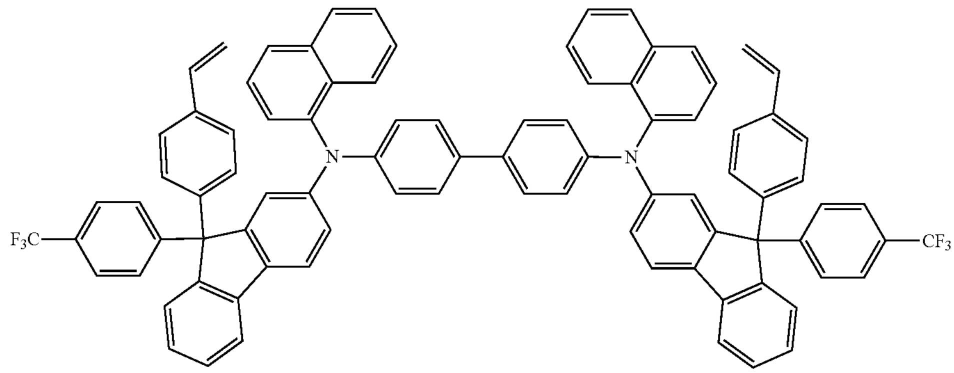
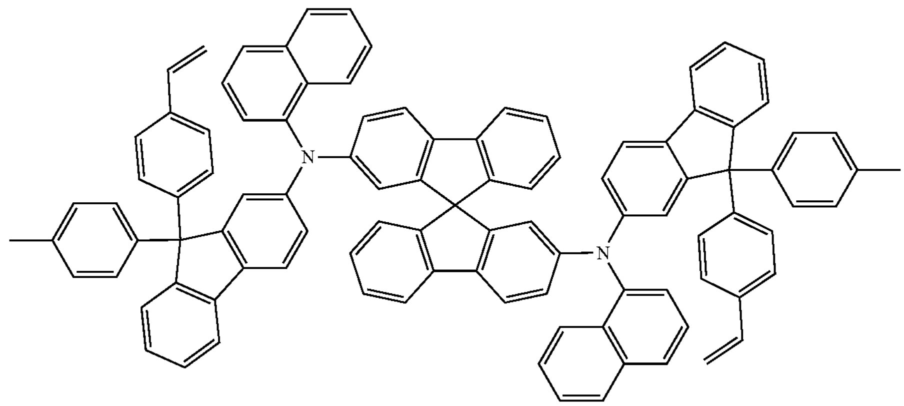
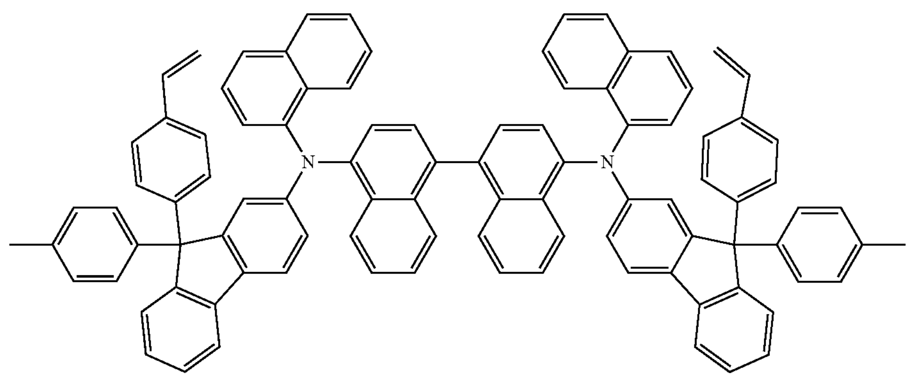
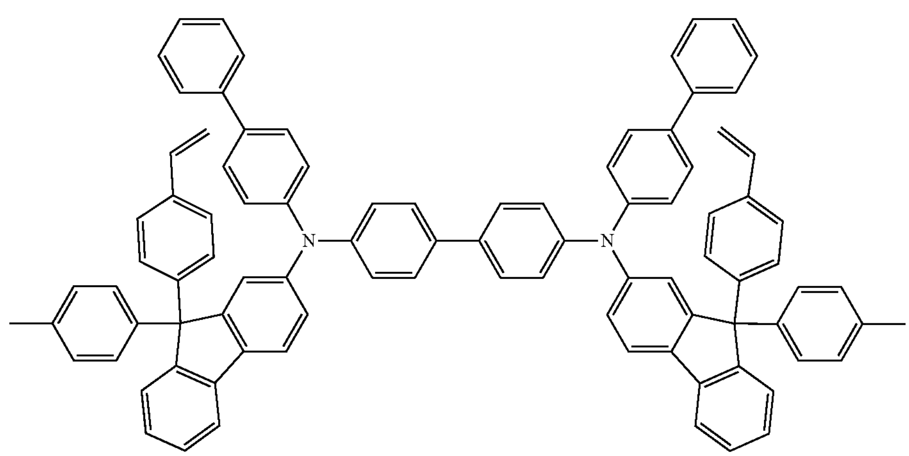

-continued
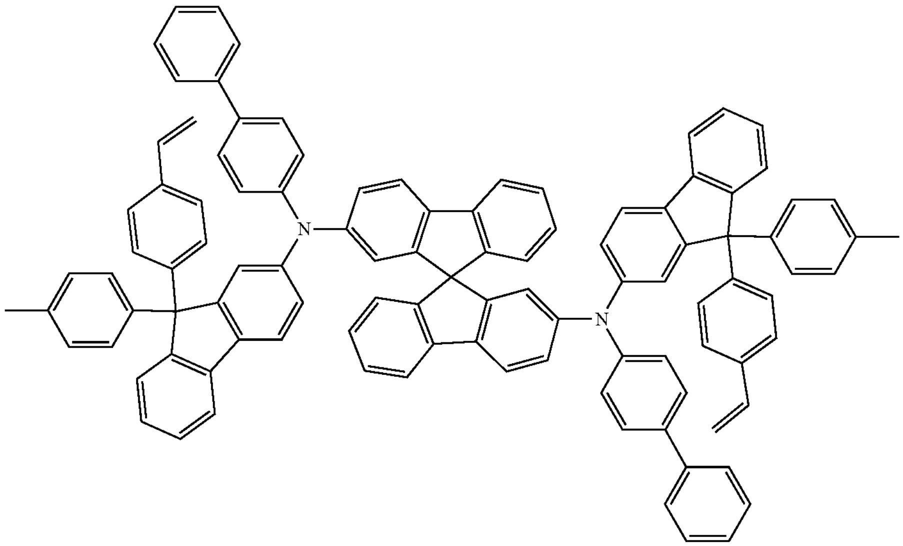
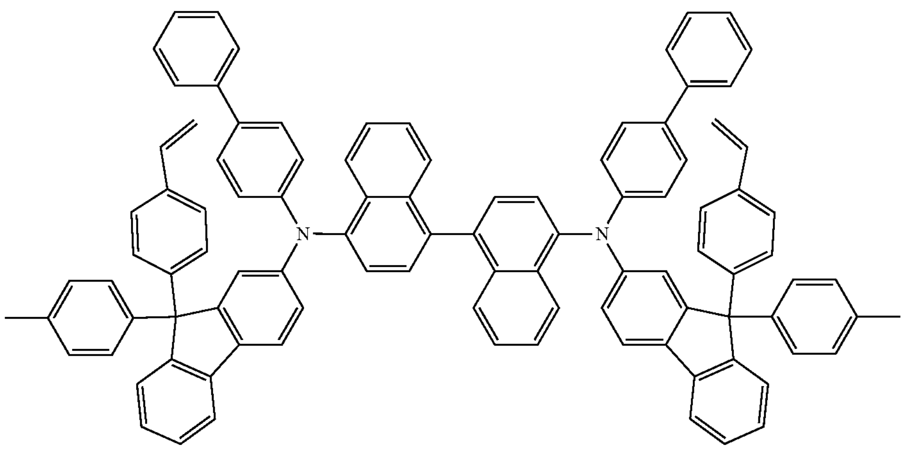
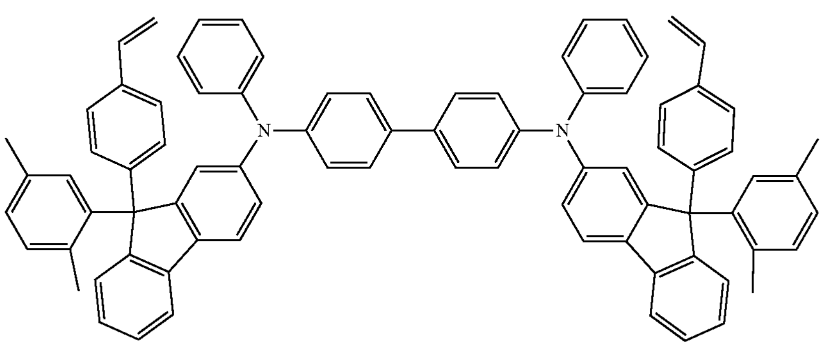
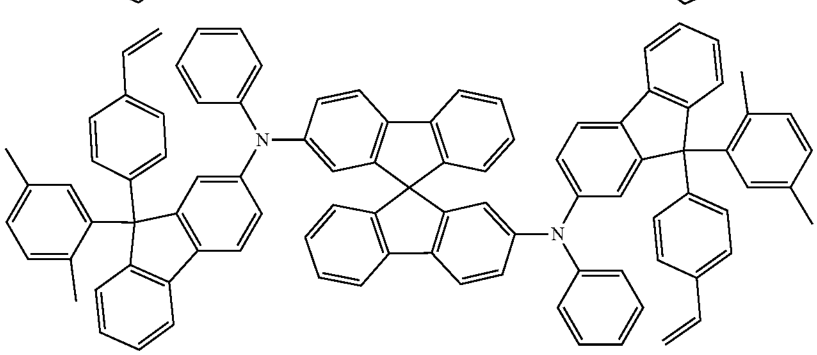

-continued
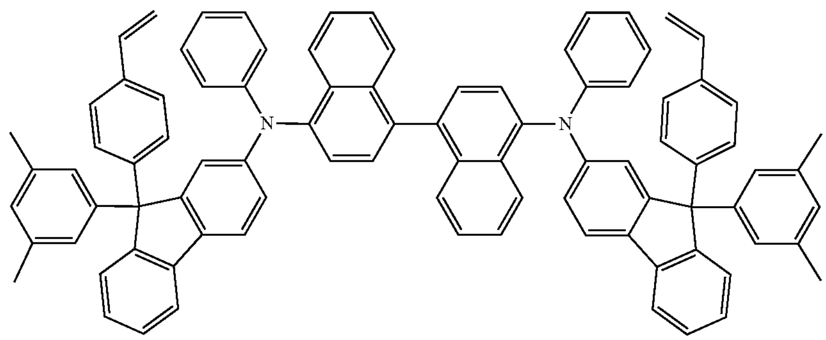
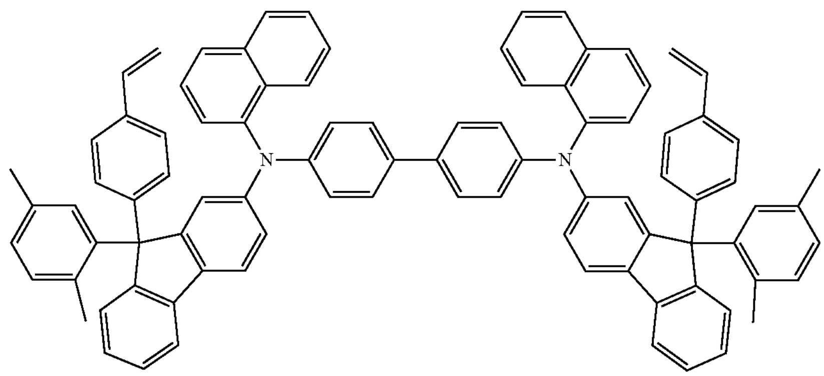
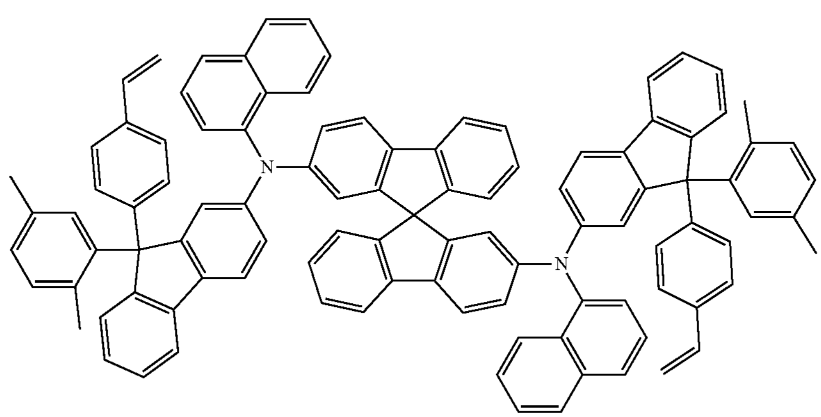
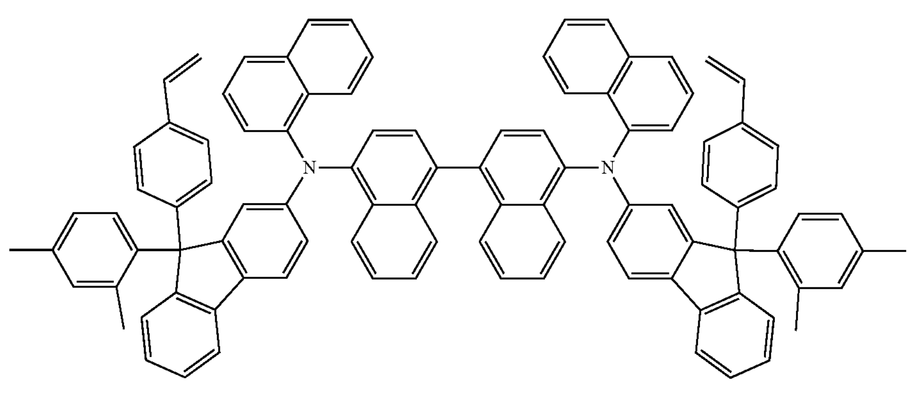

-continued
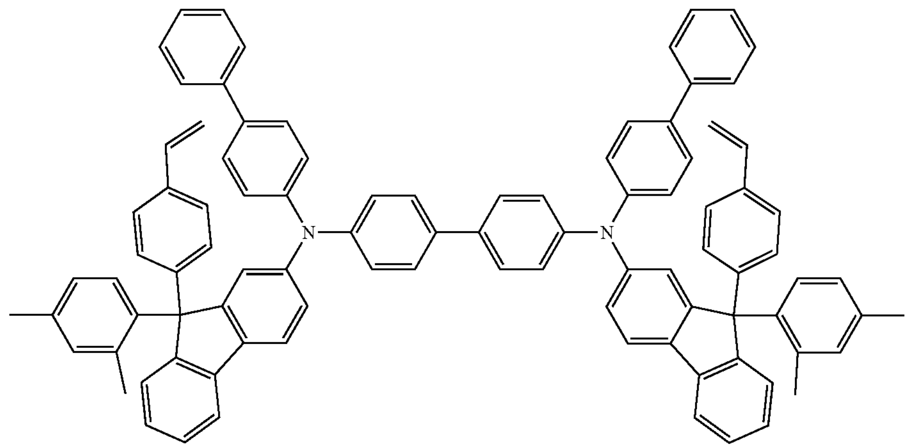
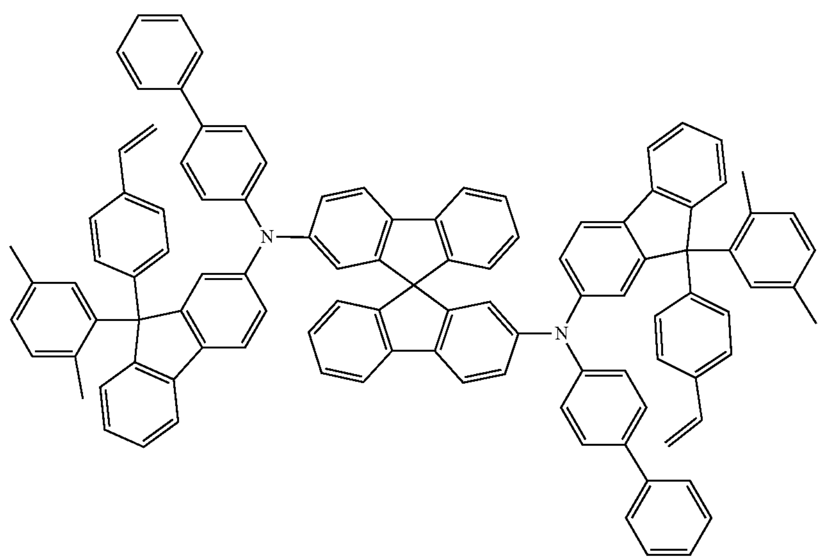
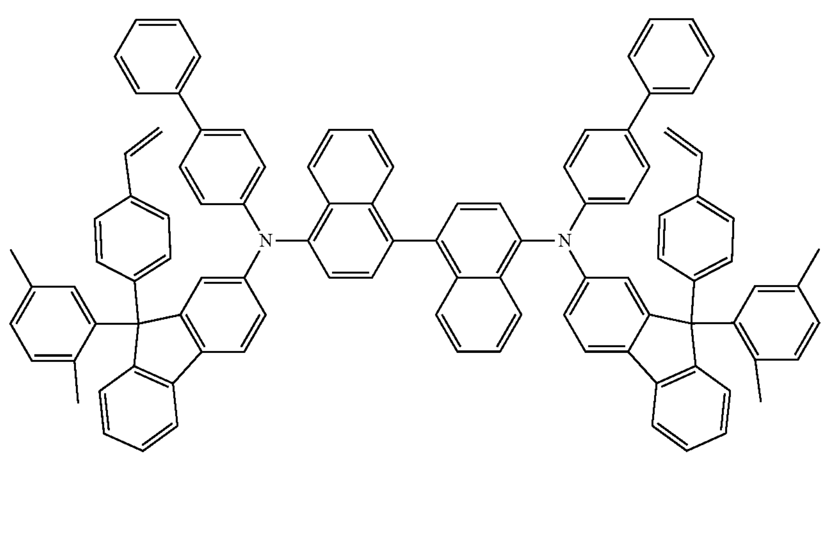

-continued
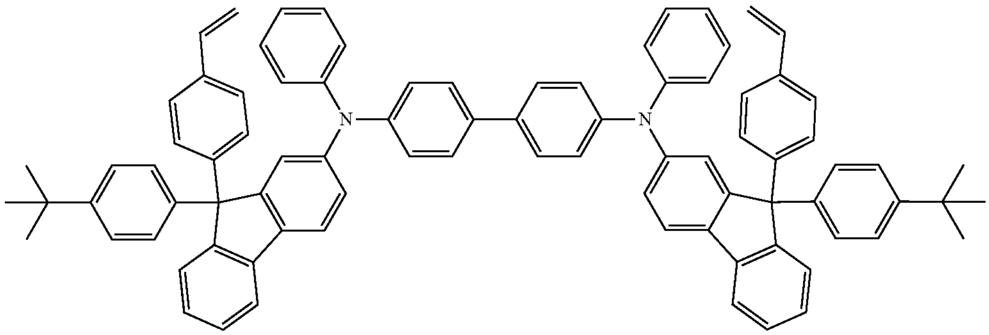
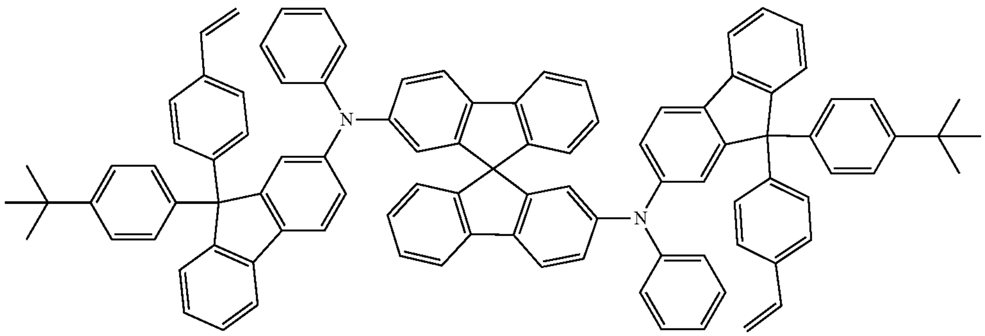
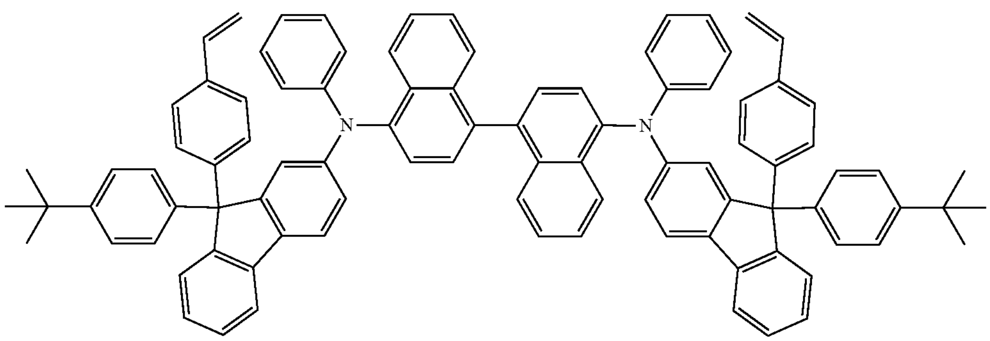
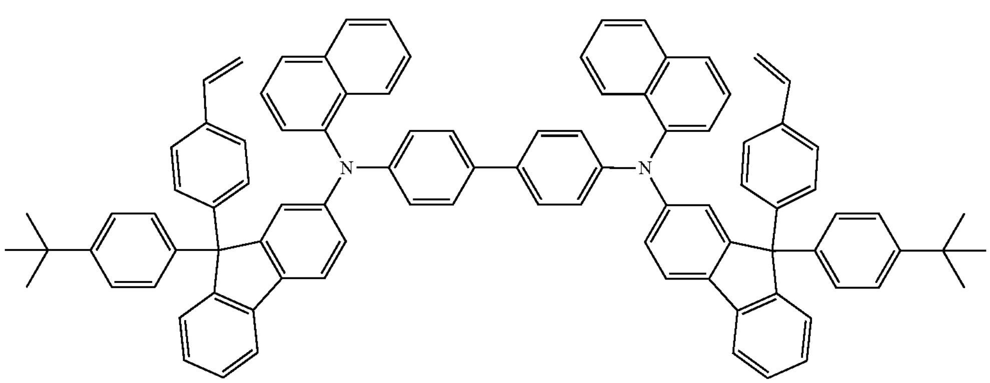

-continued
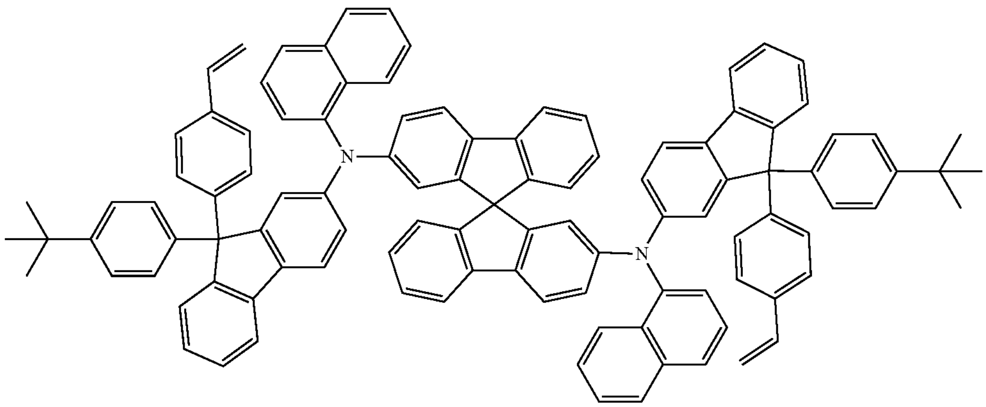
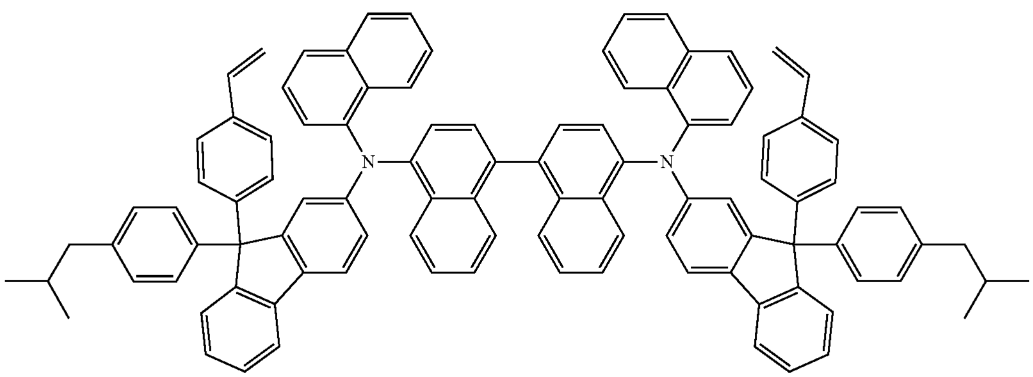
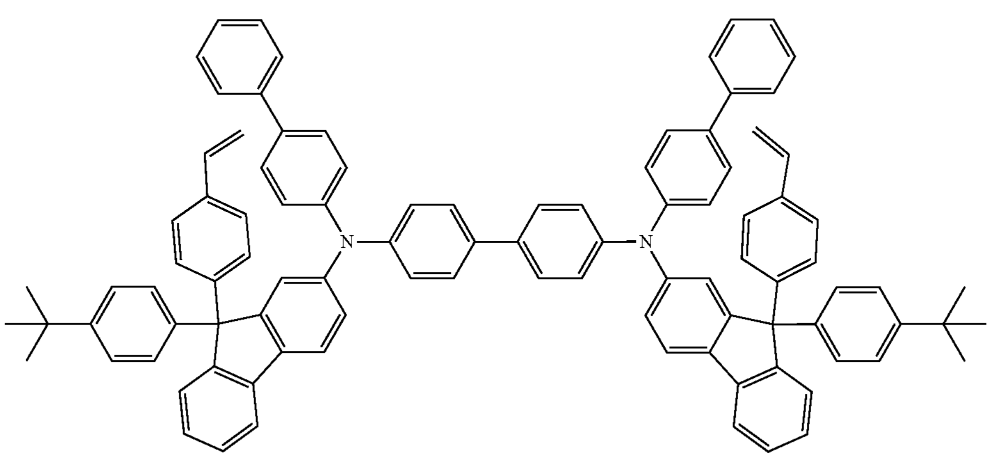

-continued
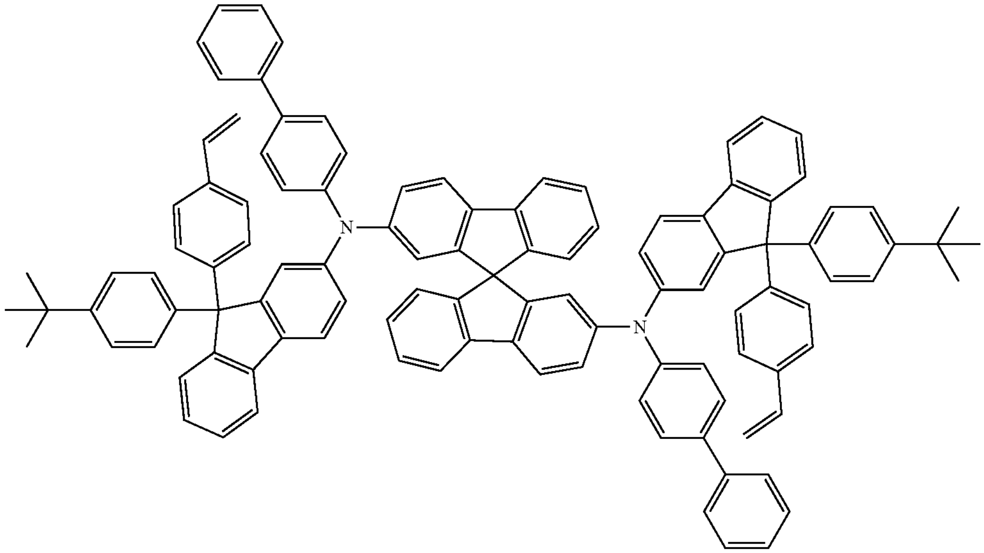
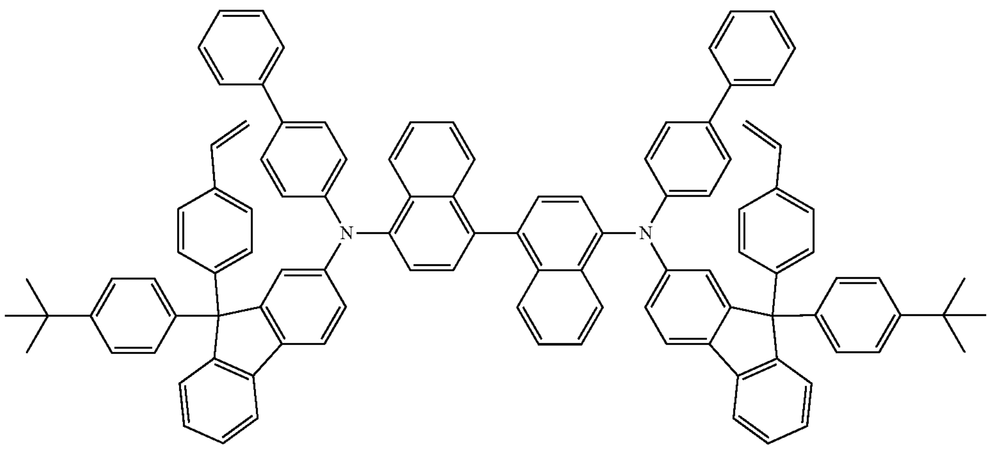
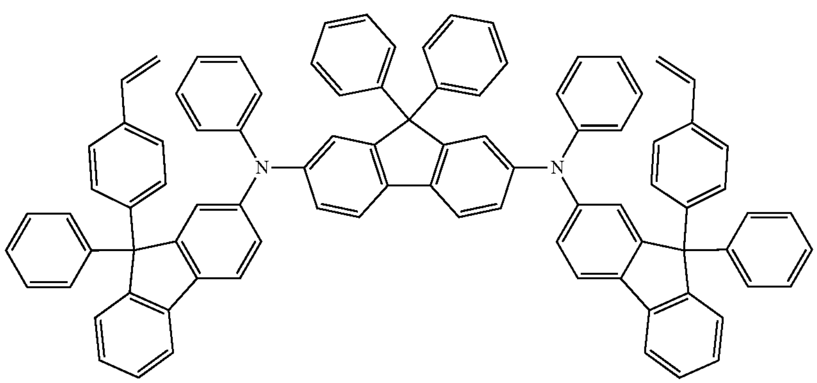
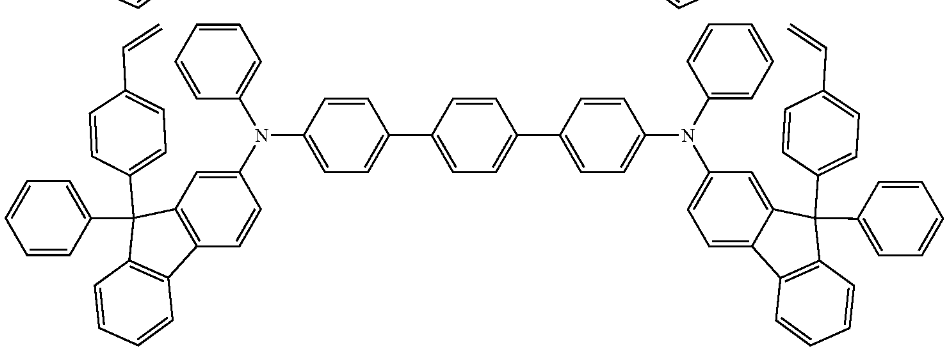

-continued
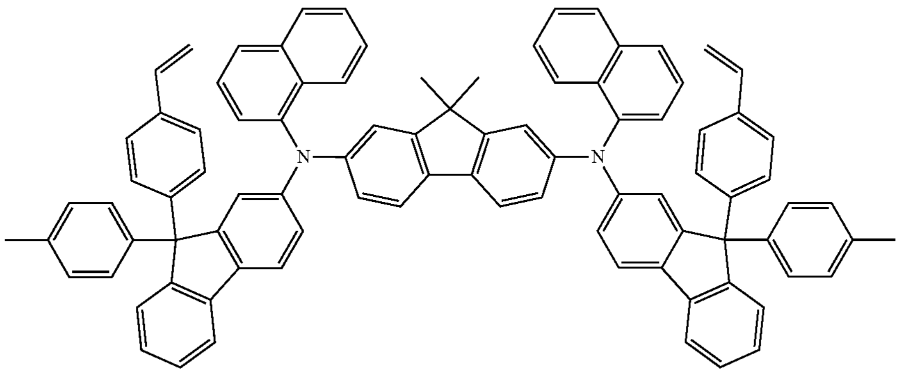
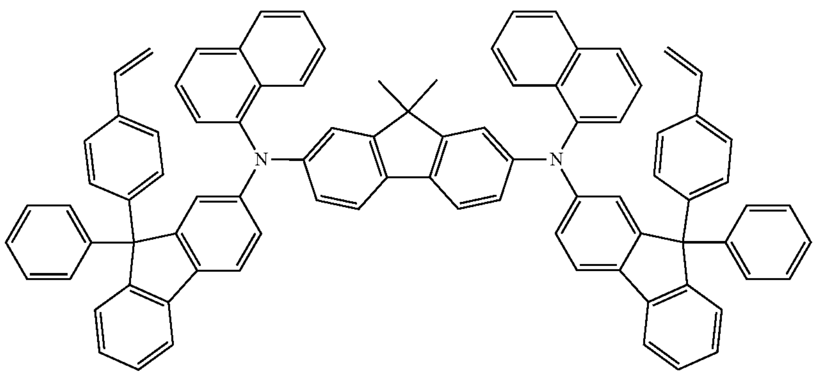
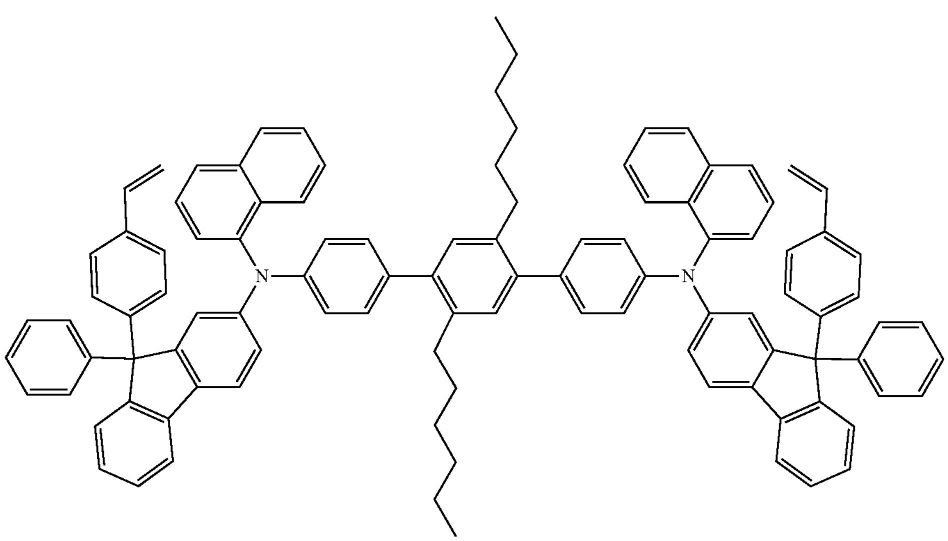

-continued
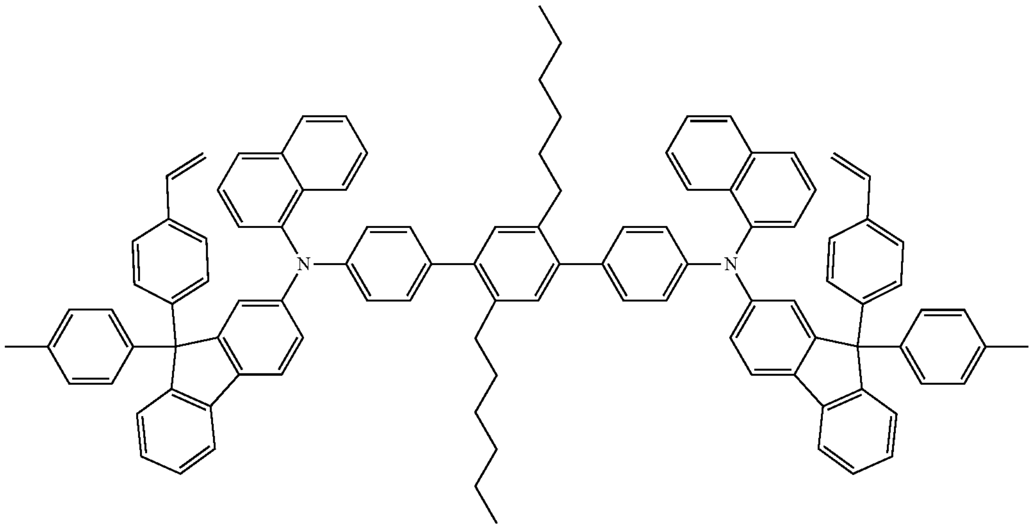
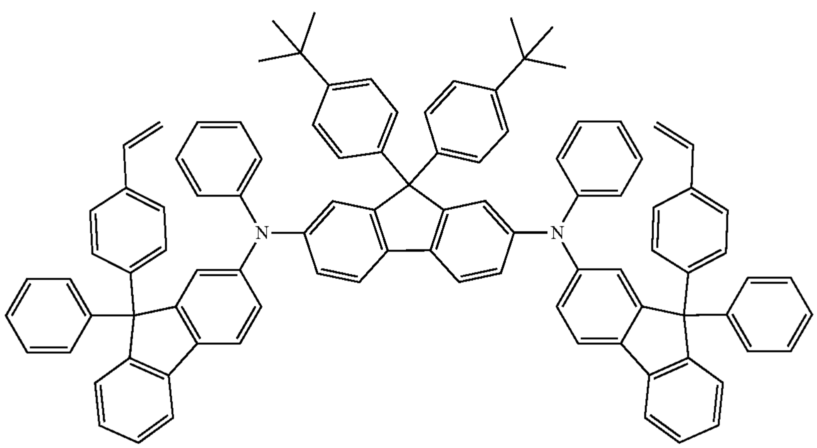
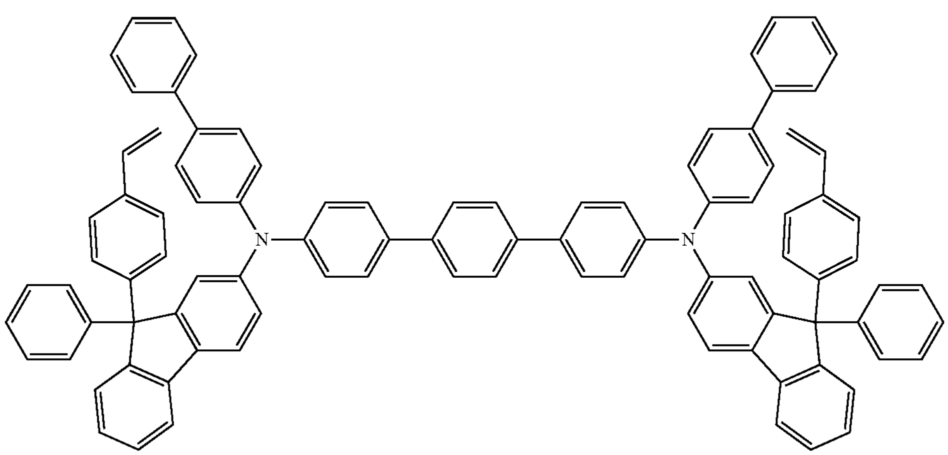

-continued
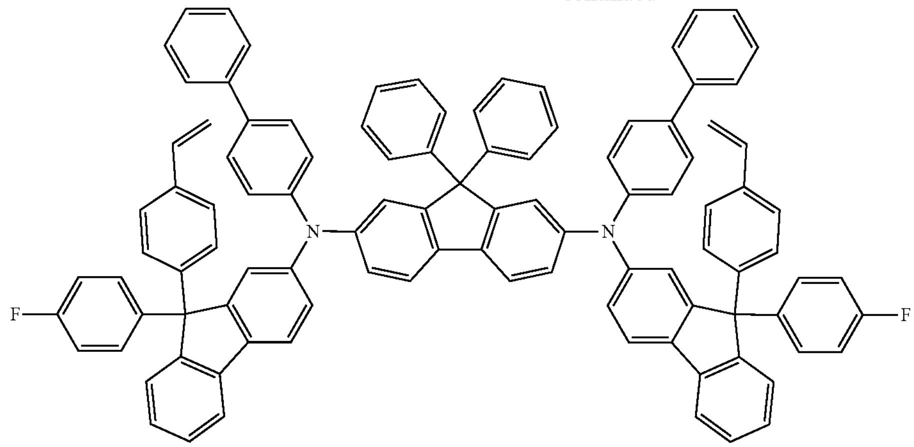
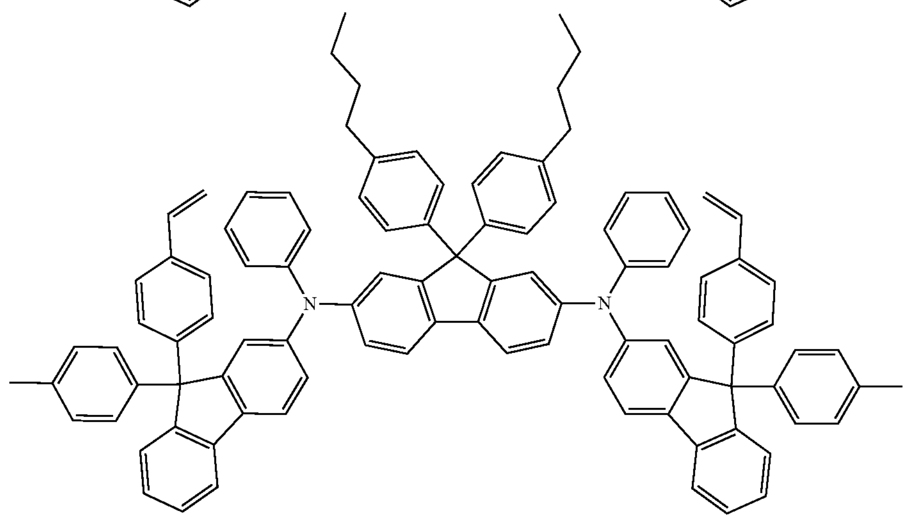
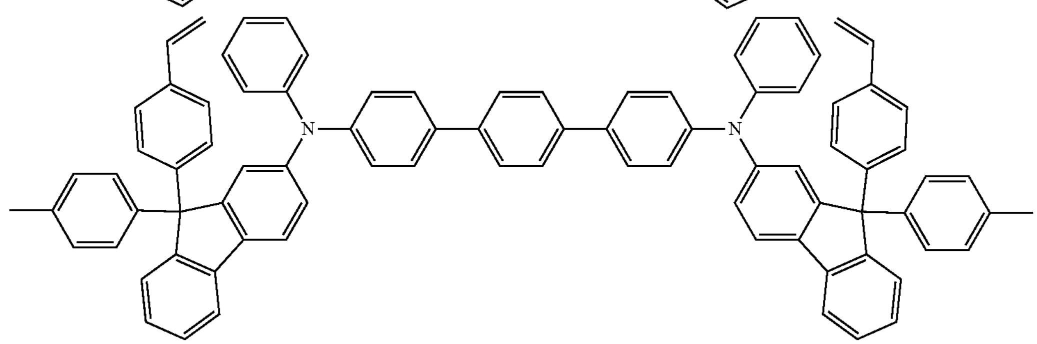
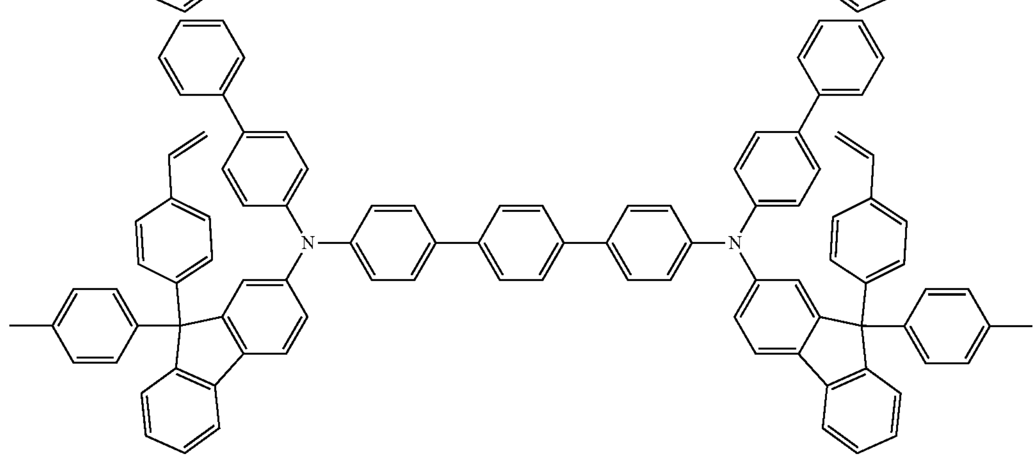

-continued
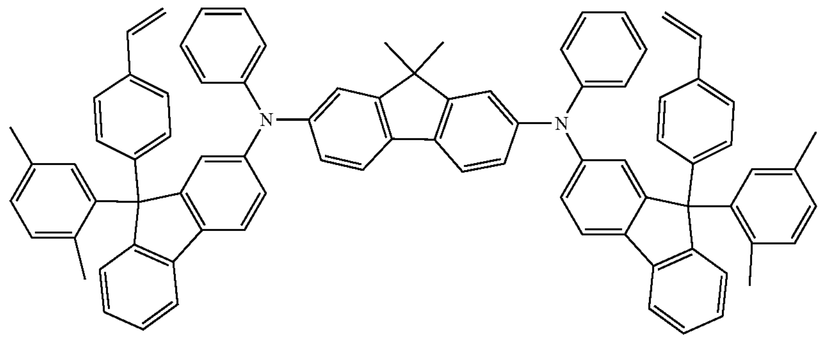
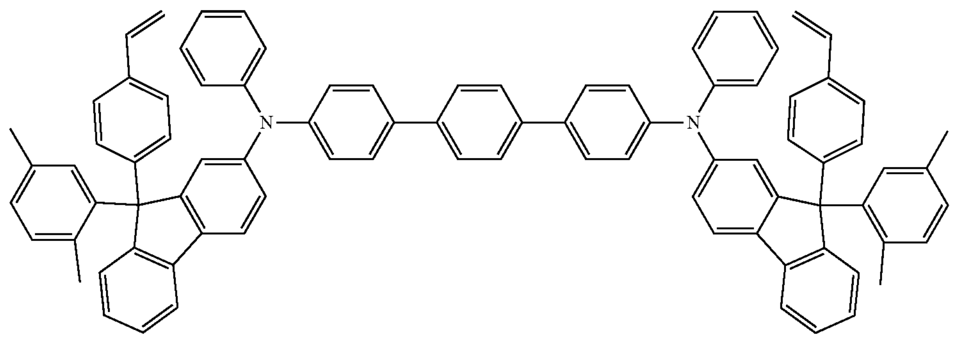
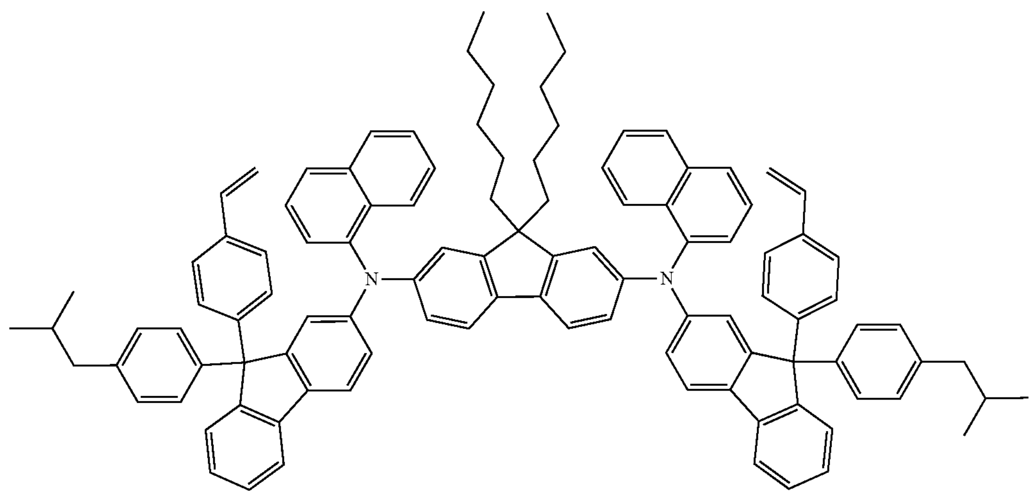
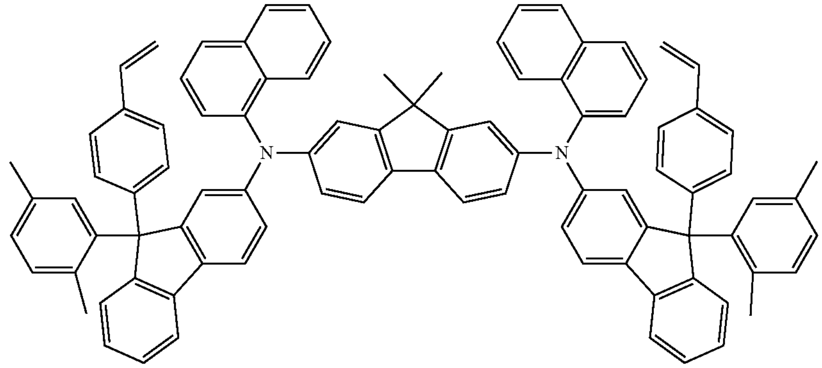

-continued
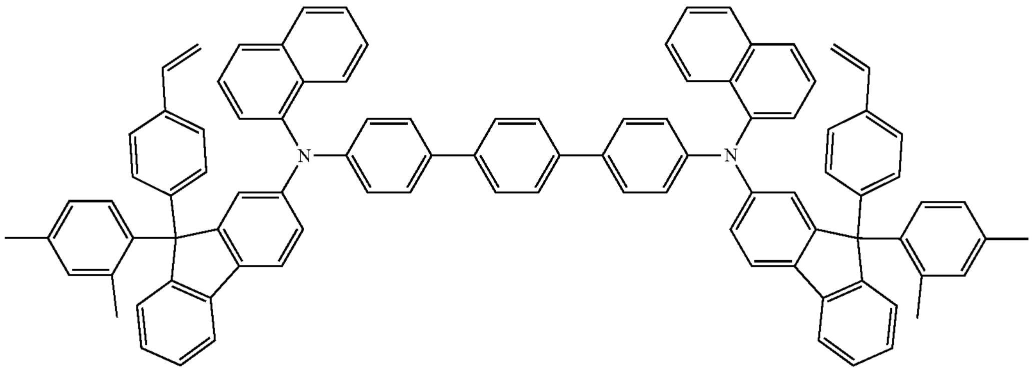
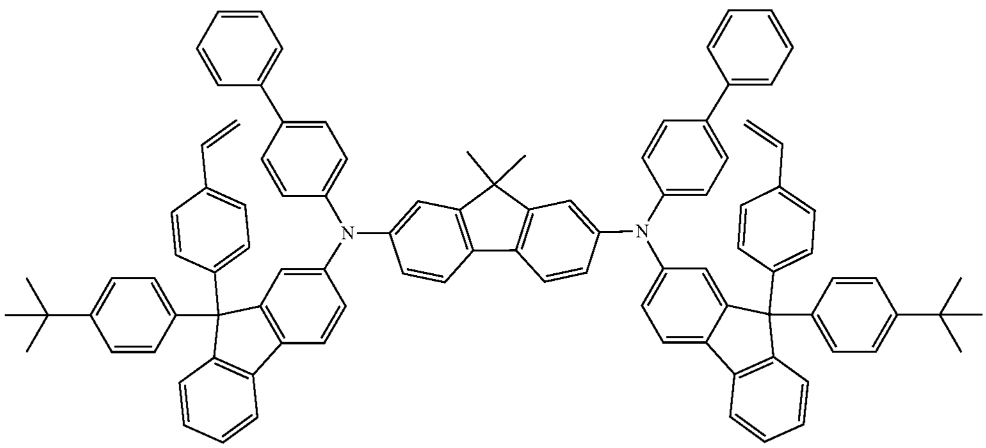
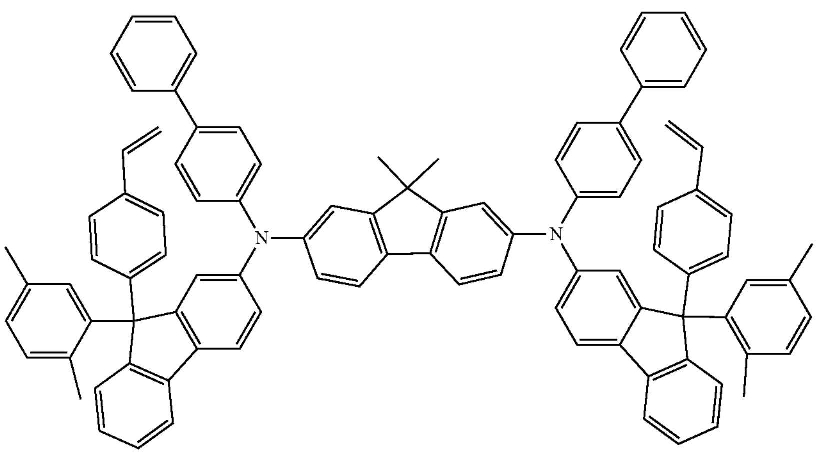
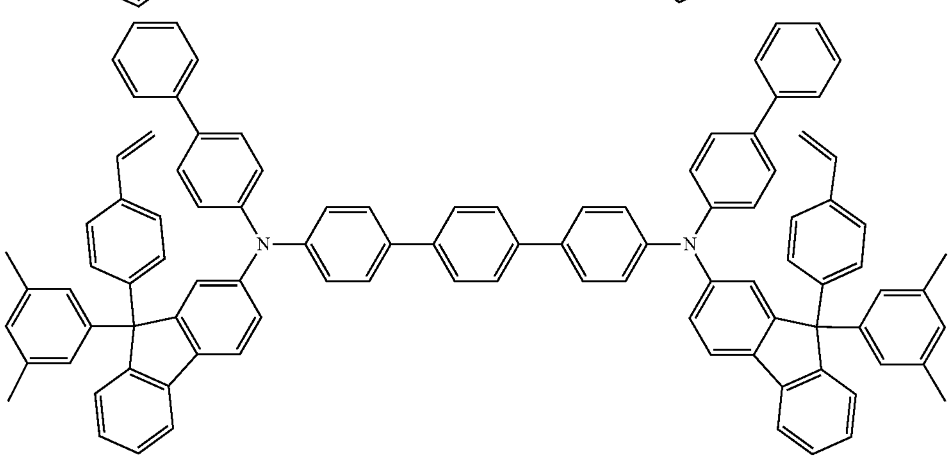

-continued
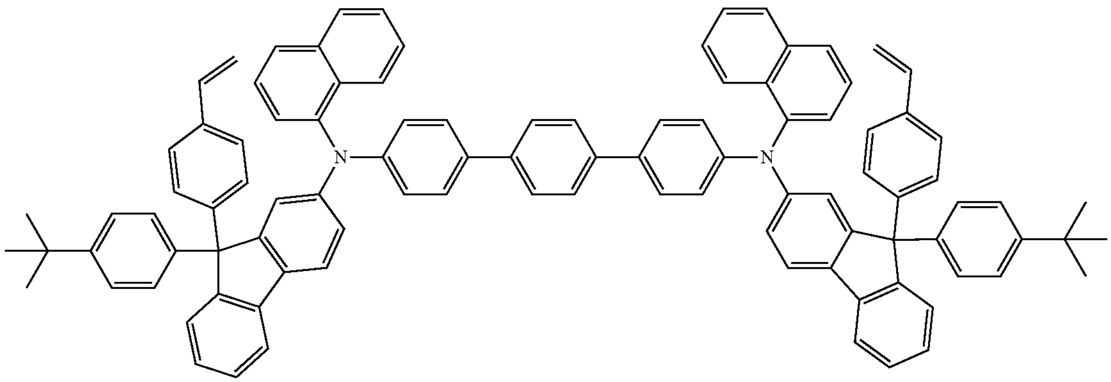
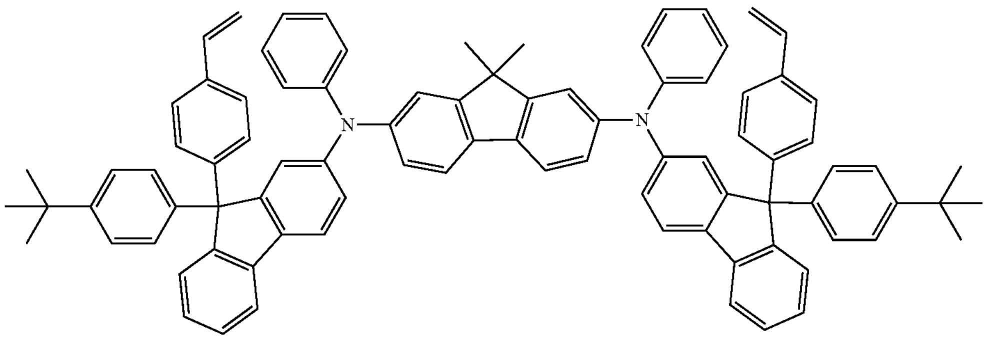
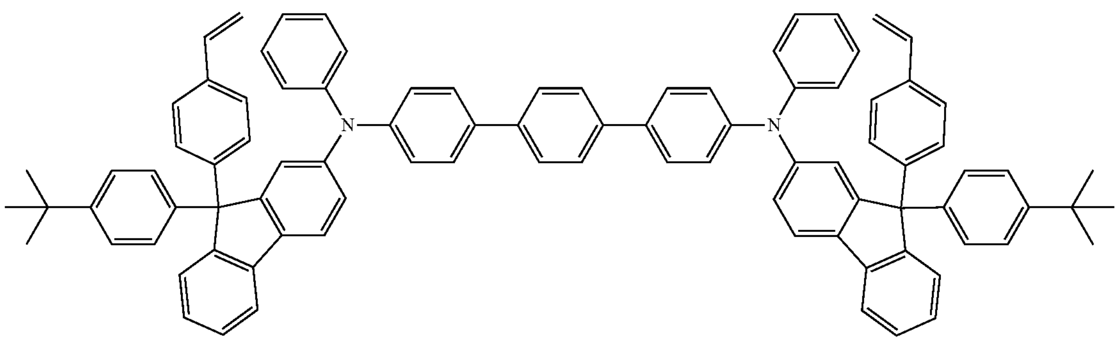
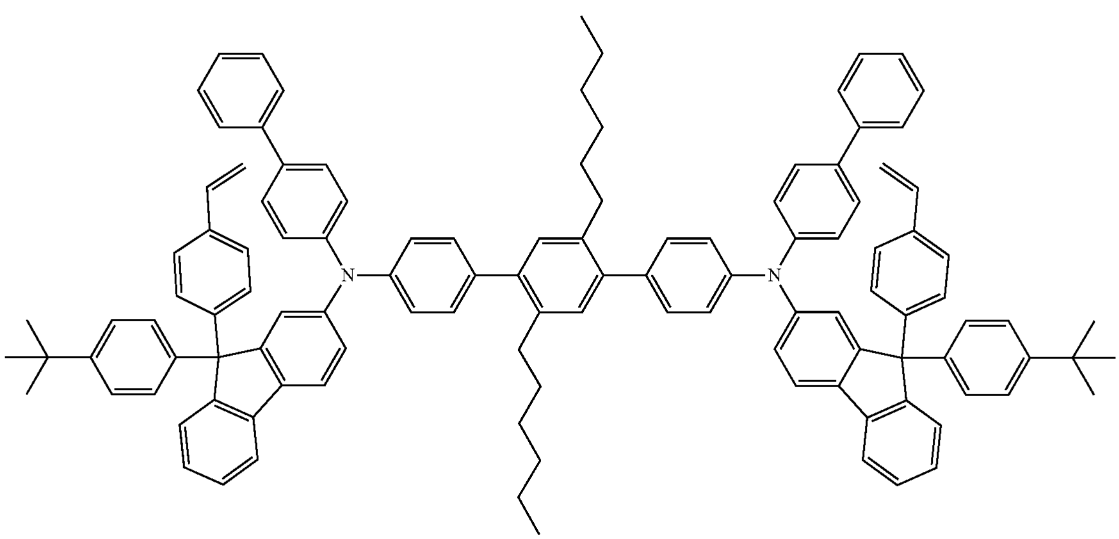

-continued
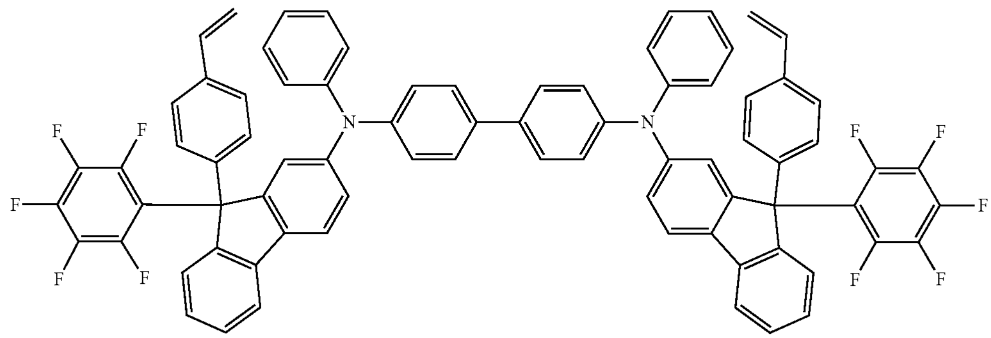
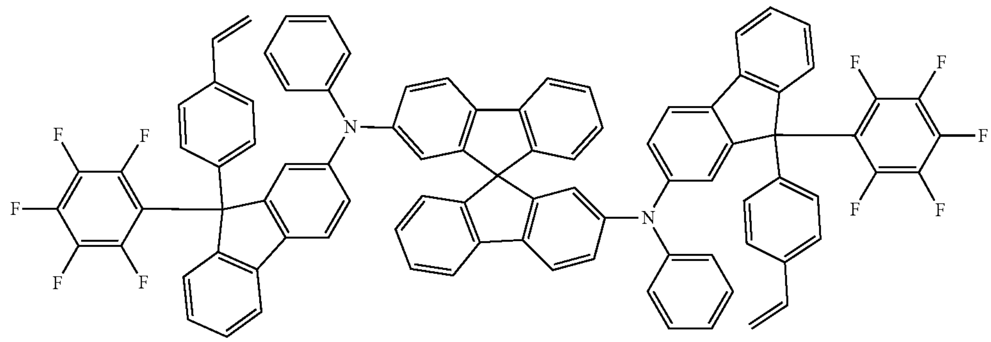
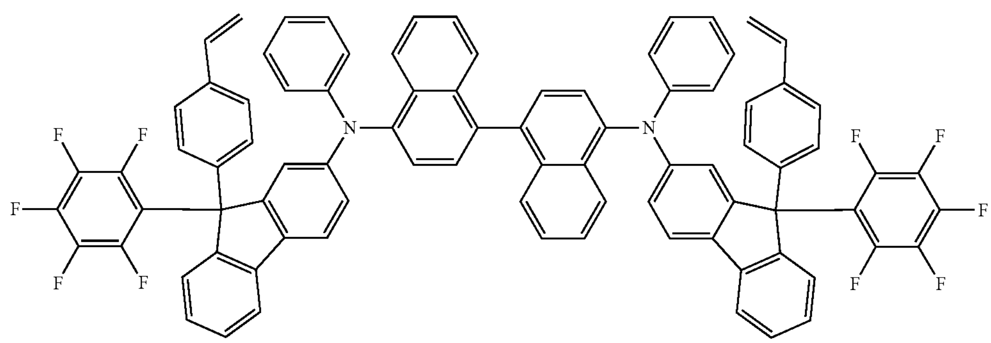
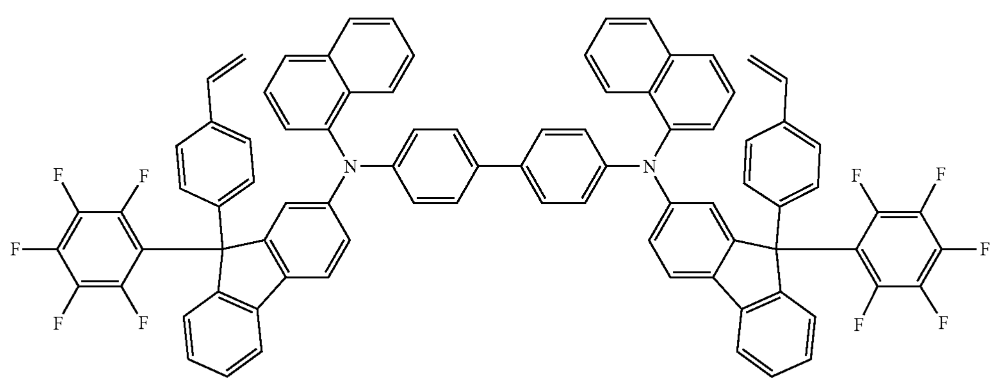

-continued
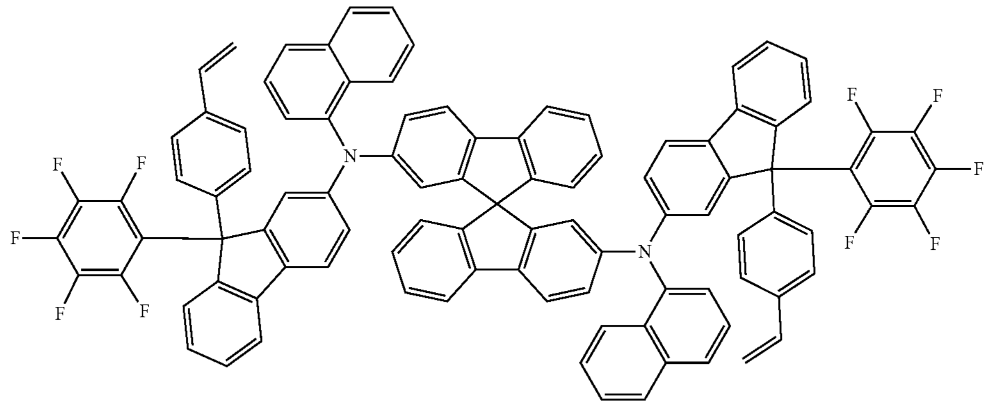
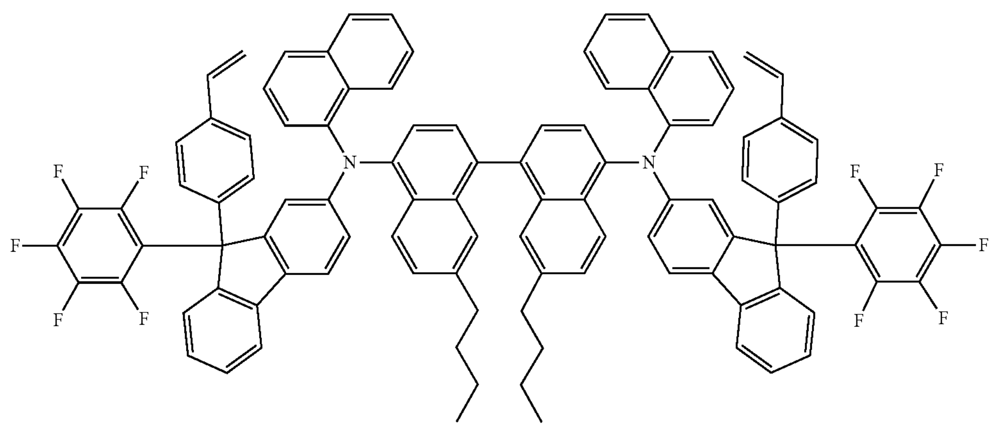
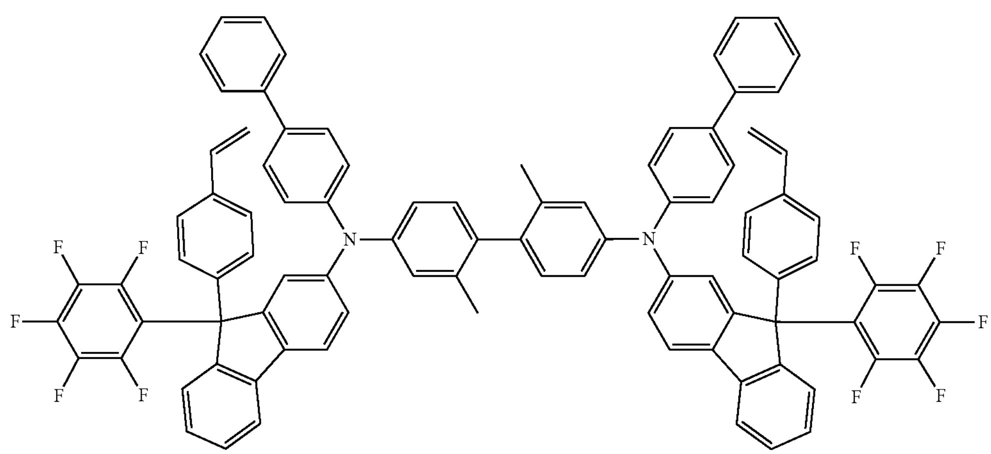

-continued
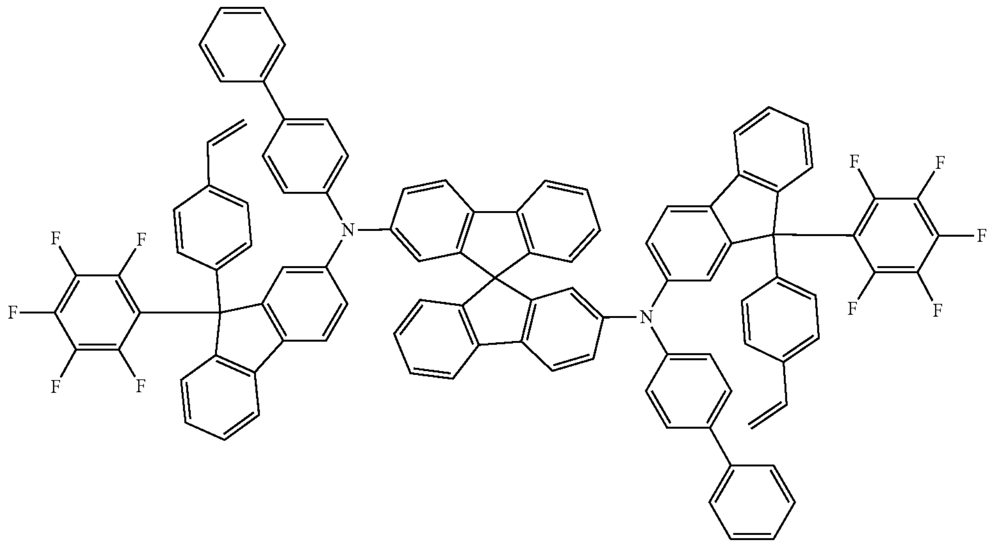
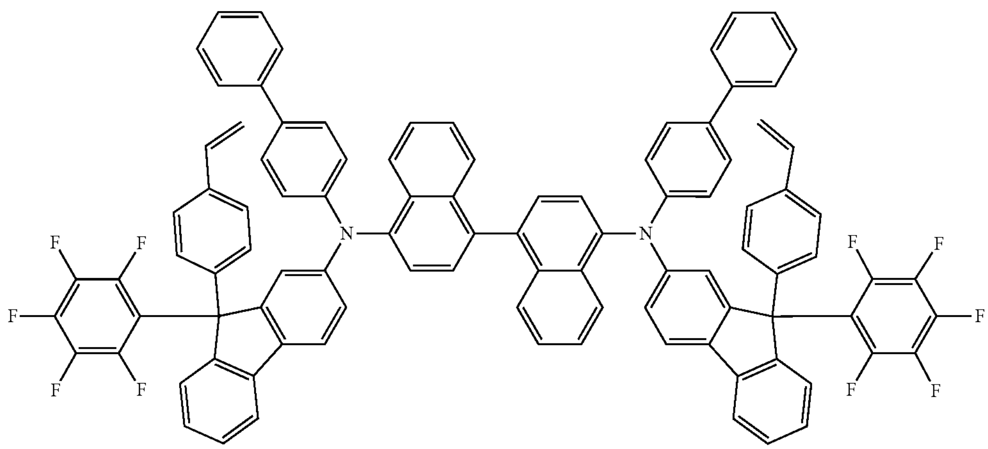
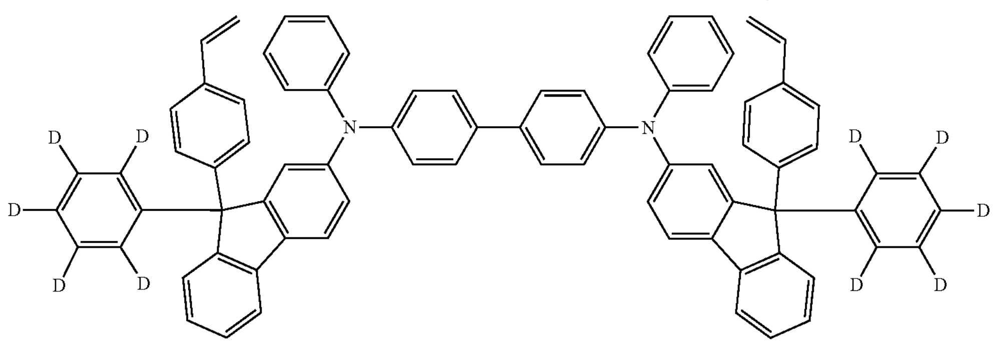
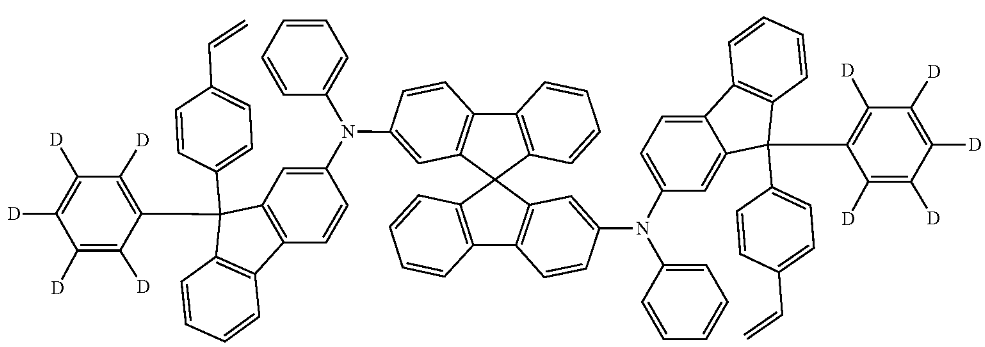

-continued
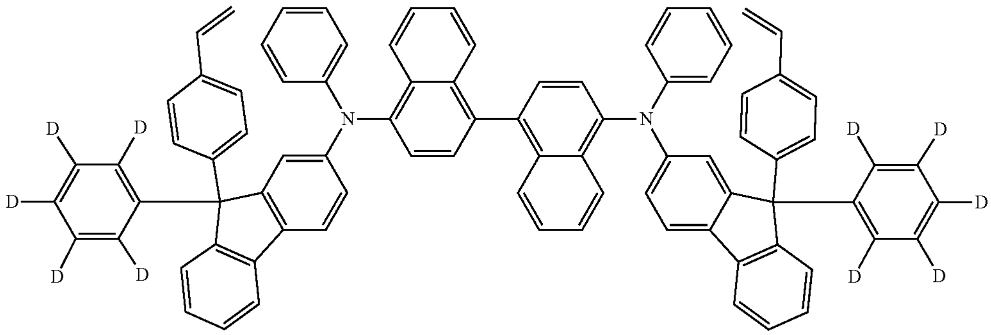
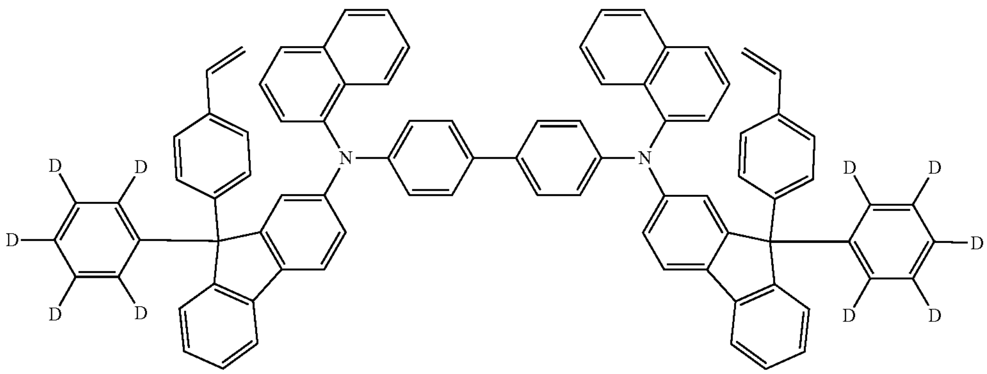
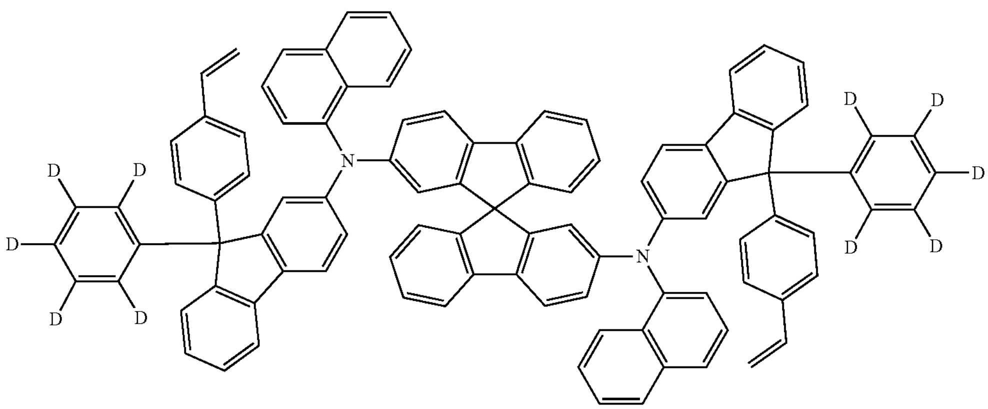
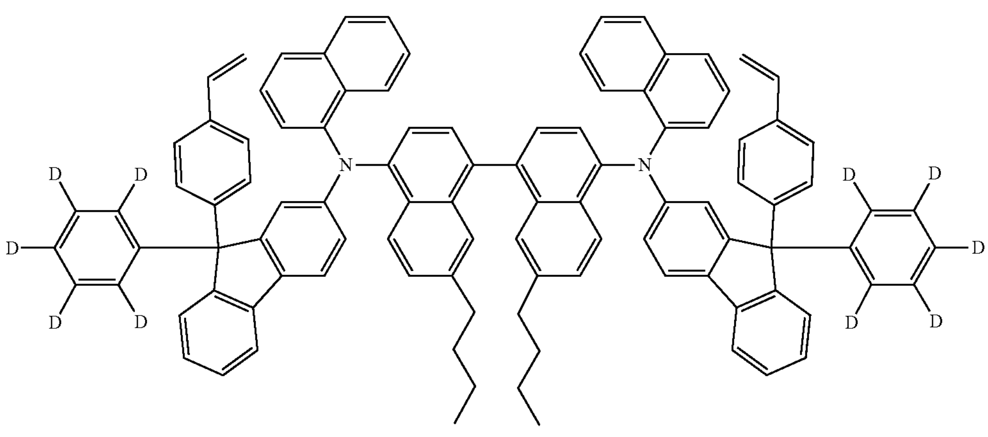

-continued
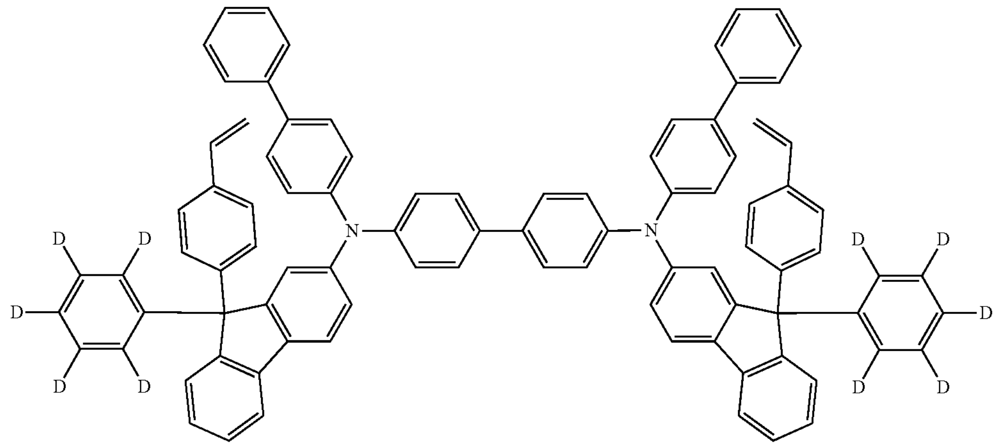
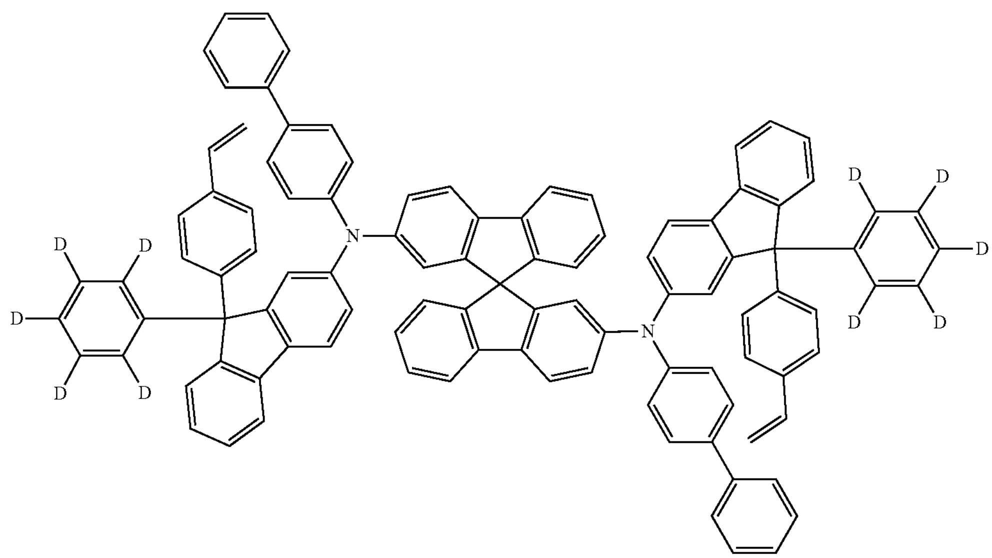
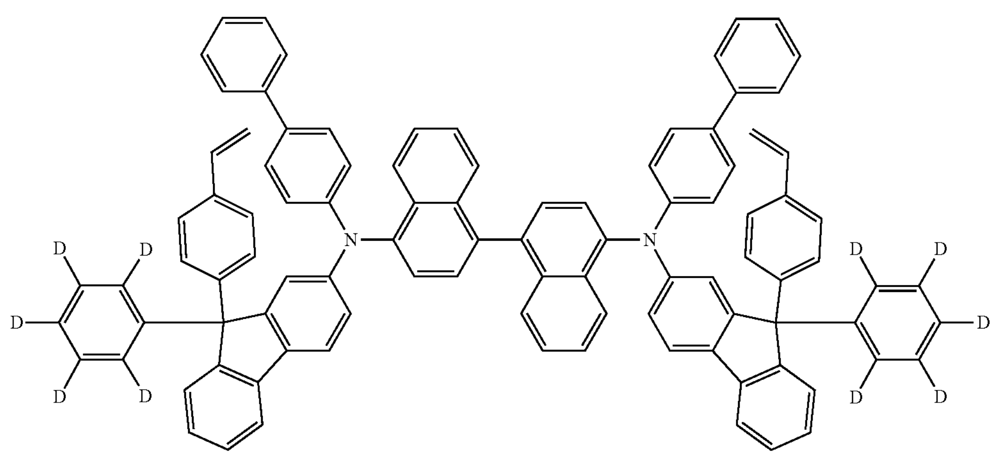

-continued
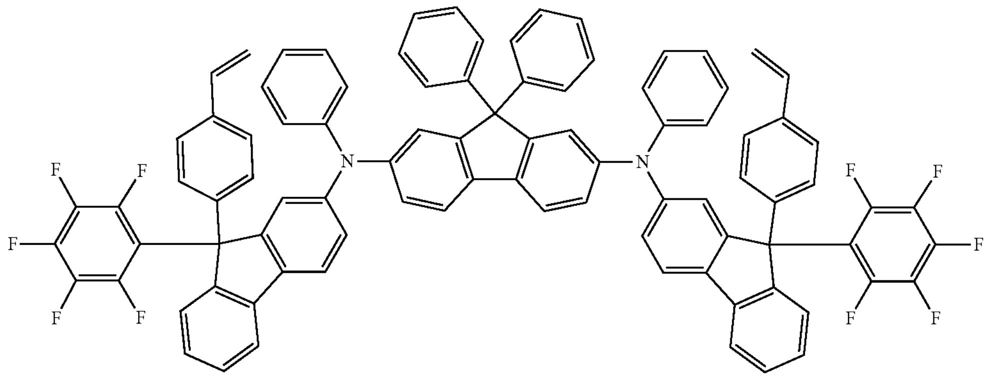
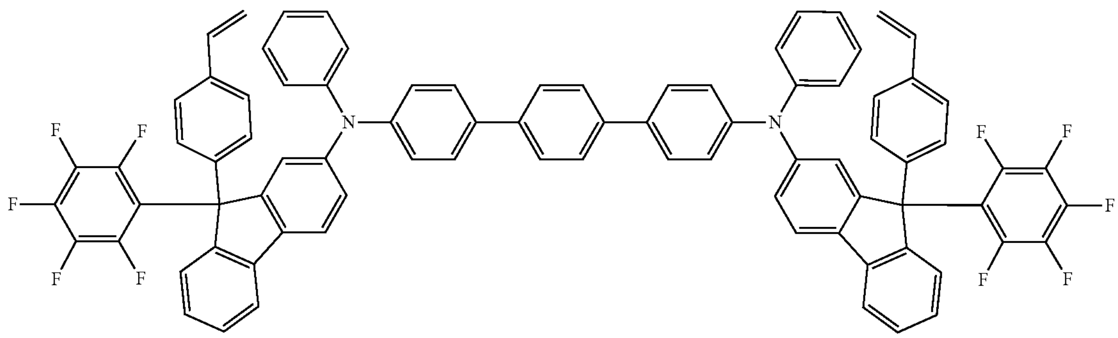
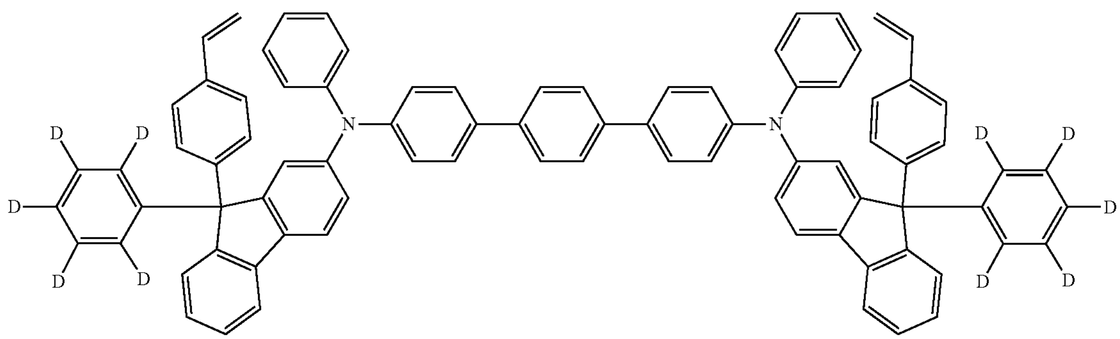
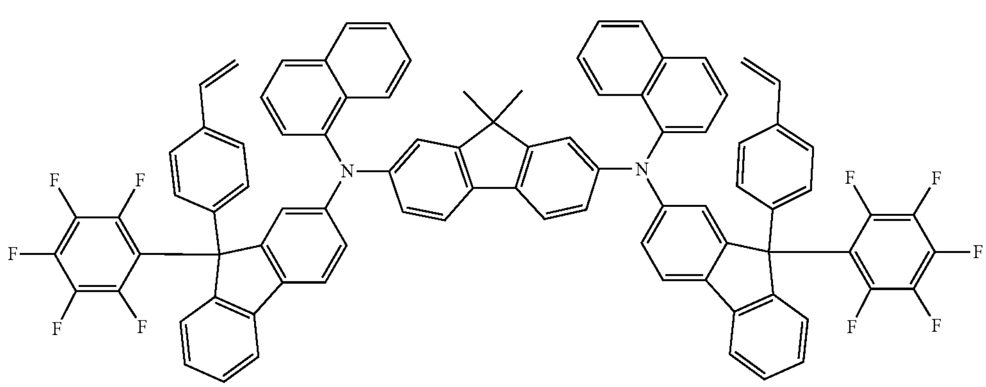

-continued
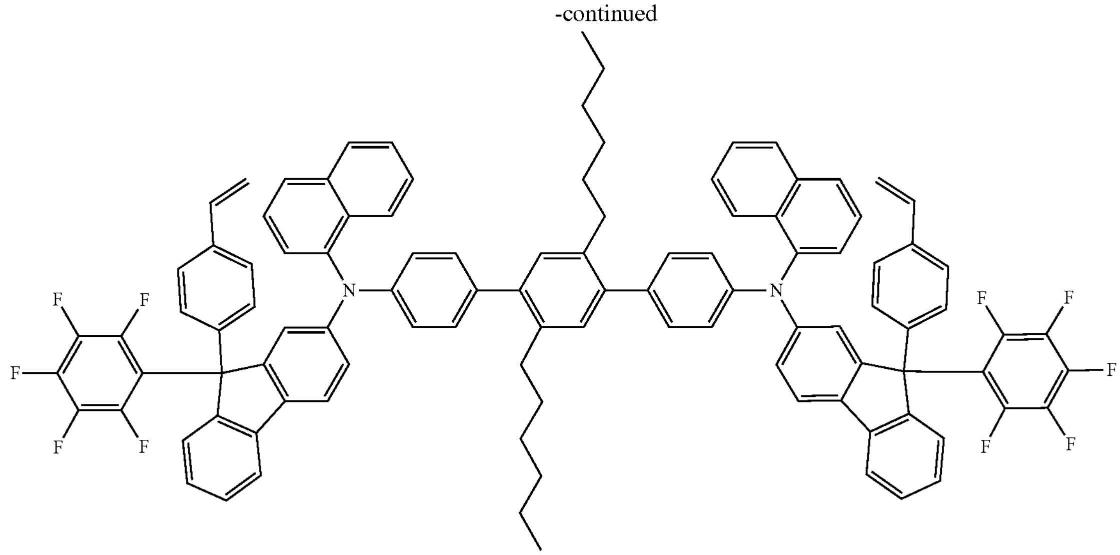
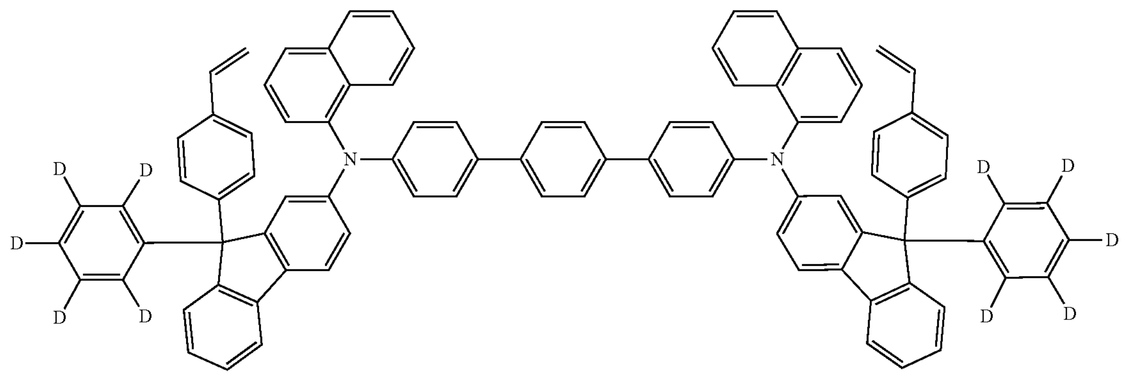
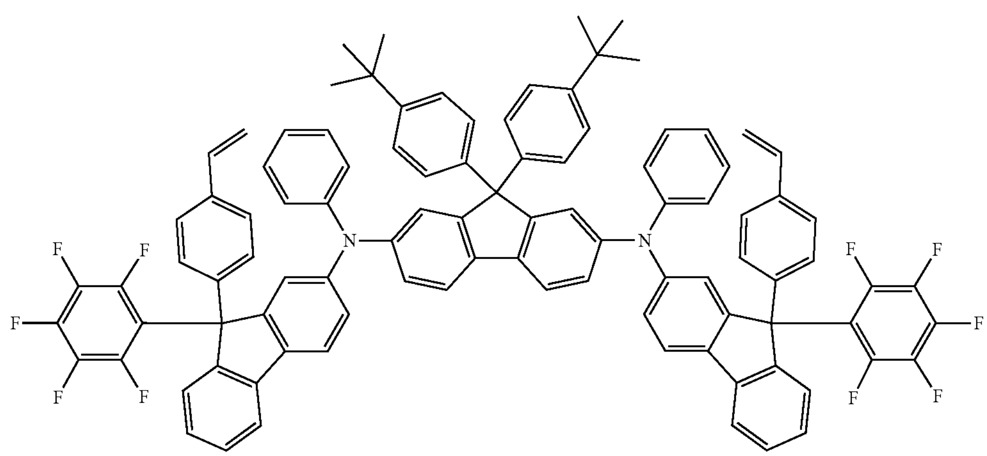

-continued
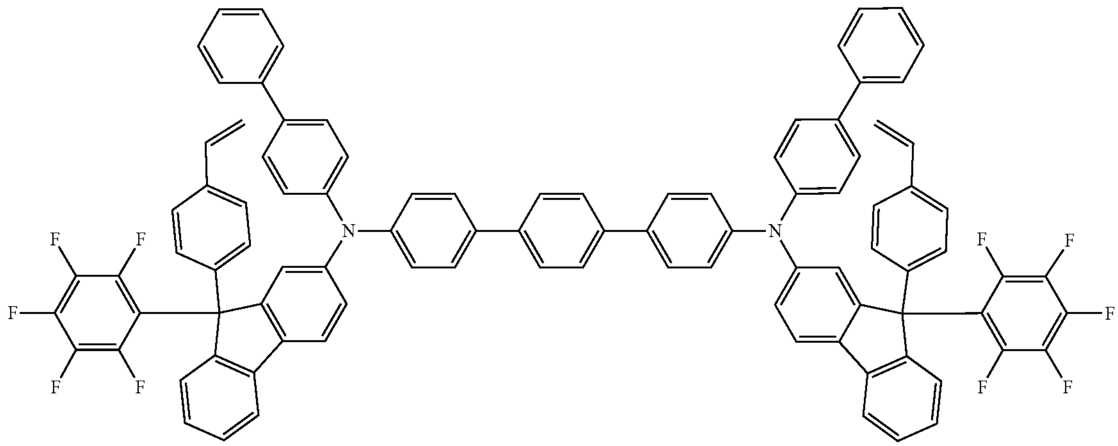
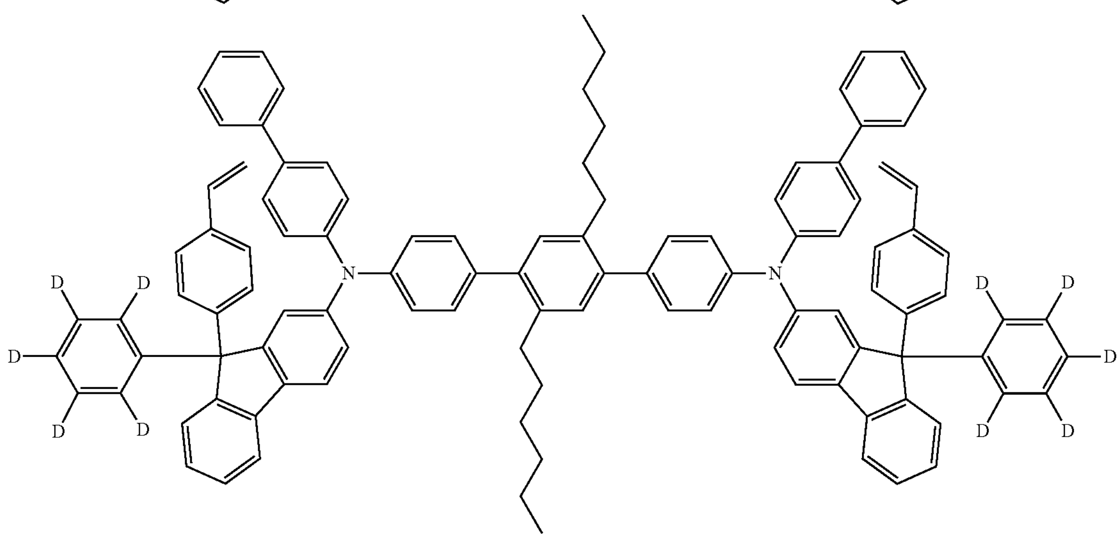
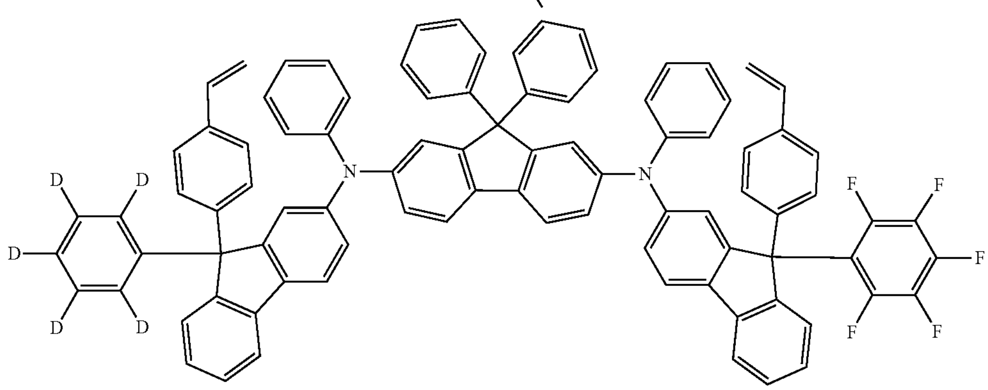
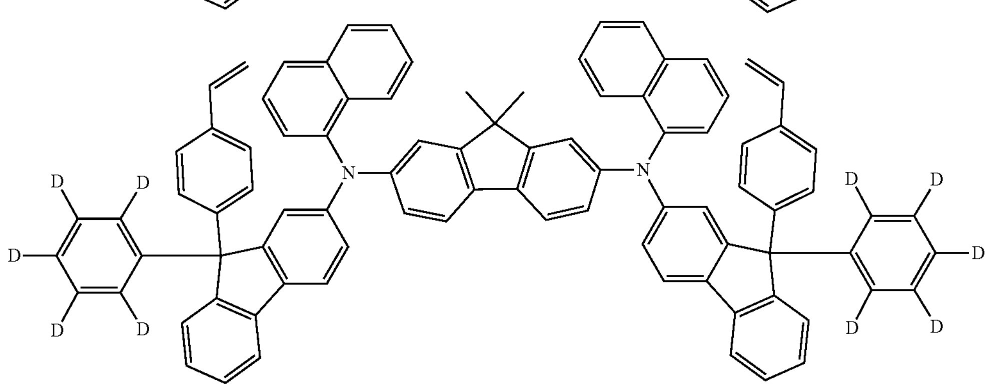

-continued
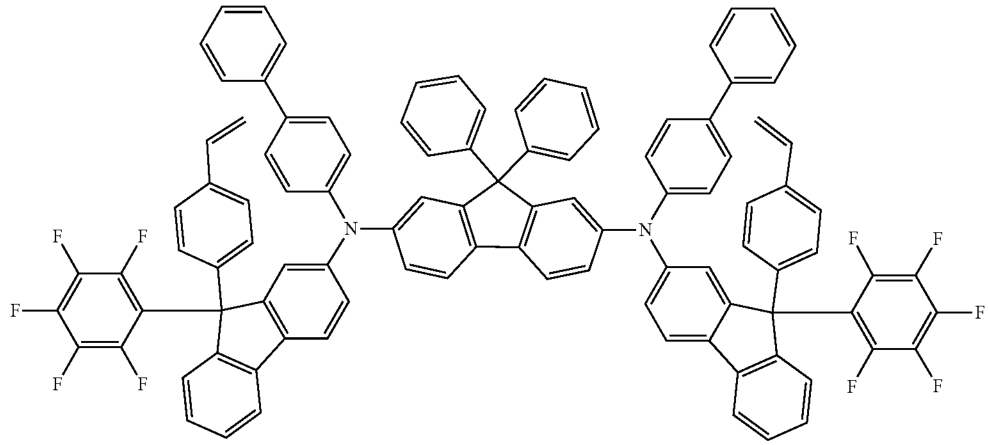
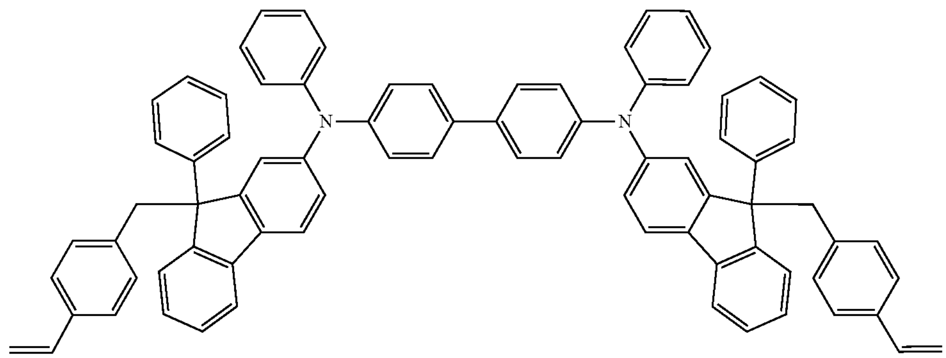
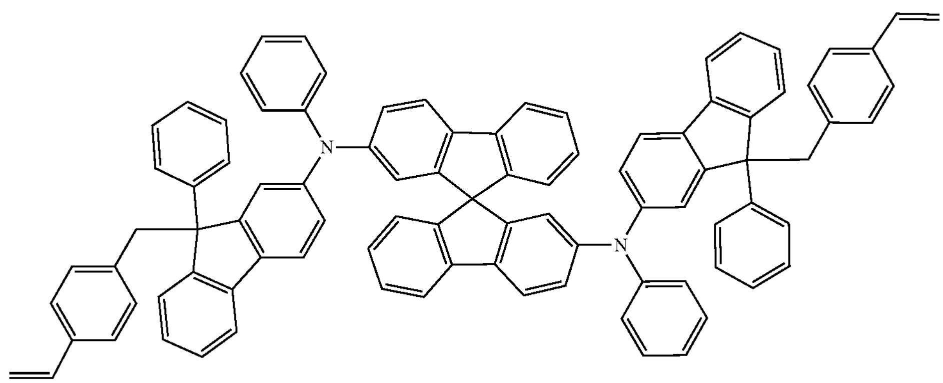
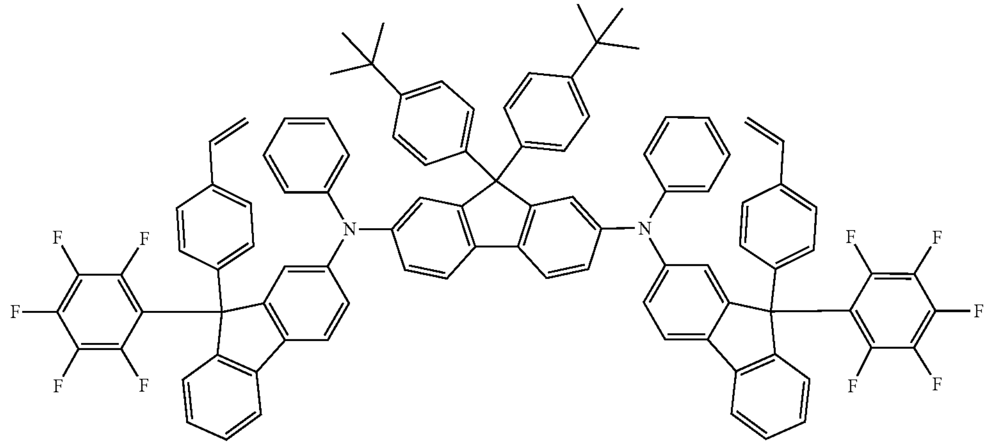

-continued
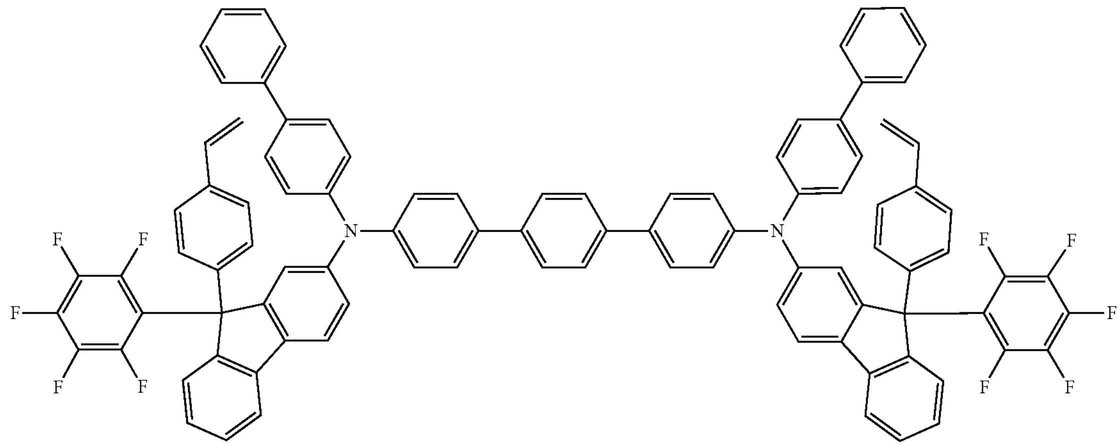
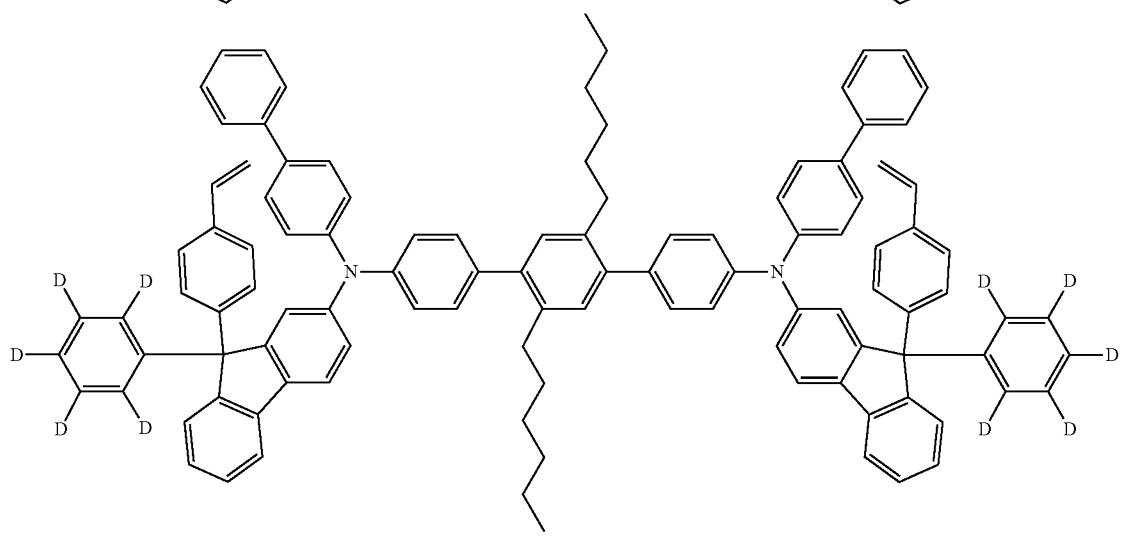
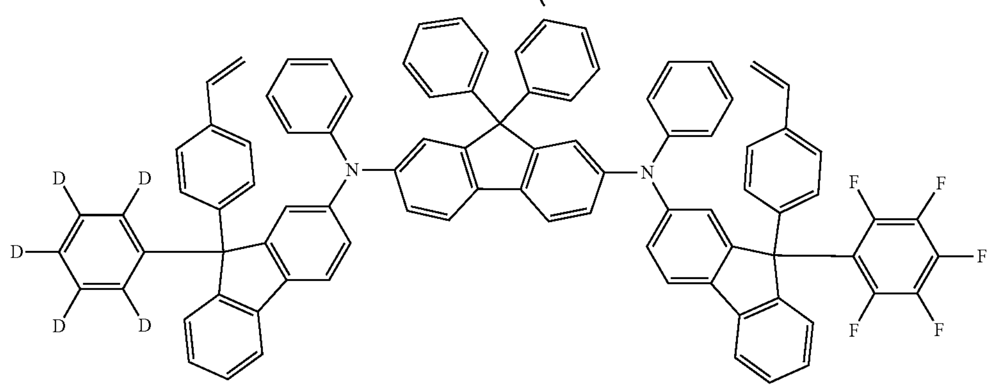
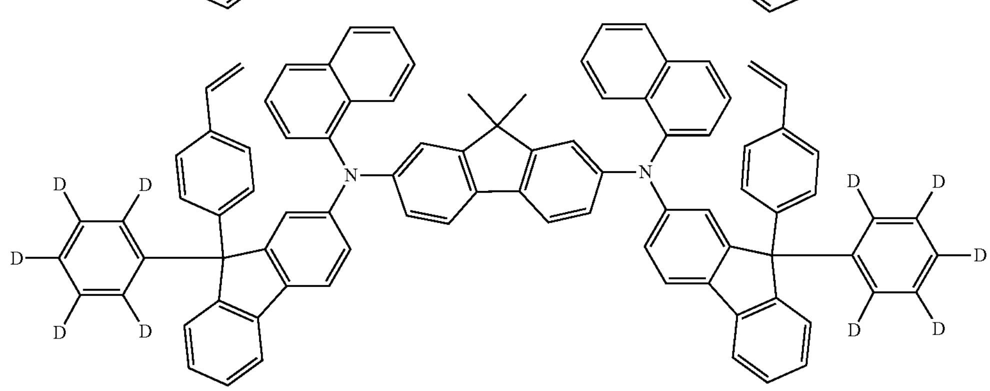

-continued
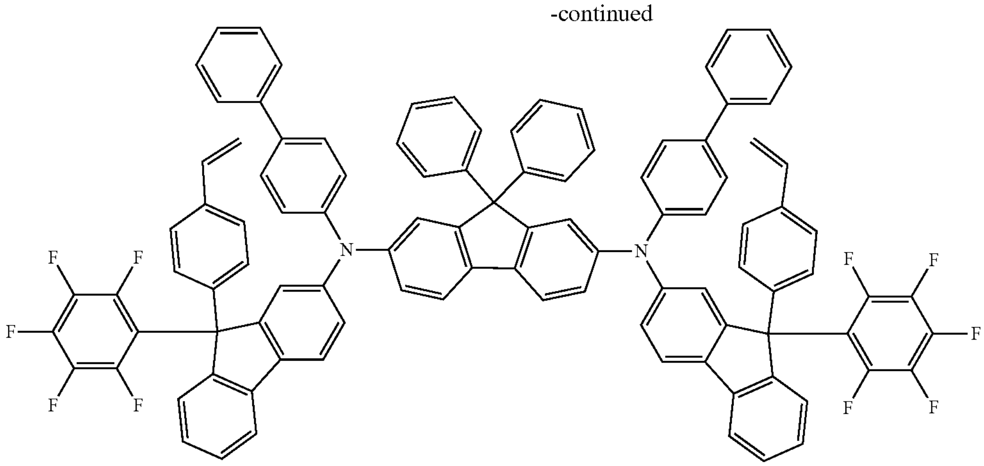
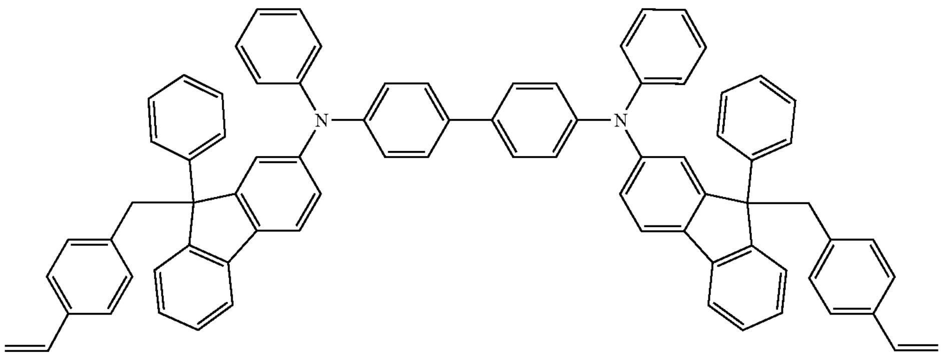
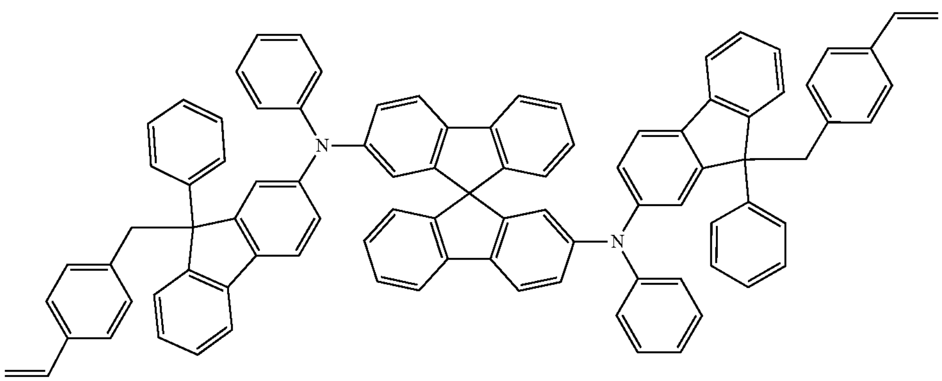
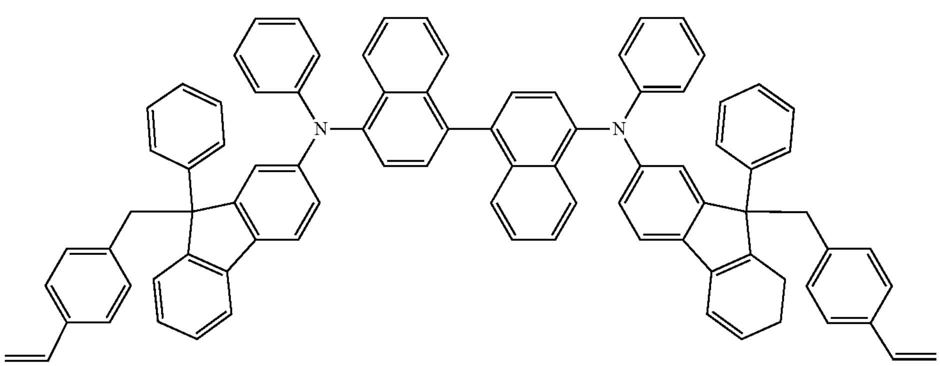

-continued
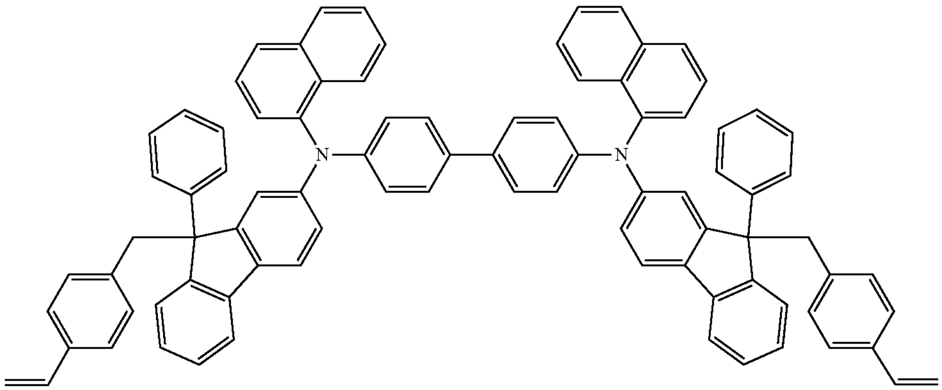
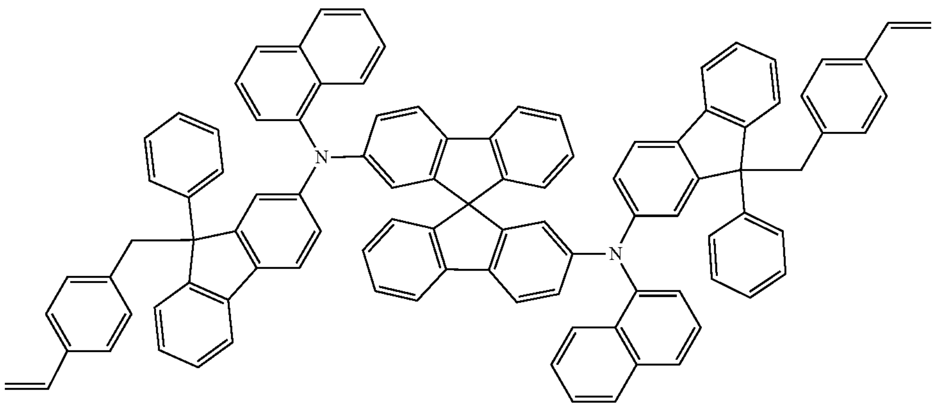
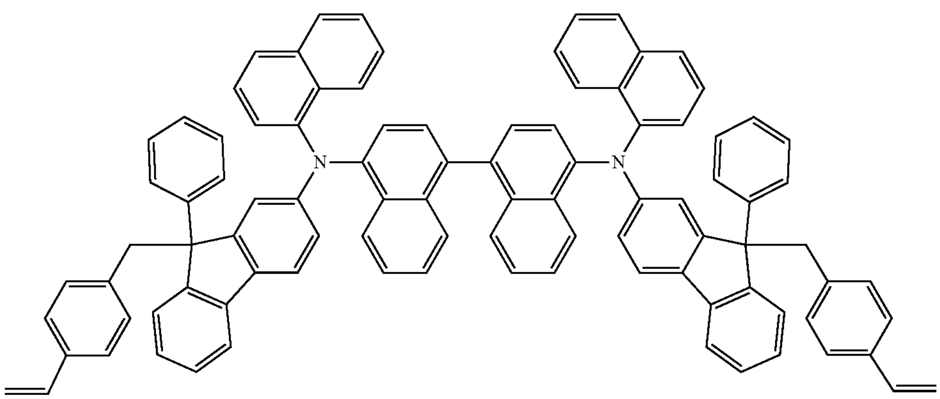
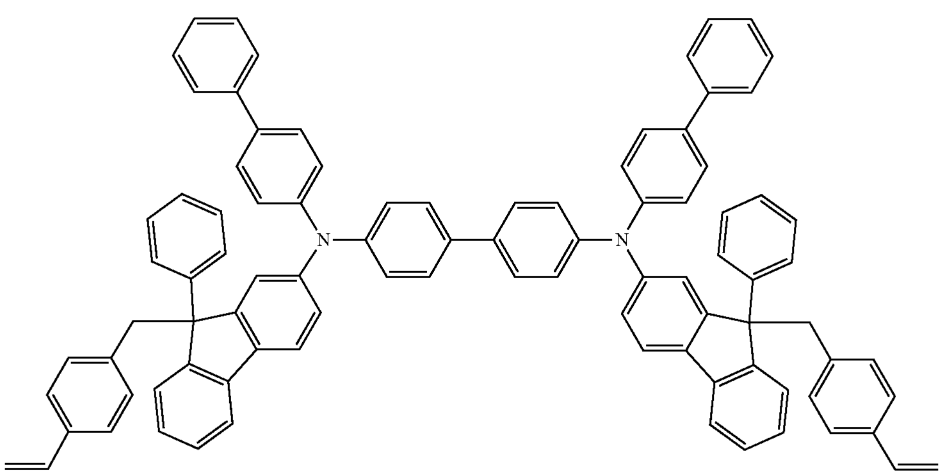

-continued
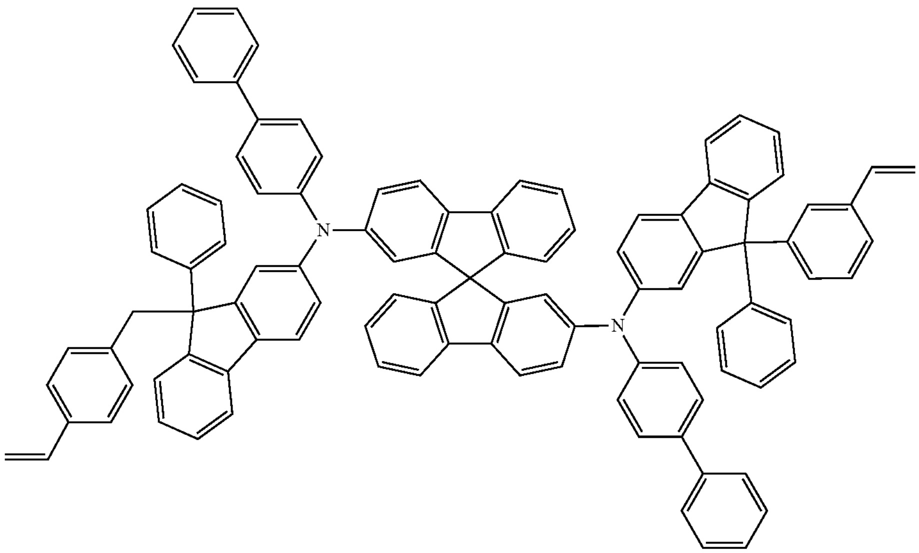
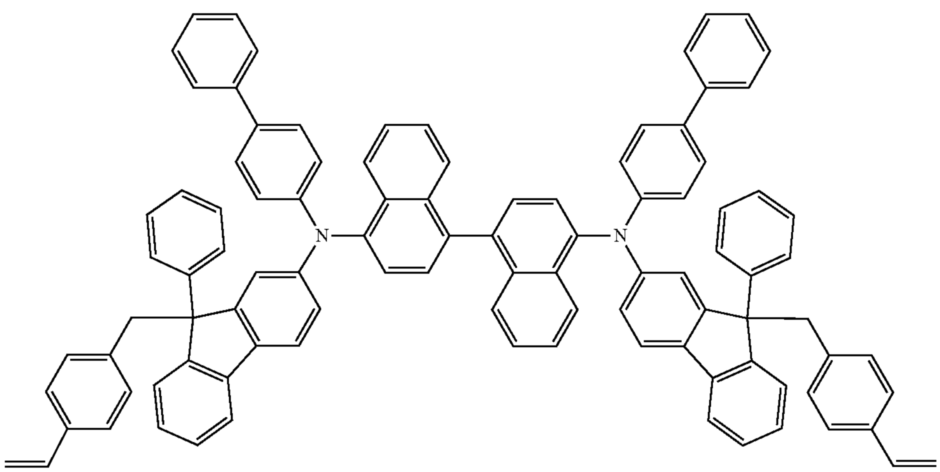
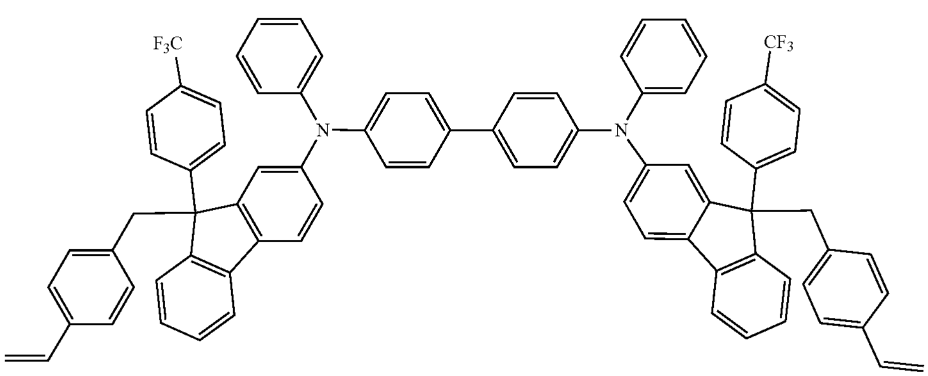

-continued
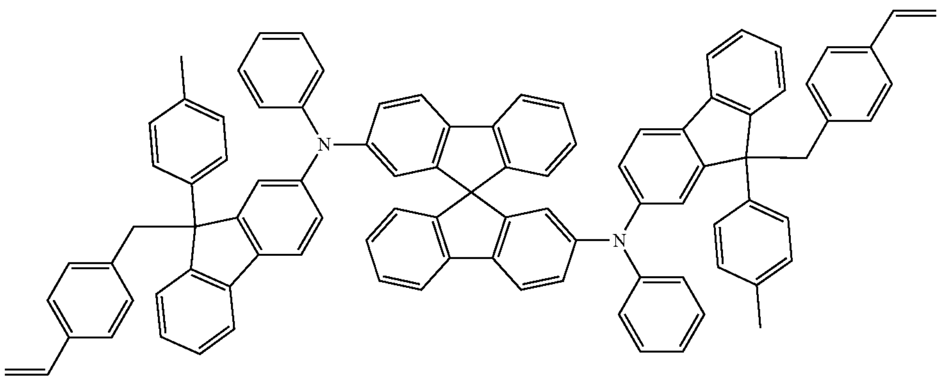
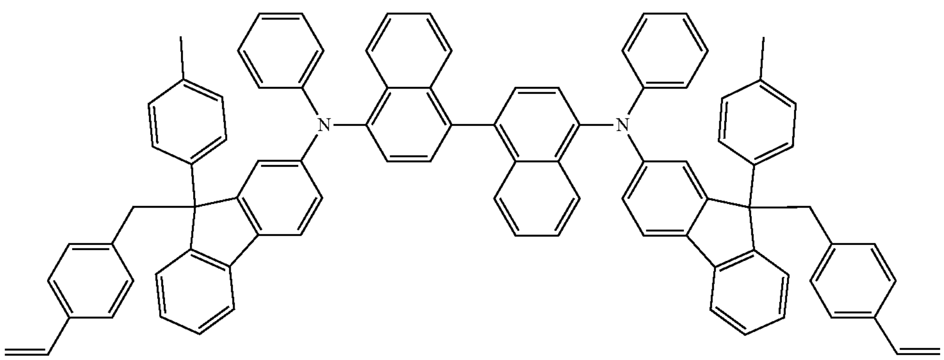
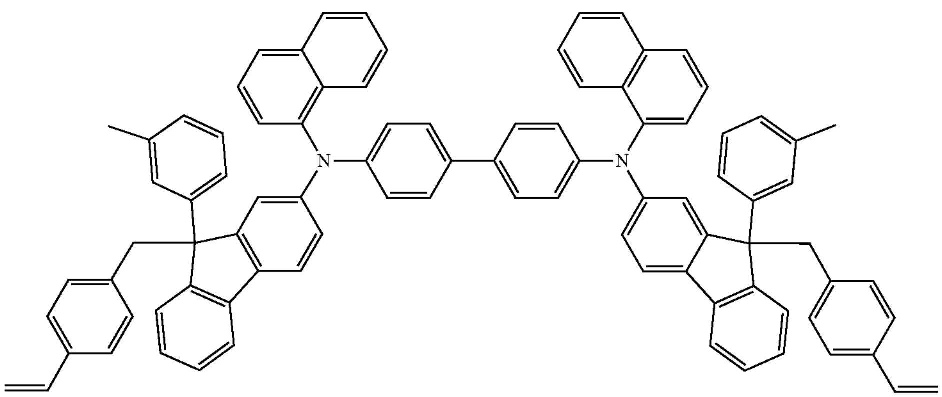
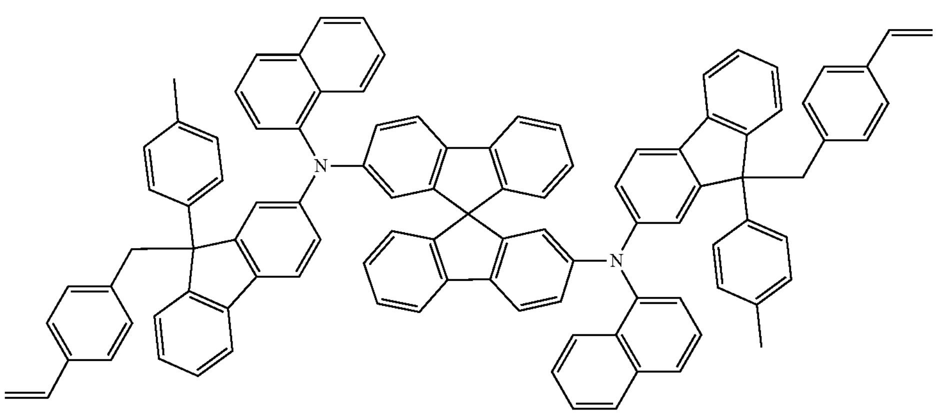

-continued
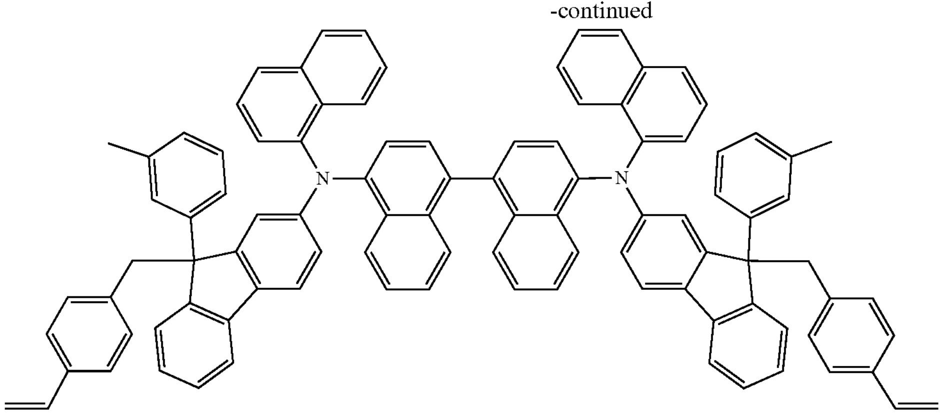
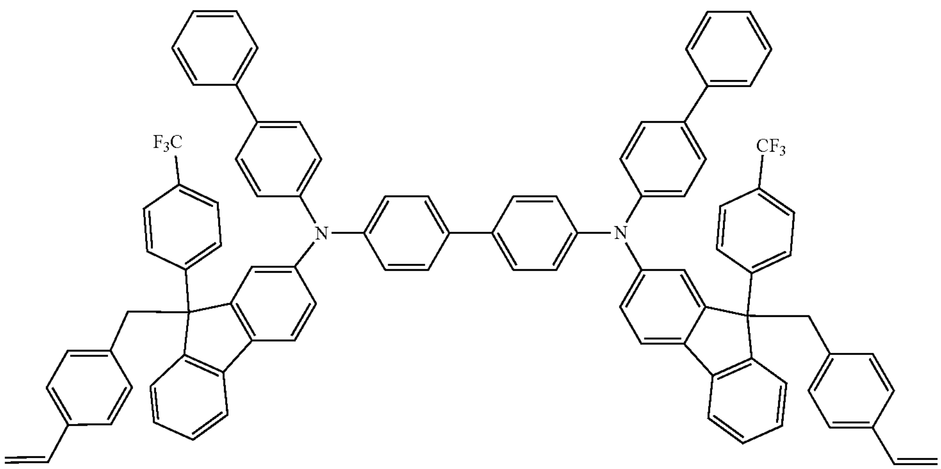
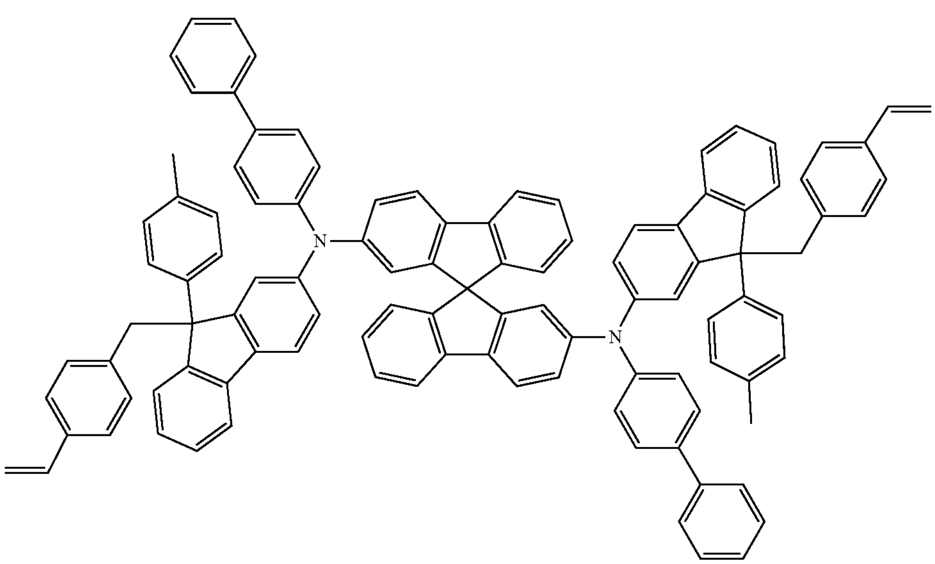

-continued
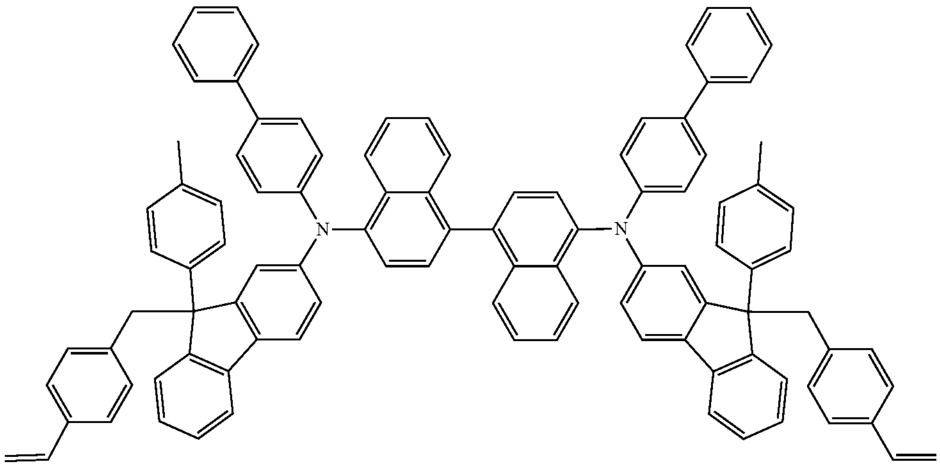
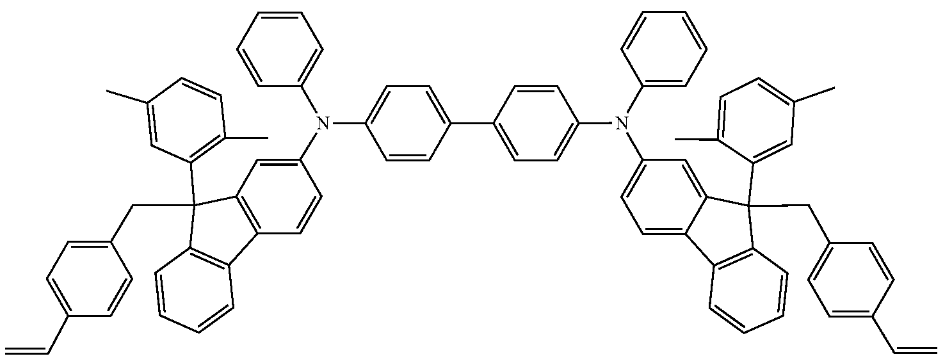
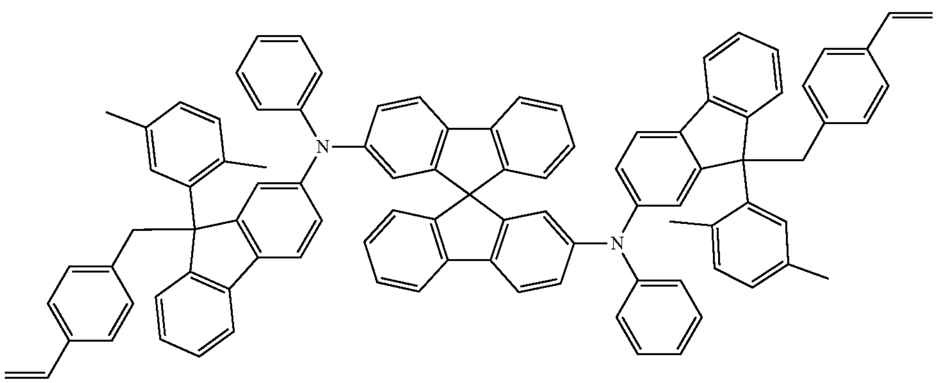
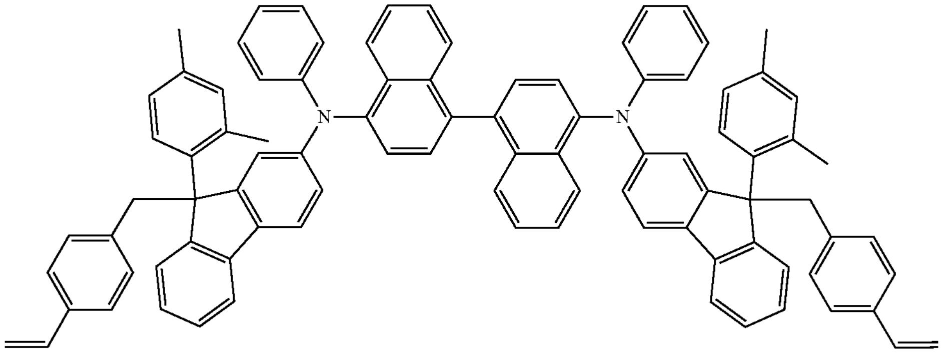

-continued
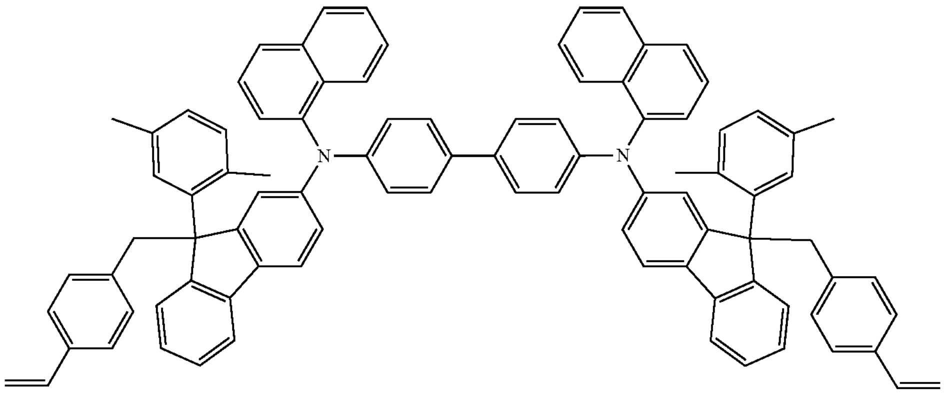
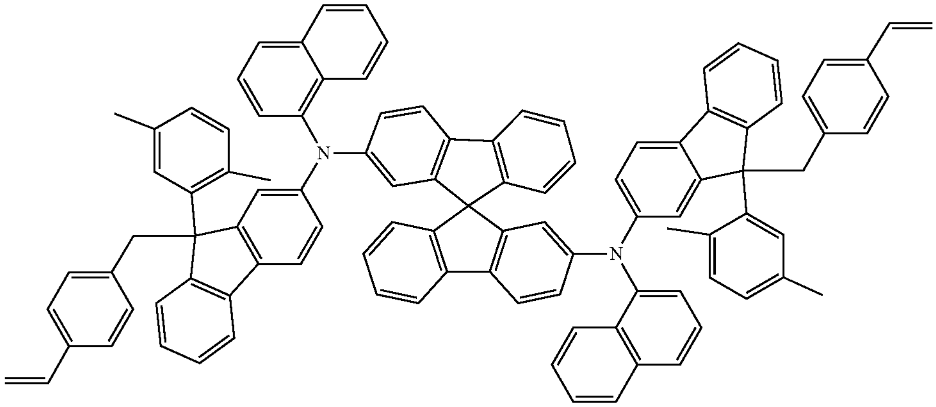
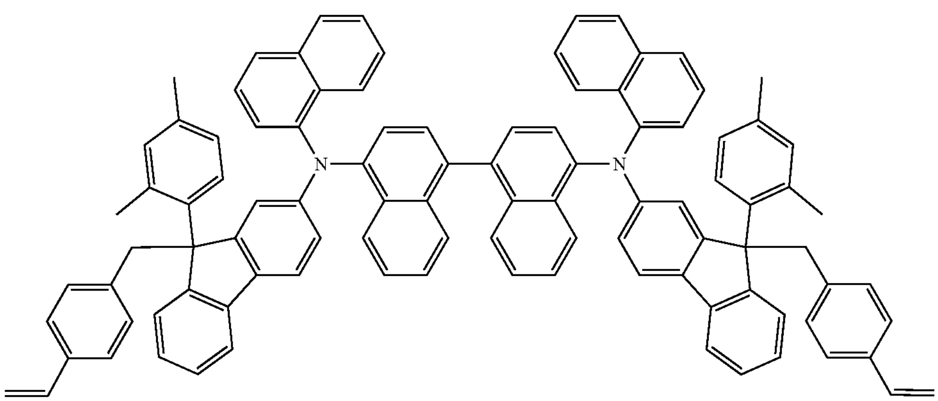
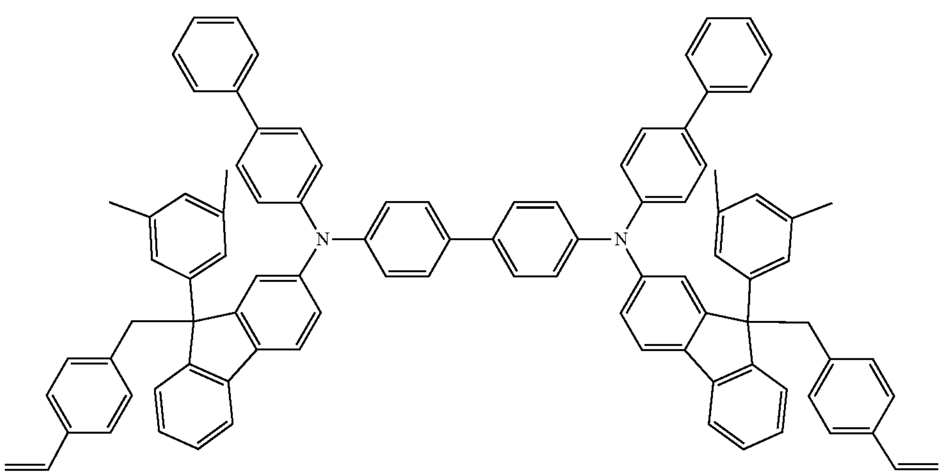

-continued
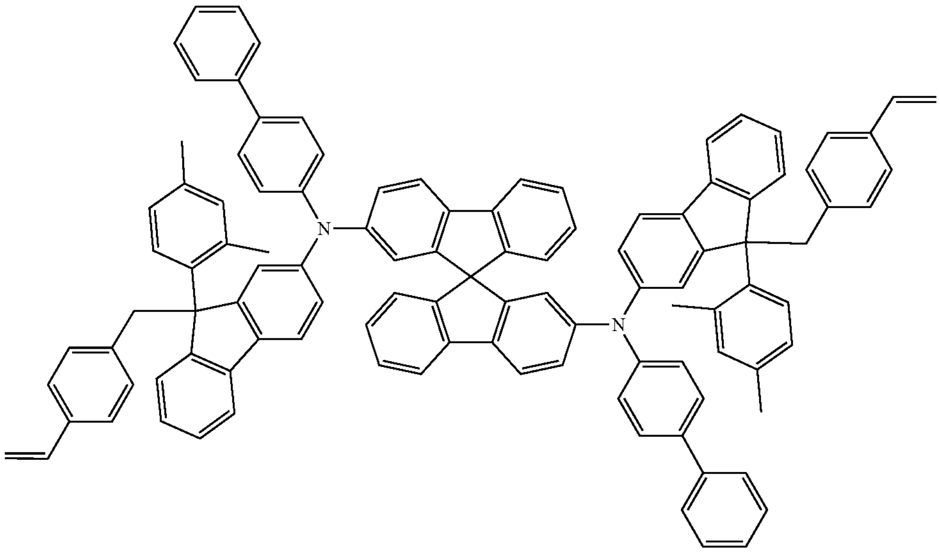
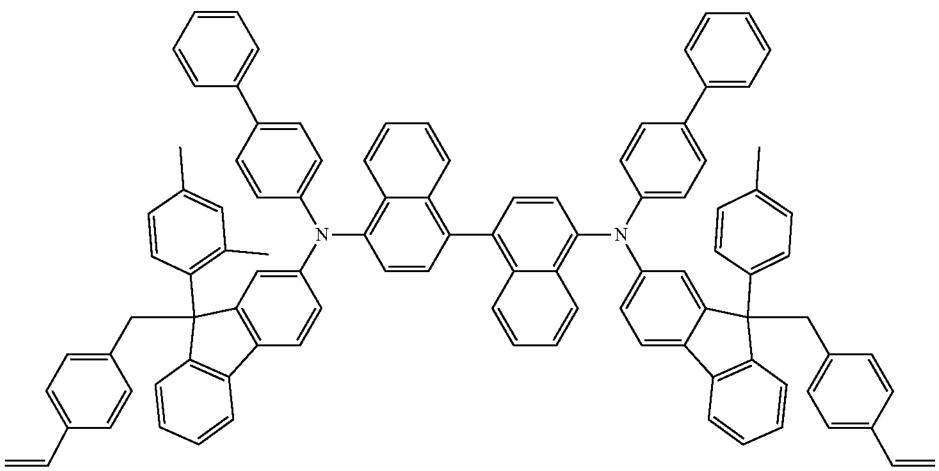
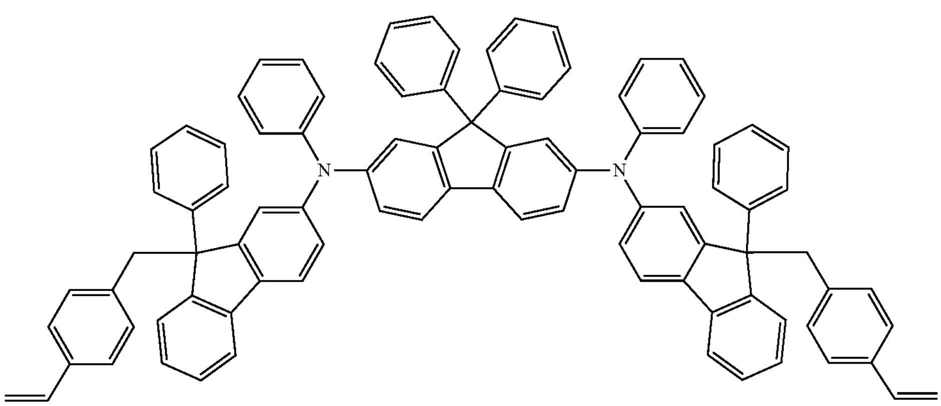

-continued
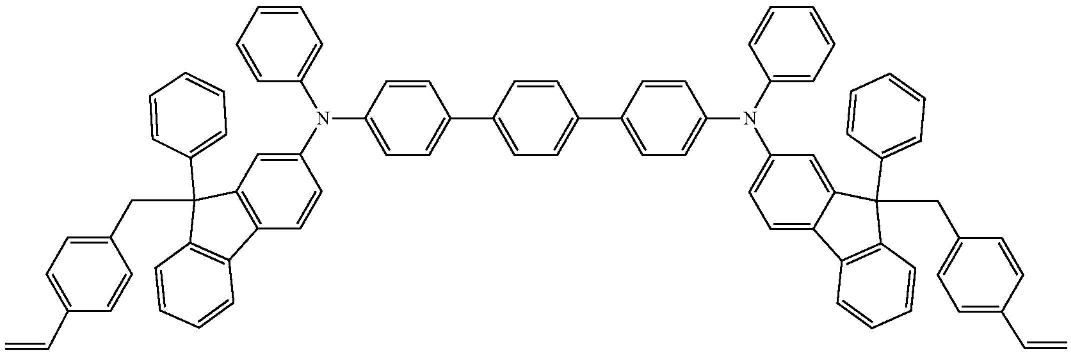
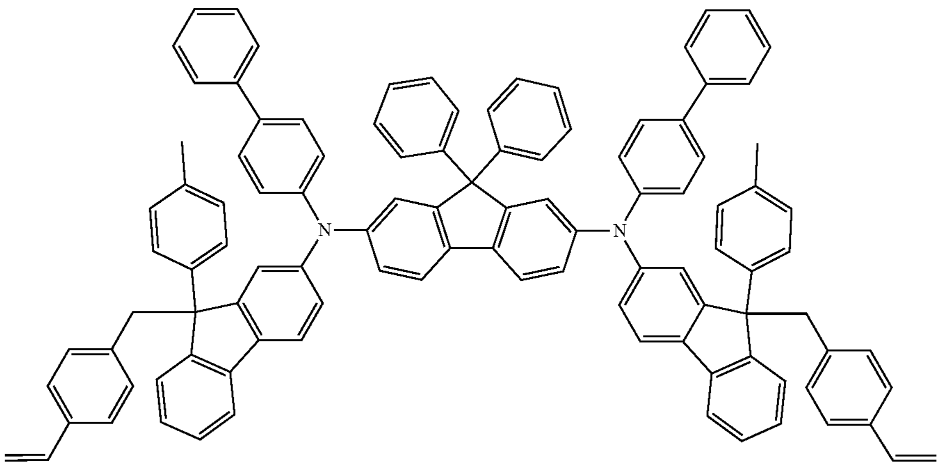
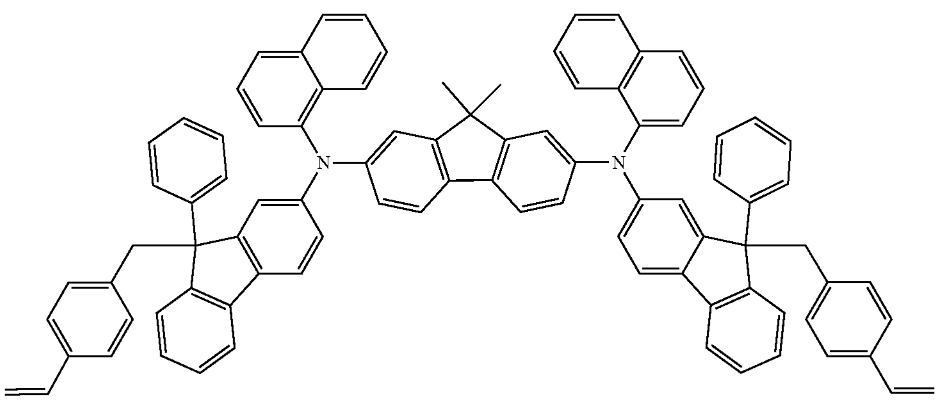
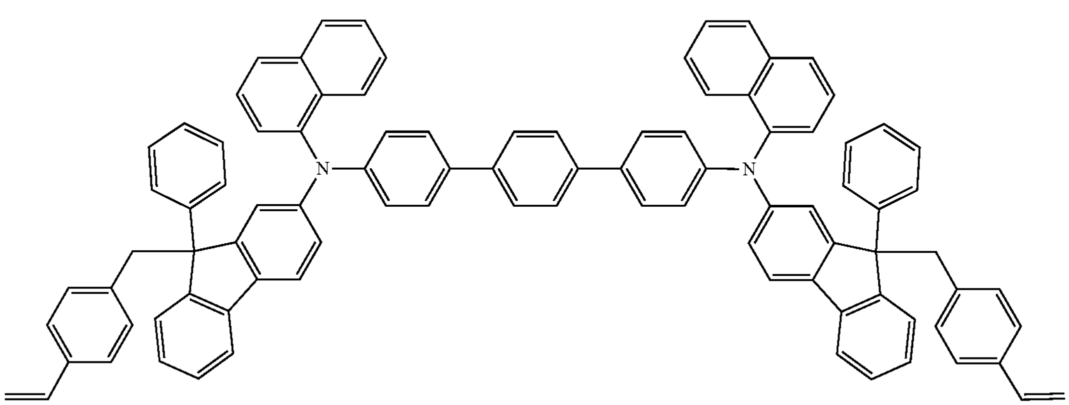

-continued
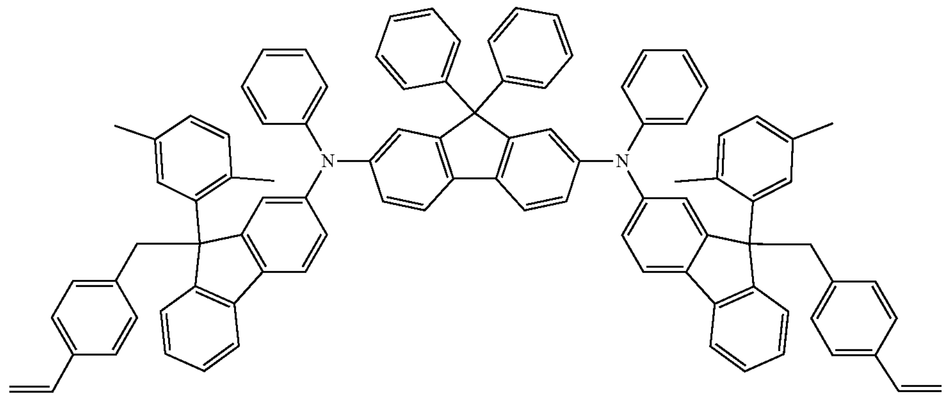
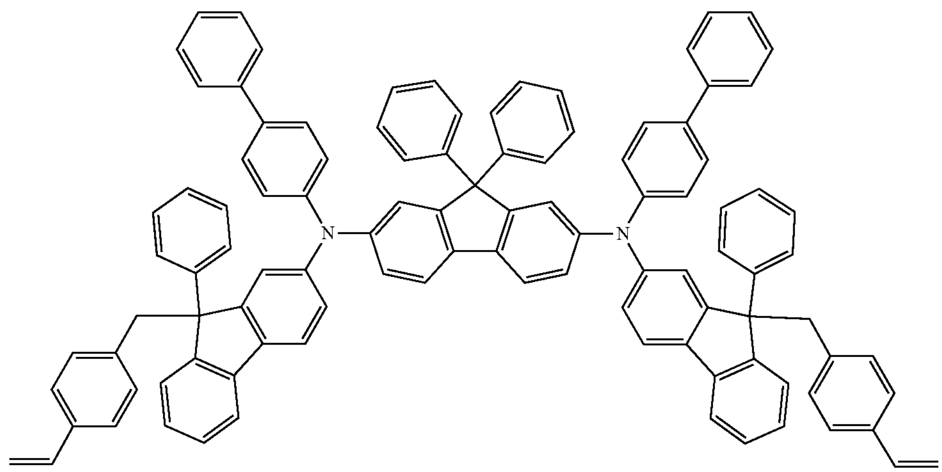
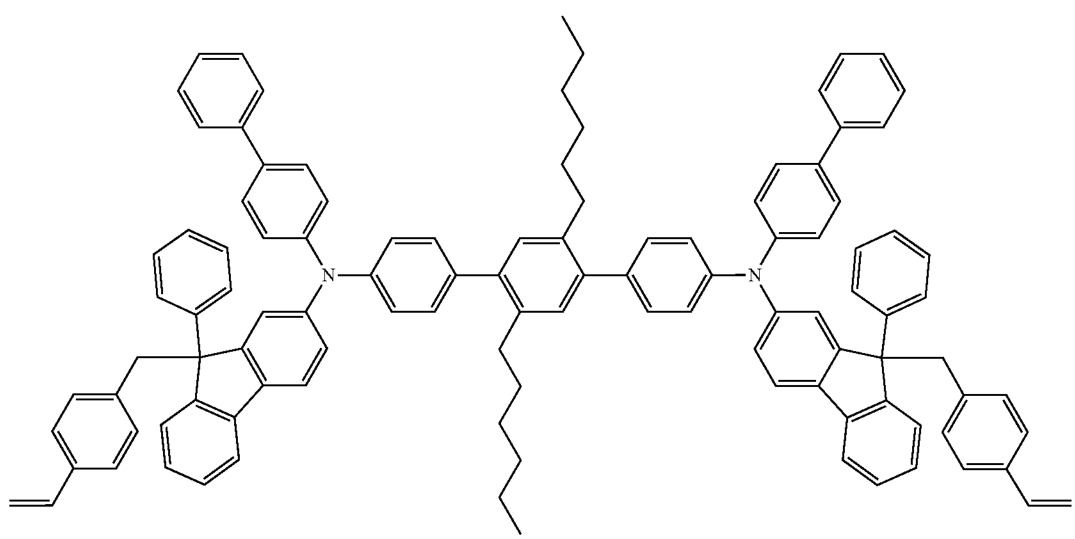

-continued
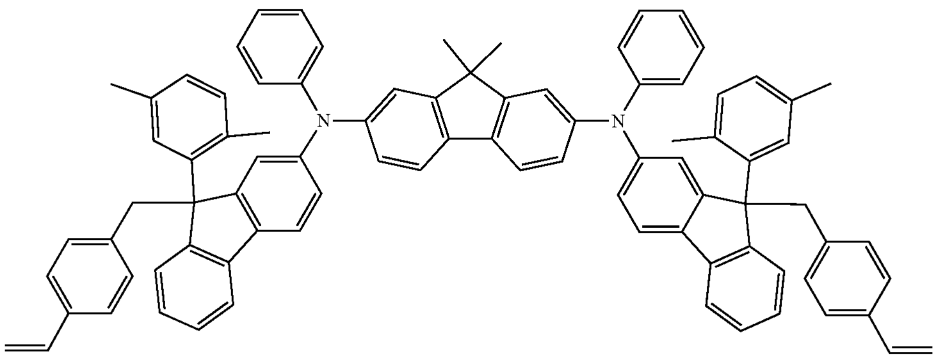
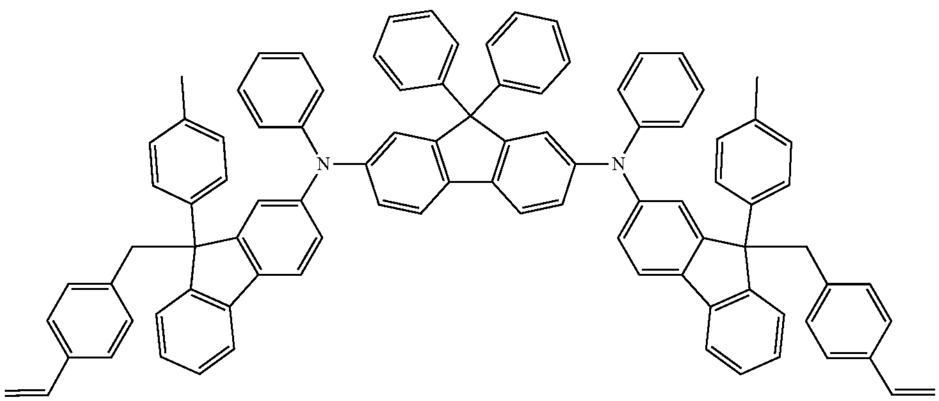
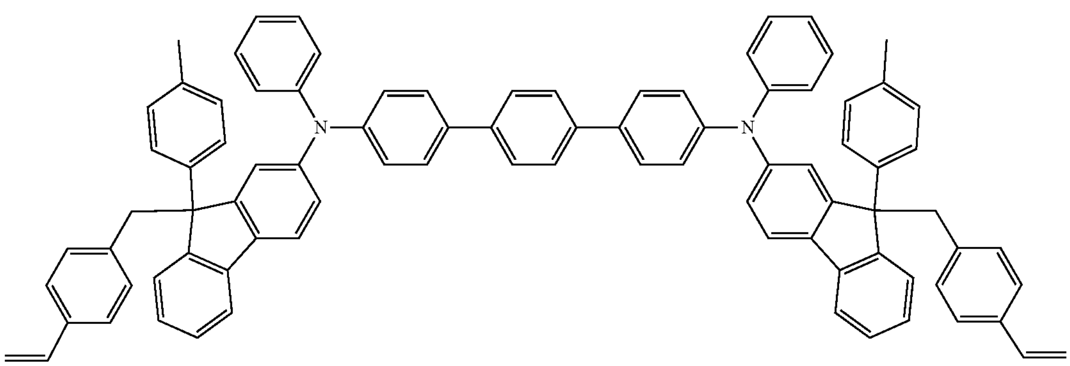
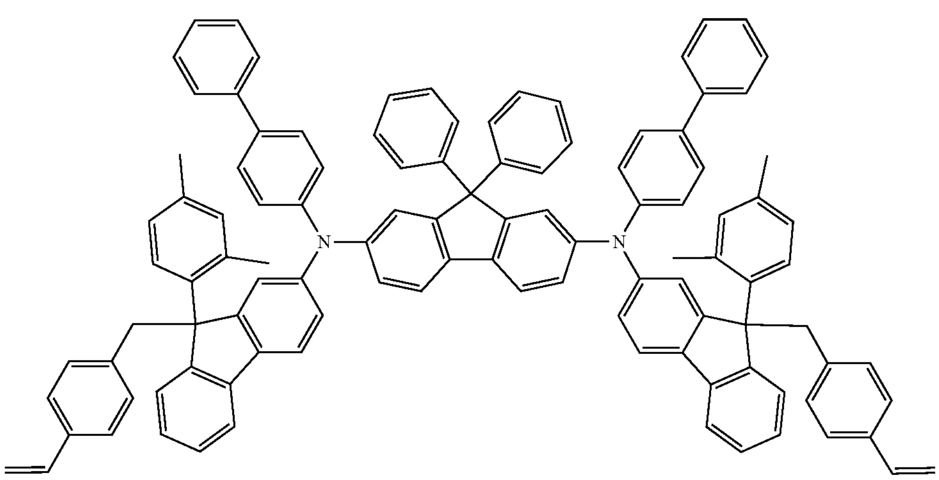

-continued
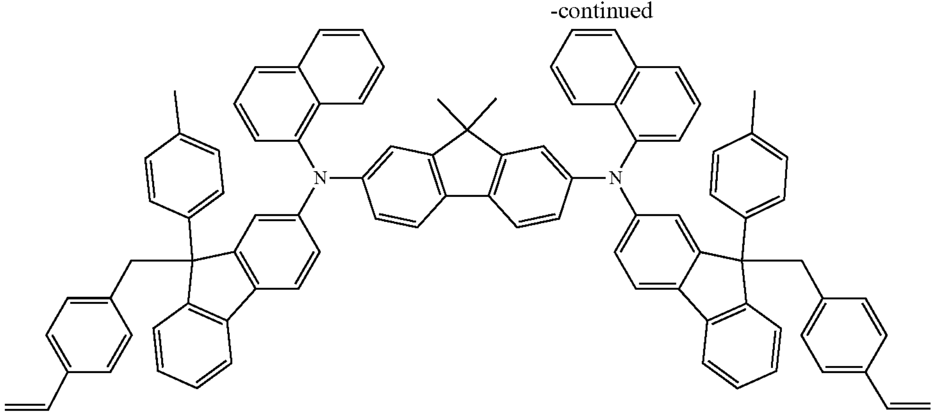
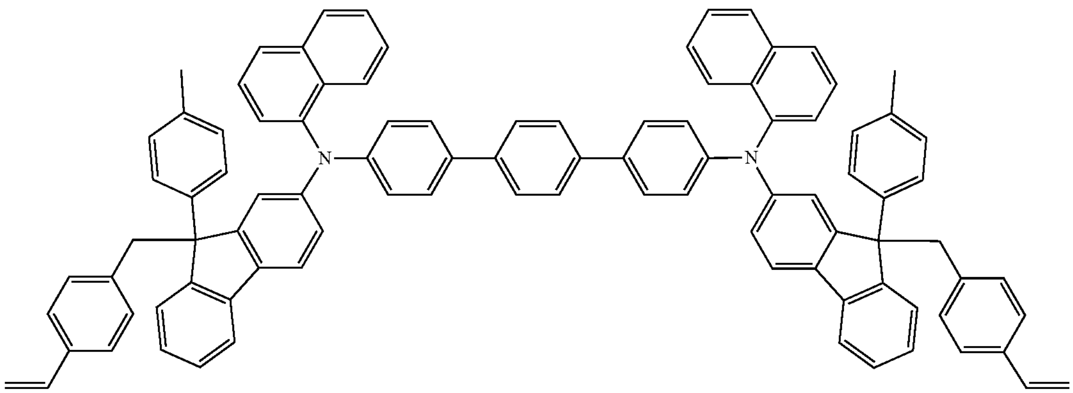
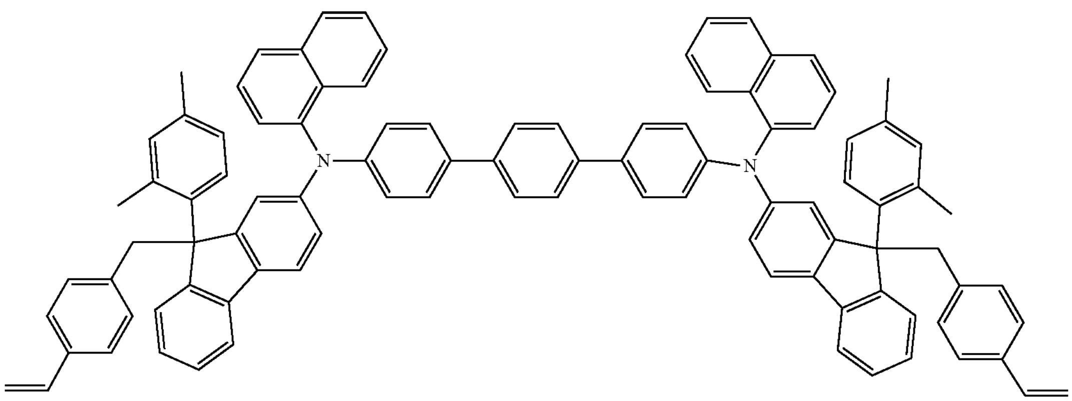
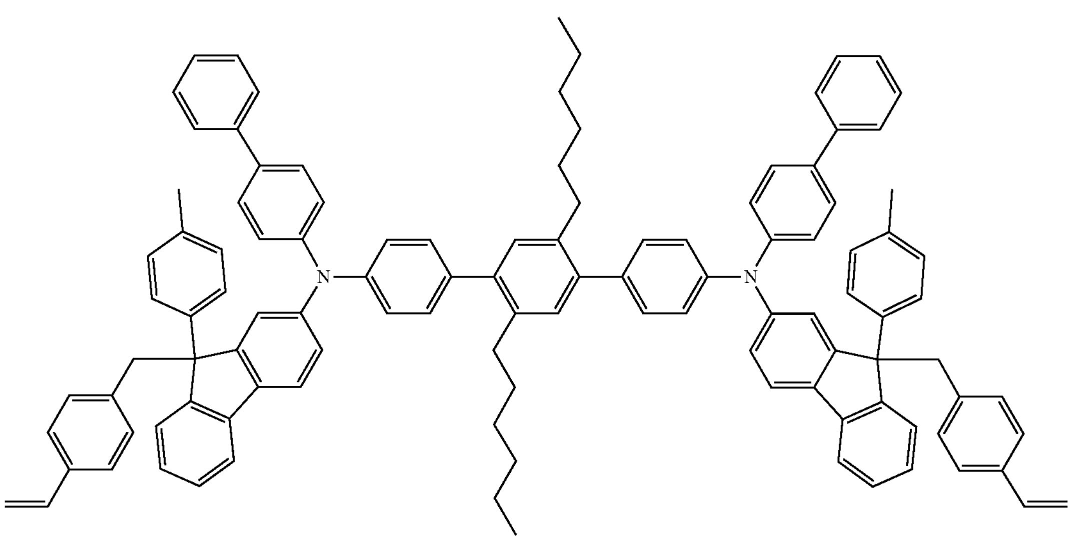

-continued
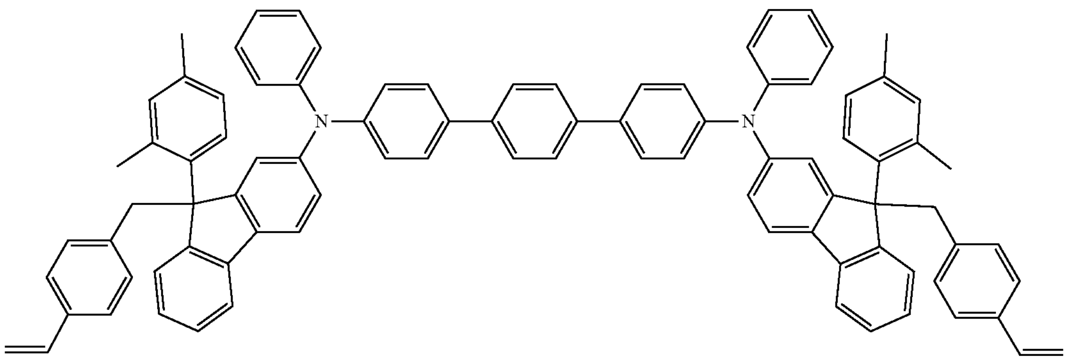
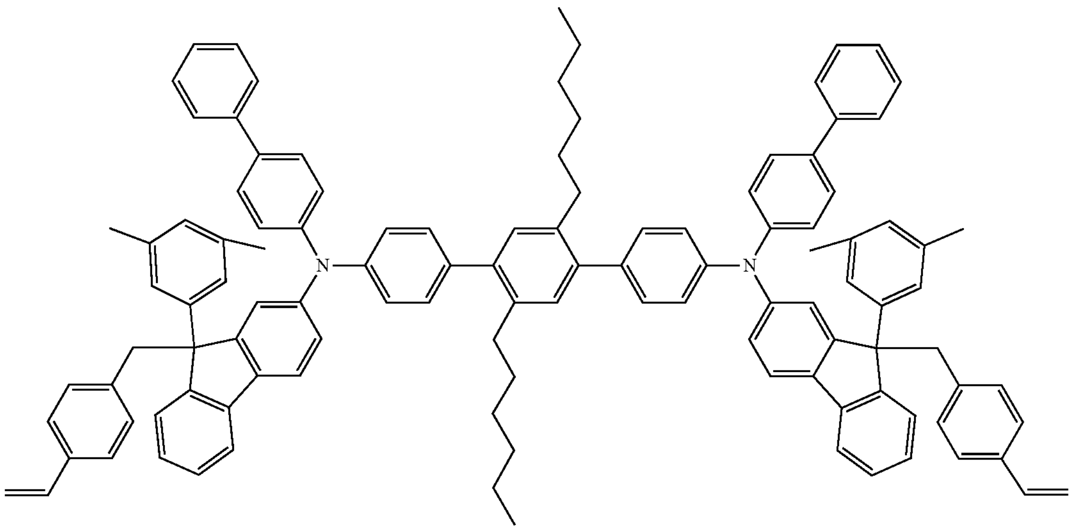
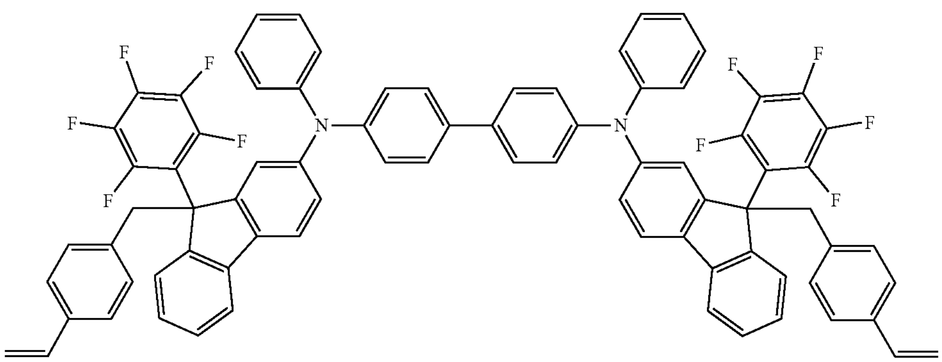
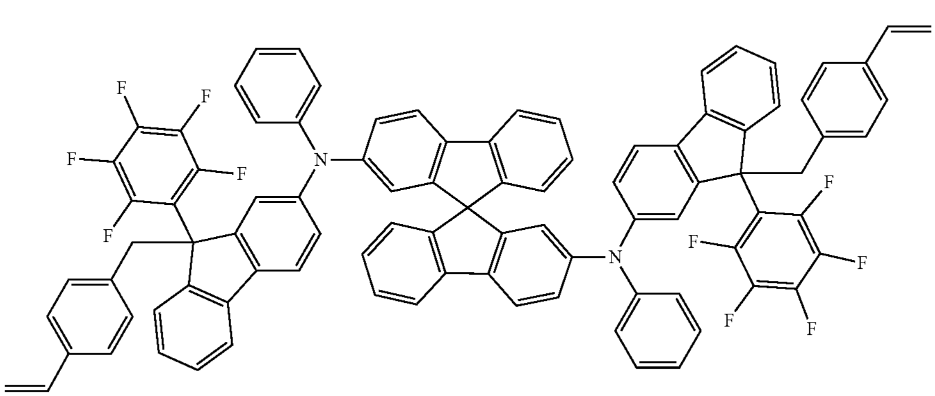

-continued
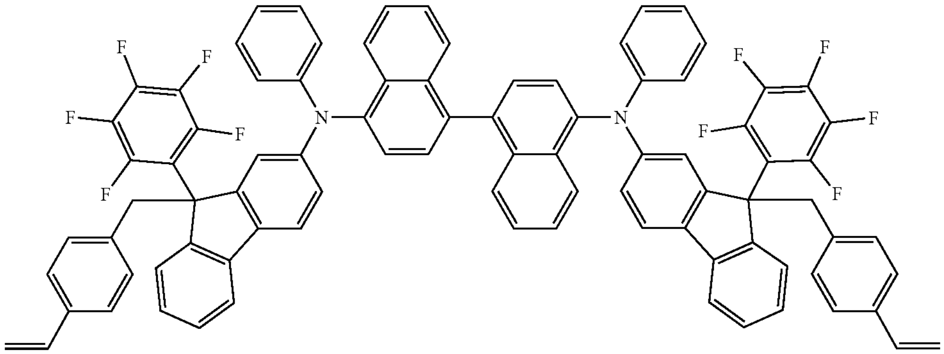
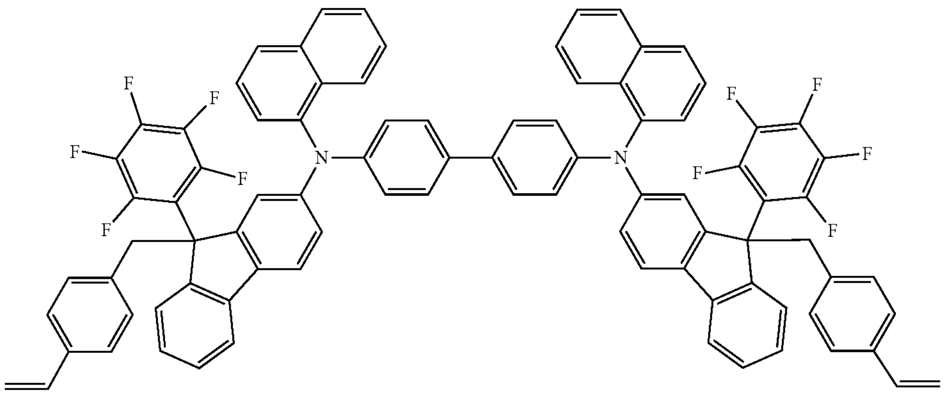
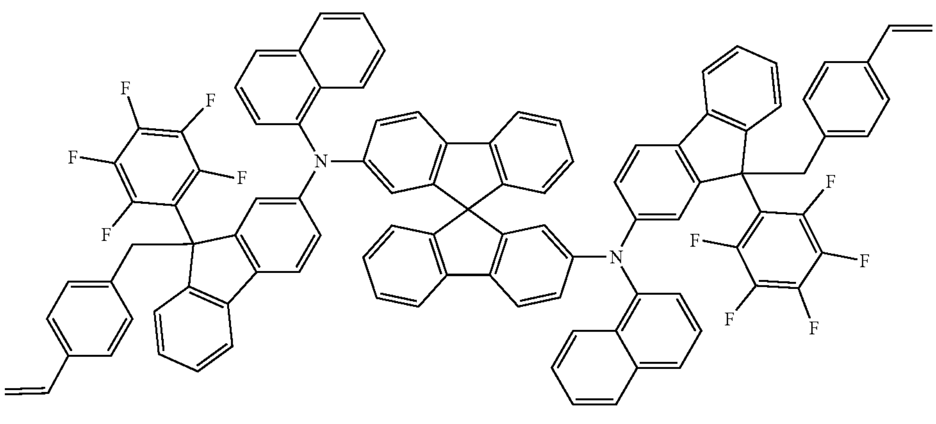
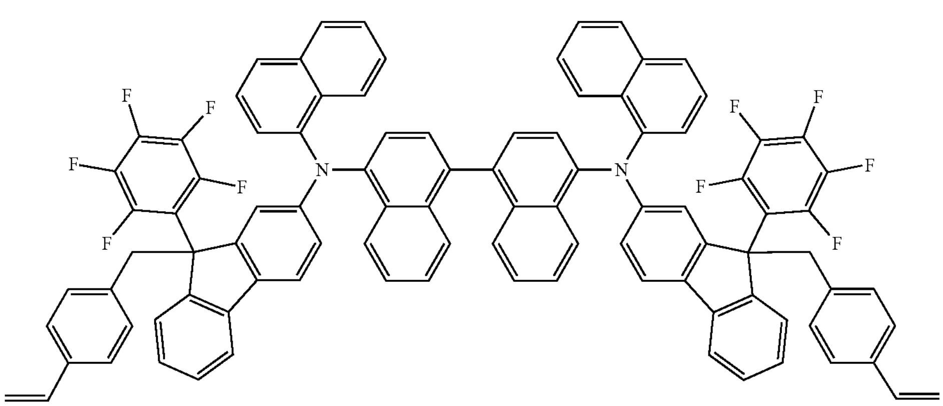

-continued
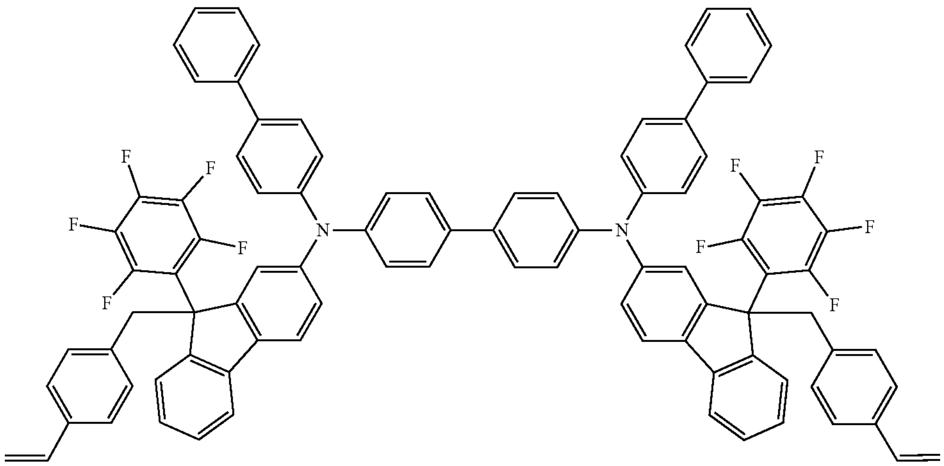
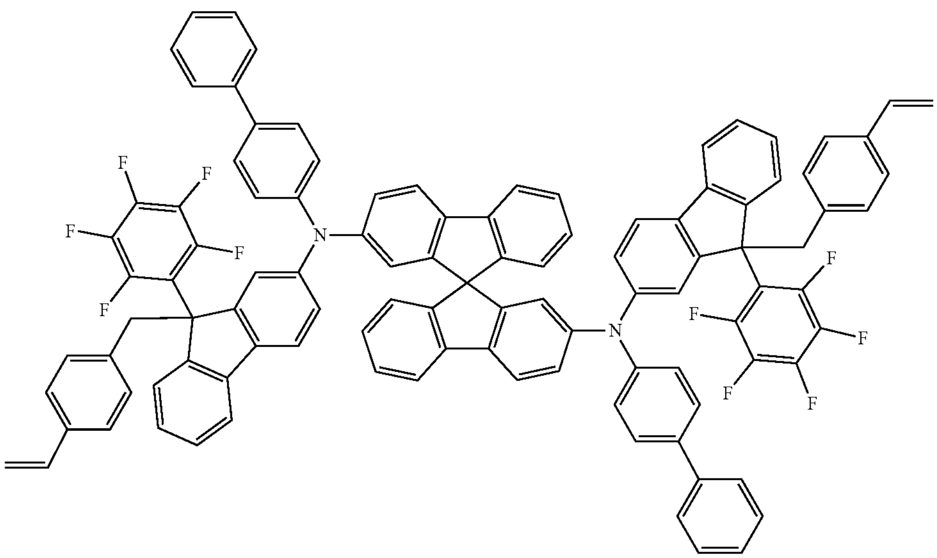
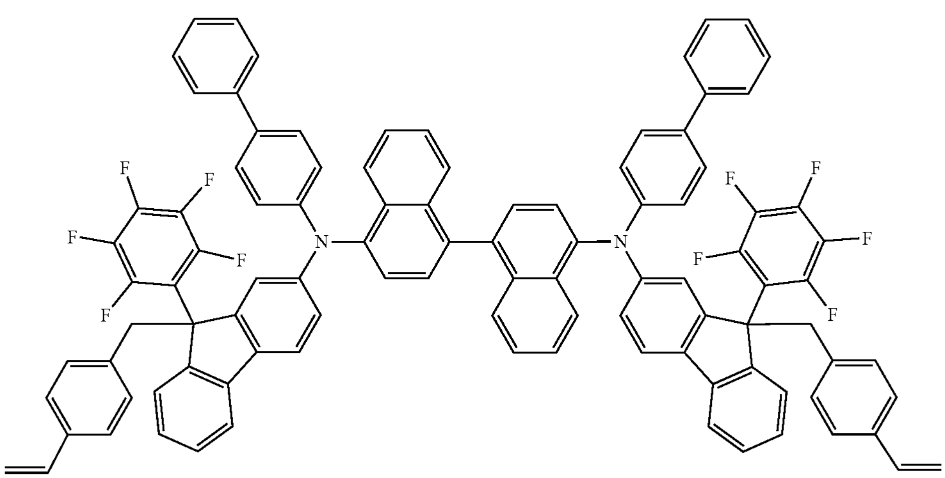

-continued
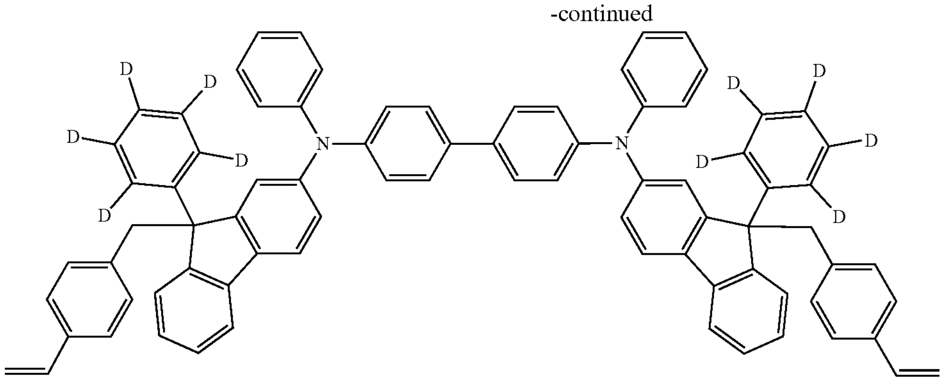
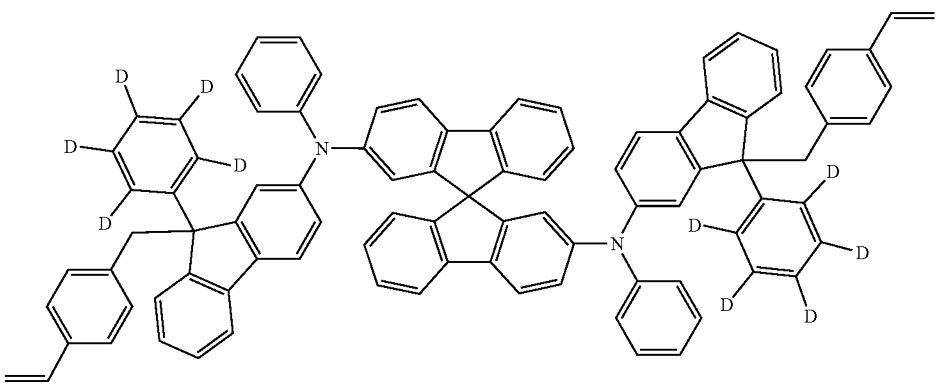
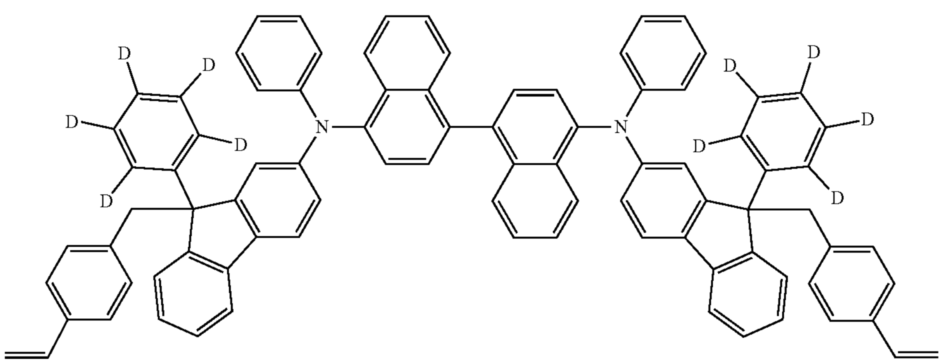
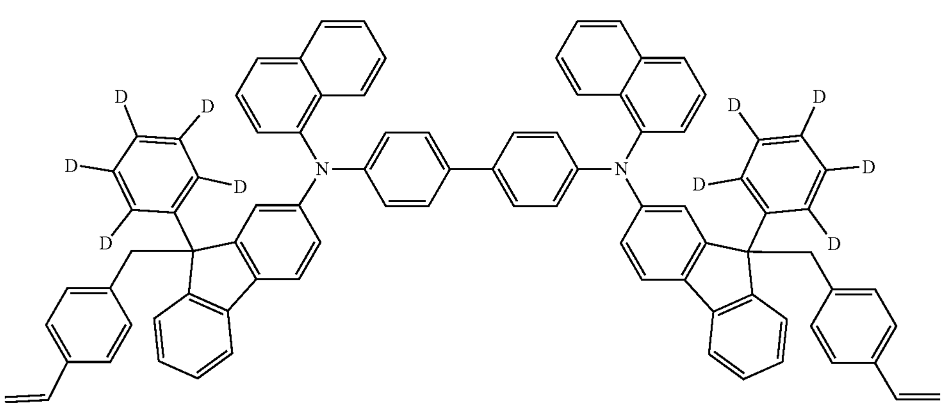

-continued
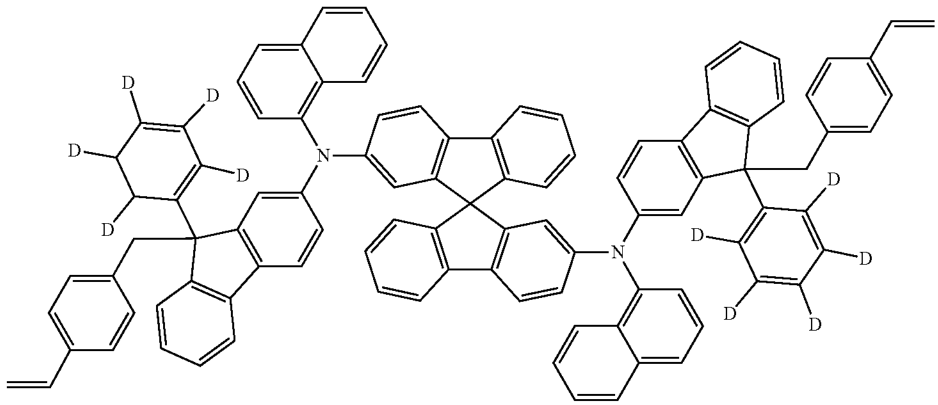
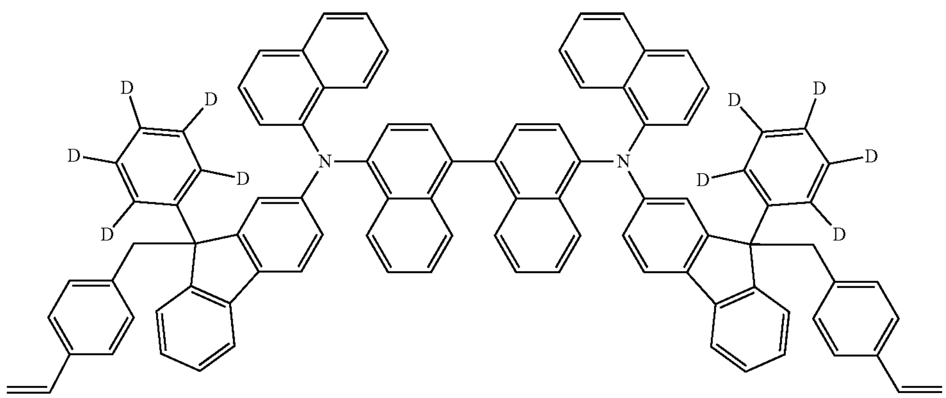
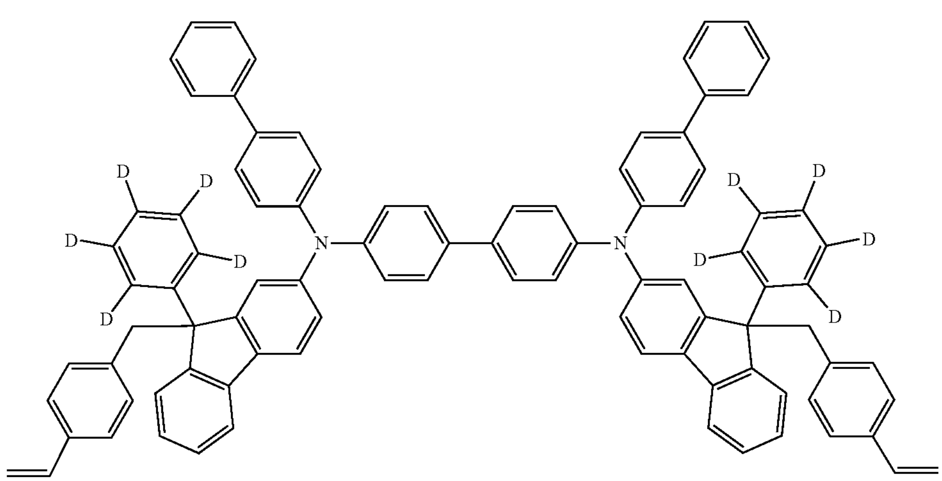

-continued
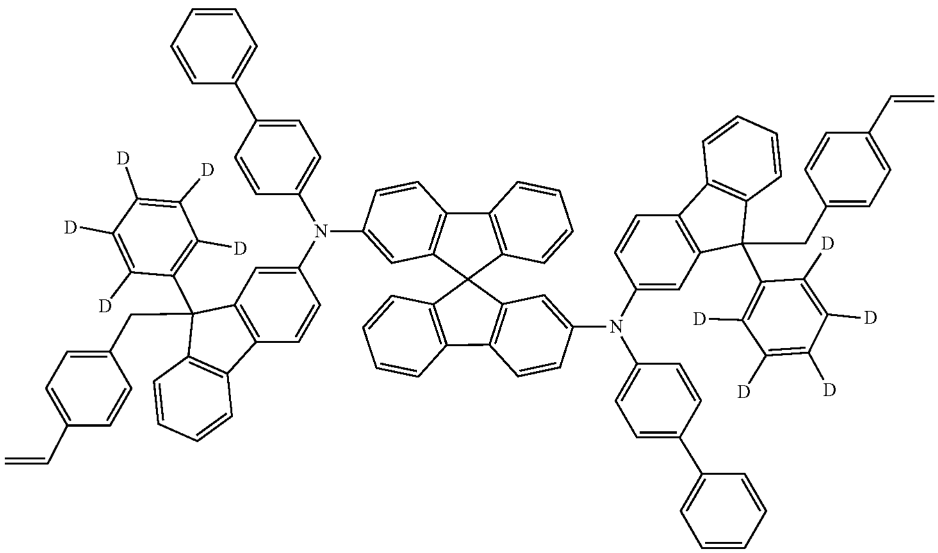
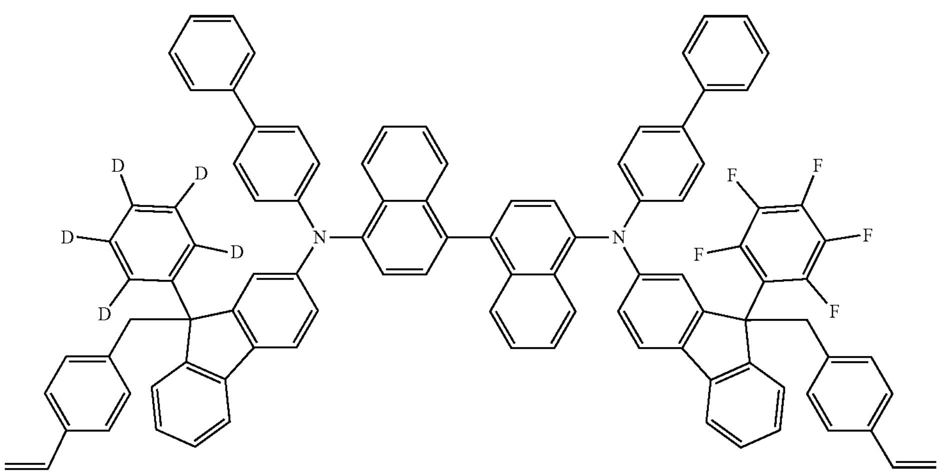
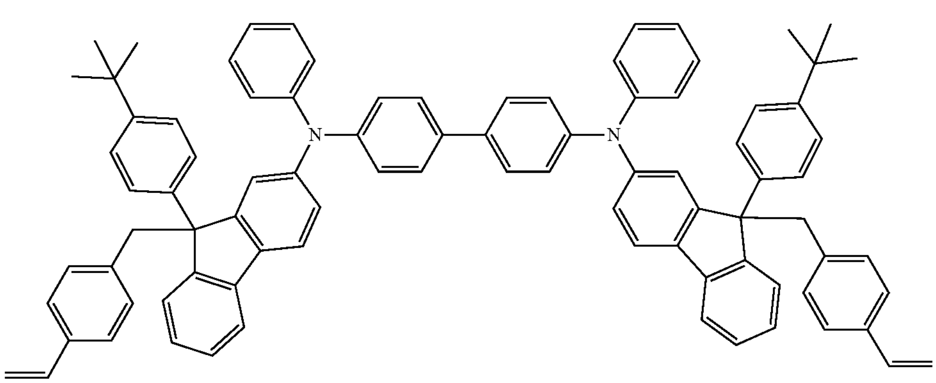

-continued
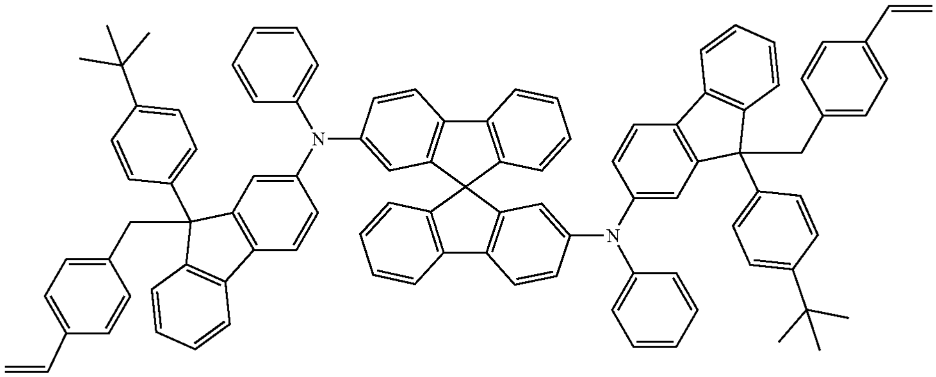
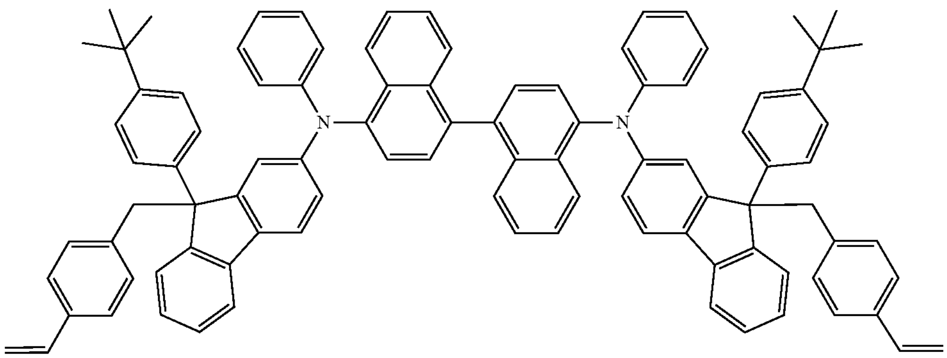
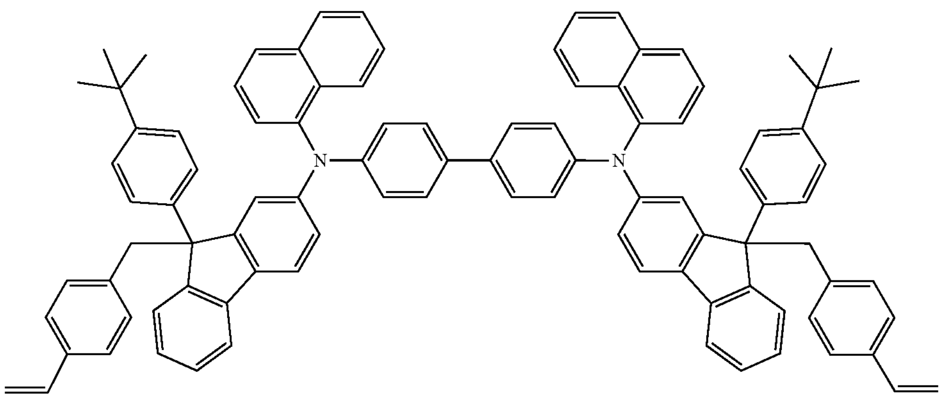
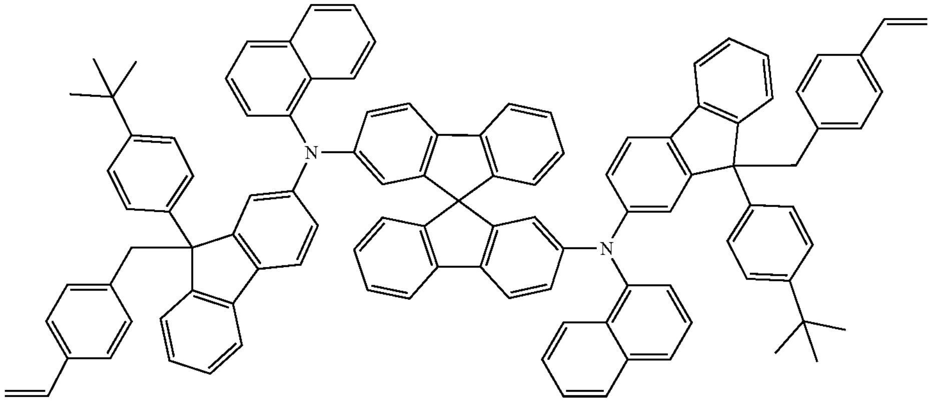

-continued
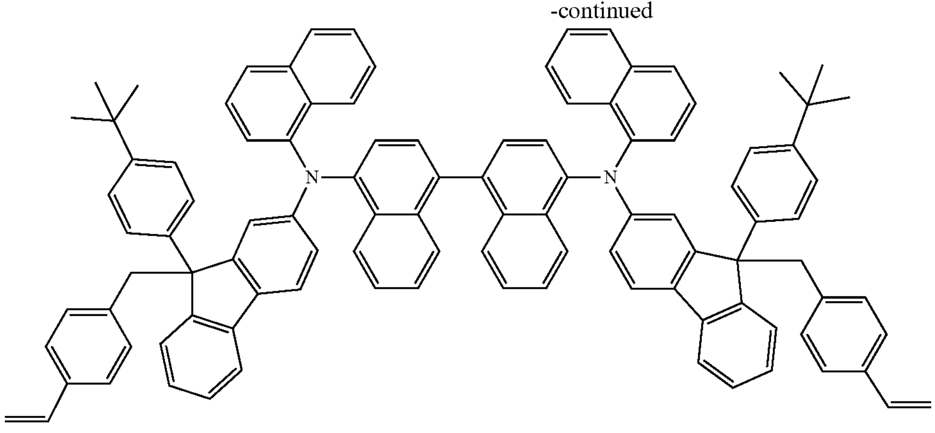
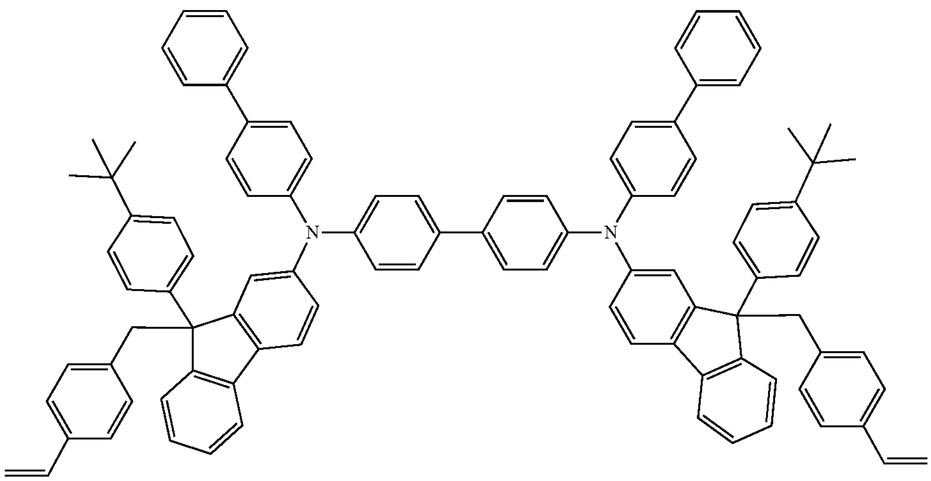
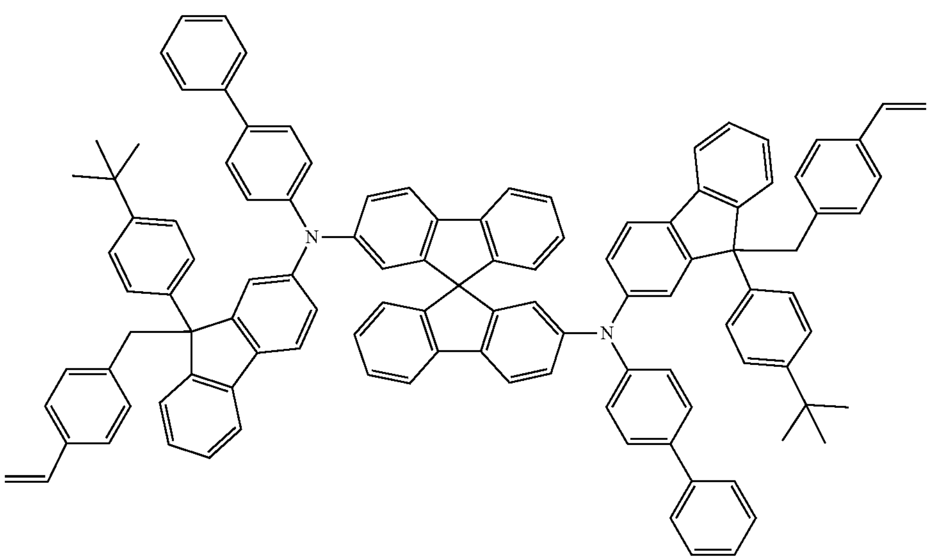

-continued
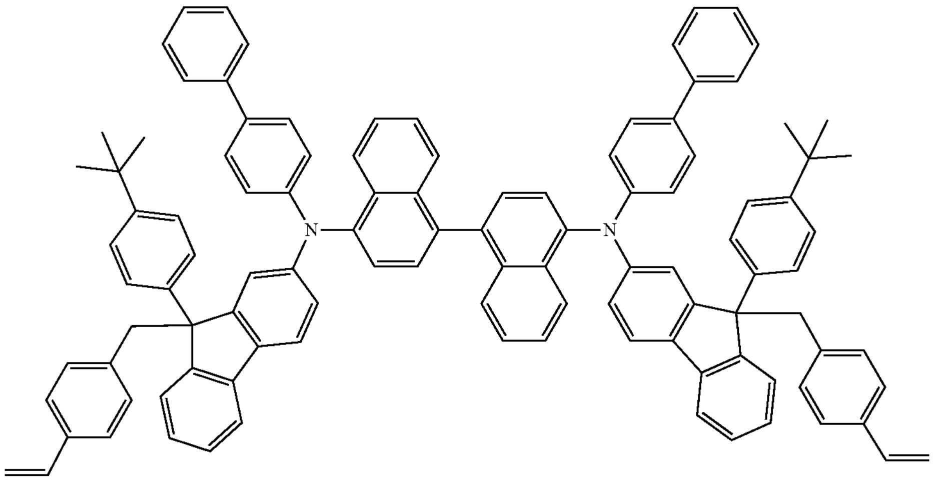
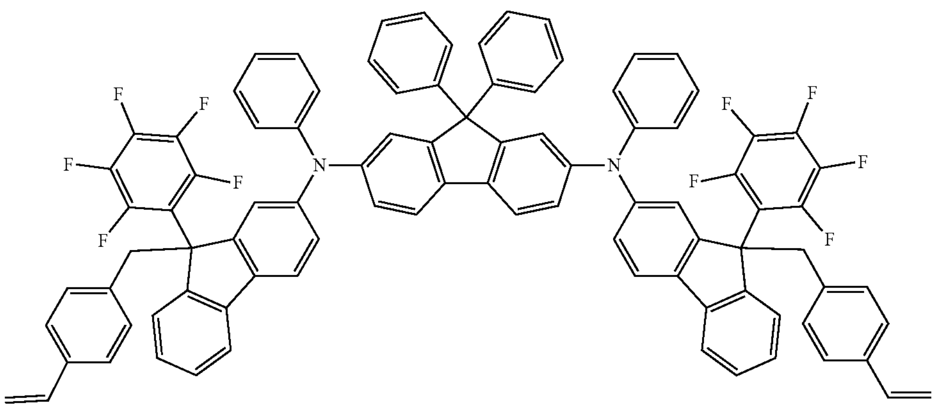
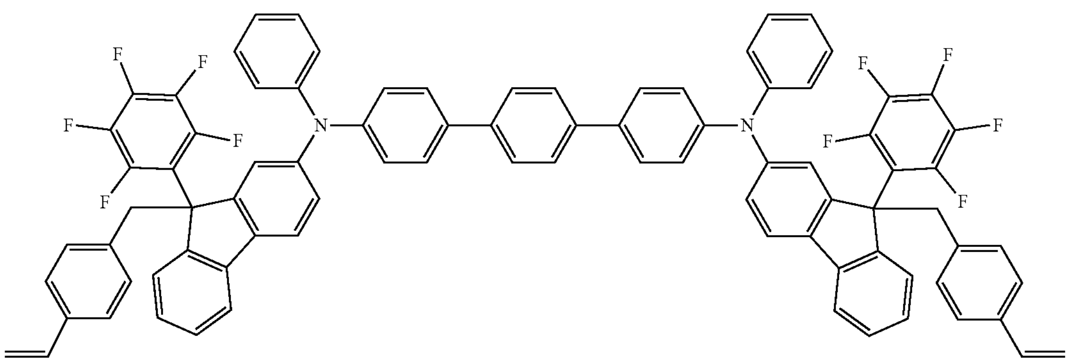
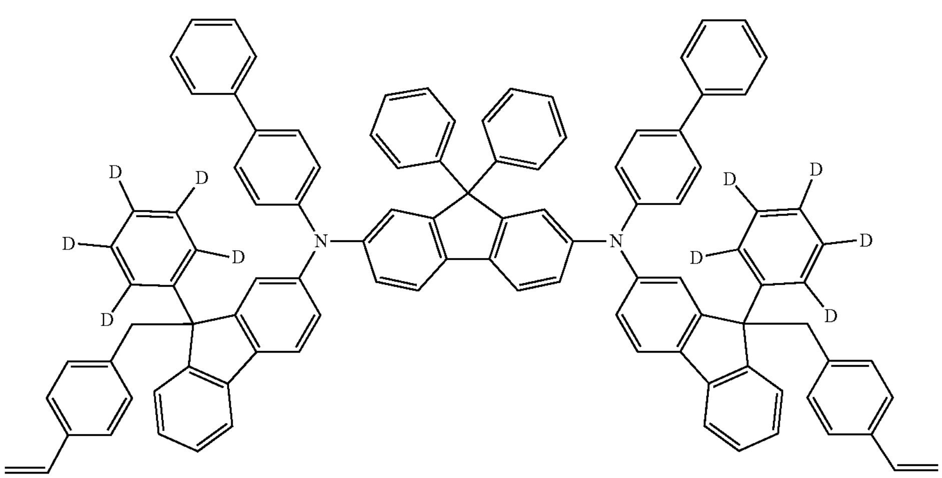

-continued
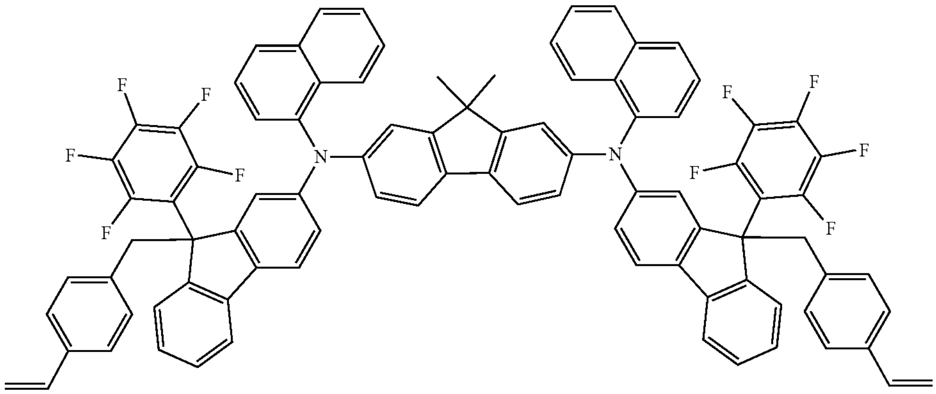
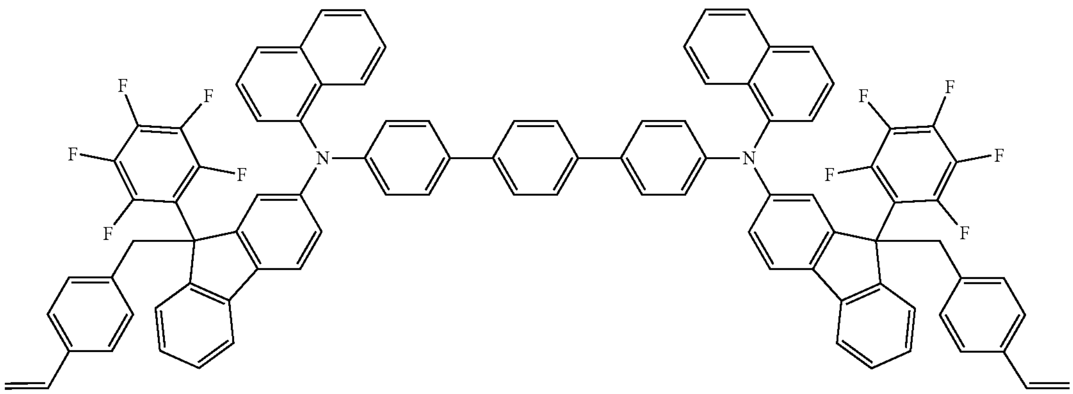
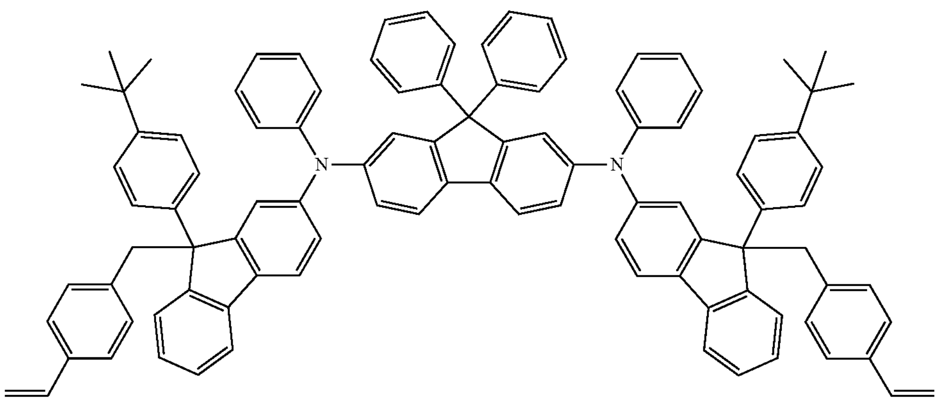
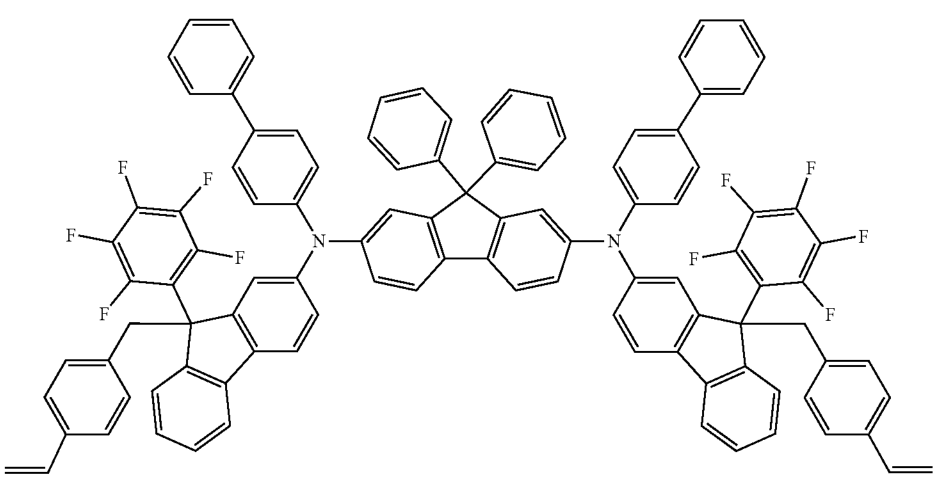

-continued
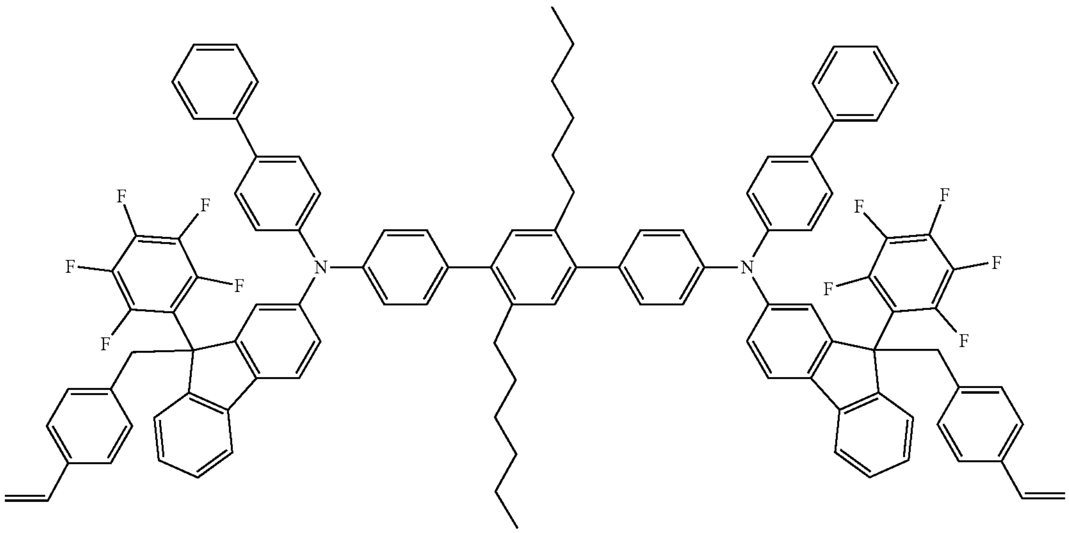
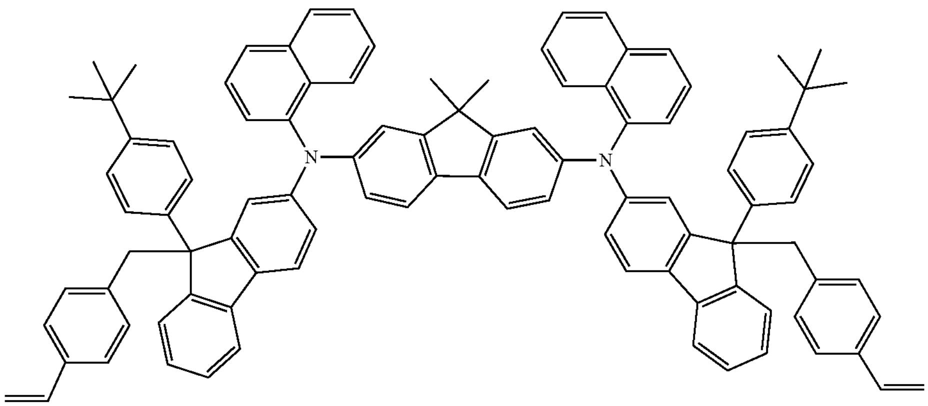
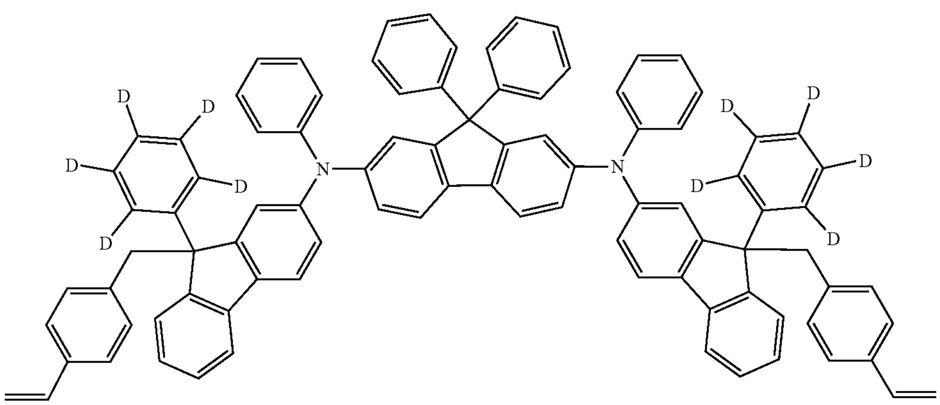
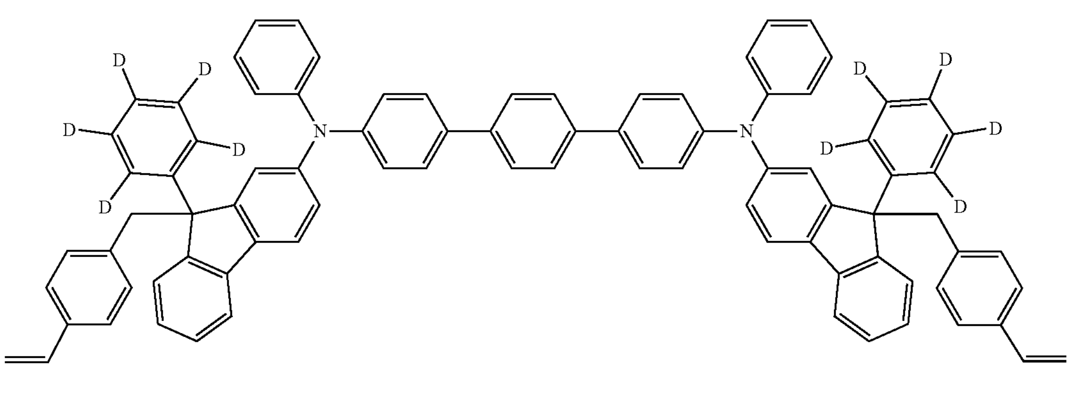

-continued
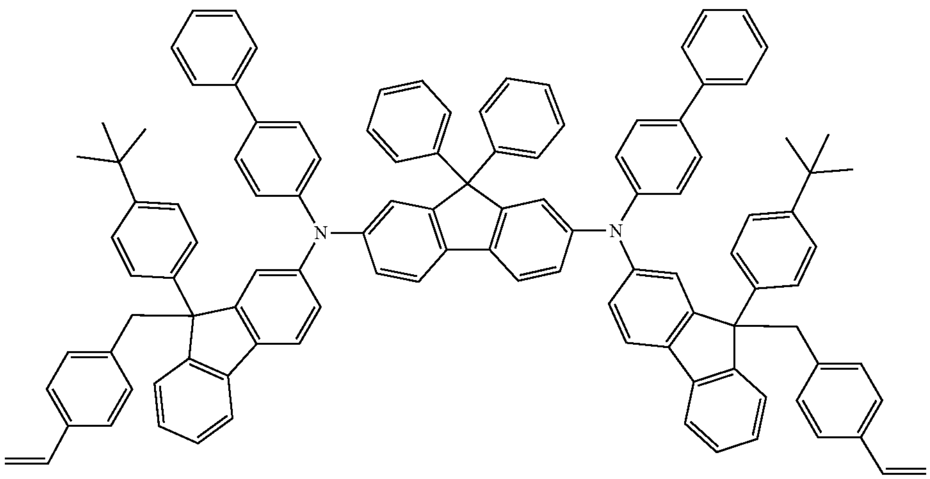
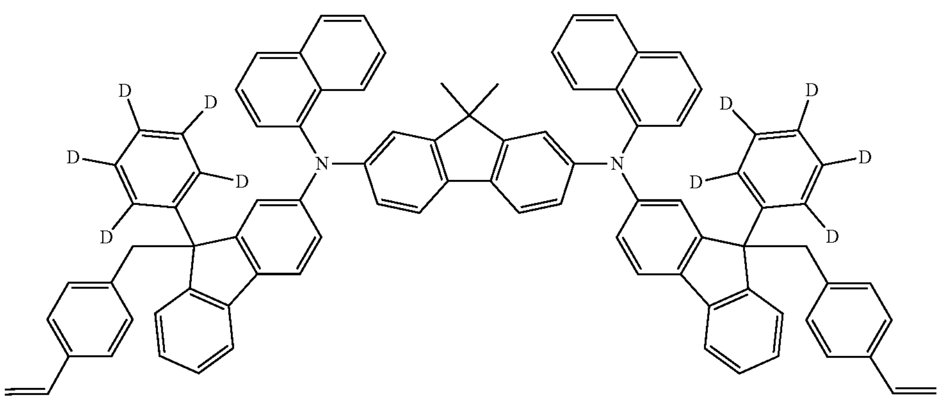
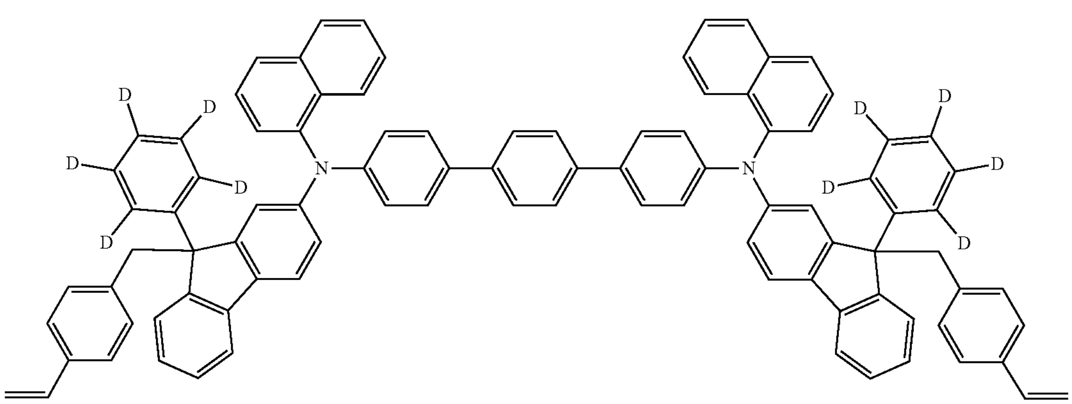

-continued
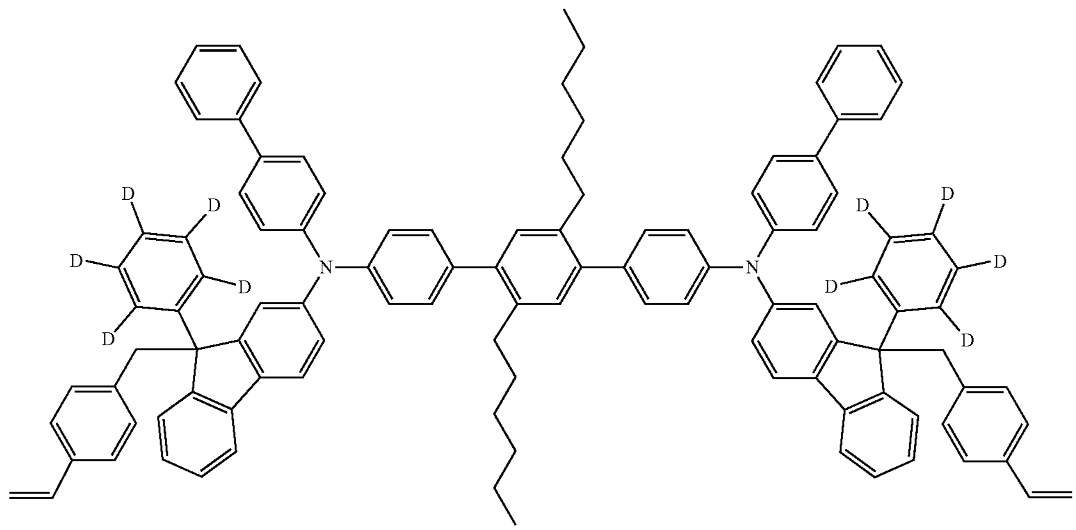
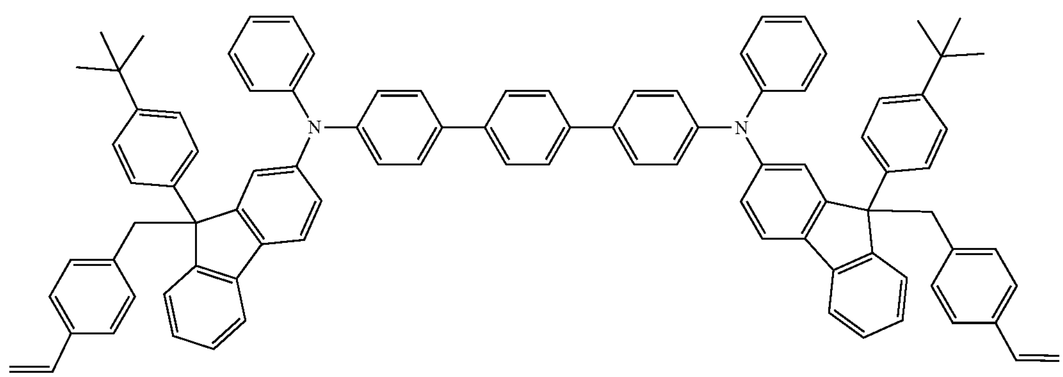
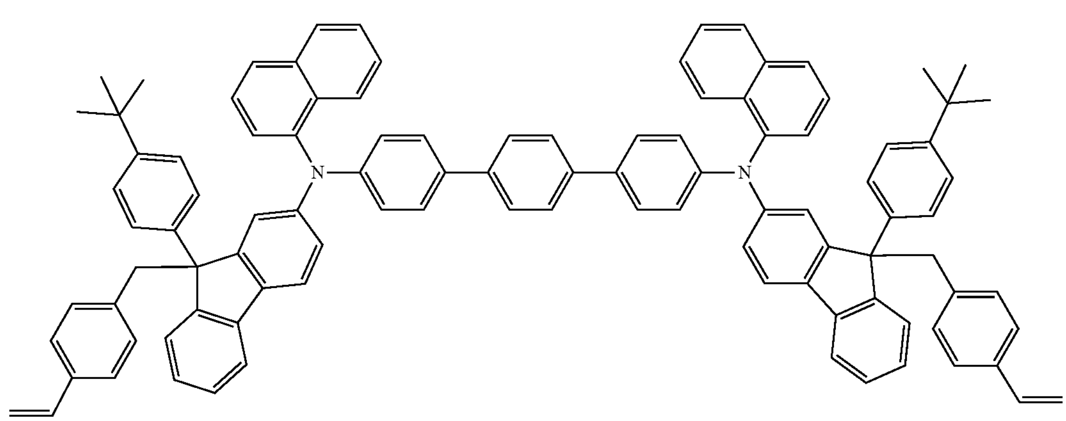

-continued
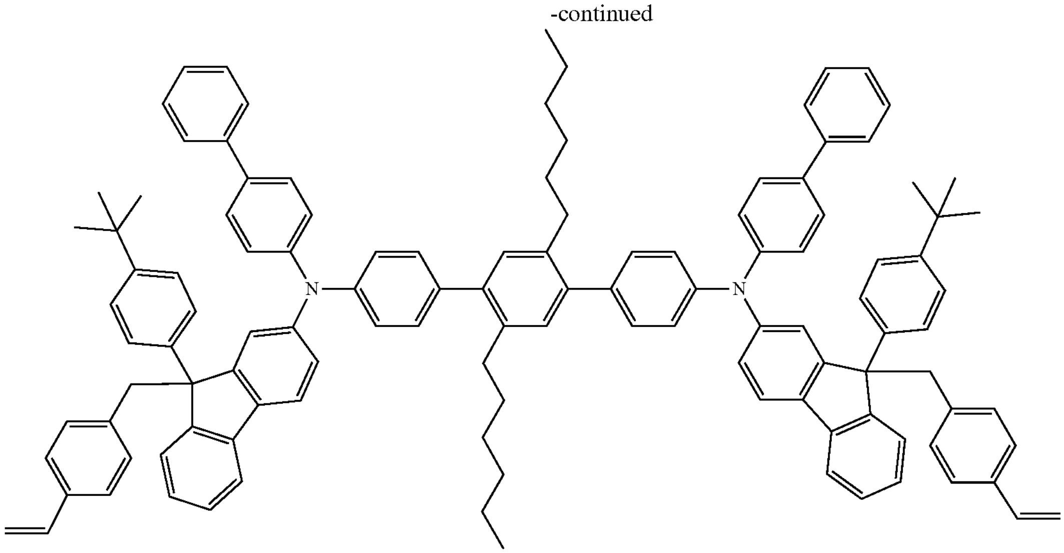
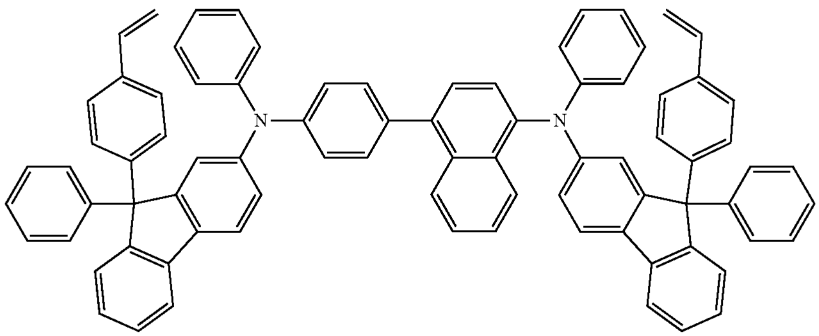
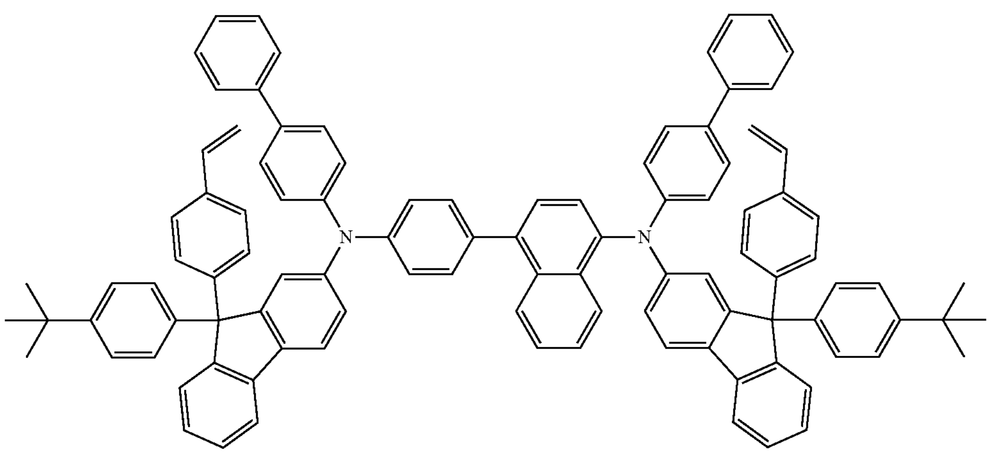
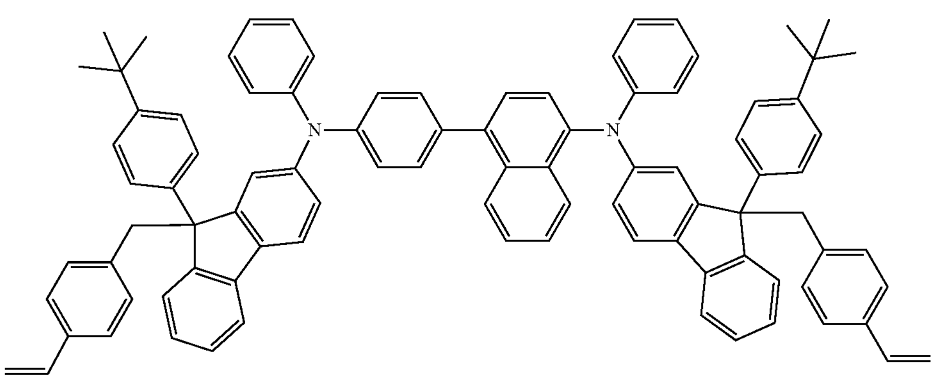

-continued
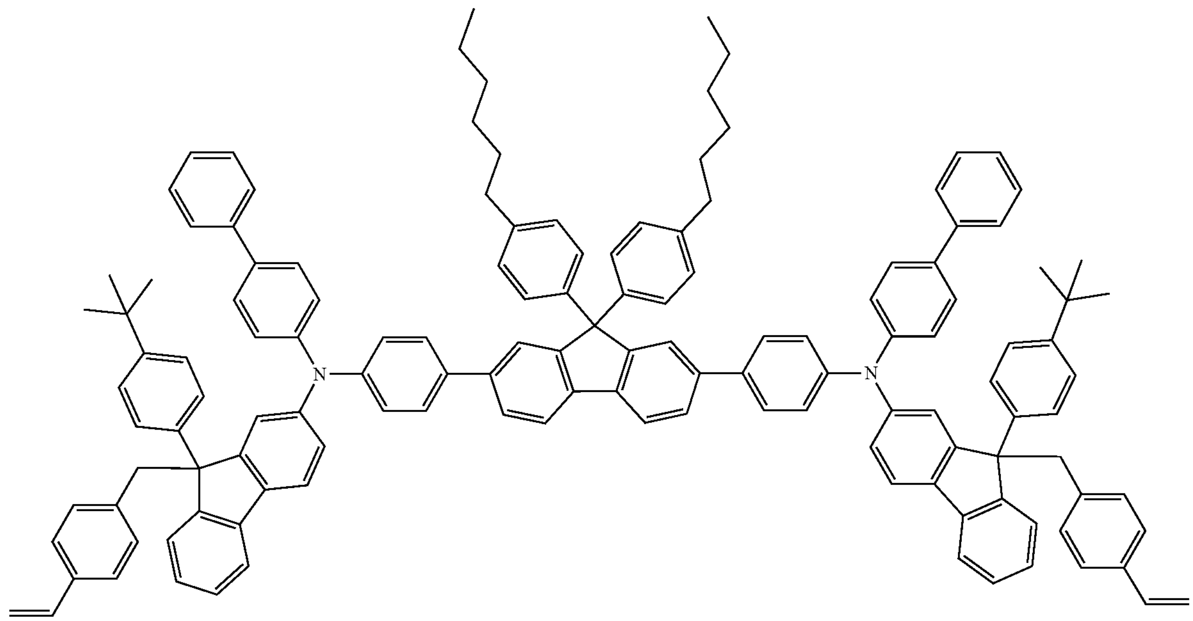
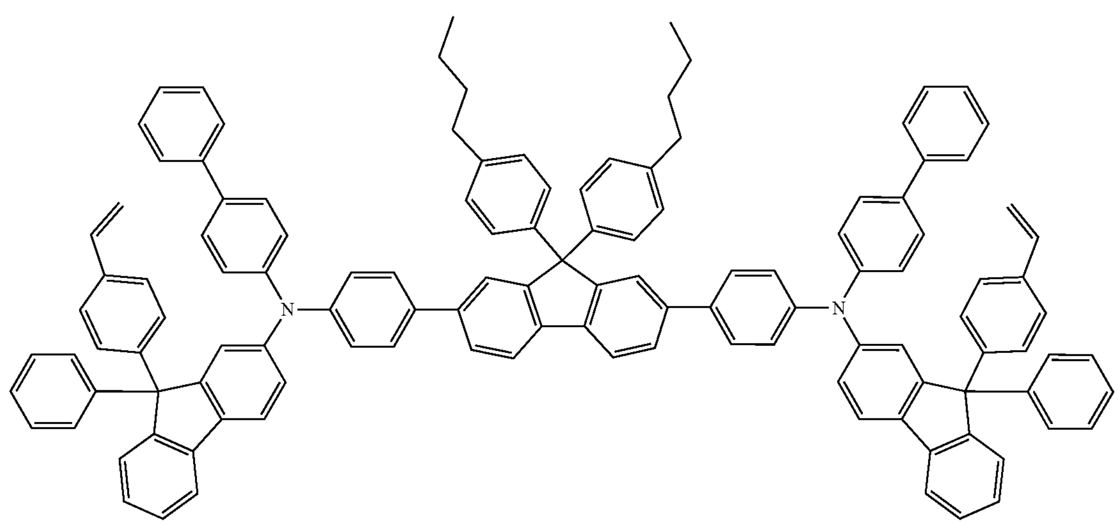

-continued
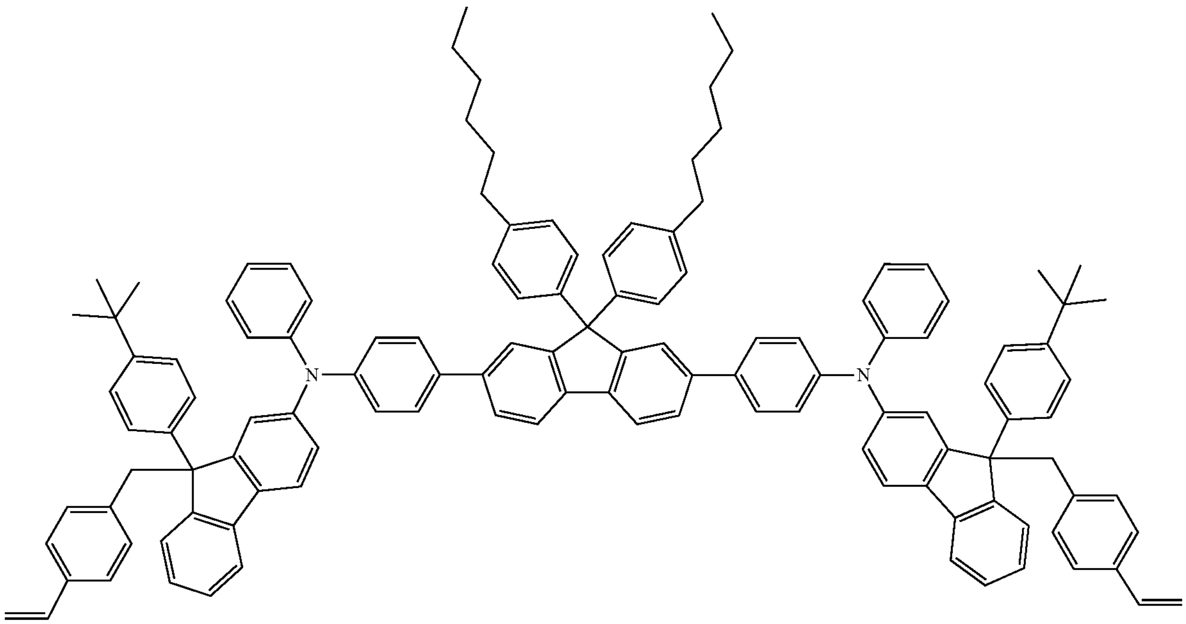
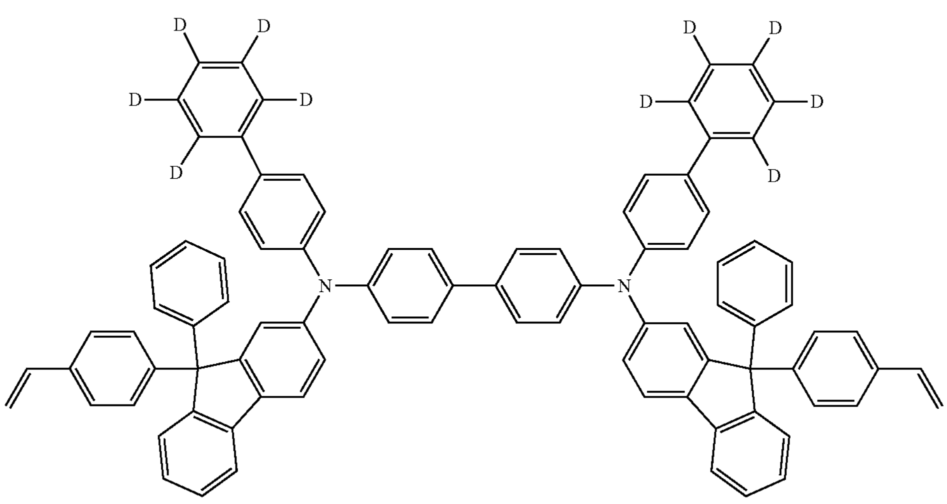

-continued
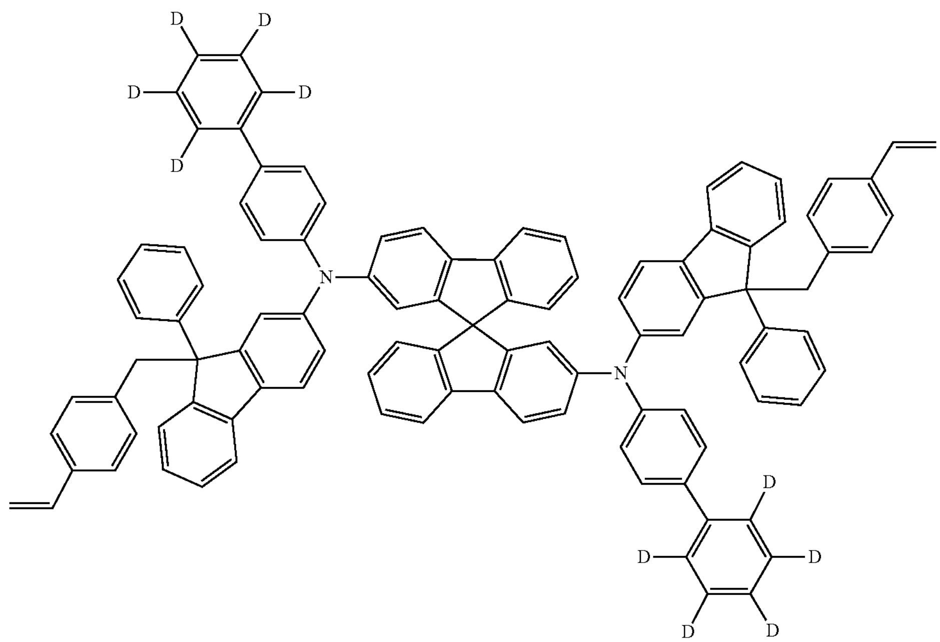 [SMILES: [2H]c1c([2H])c([2H])c(-c2ccc(N(c3ccc4c(c3)C(Cc3ccc(C=C)cc3)(c3ccccc3)c3ccccc3-4)c3ccc4c(c3)C3(c5ccccc5-4)c4ccccc4-c4ccc(N(c5ccc(-c6c([2H])c([2H])c([2H])c([2H])c6[2H])cc5)c5ccc6c(c5)C(Cc5ccc(C=C)cc5)(c5ccccc5)c5ccccc5-6)cc43)cc2)c([2H])c1[2H]]
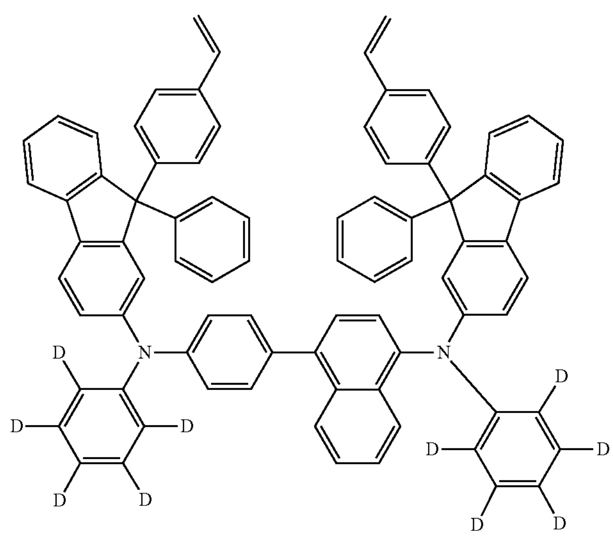

-continued
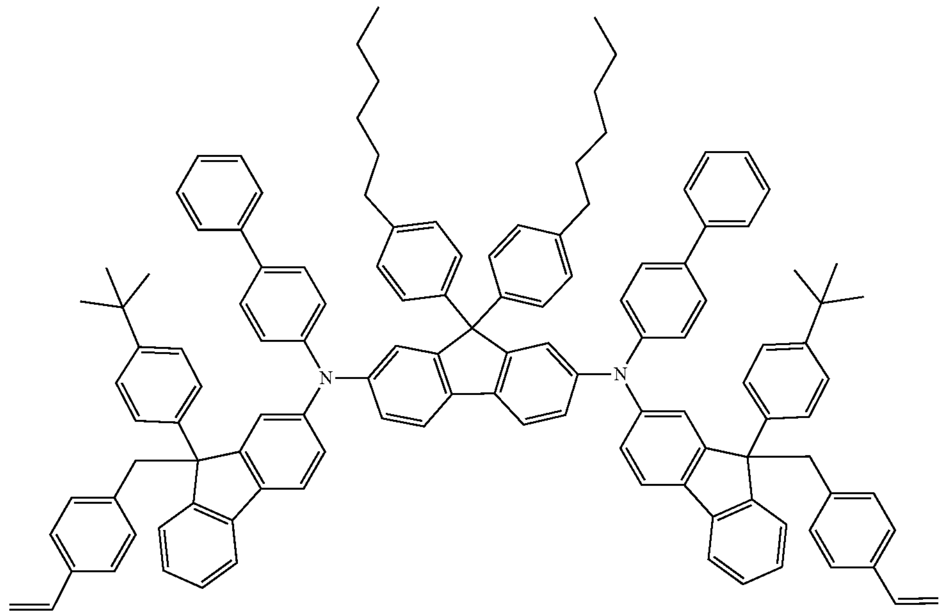
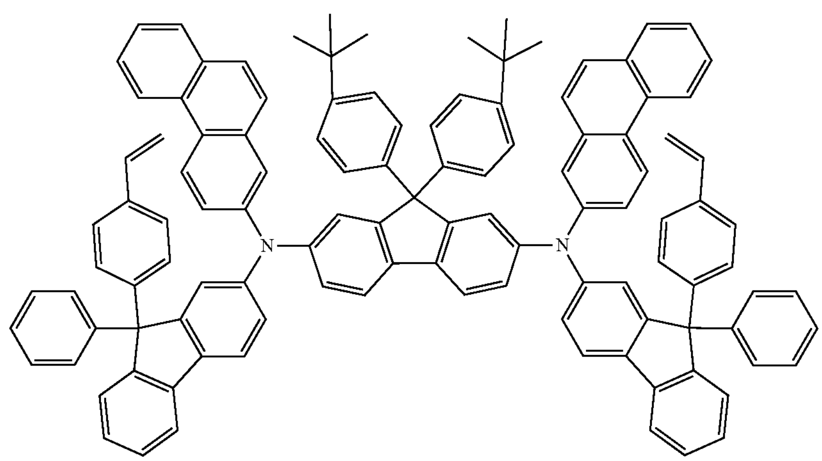
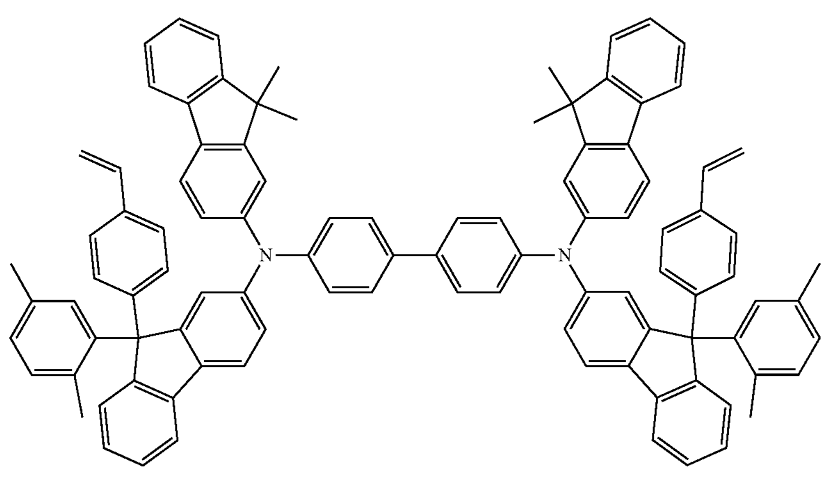

-continued
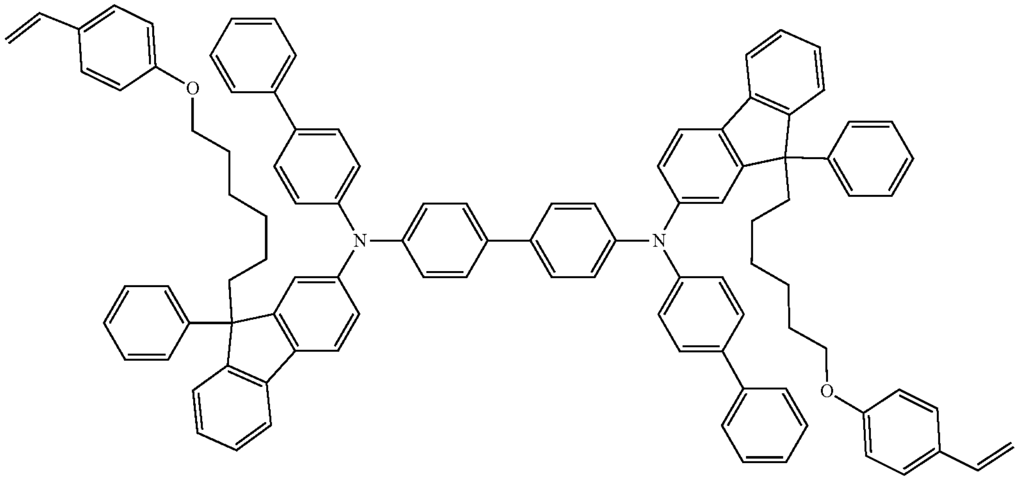
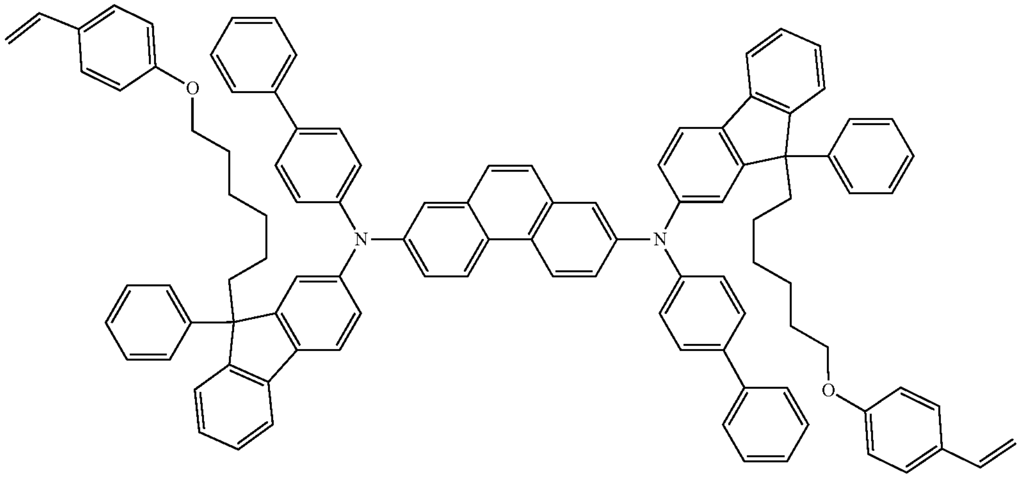
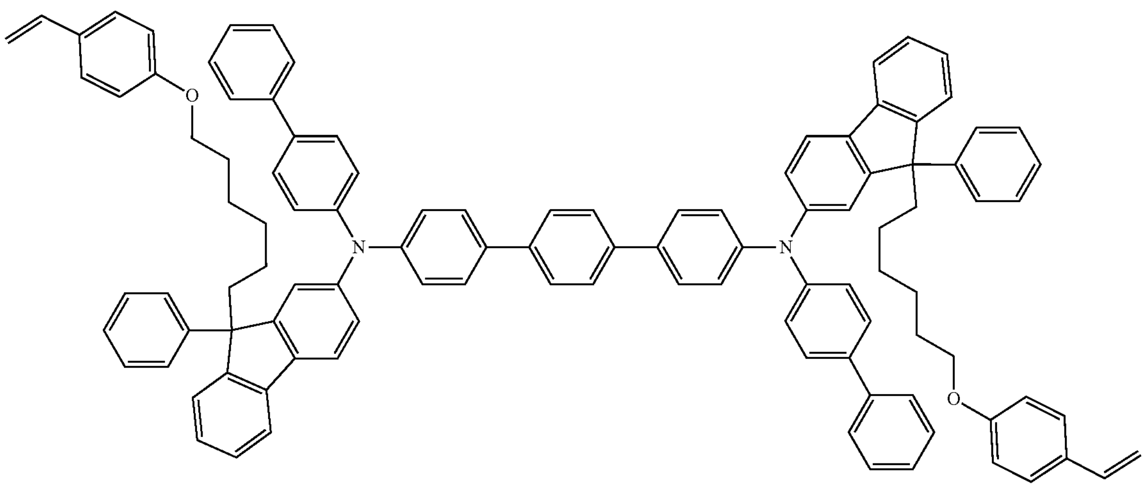

-continued
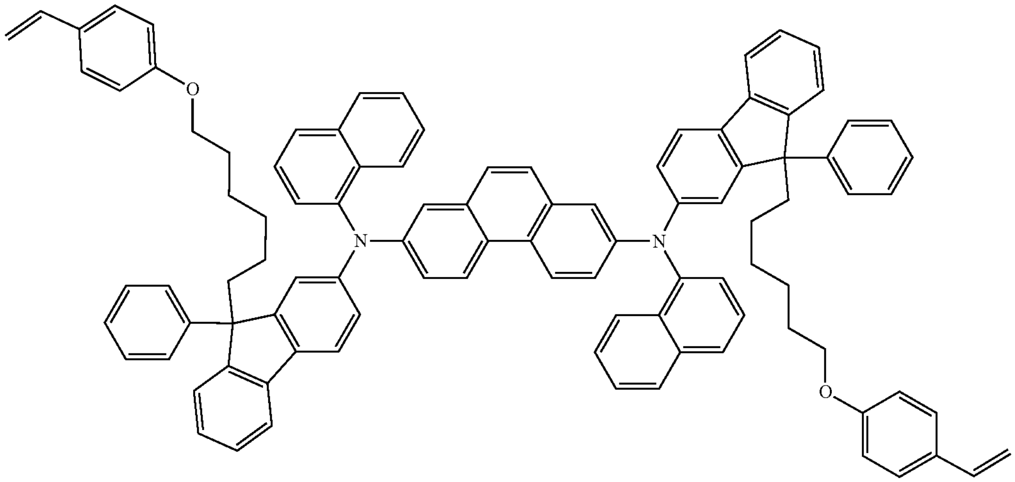 [SMILES: C=Cc1ccc(OCCCCCCC2(c3ccccc3)c3ccccc3-c3ccc(N(c4ccc5c(ccc6cc(N(c7ccc8c(c7)C(CCCCCCOc7ccc(C=C)cc7)(c7ccccc7)c7ccccc7-8)c7cccc8ccccc78)ccc65)c4)c4cccc5ccccc45)cc32)cc1]
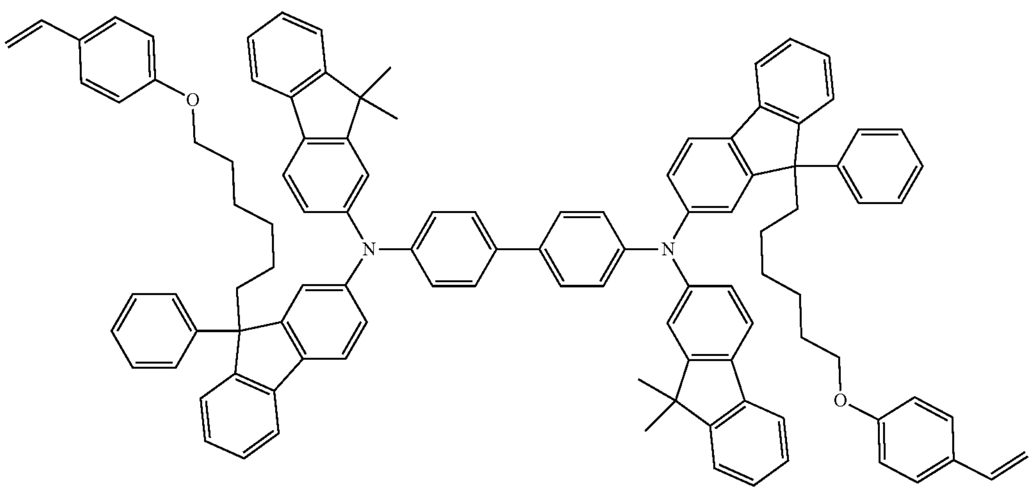
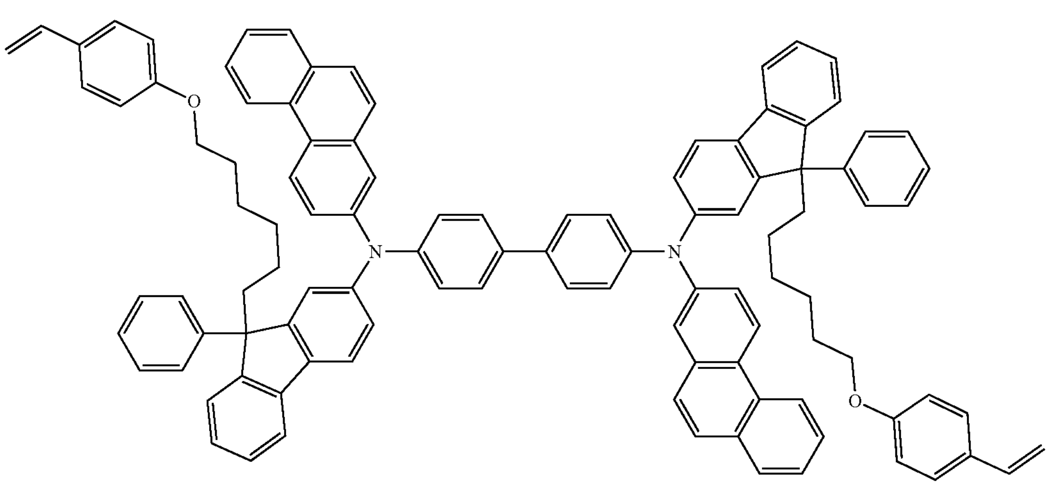

-continued
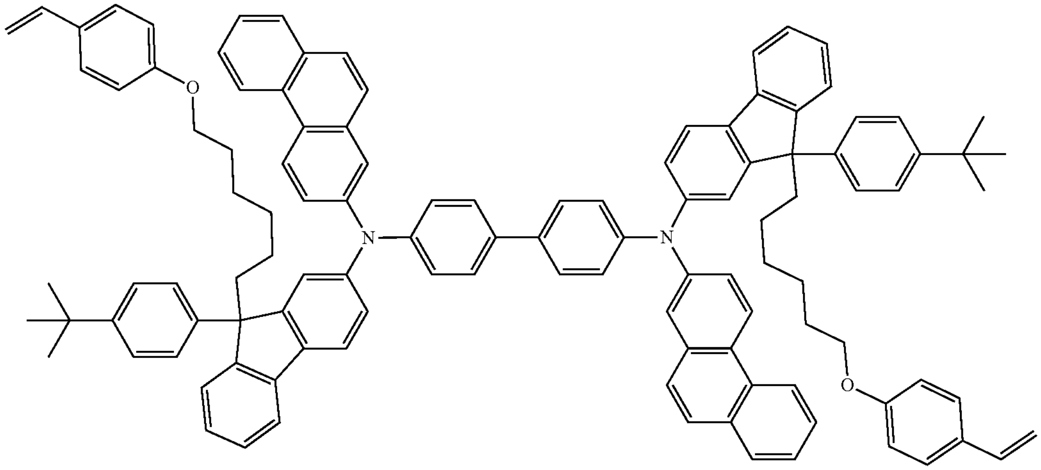
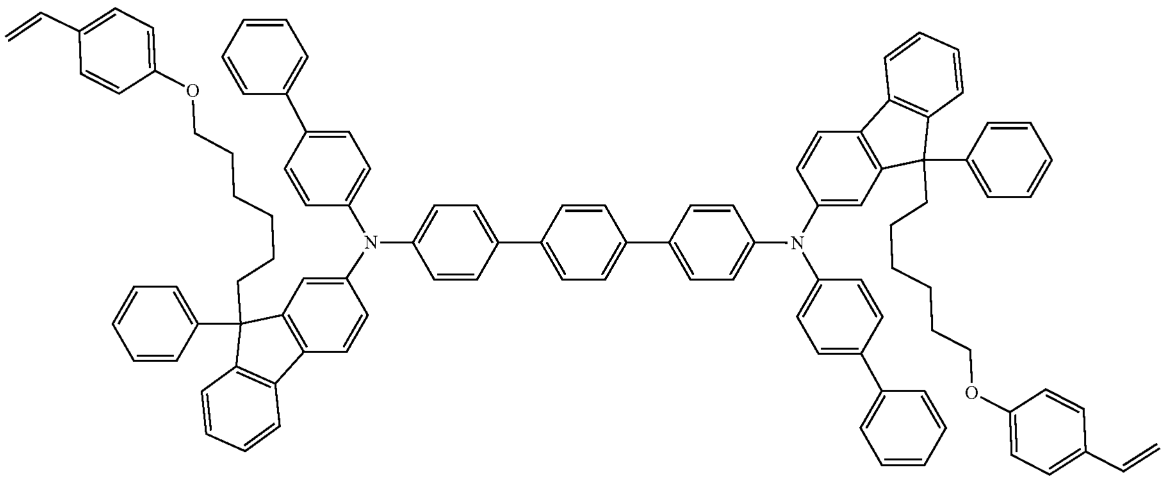
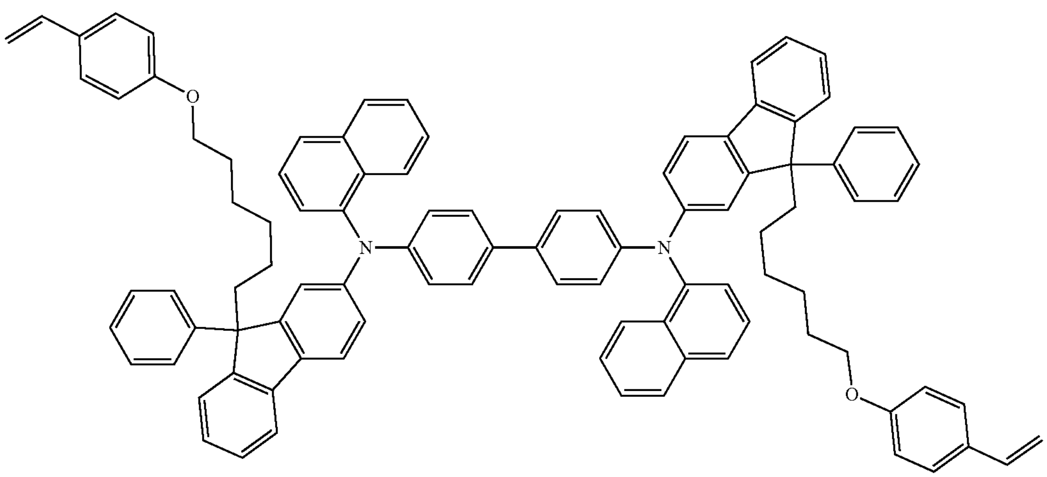

-continued
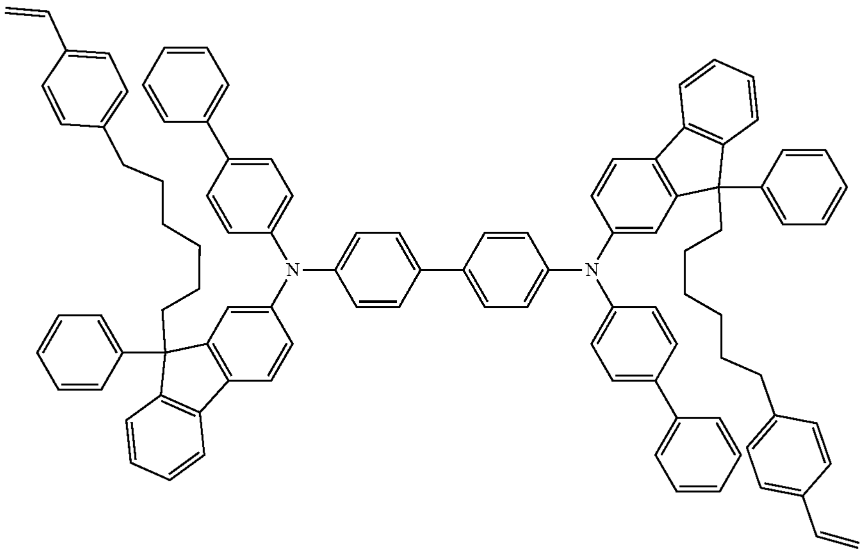
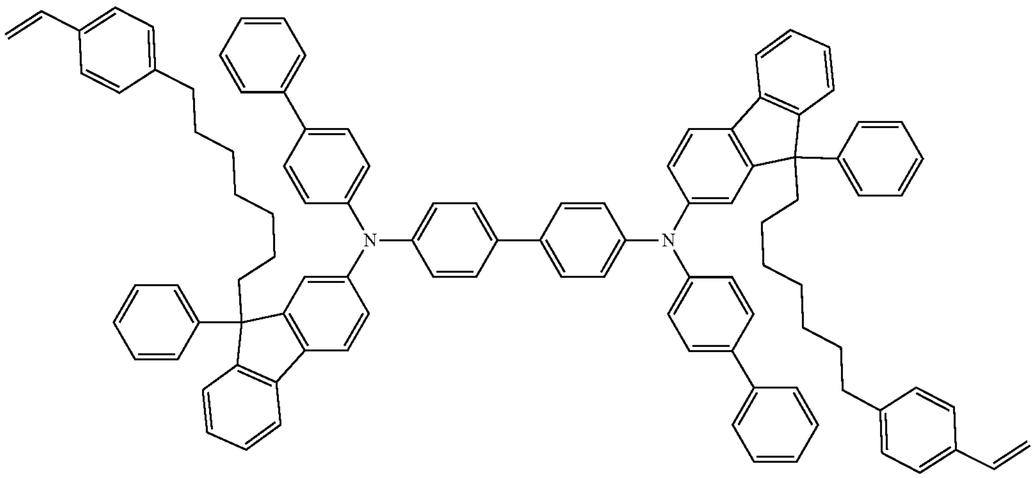
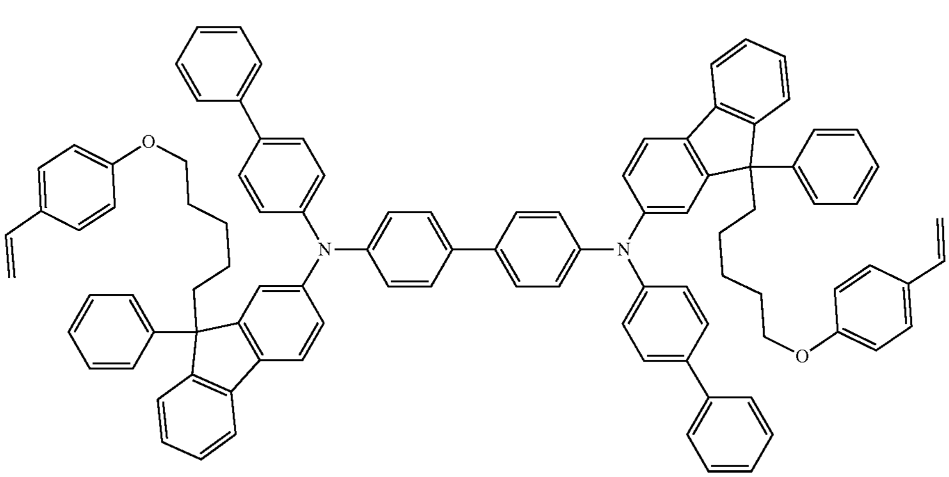 [SMILES: C=Cc1ccc(OCCCCCC2(c3ccccc3)c3ccccc3-c3ccc(N(c4ccc(-c5ccccc5)cc4)c4ccc(-c5ccc(N(c6ccc(-c7ccccc7)cc6)c6ccc7c(c6)C(CCCCCOc6ccc(C=C)cc6)(c6ccccc6)c6ccccc6-7)cc5)cc4)cc32)cc1]

-continued
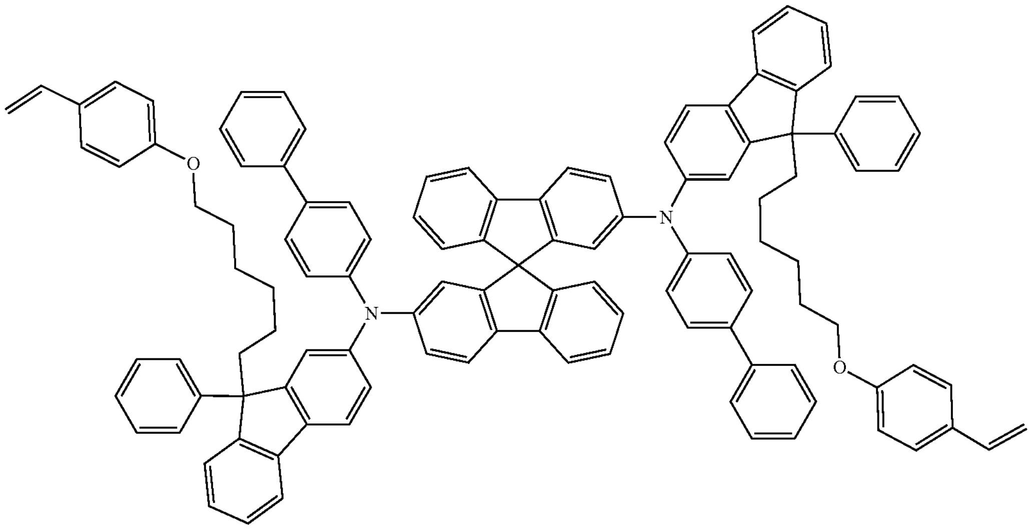
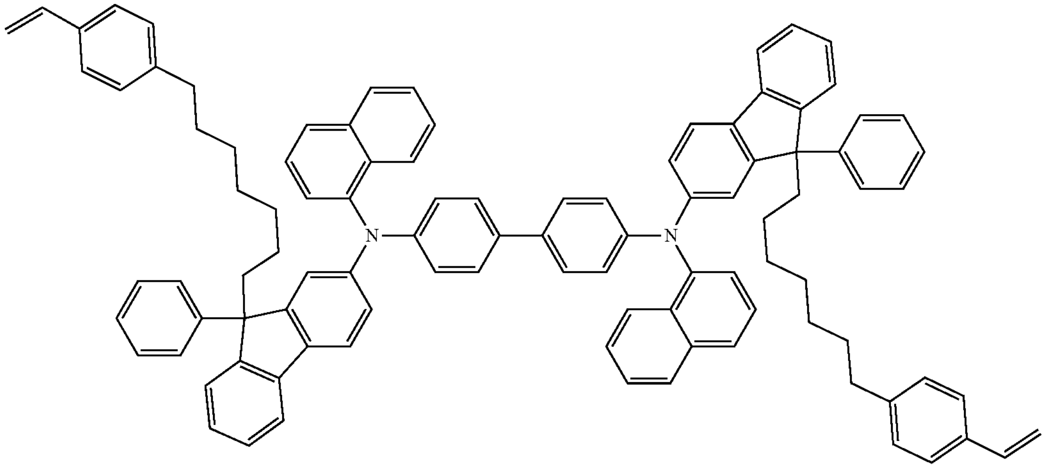
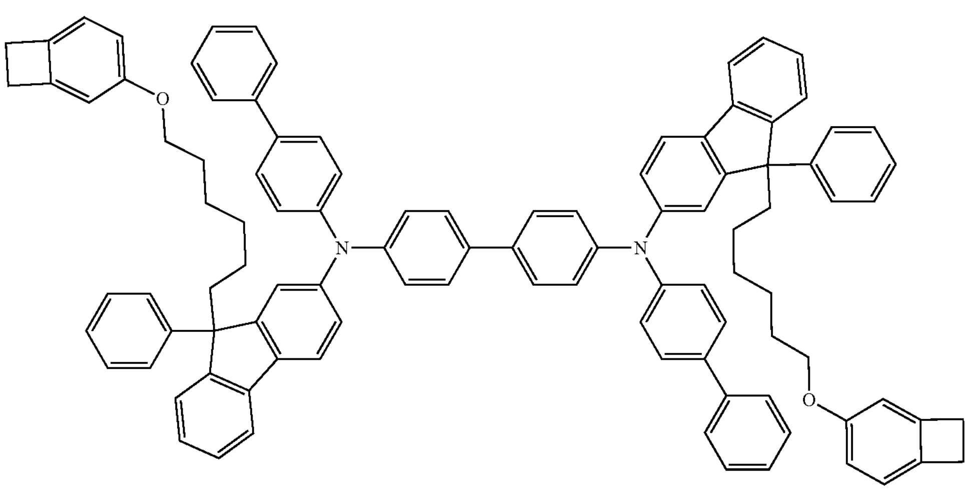

-continued
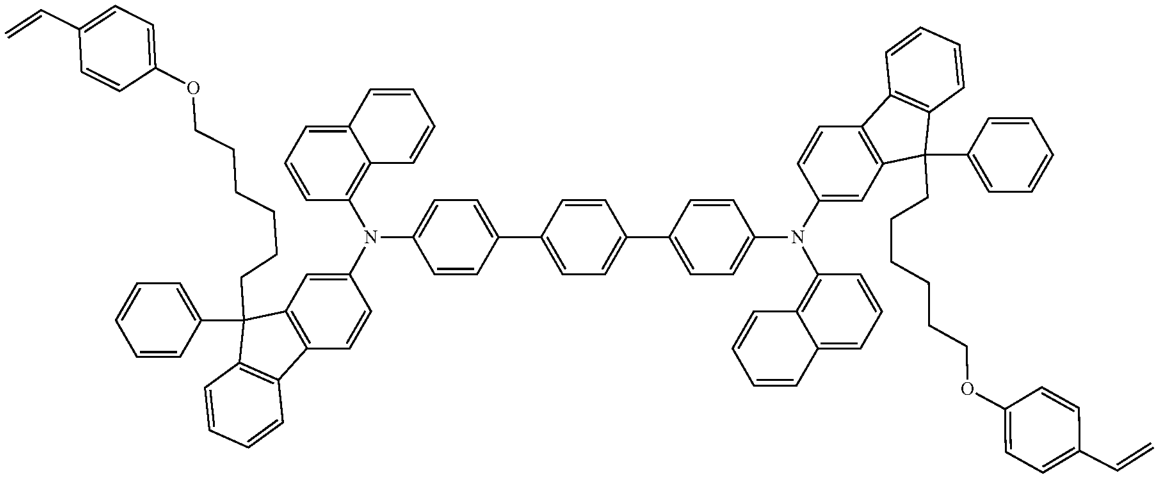
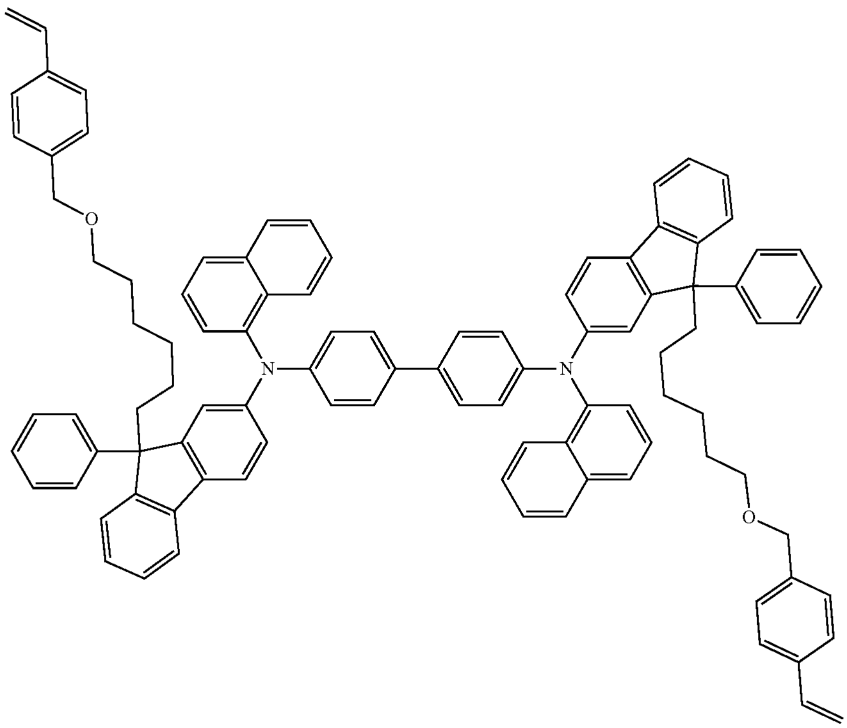
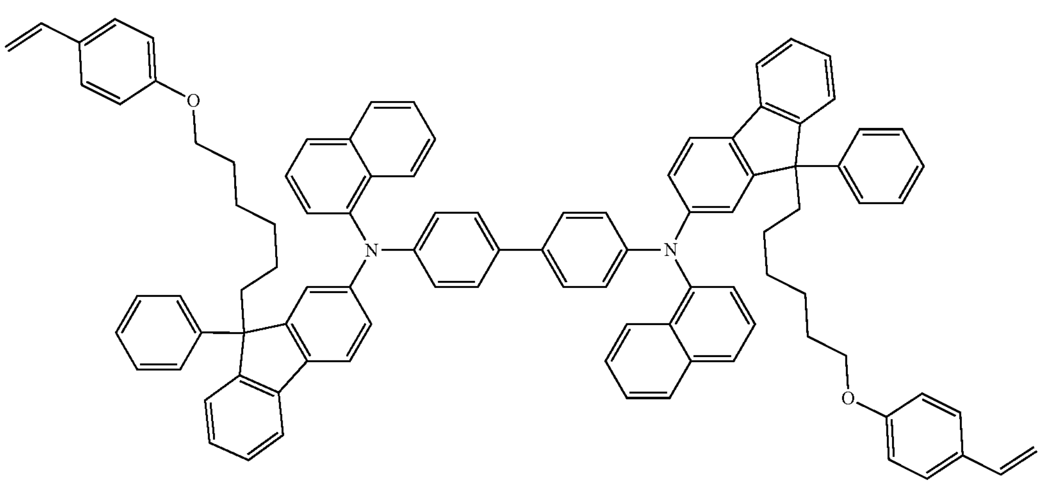

-continued
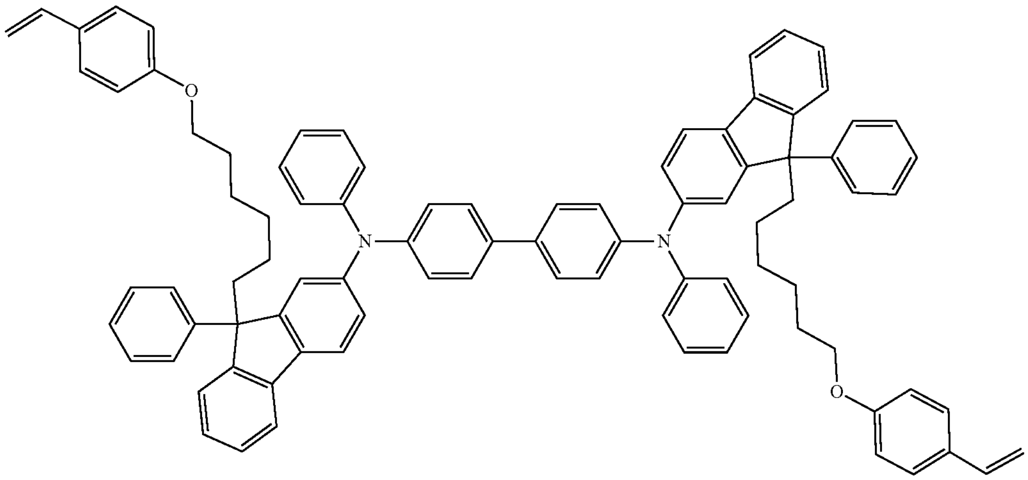
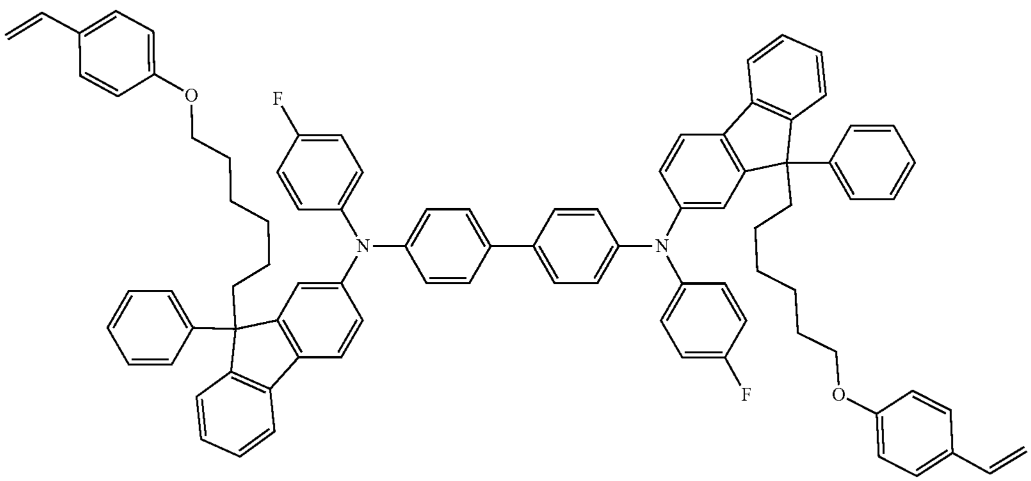
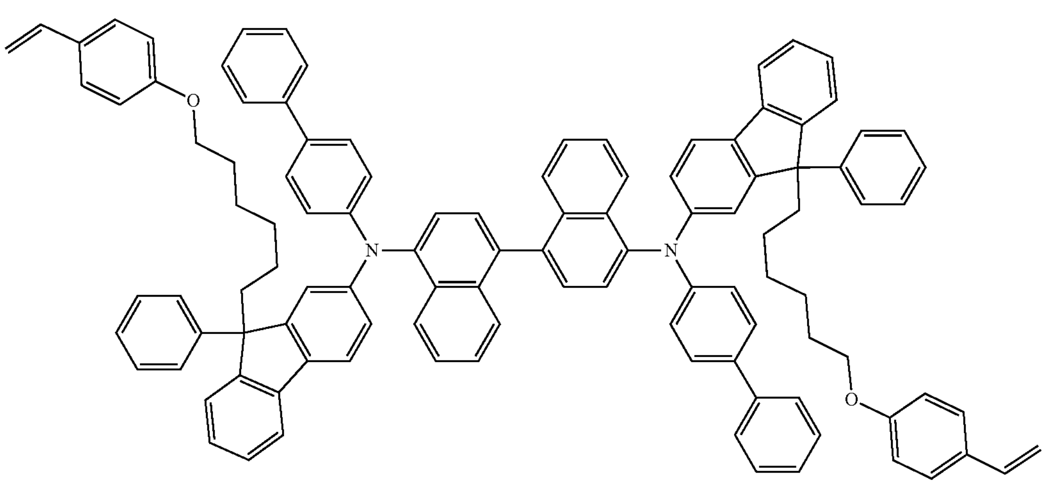

-continued
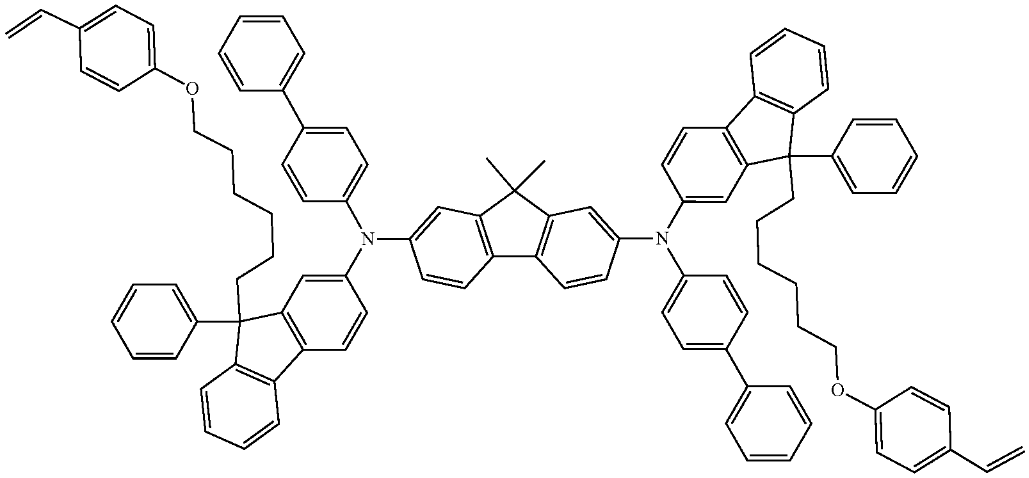
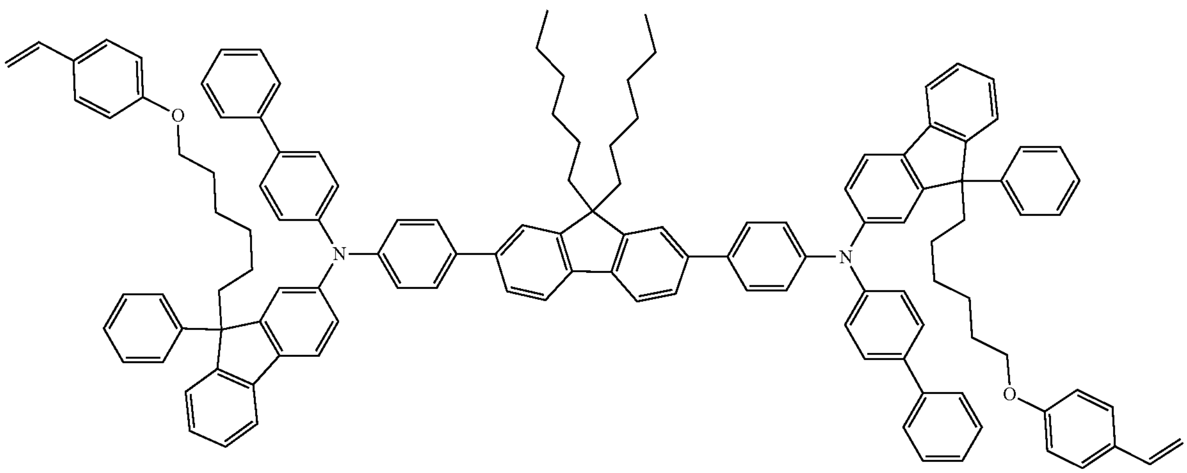
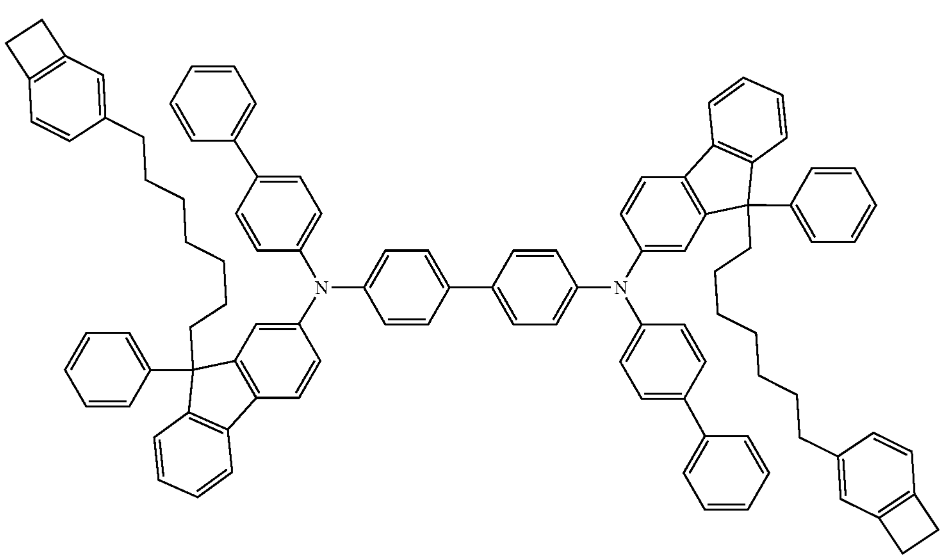

-continued
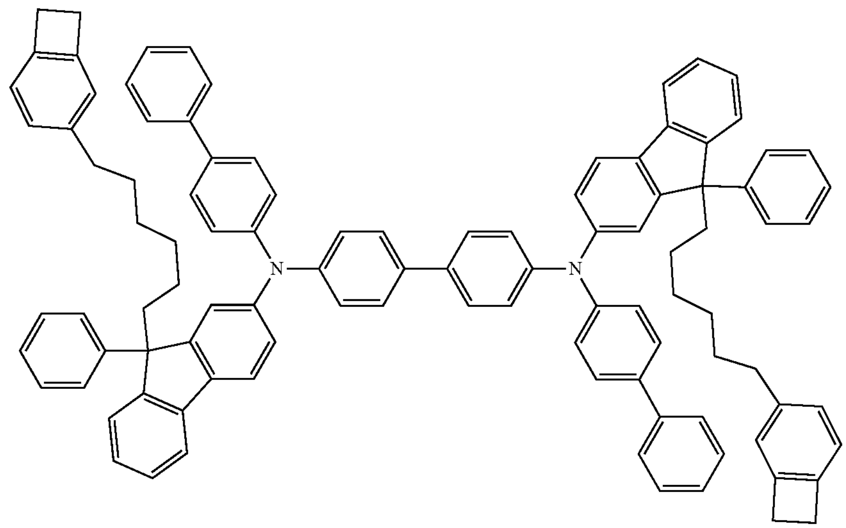
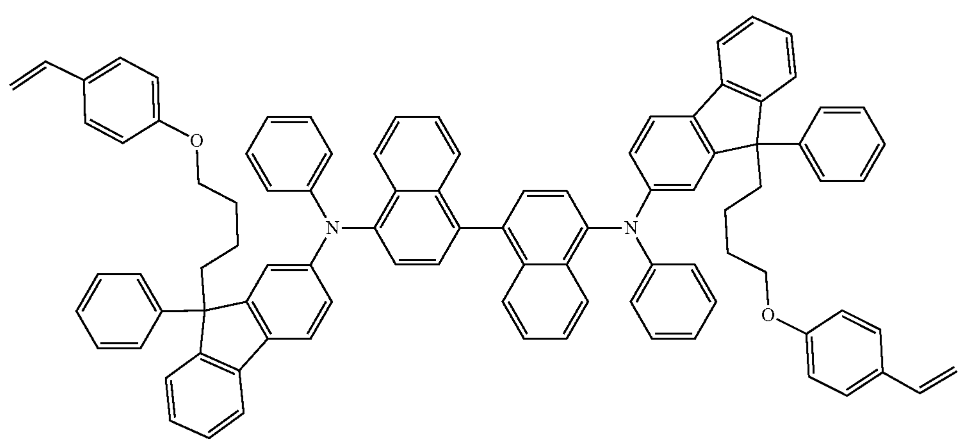
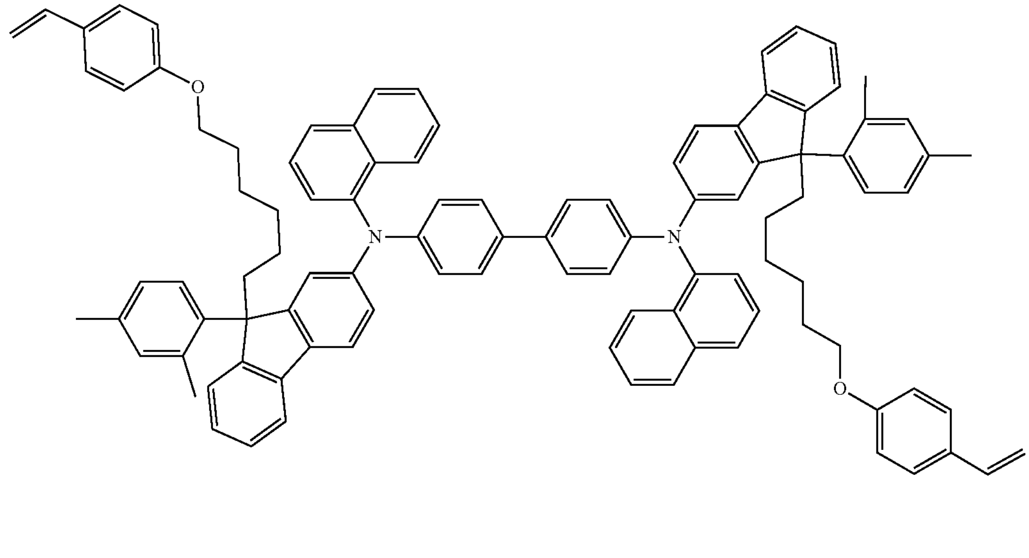

-continued
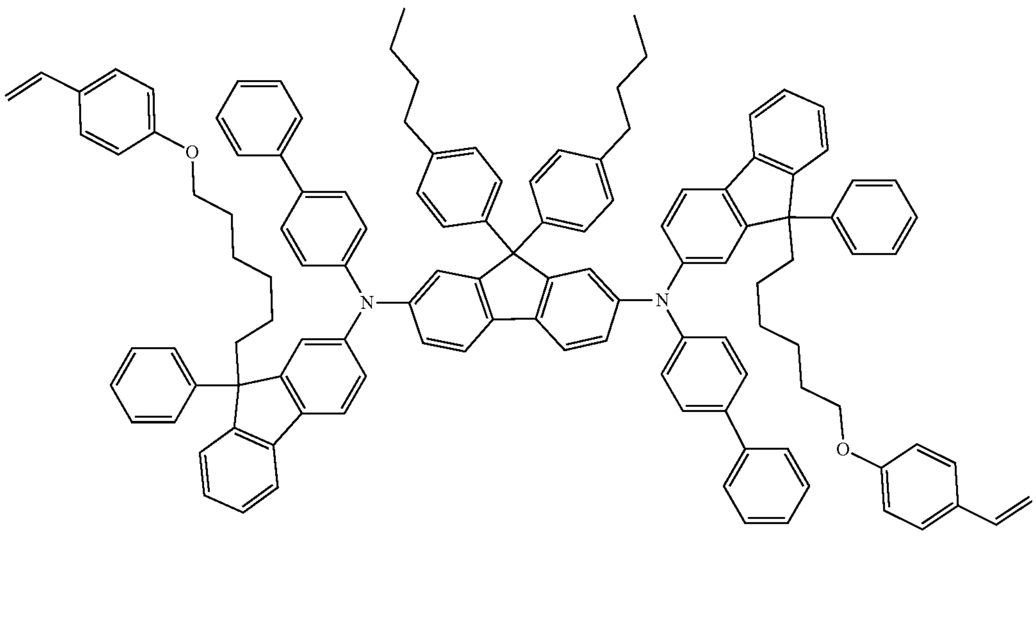 [SMILES: C=Cc1ccc(OCCCCCCC2(c3ccccc3)c3ccccc3-c3ccc(N(c4ccc(-c5ccccc5)cc4)c4ccc5c(c4)C(c4ccc(CCCC)cc4)(c4ccc(CCCC)cc4)c4cc(N(c6ccc(-c7ccccc7)cc6)c6ccc7c(c6)C(CCCCCCOc6ccc(C=C)cc6)(c6ccccc6)c6ccccc6-7)ccc4-5)cc32)cc1]
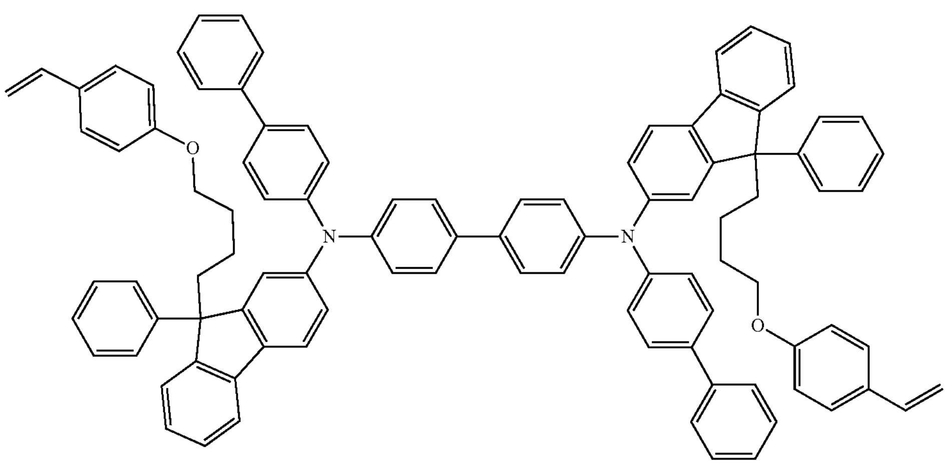
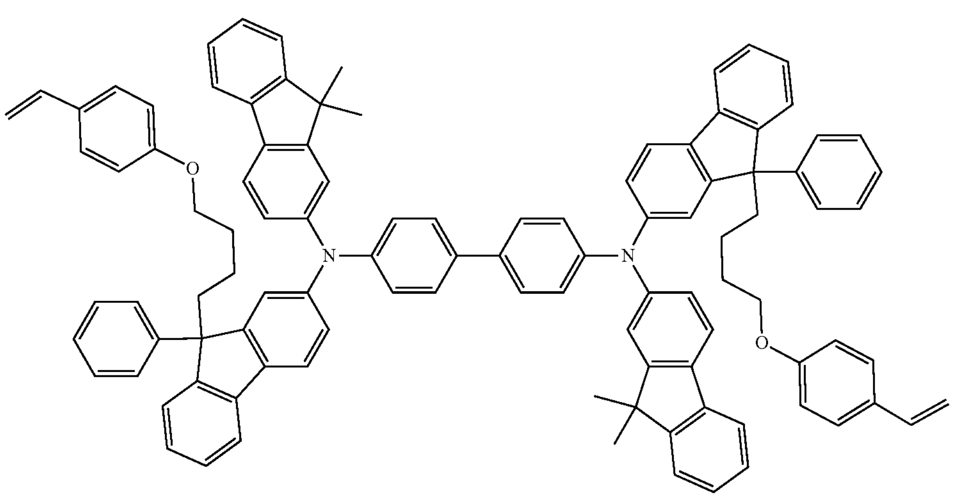

-continued
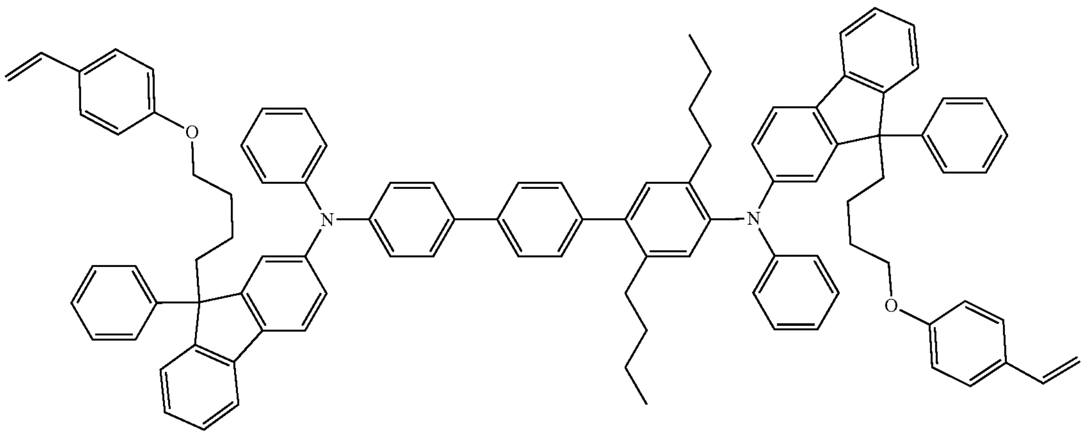
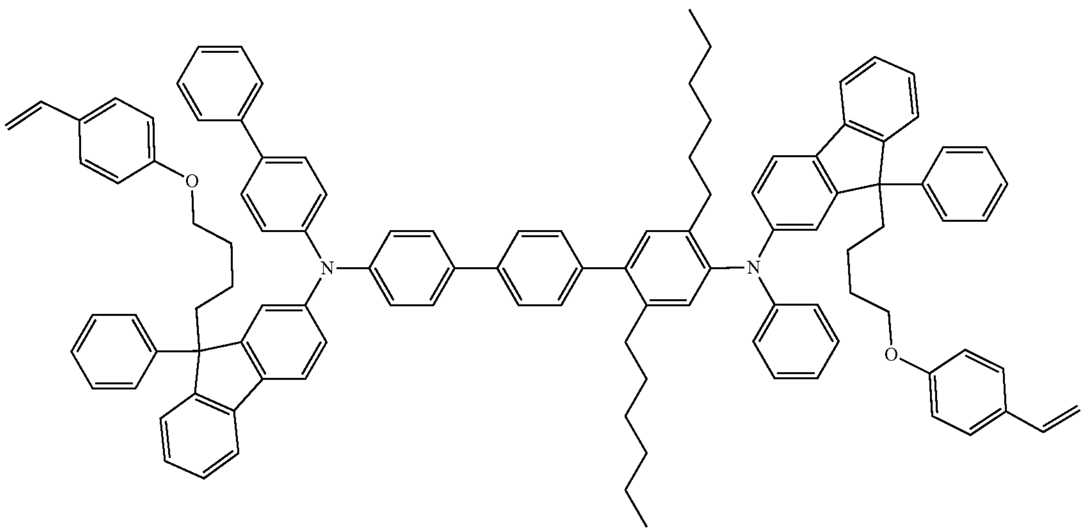
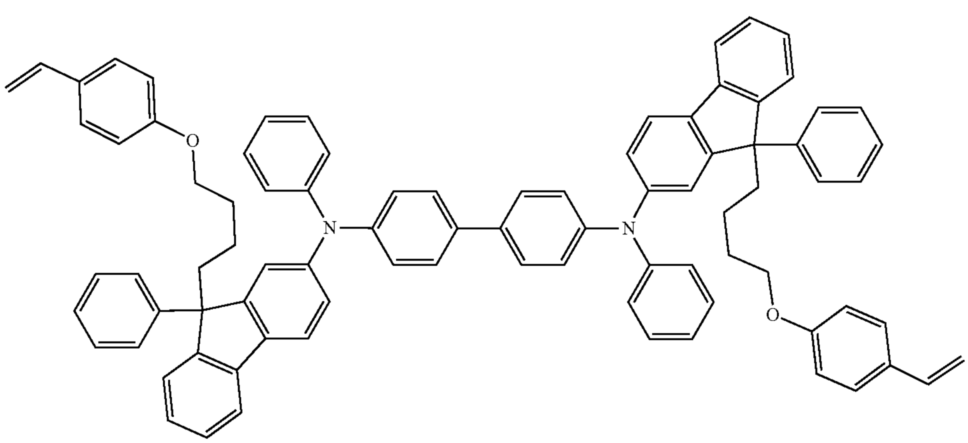

-continued
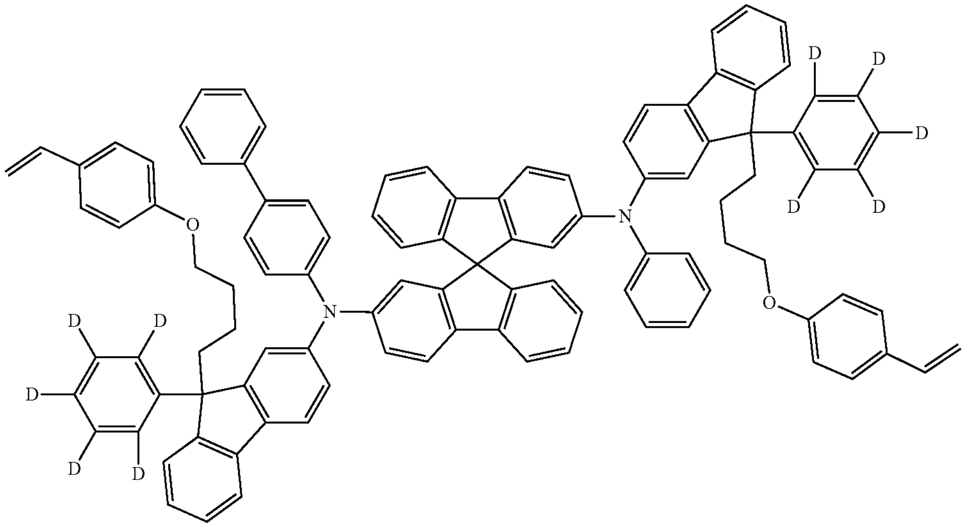
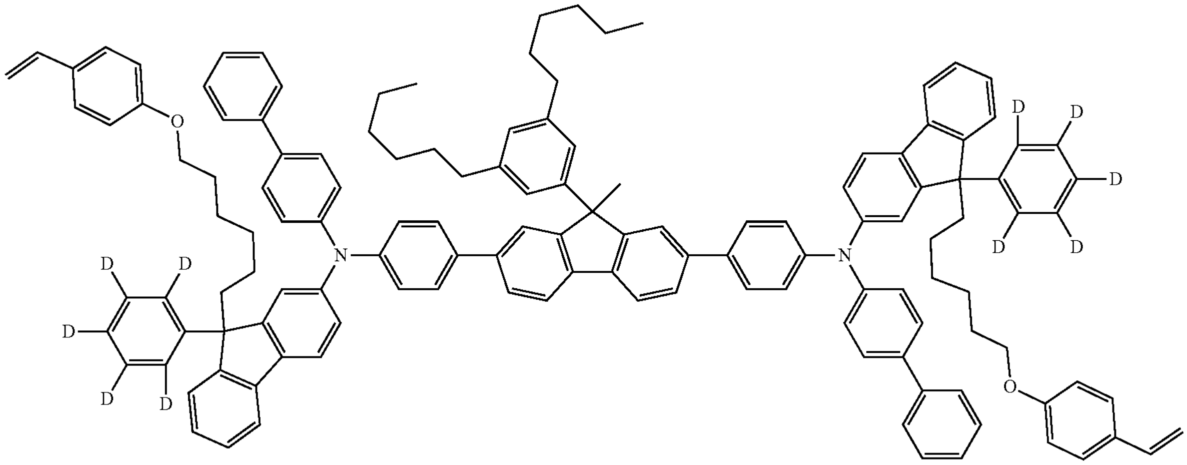
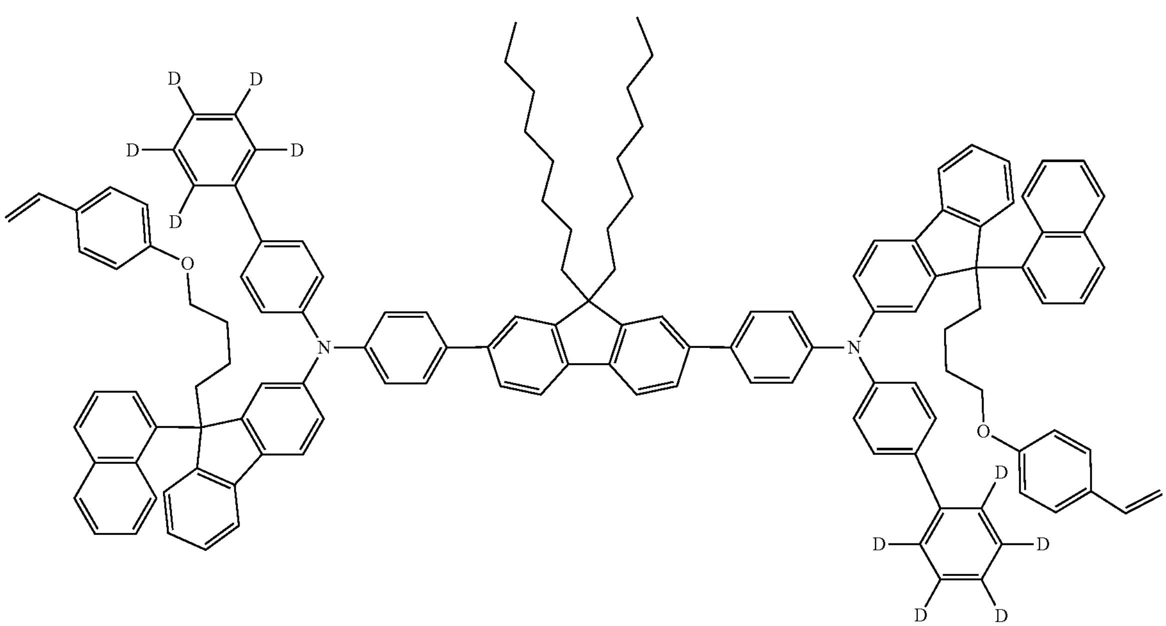

-continued
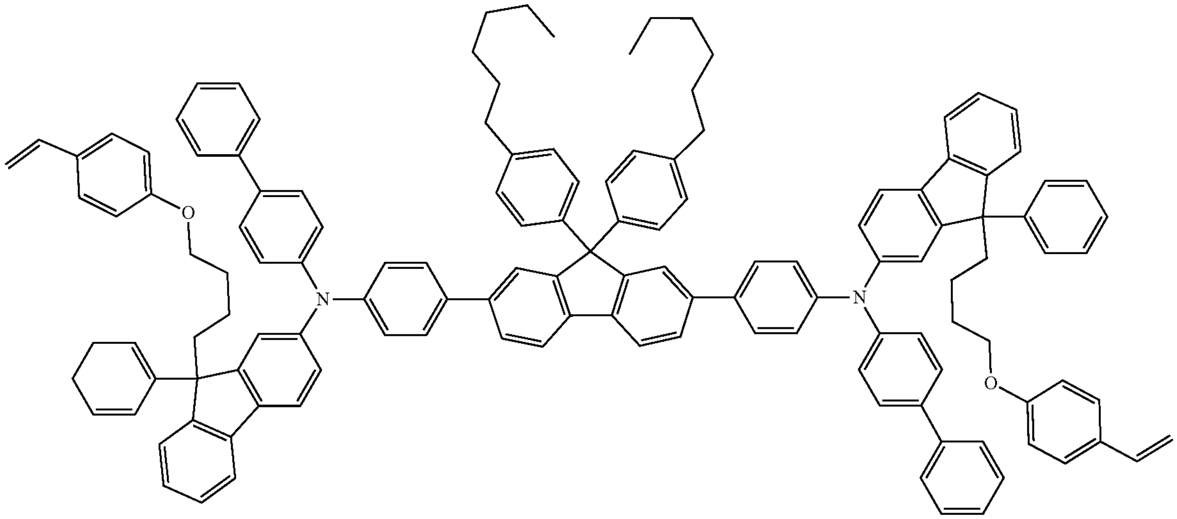
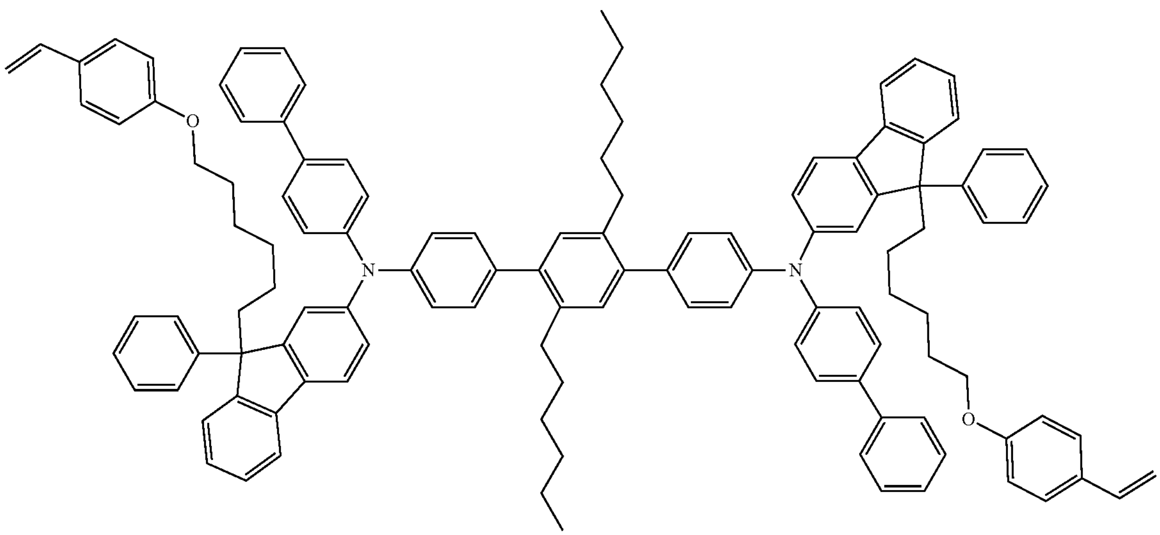
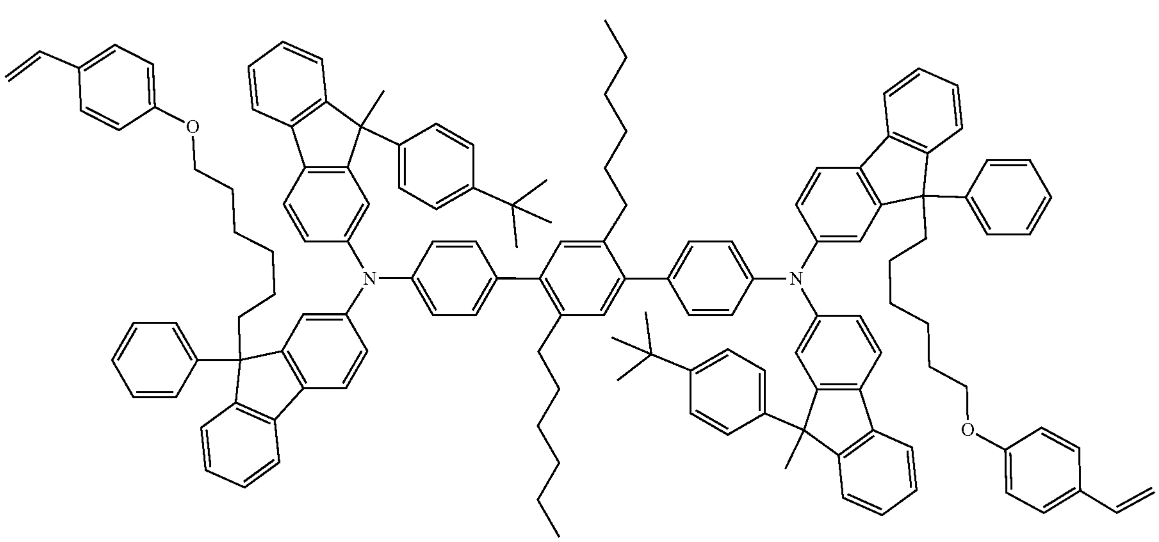

-continued
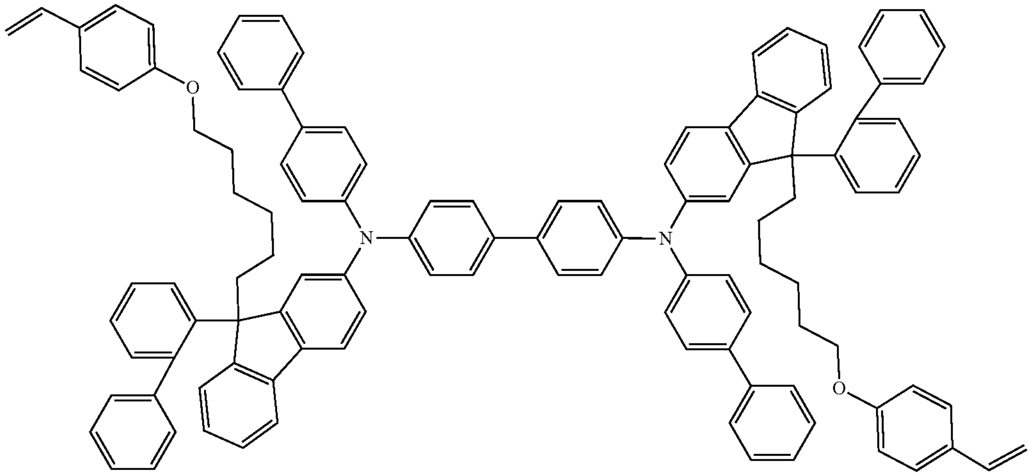
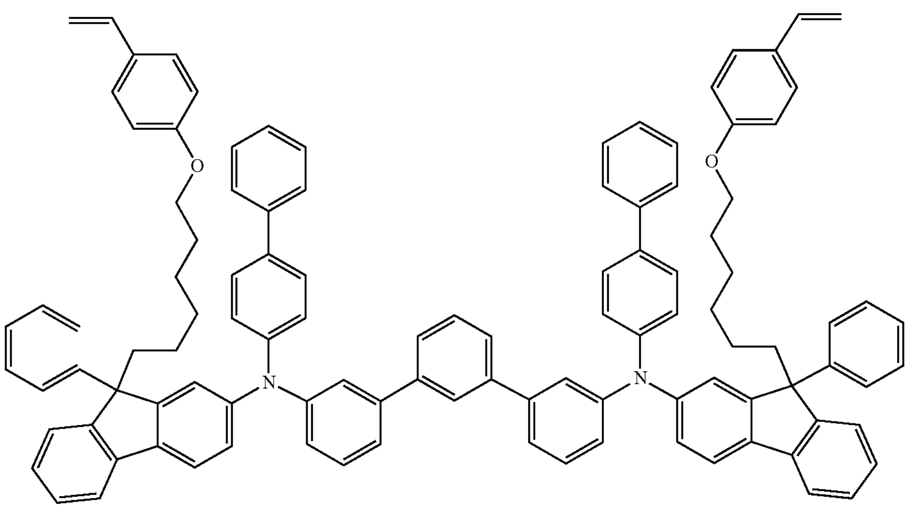
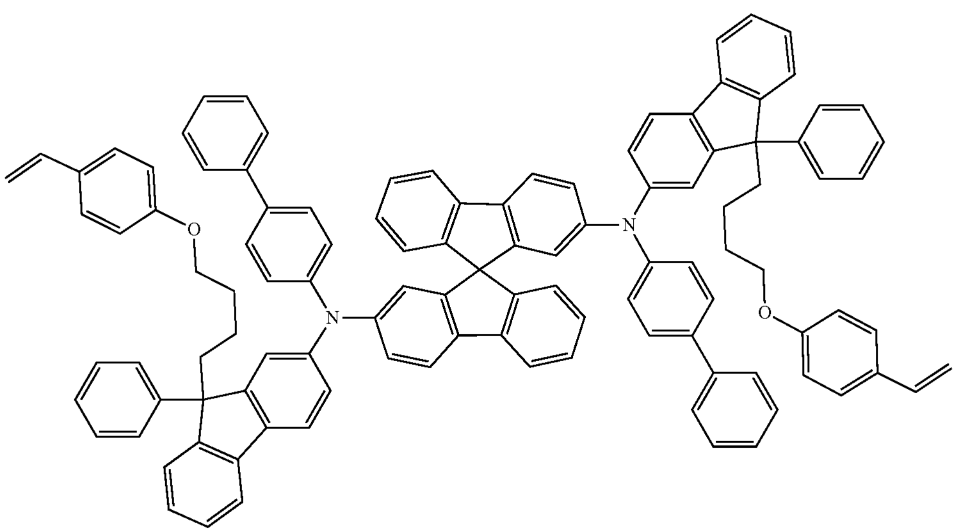

-continued
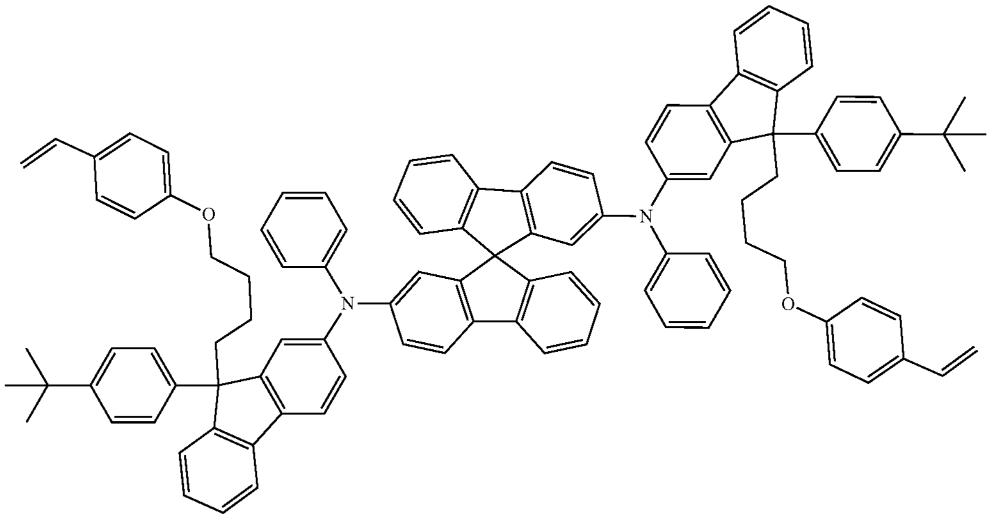
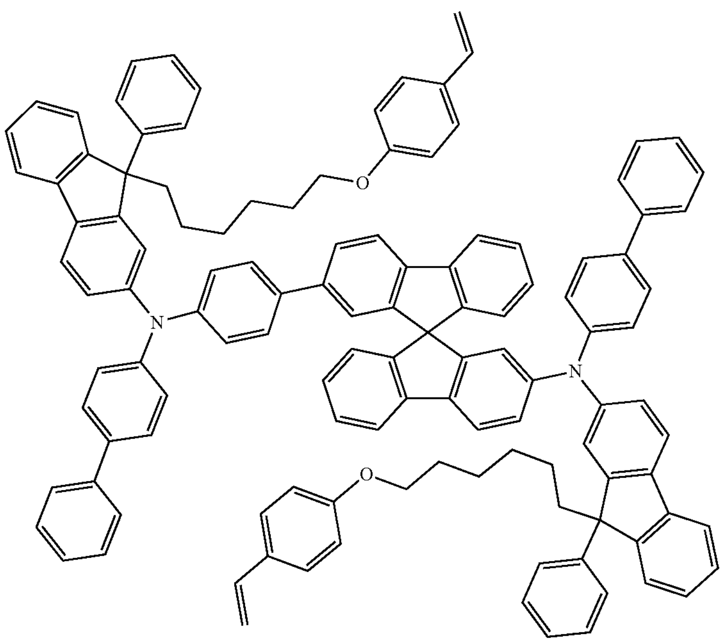
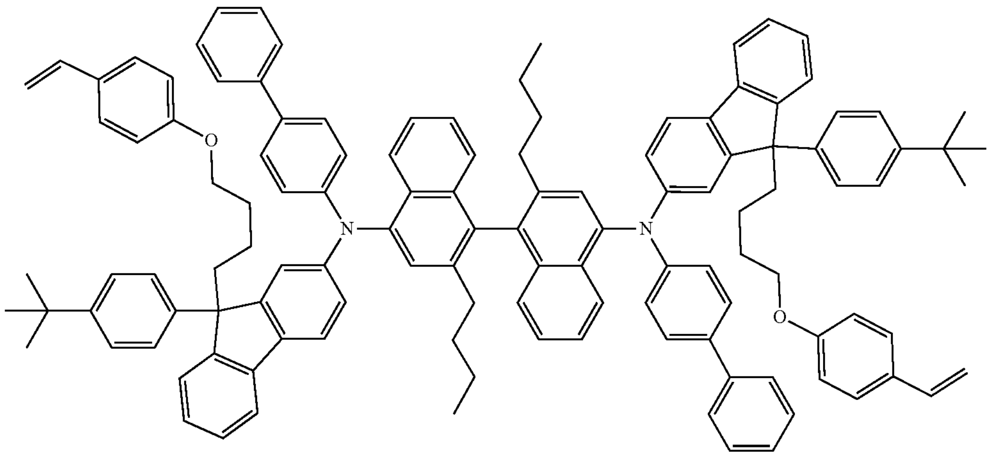

-continued
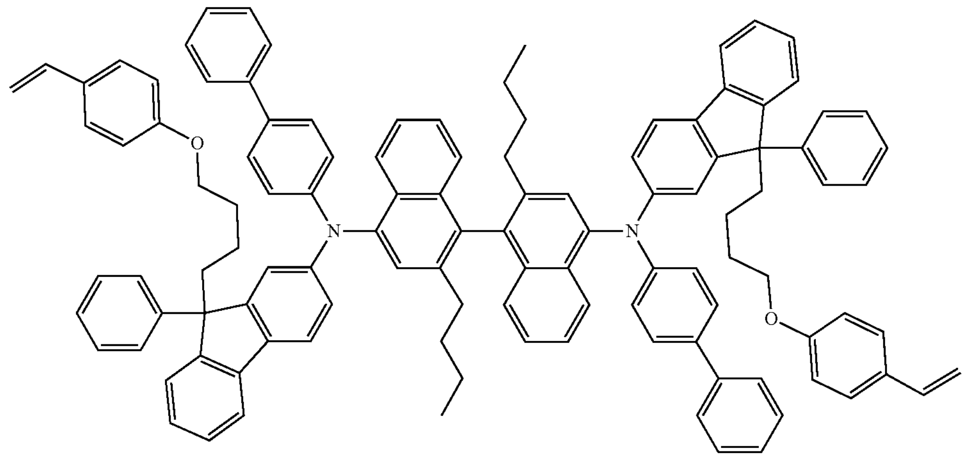
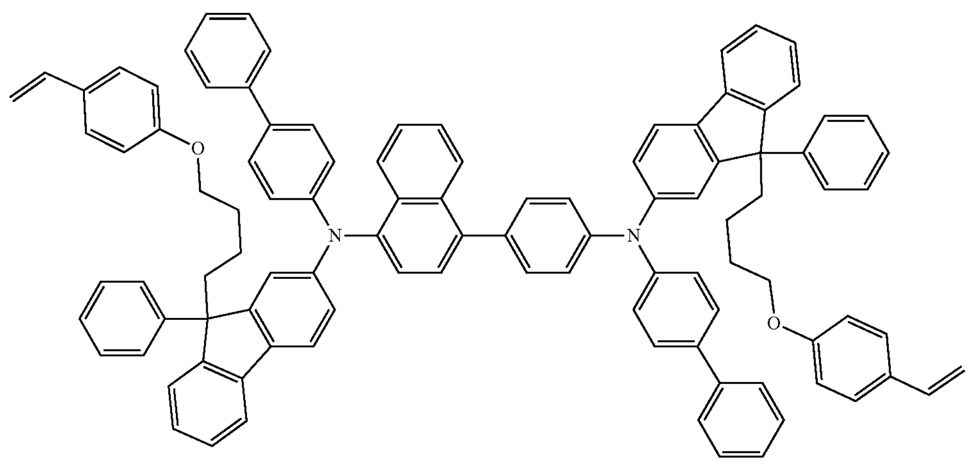
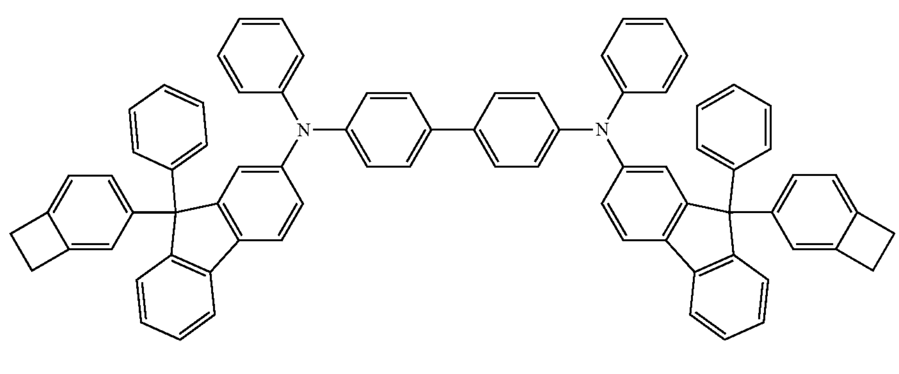

7. The ink composition of claim 1, wherein the second solvent is dibutyl malonate, diethyl succinate, dibutyl succinate, diethyl adipate, diisopropyl adipate, or dibutyl adipate.

8. The ink composition of claim 1, wherein the compound represented by Chemical Formula 1 is included in an amount of 0.1 to 10 wt %.

9. The ink composition of claim 1, further includes a p-doping material represented by one of the following Chemical Formulae A to F:

[Chemical Formulae A]

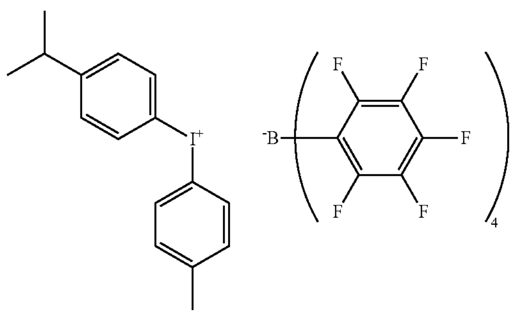

[Chemical Formulae B]

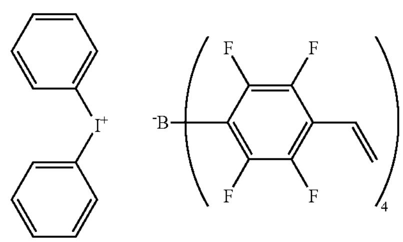

[Chemical Formulae C]

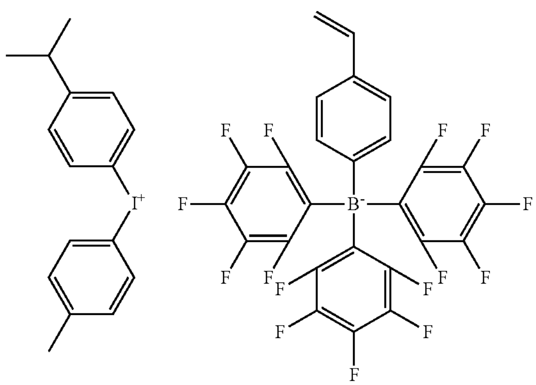

-continued

[Chemical Formulae D]

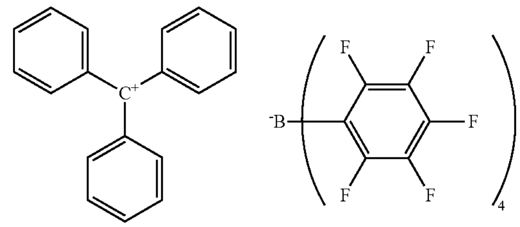

[Chemical Formulae E]

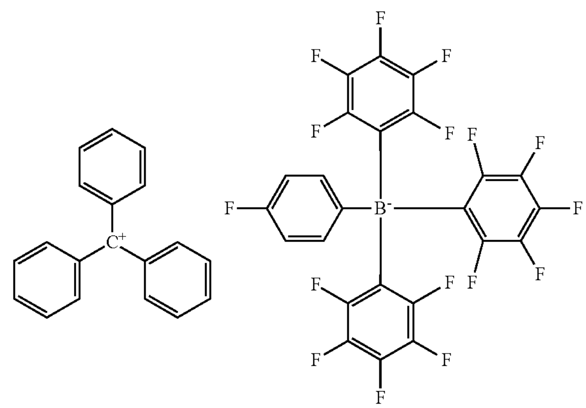

[Chemical Formulae F]

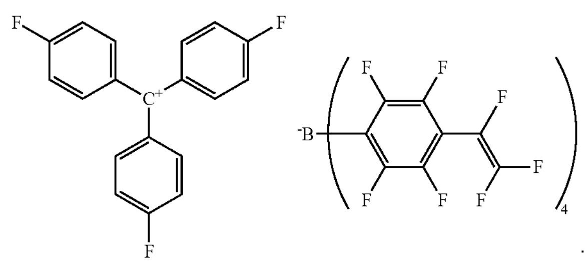

.

* * * * *